US011557736B2

(12) United States Patent
Kim et al.

(10) Patent No.: US 11,557,736 B2
(45) Date of Patent: Jan. 17, 2023

(54) ORGANOMETALLIC COMPOUND CONTAINING AN IRIDIUM COMPLEX CONTAINING A 2-PHENYLPYRIDINE LIGAND AND AN ORGANIC LIGHT EMITTING DEVICE COMPRISING SAME

(71) Applicant: LG CHEM, LTD., Seoul (KR)

(72) Inventors: Seoyeon Kim, Daejeon (KR); Tae Yoon Park, Daejeon (KR); Sang Young Jeon, Daejeon (KR); Dong Hoon Lee, Daejeon (KR); Jung Ha Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 295 days.

(21) Appl. No.: 16/644,946

(22) PCT Filed: Jul. 25, 2018

(86) PCT No.: PCT/KR2018/008432
§ 371 (c)(1),
(2) Date: Mar. 5, 2020

(87) PCT Pub. No.: WO2019/093622
PCT Pub. Date: May 16, 2019

(65) Prior Publication Data

US 2020/0287143 A1 Sep. 10, 2020

(30) Foreign Application Priority Data

Nov. 10, 2017 (KR) ........................ 10-2017-0149679

(51) Int. Cl.
*H01L 29/08* (2006.01)
*H01L 51/00* (2006.01)
(Continued)

(52) U.S. Cl.
CPC ...... *H01L 51/0085* (2013.01); *C07F 15/0033* (2013.01); *C09K 11/06* (2013.01);
(Continued)

(58) Field of Classification Search
CPC .................................................. H01L 51/0085
See application file for complete search history.

(56) References Cited

U.S. PATENT DOCUMENTS 8,722,205 B2 * 5/2014 Xia ........................ C09K 11/06 428/917
9,634,264 B2 * 4/2017 Beers .................... C09K 11/06
(Continued)

FOREIGN PATENT DOCUMENTS

CN 105646590 A 6/2016
EP 3026056 A1 6/2016
(Continued)

OTHER PUBLICATIONS

Thangaraju et al., "4,4',4"-Tris(N-carbazolyl)-triphenylamine interlayer in highly efficient phosphorescent organic light emitting diodes based on tris[4-methyl-2-2(4'-trimethylsilylphenyl)pyridine]iridium complex," Thin Solid Films 519:6073-6076 (2011).

*Primary Examiner* — Caleb E Henry
(74) *Attorney, Agent, or Firm* — Dentons US LLP

(57) ABSTRACT

Provided is an organometallic compound of Chemical Formula 1:

(Continued)

[Chemical Formula 1]

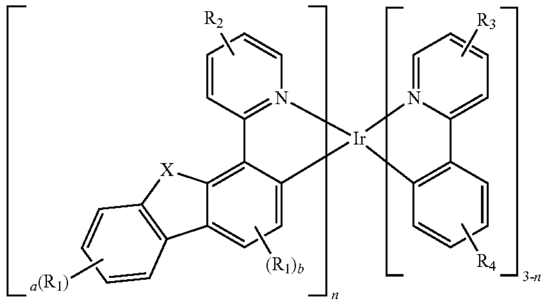

wherein, in Chemical Formula 1:

X is O, S, NH, or Se;

$R_1$ is —Si($R_a$)($R_b$)($R_c$), where $R_a$, $R_b$, and $R_c$ are hydrogen, deuterium, or a substituted or unsubstituted $C_{1-10}$ alkyl;

$R_2$, $R_3$ and $R_4$ are each independently hydrogen, deuterium, halogen, cyano, amino, a substituted or unsubstituted $C_{1-60}$ alkyl, a substituted or unsubstituted $C_{1-60}$ haloalkyl, a substituted or unsubstituted $C_{1-60}$ alkoxy, a substituted or unsubstituted $C_{1-60}$ haloalkoxy, a substituted or unsubstituted $C_{3-60}$ cycloalkyl, a substituted or unsubstituted $c_{2-60}$ alkenyl, a substituted or unsubstituted $C_{6-60}$ aryl, a substituted or unsubstituted $C_{6-60}$ aryloxy, or a substituted or unsubstituted $C_{2-60}$ heterocyclic group containing one or more heteroatoms selected from the group consisting of N, O and S;

a and b are each 0 and 1, or 1 and 0, respectively; and n is 1 or 2, and an organic light emitting device including the same.

9 Claims, 1 Drawing Sheet

(51) Int. Cl.

| | |
|---|---|
| ***C07F 15/00*** | (2006.01) |
| ***C09K 11/06*** | (2006.01) |
| *H01L 51/50* | (2006.01) |

(52) U.S. Cl.

CPC ................ *C09K 2211/1007* (2013.01); *C09K 2211/1029* (2013.01); *C09K 2211/1088* (2013.01); *C09K 2211/185* (2013.01); *H01L 51/5016* (2013.01)

(56) References Cited

U.S. PATENT DOCUMENTS

| | | | | |
|---|---|---|---|---|
| 9,685,617 | B2 * | 6/2017 | Beers | H01L 51/0085 |
| 10,033,002 | B2 * | 7/2018 | Ma | H01L 51/0085 |
| 10,038,151 | B2 * | 7/2018 | Boudreault | H01L 51/0085 |
| 10,056,566 | B2 * | 8/2018 | Xia | C09K 11/06 |
| 10,411,201 | B2 * | 9/2019 | Boudreault | H01L 51/0071 |
| 2004/0251816 | A1 | 12/2004 | Leo et al. | |
| 2010/0244004 | A1 * | 9/2010 | Xia | H01L 51/0085 546/4 |
| 2010/0270540 | A1 * | 10/2010 | Chung | H01L 51/0085 257/40 |
| 2014/0131663 | A1 * | 5/2014 | Beers | H01L 51/0085 546/4 |
| 2014/0131676 | A1 * | 5/2014 | Beers | H01L 51/0085 546/4 |
| 2015/0295197 | A1 | 10/2015 | Adamovich et al. | |
| 2016/0049597 | A1 * | 2/2016 | Ma | H01L 51/0085 546/4 |
| 2016/0111663 | A1 | 4/2016 | Kim et al. | |
| 2016/0133859 | A1 | 5/2016 | Boudreault et al. | |
| 2016/0133860 | A1 | 5/2016 | Boudreault et al. | |
| 2016/0155962 | A1 * | 6/2016 | Hwang | H01L 51/0094 546/4 |
| 2016/0155963 | A1 | 6/2016 | Hwang et al. | |
| 2016/0164012 | A1 | 6/2016 | Lee et al. | |
| 2017/0054095 | A1 | 2/2017 | Choi et al. | |
| 2017/0069848 | A1 * | 3/2017 | Zeng | C07D 487/04 |
| 2017/0200899 | A1 * | 7/2017 | Kim | H01L 51/0059 |
| 2017/0294596 | A1 | 10/2017 | Ishibe et al. | |
| 2019/0074446 | A1 * | 3/2019 | Xia | C07C 255/34 |
| 2021/0320251 | A1 * | 10/2021 | Nakano | H01L 51/0061 |

FOREIGN PATENT DOCUMENTS

| | | |
|---|---|---|
| JP | 2005-327526 | 11/2005 |
| JP | 2012-521436 | 9/2012 |
| KR | 10-20000051826 | 8/2000 |
| KR | 10-20090059525 | 6/2009 |
| KR | 10-20160046296 | 4/2016 |
| KR | 10-20160064951 | 6/2016 |
| KR | 10-20160064955 | 6/2016 |
| KR | 10-20170021737 | 2/2017 |
| KR | 10-20170115872 | 10/2017 |
| WO | 2003012890 | 2/2003 |

* cited by examiner

[FIG. 1]
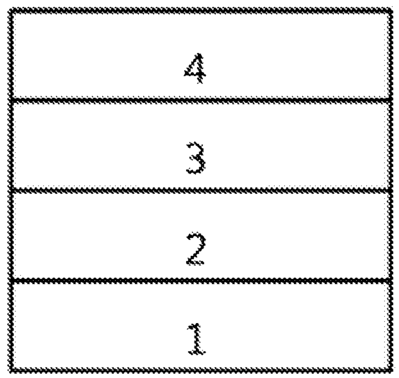
[FIG. 2]
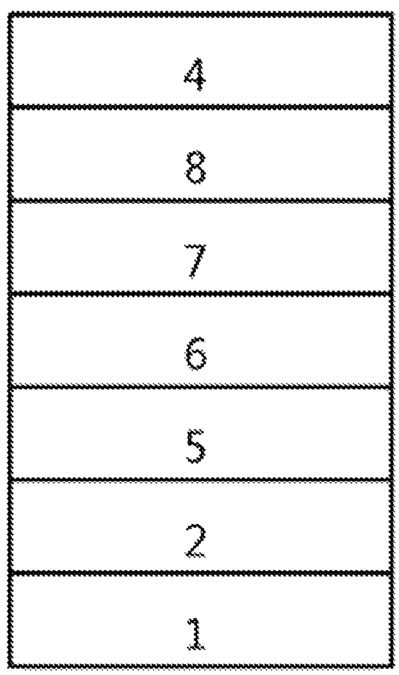

ORGANOMETALLIC COMPOUND CONTAINING AN IRIDIUM COMPLEX CONTAINING A 2-PHENYLPYRIDINE LIGAND AND AN ORGANIC LIGHT EMITTING DEVICE COMPRISING SAME

CROSS-REFERENCE TO RELATED APPLICATION(S)

This application is a National Stage Application of International Application No. PCT/KR2018/008432 filed on Jul. 25, 2018, which claims priority to or the benefit of Korean Patent Application No. 10-2017-0149679 filed with the Korean Intellectual Property Office on Nov. 10, 2017, the disclosure of which is incorporated herein by reference in its entirety.

TECHNICAL FIELD

The present invention relates to an organometallic compound and to an organic light emitting device comprising the same.

BACKGROUND

In general, an organic light emitting phenomenon refers to a phenomenon where electric energy is converted into light energy by using an organic material. The organic light emitting device using the organic light emitting phenomenon has characteristics such as a wide viewing angle, an excellent contrast, a fast response time, an excellent luminance, driving voltage and response speed, and thus many studies have proceeded.

The organic light emitting device generally has a structure which comprises an anode, a cathode, and an organic material layer interposed between the anode and the cathode. The organic material layer frequently has a multilayered structure that comprises different materials in order to enhance efficiency and stability of the organic light emitting device, and for example, the organic material layer can be formed of a hole injection layer, a hole transport layer, a light emitting layer, an electron transport layer, an electron injection layer and the like. In the structure of the organic light emitting device, if a voltage is applied between two electrodes, the holes are injected from an anode into the organic material layer and the electrons are injected from the cathode into the organic material layer, and when the injected holes and electrons meet each other, an exciton is formed, and light is emitted when the exciton falls to a ground state again.

There is a continuing need for the development of new materials for the organic materials used in the organic light emitting devices as described above.

PRIOR ART LITERATURE

Patent Literature

Korean Unexamined Patent Publication No. 10-2000-0051826

BRIEF DESCRIPTION

Technical Problem

It is an object of the present invention to provide a novel organometallic compound and an organic light emitting device including the same.

Technical Solution

In one aspect of the invention, there is provided a compound of Chemical Formula 1:

Chemical Formula 1

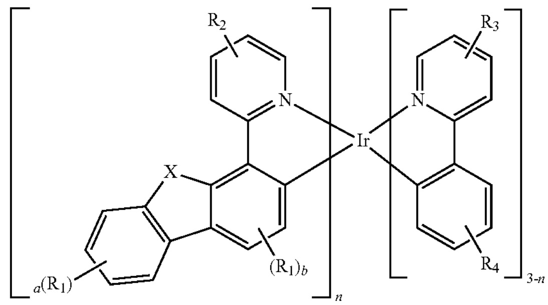

wherein, in Chemical Formula 1:

X is O, S, NH, or Se;

$R_1$ is —Si($R_a$)($R_b$)($R_c$), where $R_a$, $R_b$, and $R_c$ are hydrogen, deuterium, or a substituted or unsubstituted alkyl;

$R_2$, $R_3$ and $R_4$ are each independently hydrogen, deuterium, halogen, cyano, amino, a substituted or unsubstituted $C_{1-60}$ alkyl, a substituted or unsubstituted $C_{1-60}$ haloalkyl, a substituted or unsubstituted $C_{1-60}$ alkoxy, a substituted or unsubstituted $C_{1-60}$ haloalkoxy, a substituted or unsubstituted $C_{3-60}$ cycloalkyl, a substituted or unsubstituted $C_{2-60}$ alkenyl, a substituted or unsubstituted $C_{6-60}$ aryl, a substituted or unsubstituted $C_{6-60}$ aryloxy, or a substituted or unsubstituted $C_{2-60}$ heterocyclic group containing one or more heteroatoms selected from the group consisting of N, O and S;

a and b are each 0 and 1, or 1 and 0, respectively; and n is 1 or 2.

In another aspect of the prevent invention, there is provided an organic light emitting device including a first electrode; a second electrode that is disposed opposite to the first electrode; and one or more organic material layers that are disposed between the first electrode and the second electrode, wherein one or more layers of the organic material layers is a light emitting layer, and wherein the light emitting layer includes the compound of Chemical Formula 1.

Advantageous Effects

The compound of Chemical Formula 1 described above can be used as a material of an organic material layer of an organic light emitting device, and can improve the efficiency, achieve low driving voltage and/or improve lifetime characteristics in the organic light emitting device. In particular, the compound of Chemical Formula 1 can be used as a material of a light emitting layer.

BRIEF DESCRIPTION OF THE DRAWINGS

FIG. 1 shows an example of an organic light emitting device comprising a substrate 1, an anode 2, a light emitting layer 3, and a cathode 4.

FIG. 2 shows an example of an organic light emitting device comprising a substrate 1, an anode 2, a hole injection layer 5, a hole transport layer 6, a light emitting layer 7, an electron transport layer 8 and a cathode 4.

DETAILED DESCRIPTION

Hereinafter, embodiments of the present invention will be described in more detail to facilitate understanding of the invention.

As used herein, the notation

means a bond linked to another substituent group.

As used herein, the term "substituted or unsubstituted" means being unsubstituted or substituted with one or more substituents selected from the group consisting of deuterium, a halogen group, a nitrile group, a nitro group, a hydroxy group, a carbonyl group, an ester group, an imide group, an amino group, a phosphine oxide group, an alkoxy group, an aryloxy group, an alkylthioxy group, an arylthioxy group, an alkylsulfoxy group, an arylsulfoxy group, a silyl group, a boron group, an alkyl group, a cycloalkyl group, an alkenyl group, an aryl group, an aralkyl group, an aralkenyl group, an alkylaryl group, an alkylamine group, an aralkylamine group, a heteroarylamine group, an arylamine group, an arylphosphine group, and a heterocyclic group containing at least one of N, O and S atoms, or being unsubstituted or substituted with a substituent to which two or more substituents are linked among the substituents exemplified above. For example, "the substituent to which two or more substituents are linked" can be a biphenyl group. That is, the biphenyl group can also be an aryl group and can be interpreted as a substituent to which two phenyl groups are linked.

In the present specification, the number of carbon atoms of a carbonyl group is not particularly limited, but is preferably 1 to 40. Specifically, the carbonyl group can be a compound having the following structural formulas, but is not limited thereto:

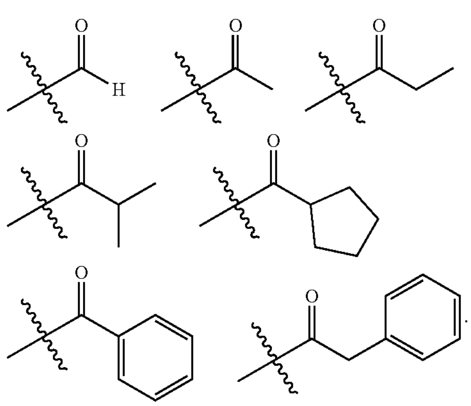

In the present specification, an ester group can have a structure in which oxygen of the ester group can be substituted by a straight-chain, branched-chain, or cyclic alkyl group having 1 to 25 carbon atoms, or an aryl group having 6 to 25 carbon atoms. Specifically, the ester group can be a compound having the following structural formulas, but is not limited thereto:

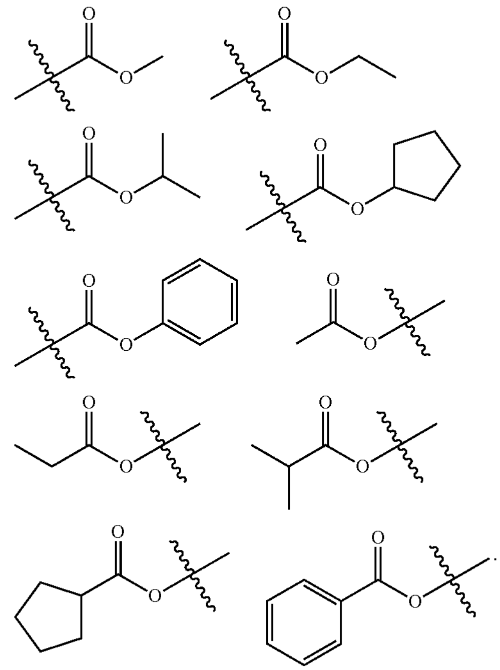

In the present specification, the number of carbon atoms of an imide group is not particularly limited, but is preferably 1 to 25. Specifically, the imide group can be a compound having the following structural formulas, but is not limited thereto:

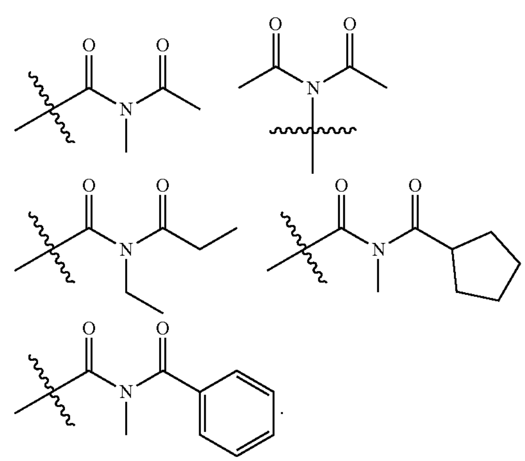

In the present specification, a silyl group specifically includes a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but is not limited thereto.

In the present specification, a boron group specifically includes a trimethylboron group, a triethylboron group, a t-butyldimethylboron group, a triphenylboron group, and a phenylboron group, but is not limited thereto.

In the present specification, examples of a halogen group include fluorine, chlorine, bromine, or iodine.

In the present specification, the alkyl group can be straight-chain or branched-chain, and the number of carbon atoms thereof is not particularly limited, but is preferably 1 to 40. According to one embodiment, the number of carbon atoms of the alkyl group is 1 to 20. According to another embodiment, the number of carbon atoms of the alkyl group is 1 to 10. According to another embodiment, the number of carbon atoms of the alkyl group is 1 to 6. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl, and the like, but are not limited thereto.

In the present specification, the alkenyl group can be straight-chain or branched-chain, and the number of carbon atoms thereof is not particularly limited, but is preferably 2 to 40. According to one embodiment, the number of carbon atoms of the alkenyl group is 2 to 20. According to another embodiment, the number of carbon atoms of the alkenyl group is 2 to 10. According to still another embodiment, the number of carbon atoms of the alkenyl group is 2 to 6. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present specification, a cycloalkyl group is not particularly limited, but the number of carbon atoms thereof is preferably 3 to 60. According to one embodiment, the number of carbon atoms of the cycloalkyl group is 3 to 30. According to another embodiment, the number of carbon atoms of the cycloalkyl group is 3 to 20. According to still another embodiment, the number of carbon atoms of the cycloalkyl group is 3 to 6. Specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethyl-cyclohexyl, 4-tert-butylcyclohexyl, cycloheptyl, cyclooctyl, and the like, but are not limited thereto.

In the present specification, an aryl group is not particularly limited, but preferably has 6 to 60 carbon atoms, and it can be a monocyclic aryl group or a polycyclic aryl group. According to one embodiment, the number of carbon atoms of the aryl group is 6 to 30. According to one embodiment, the number of carbon atoms of the aryl group is 6 to 20. The aryl group can be a phenyl group, a biphenyl group, a terphenyl group or the like as the monocyclic aryl group, but is not limited thereto. The polycyclic aryl group includes a naphthyl group, an anthracenyl group, a phenanthryl group, a pyrenyl group, a perylenyl group, a chrysenyl group, a fluorenyl group or the like, but is not limited thereto.

In the present specification, a fluorenyl group can be substituted, and two substituent groups can be bonded to each other to form a spiro structure. In the case where the fluorenyl group is substituted,

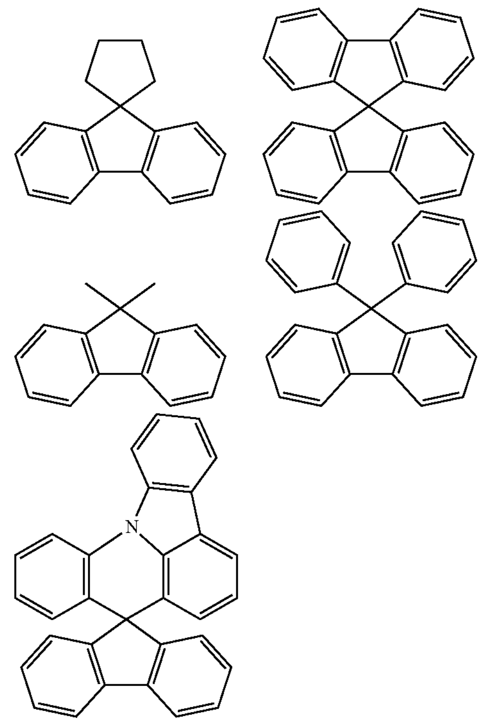

and the like can be formed. However, the structure is not limited thereto.

In the present specification, a heterocyclic group is a heterocyclic group including one or more of O, N, Si and S as a heteroatom, and the number of carbon atoms thereof is not particularly limited, but is preferably 2 to 60. Examples of the heterocyclic group include a thiophene group, a furan group, a pyrrole group, an imidazole group, a thiazole group, an oxazol group, an oxadiazol group, a triazol group, a pyridyl group, a bipyridyl group, a pyrimidyl group, a triazine group, an acridyl group, a pyridazine group, a pyrazinyl group, a quinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzimidazole group, a benzothiazol group, a benzocarbazole group, a benzothiophene group, a dibenzothiophene group, a benzofuranyl group, a phenanthroline group, an isoxazolyl group, a thiadiazolyl group, a phenothiazinyl group, a dibenzofuranyl group, and the like, but are not limited thereto.

In the present specification, the aryl group in the aralkyl group, the aralkenyl group, the alkylaryl group and the arylamine group is the same as the aforementioned examples of the aryl group. In the present specification, the alkyl group in the aralkyl group, the alkylaryl group and the alkylamine group is the same as the aforementioned examples of the alkyl group. In the present specification, the heteroaryl in the heteroarylamine can be applied to the aforementioned description of the heterocyclic group. In the present specification, the alkenyl group in the aralkenyl group is the same as the aforementioned examples of the alkenyl group. In the present specification, the aforementioned description of the aryl group can be applied except that the arylene is a divalent group. In the present specification, the aforementioned description of the heterocyclic group can be applied except that the heteroarylene is a divalent group. In the present specification, the aforementioned description of the aryl group or cycloalkyl group can be applied except that the hydrocarbon ring is not a monovalent group but formed by combining two substituent groups. In the present specification, the aforementioned description of the heterocyclic group can be applied, except that the heterocyclic group is not a monovalent group but formed by combining two substituent groups.

According to the substitution position of $R_1$ in Chemical Formula 1, the Chemical Formula 1 can be any one of the following Chemical Formulas 1-1, 1-2, 1-3, 1-4, or 1-5:

1-1

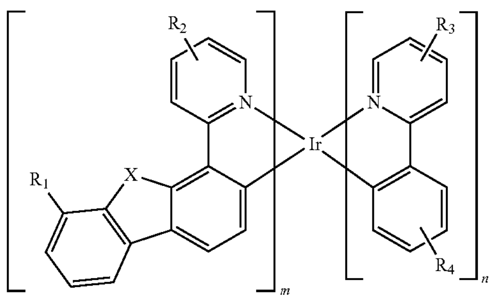

1-2

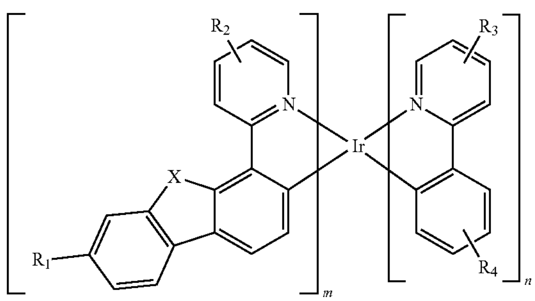

1-3

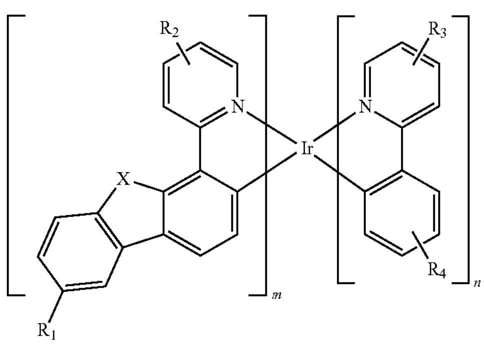

1-4

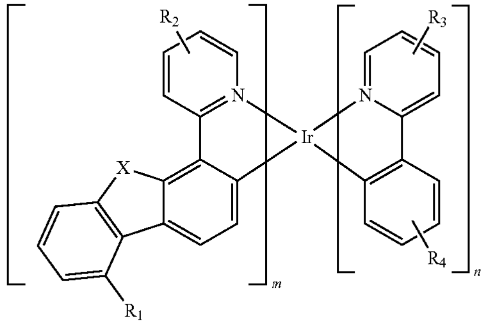

-continued 1-5

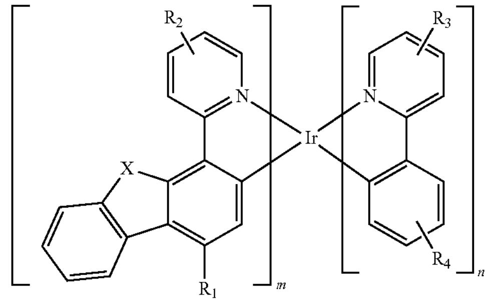

Preferably, $R_1$ is —$Si(CH_3)_3$.

Preferably, $R_2$ is hydrogen, methyl, $CD_3$, ethyl, propyl, isopropyl, cyclopropyl, cyclobutyl, cyclopentyl, or cyclohexyl.

Preferably, $R_3$ is hydrogen, methyl, $CD_3$, ethyl, propyl, isopropyl, cyclopropyl, cyclobutyl, cyclopentyl, or cyclohexyl.

Preferably, $R_4$ is hydrogen.

Further, preferably, the triplet energy level of the compound of Chemical Formula 1 is 2.6 eV or less, more preferably 2.45 eV to 2.6 eV.

Further, preferably, the maximum light emission wavelength of the compound of Chemical Formula 1 is 500 nm to 550 nm, more preferably 520 nm to 535 nm.

Representative examples of the compound of Chemical Formula 1 are as follows:

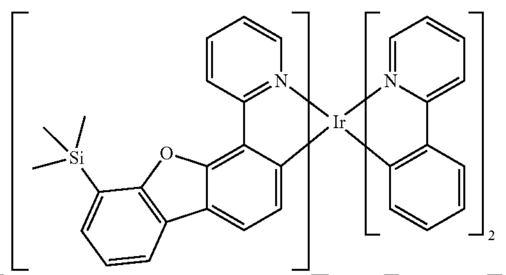

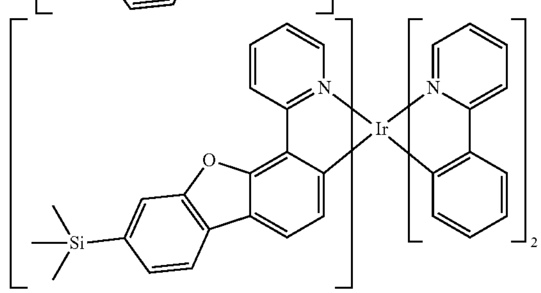

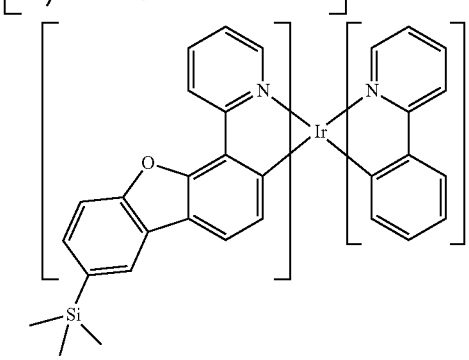

-continued
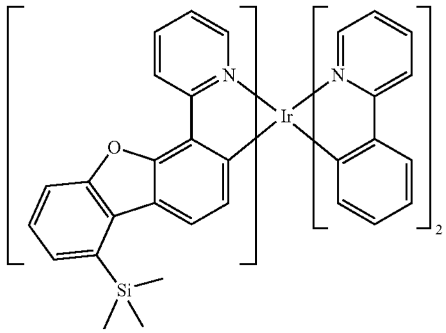
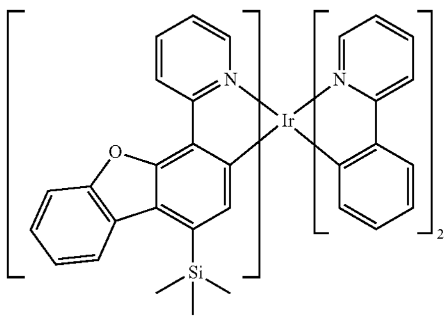
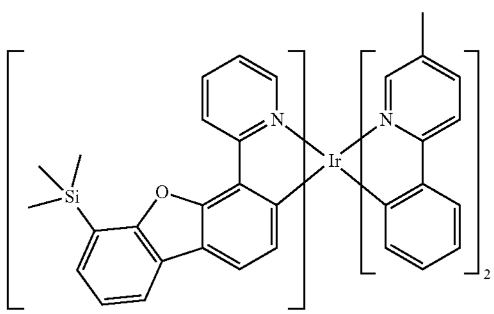
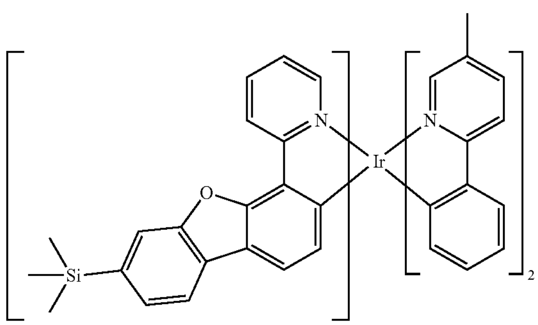
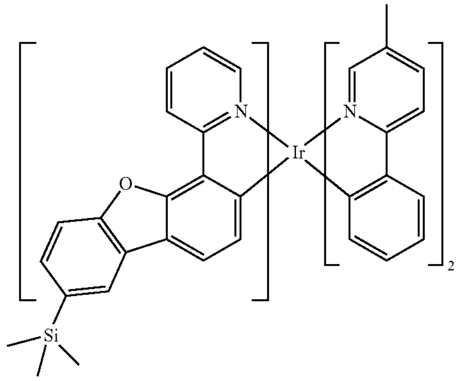
-continued
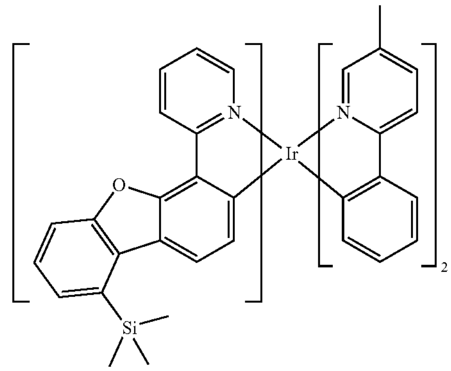
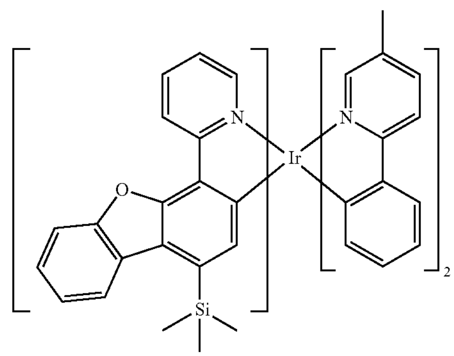
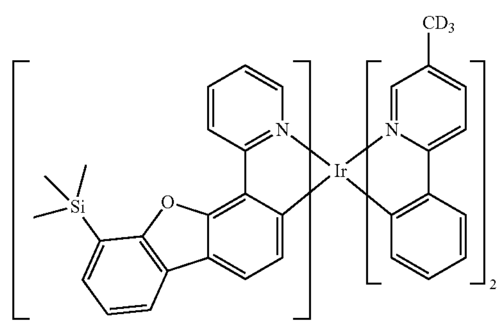
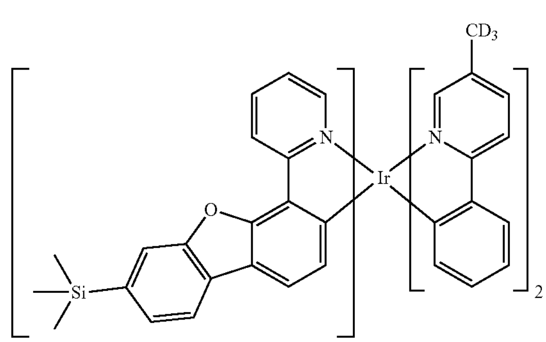

-continued
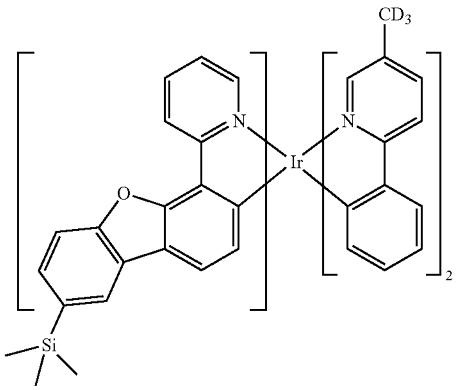
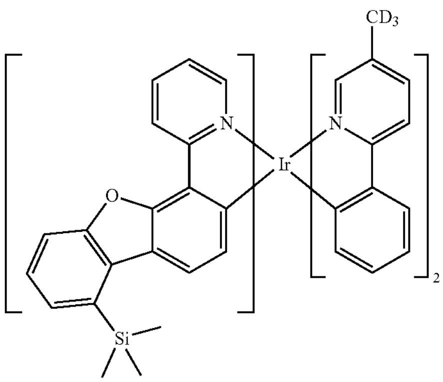
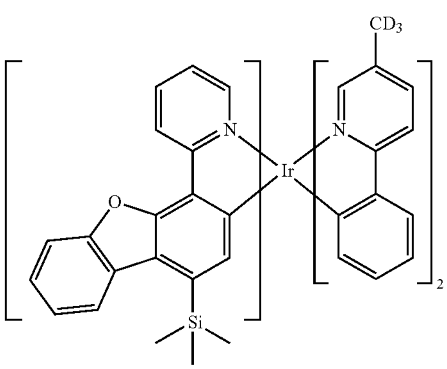
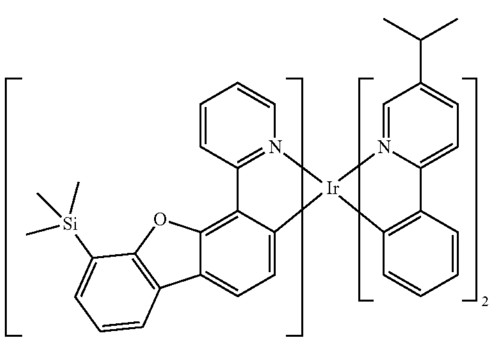
-continued
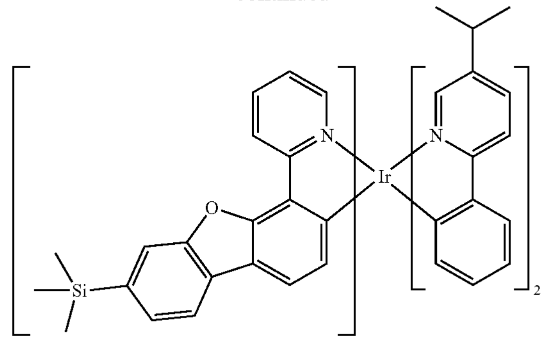
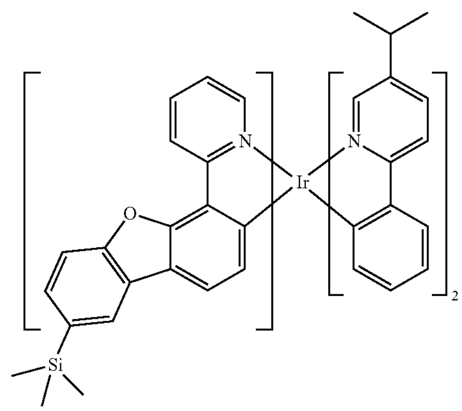
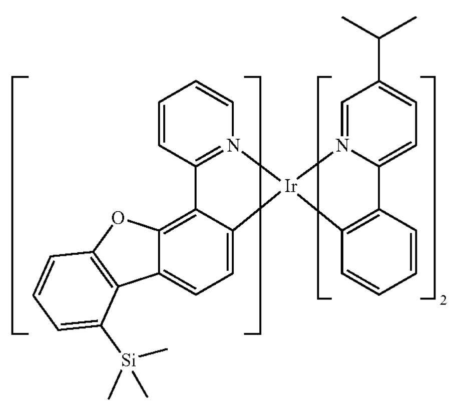
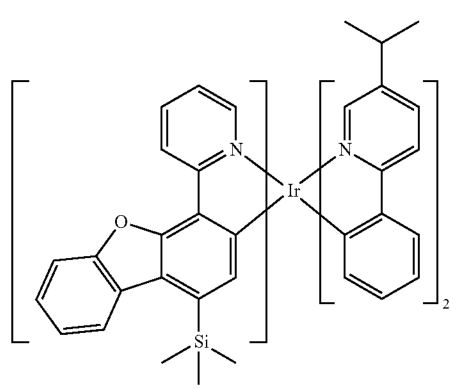

-continued
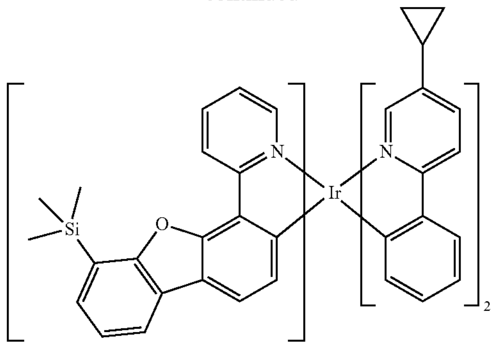
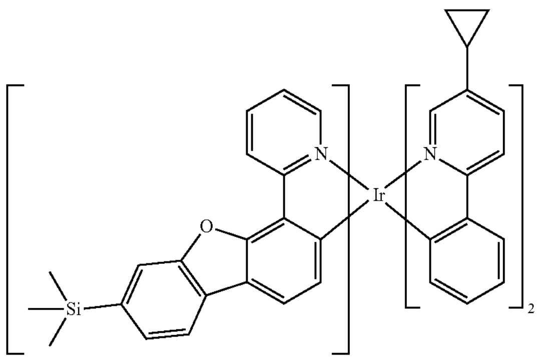
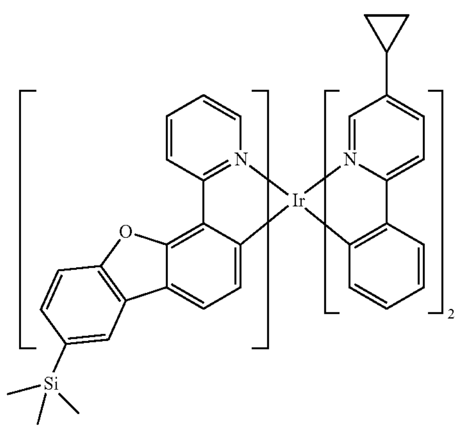
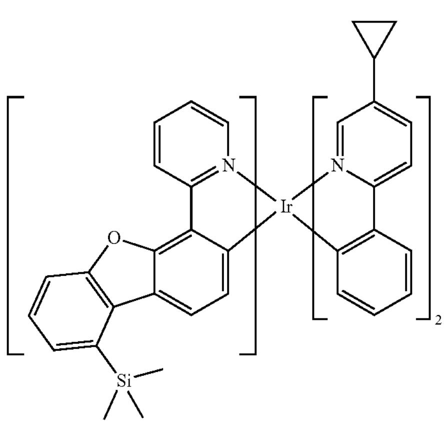
-continued
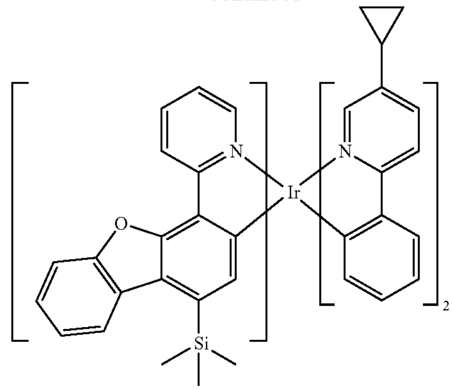
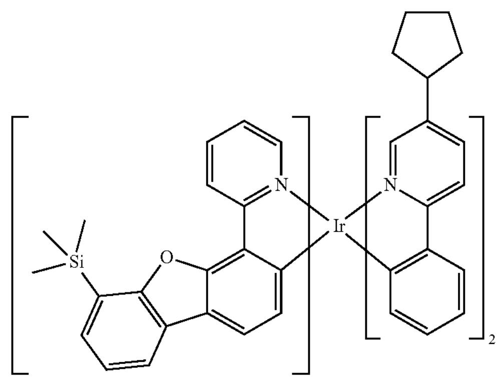
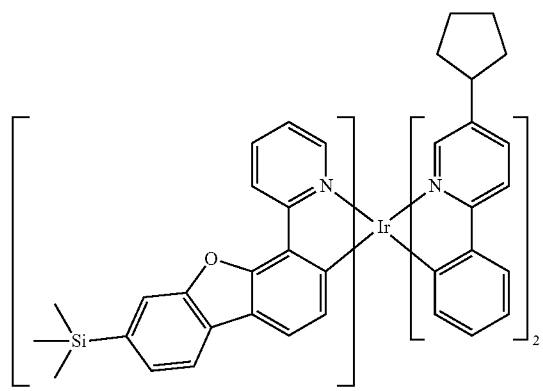
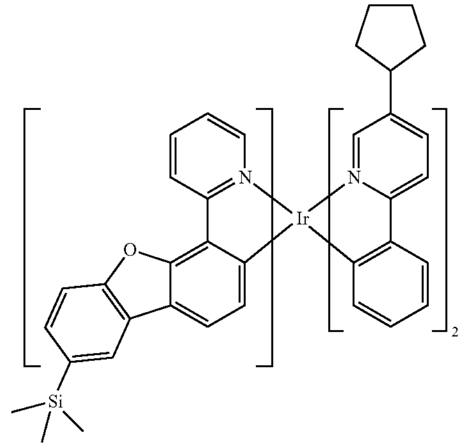

-continued
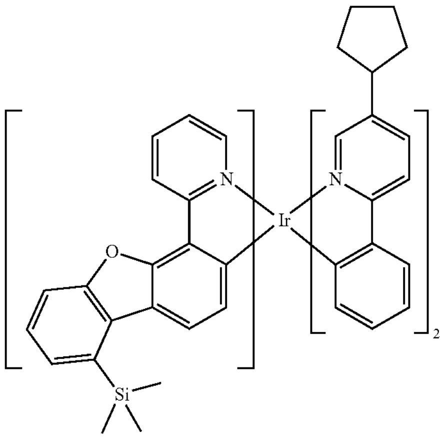
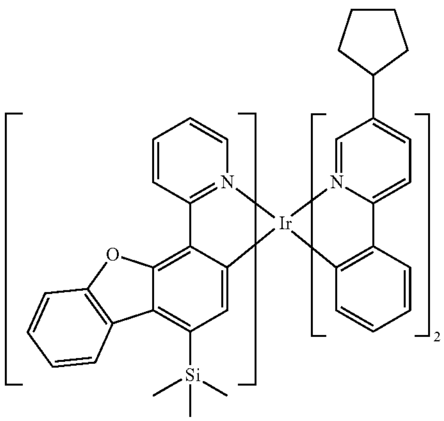
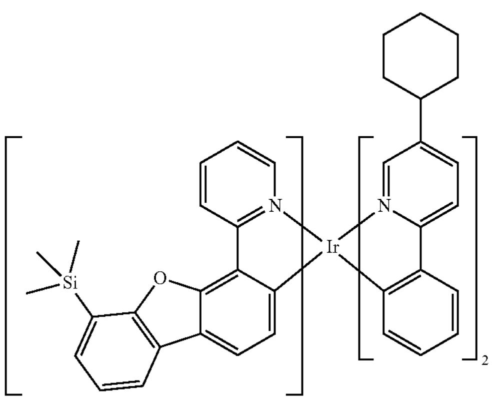
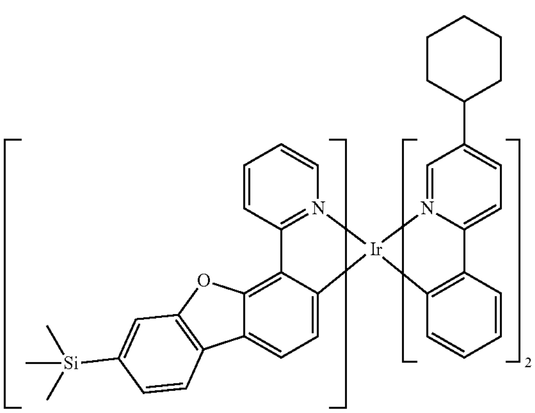
-continued
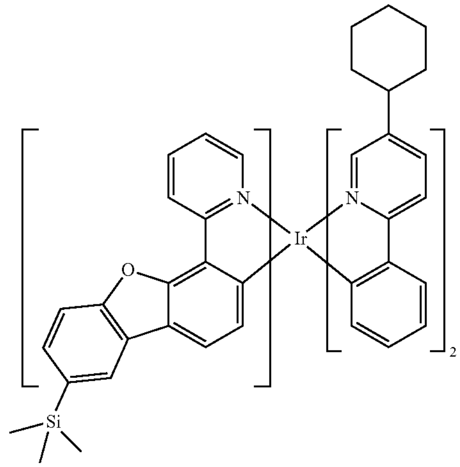
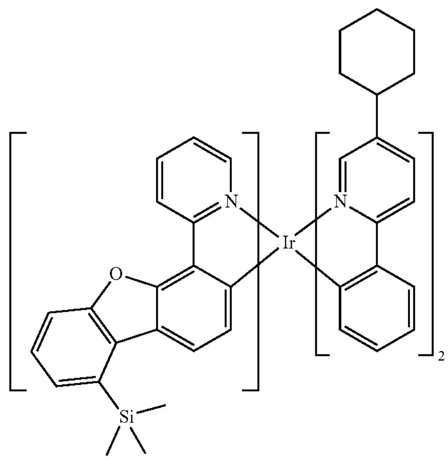
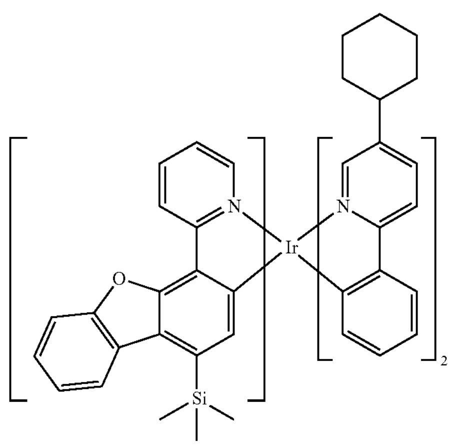
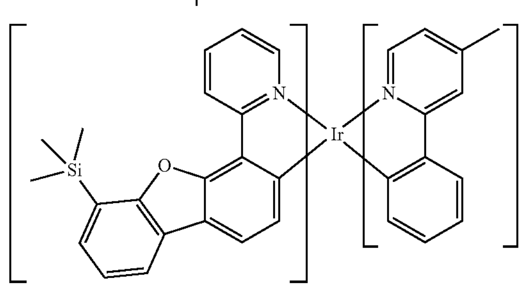

-continued
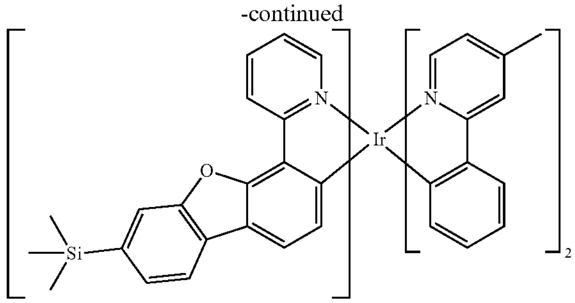
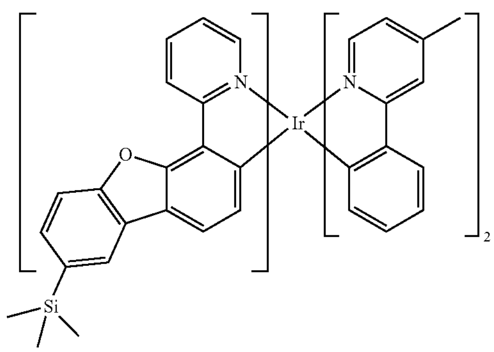
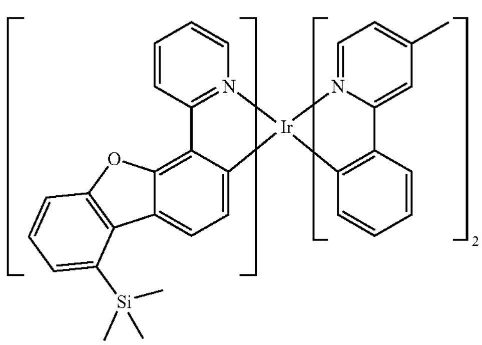
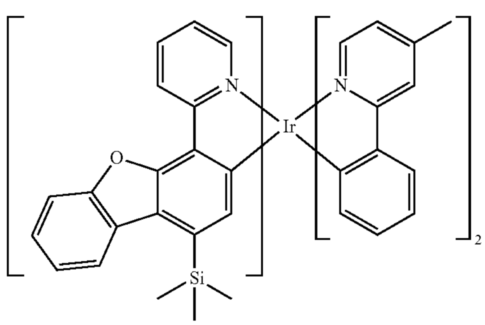
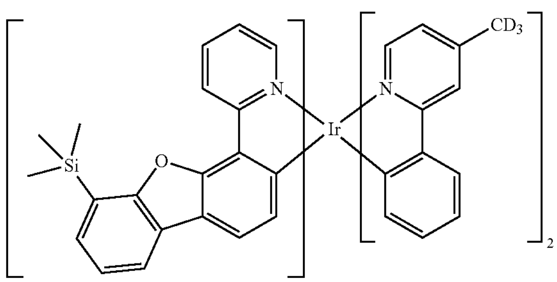
-continued
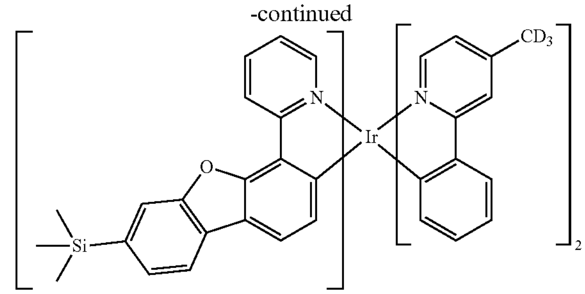
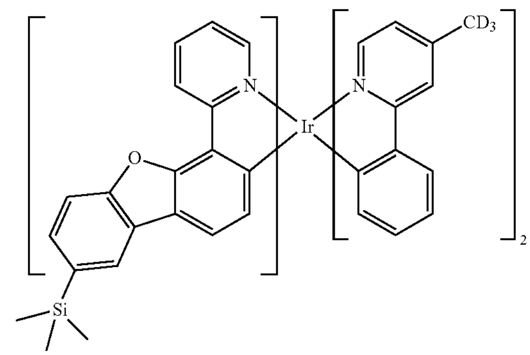
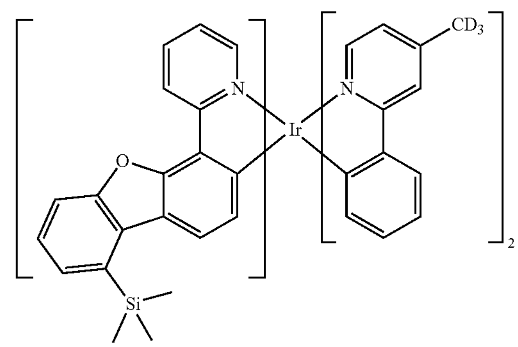
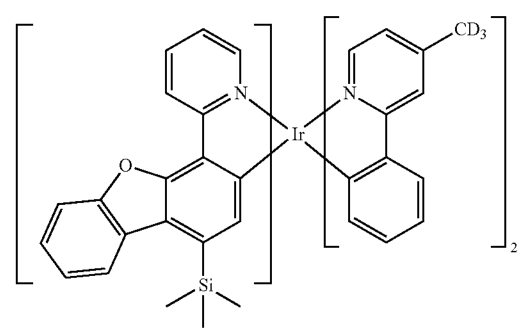
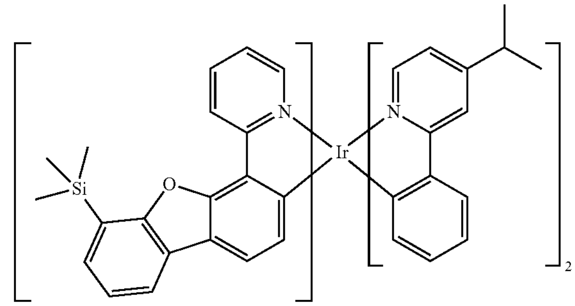

-continued
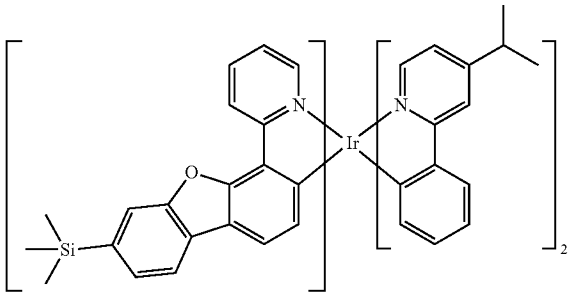
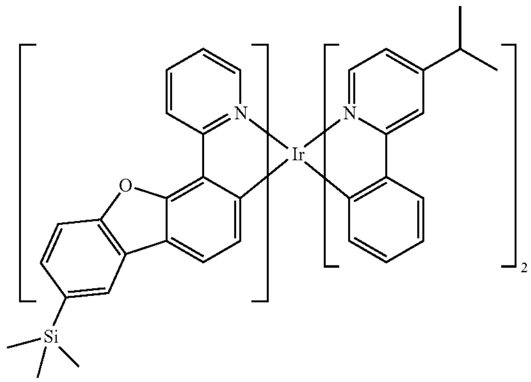
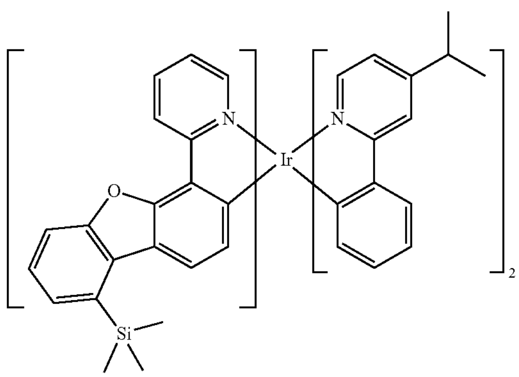
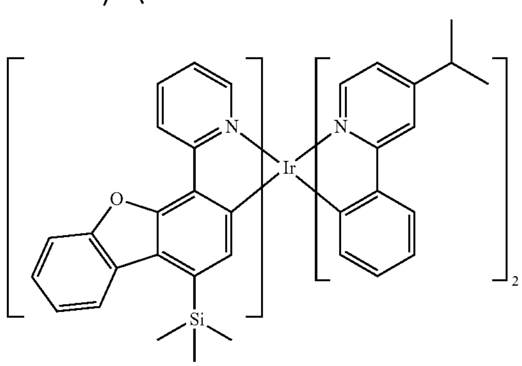
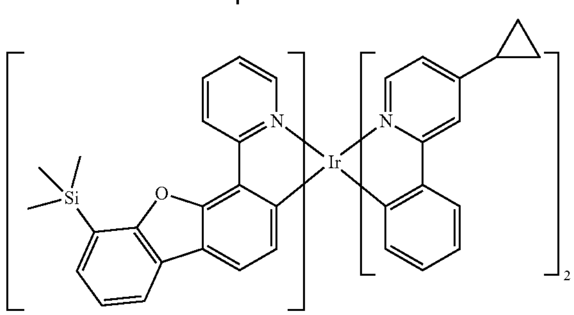
-continued
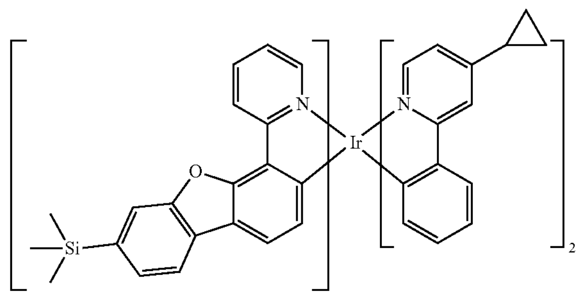
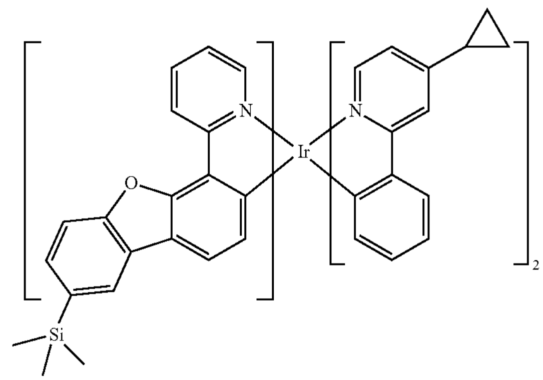
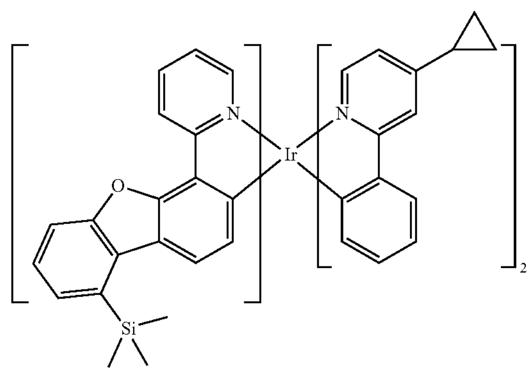
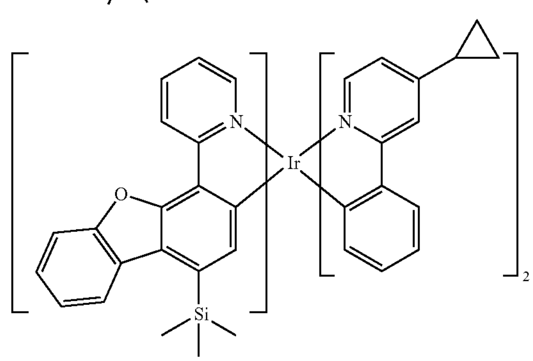
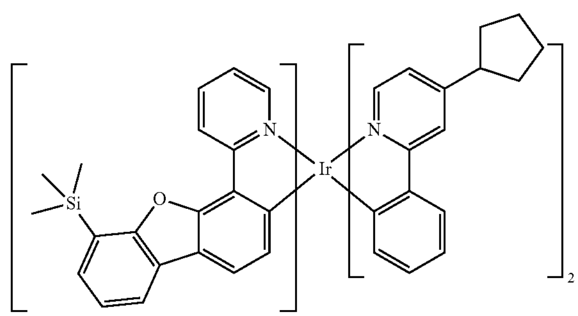

-continued
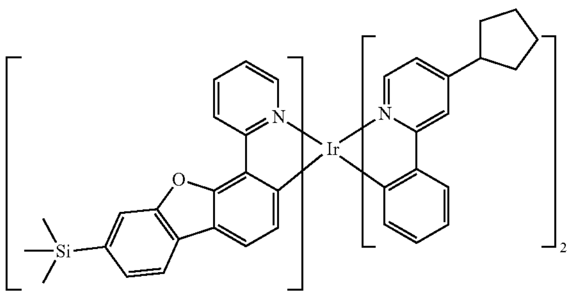
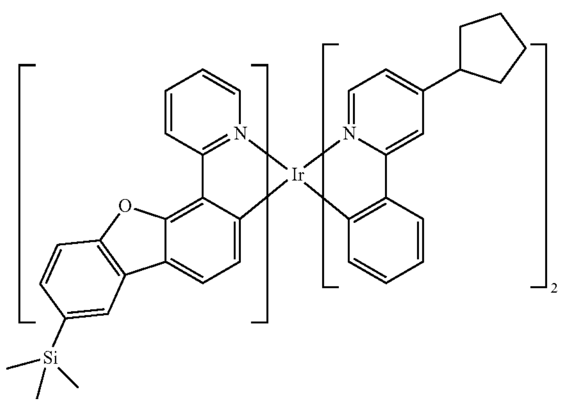
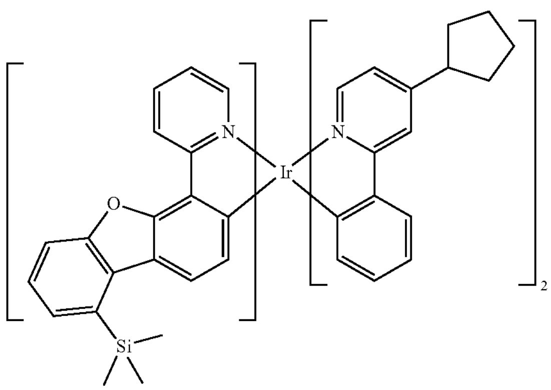
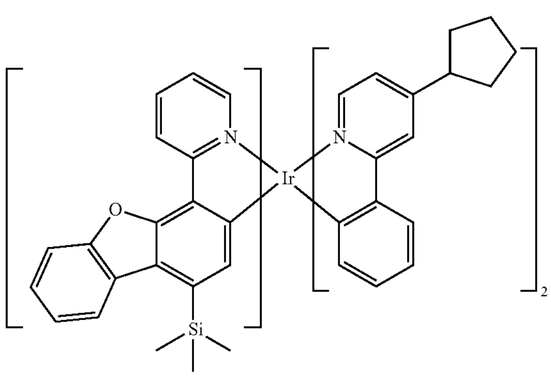
-continued
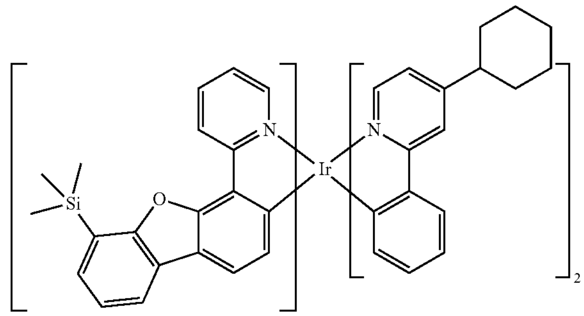
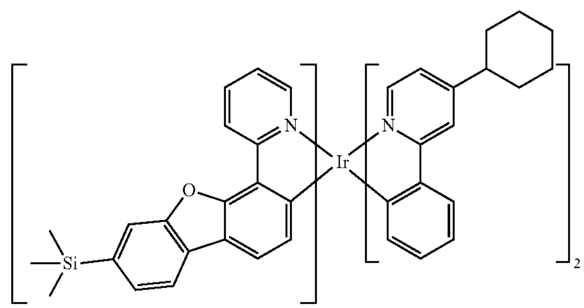
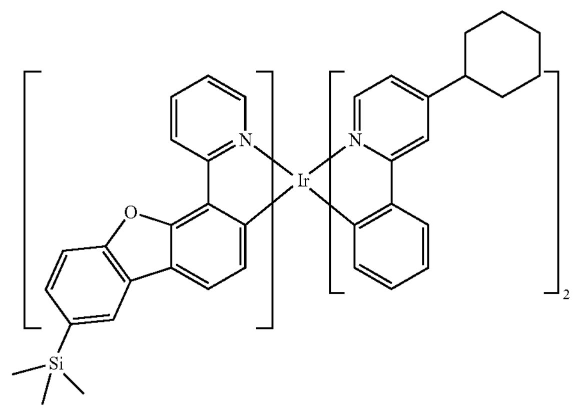
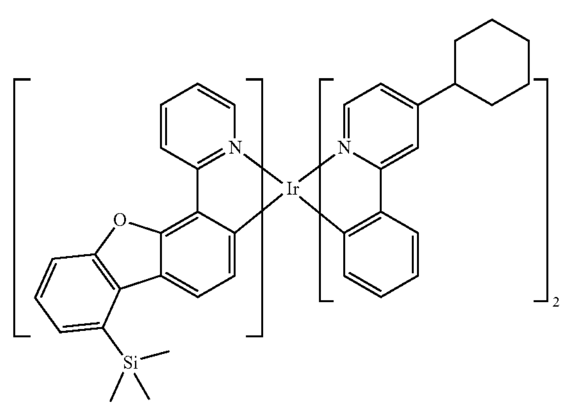

-continued
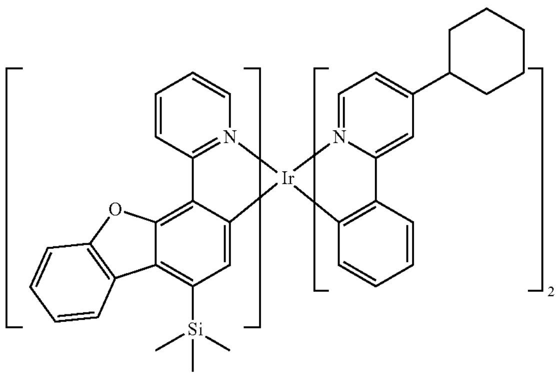
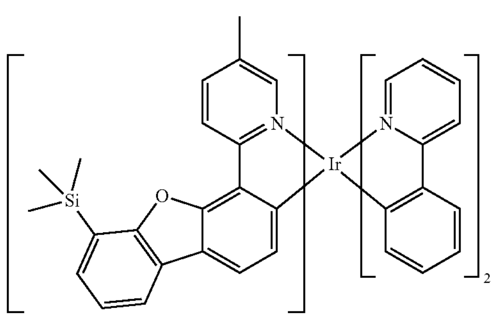
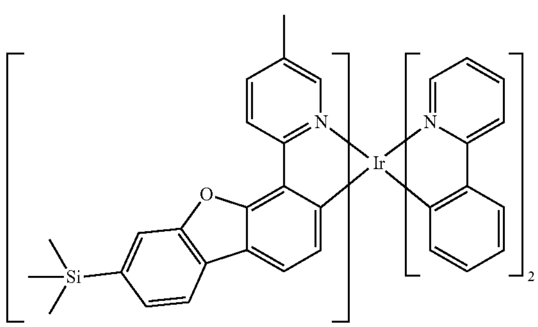
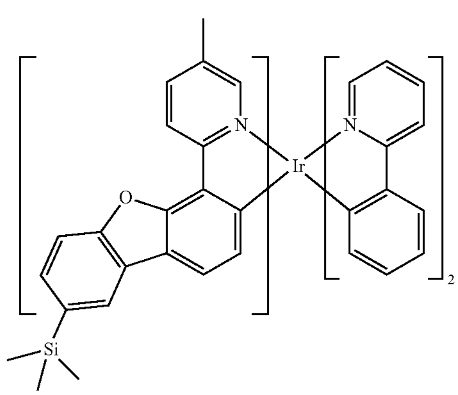
-continued
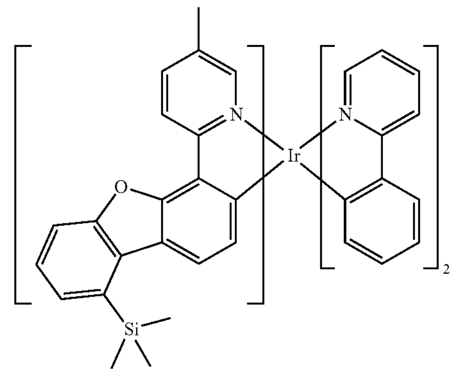
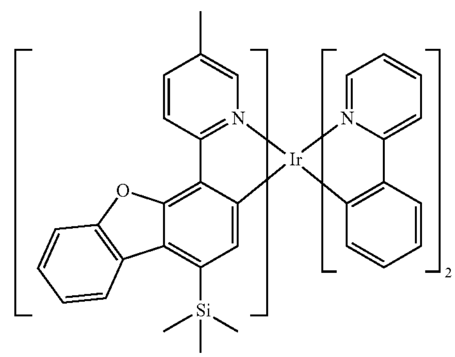
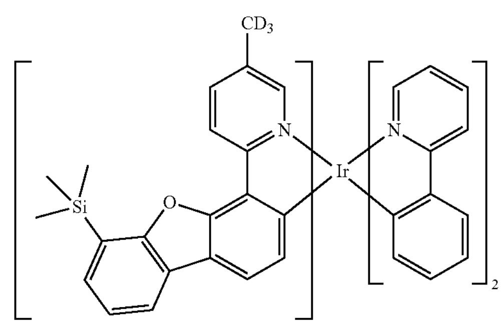
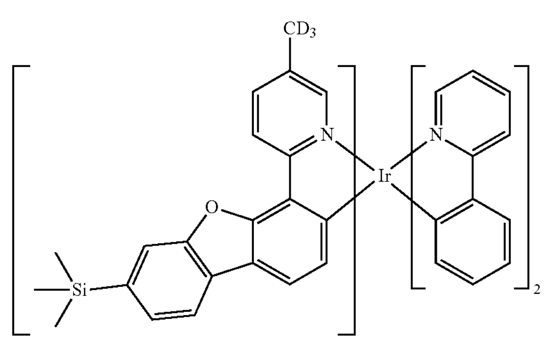

-continued
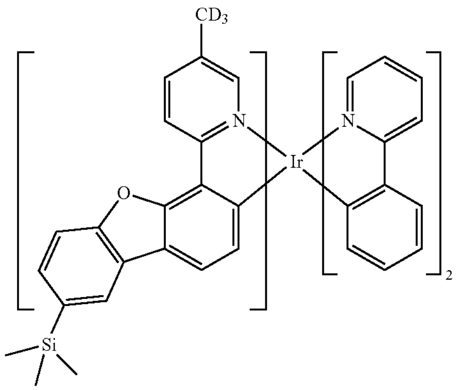
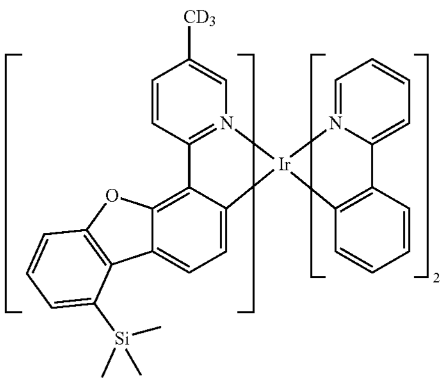
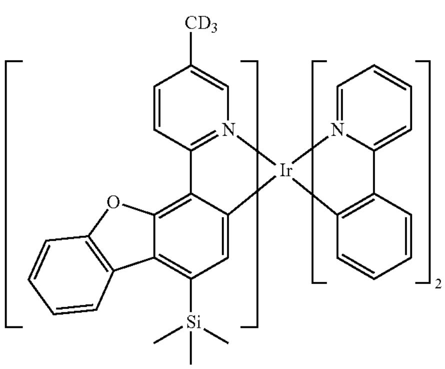
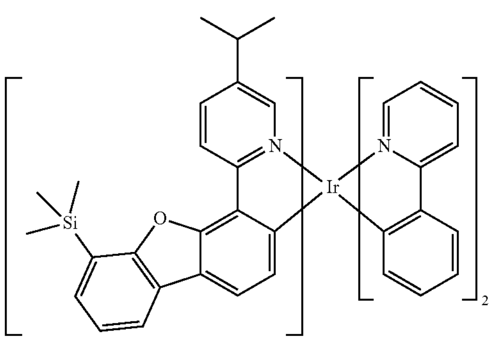
-continued
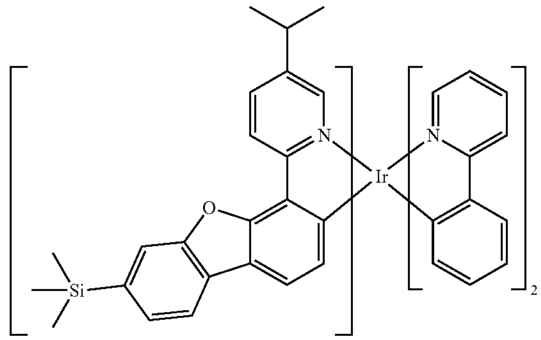
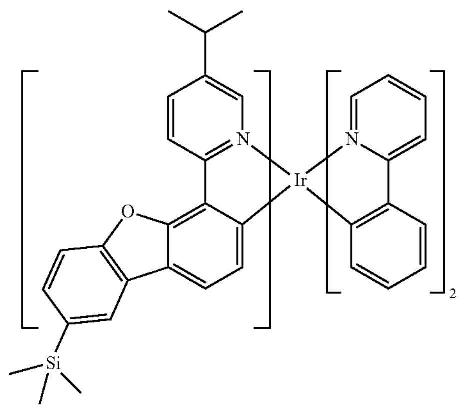
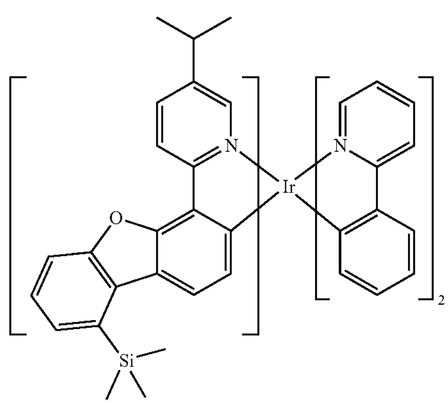
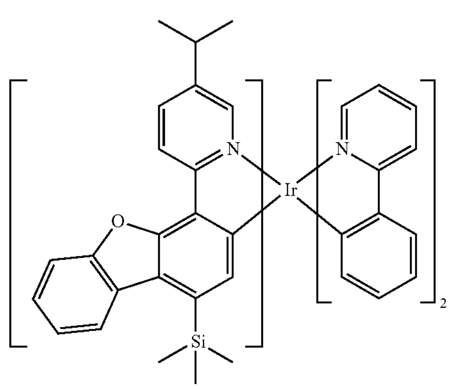

-continued
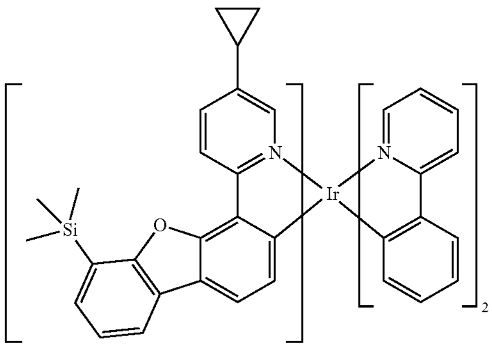
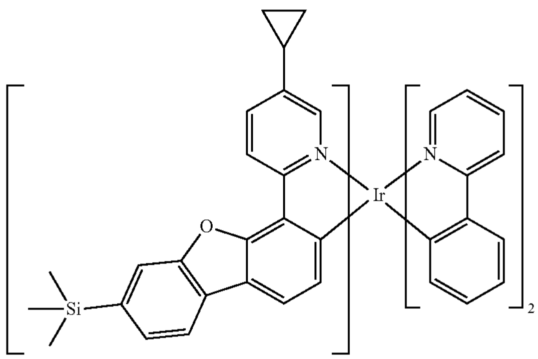
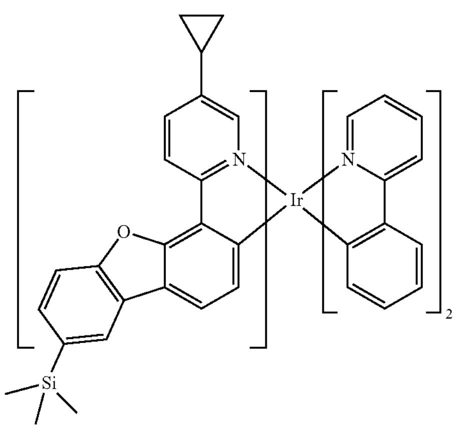
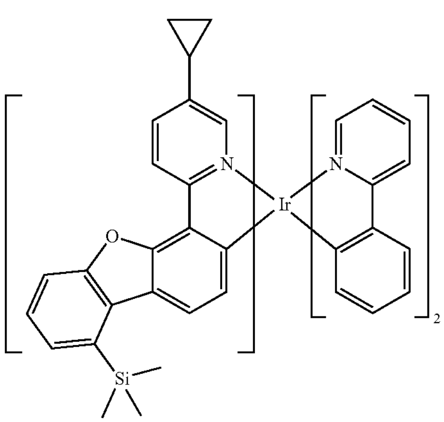
-continued
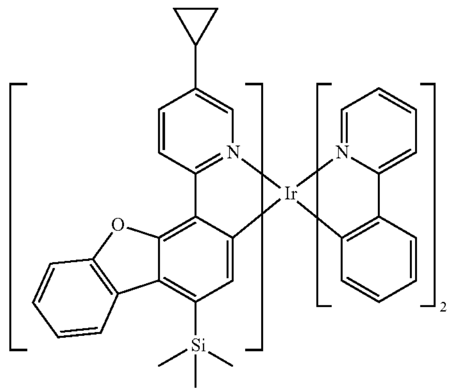
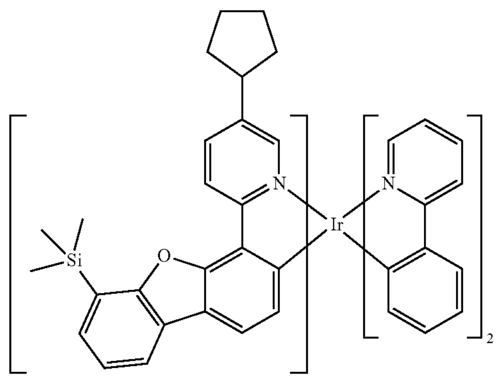
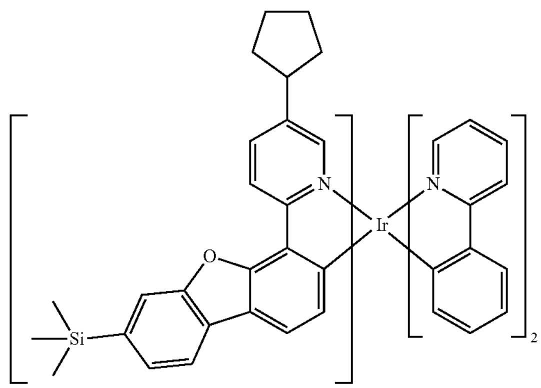
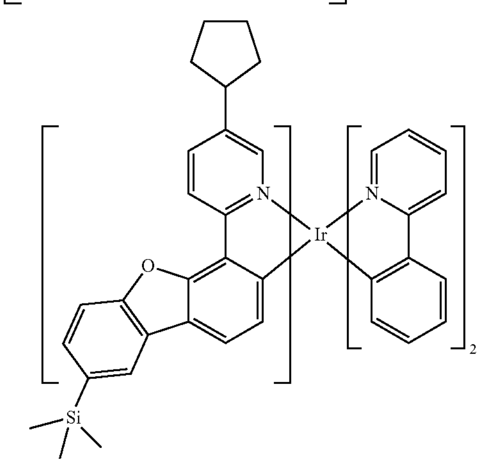

-continued
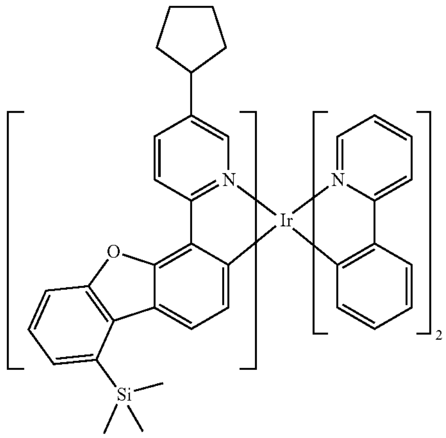
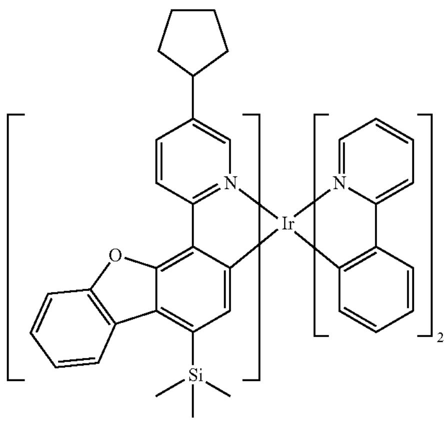
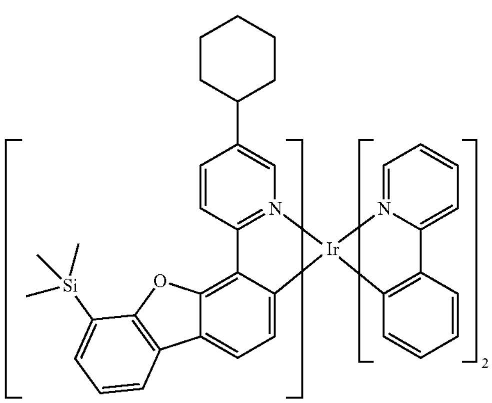
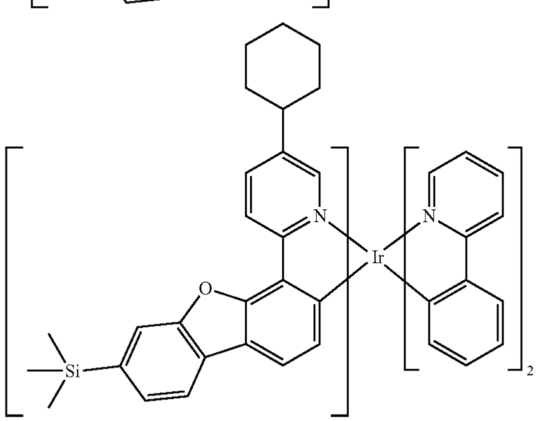
-continued
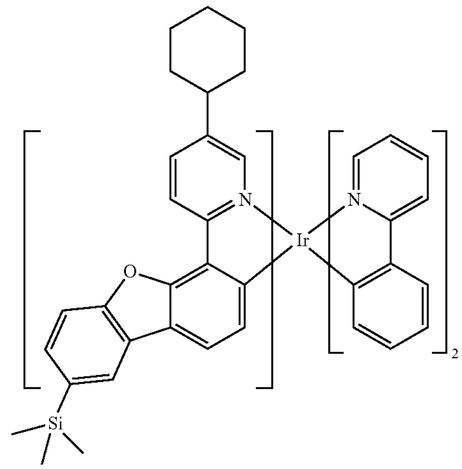
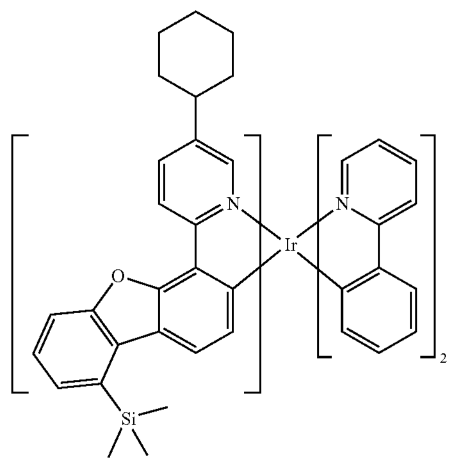
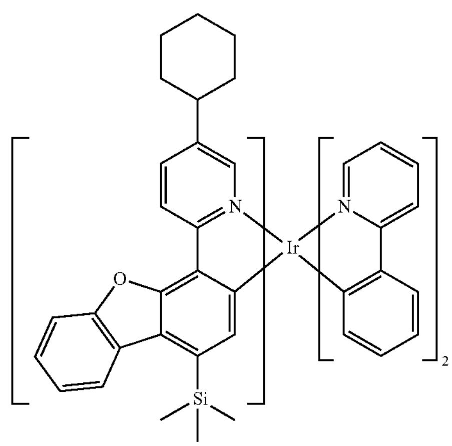
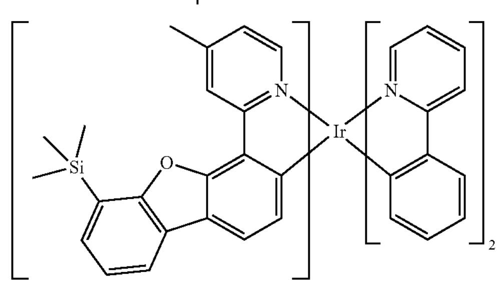

-continued
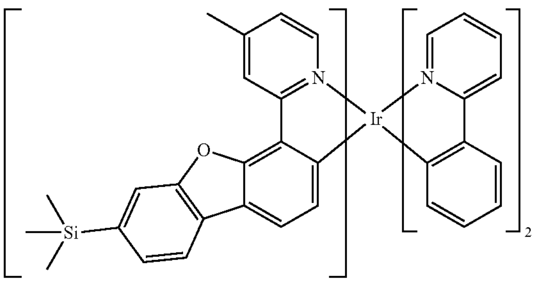
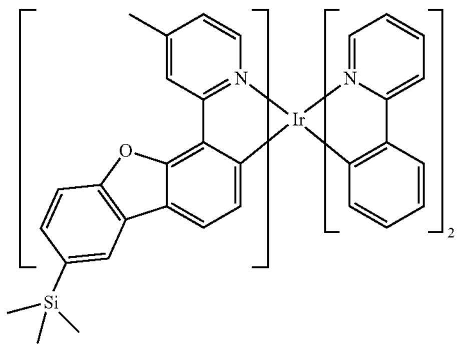
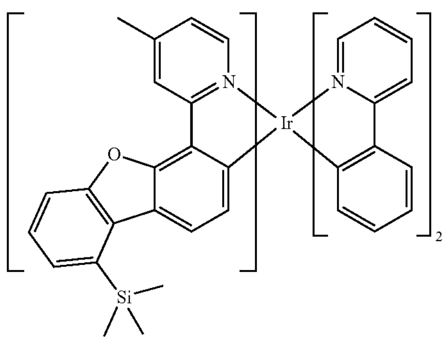
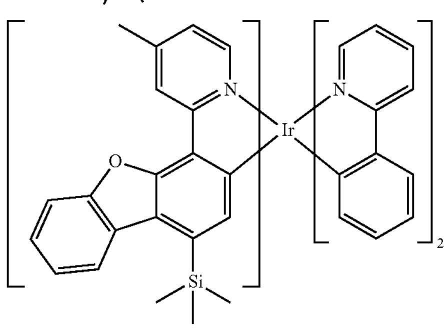
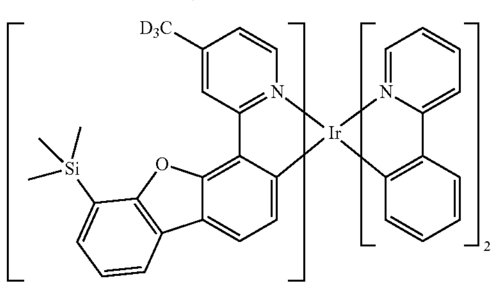
-continued
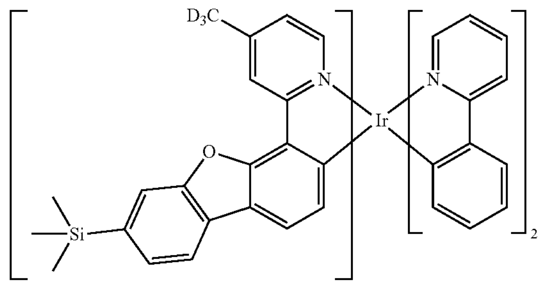
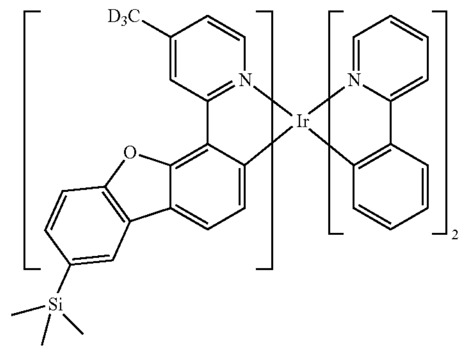
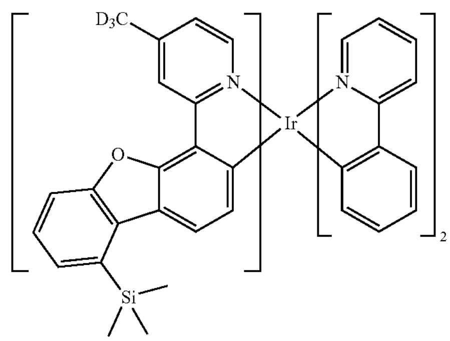
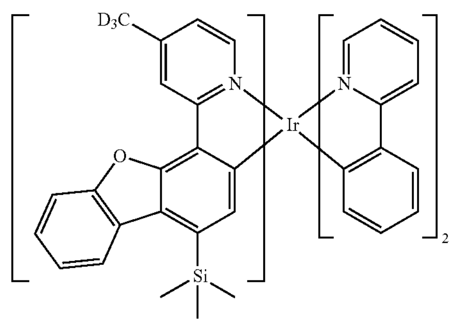
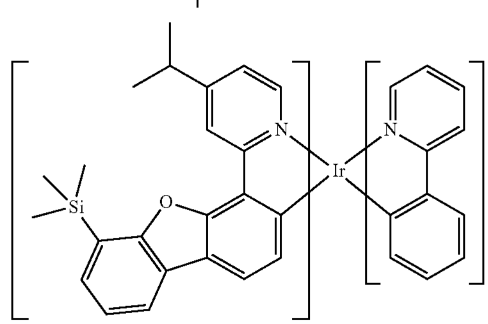

-continued
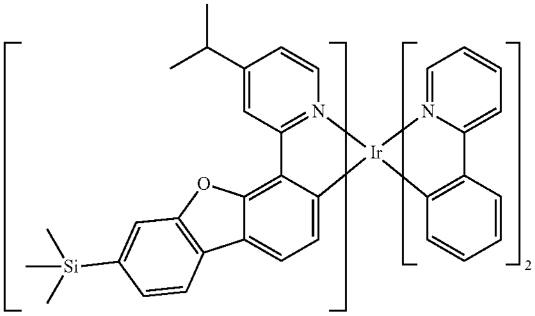
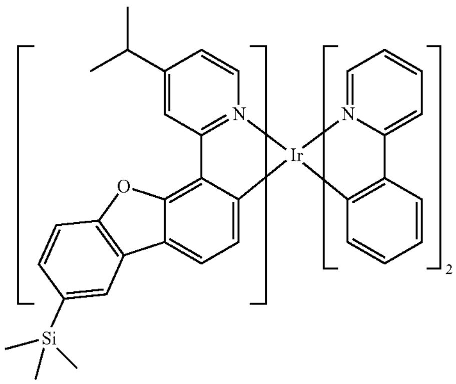
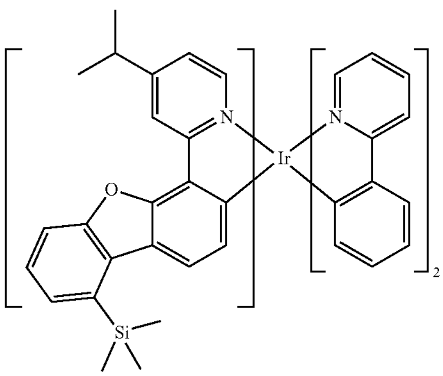
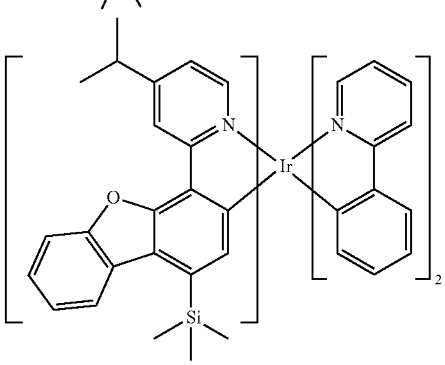
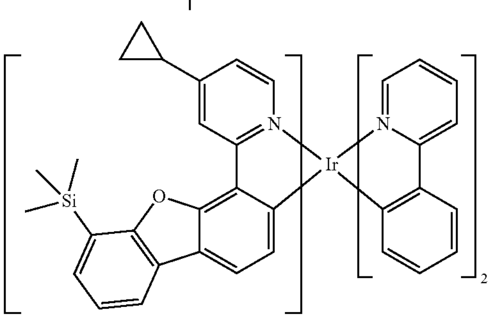
-continued
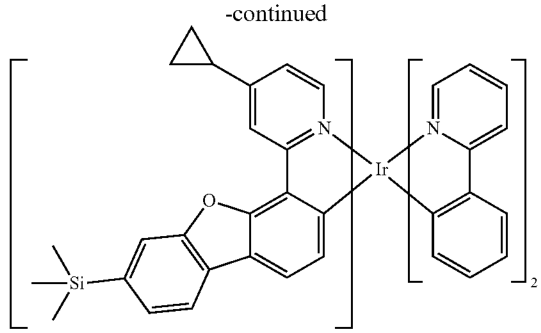
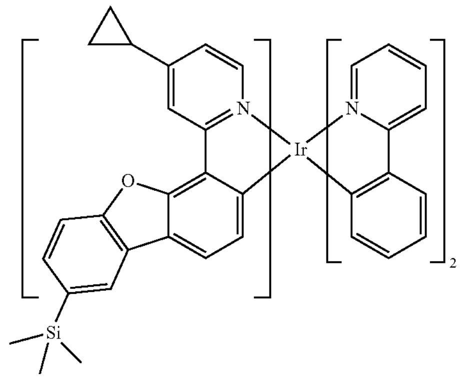
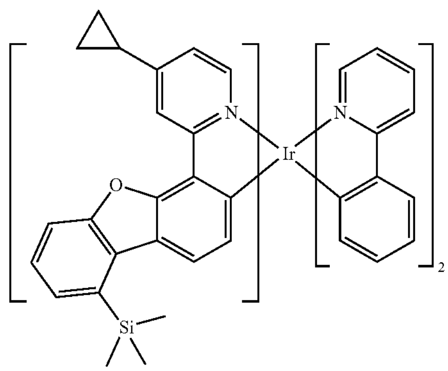
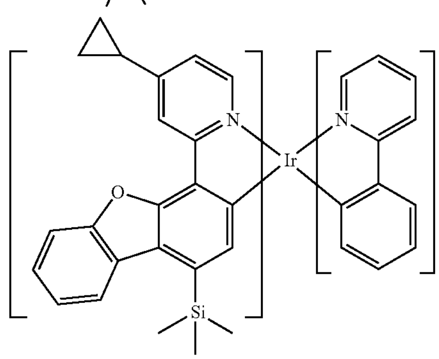
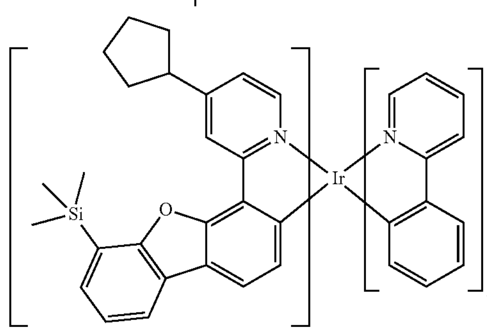

-continued
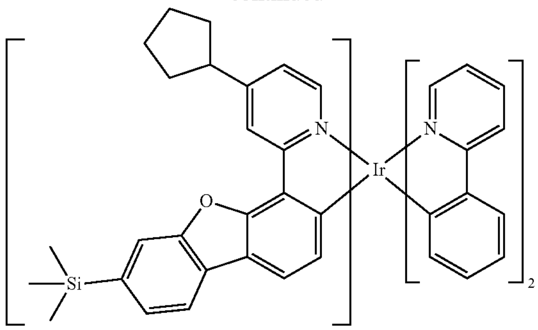
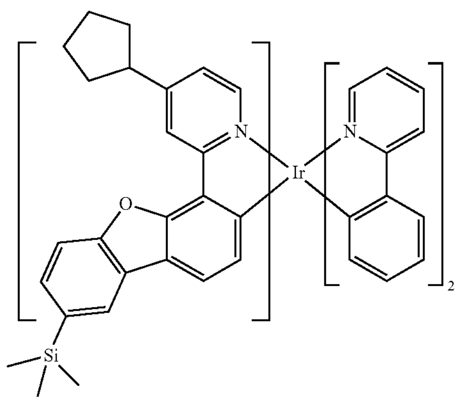
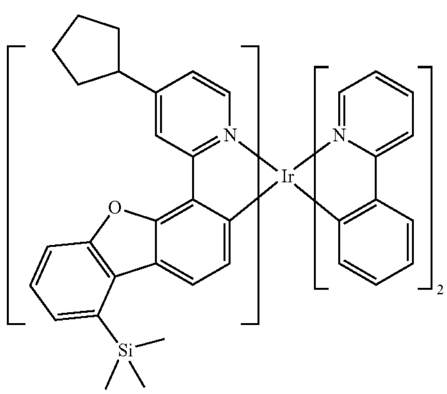
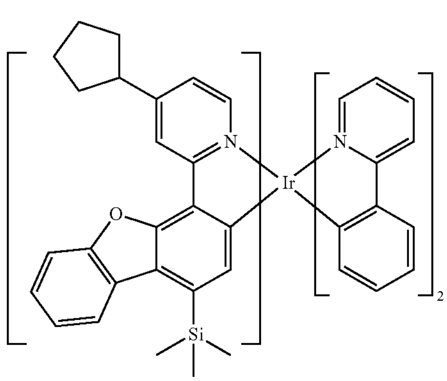
-continued
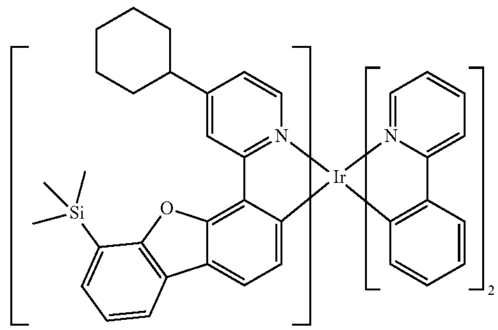
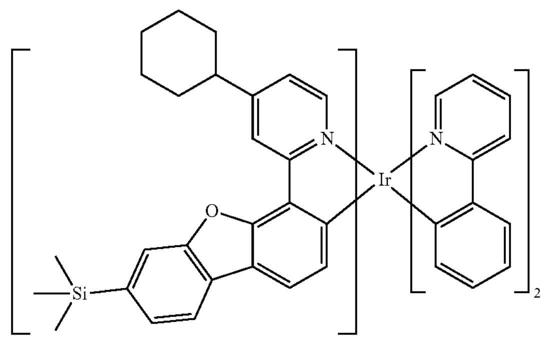
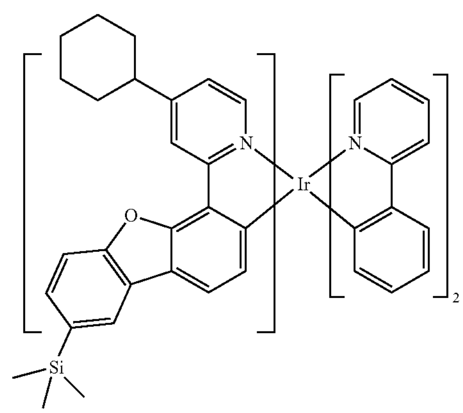
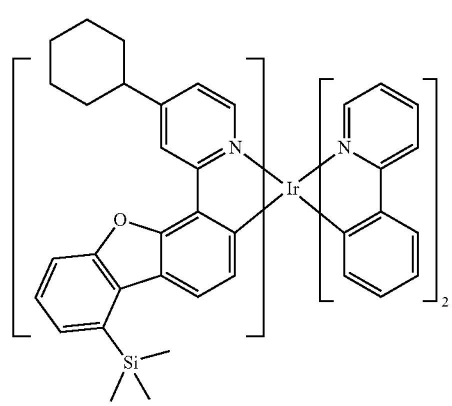

-continued
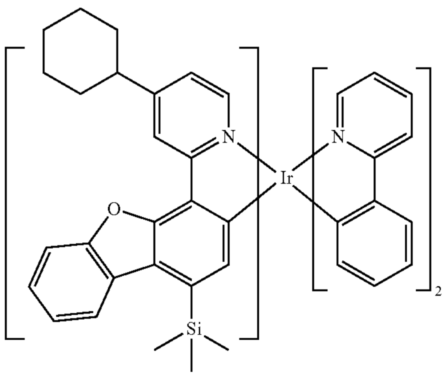
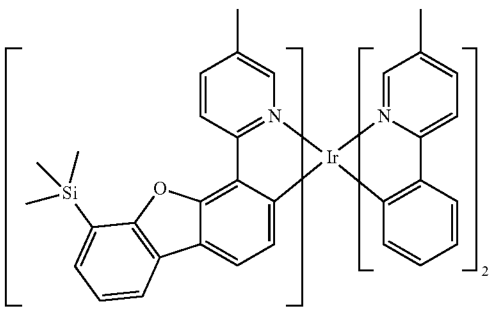
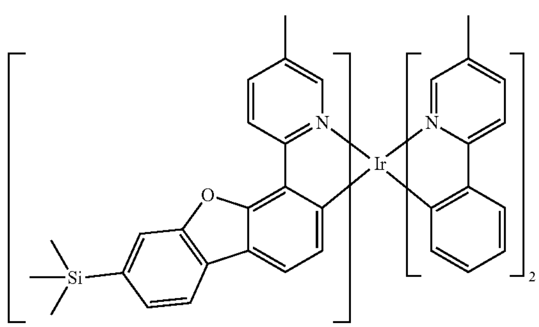
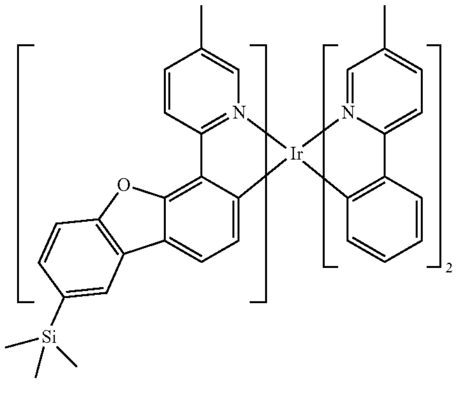
-continued
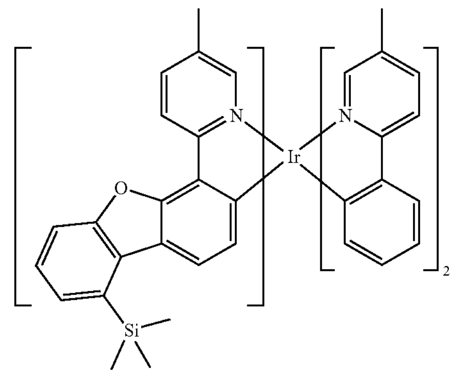
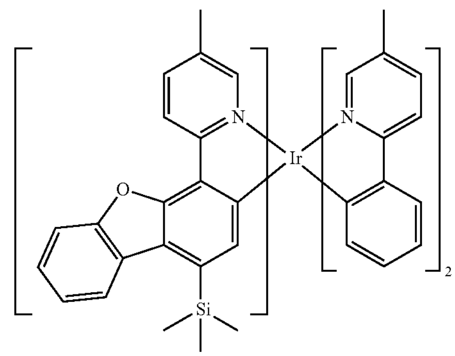
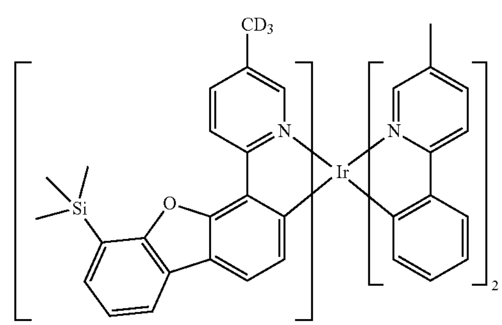
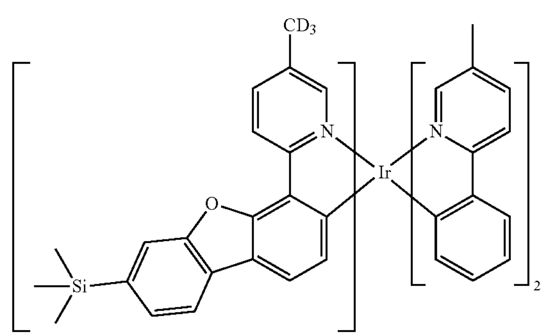

-continued
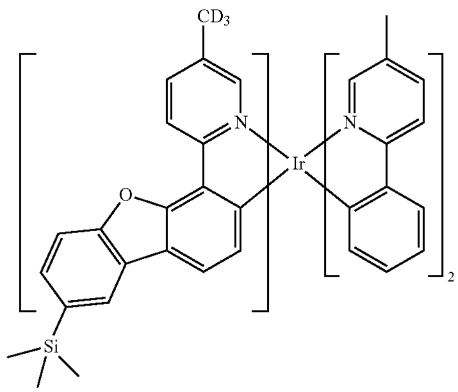
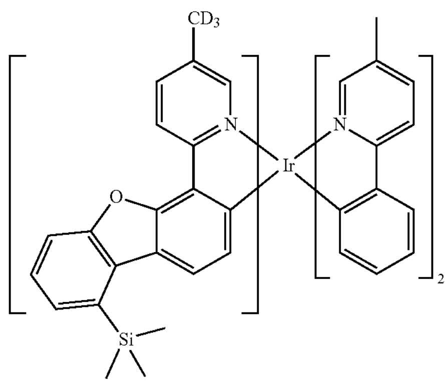
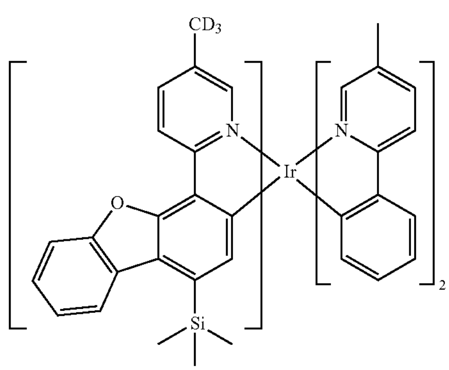
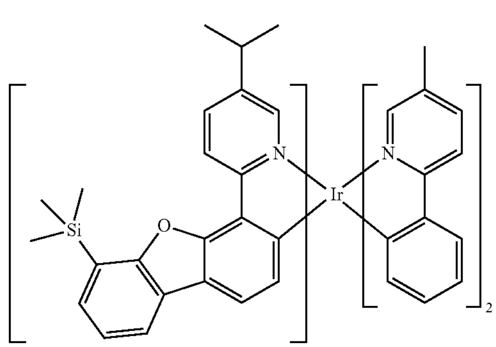
-continued
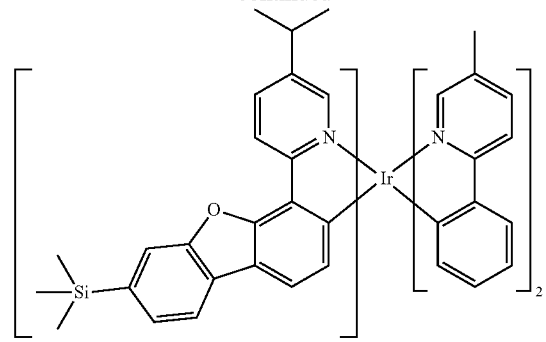
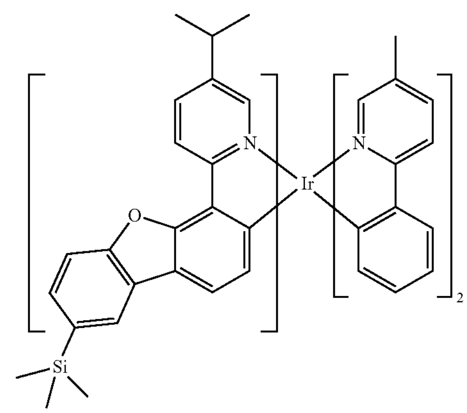
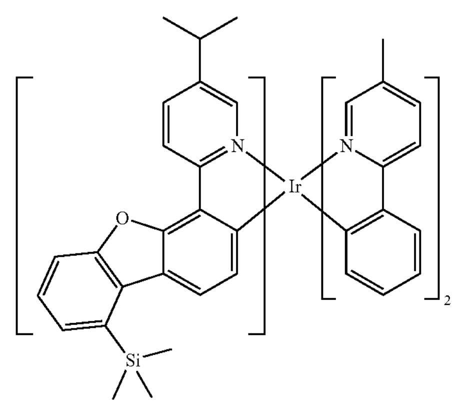
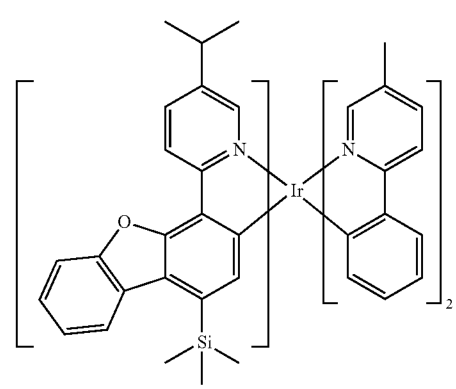

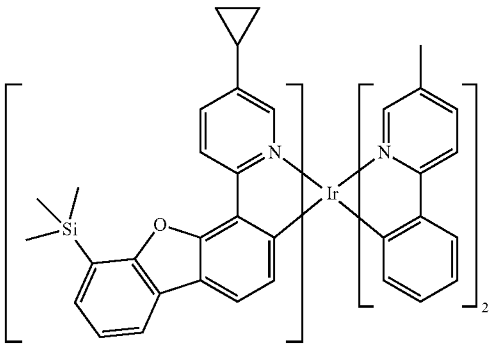
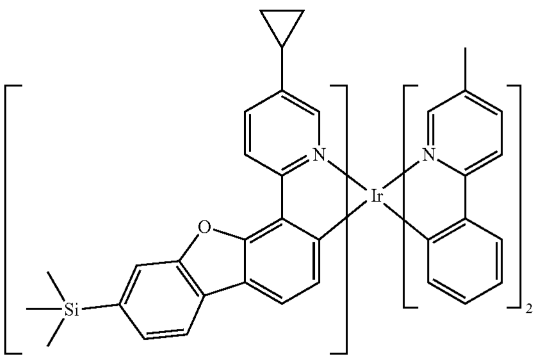
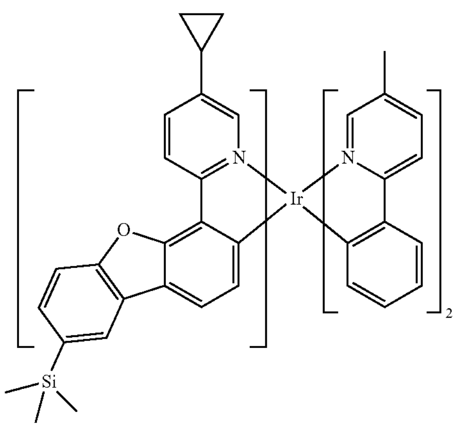
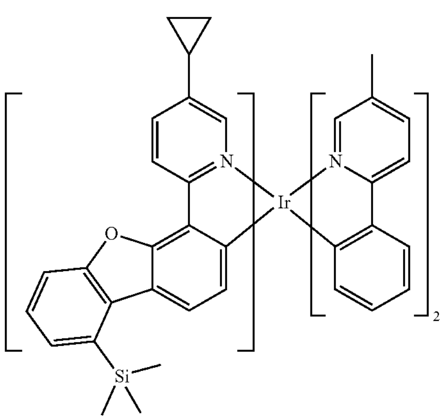
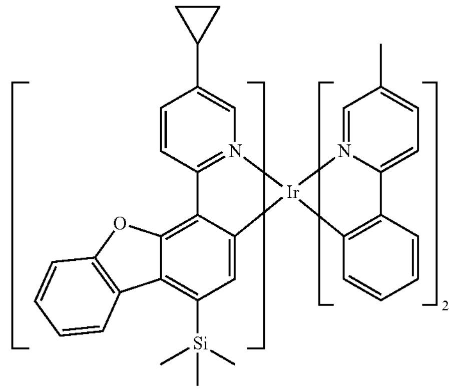
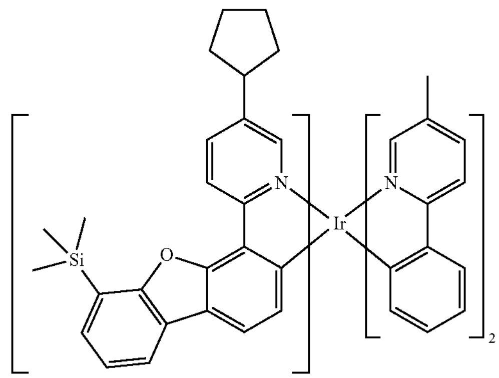
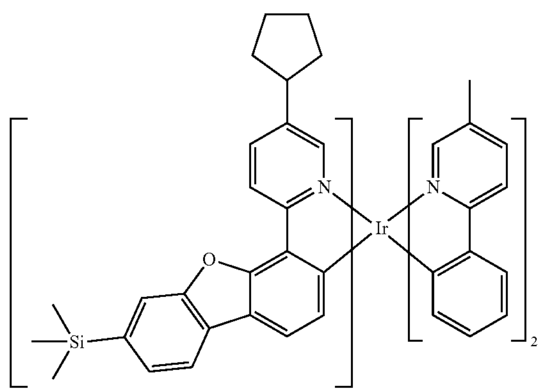
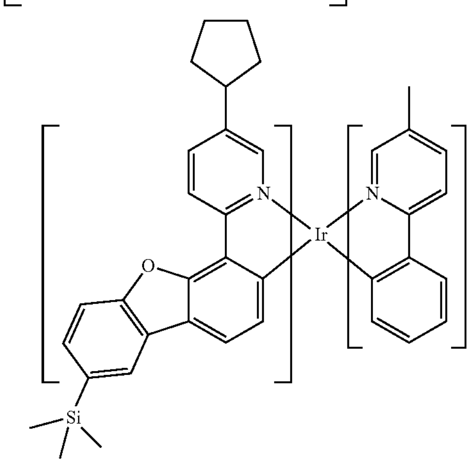

-continued
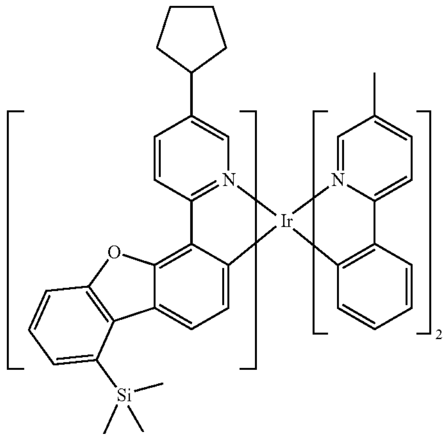
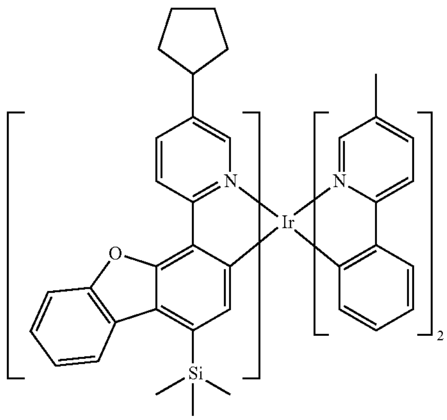
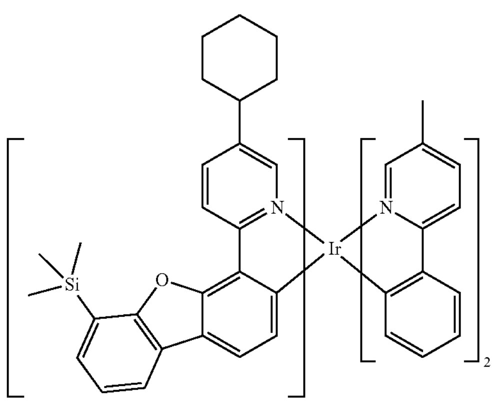
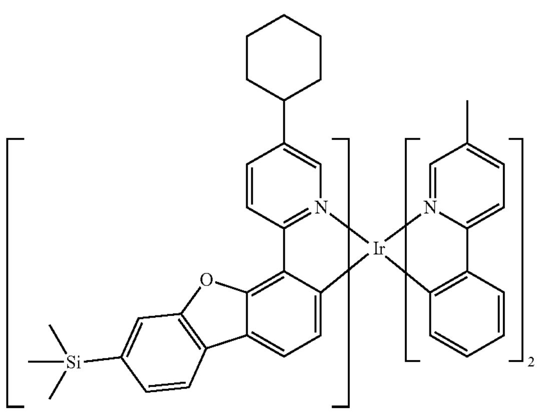
-continued
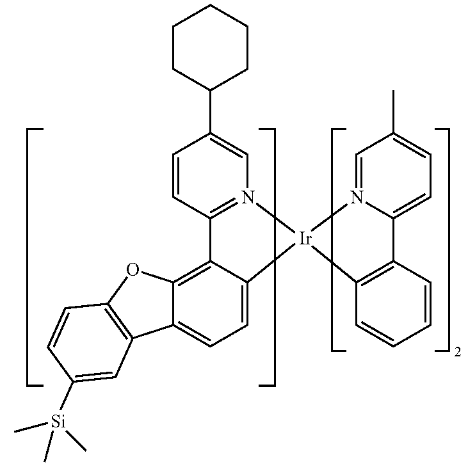
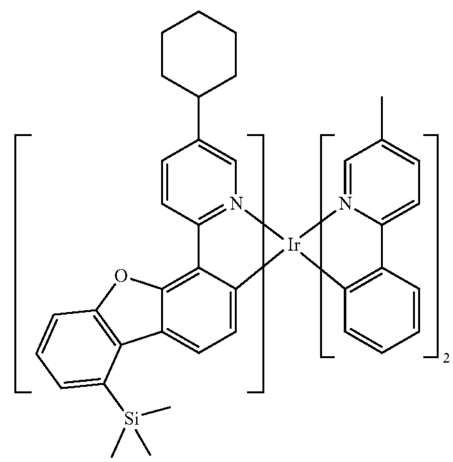
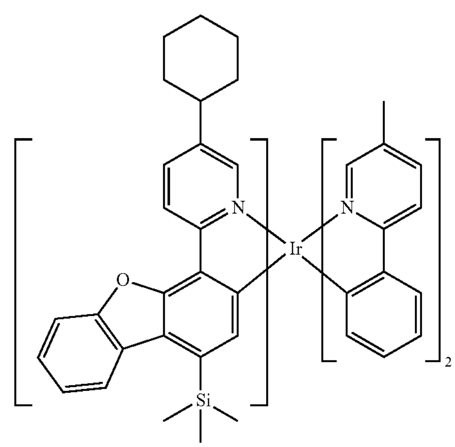
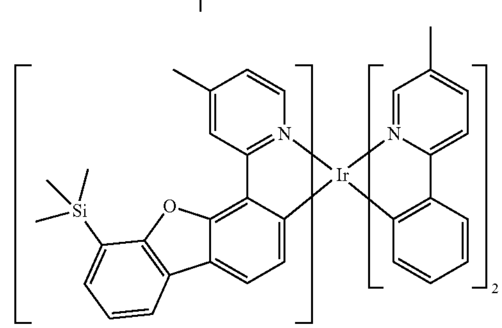

-continued
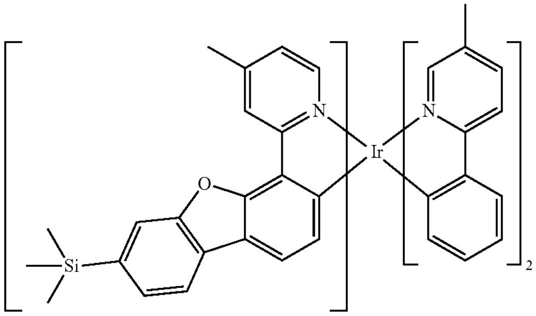
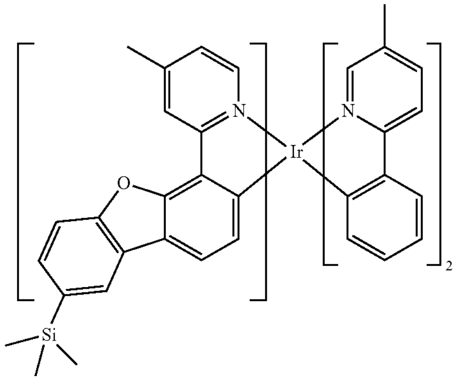
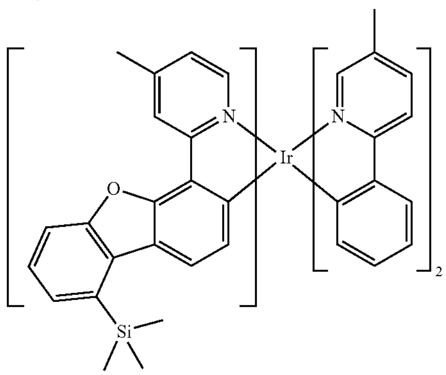
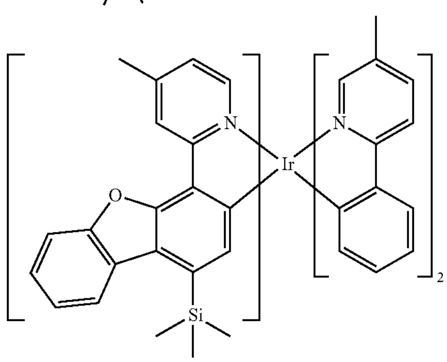
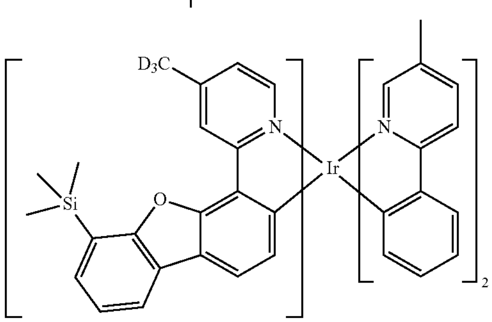
-continued
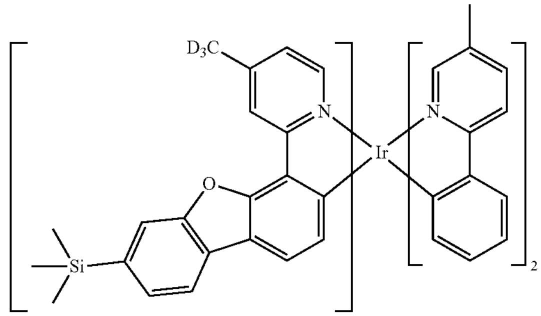
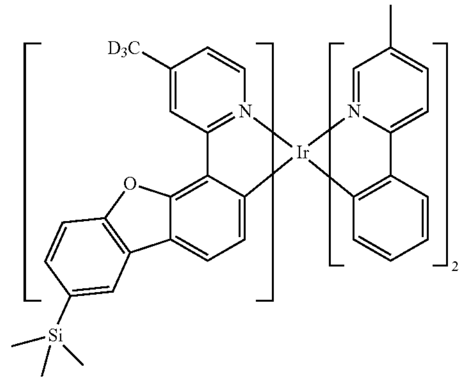
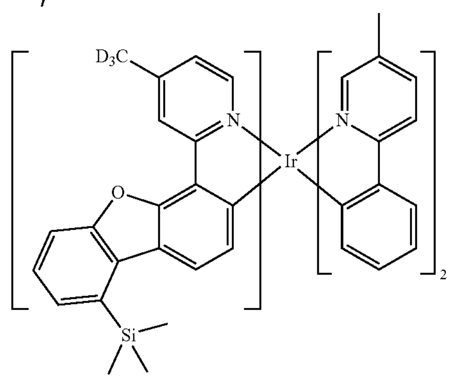
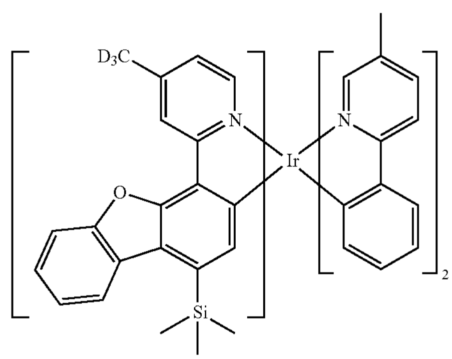
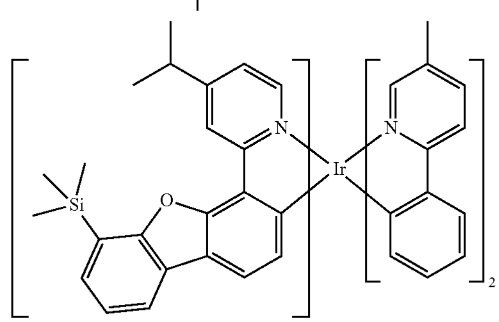

-continued
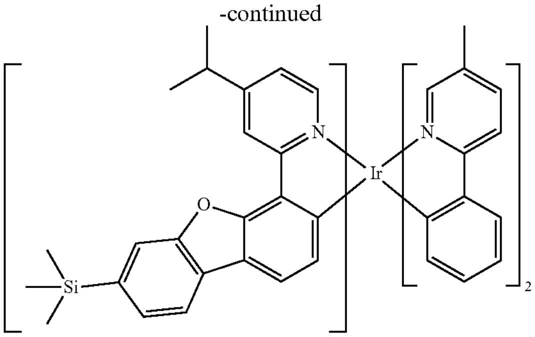
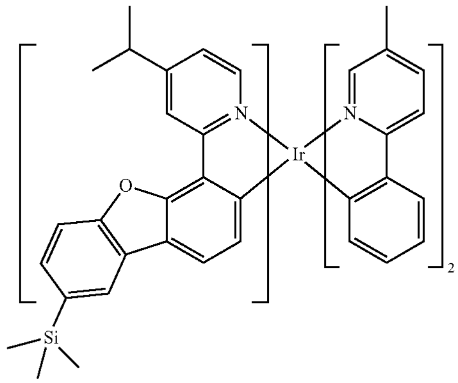
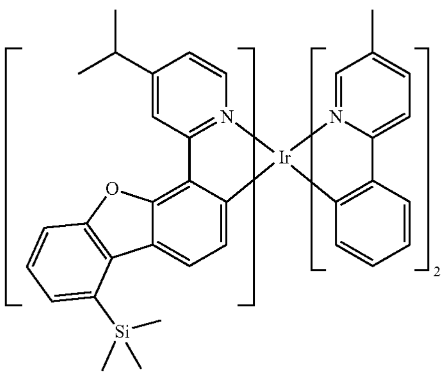
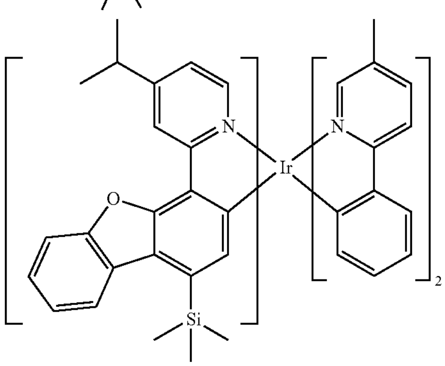
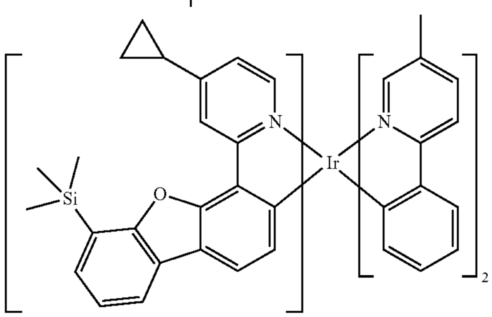
-continued
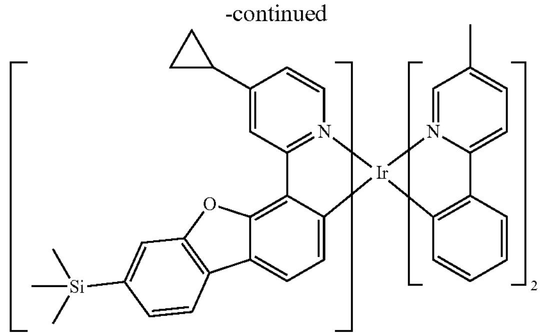
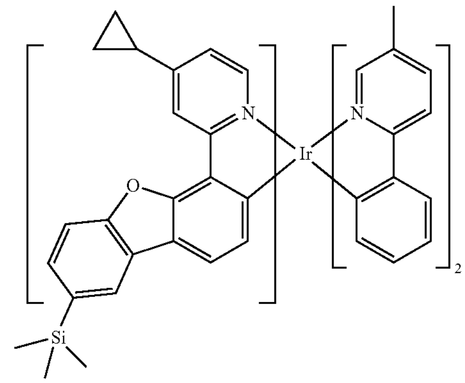
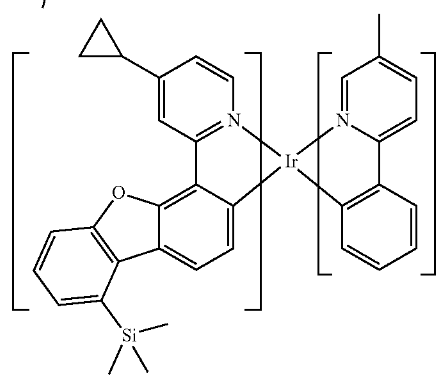
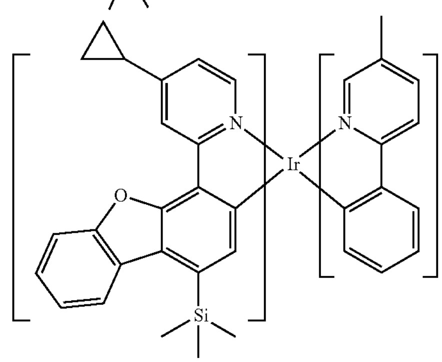
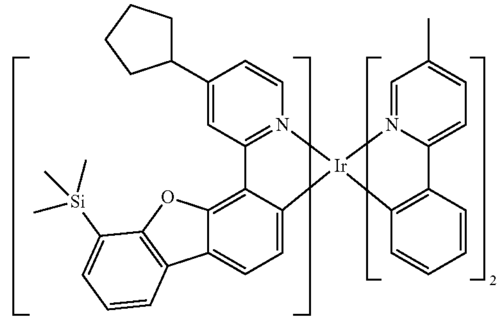

-continued
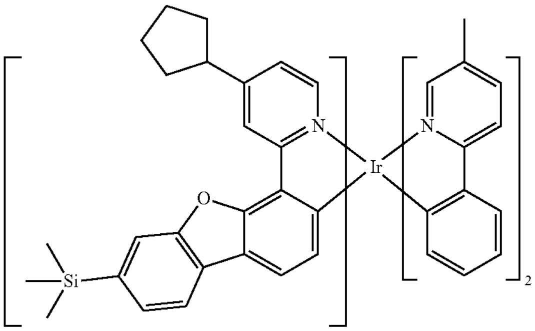
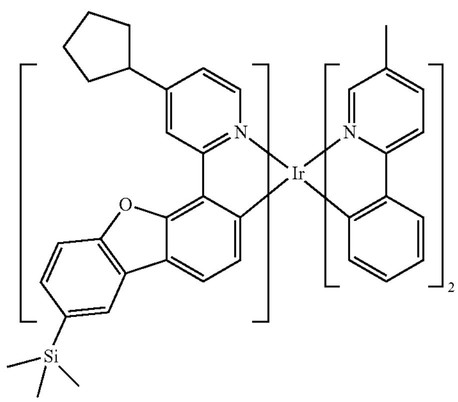
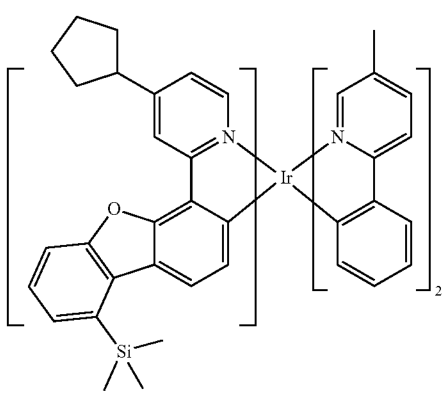
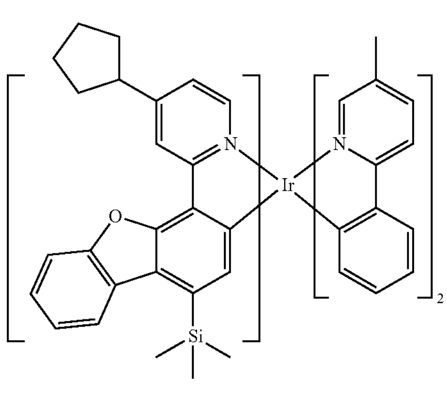
-continued
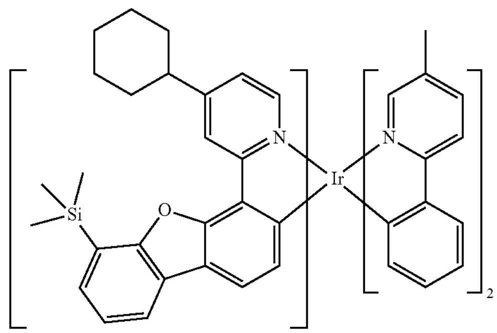
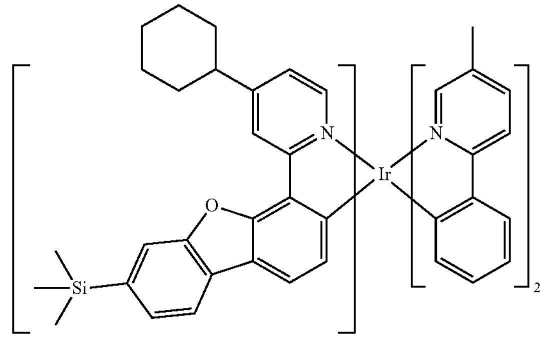
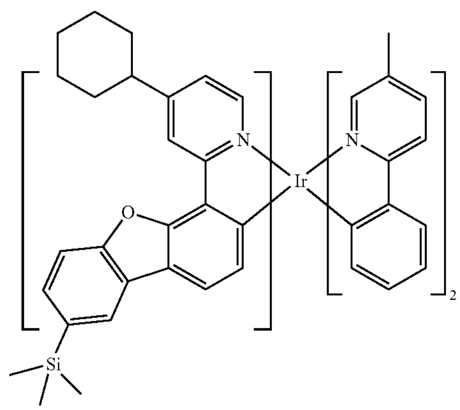
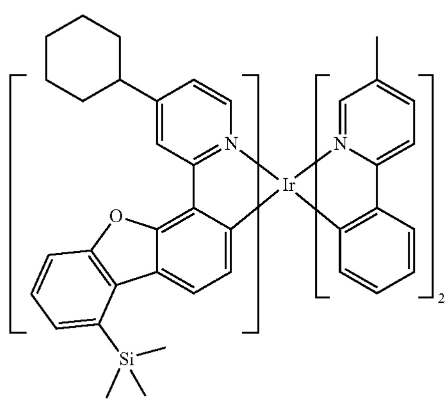

-continued
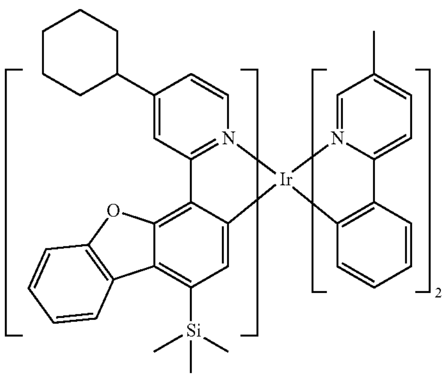
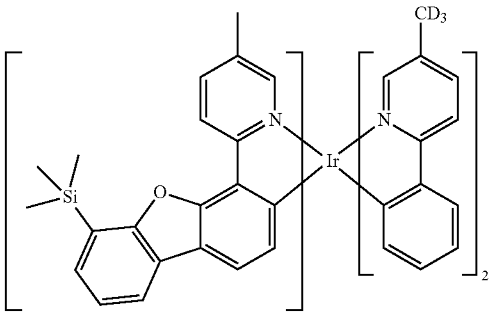
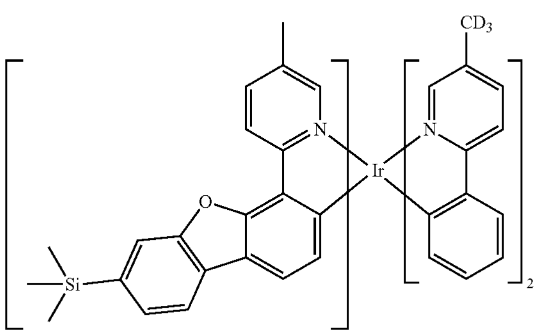
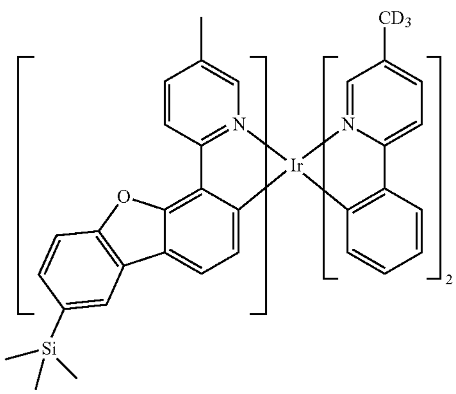
-continued
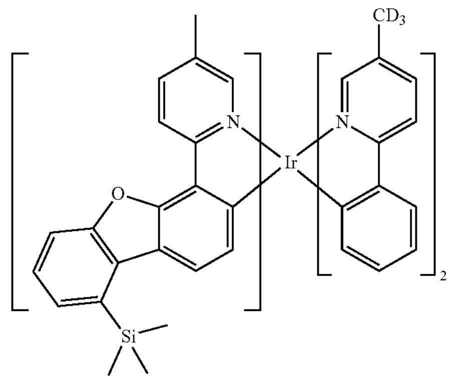
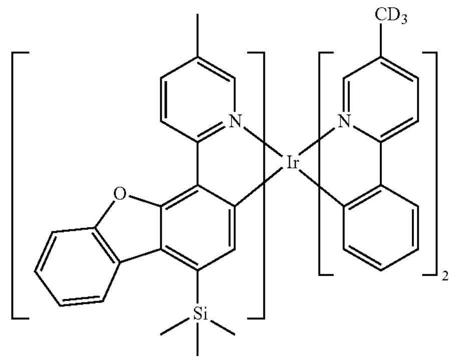
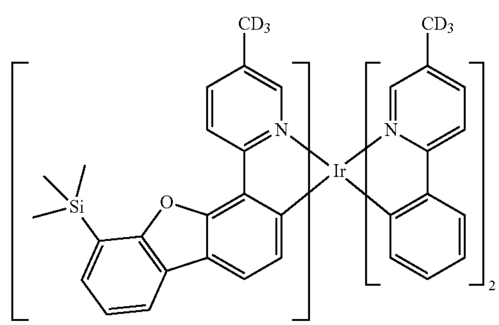
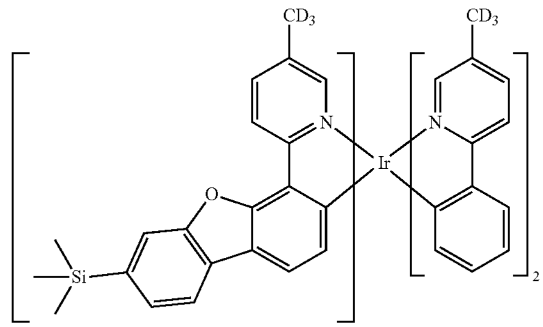

-continued
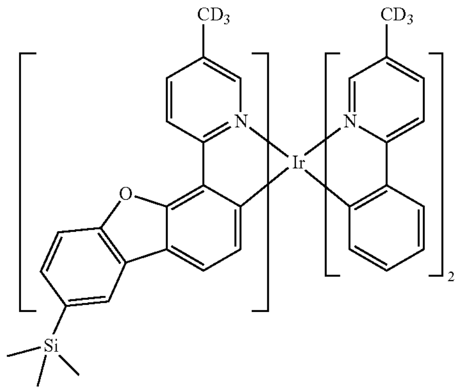
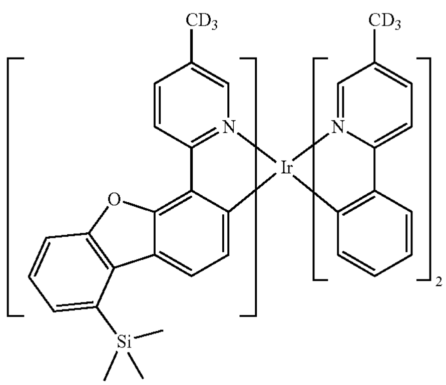
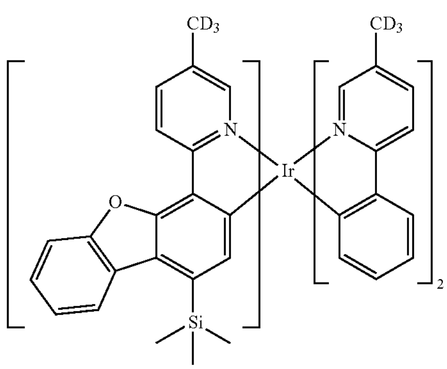
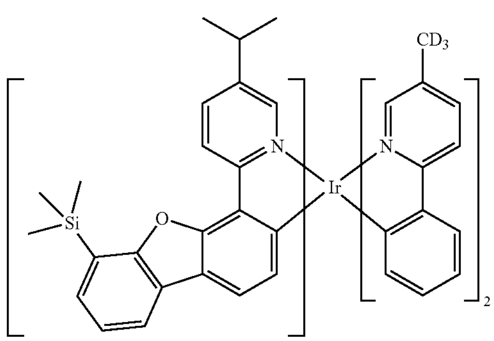
-continued
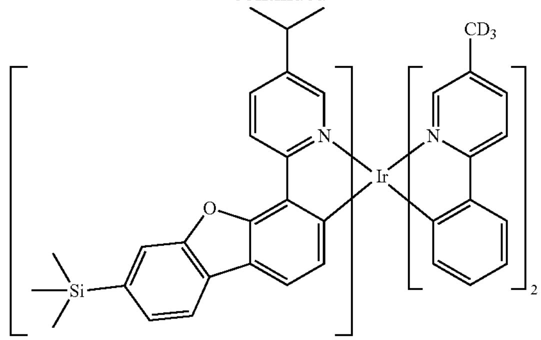
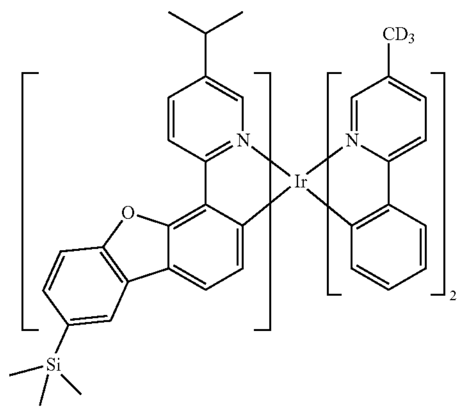
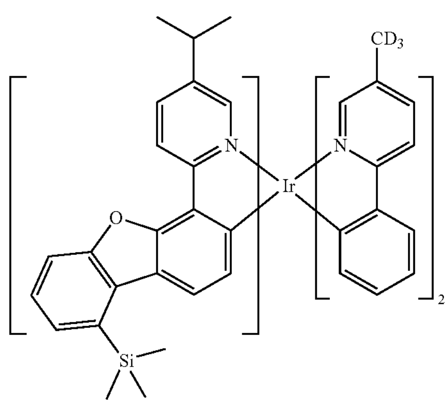
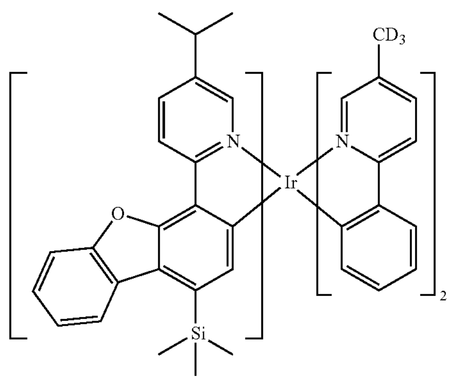

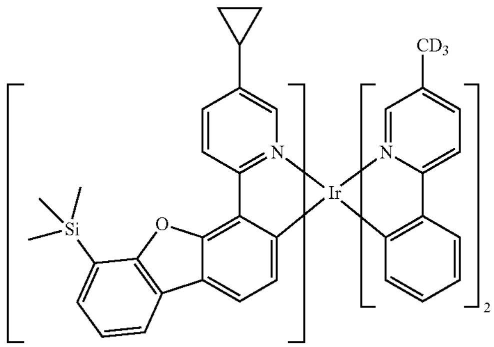
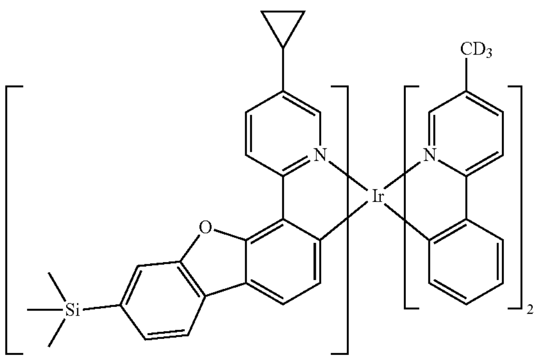
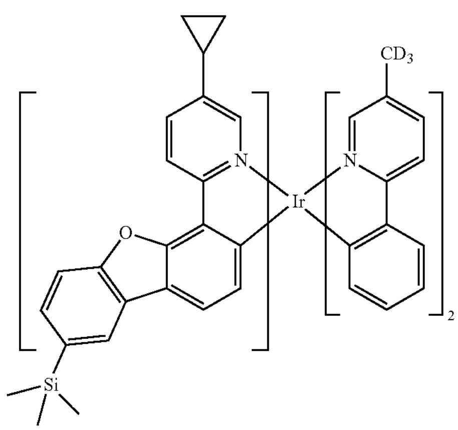
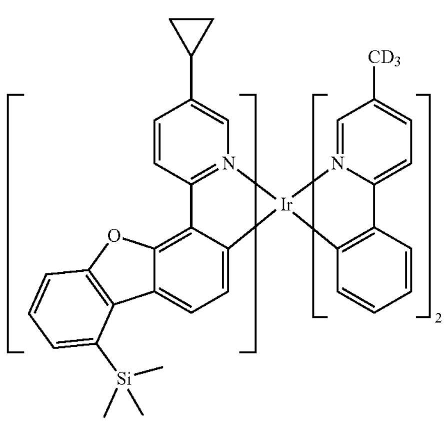
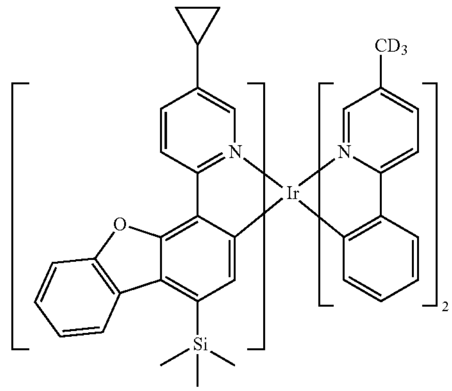
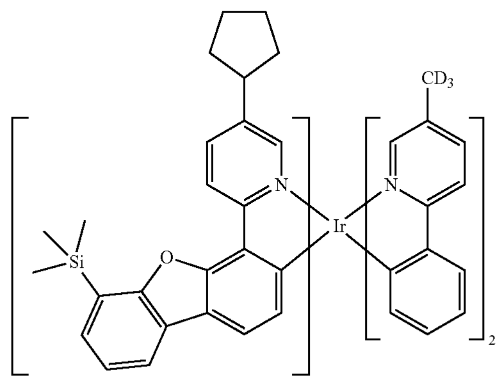
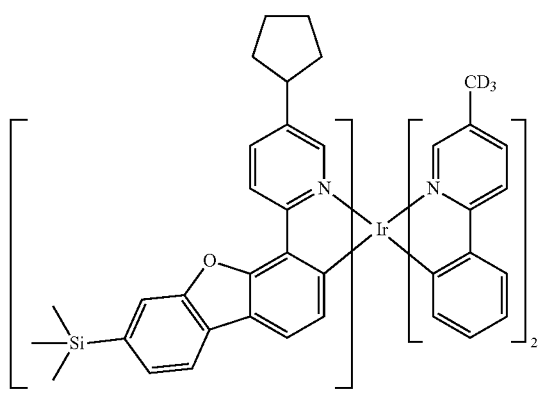
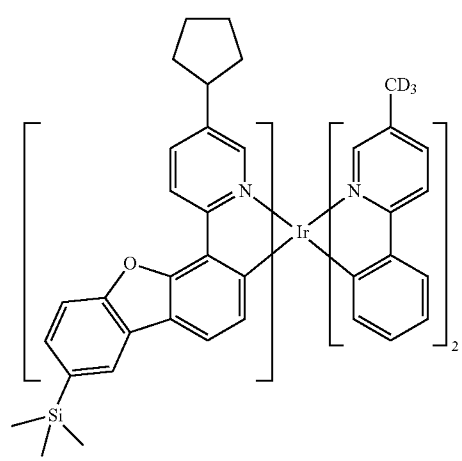

-continued
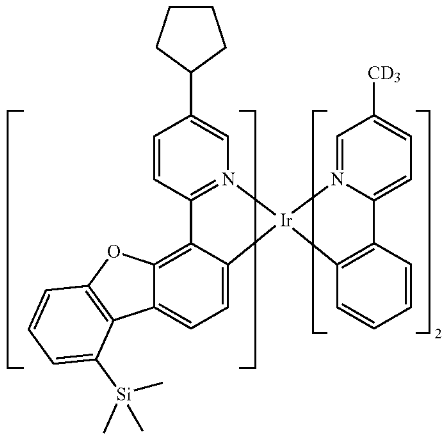
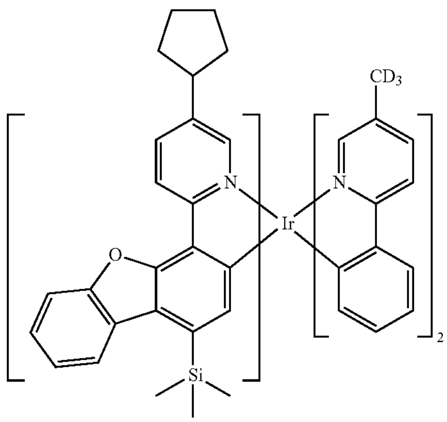
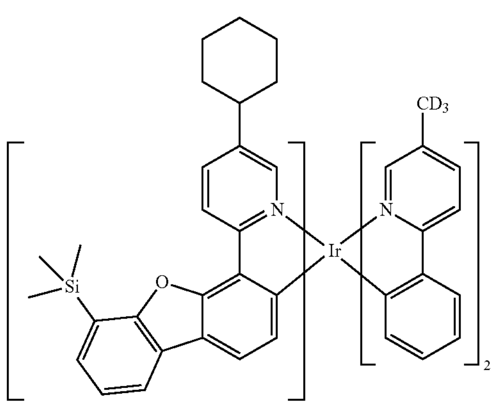
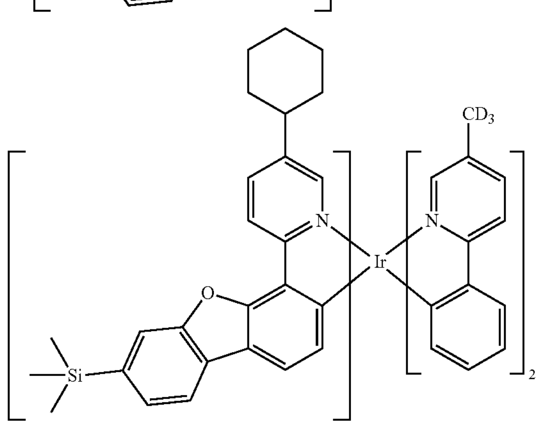
-continued
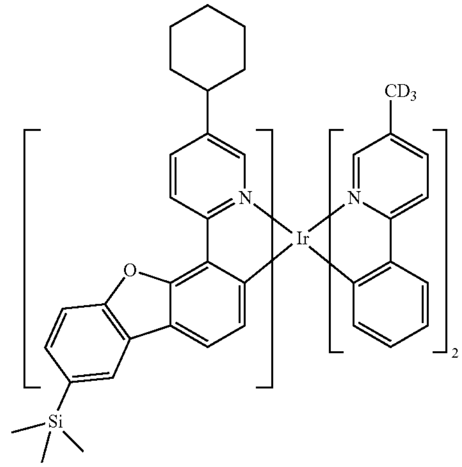
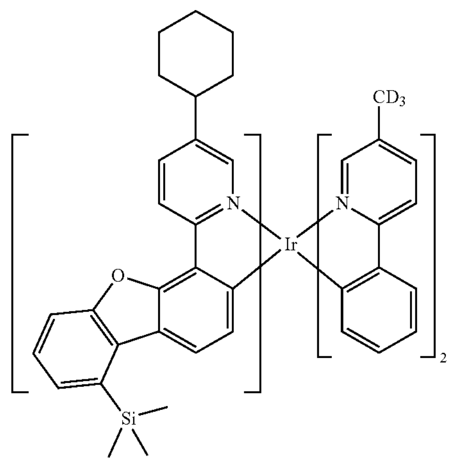
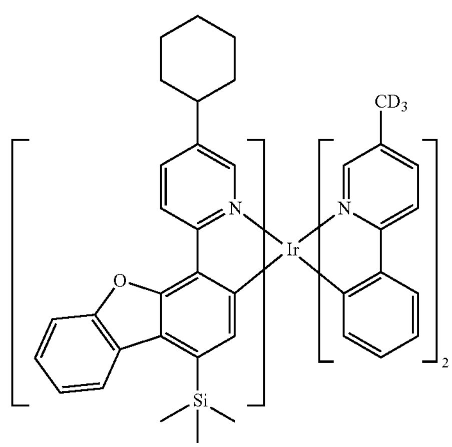
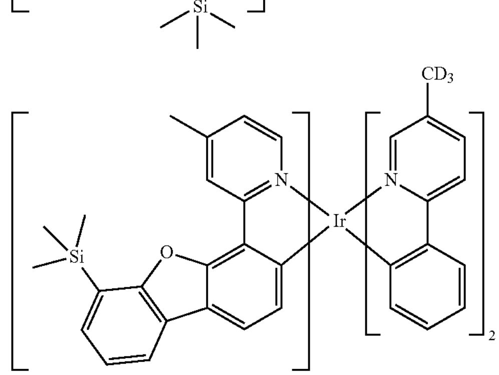

-continued
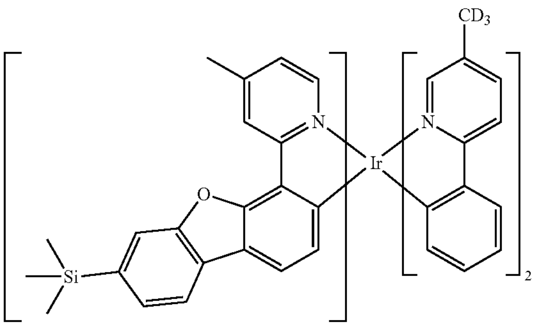
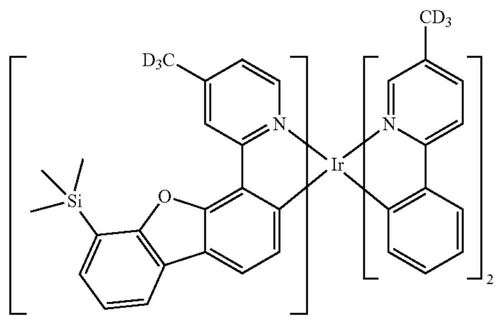
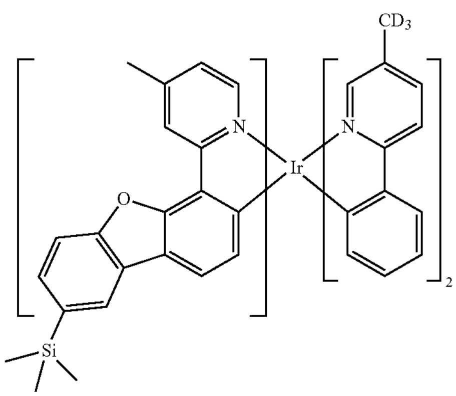
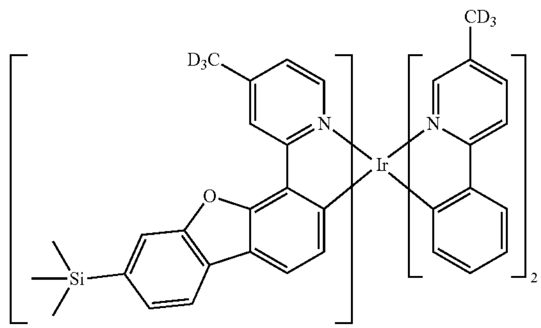
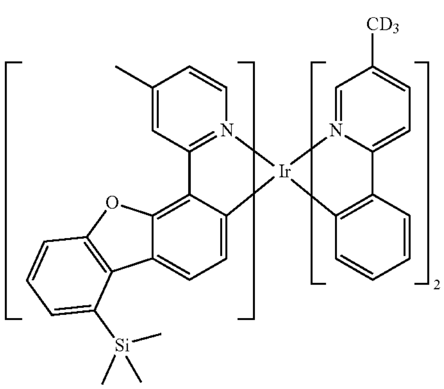
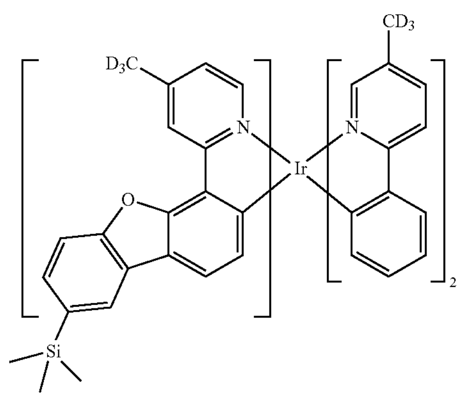
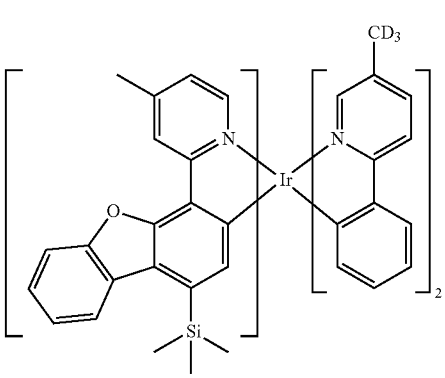
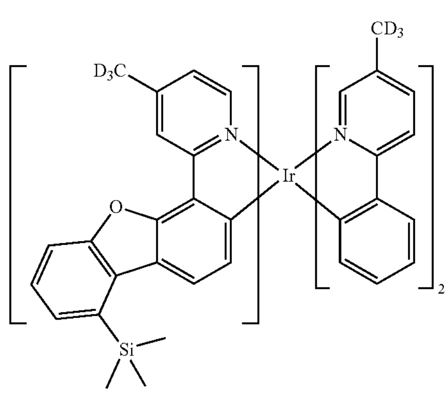

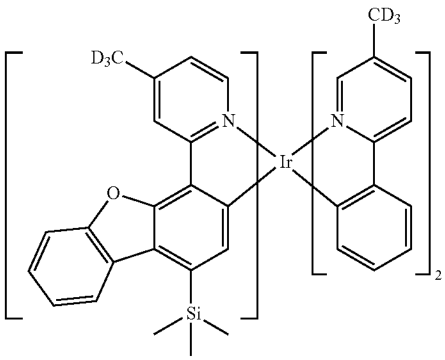
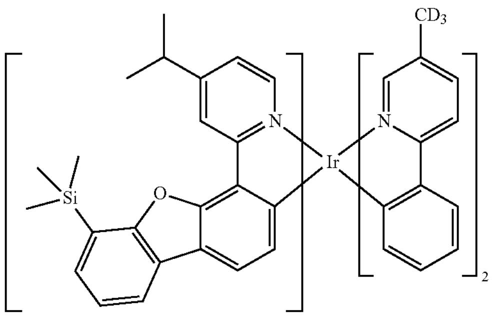
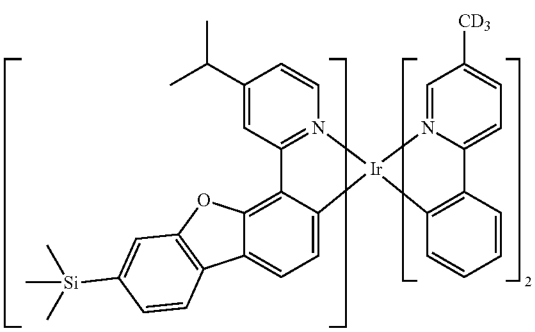
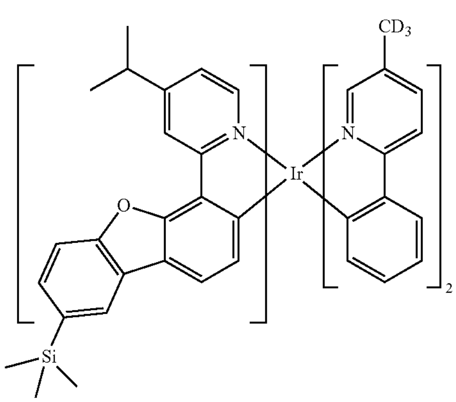
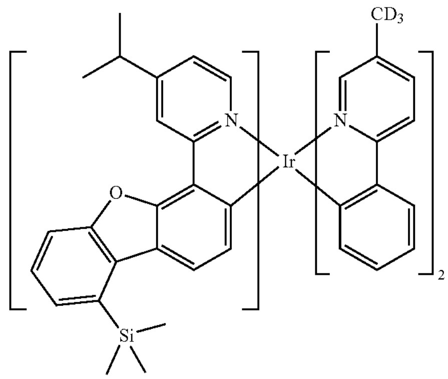
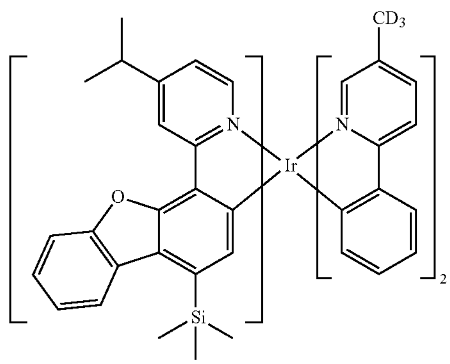
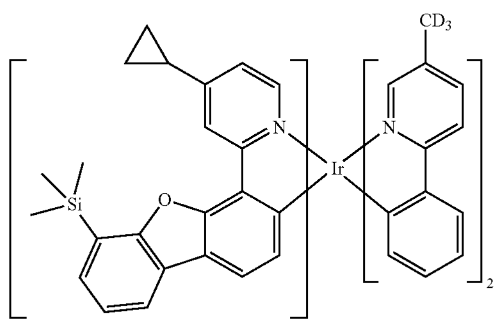
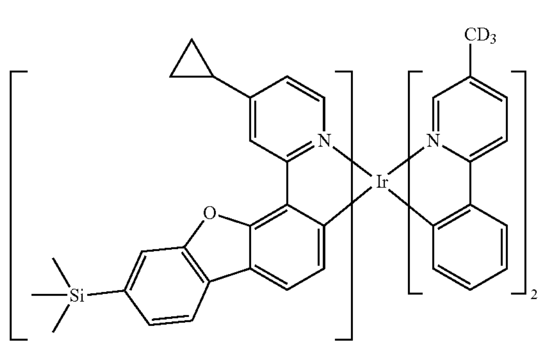

-continued
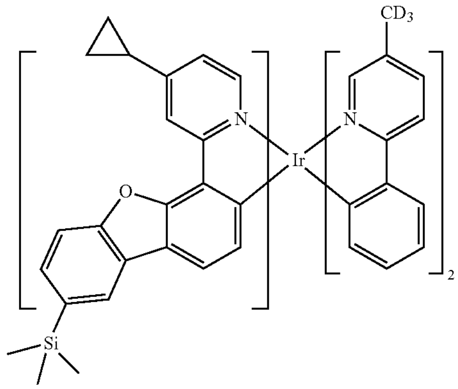
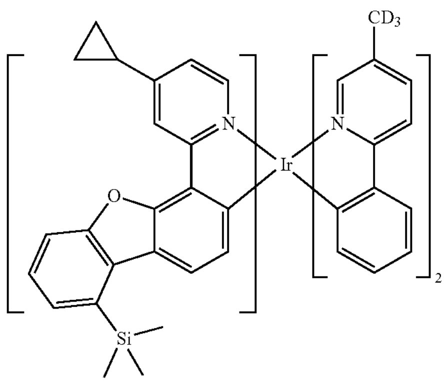
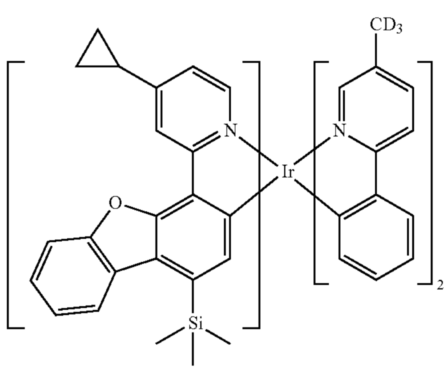
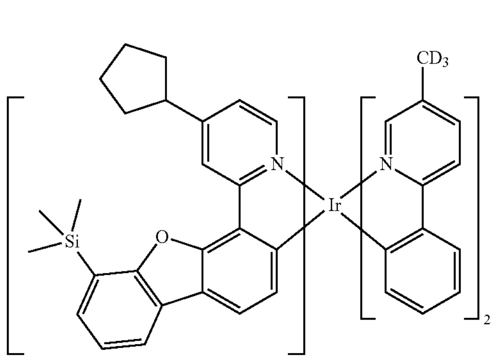
-continued
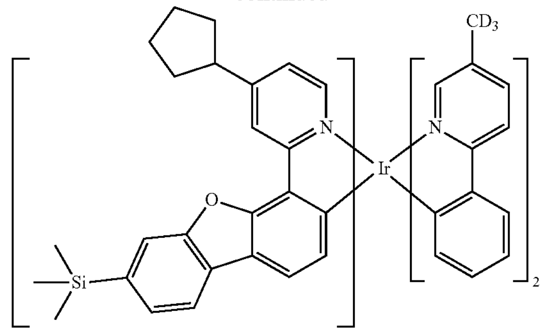
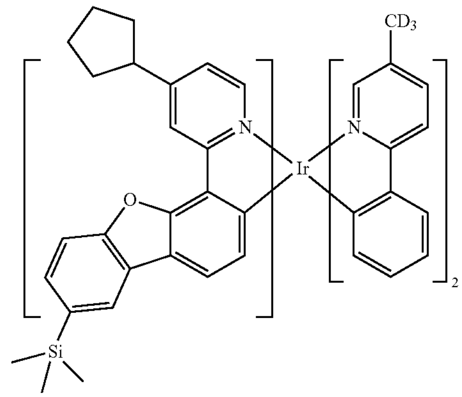
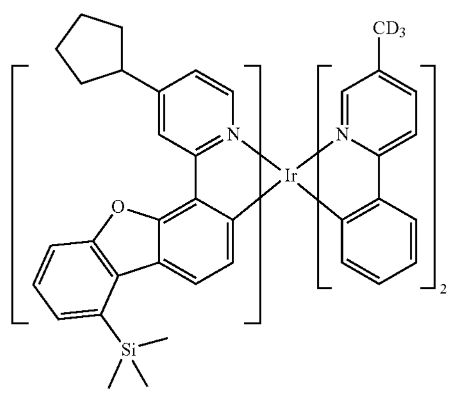
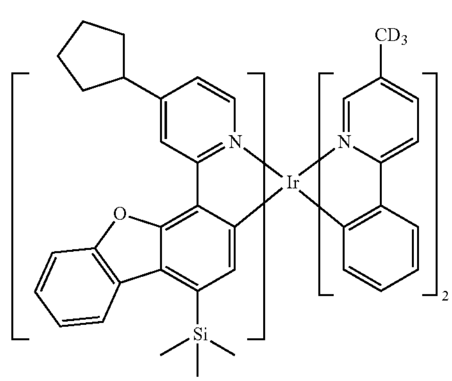

-continued
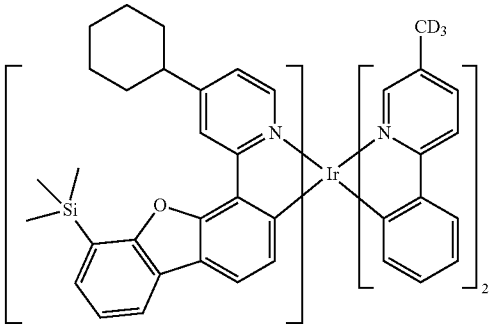
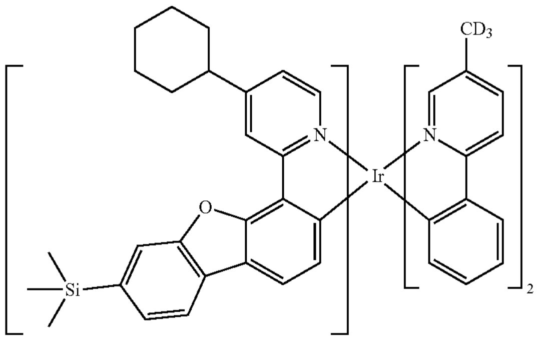
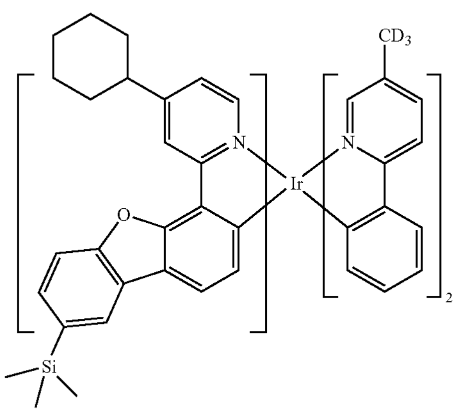
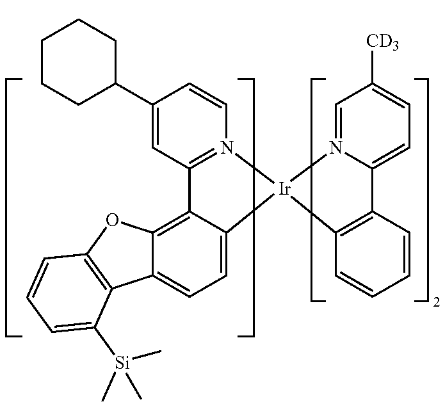
-continued
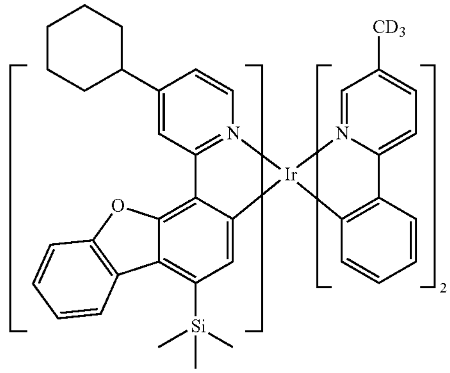
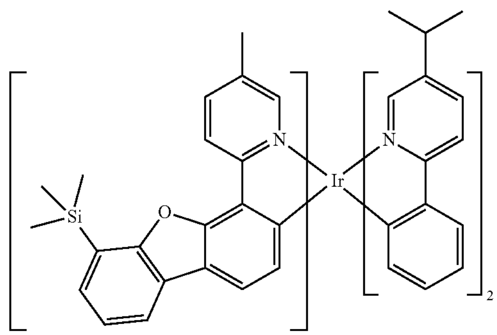
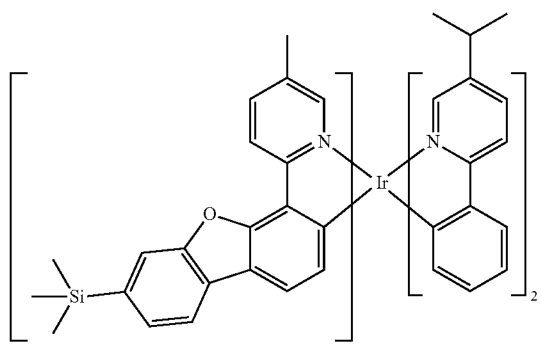
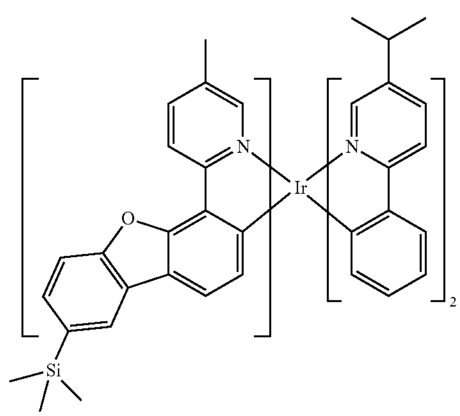

-continued
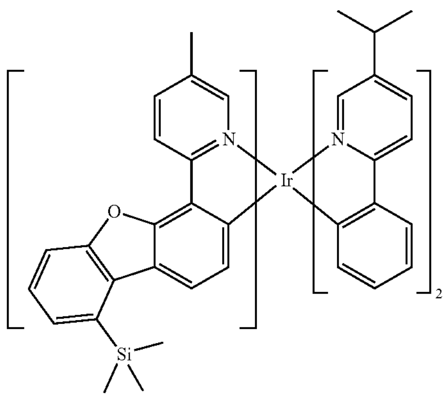
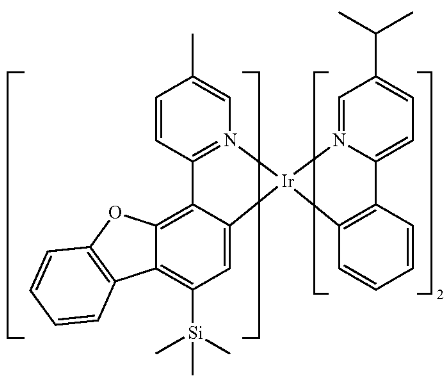
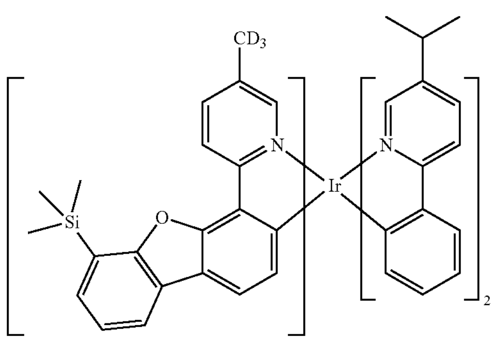
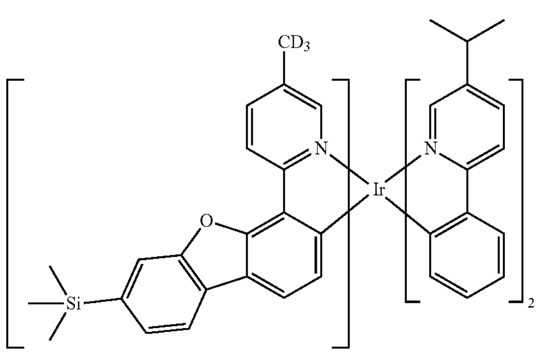
-continued
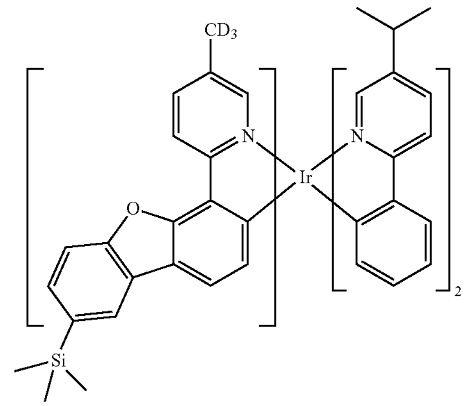
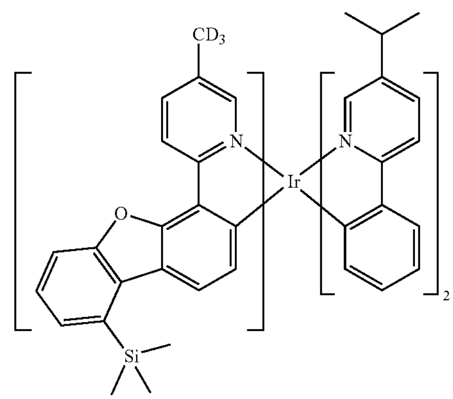
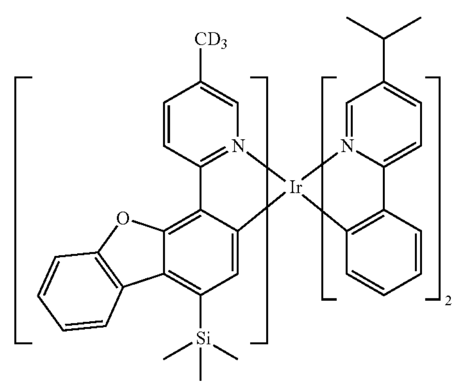
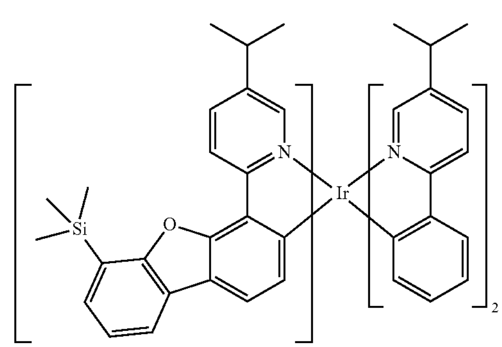

-continued
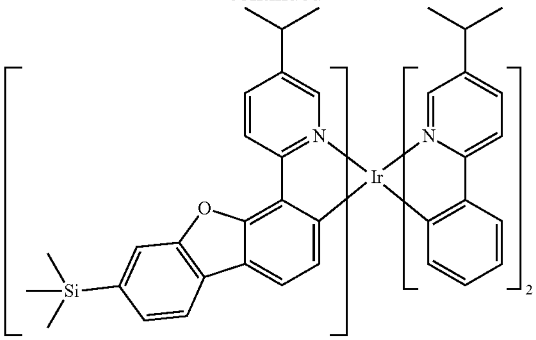
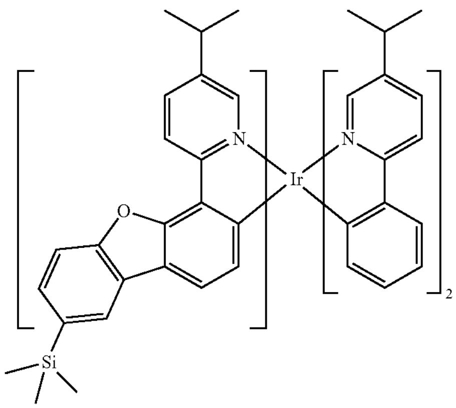
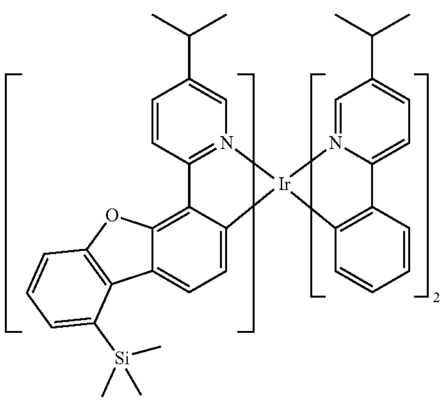
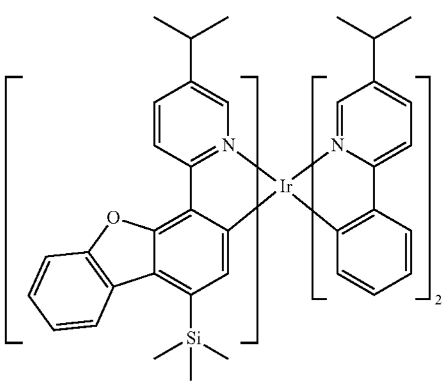
-continued
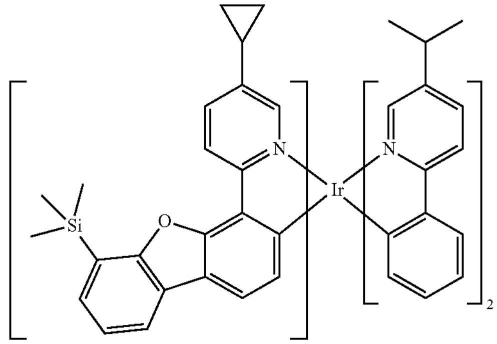
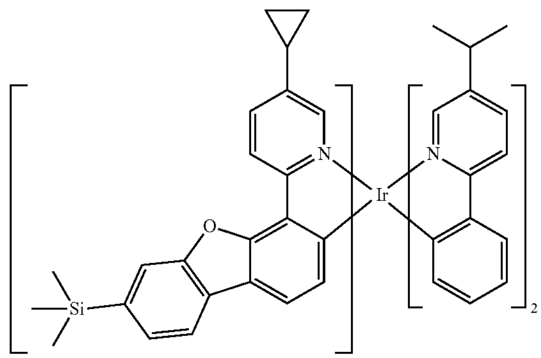
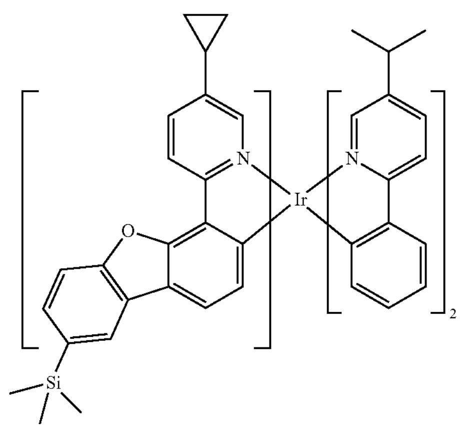
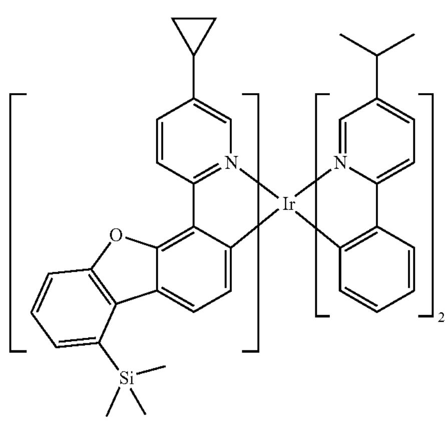

-continued
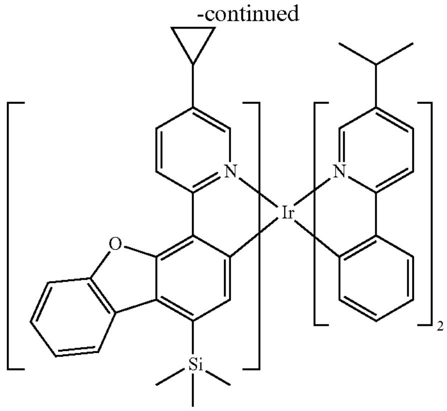
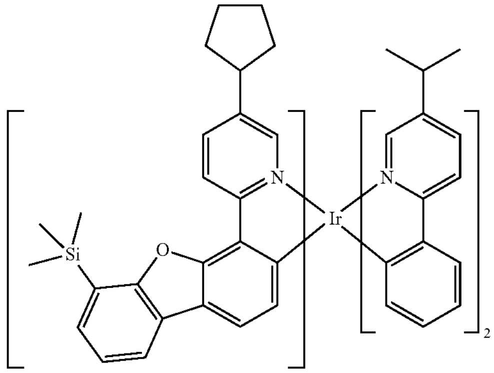
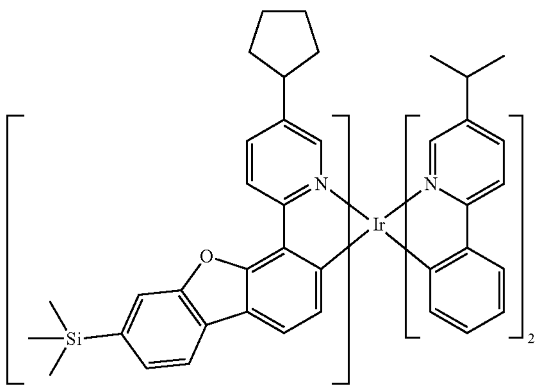
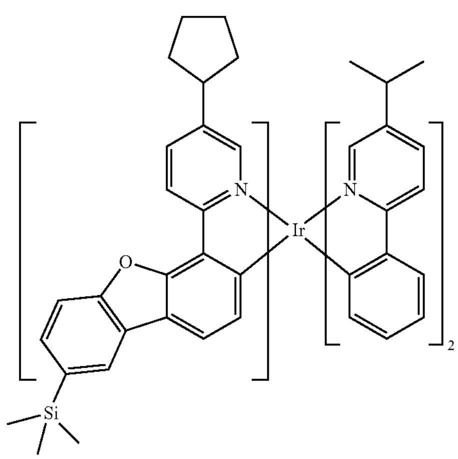
-continued
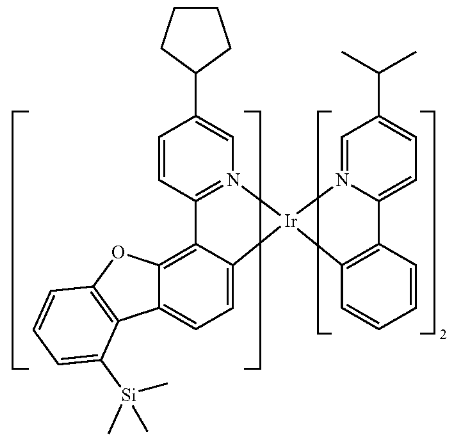
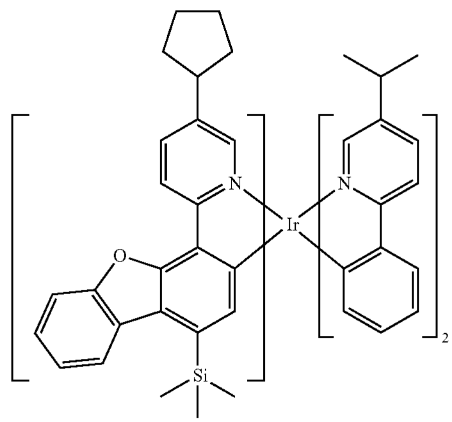
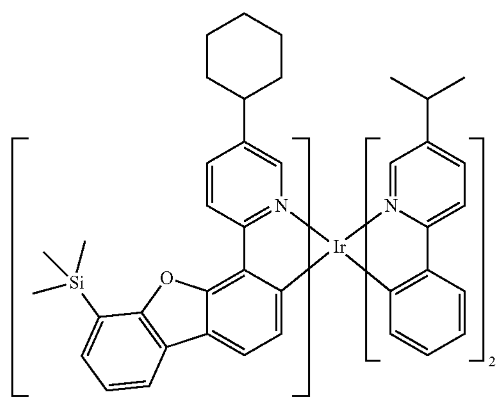
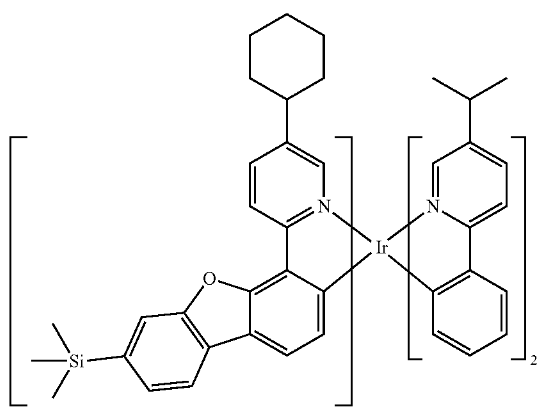

-continued
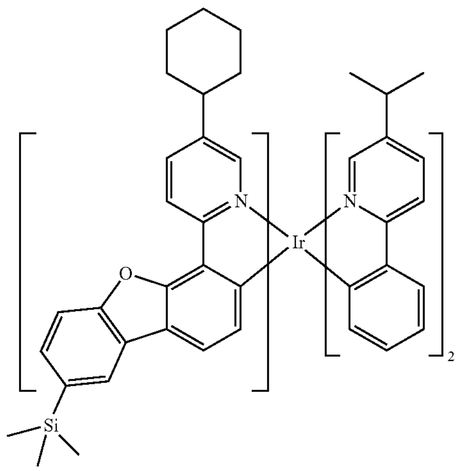
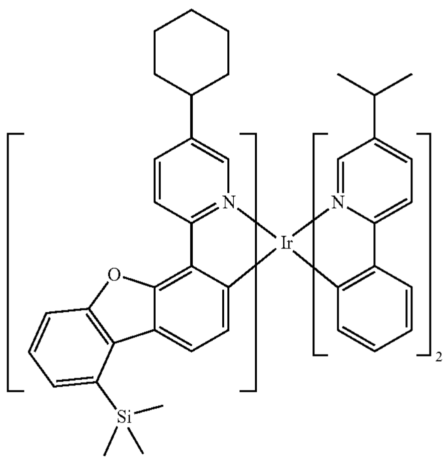
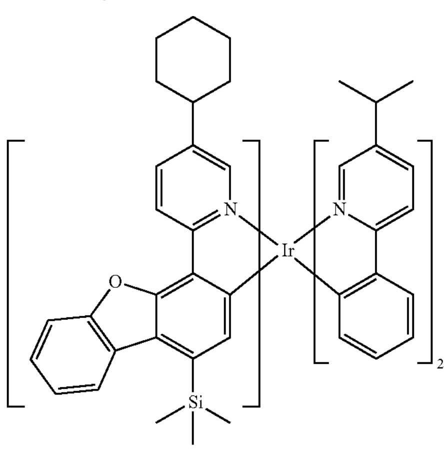
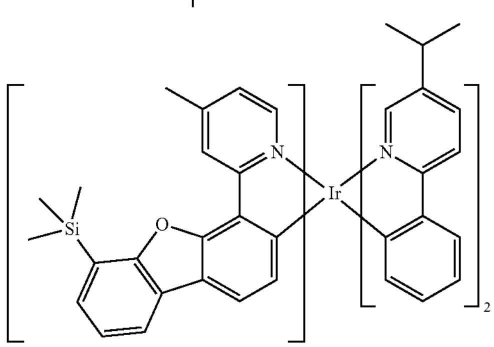
-continued
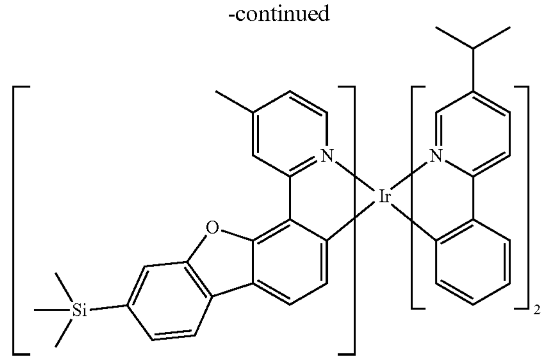
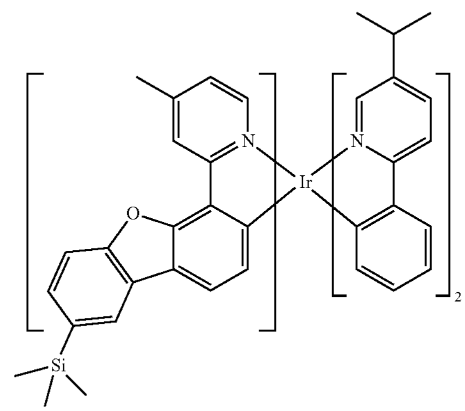
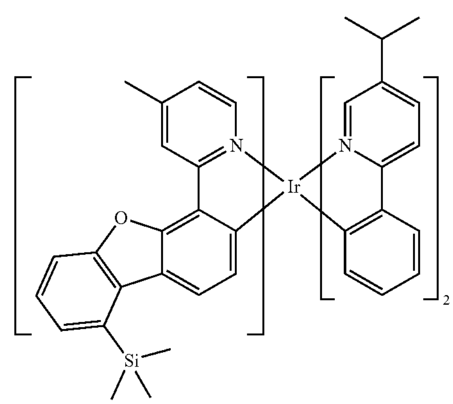
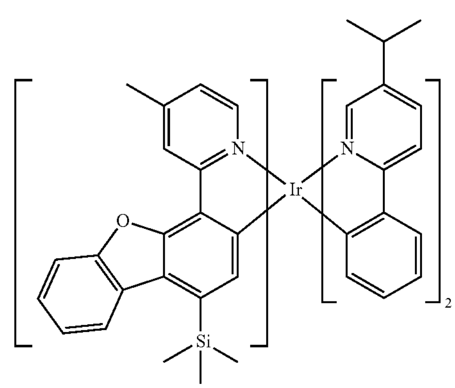

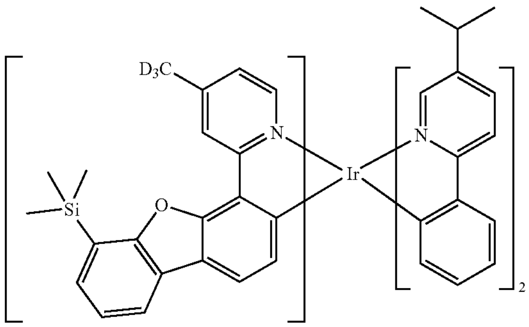
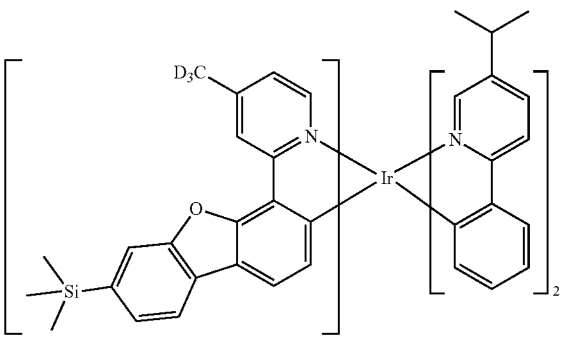
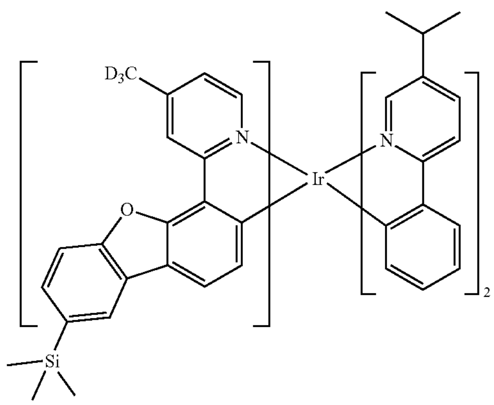
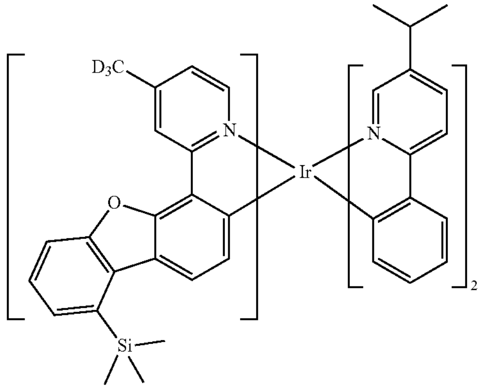
-continued
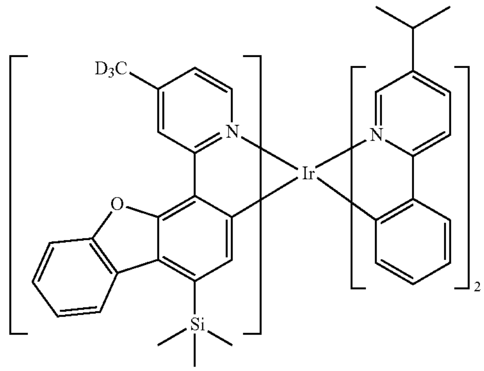
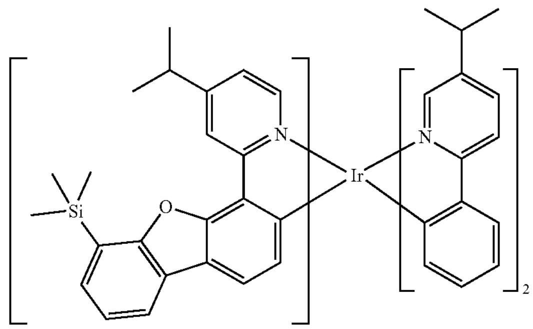
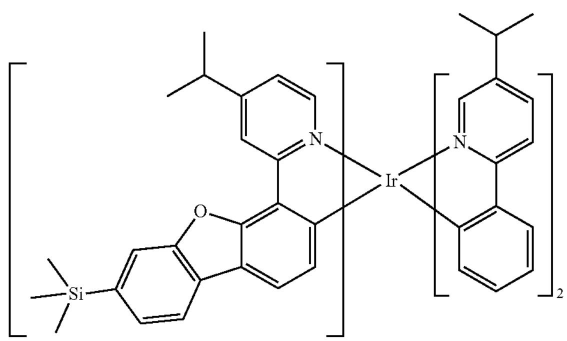
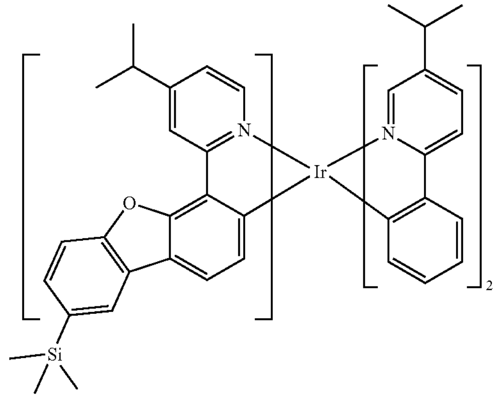

-continued
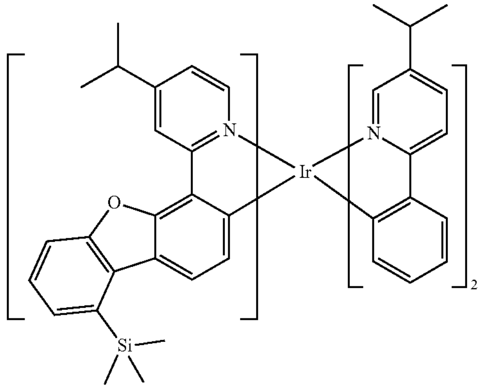
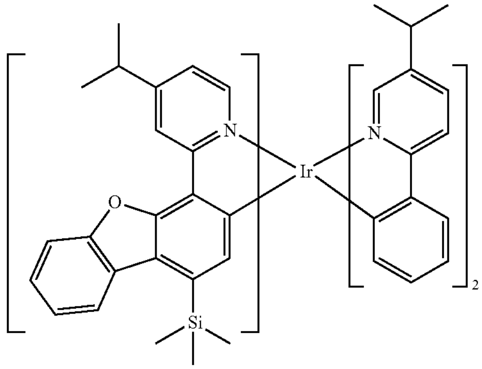
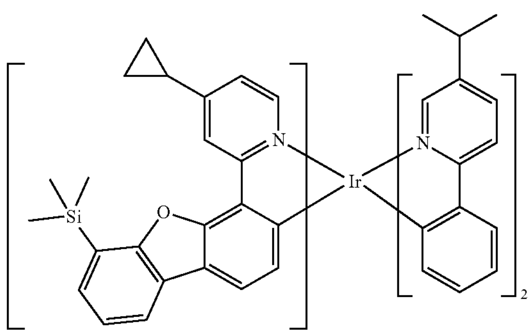
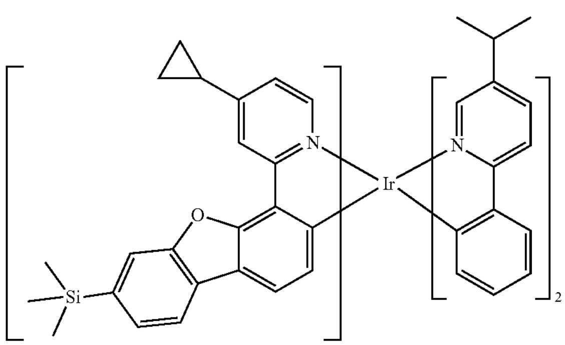
-continued
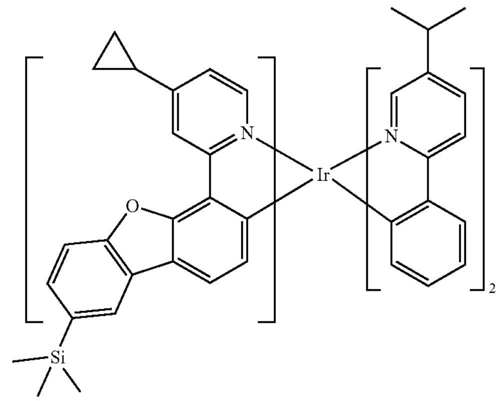
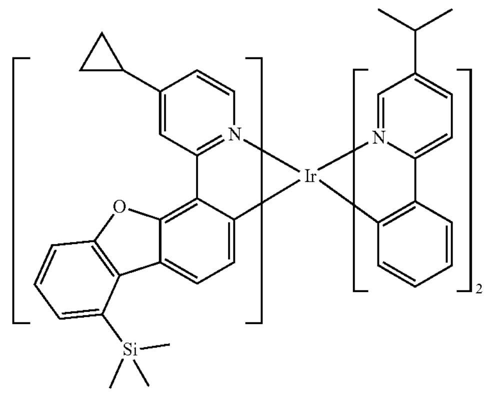
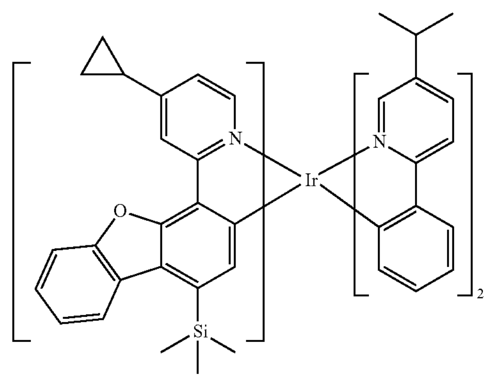
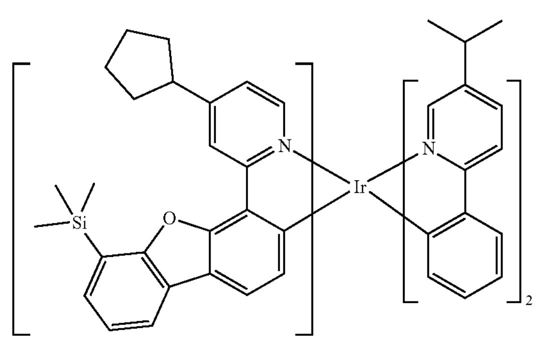

-continued
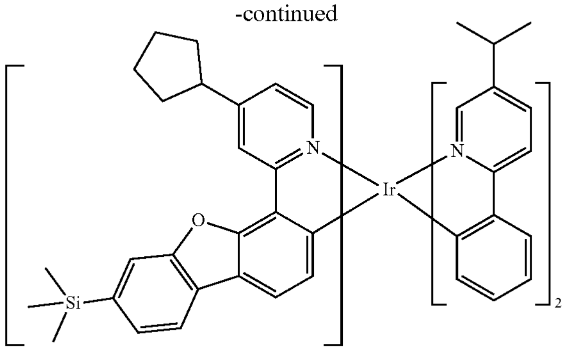
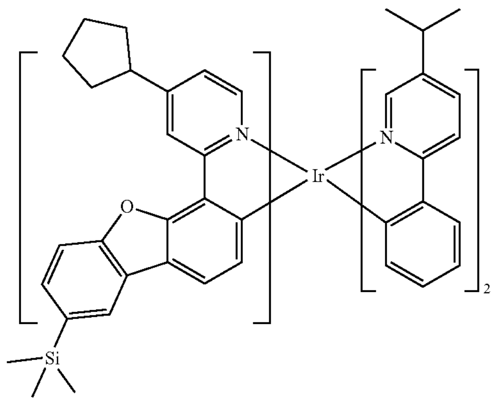
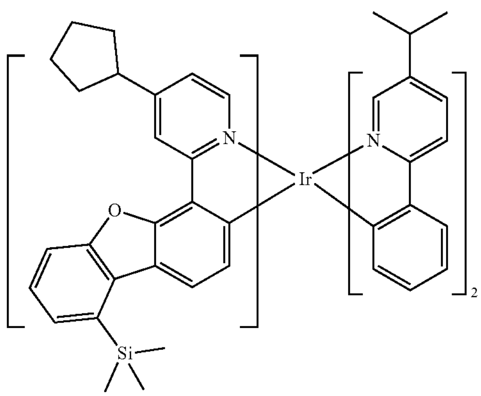
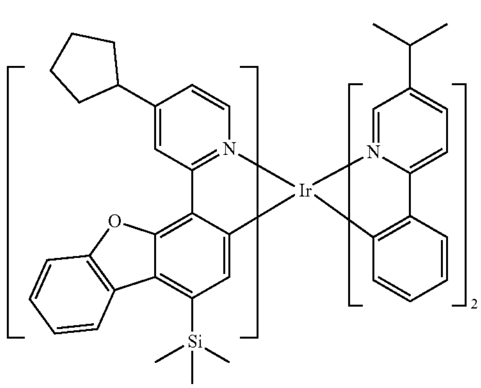
-continued
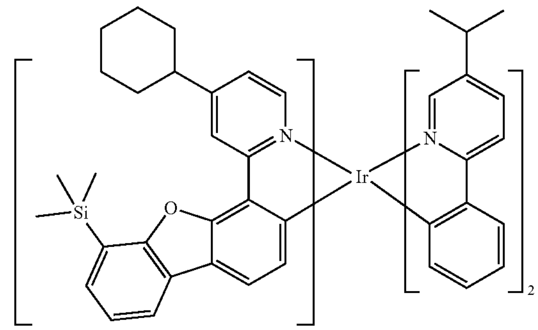
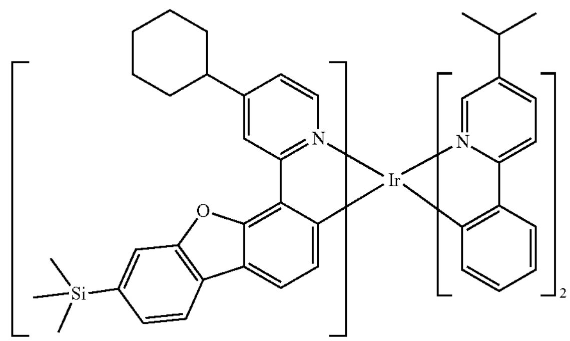
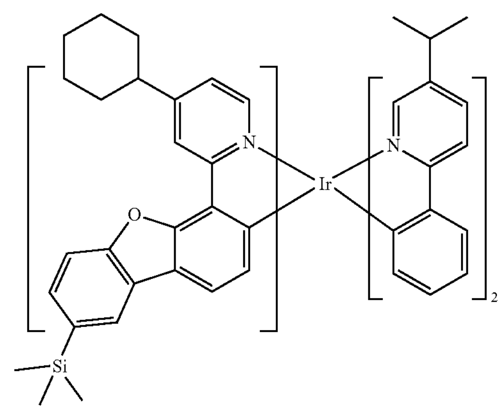
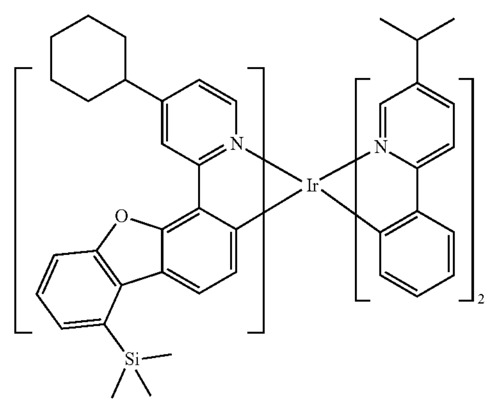

-continued
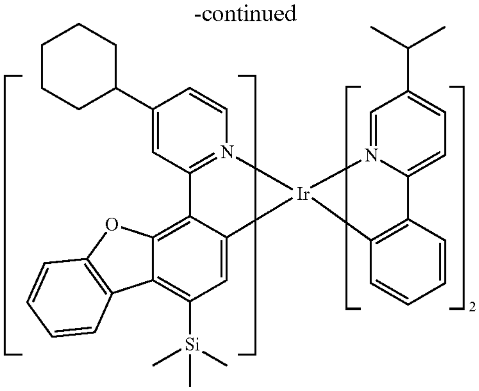
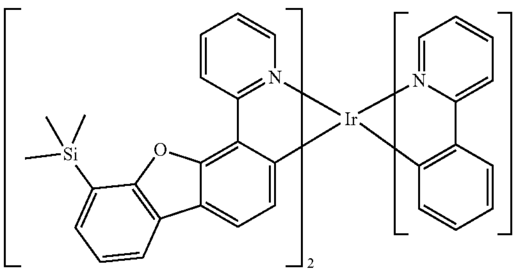
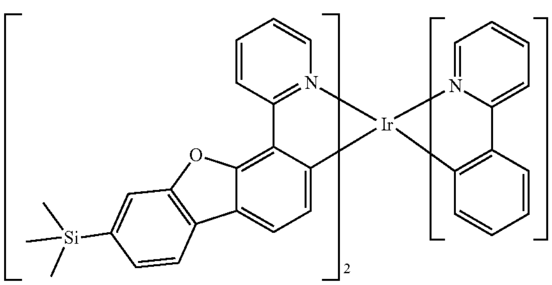
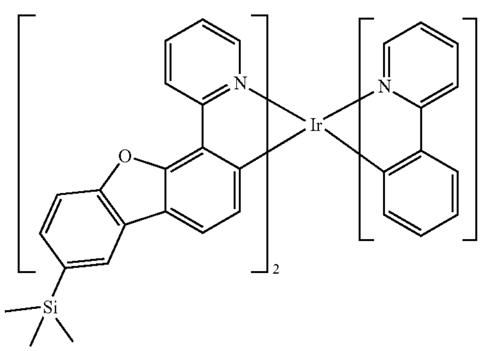
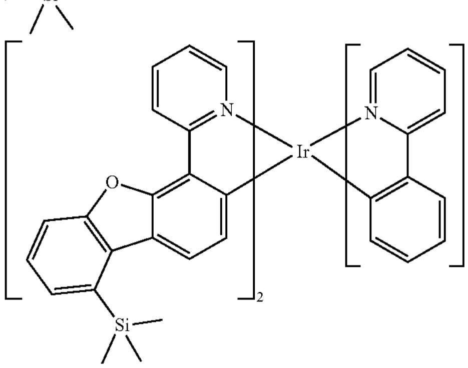
-continued
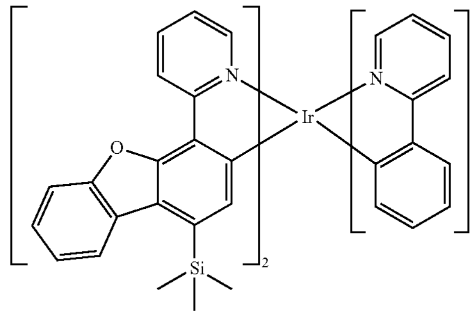
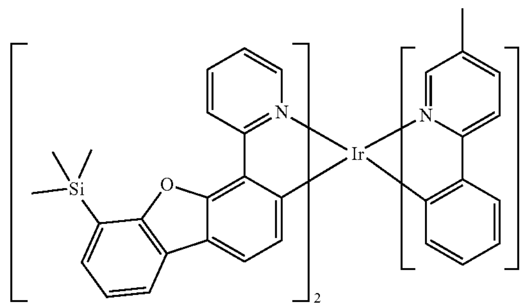
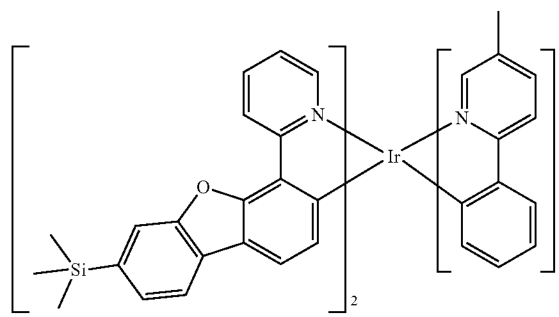
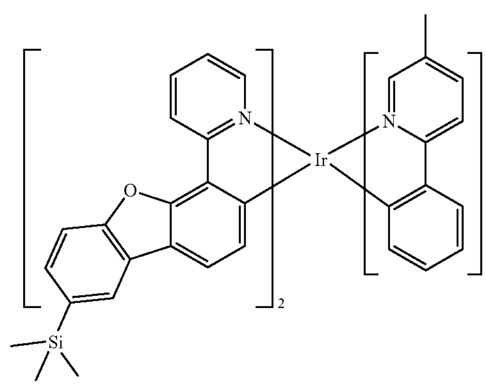
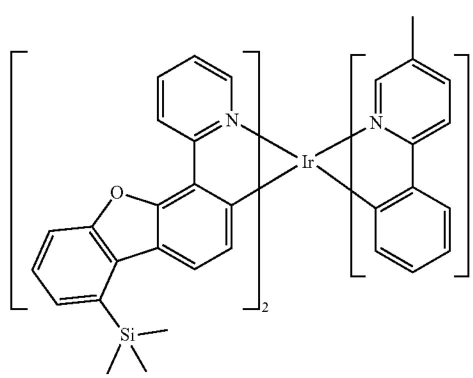

-continued
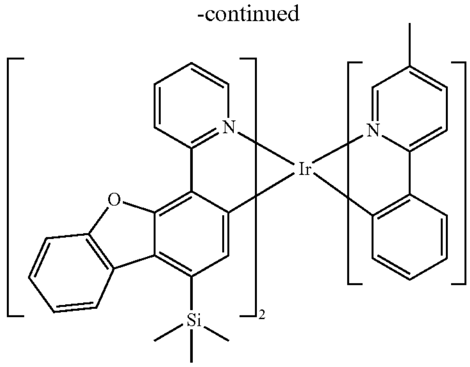
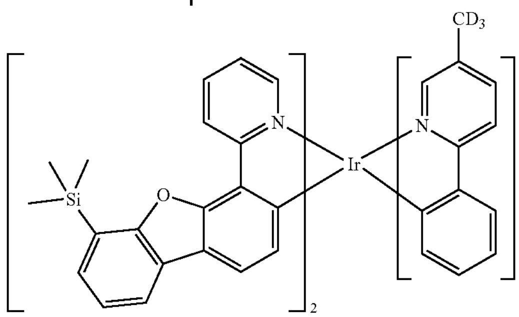
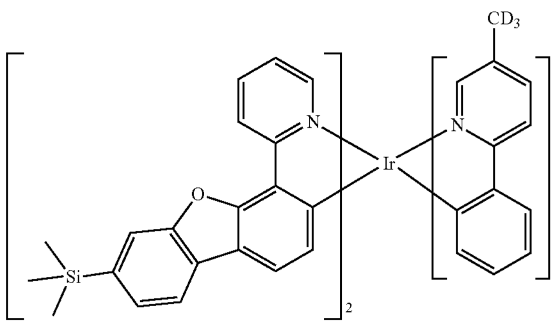
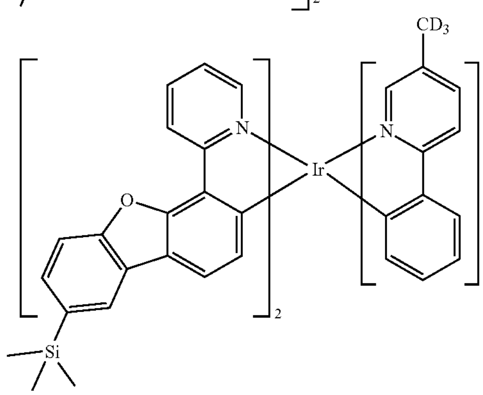
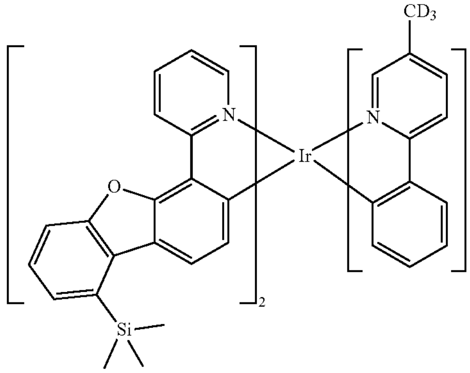
-continued
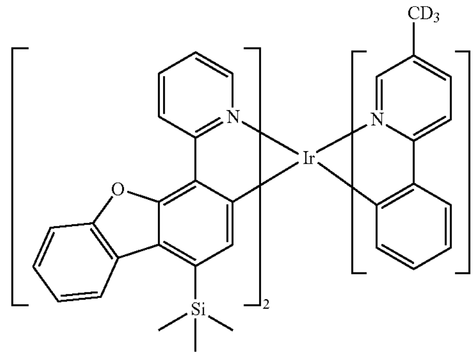
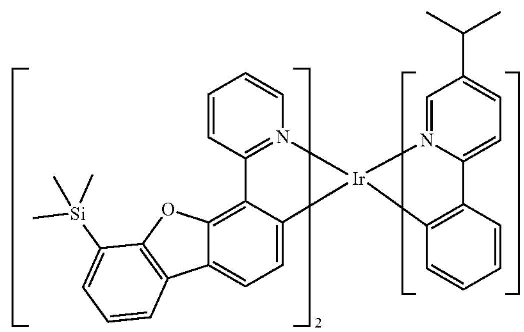
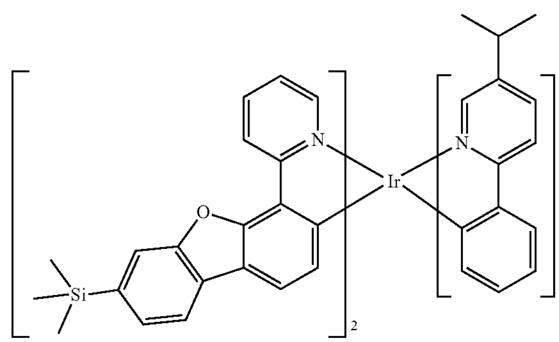
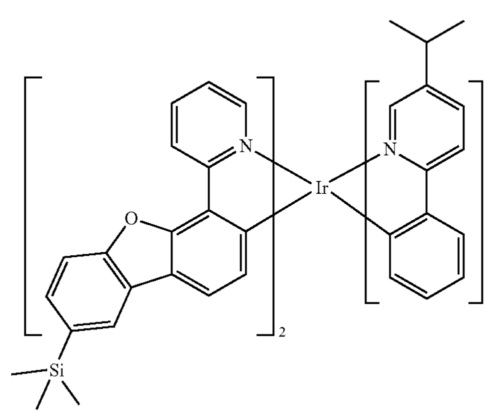

-continued
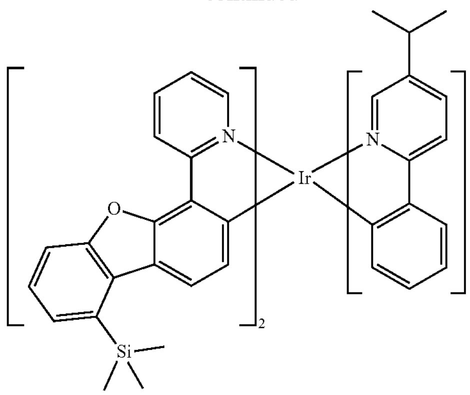
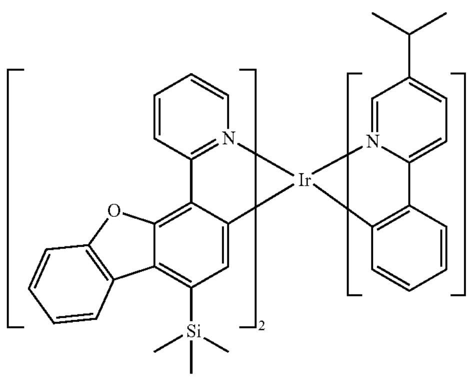
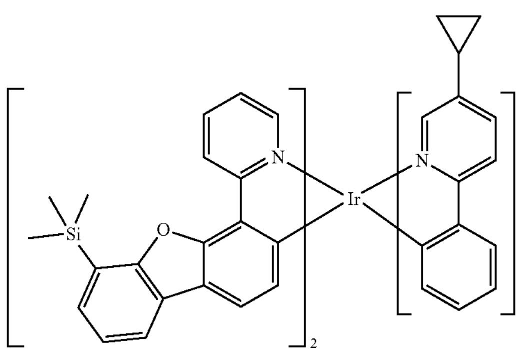
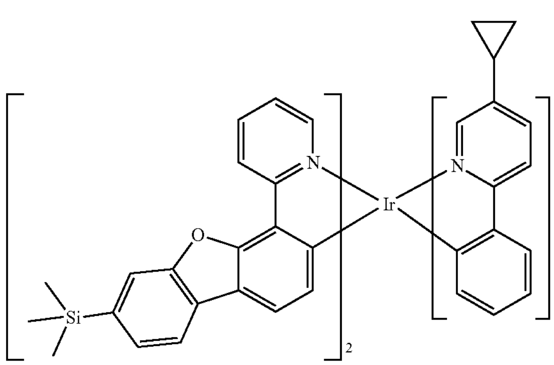
-continued
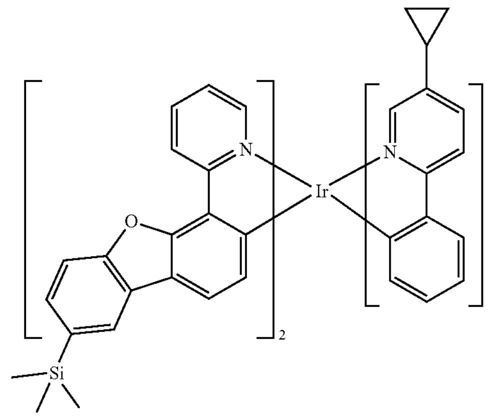
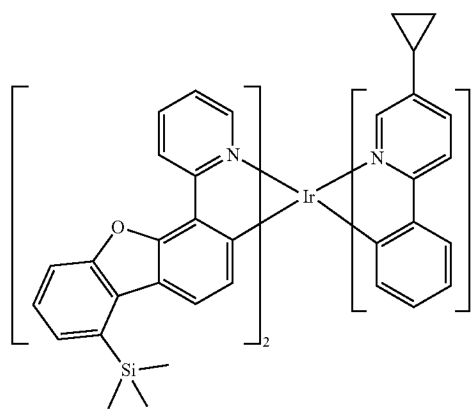
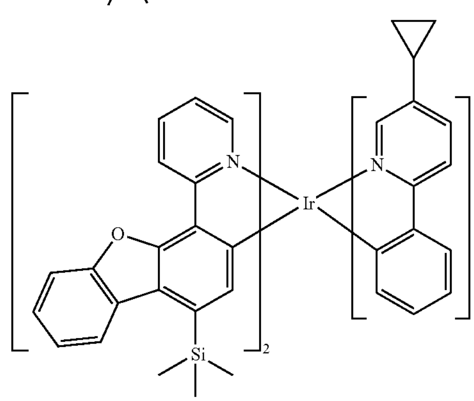
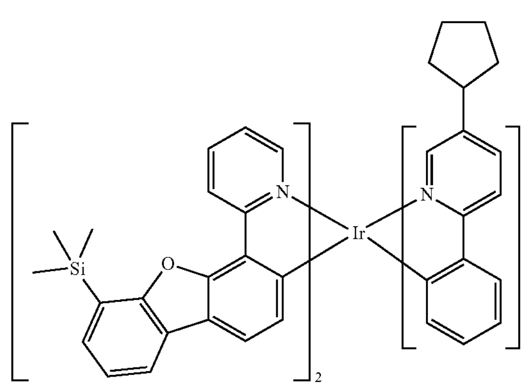

-continued
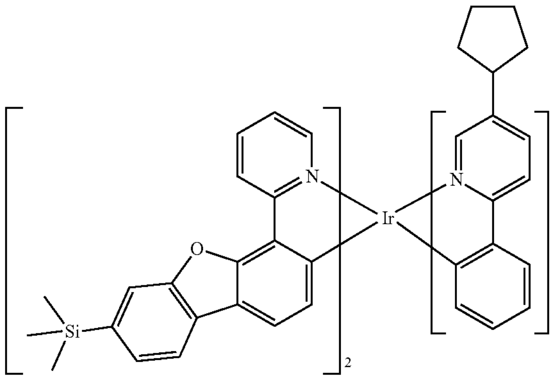
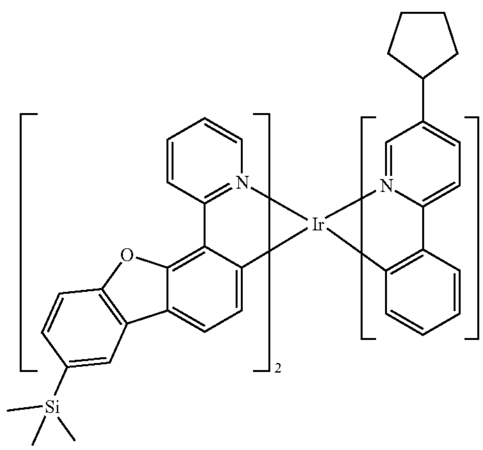
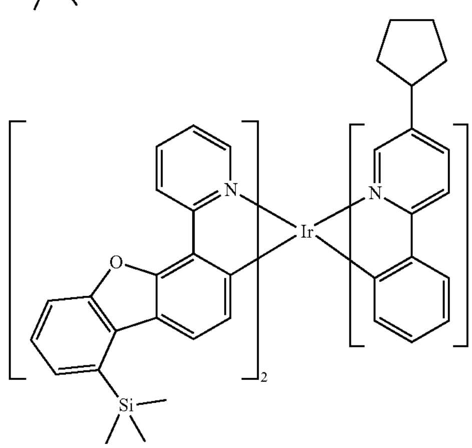
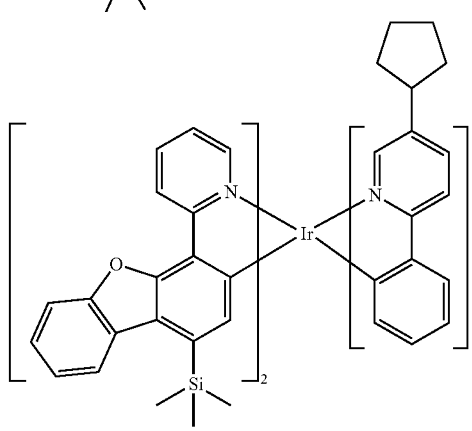
-continued
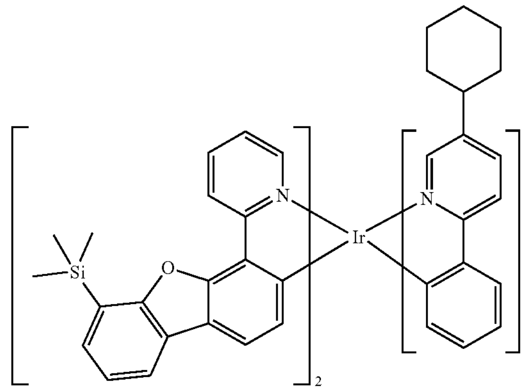
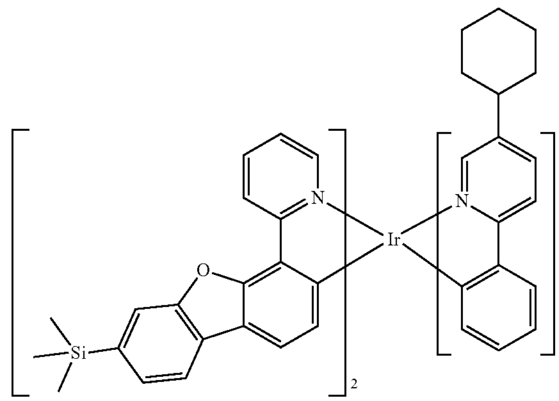
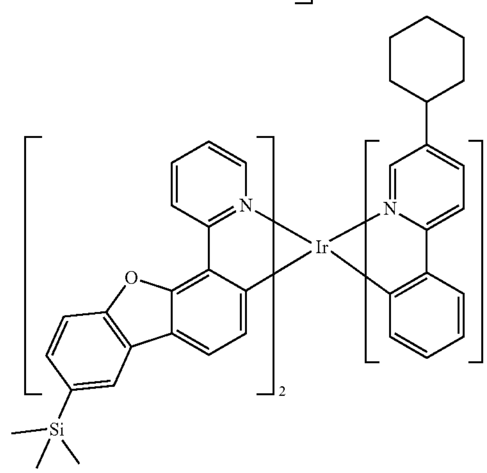
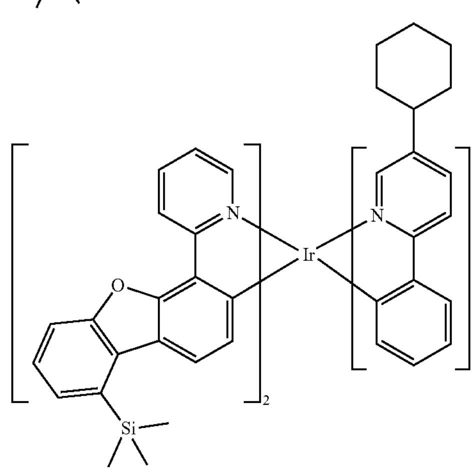

-continued
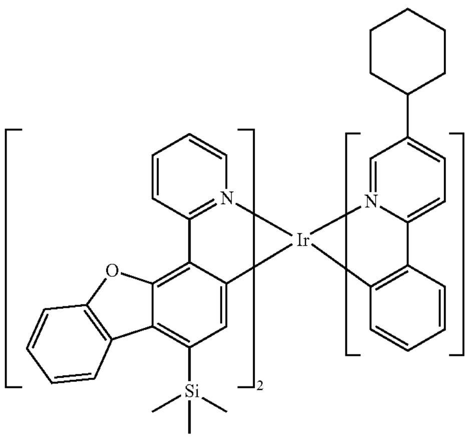
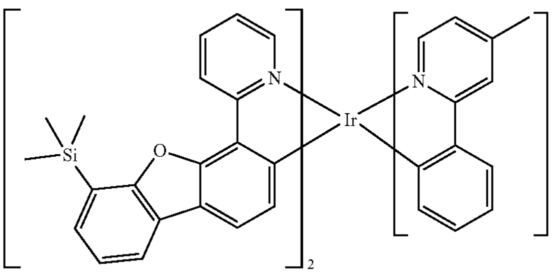
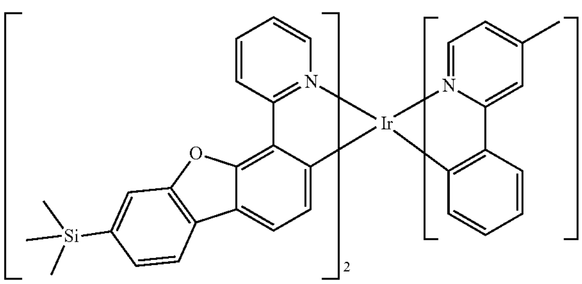
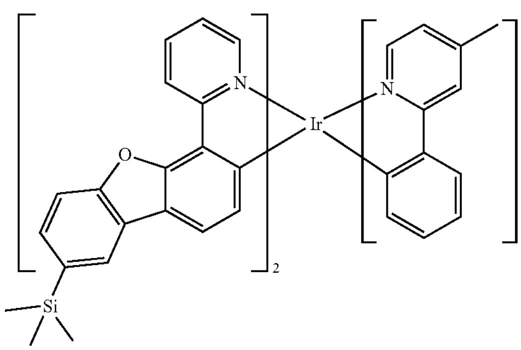
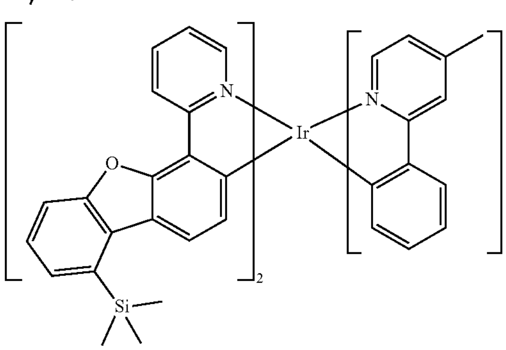
-continued
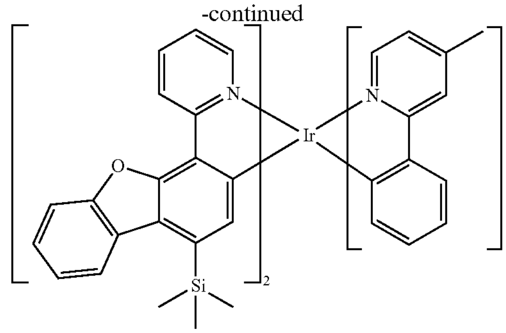
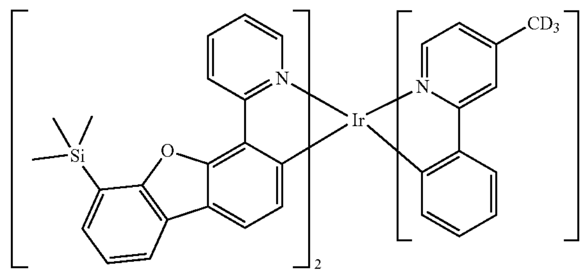
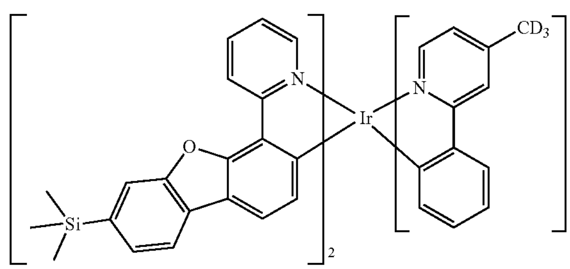
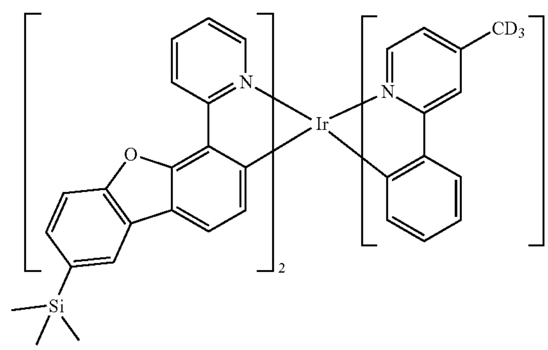
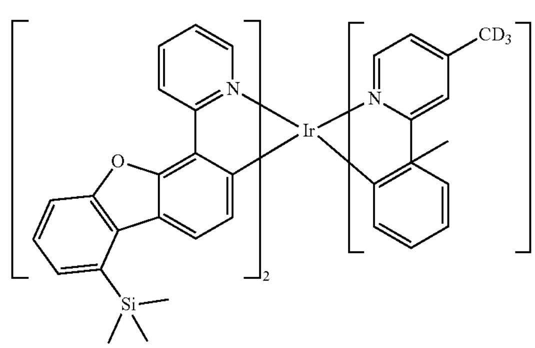

-continued
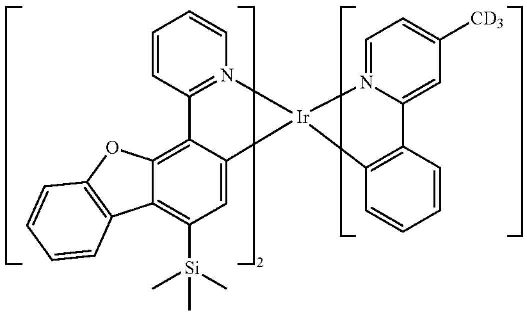
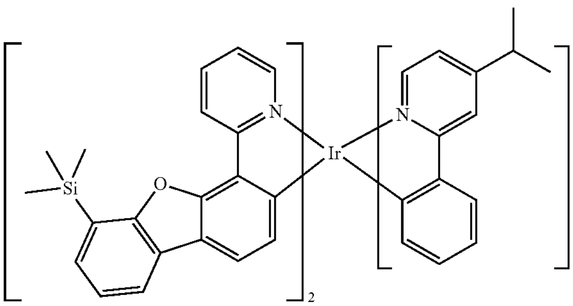
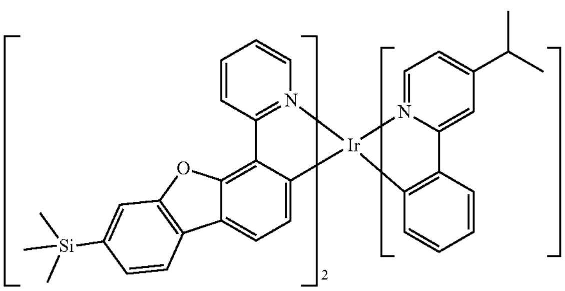
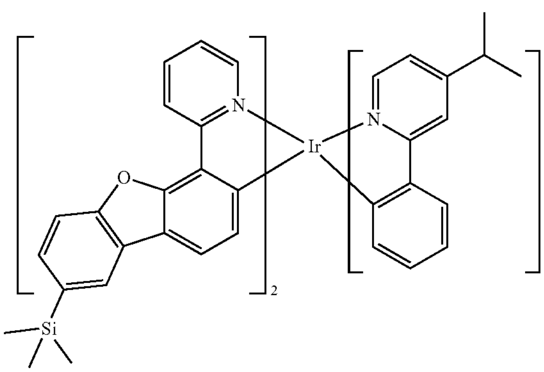
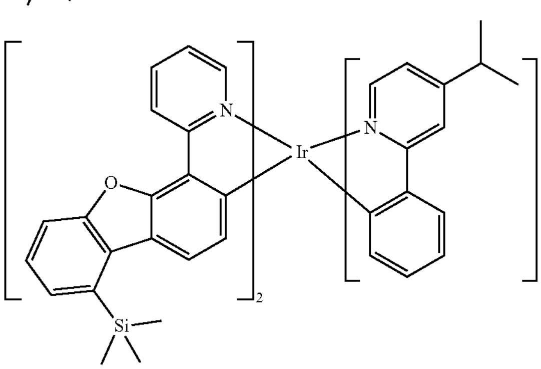
-continued
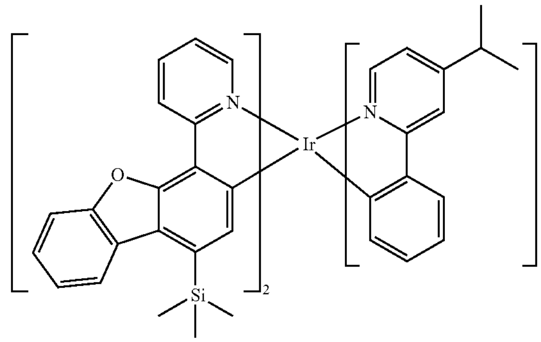
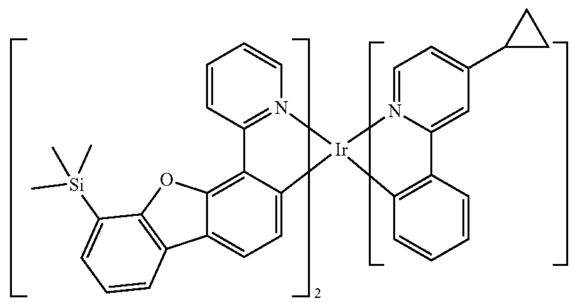
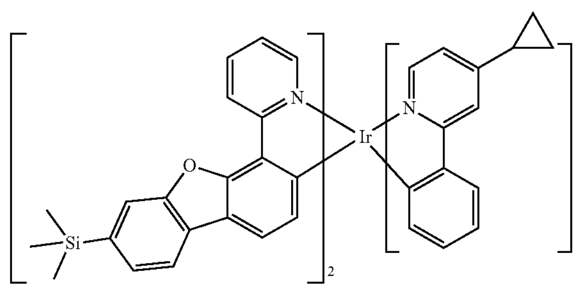
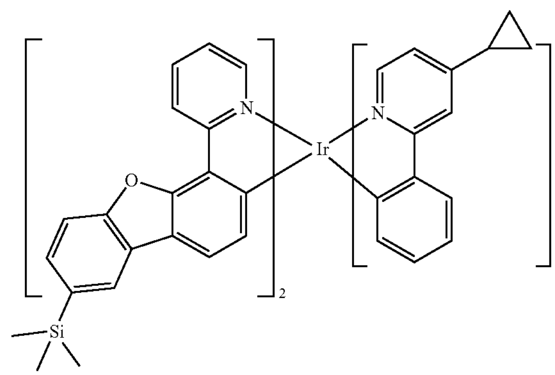
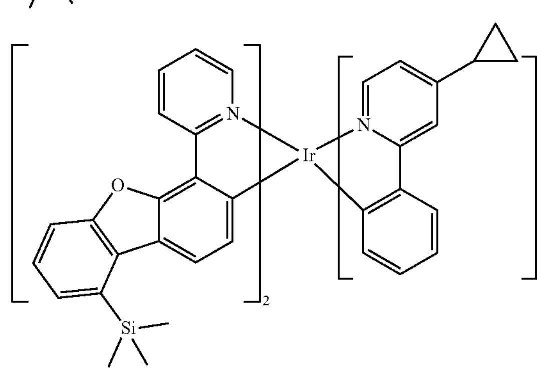

-continued
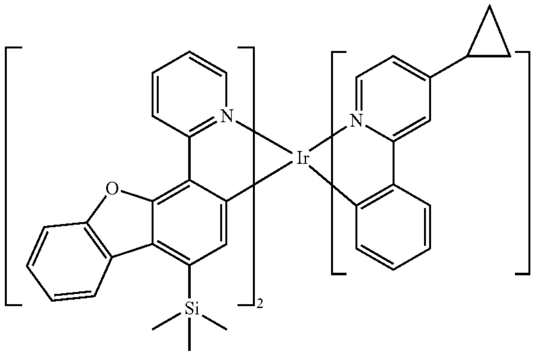
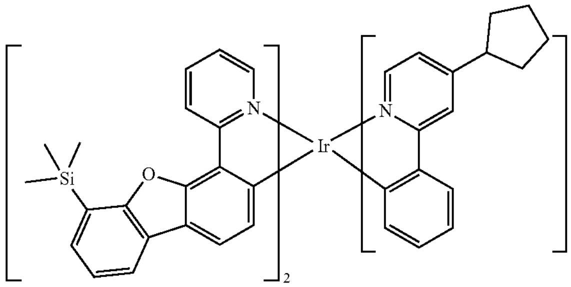
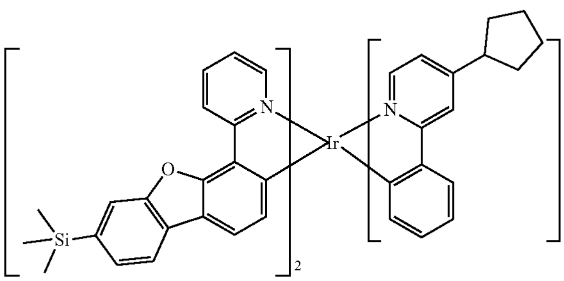
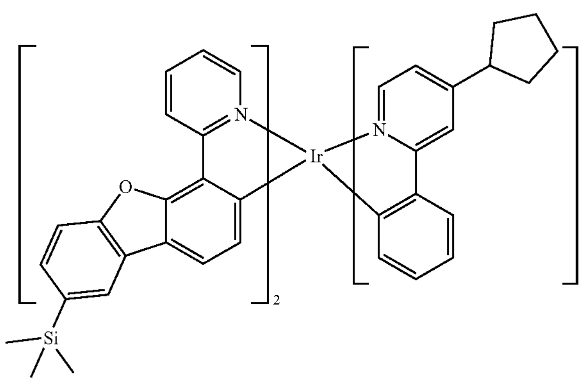
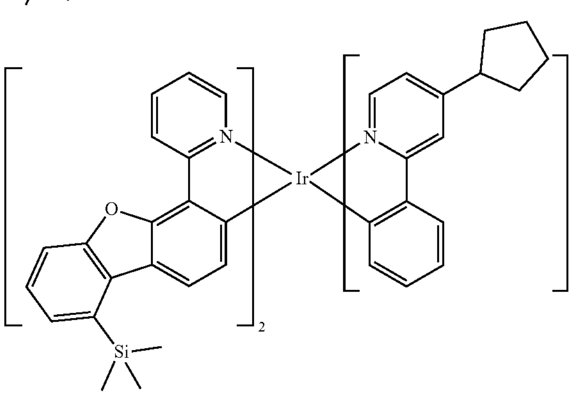
-continued
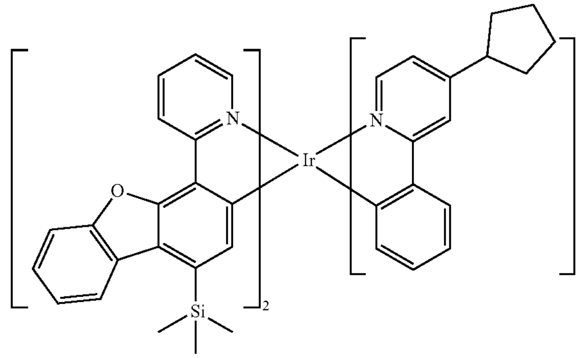
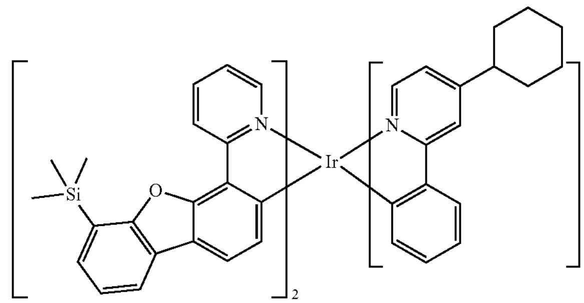
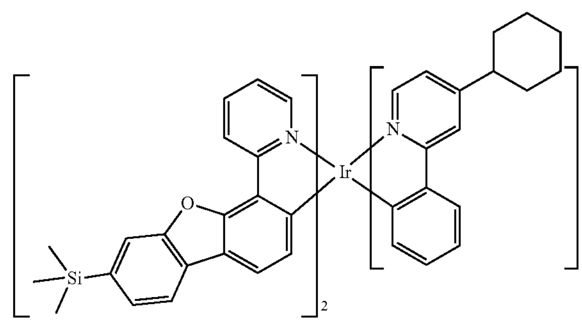
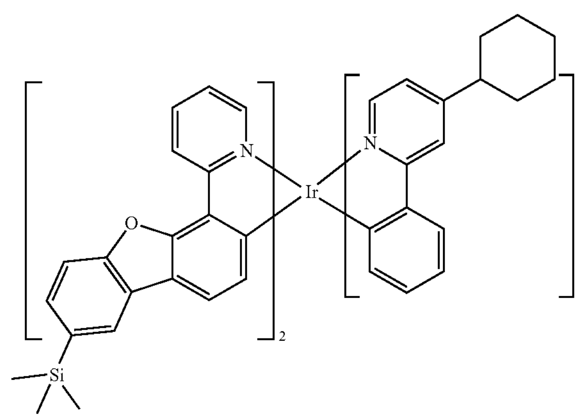

-continued
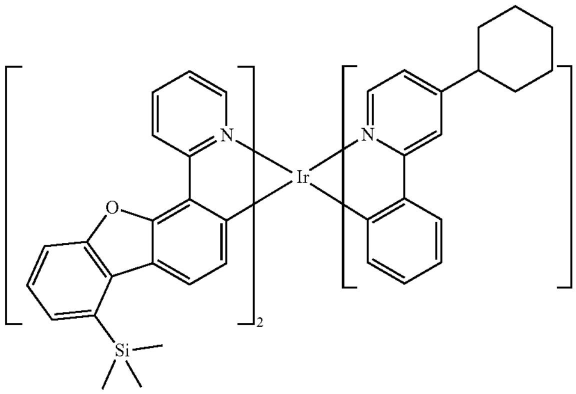
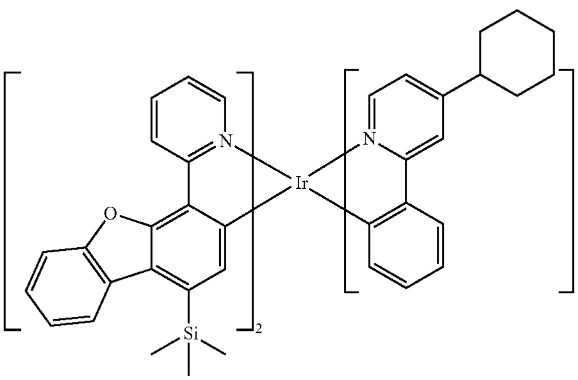
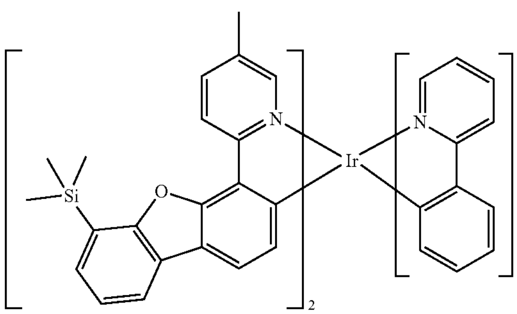
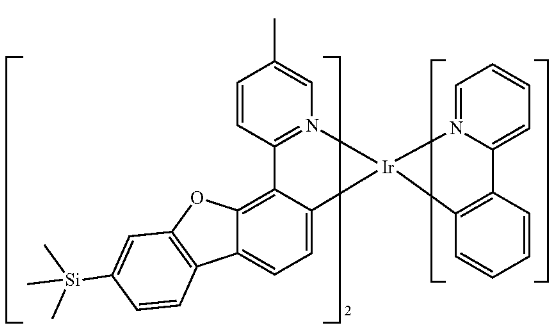
-continued
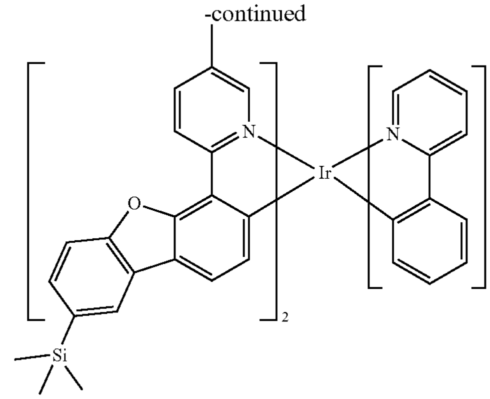
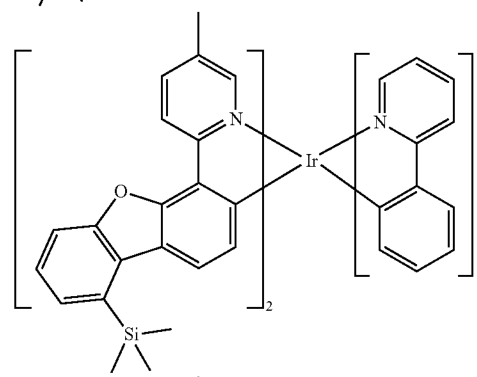
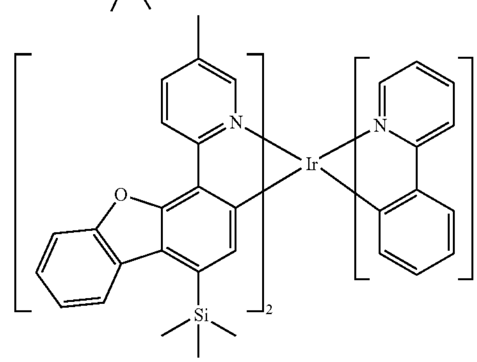
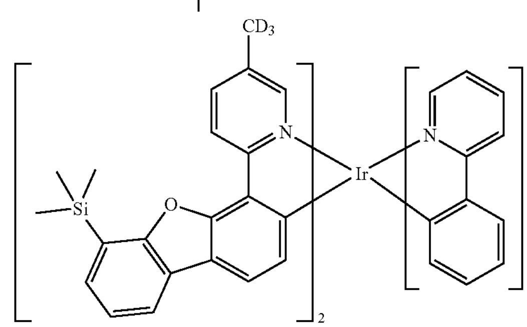
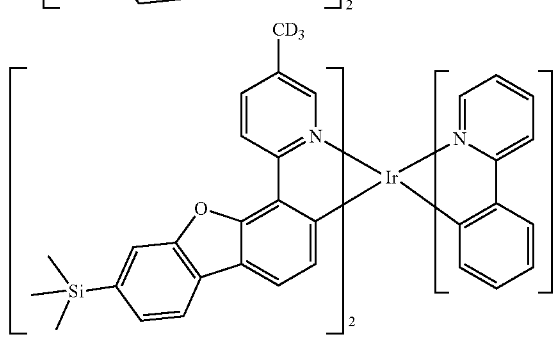

-continued
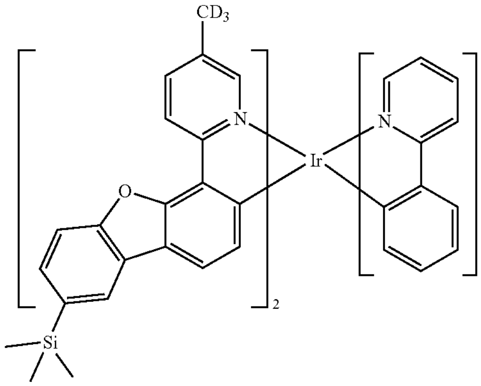
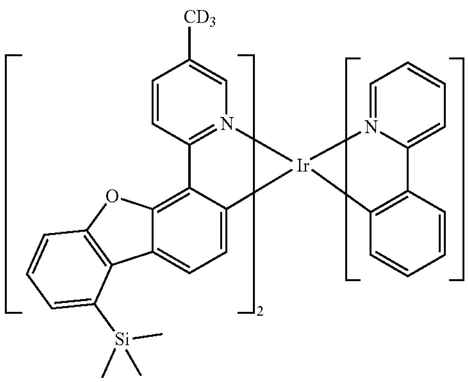
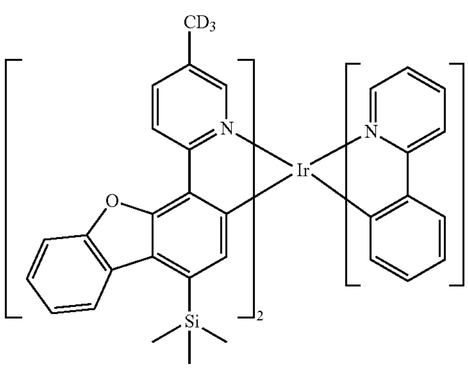
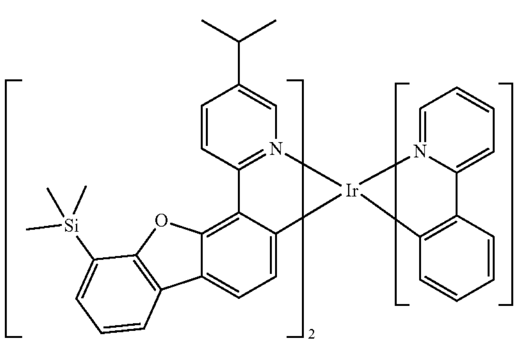
-continued
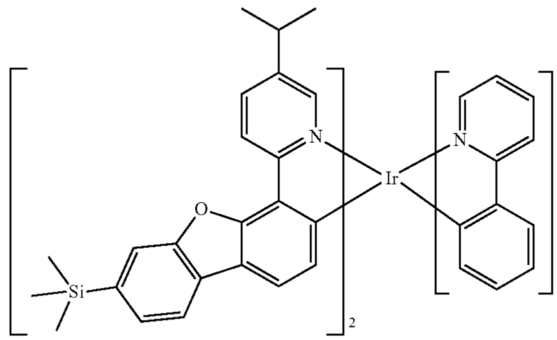
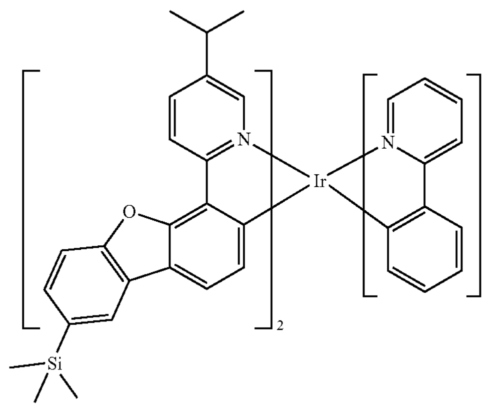
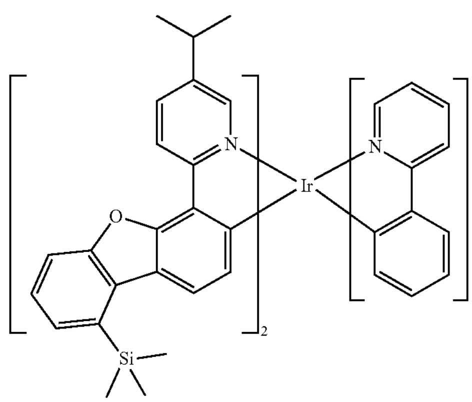
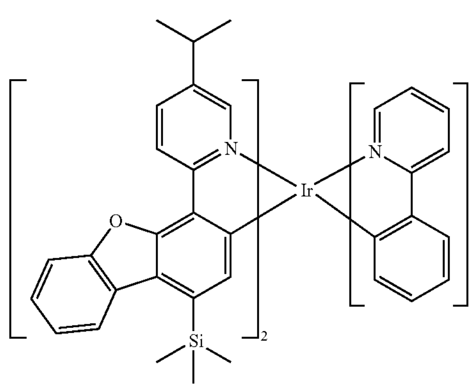

-continued
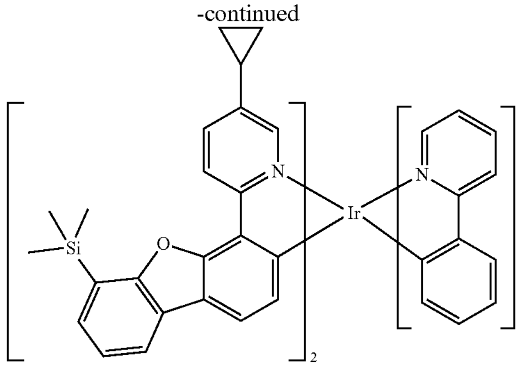
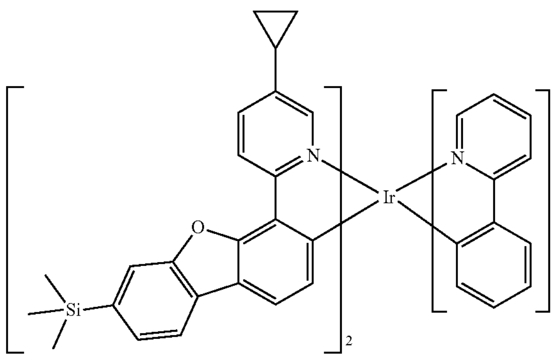
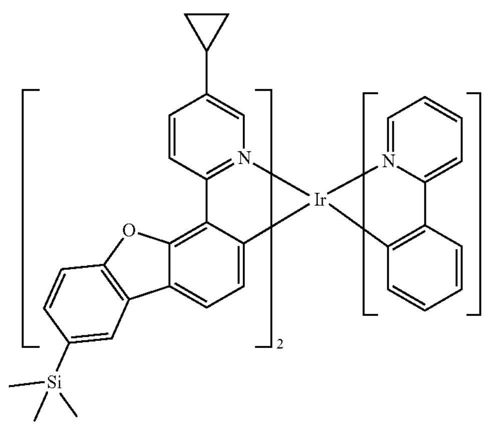
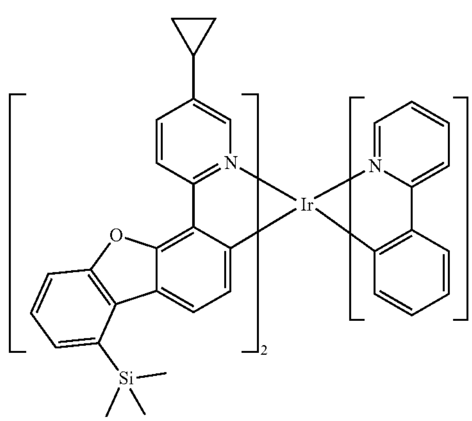
-continued
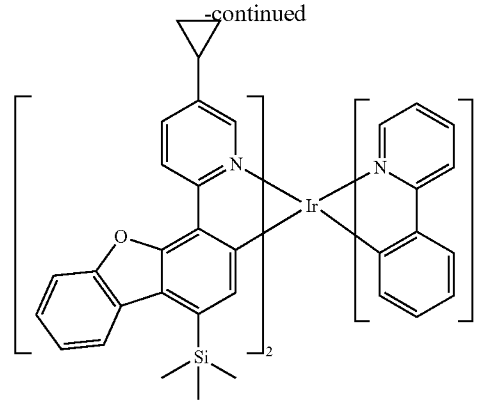
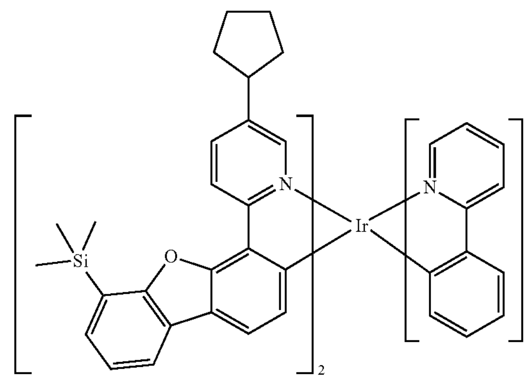
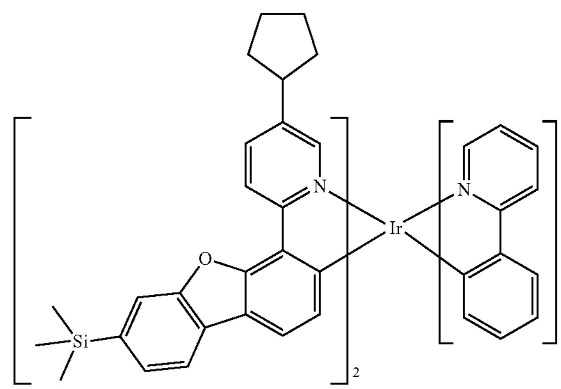
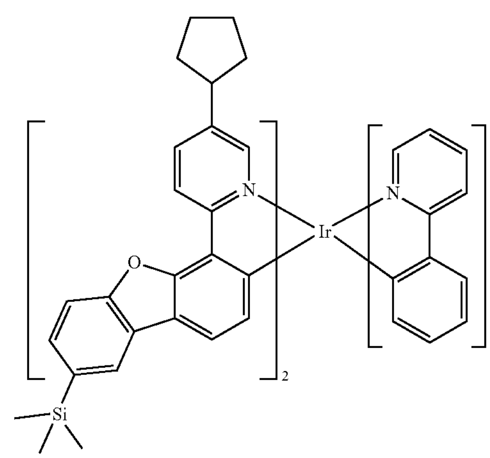

-continued
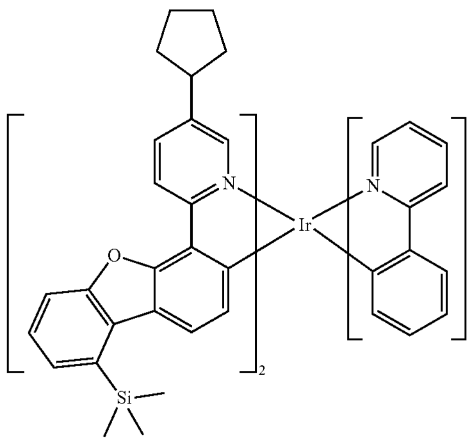
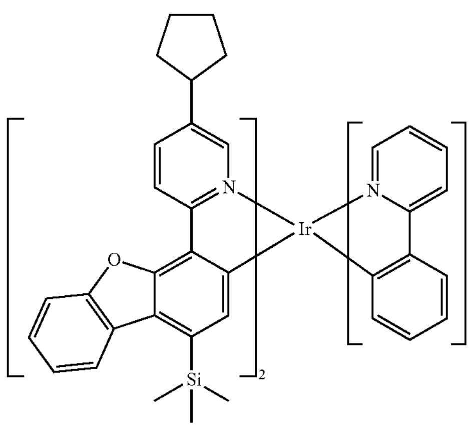
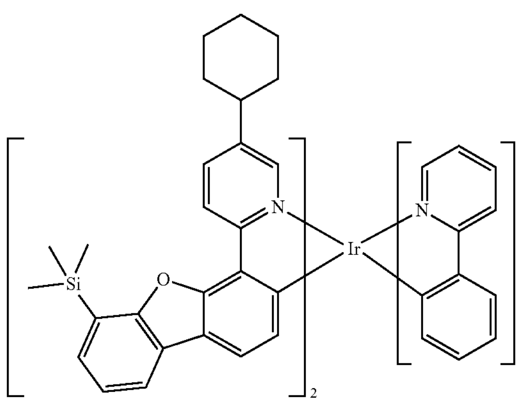
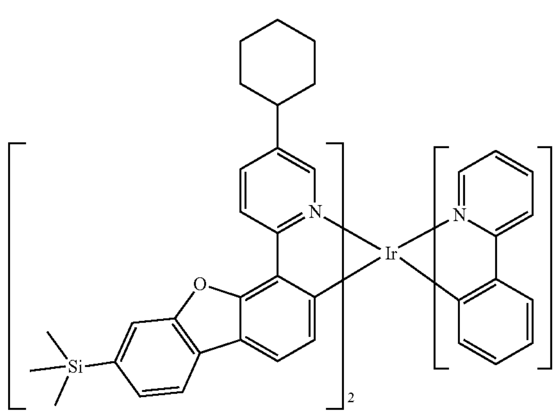
-continued
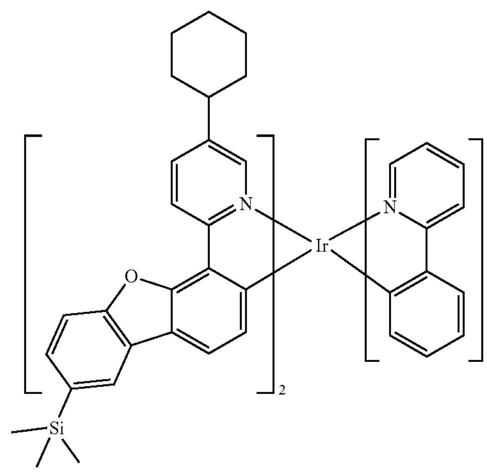
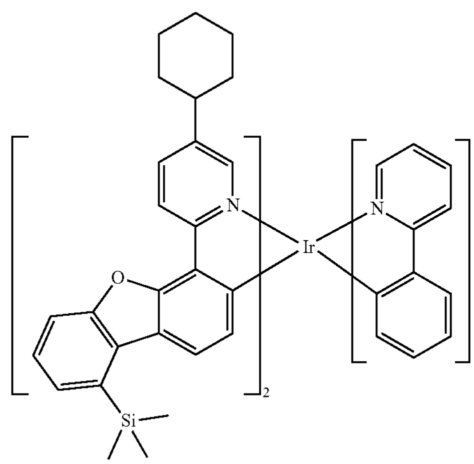
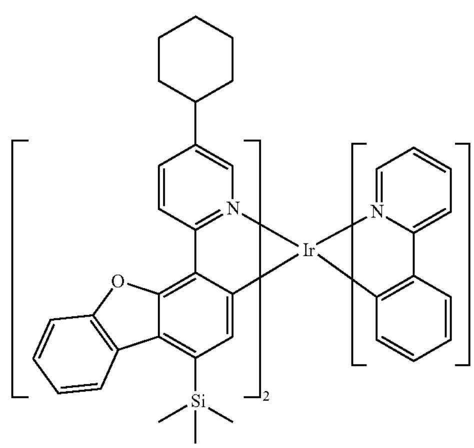
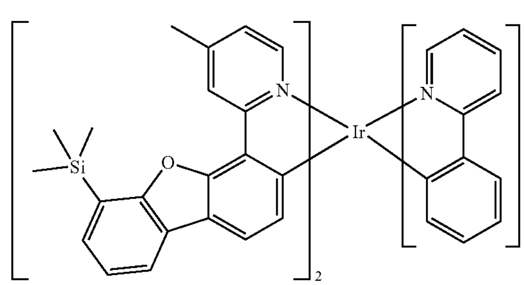

-continued
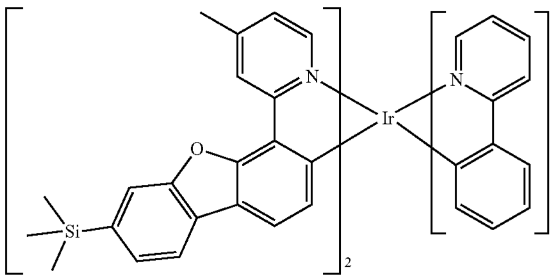
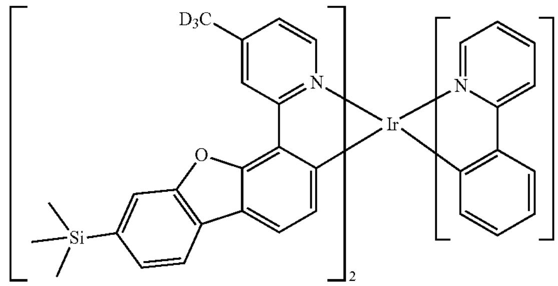
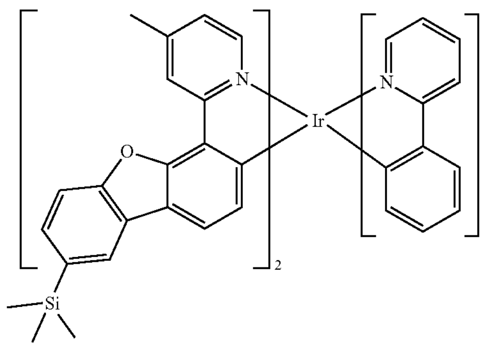
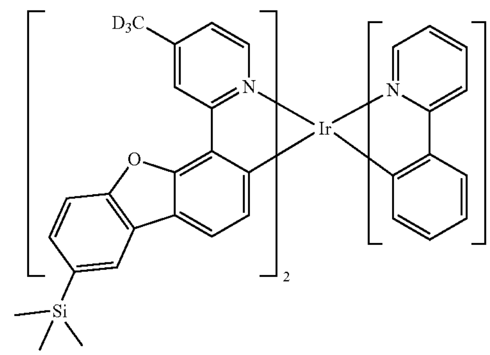
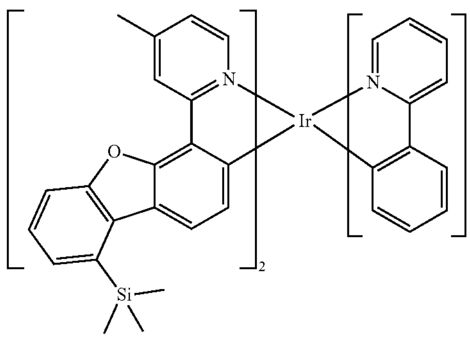
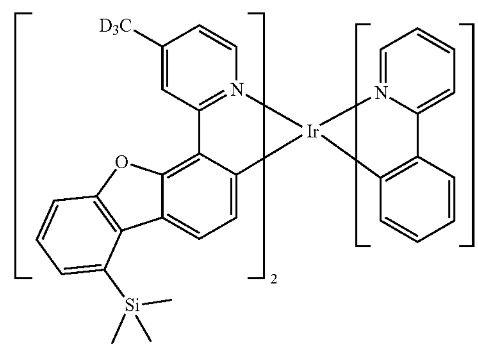
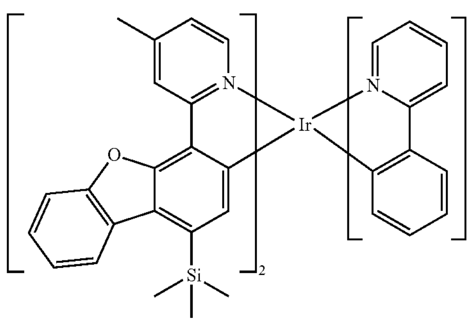
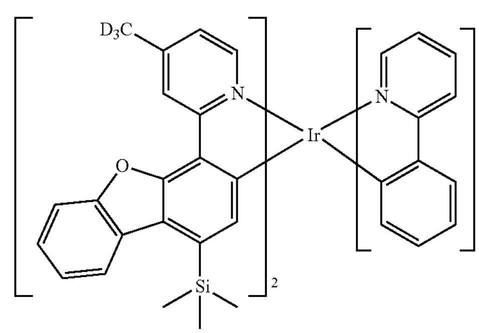
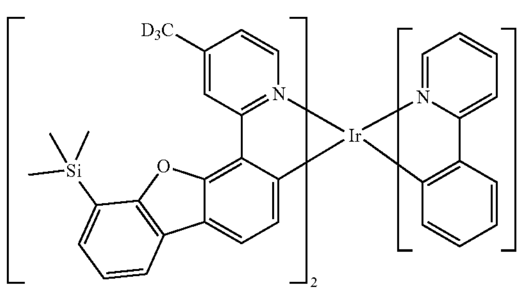
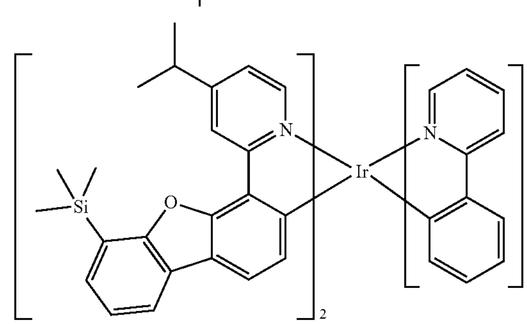

-continued
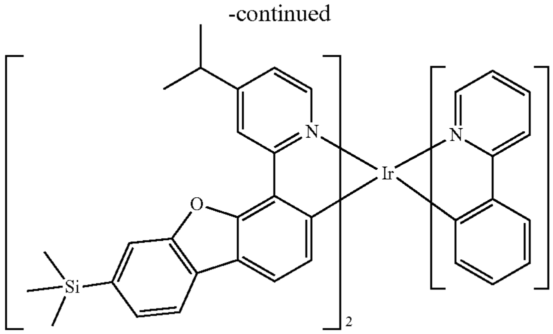
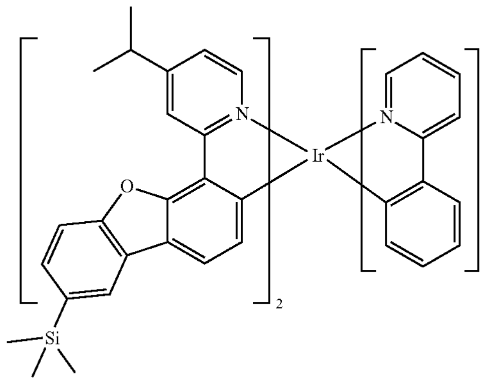
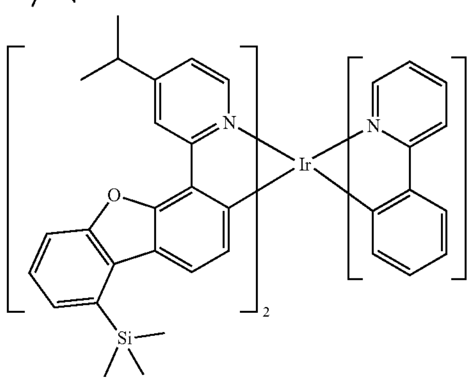
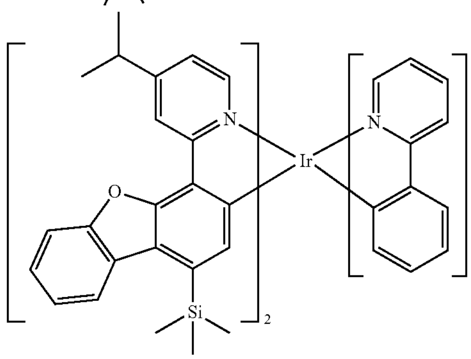
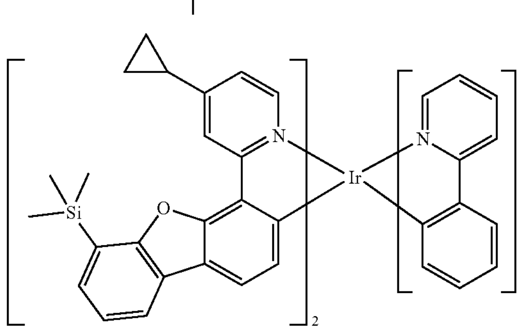
-continued
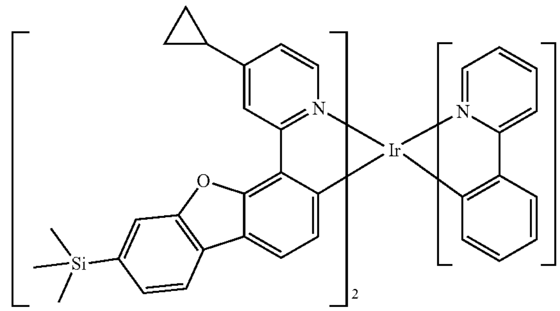
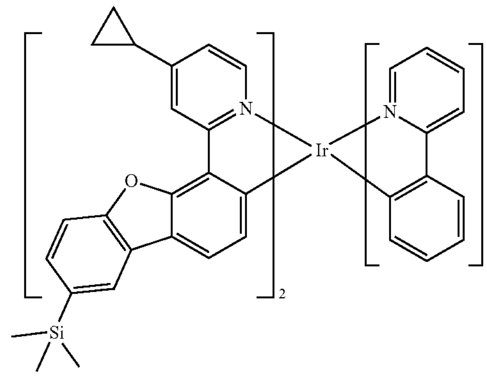
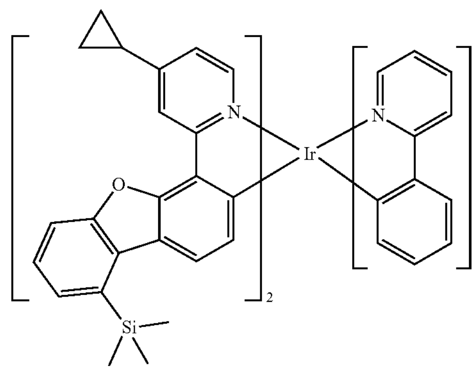
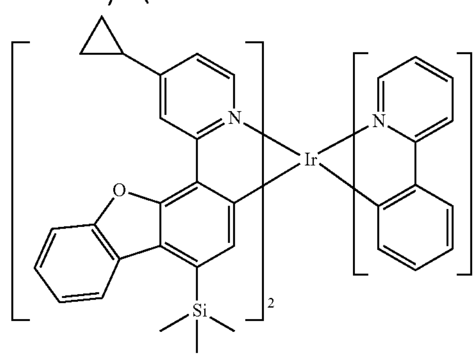
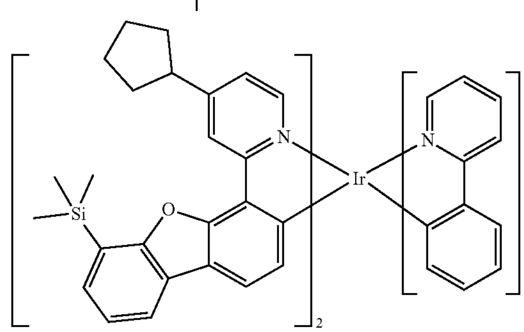

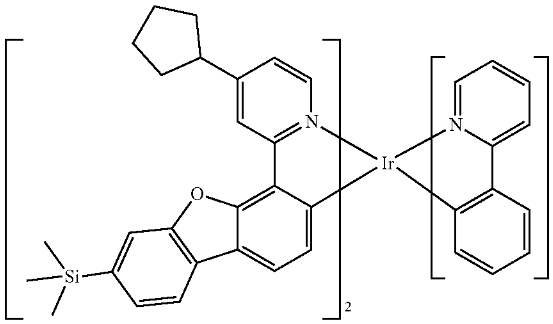
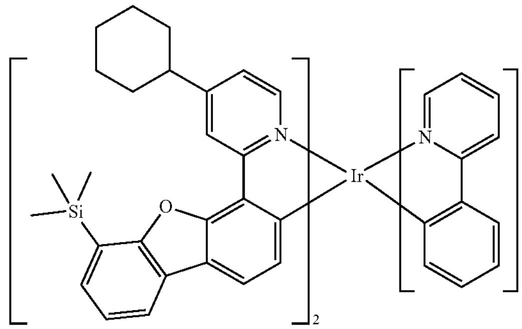
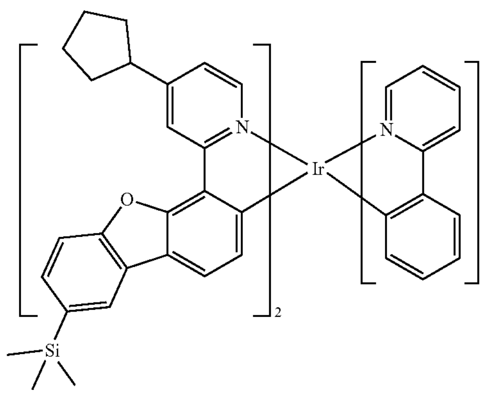
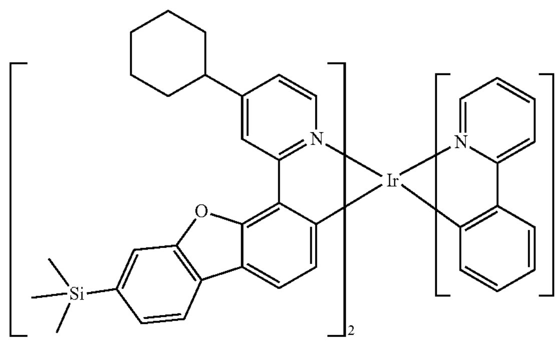
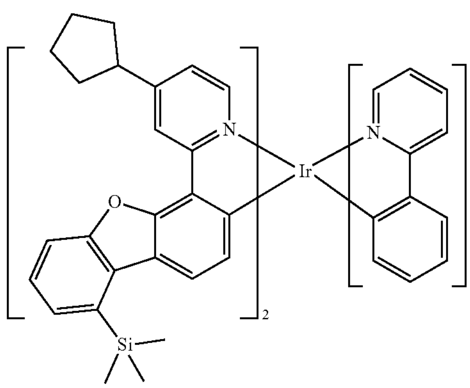
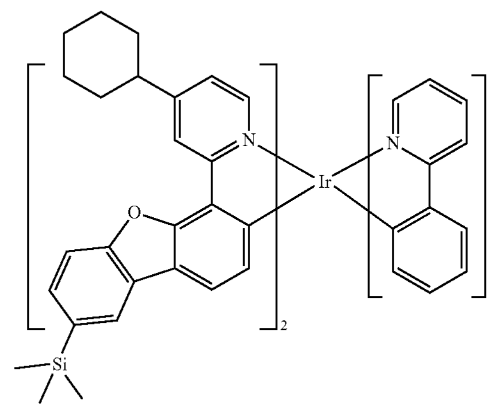
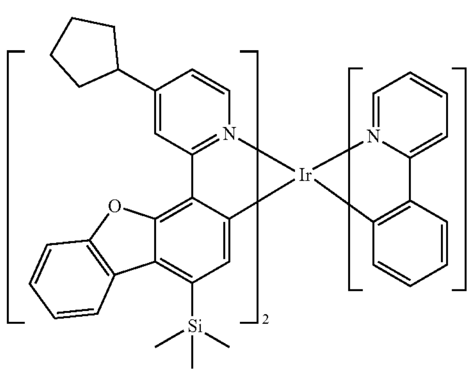
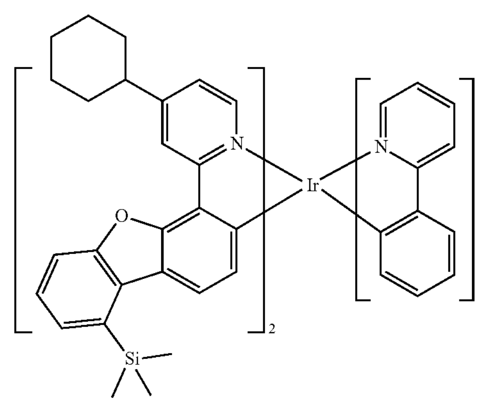

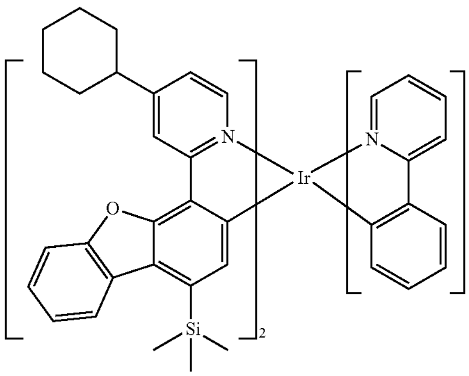
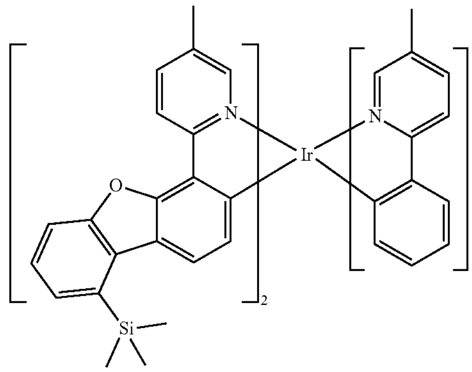
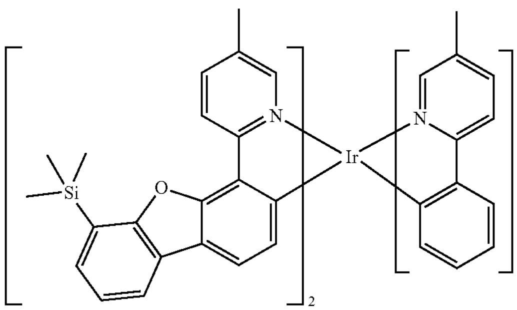
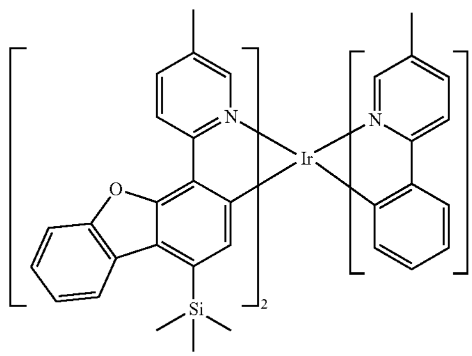
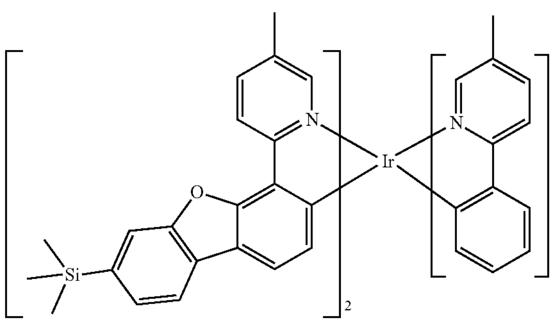
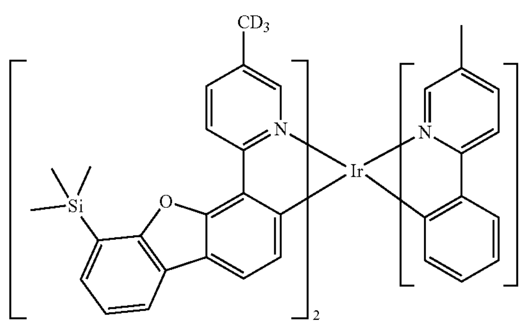
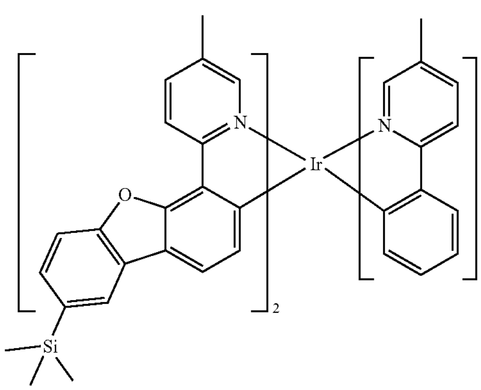
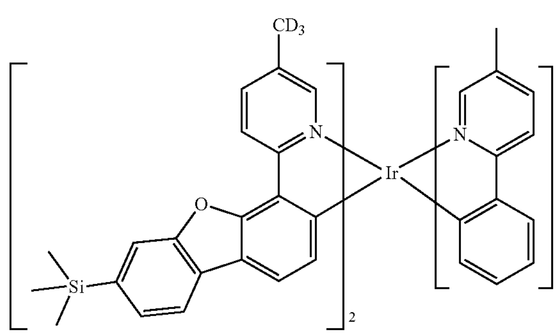

-continued
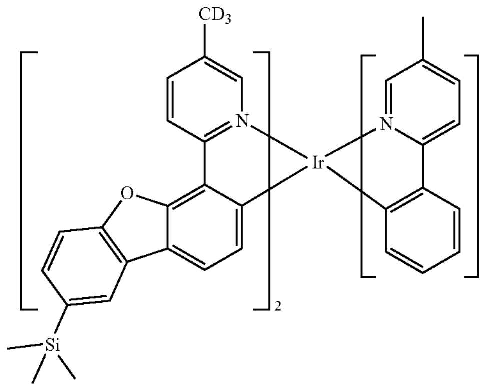
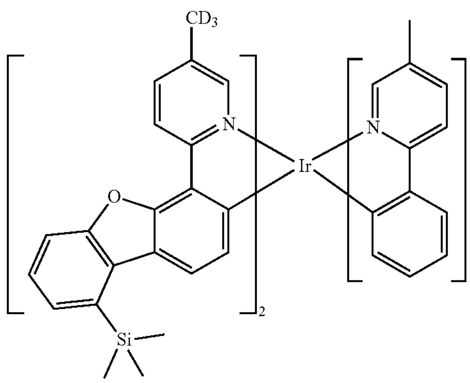
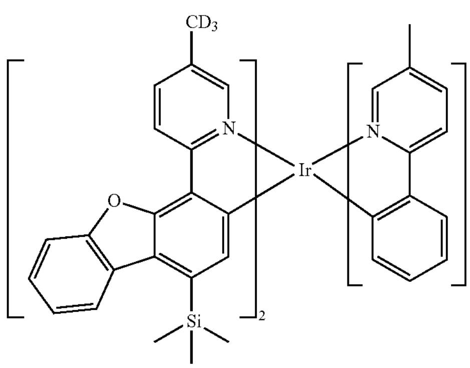
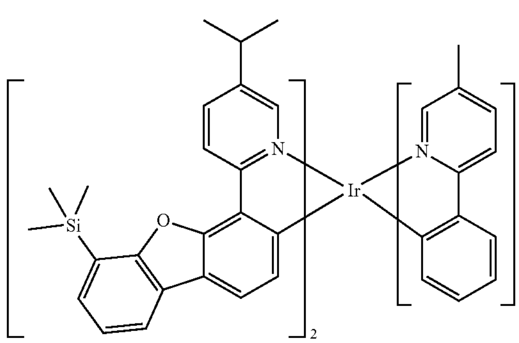
-continued
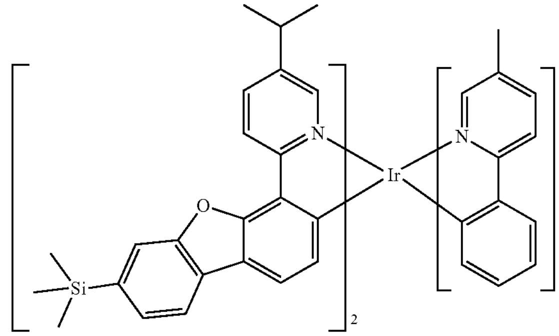
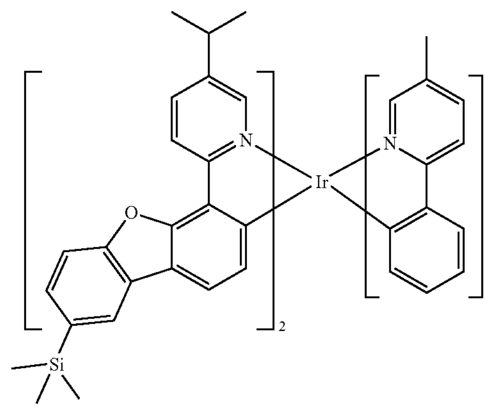
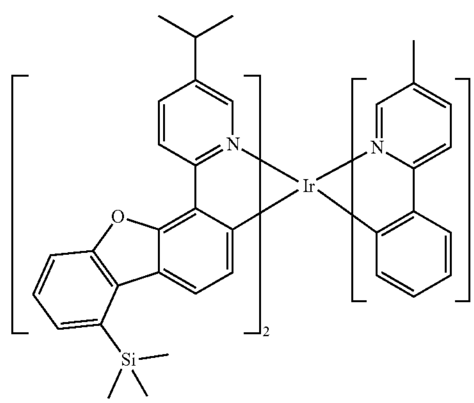
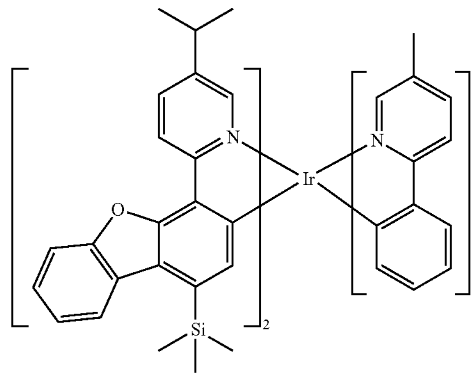

-continued
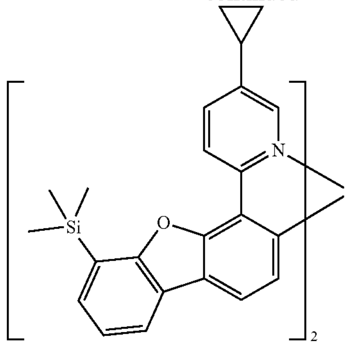
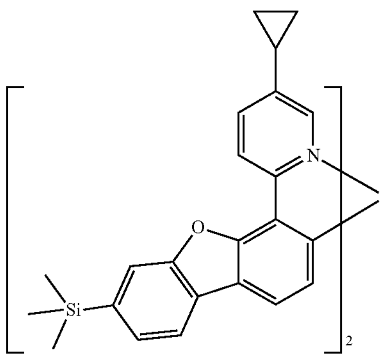
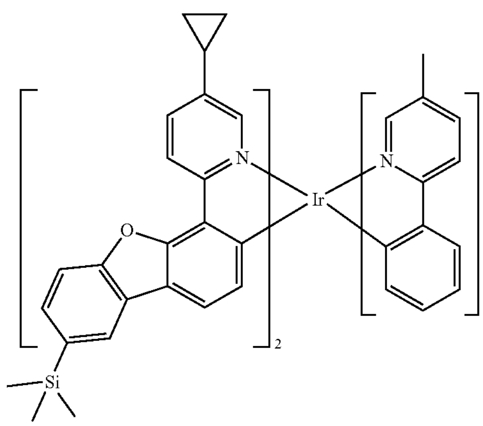
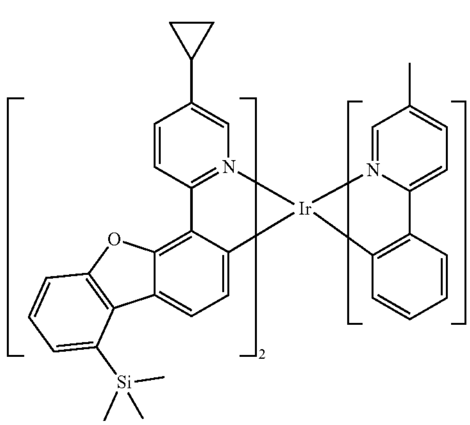
-continued
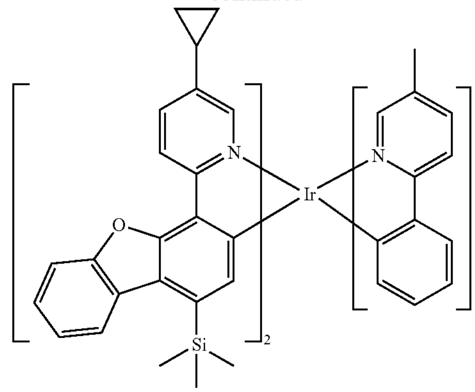
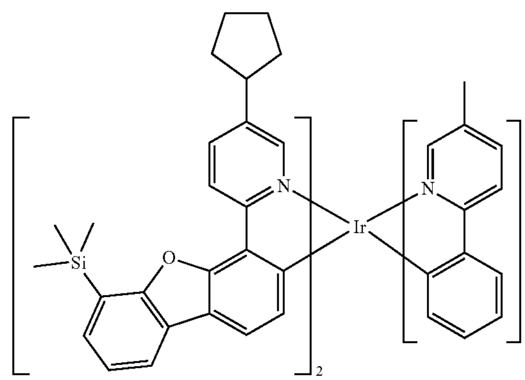
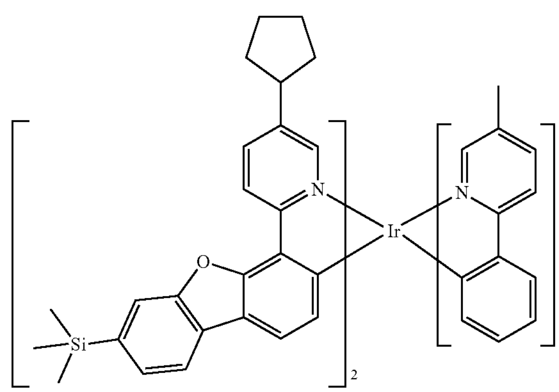
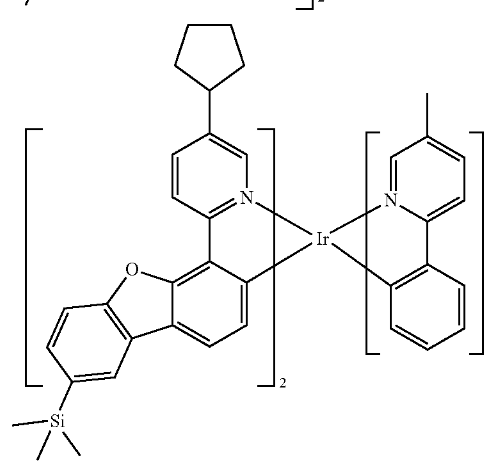

-continued
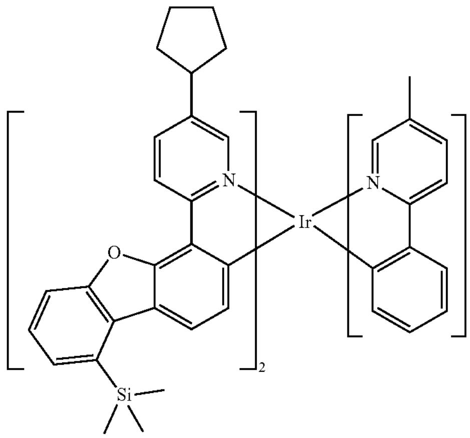
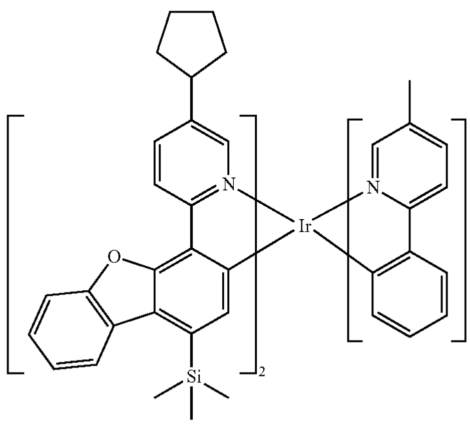
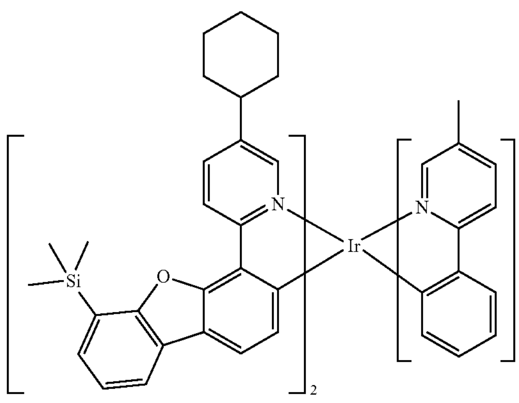
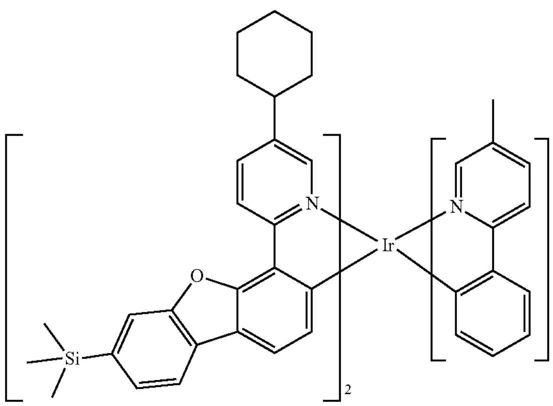
-continued
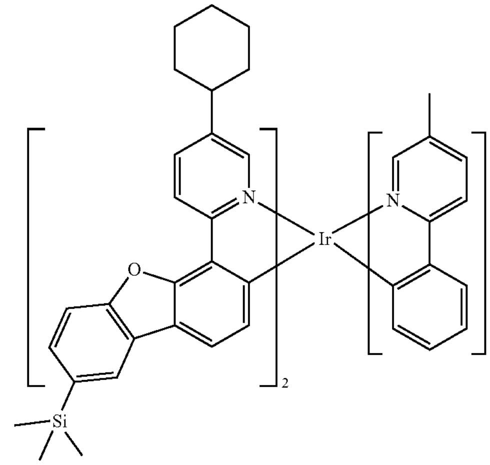
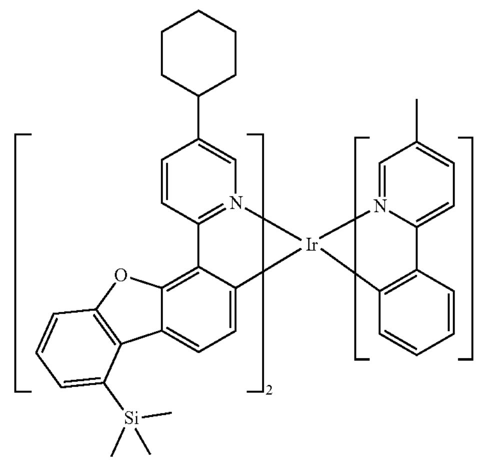
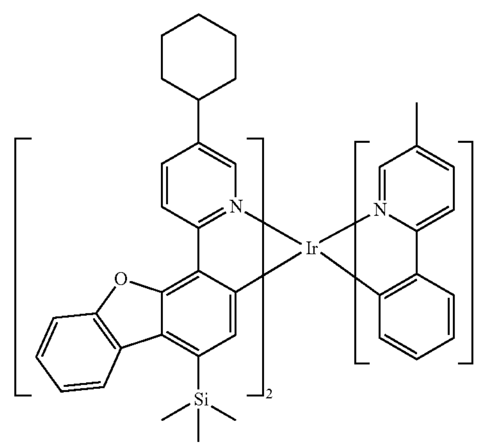
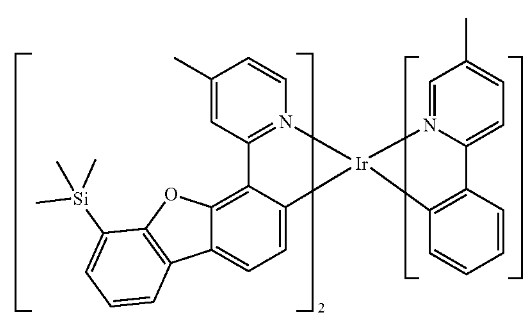

-continued
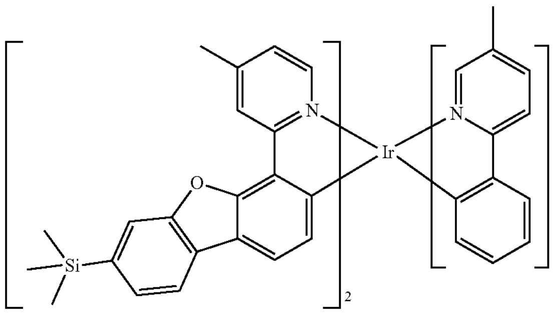
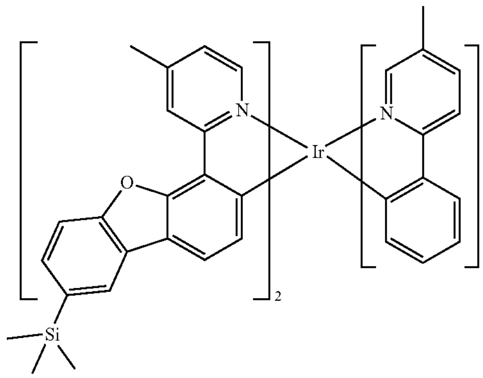
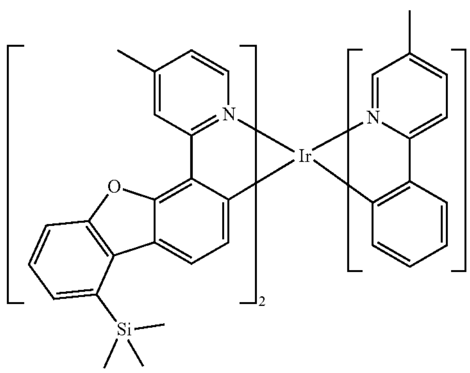
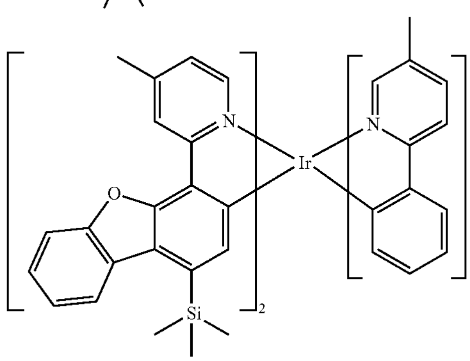
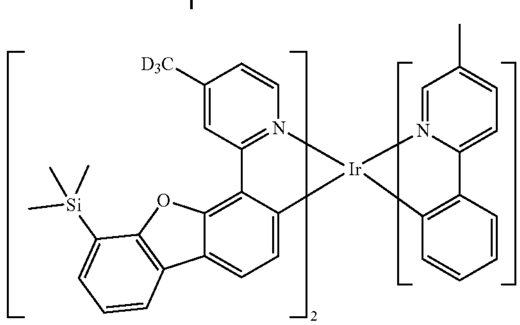
-continued
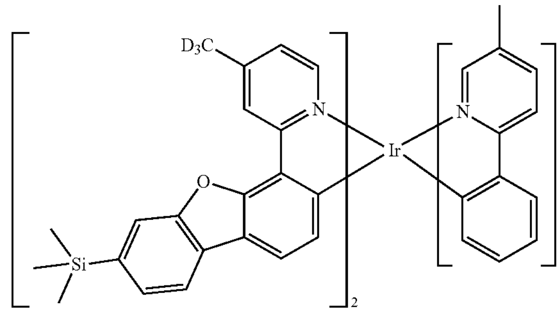
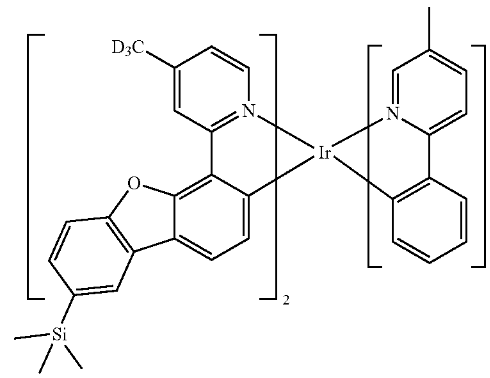
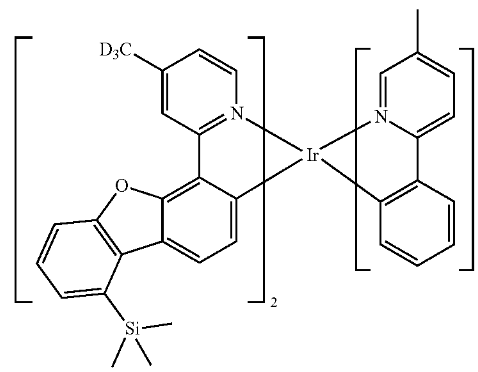
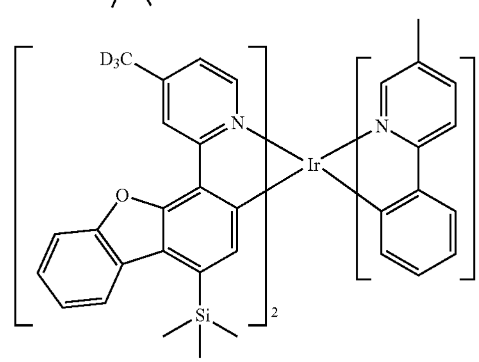
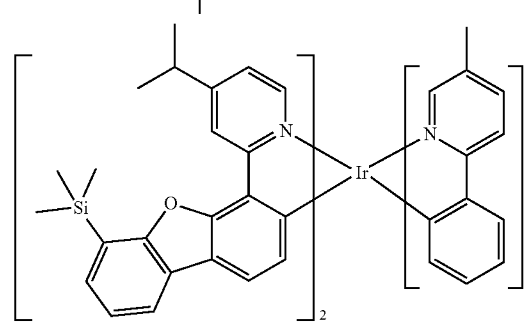

-continued
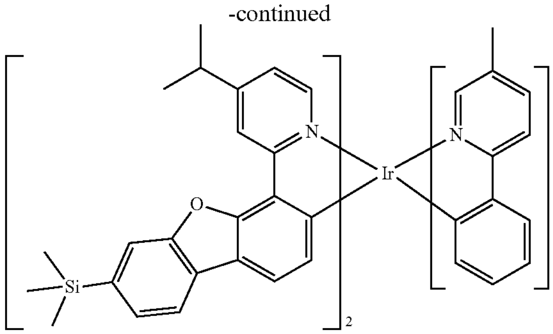
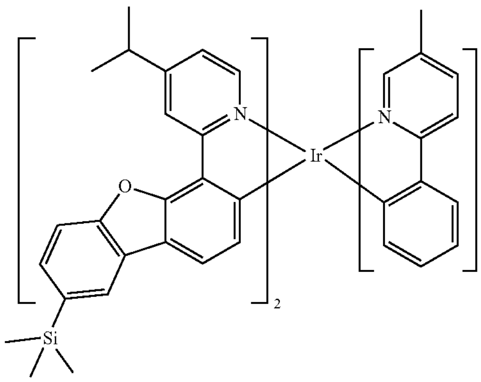
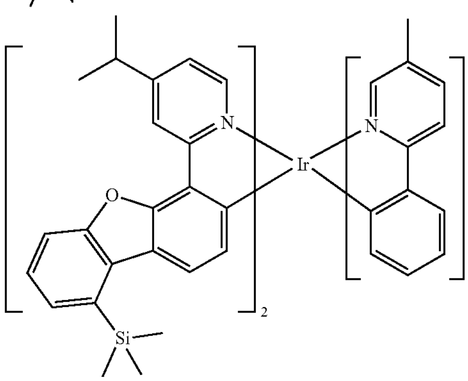
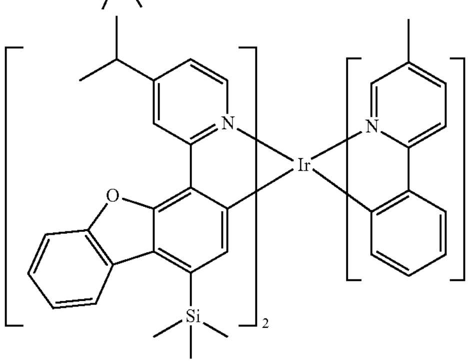
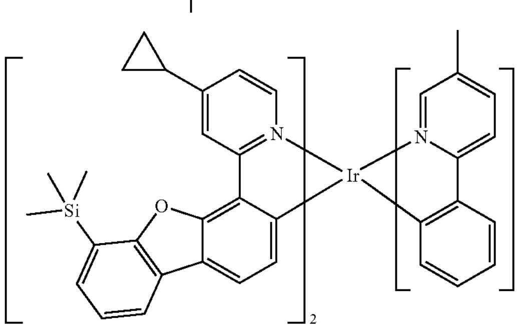
-continued
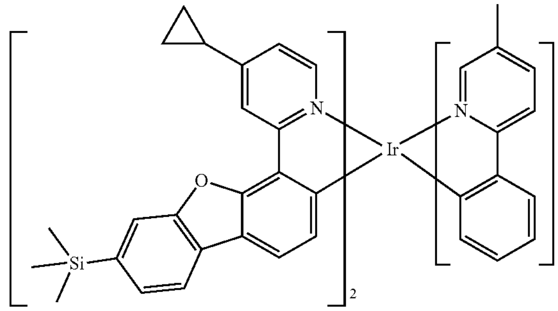
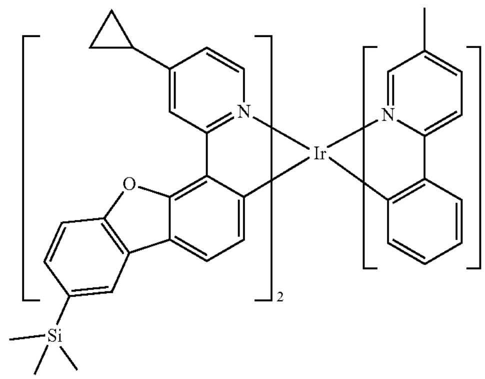
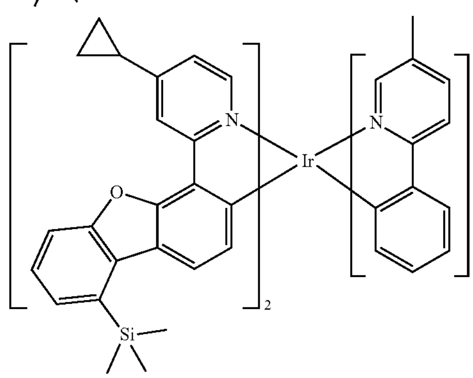
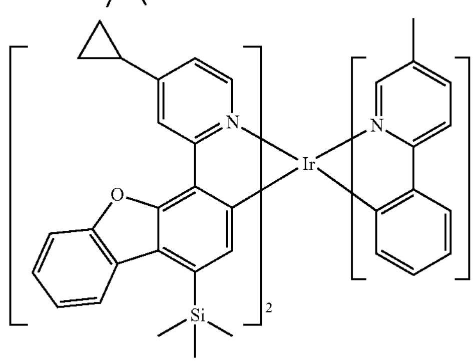
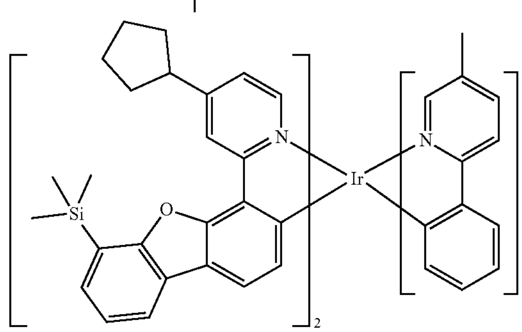

-continued
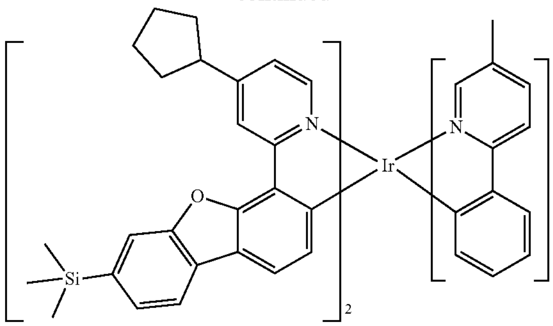
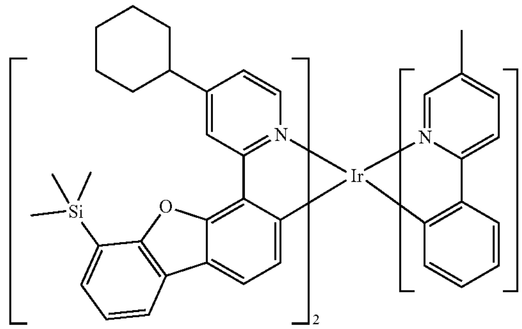
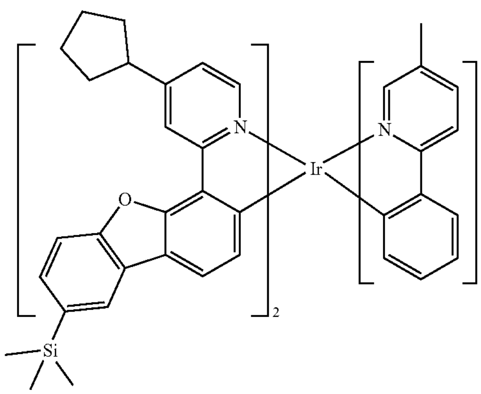
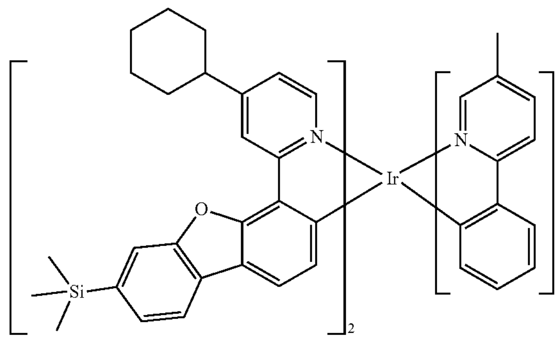
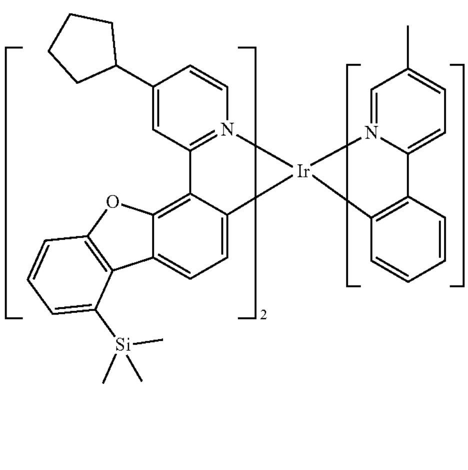
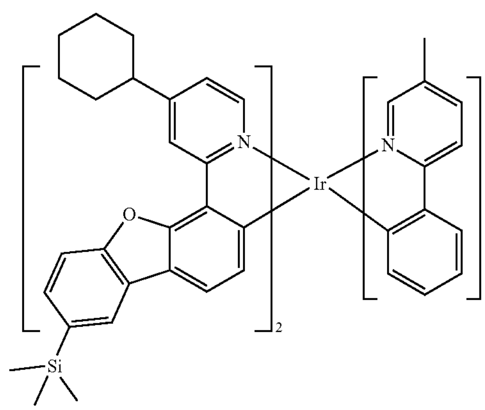
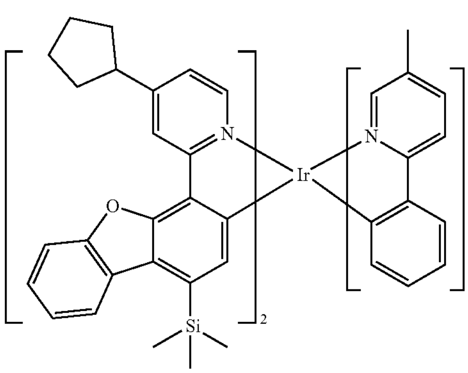
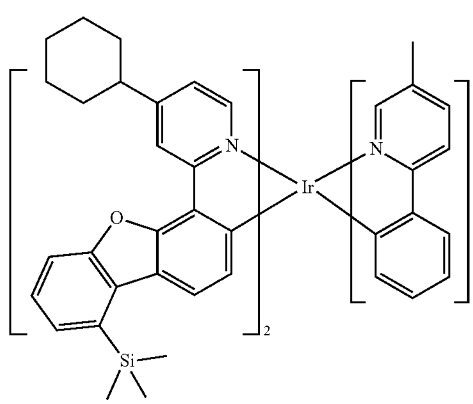

-continued
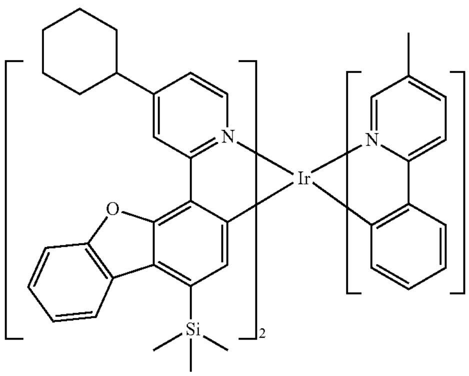
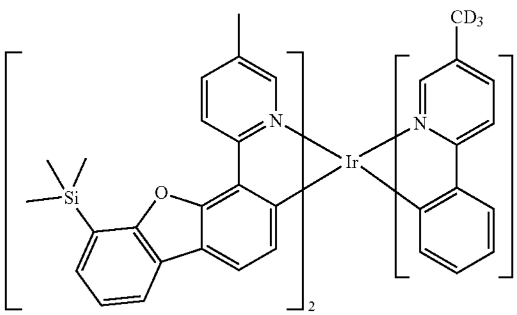
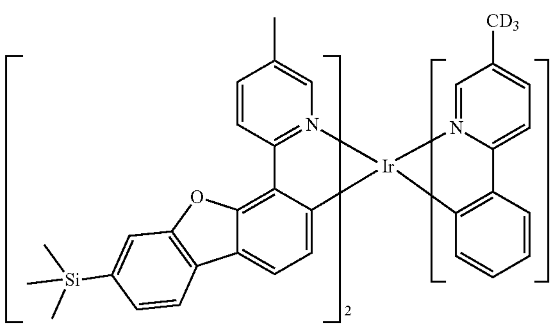
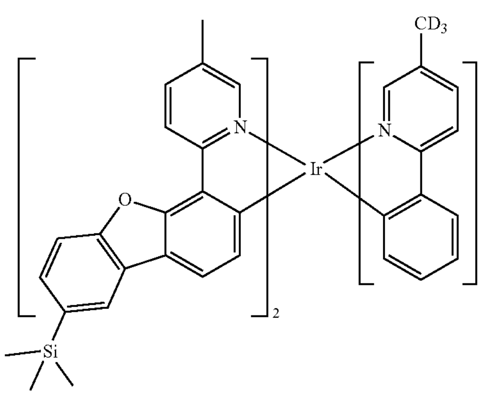
-continued
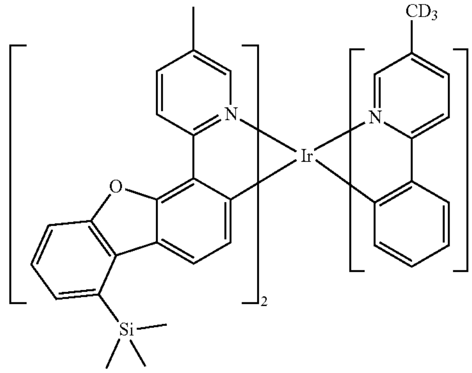
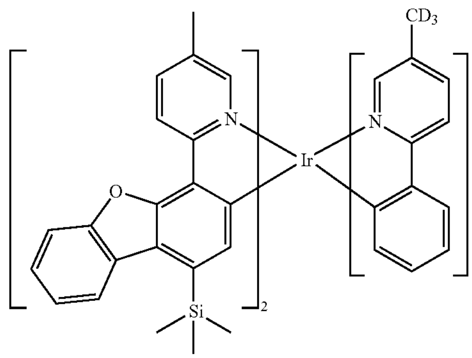
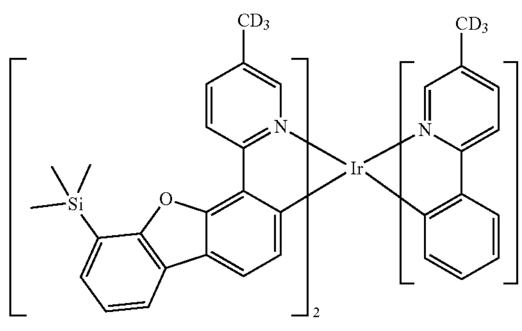
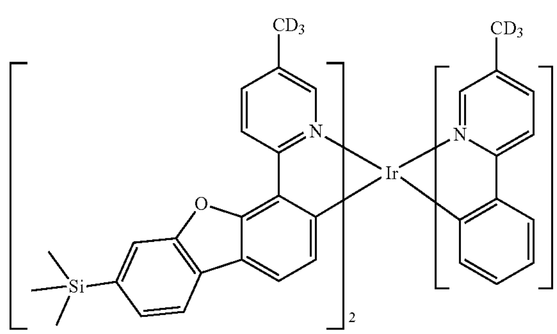

-continued
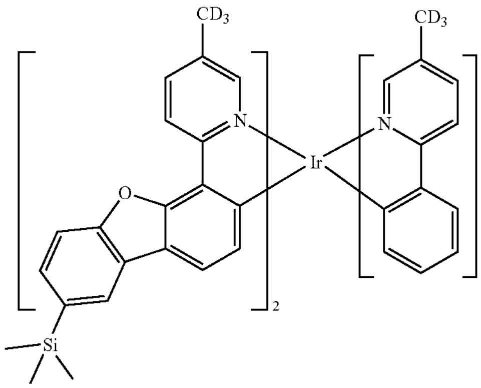
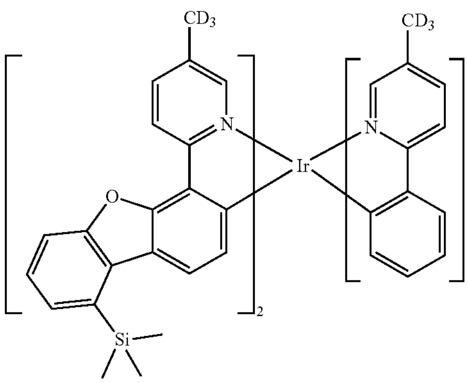
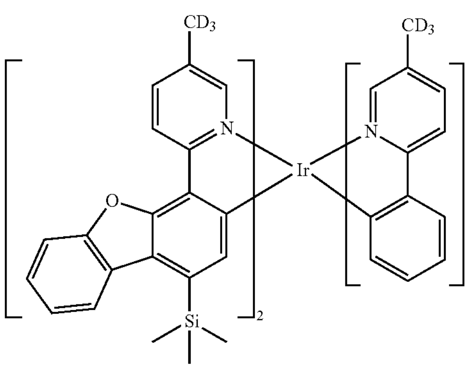
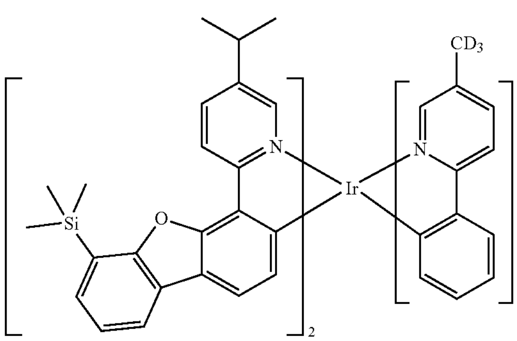
-continued
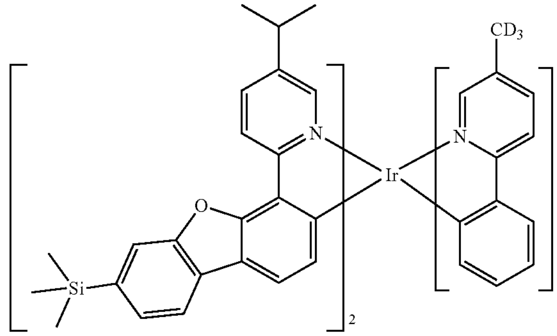
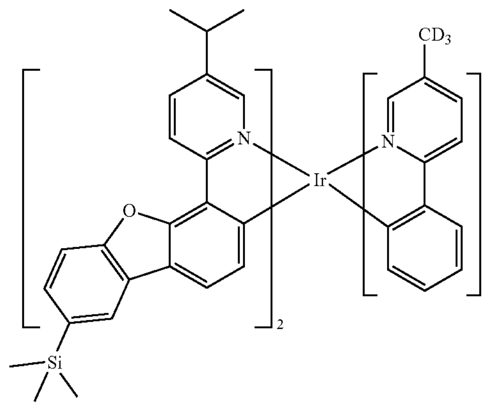
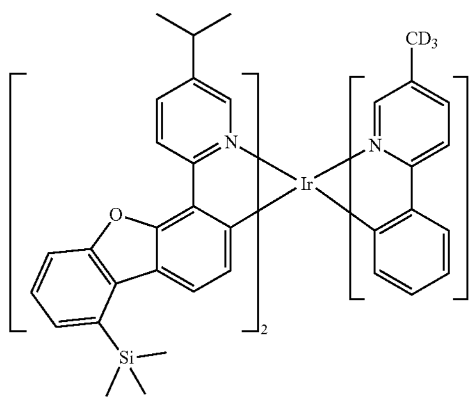
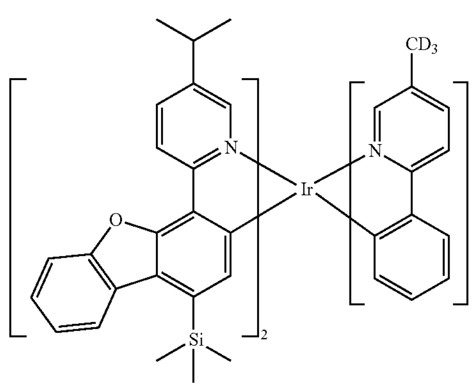

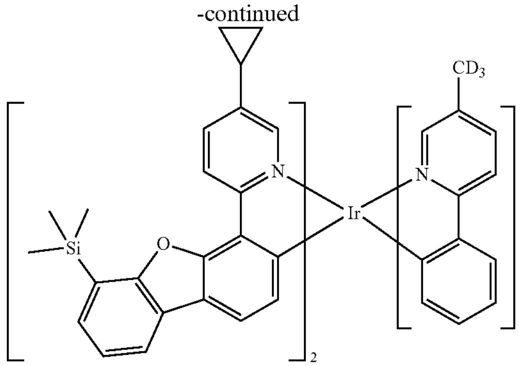
CD3
N
Ir
N
Si
O
2
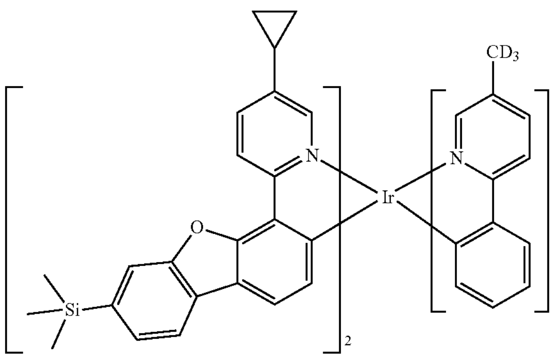
CD3
N
Ir
N
O
Si
2
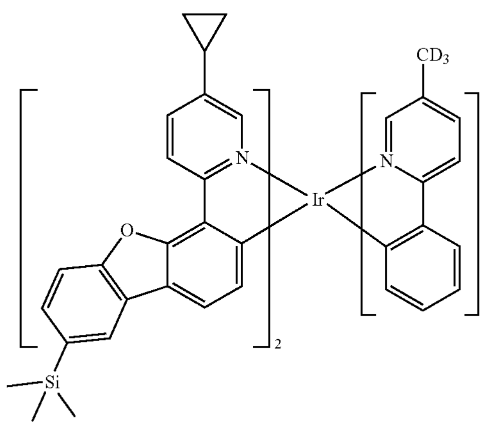
CD3
N
Ir
N
O
Si
2
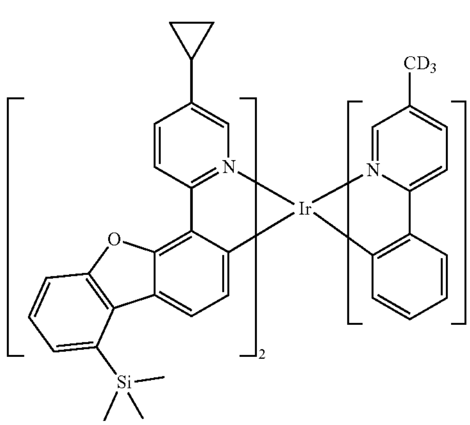
CD3
N
Ir
N
O
Si
2
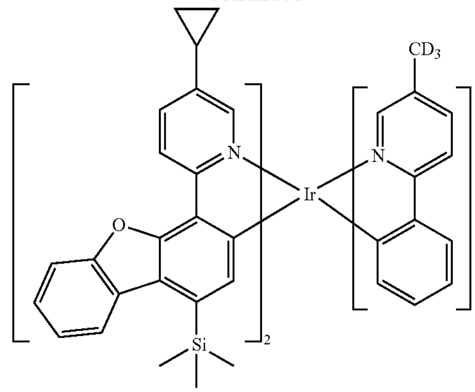
CD3
N
Ir
N
O
Si
2
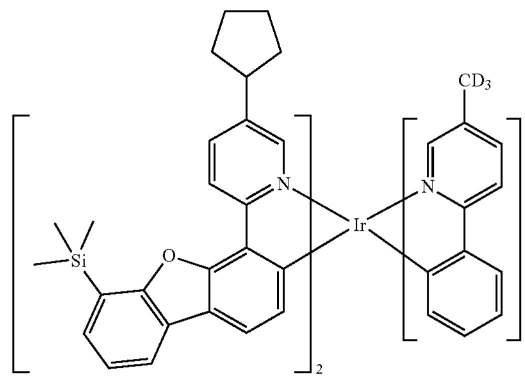
CD3
N
Ir
N
Si
O
2
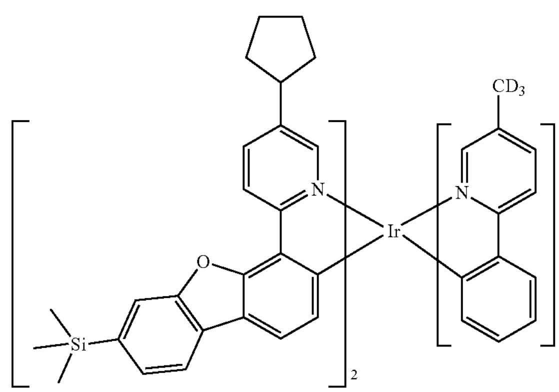
CD3
N
Ir
N
O
Si
2
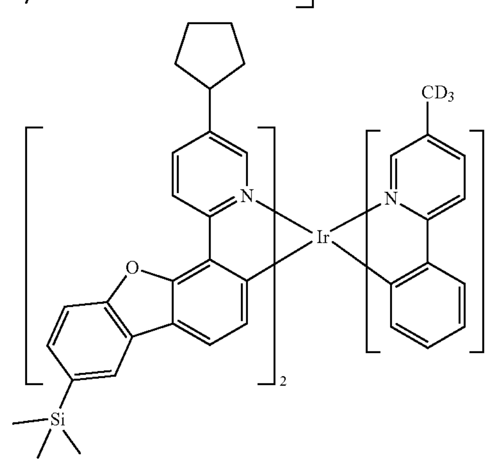
CD3
N
Ir
N
O
Si
2

-continued
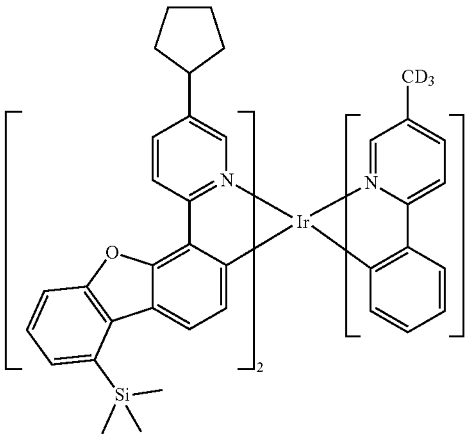
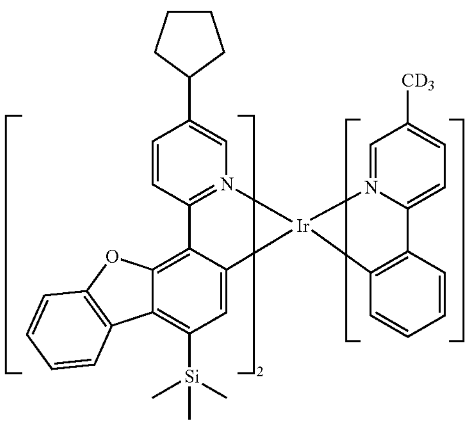
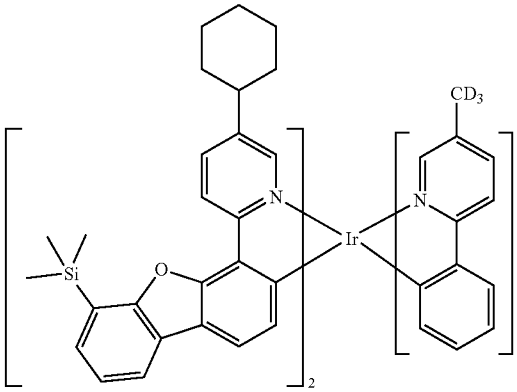
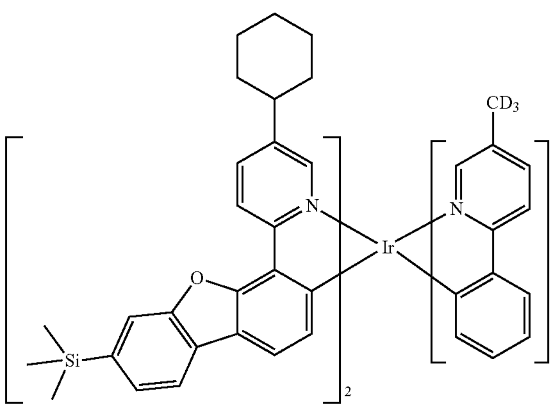
-continued
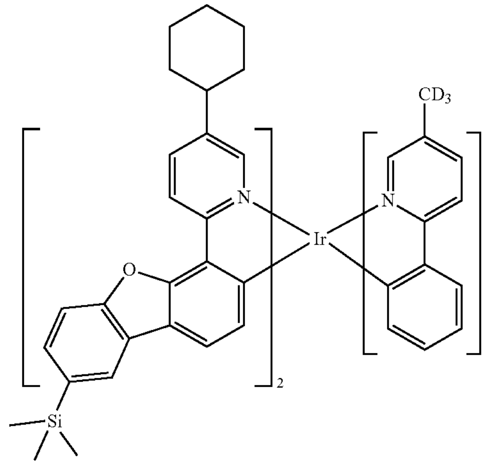
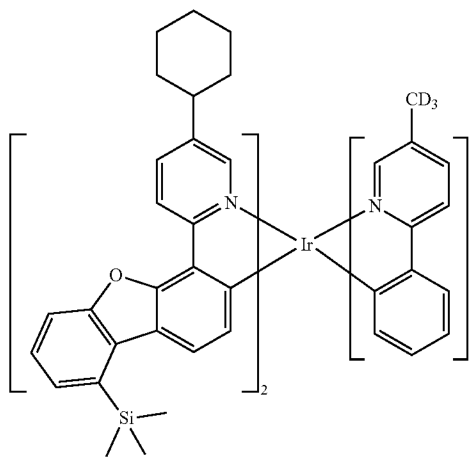
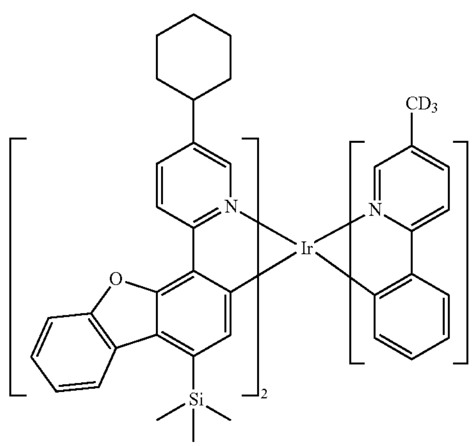
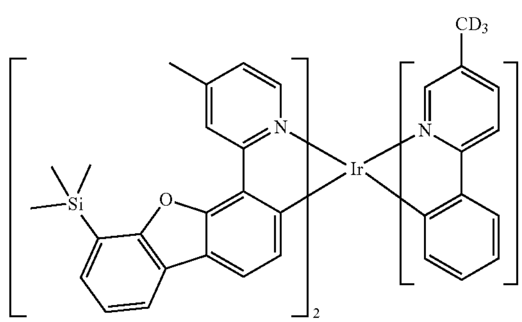

-continued
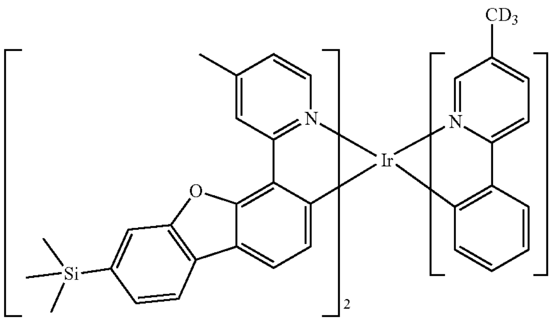
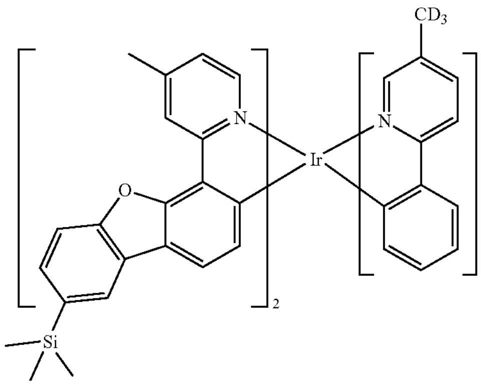
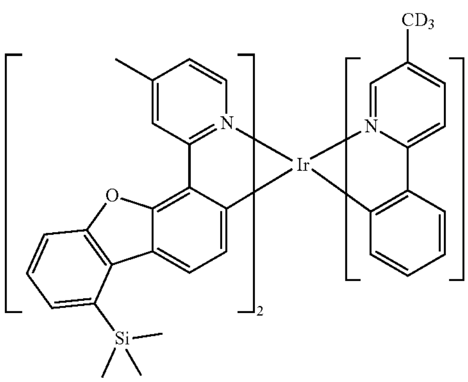
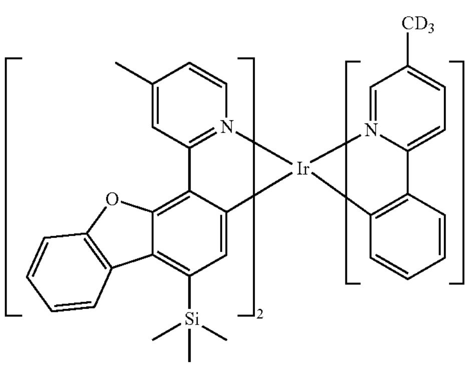
-continued
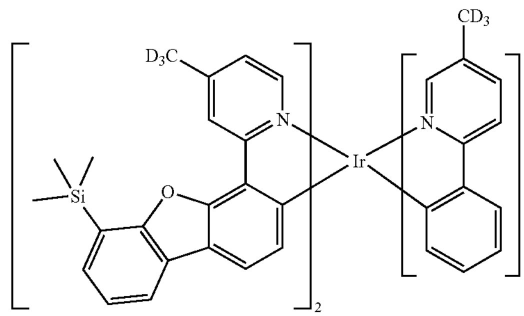
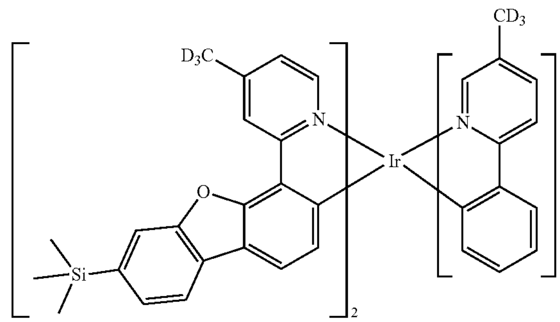
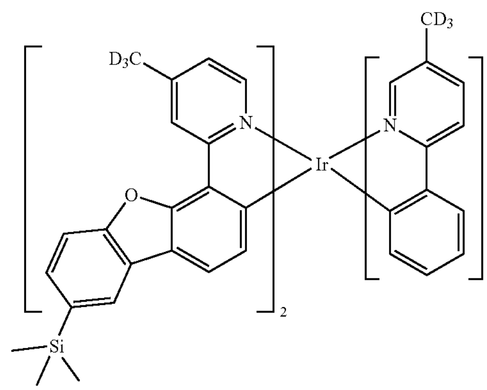
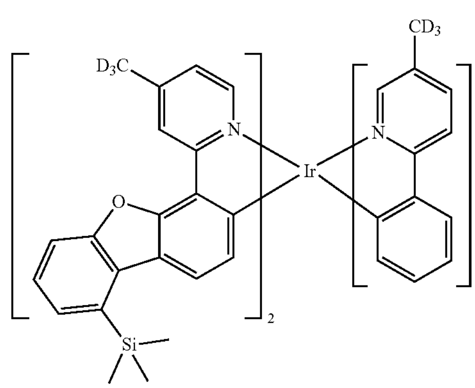

-continued
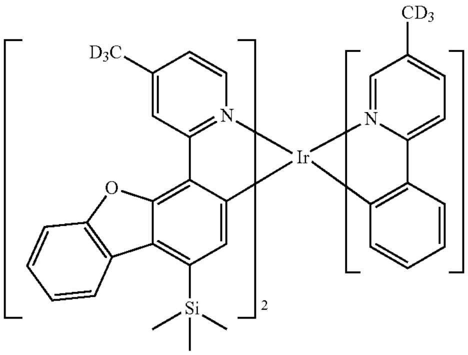
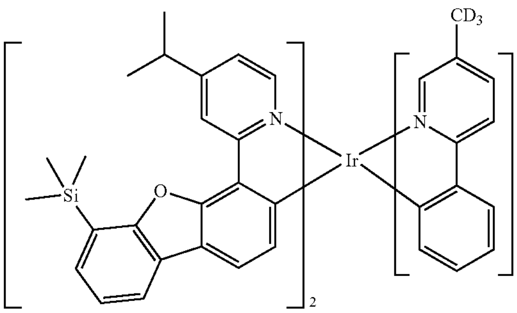
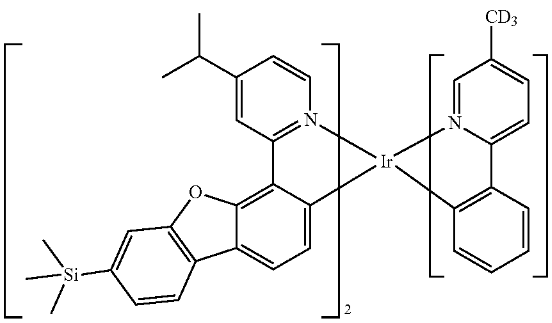
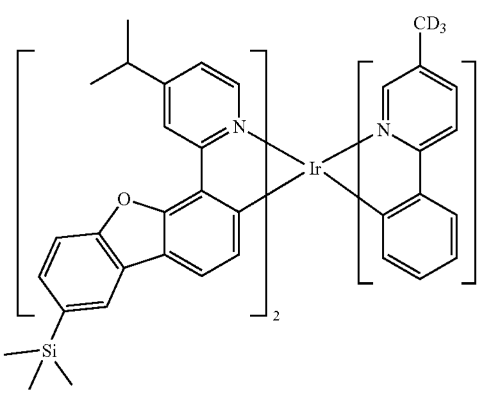
-continued
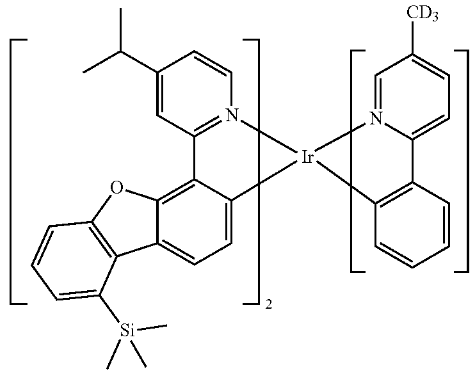
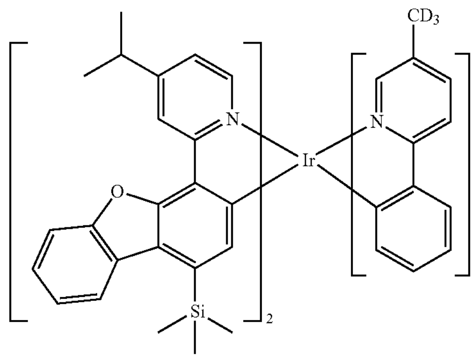
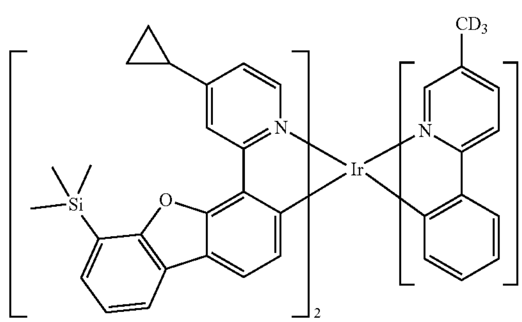
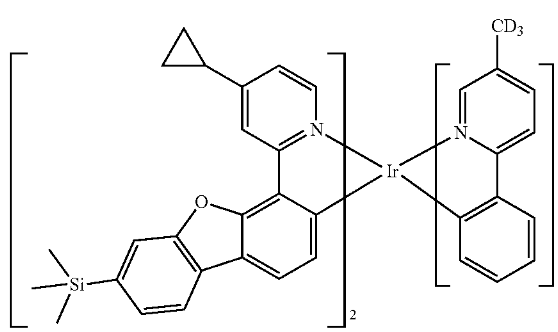

-continued
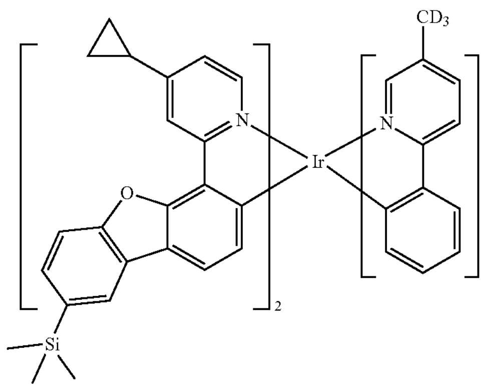
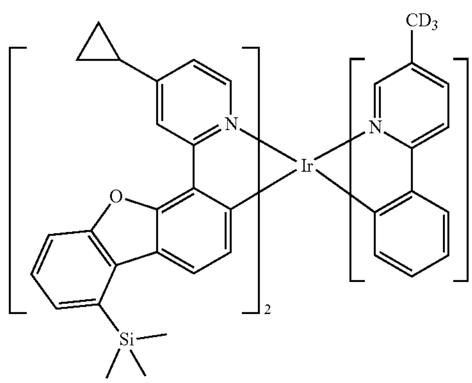
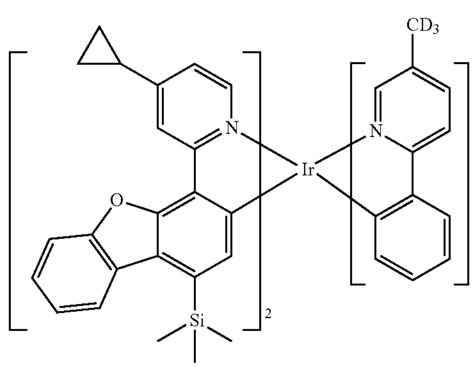
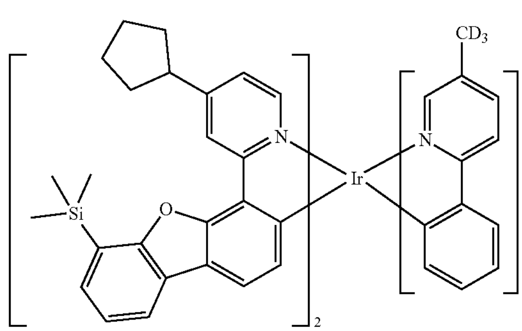
-continued
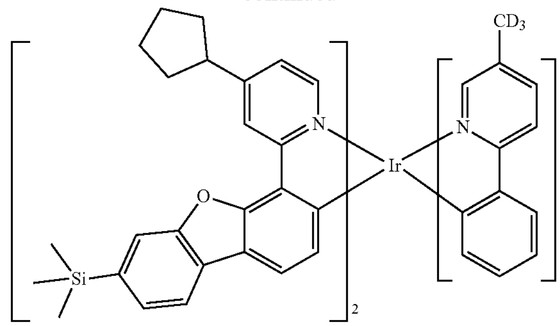
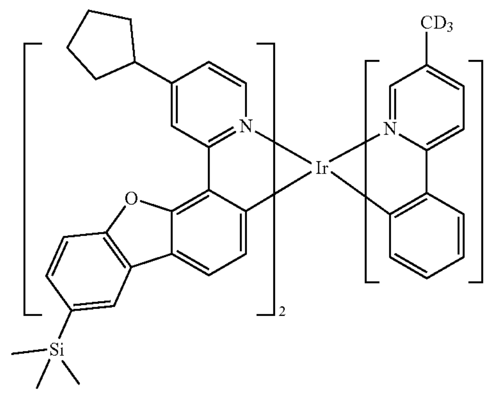
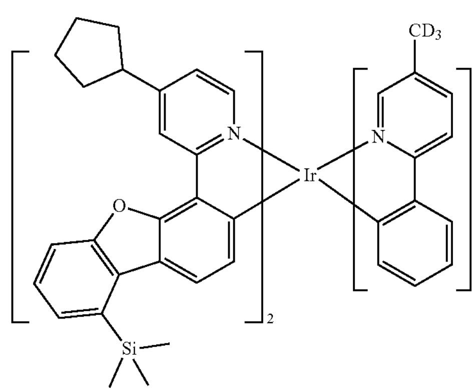
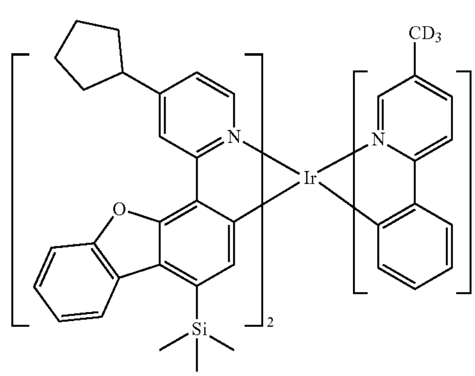

-continued
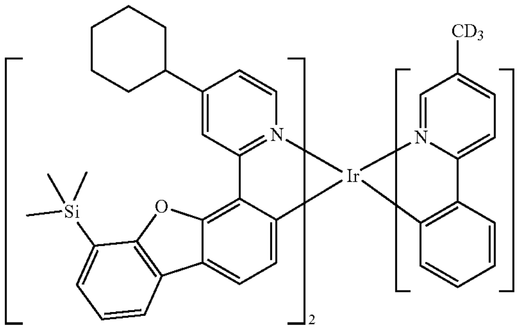
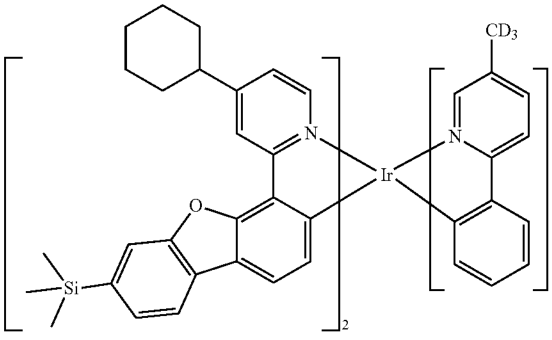
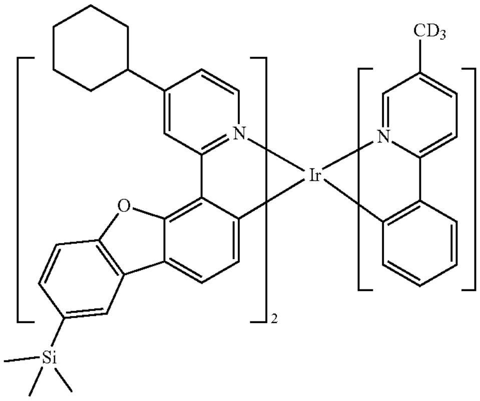
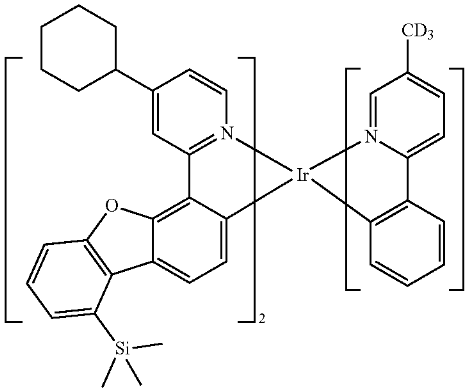
-continued
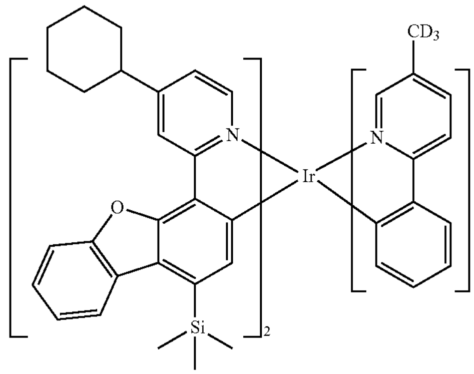
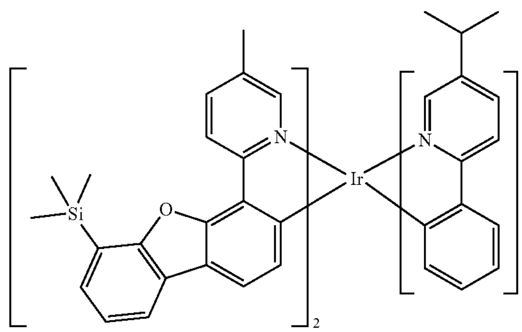
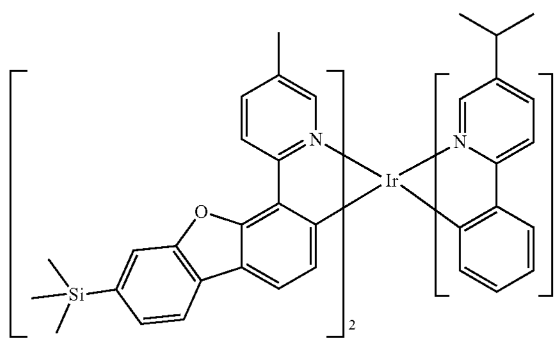
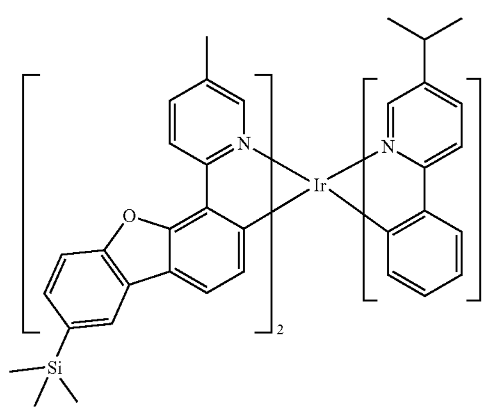

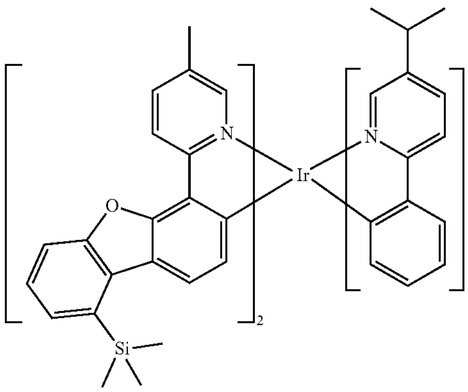
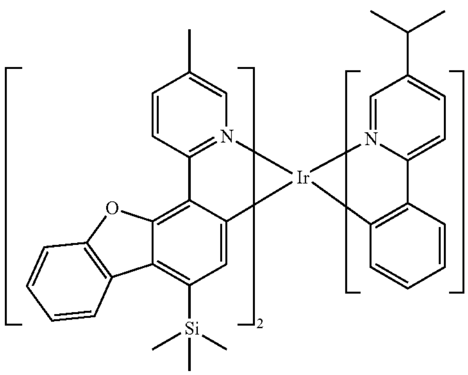
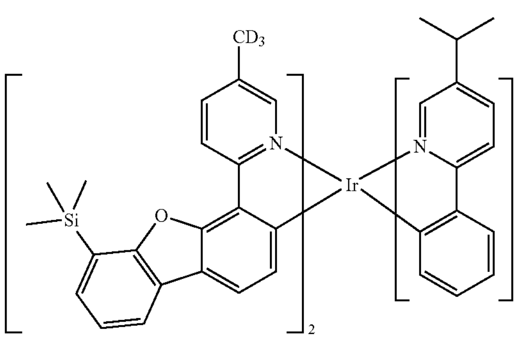
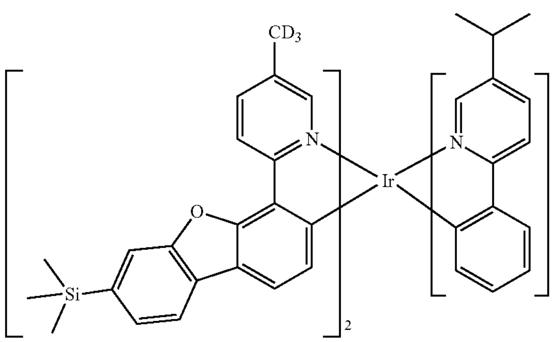
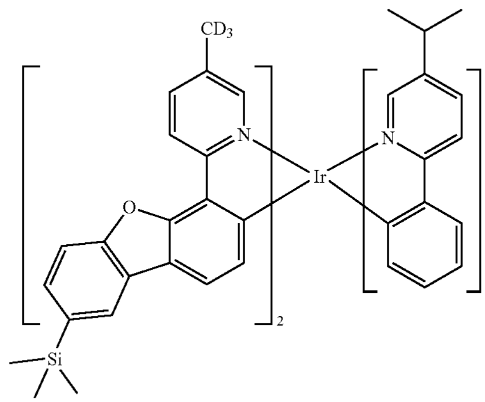
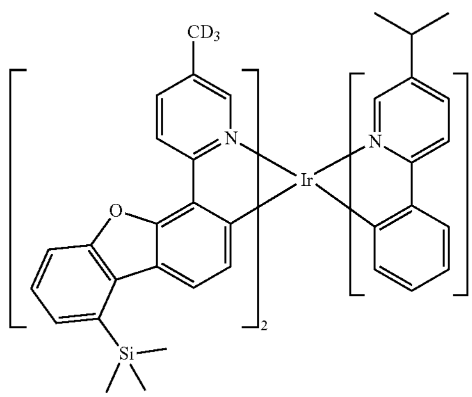
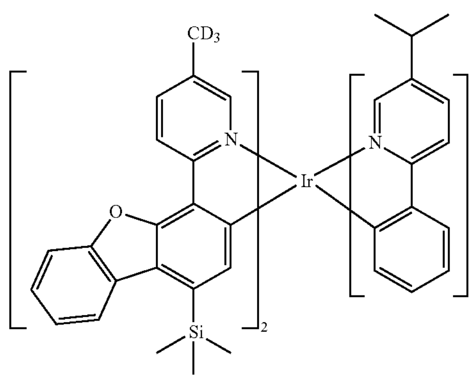
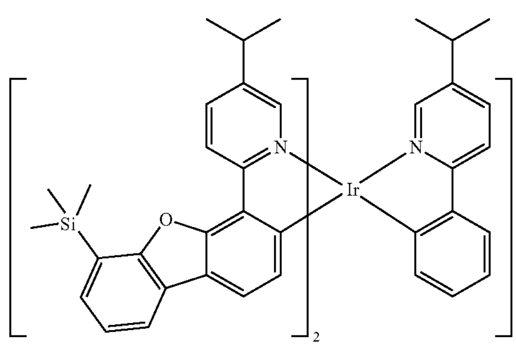

-continued
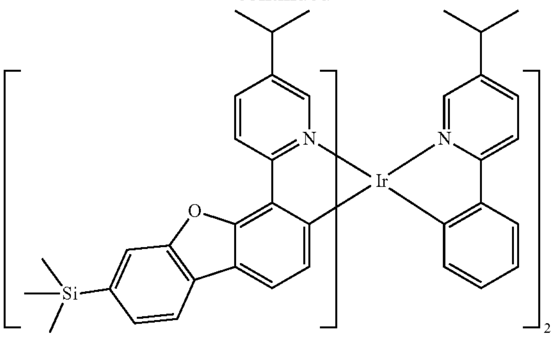
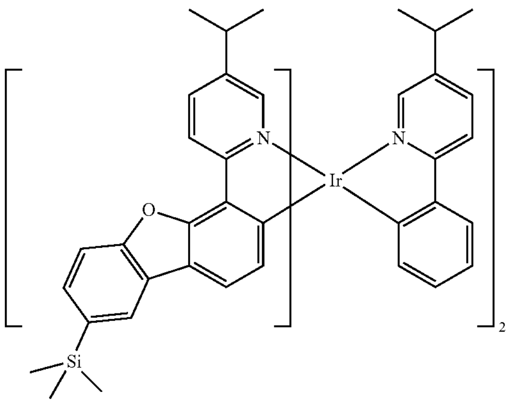
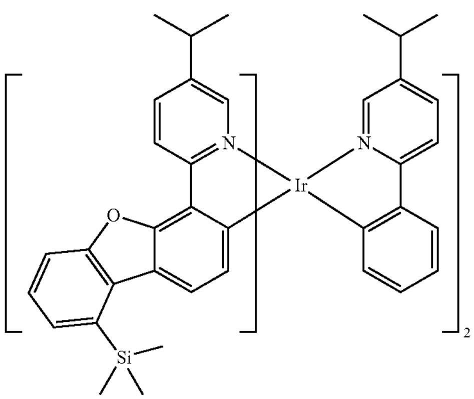
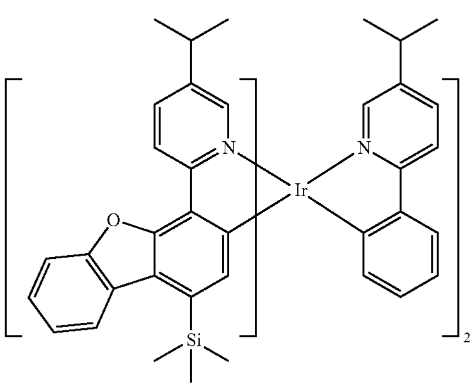
-continued
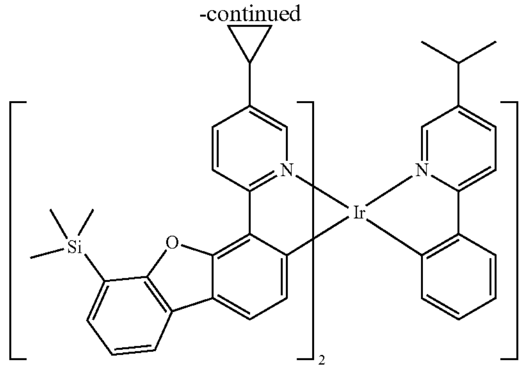
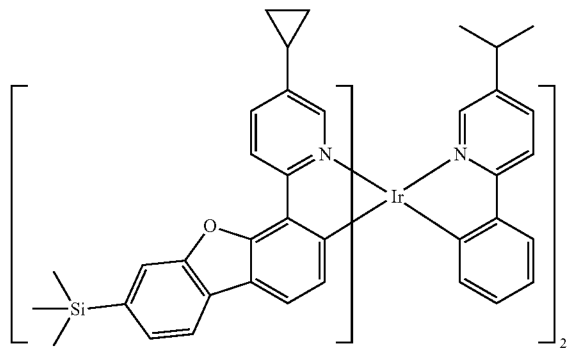
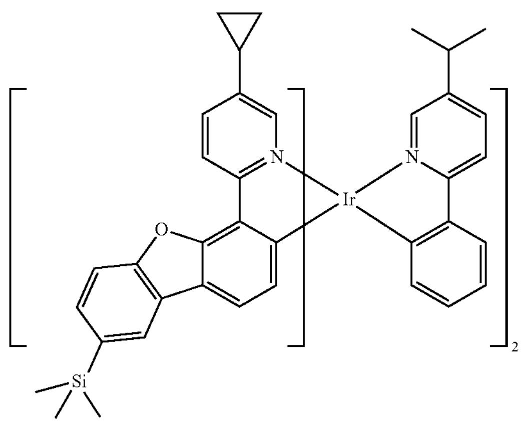
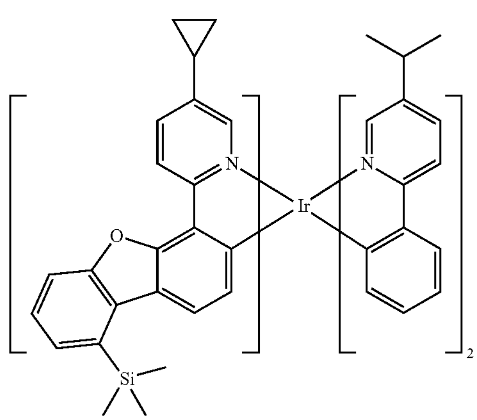

-continued
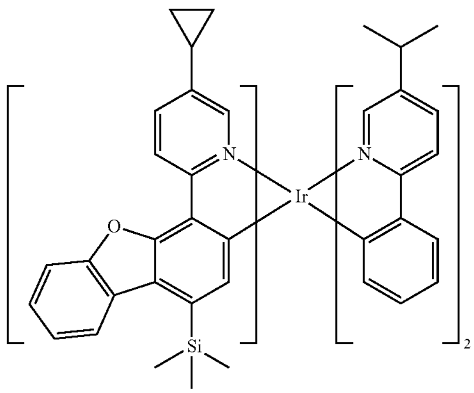
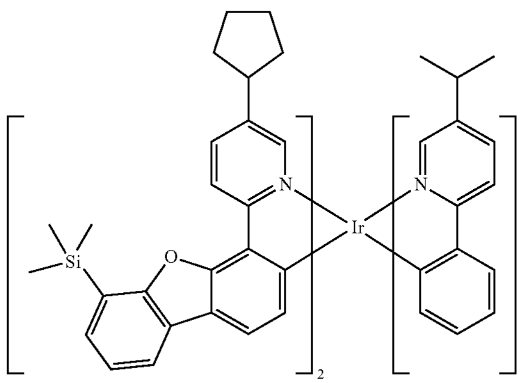
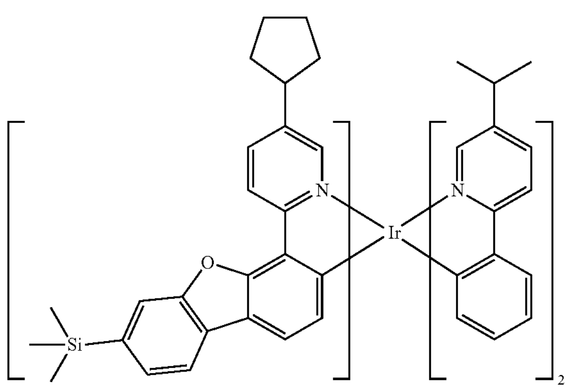
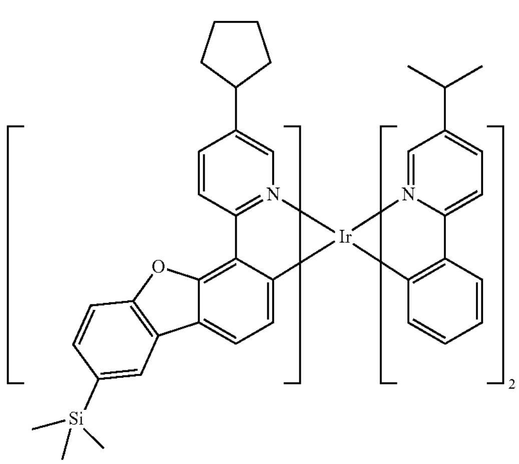
-continued
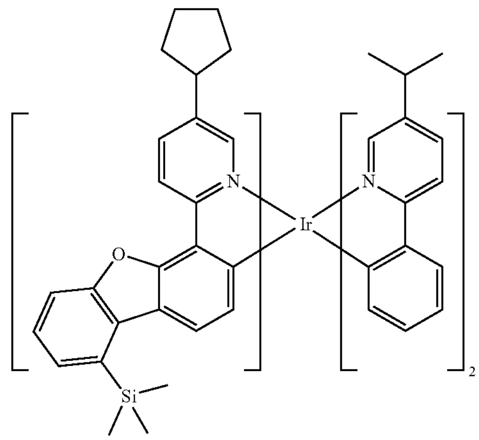
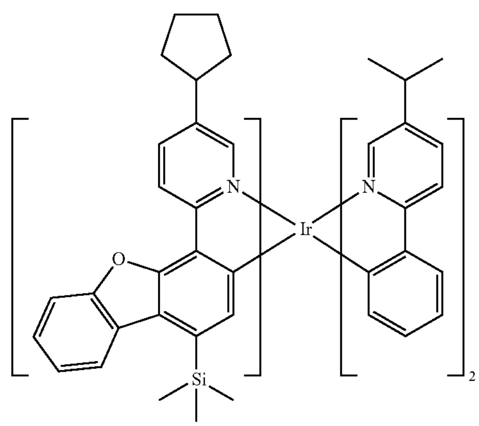
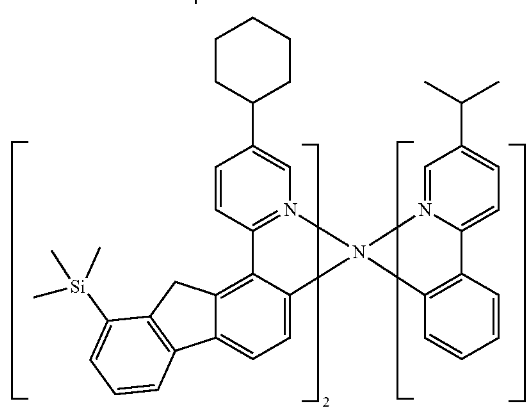
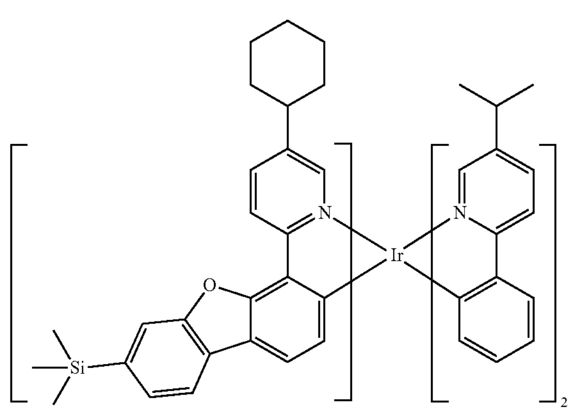

-continued
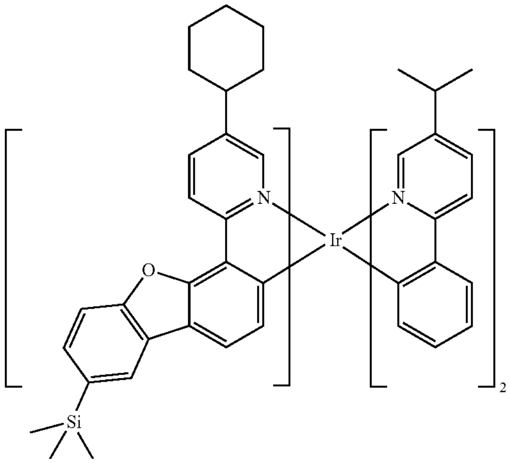
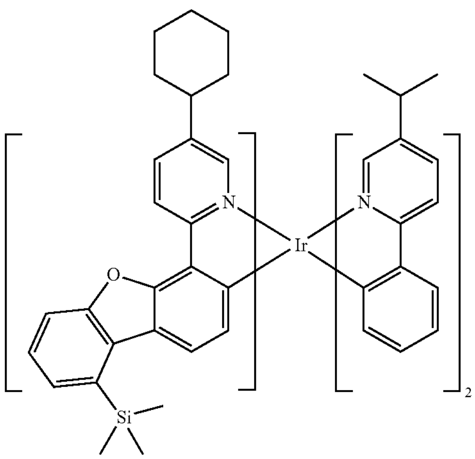
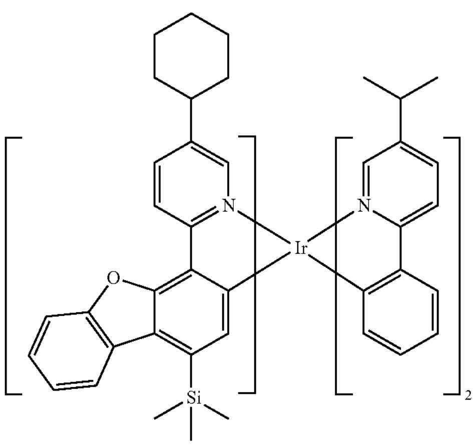
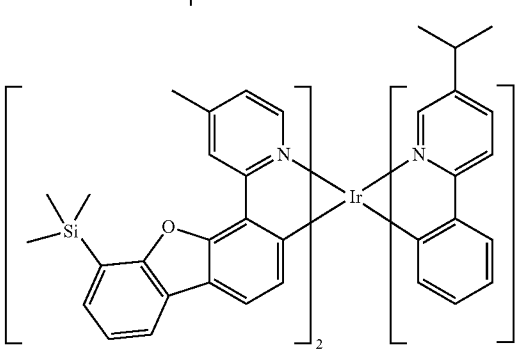
-continued
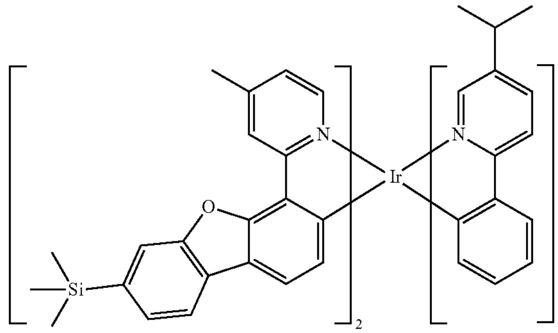
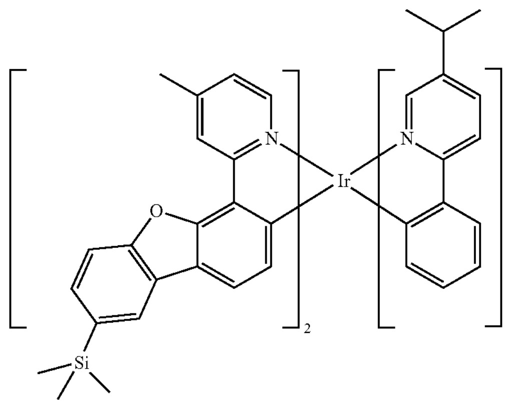
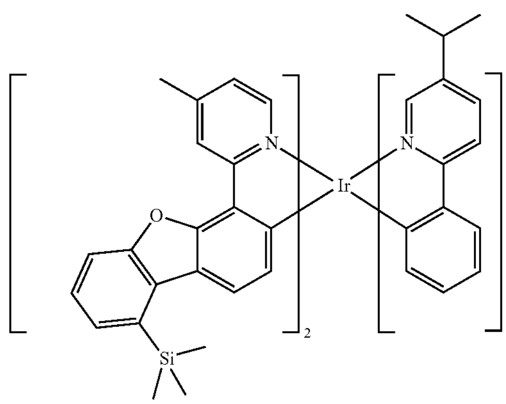
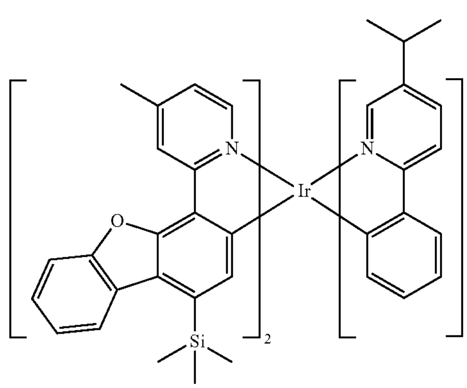

-continued
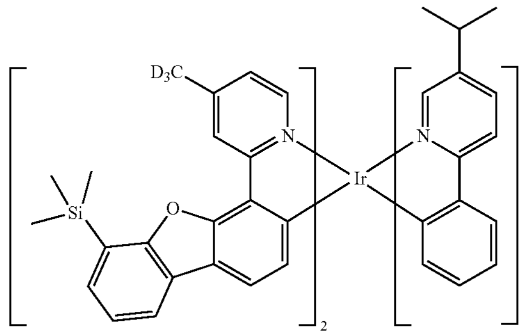
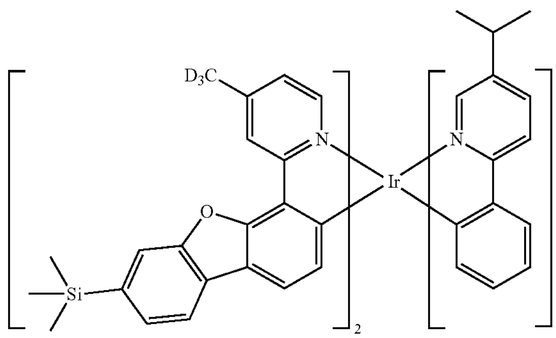
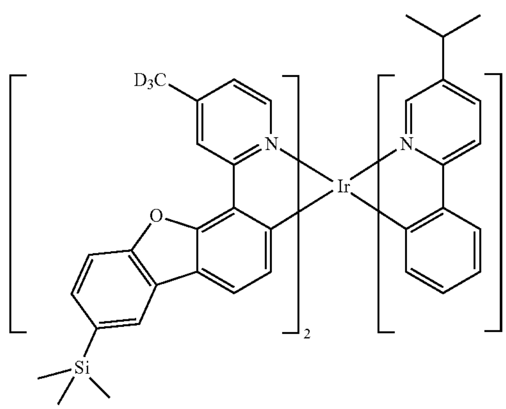
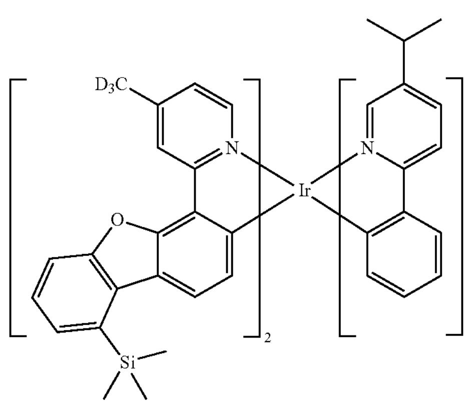
-continued
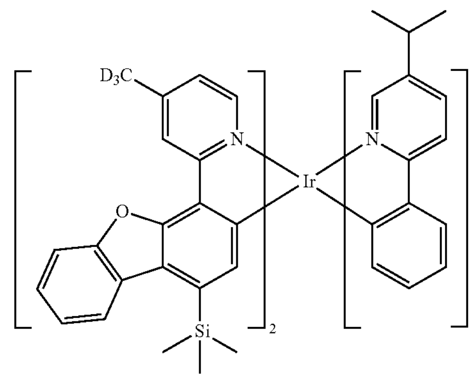
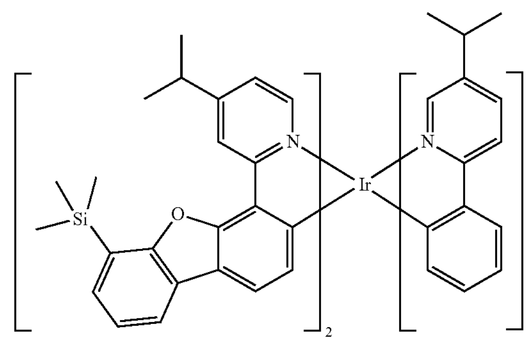
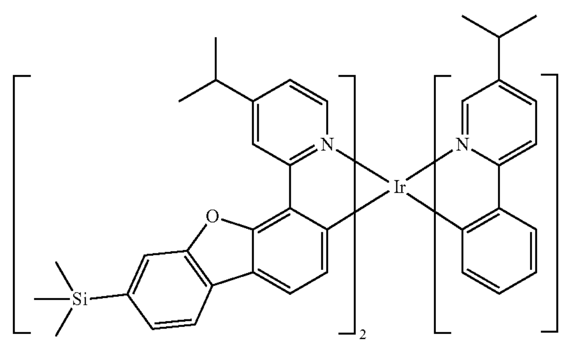
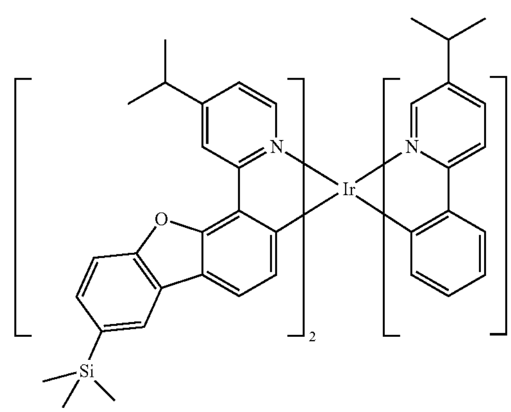

-continued
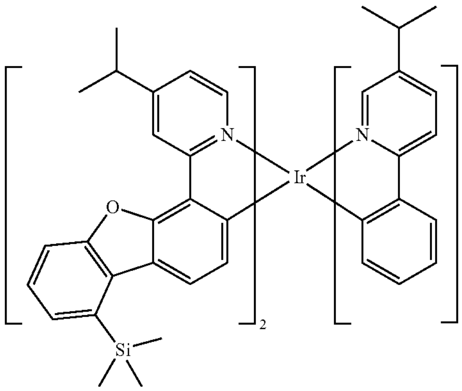
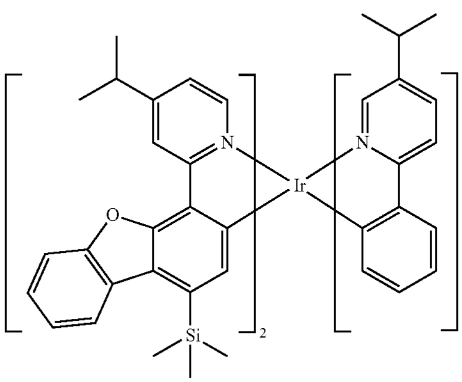
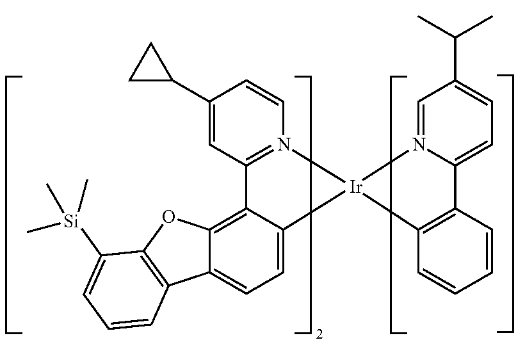
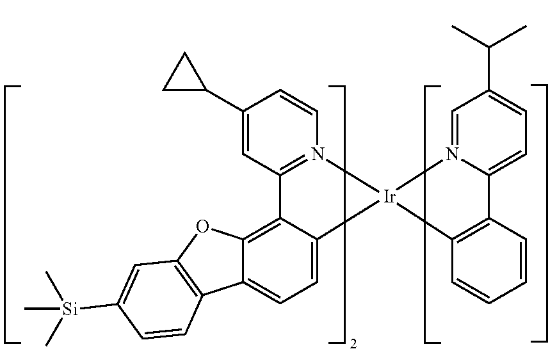
-continued
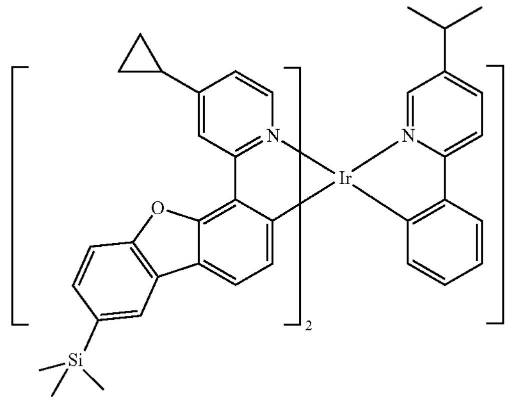
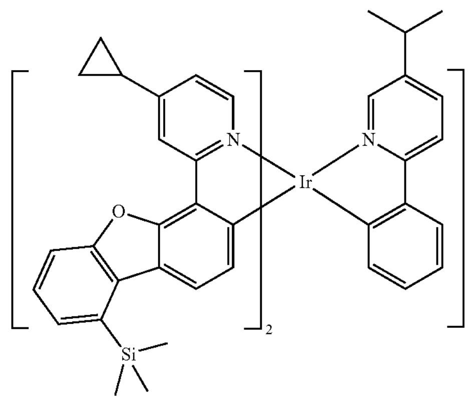
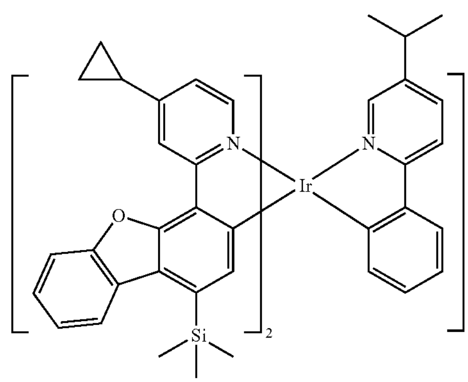
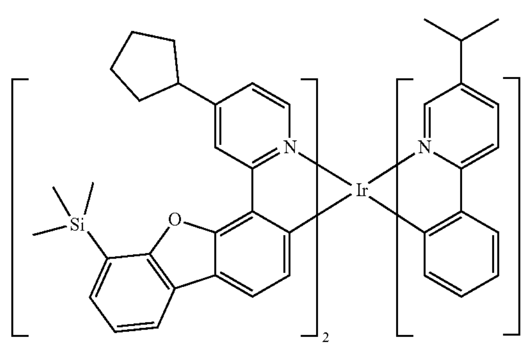

-continued
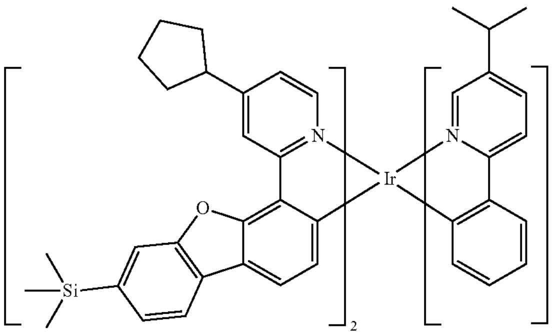
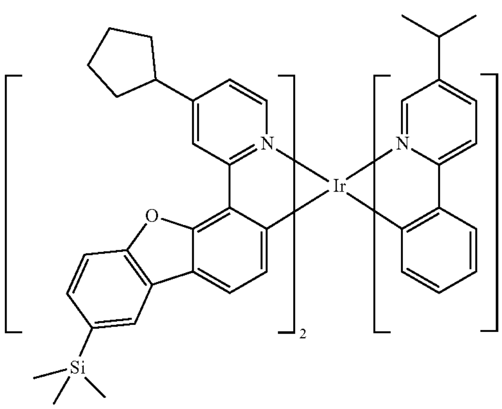
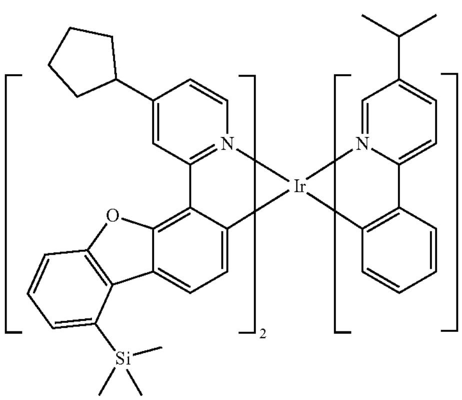
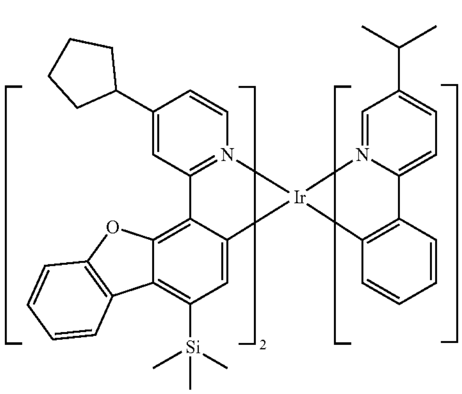
-continued
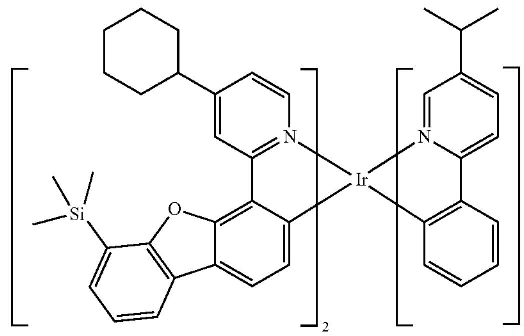
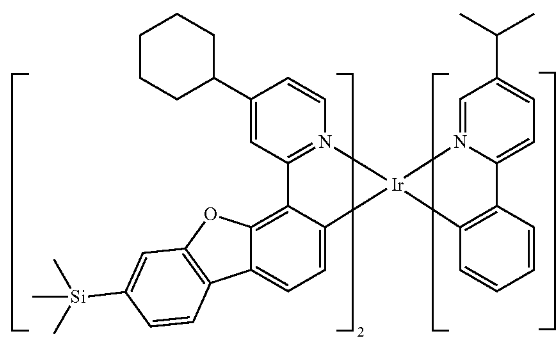
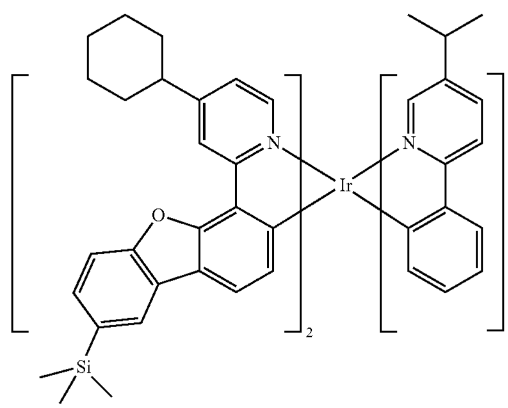
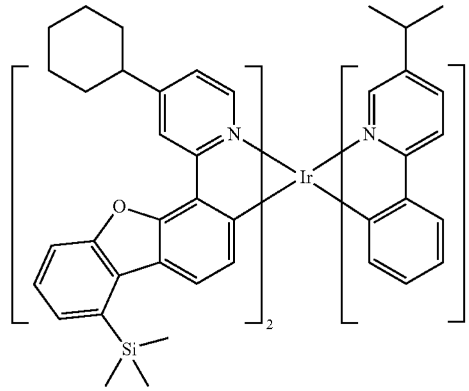

-continued
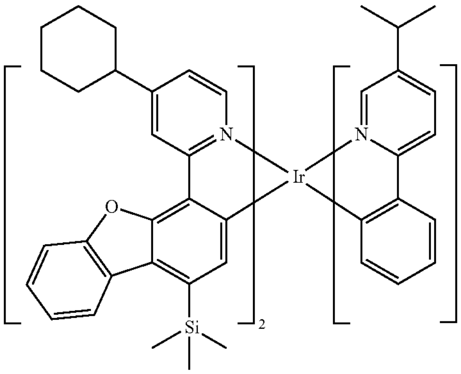
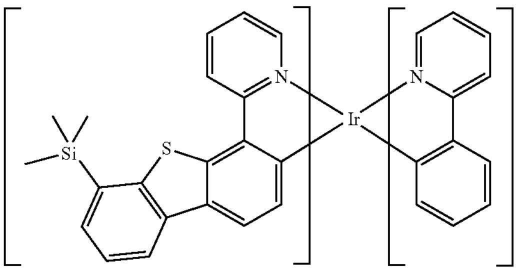
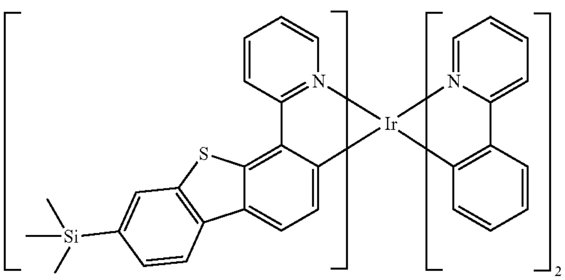
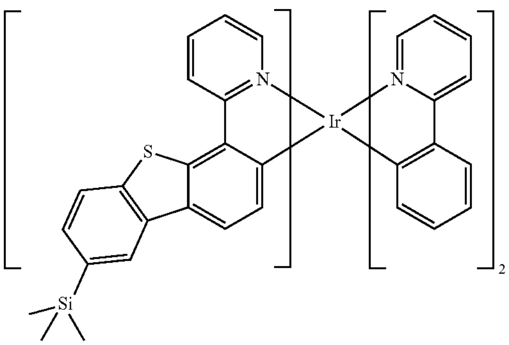
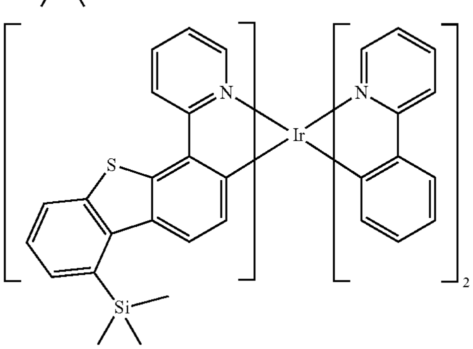
-continued
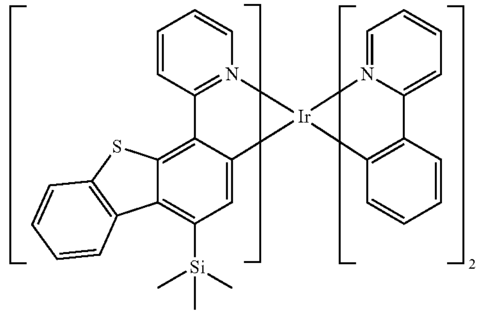
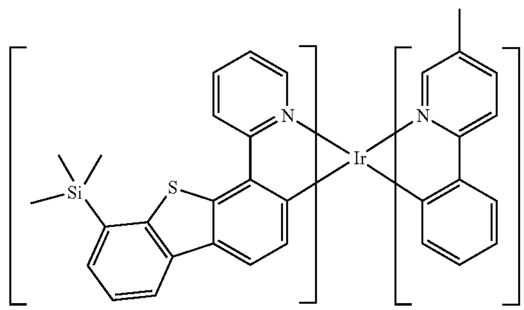
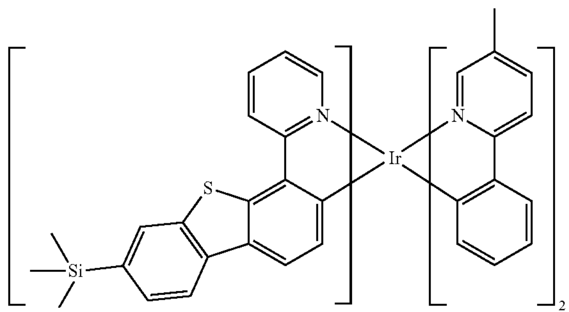
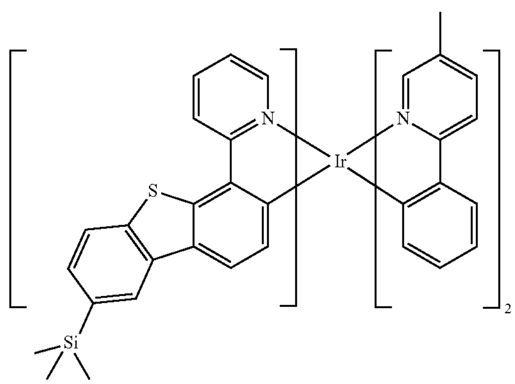
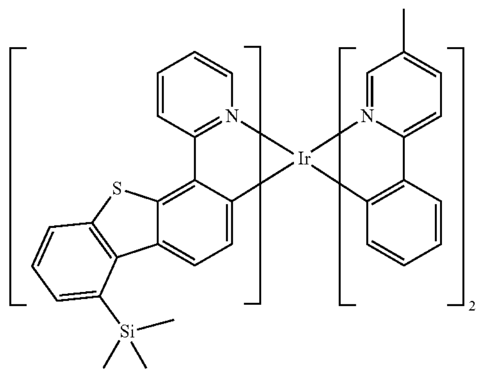

-continued
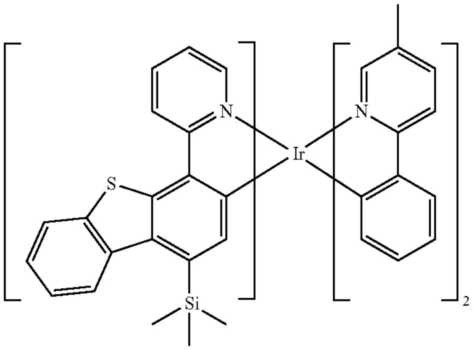
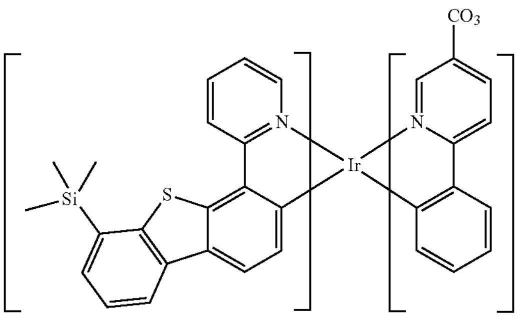
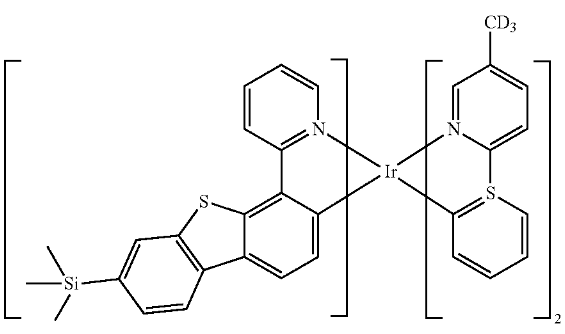
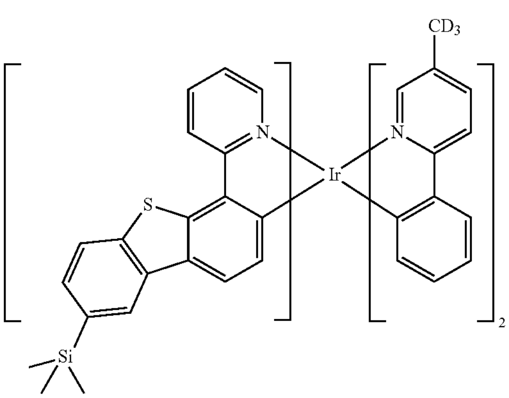
-continued
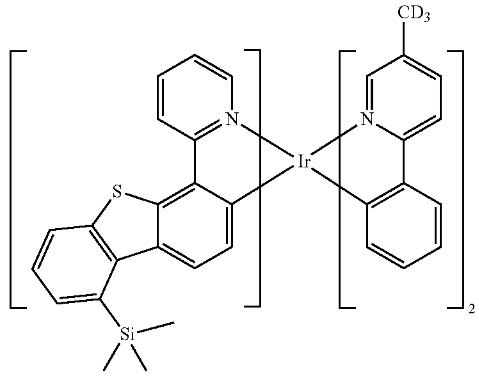
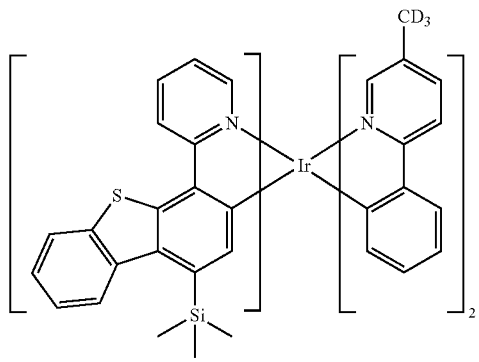
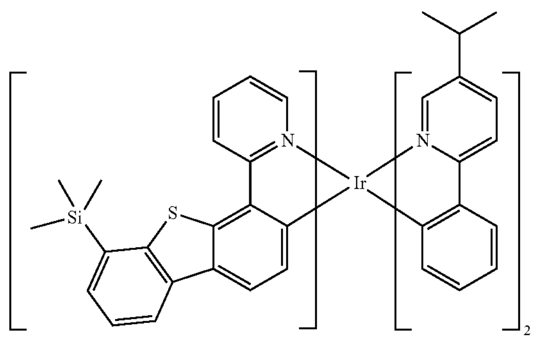
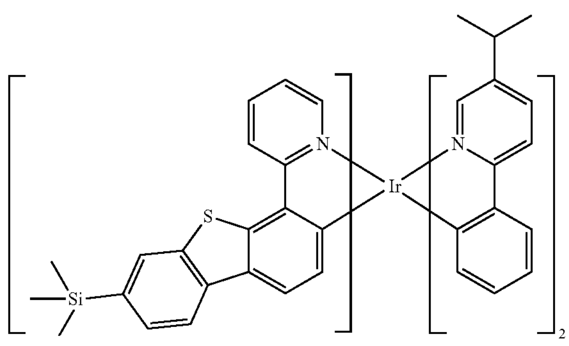

-continued
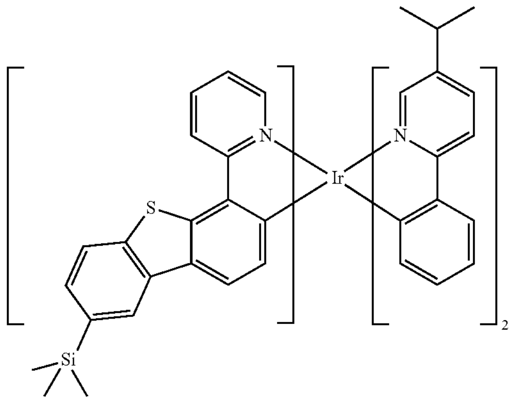
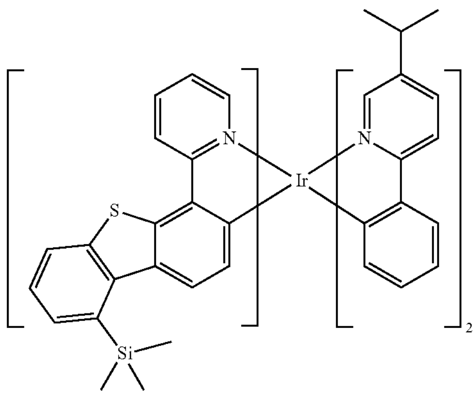
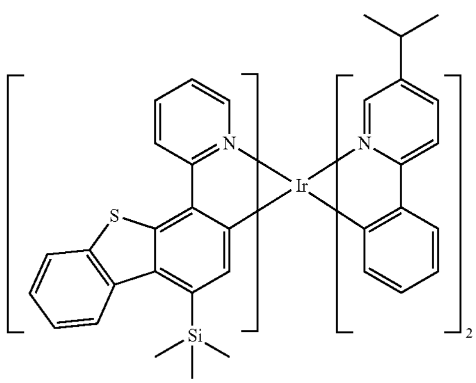
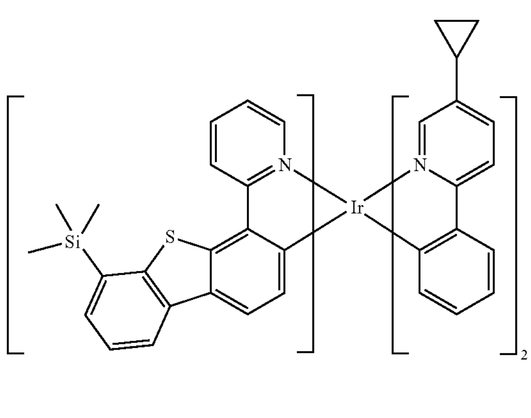
-continued
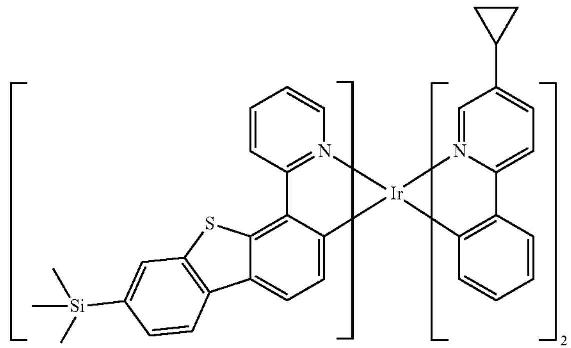
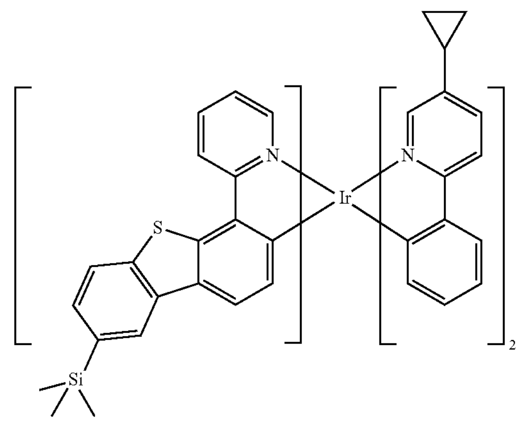
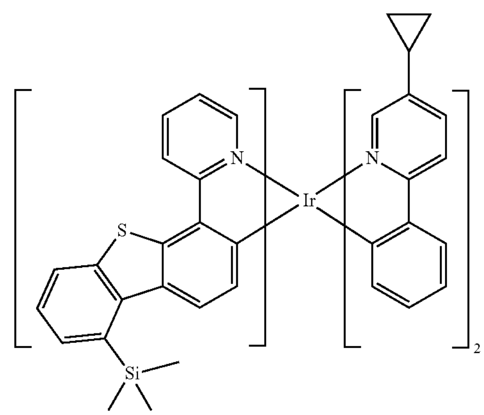
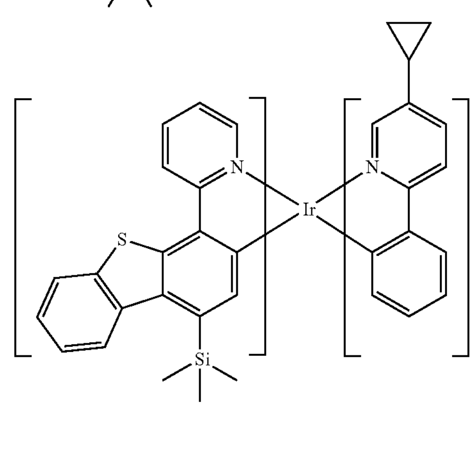

-continued
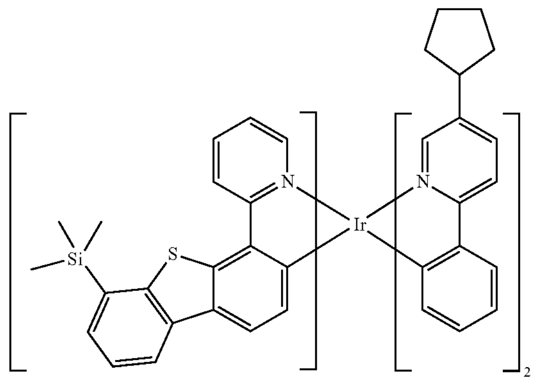
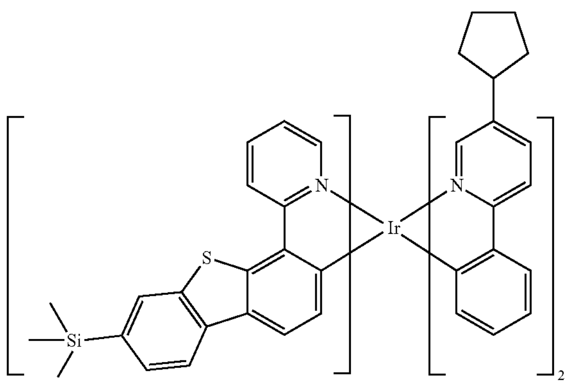
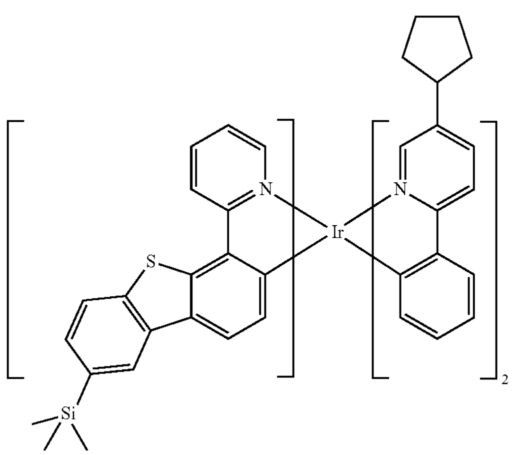
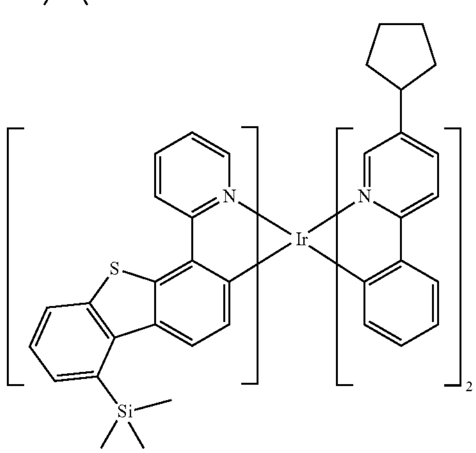
-continued
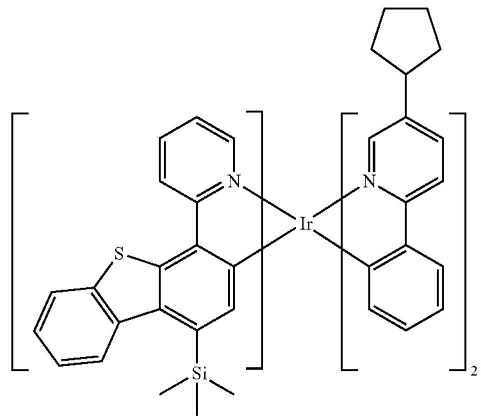
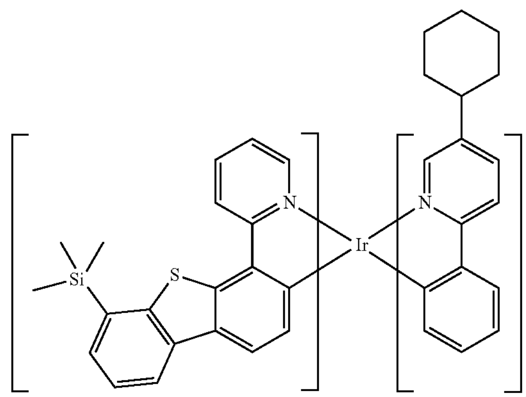
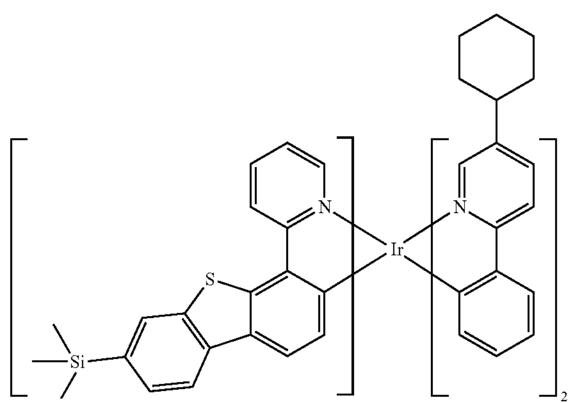
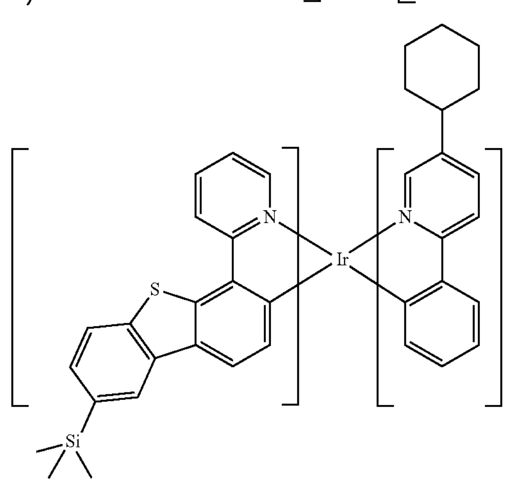

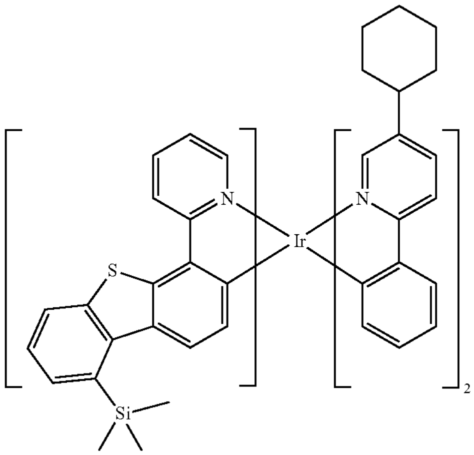
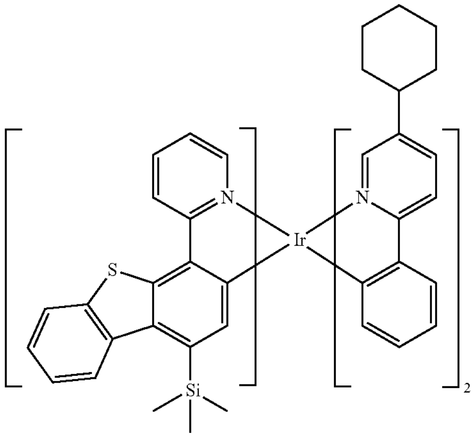
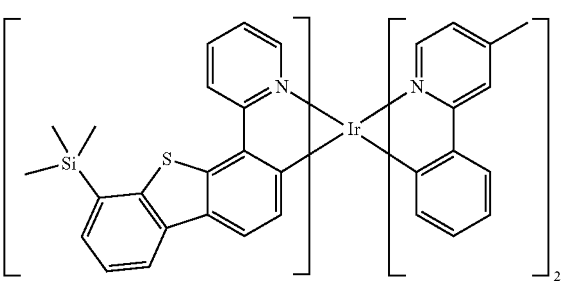
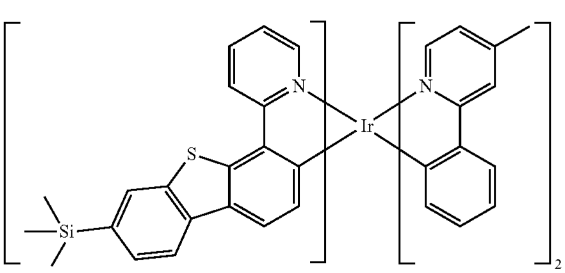
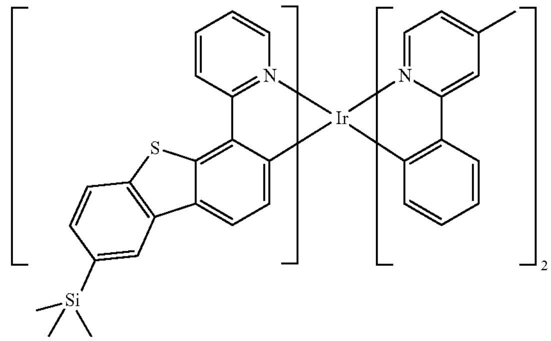
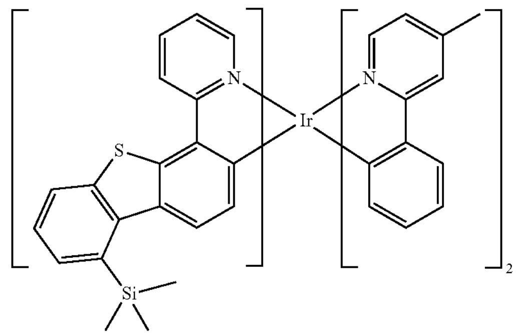
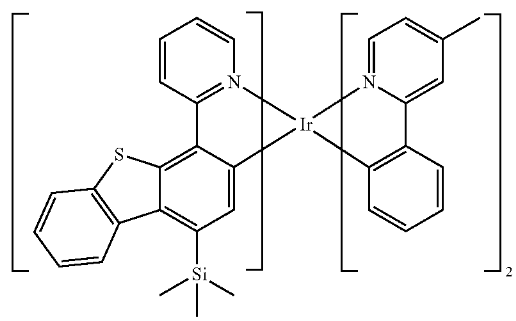
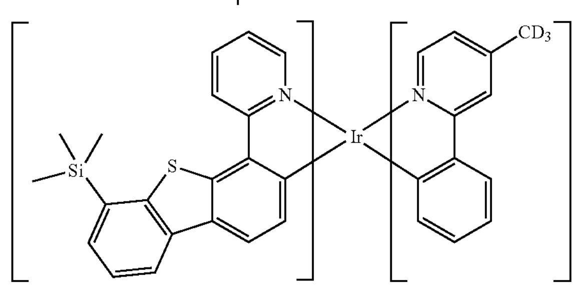
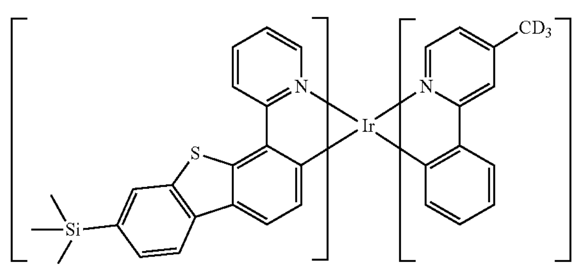

-continued
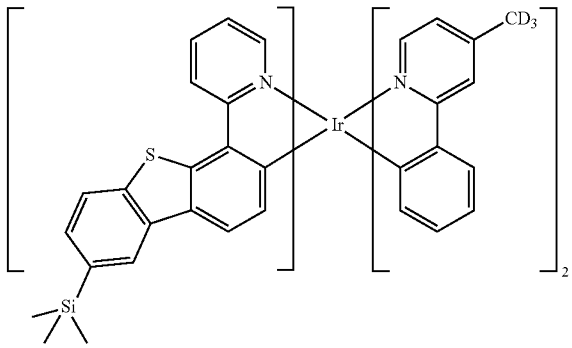
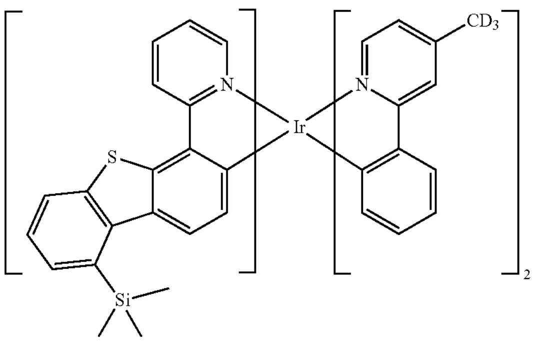
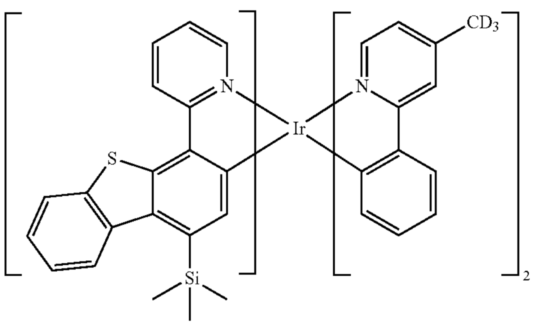
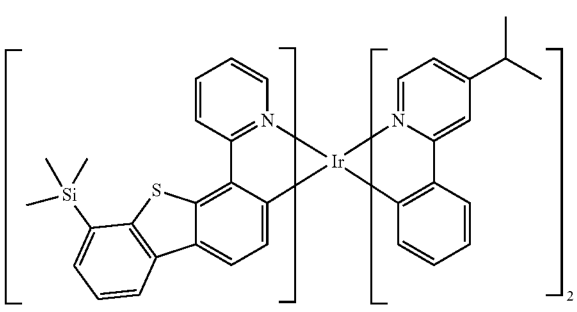
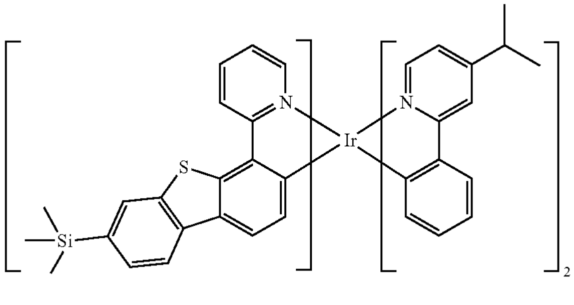
-continued
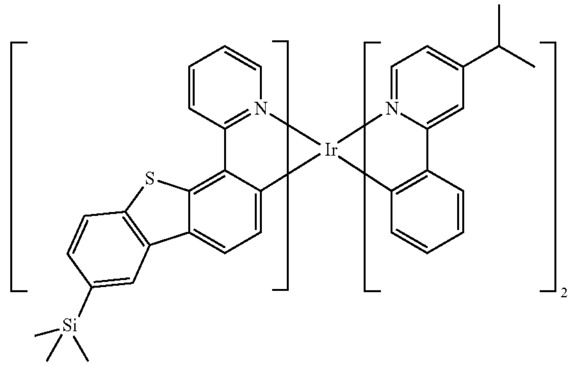
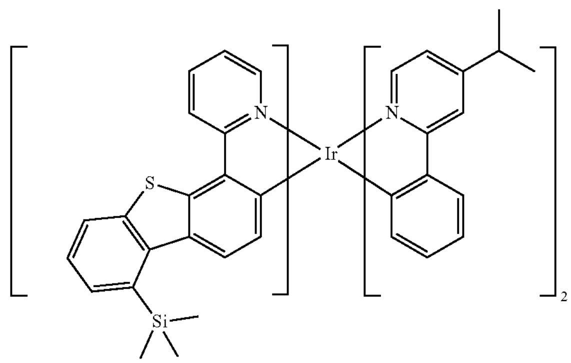
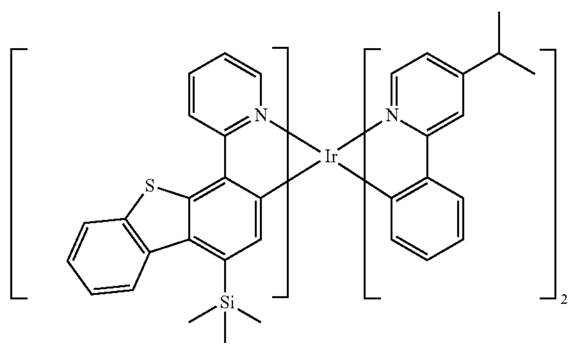
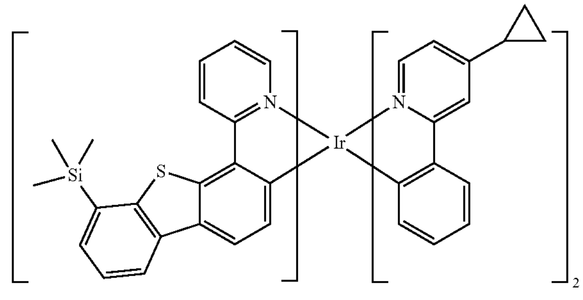
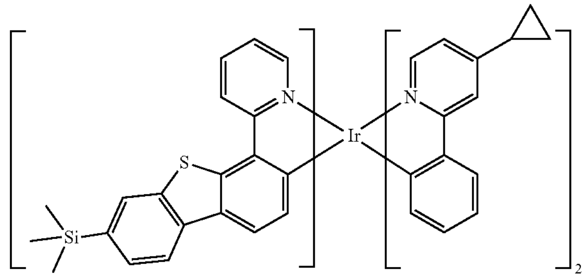

-continued
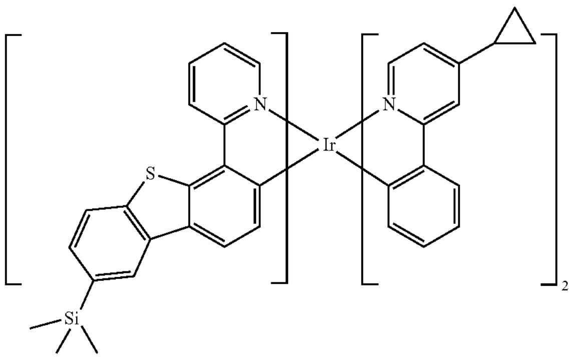
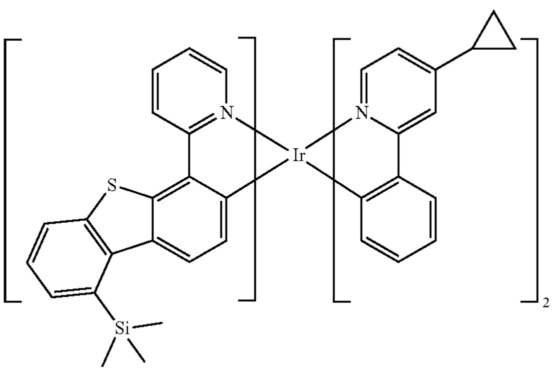
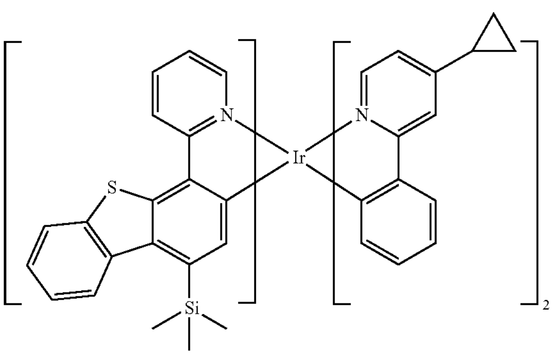
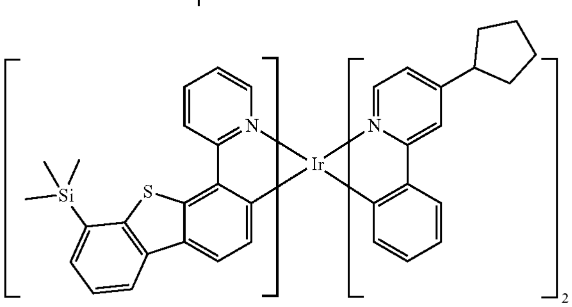
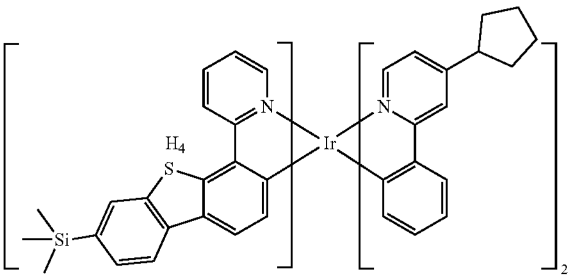
-continued
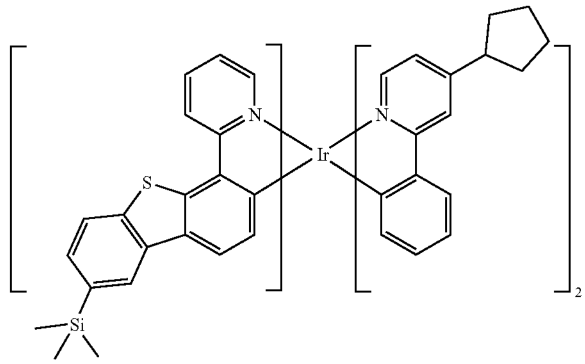
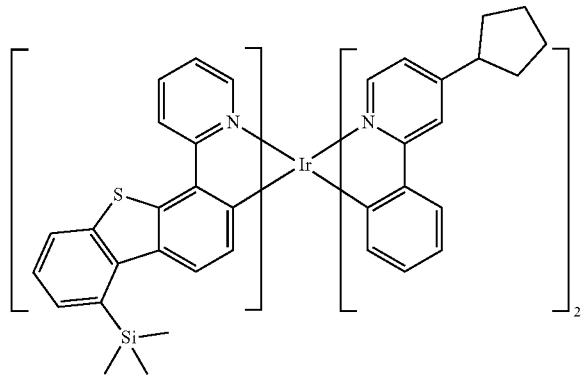
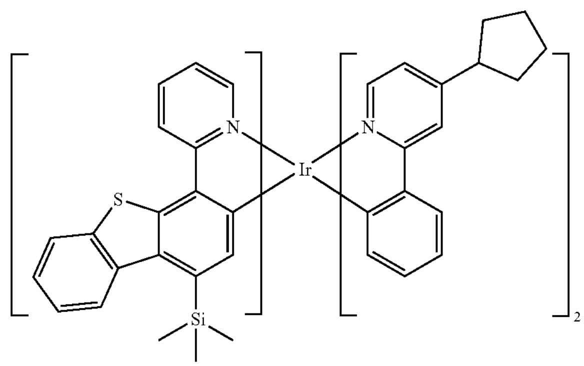
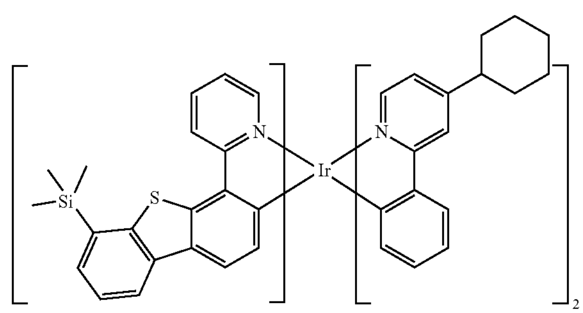
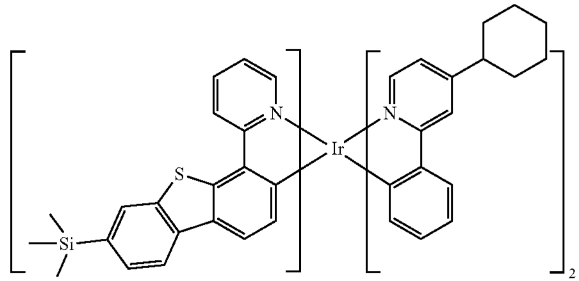

-continued
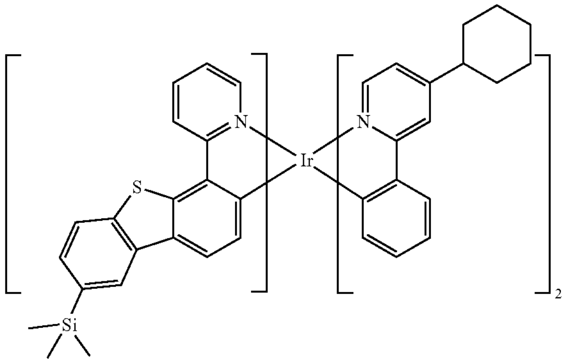
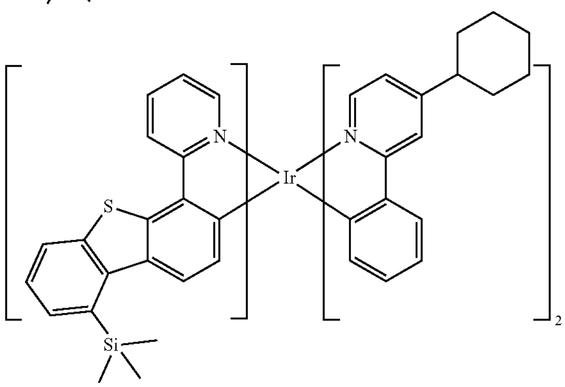
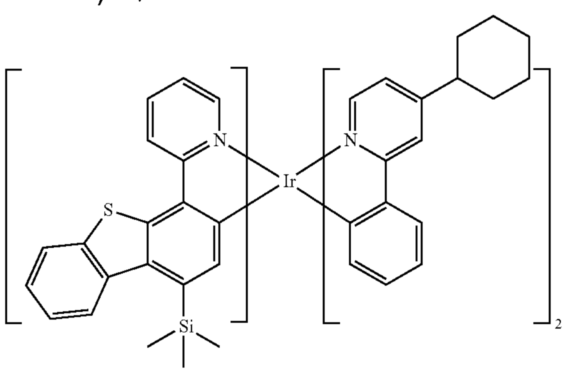
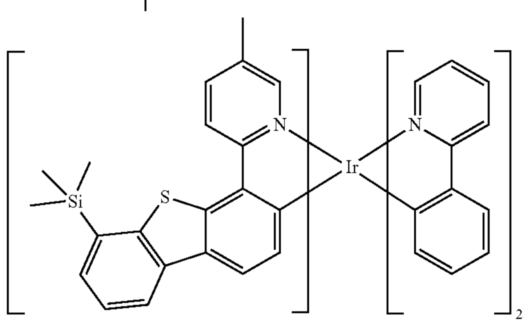
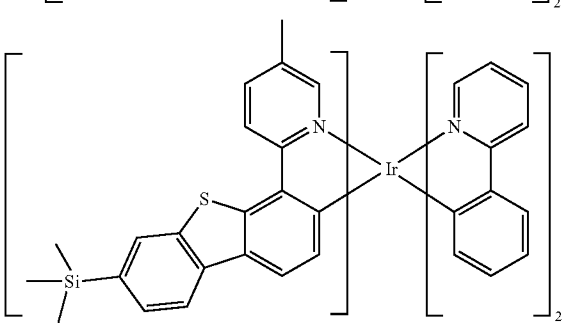
-continued
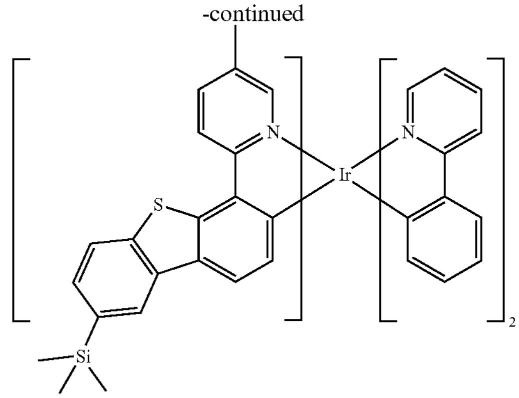
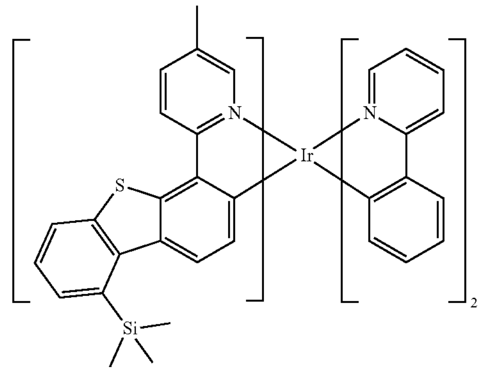
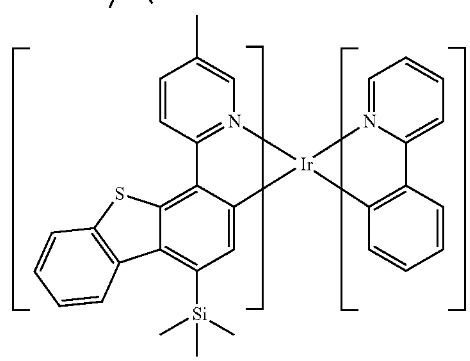
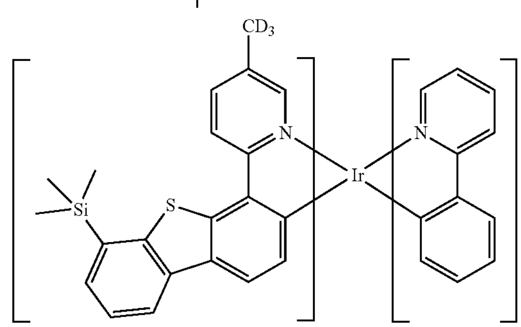
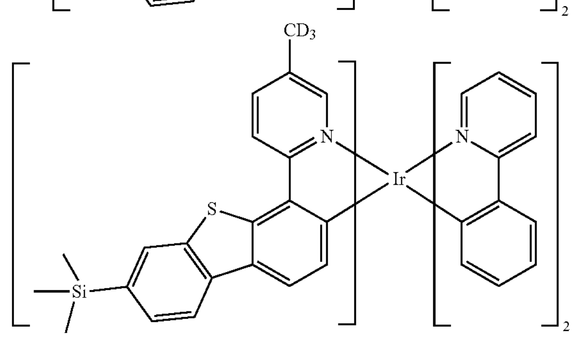

-continued
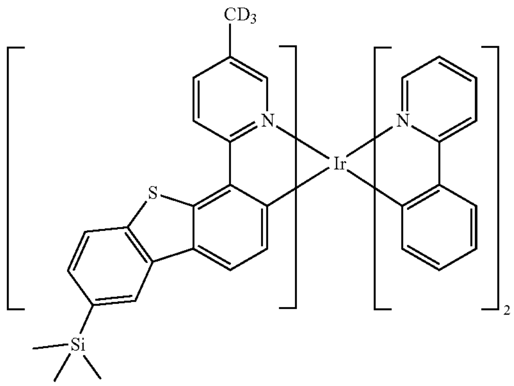
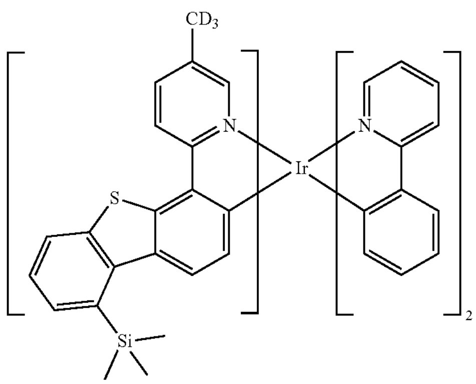
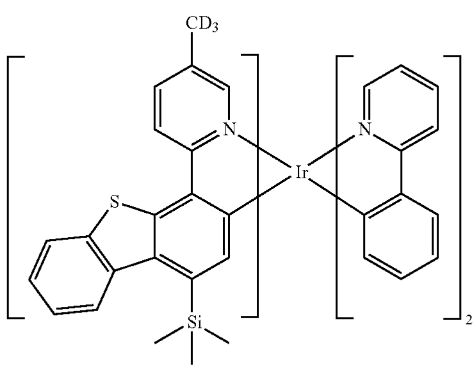
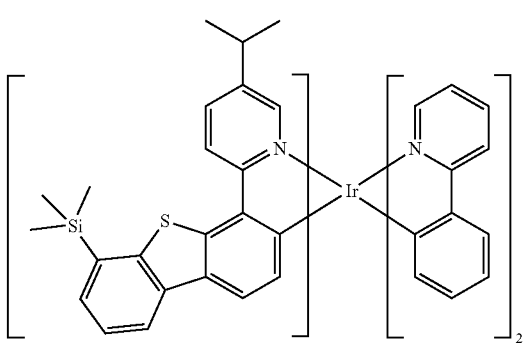
-continued
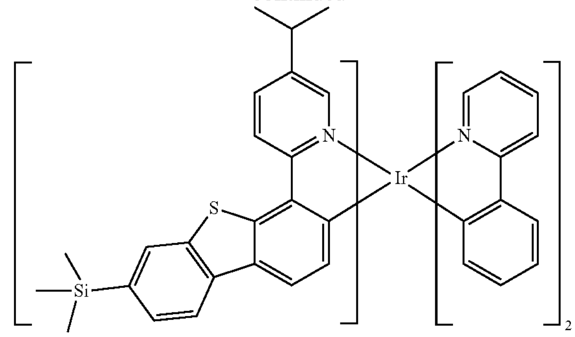
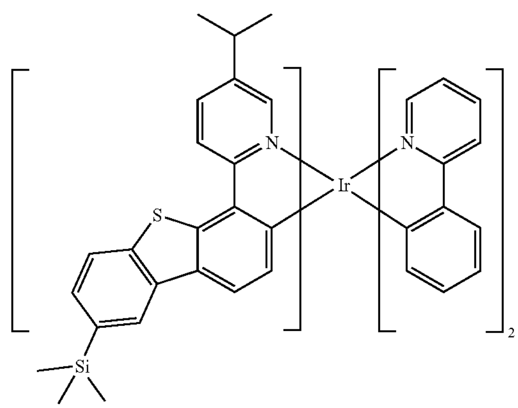
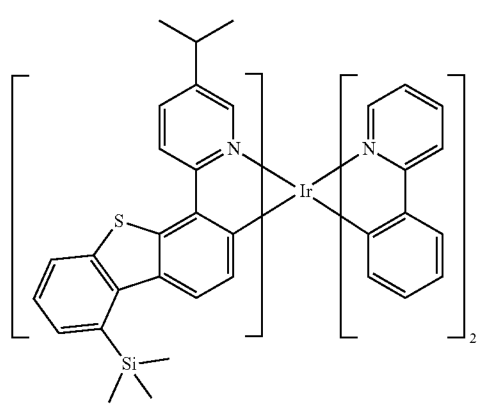
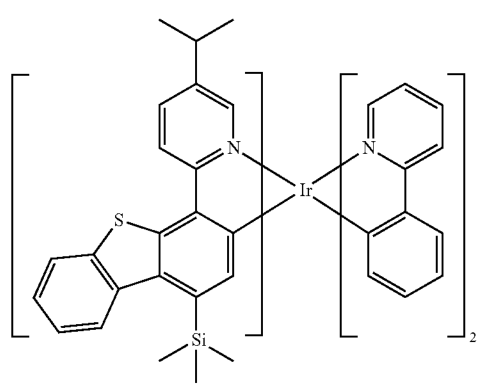

-continued
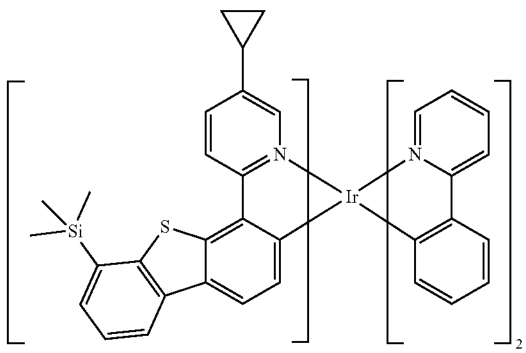
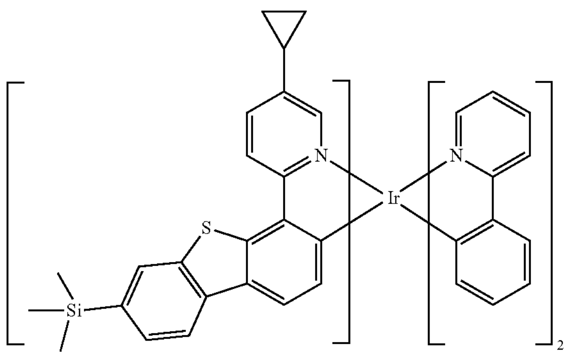
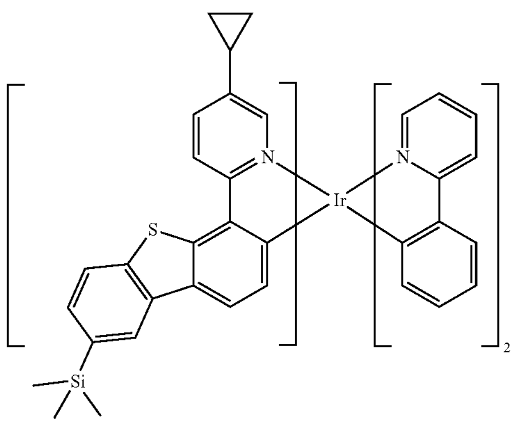
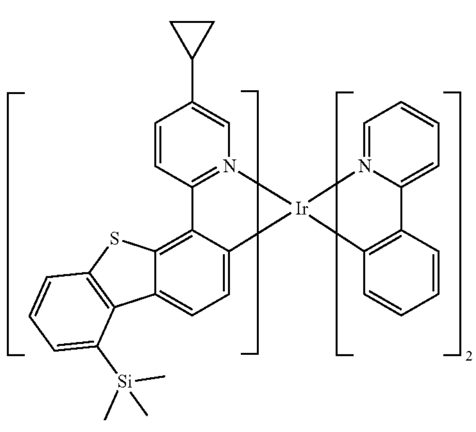
-continued
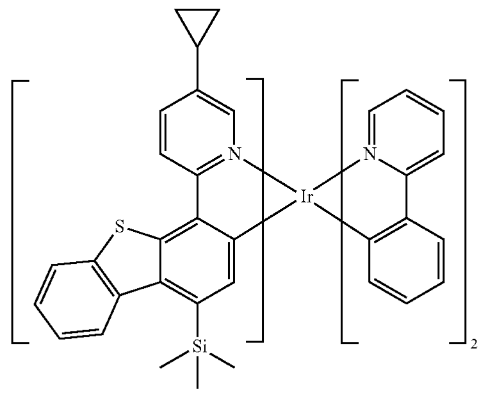
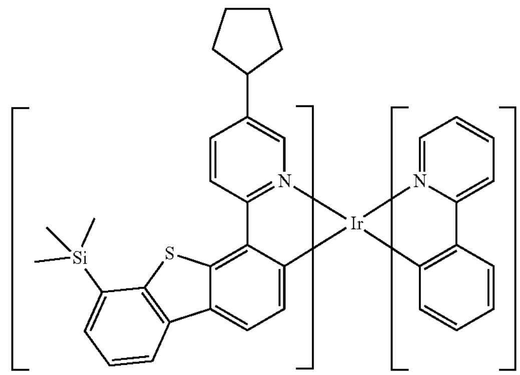
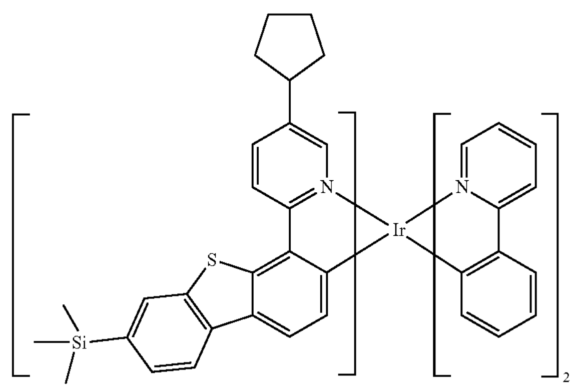
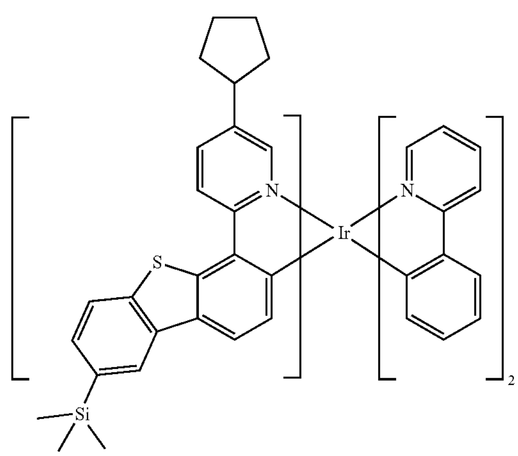

-continued
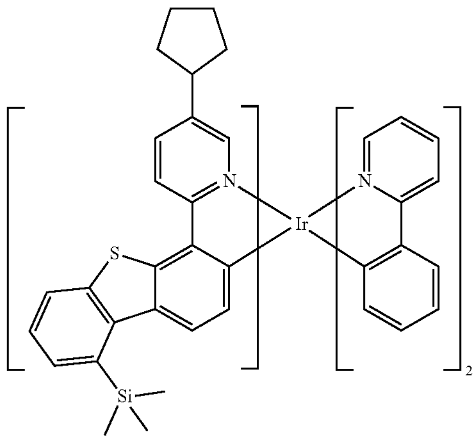
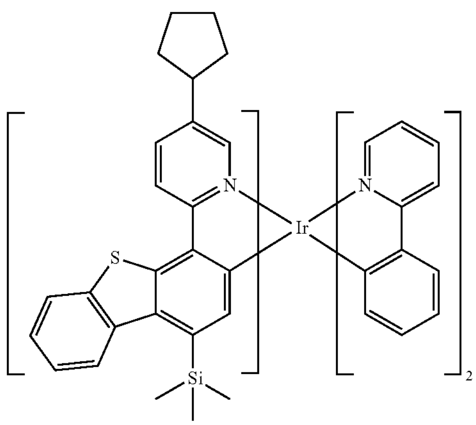
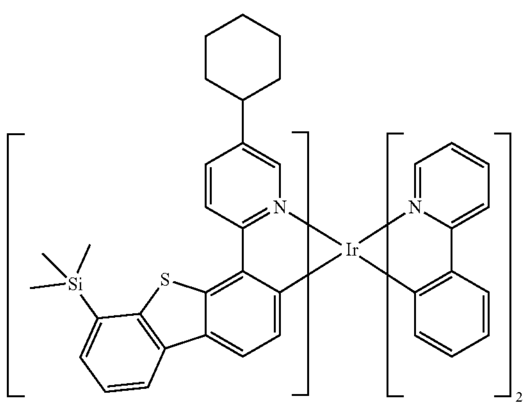
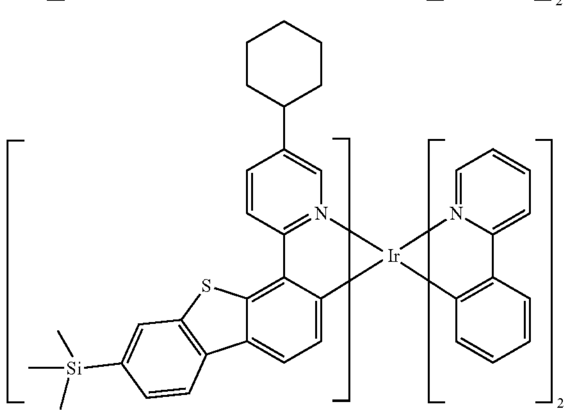
-continued
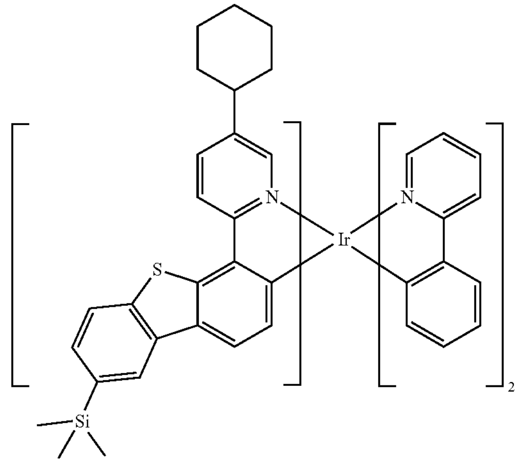
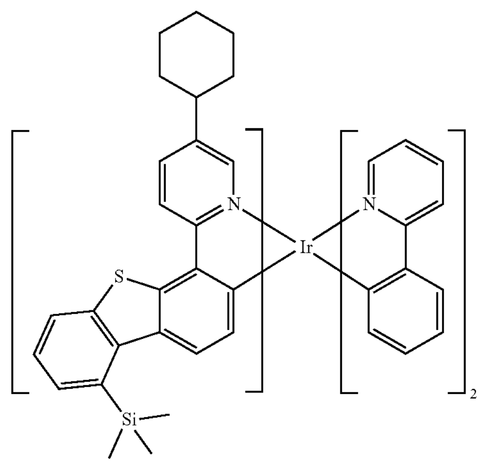
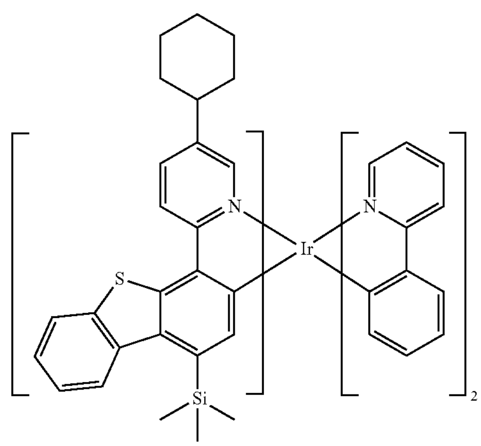
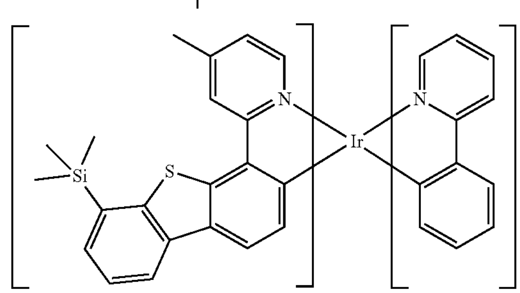

-continued
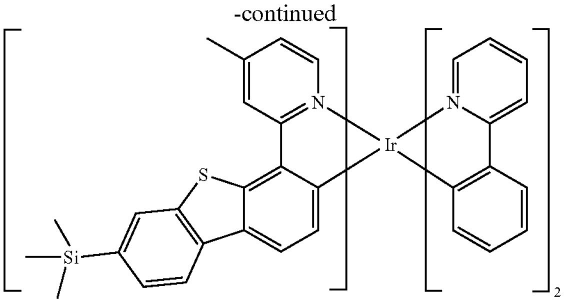
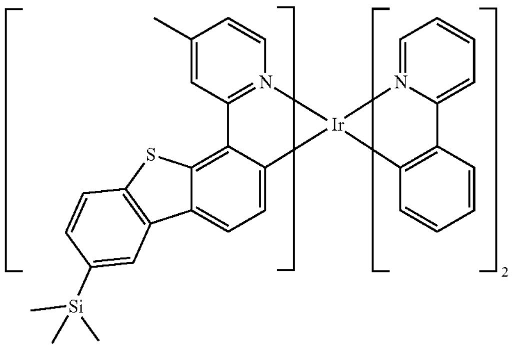
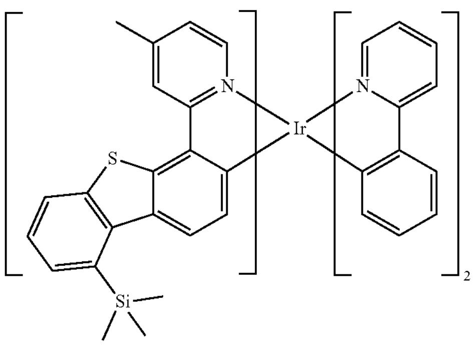
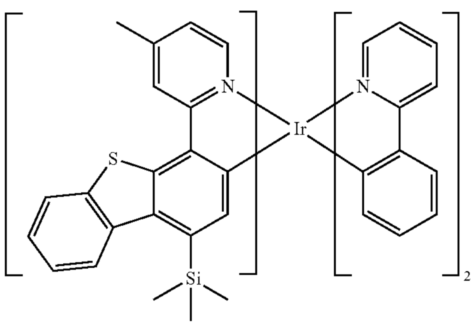
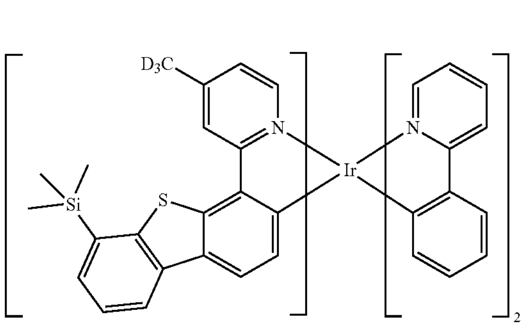
-continued
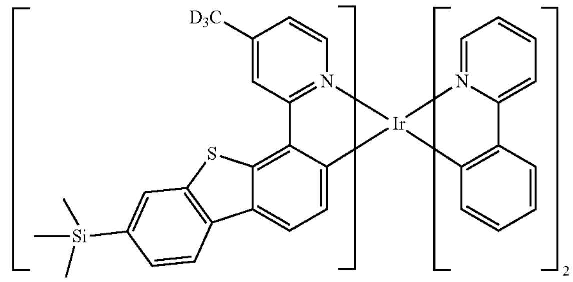
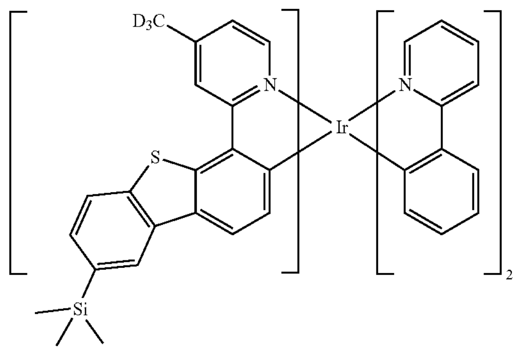
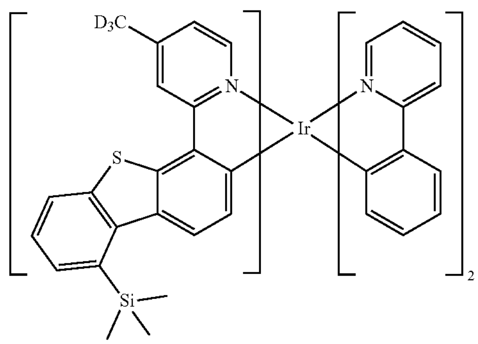
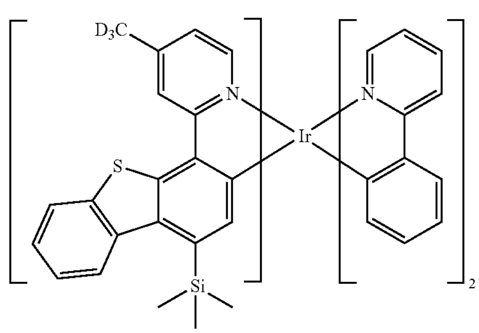
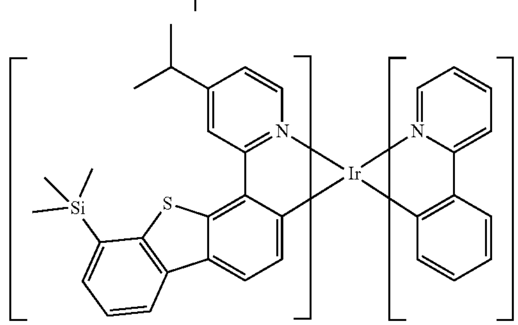

-continued
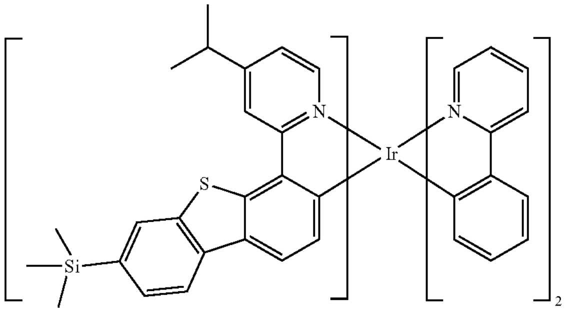
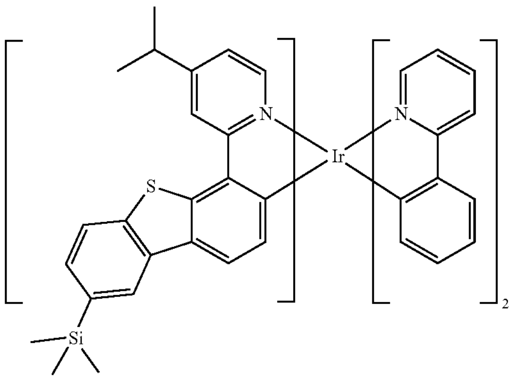
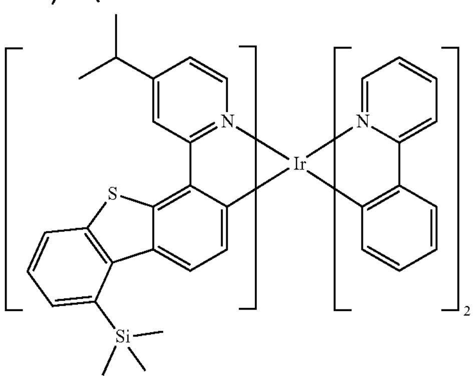
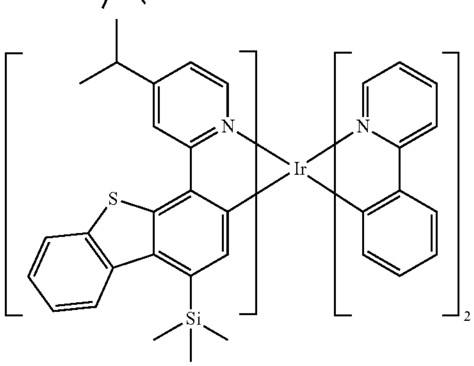
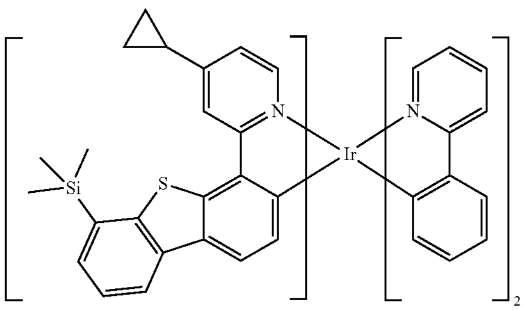
-continued
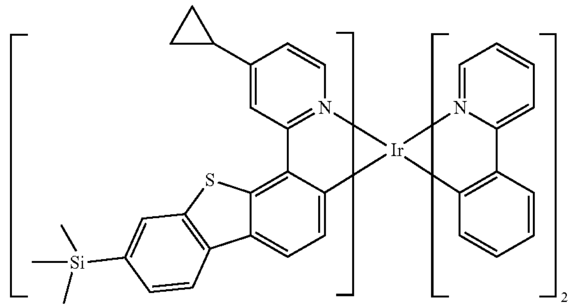
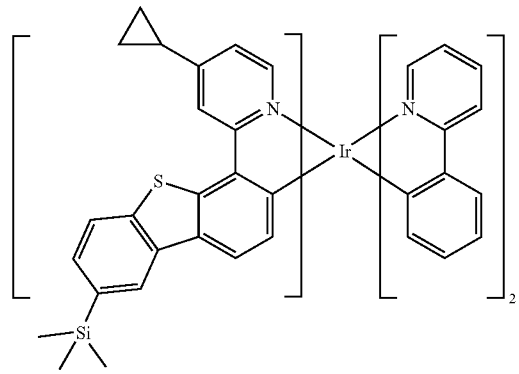
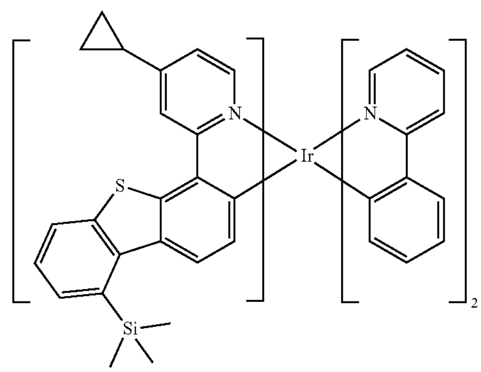
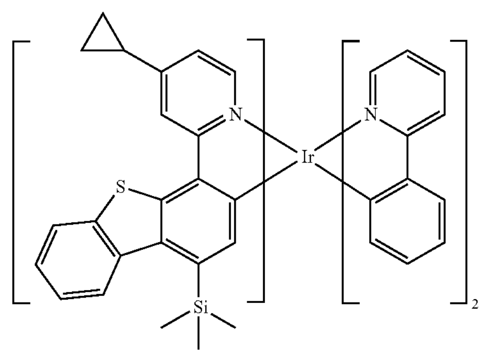
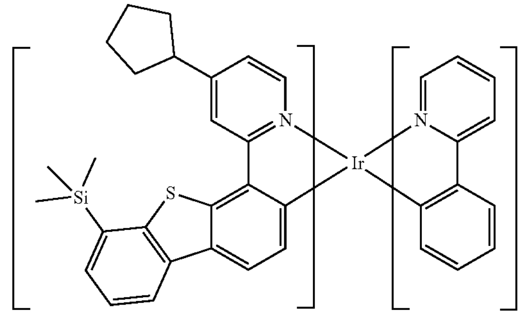

-continued
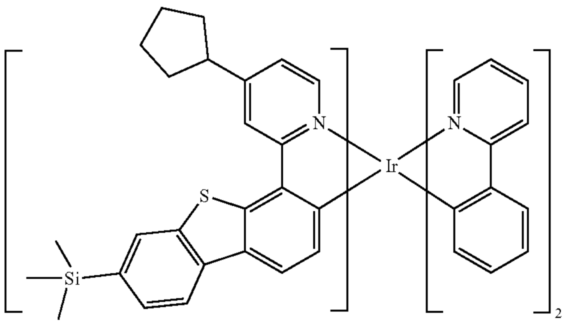
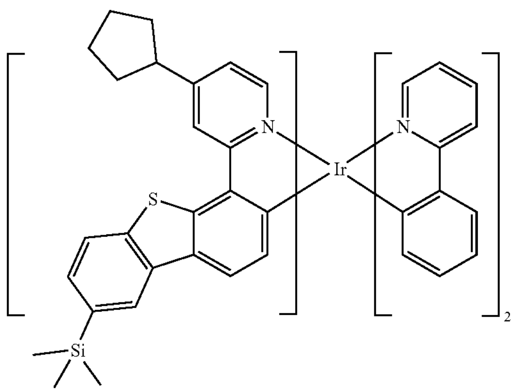
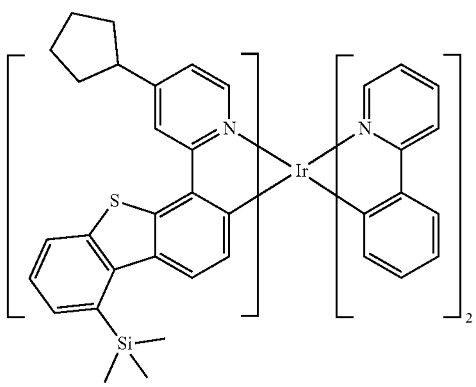
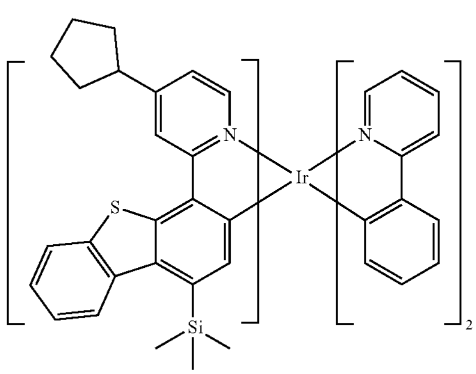
-continued
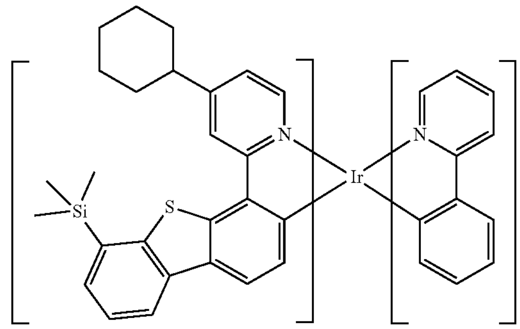
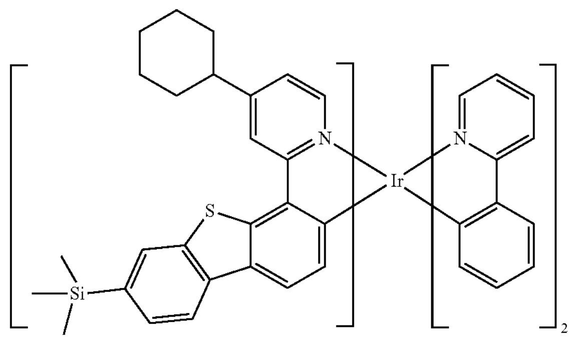
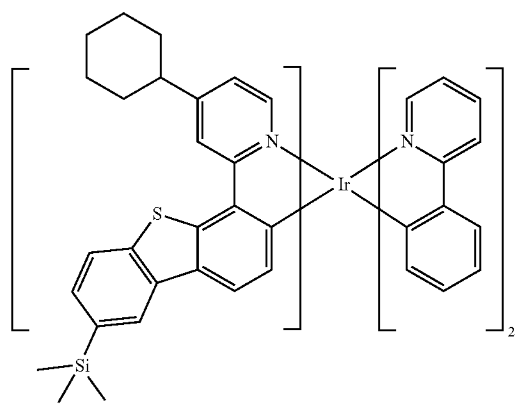
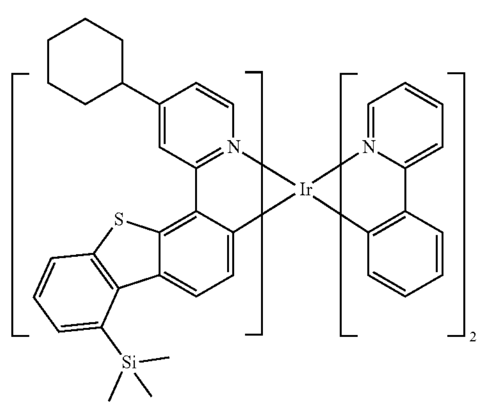

-continued
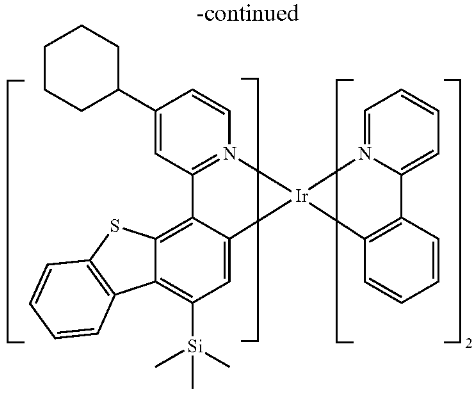
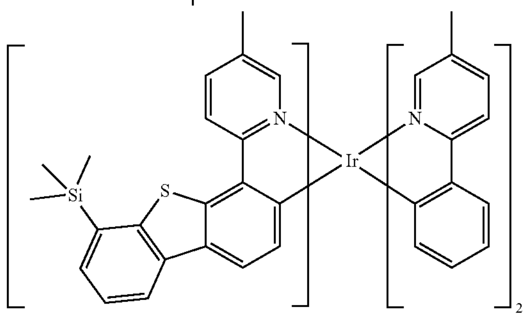
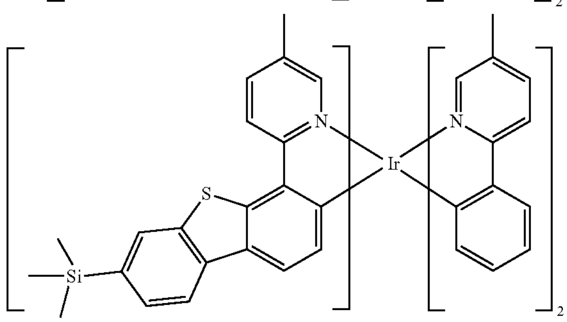
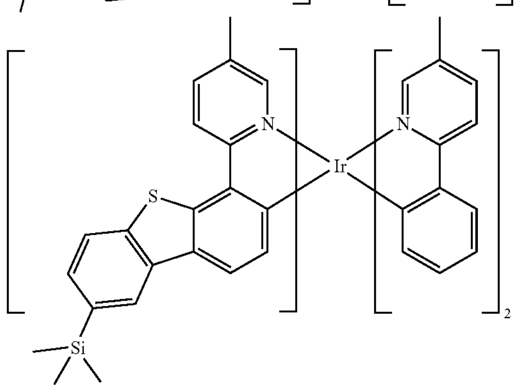
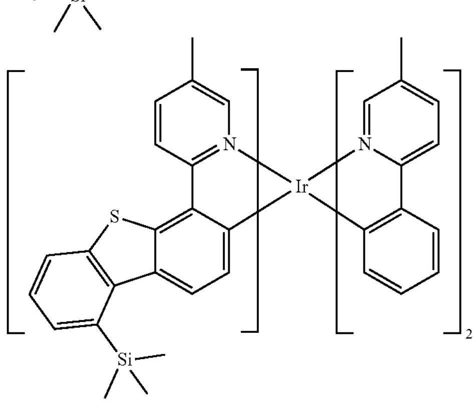
-continued
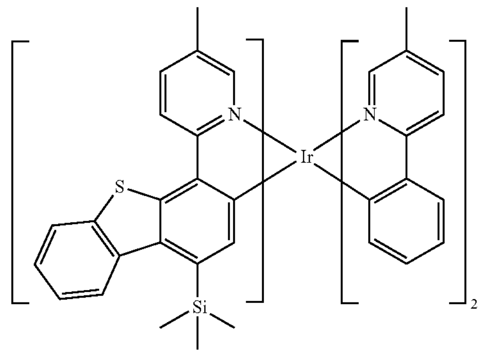
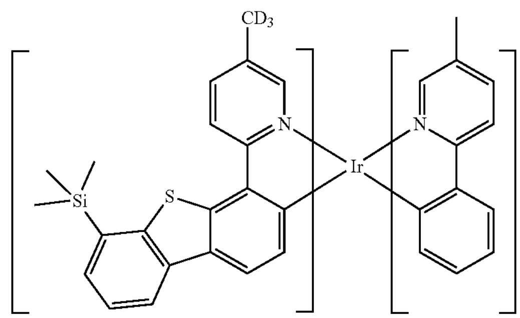
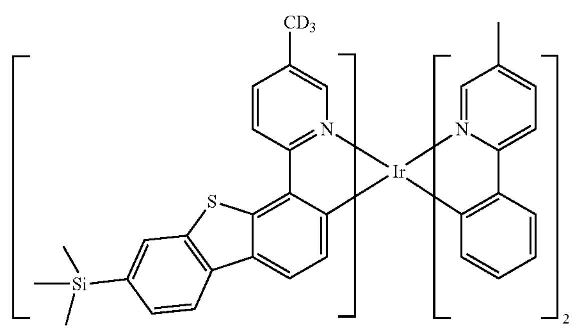
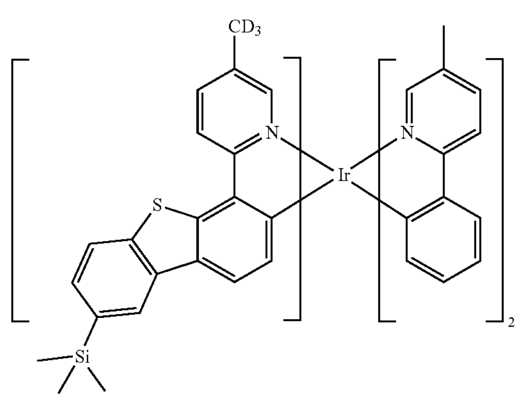

-continued
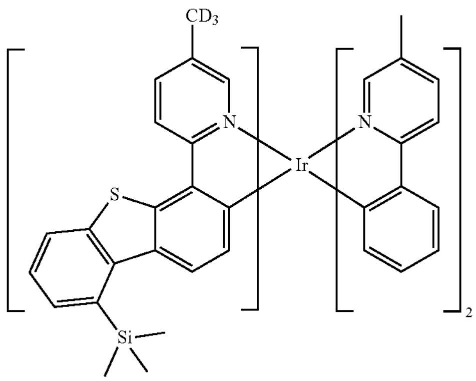
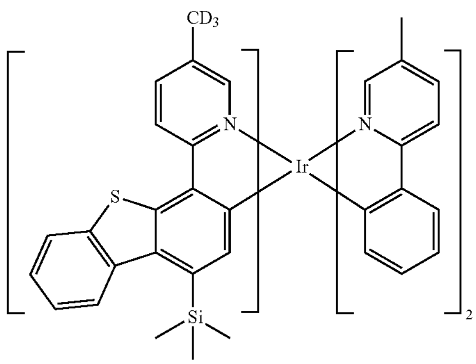
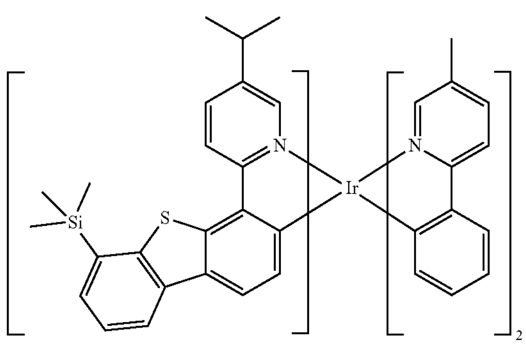
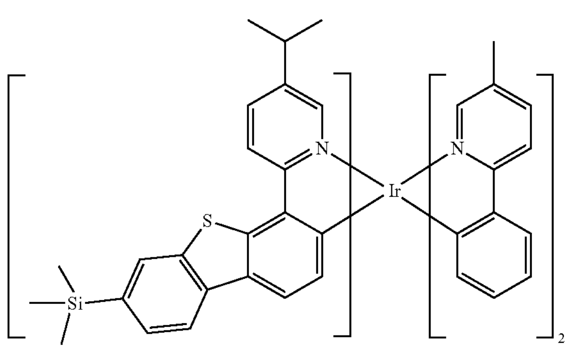
-continued
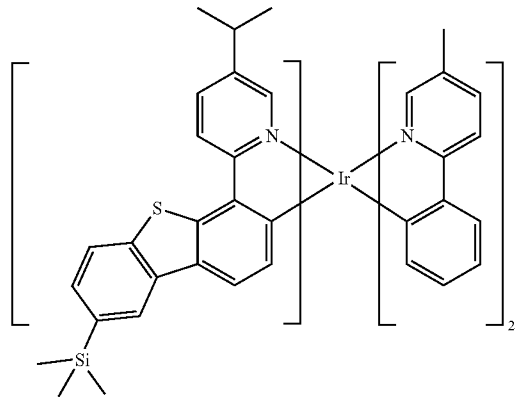
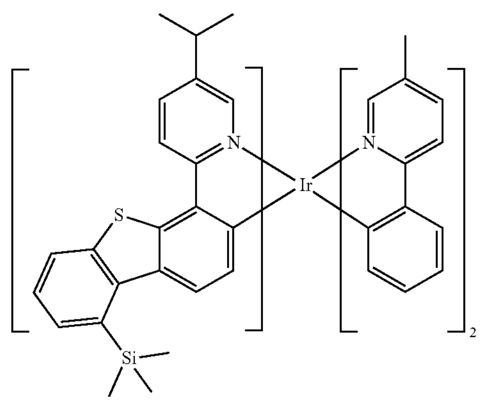
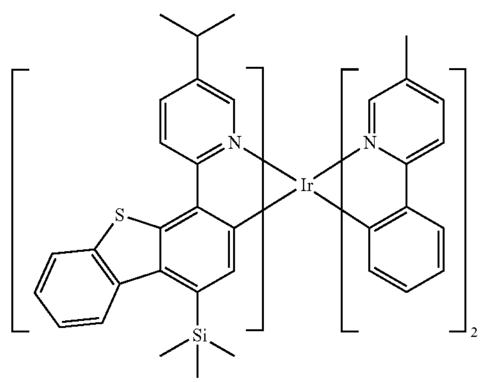
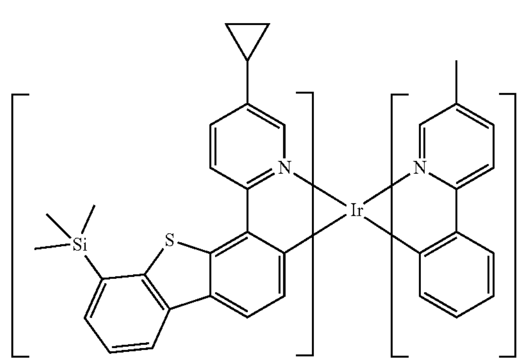

-continued
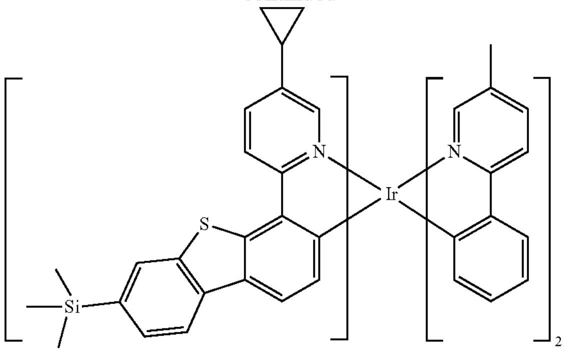
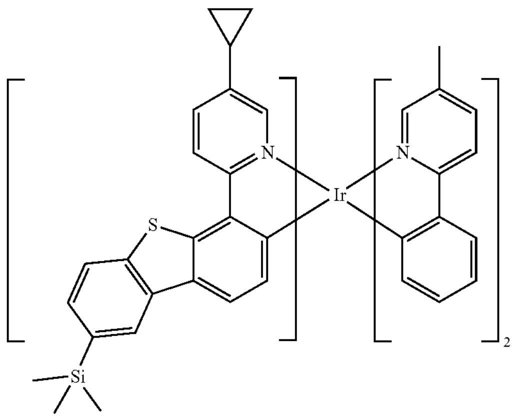
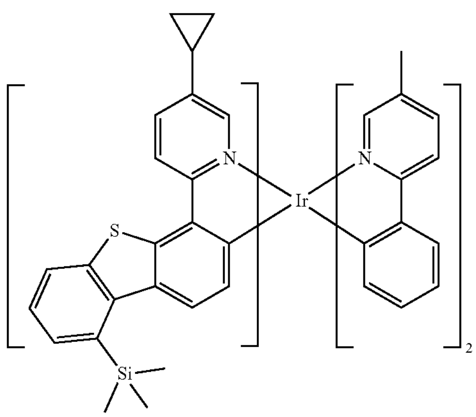
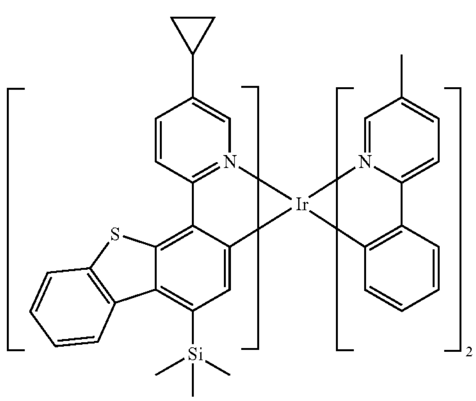
-continued
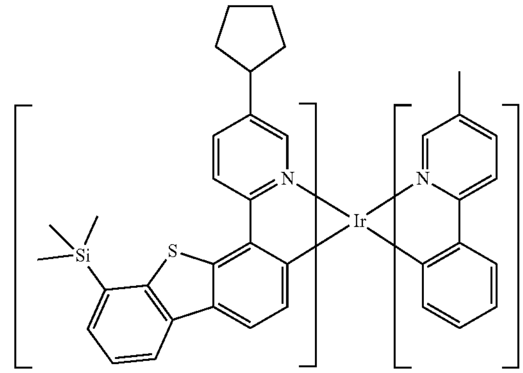
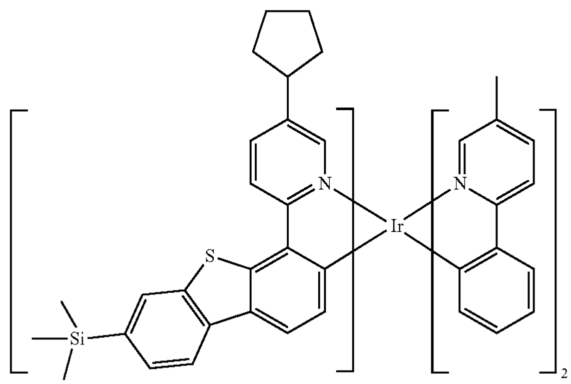
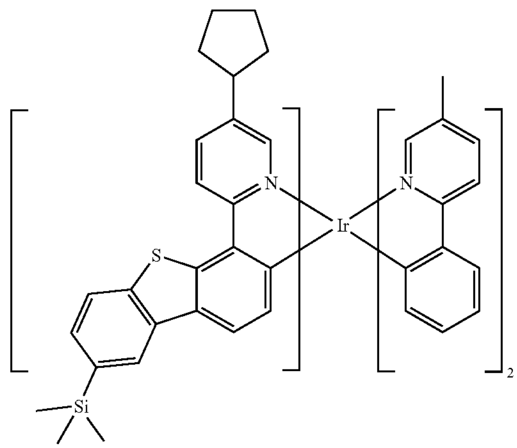
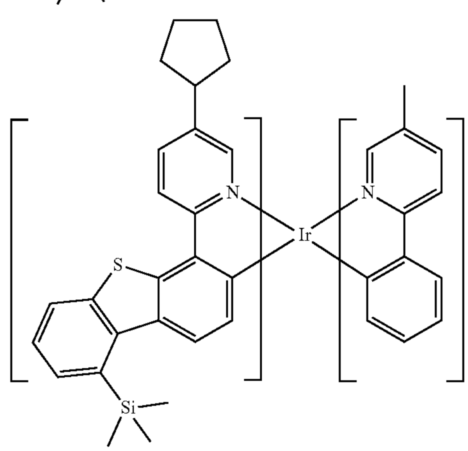

-continued
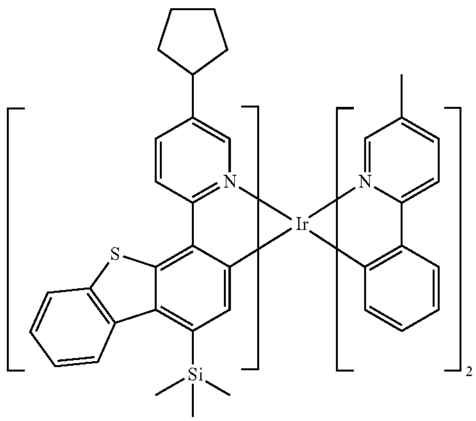
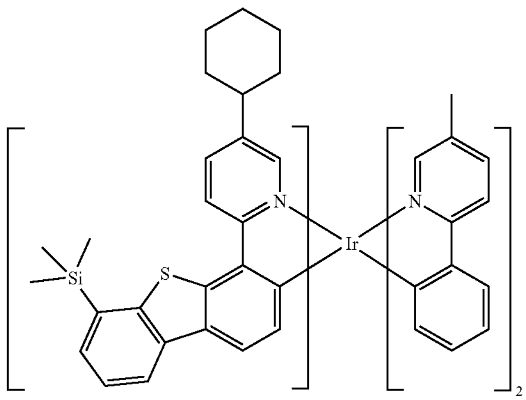
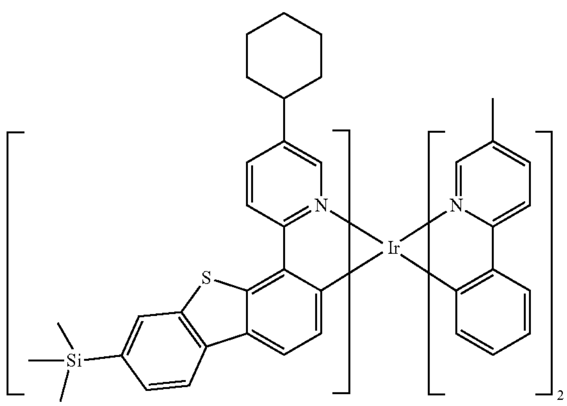
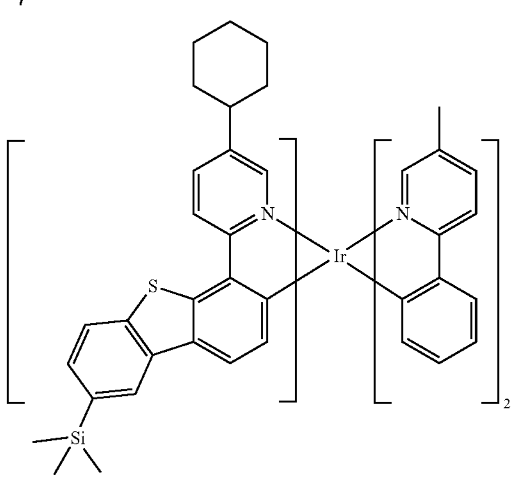
-continued
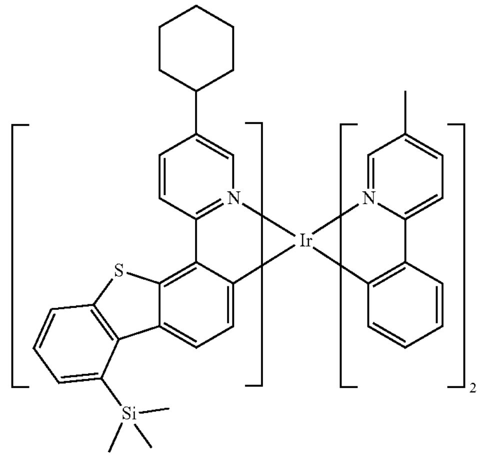
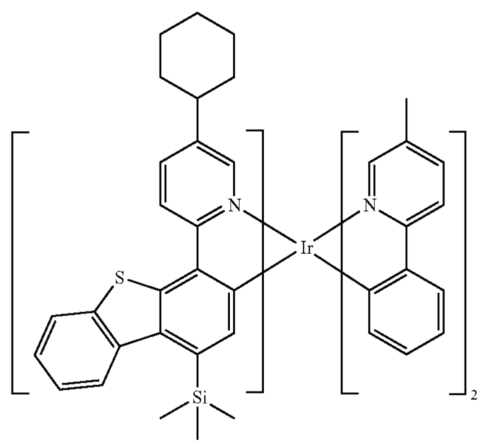
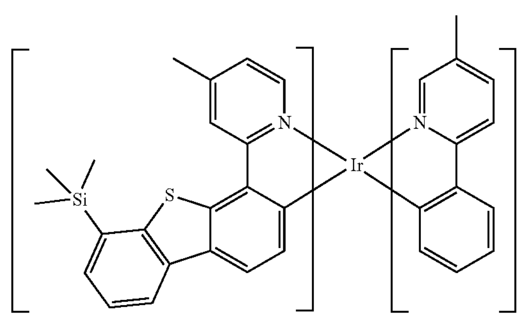
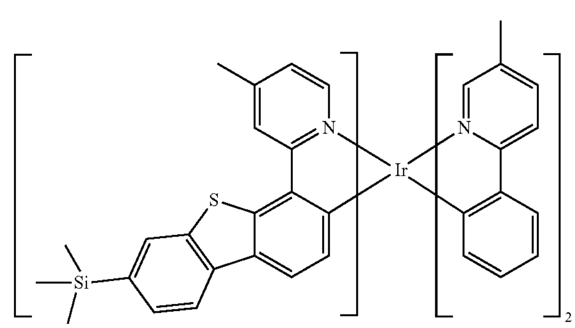

-continued
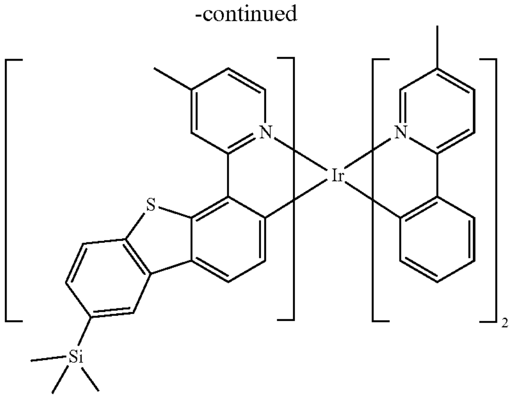
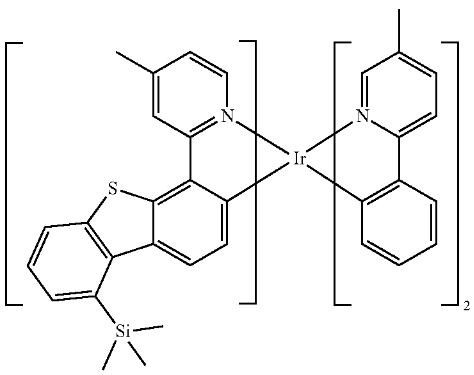
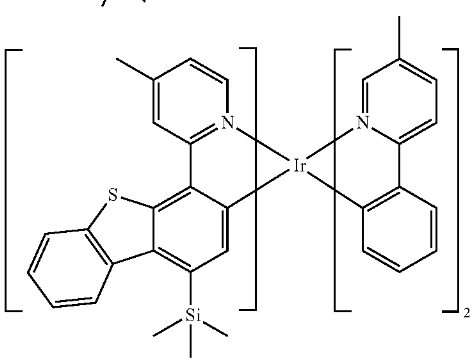
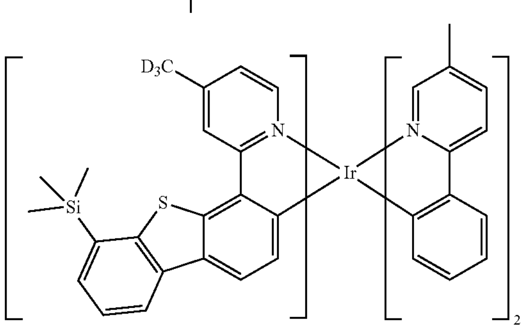
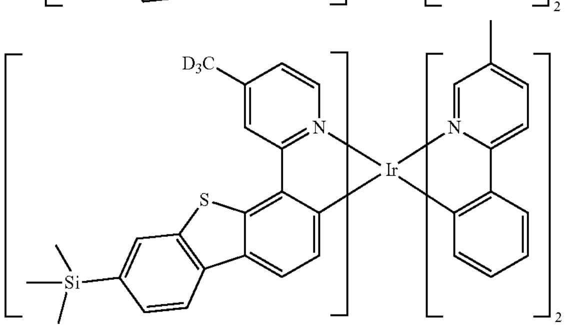
-continued
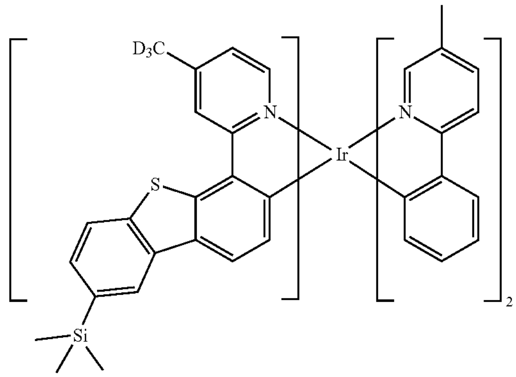
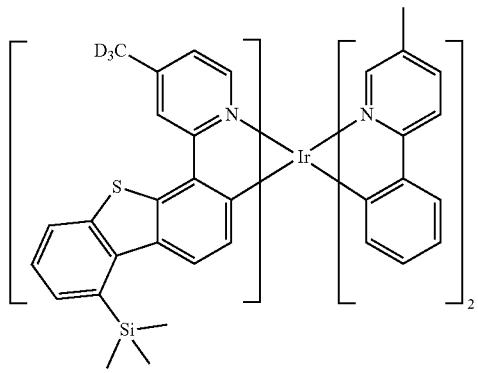
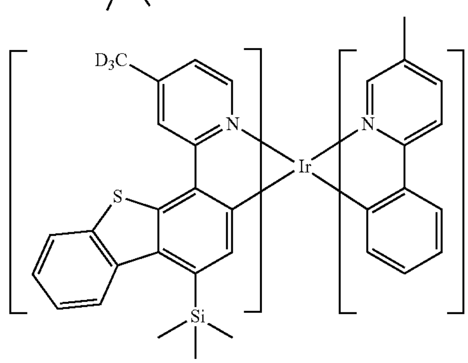
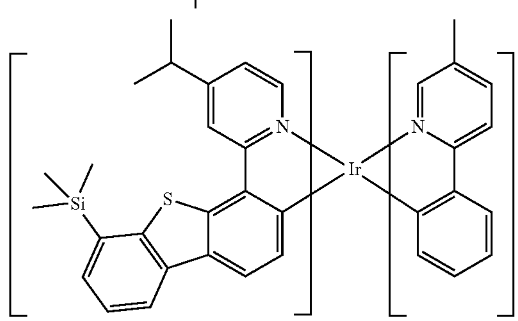
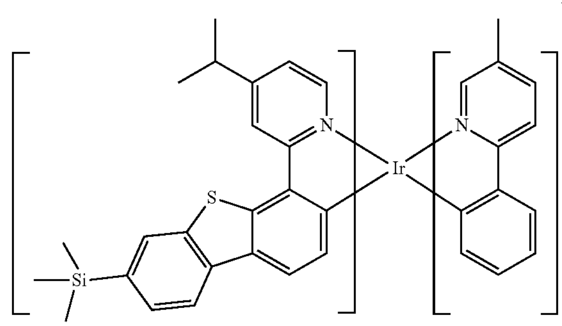

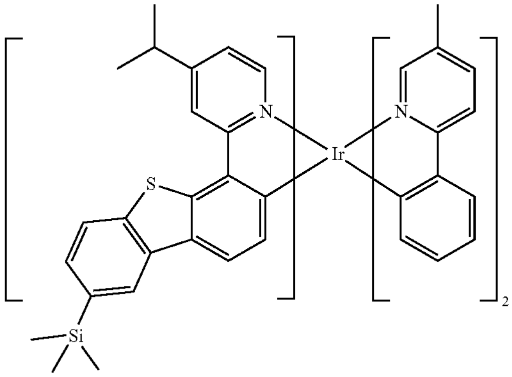
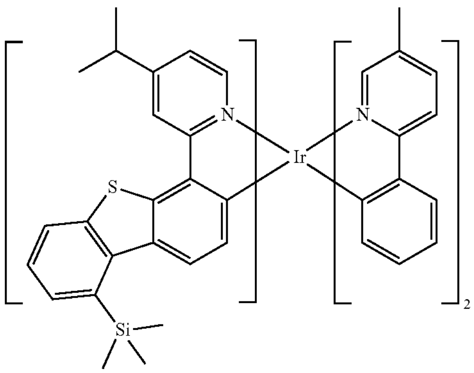
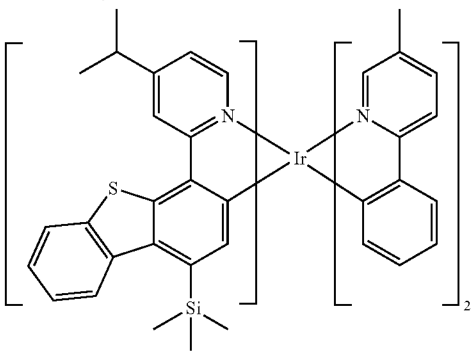
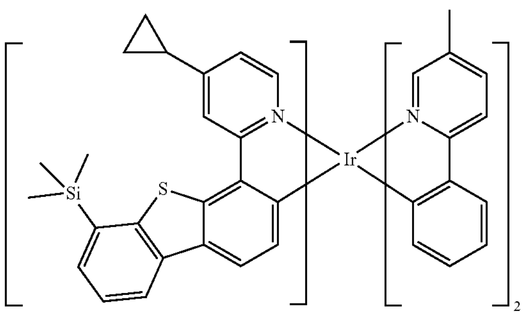
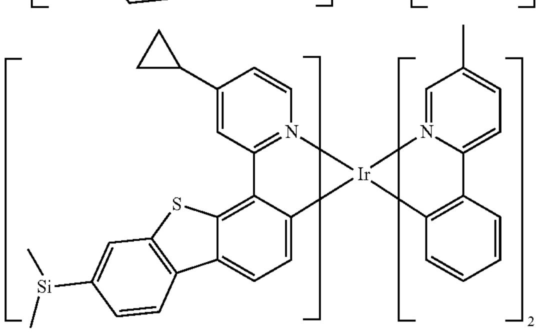
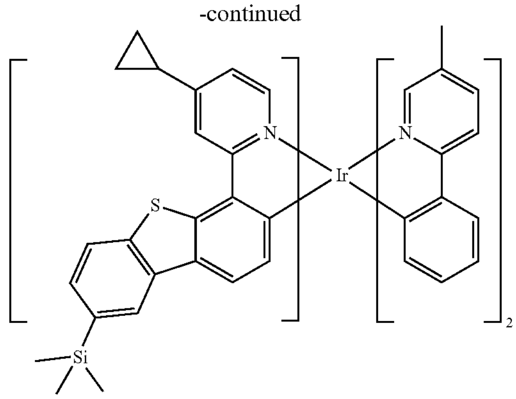
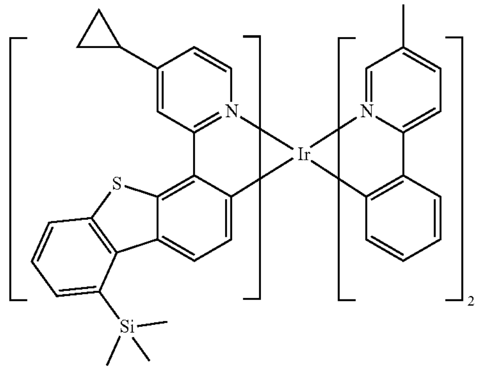
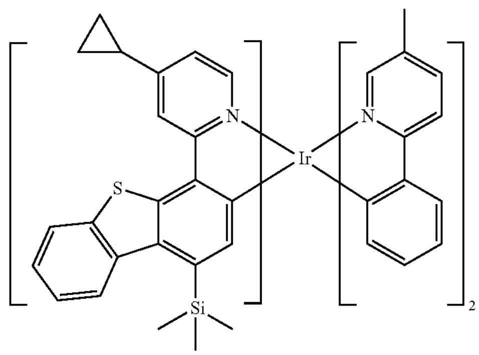
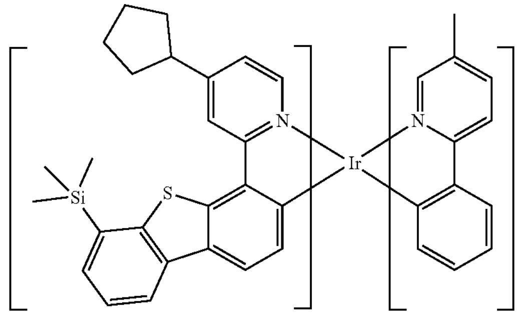
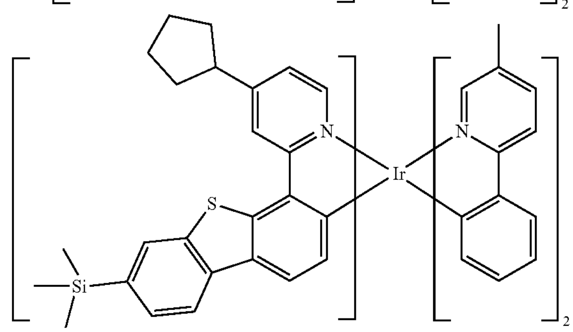

-continued
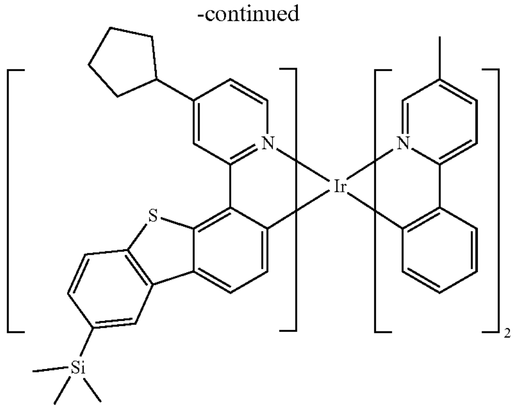
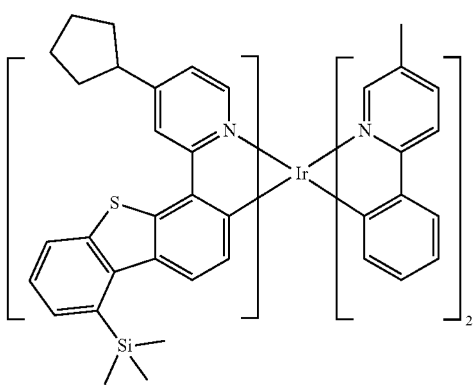
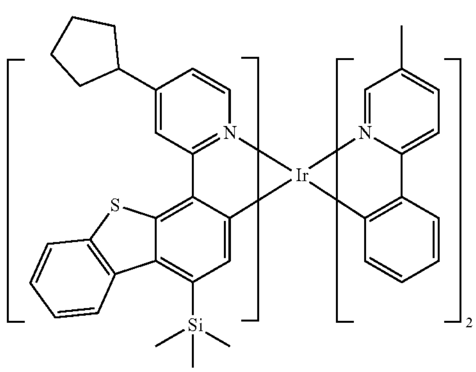
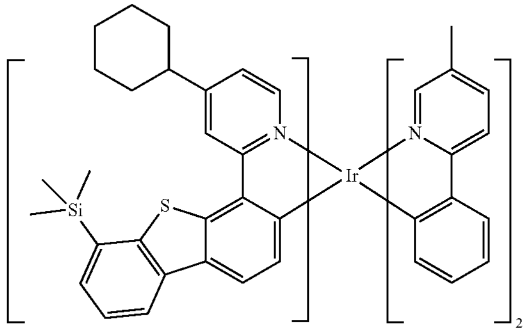
-continued
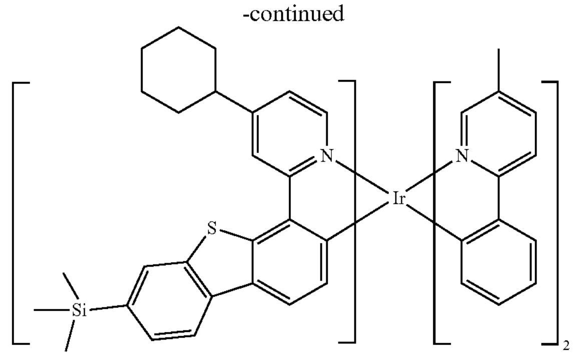
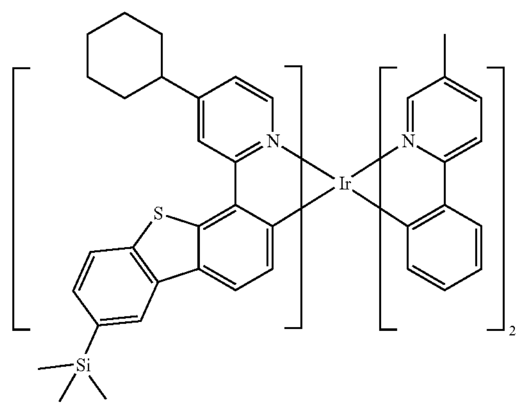
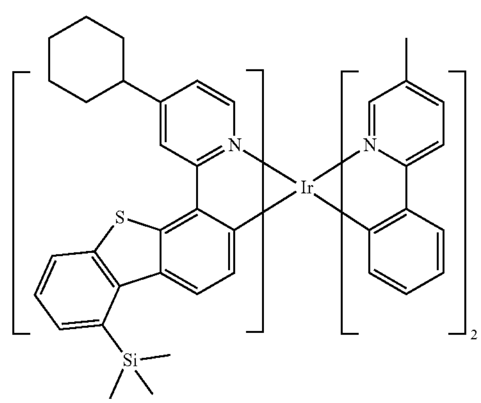
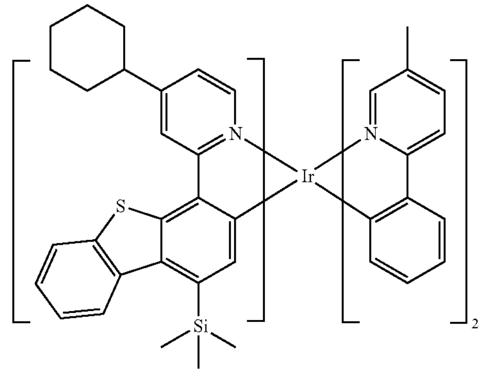

-continued
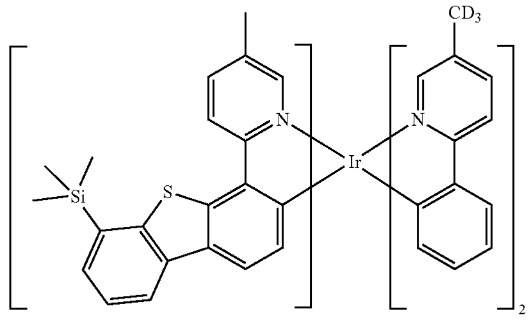
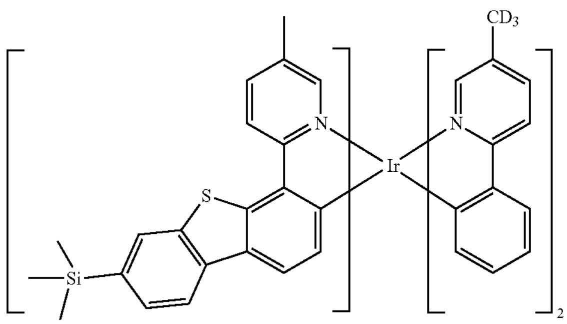
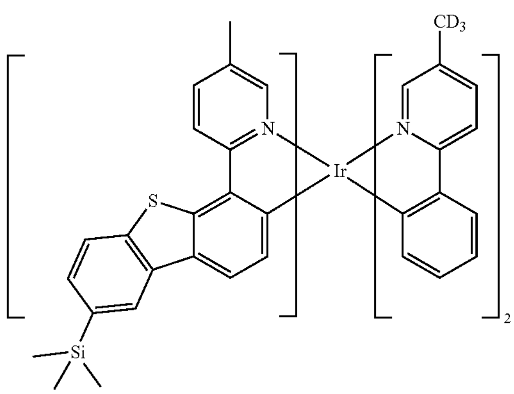
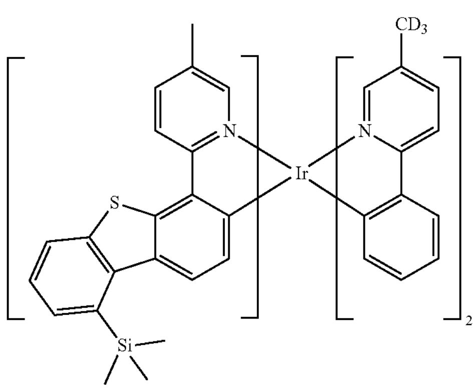
-continued
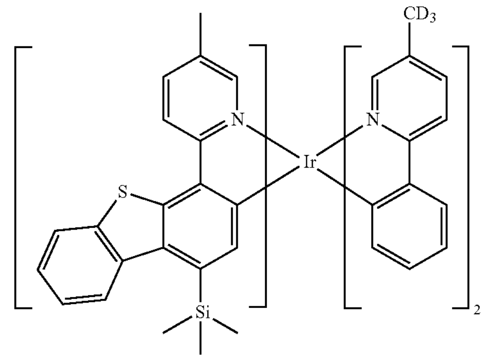
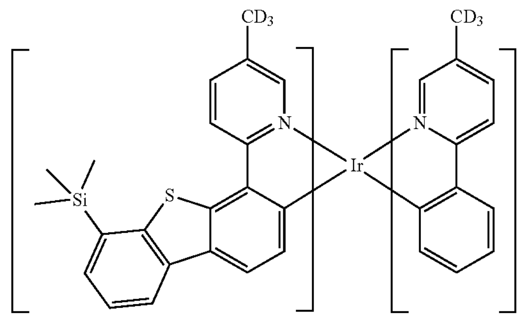
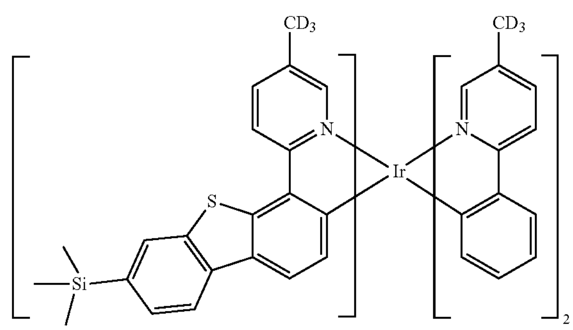
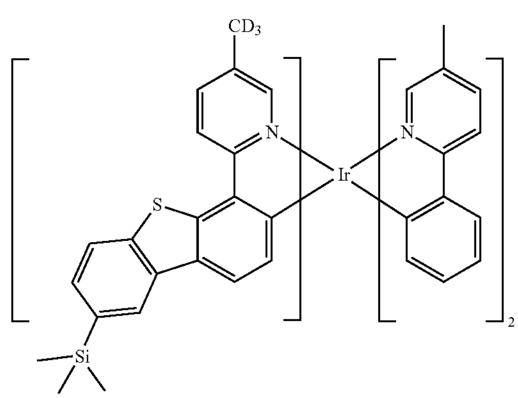

-continued
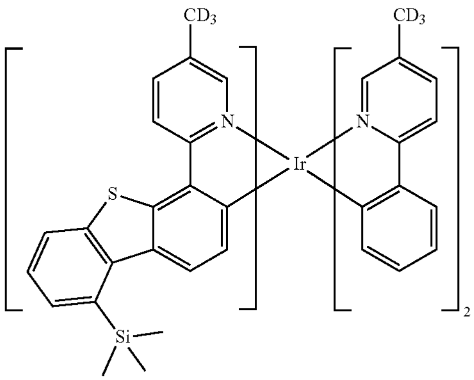
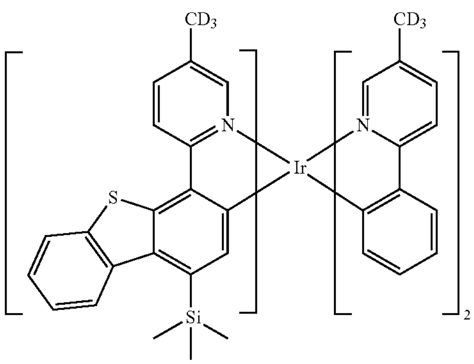
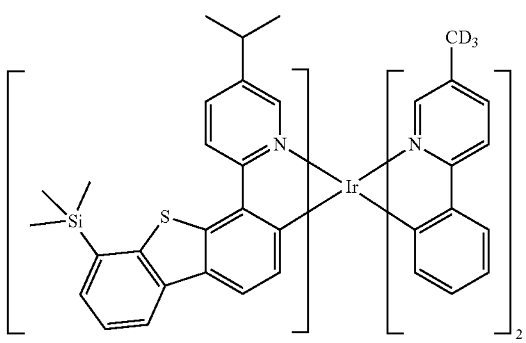
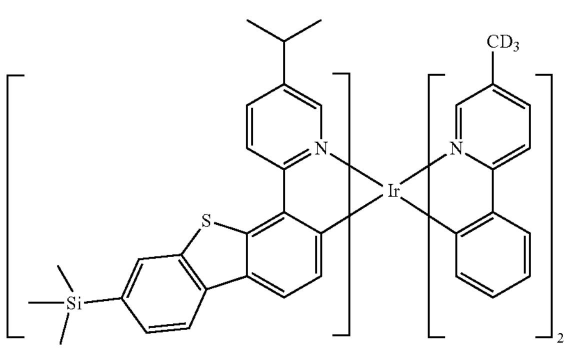
-continued
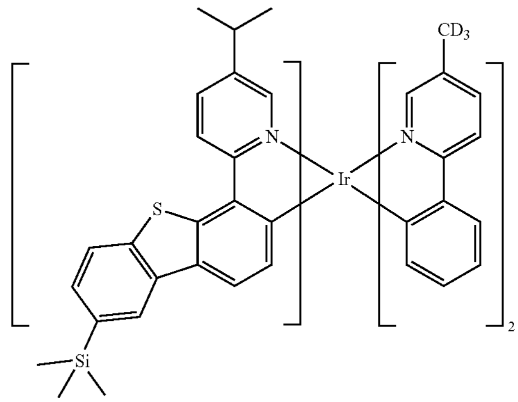
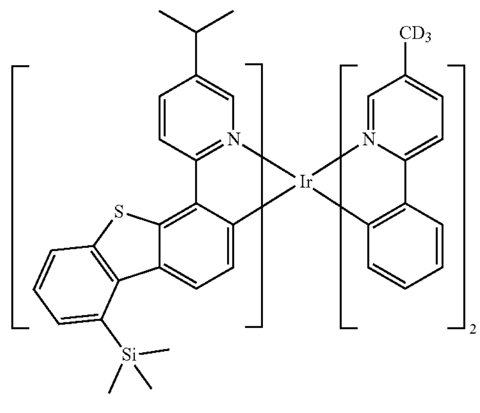
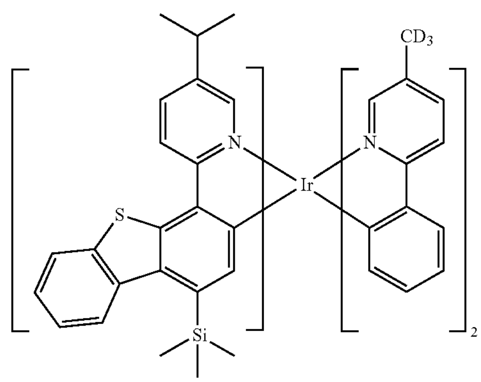
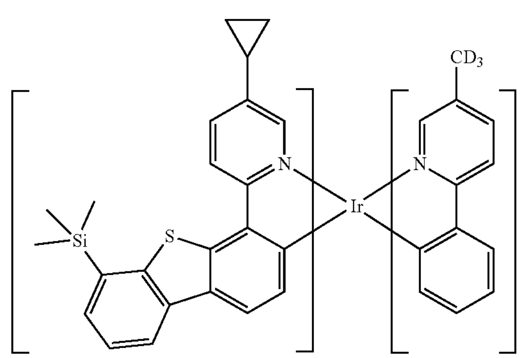

-continued
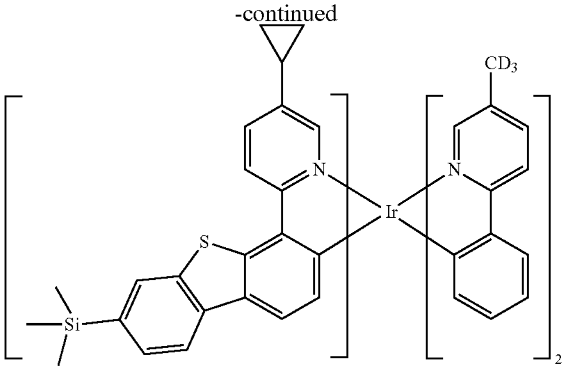
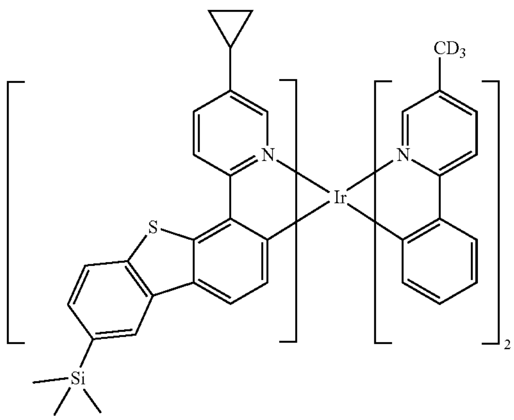
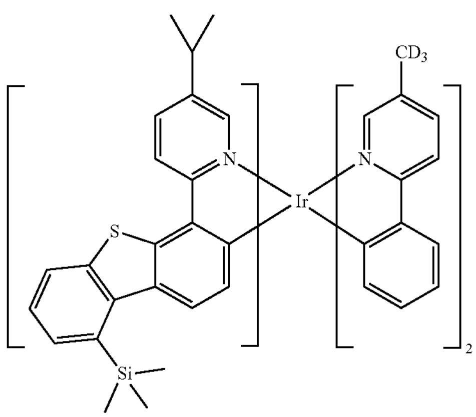
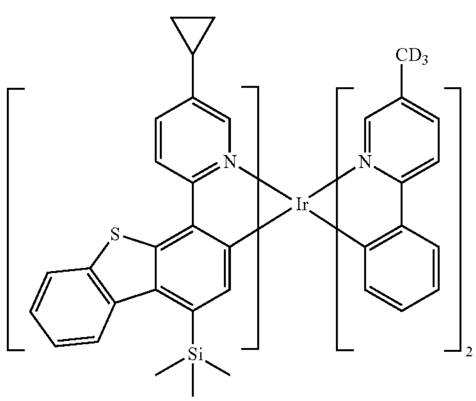
-continued
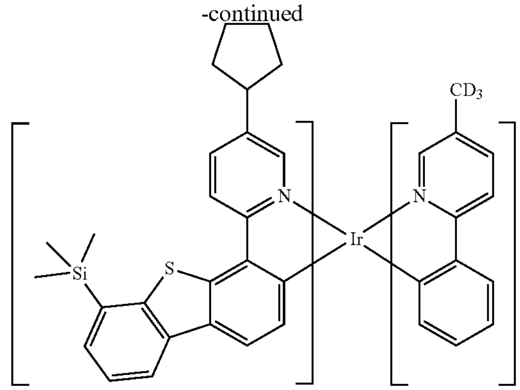
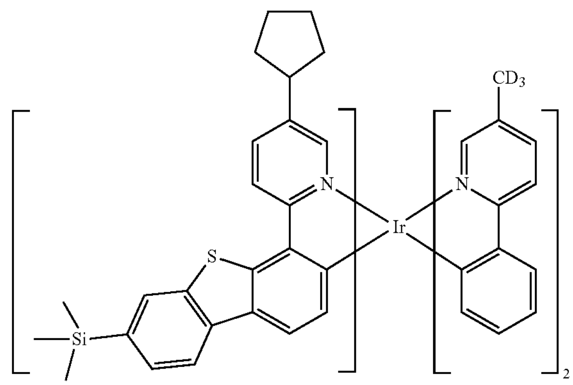
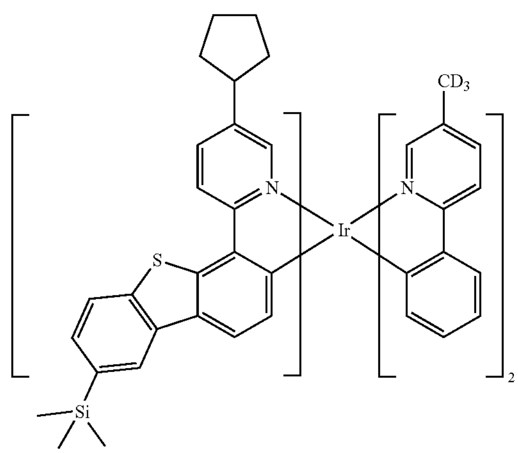
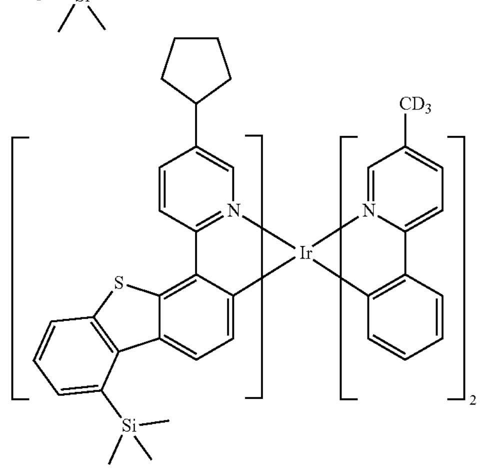

-continued
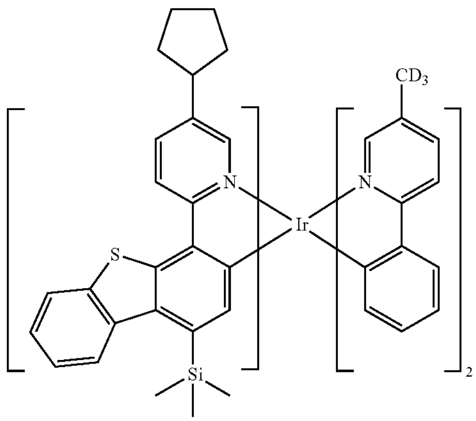
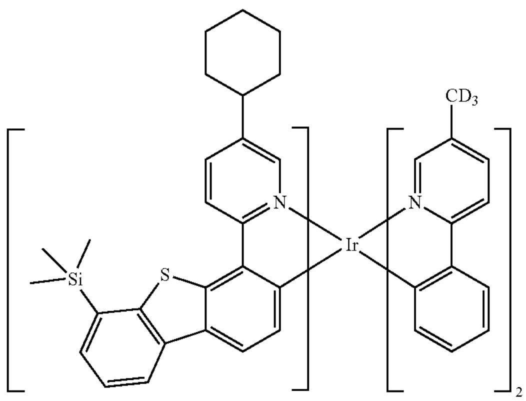
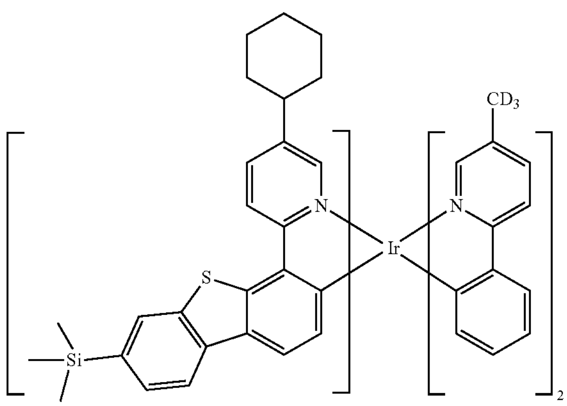
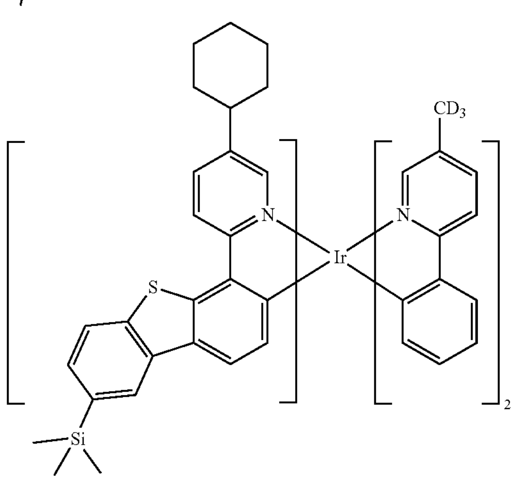
-continued
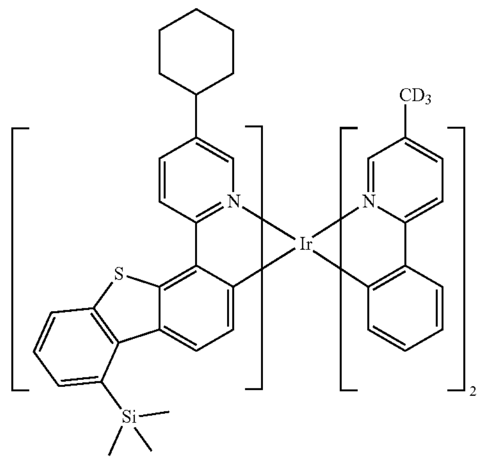
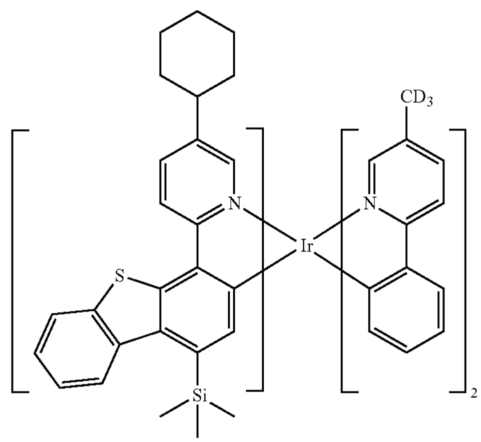
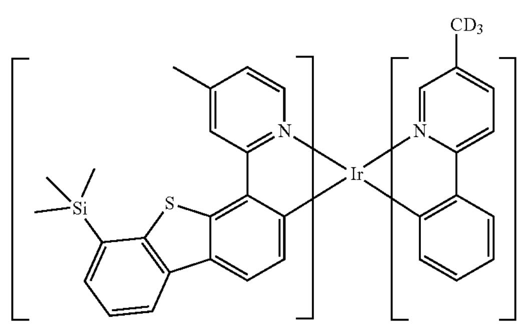
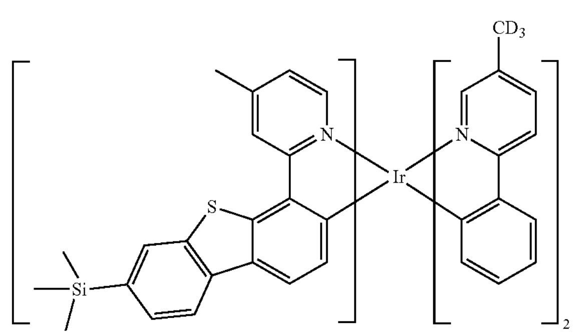

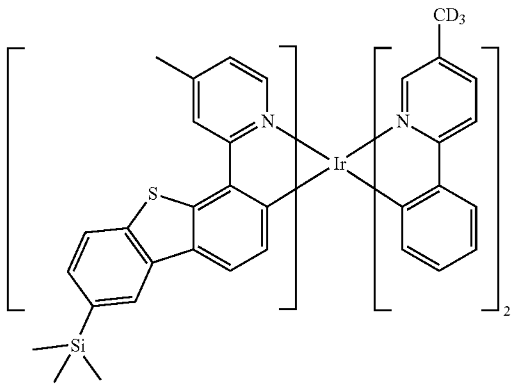
CD3
N
Ir
S
Si
2
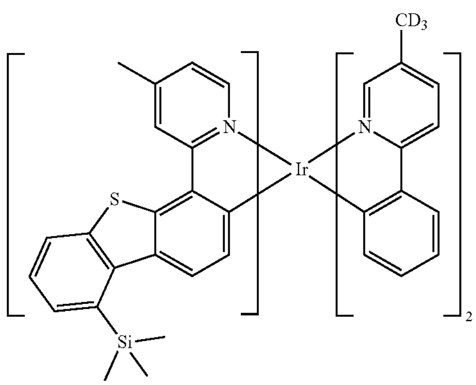
CD3
N
Ir
S
Si
2
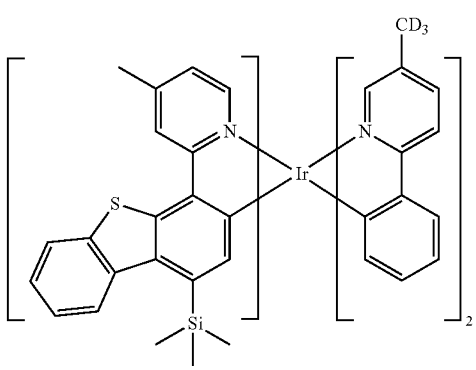
CD3
N
Ir
S
Si
2
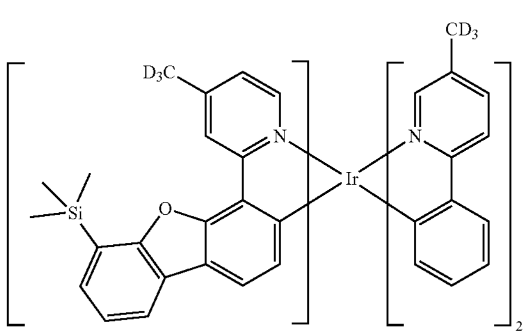
CD3
D3C
N
Ir
O
Si
2
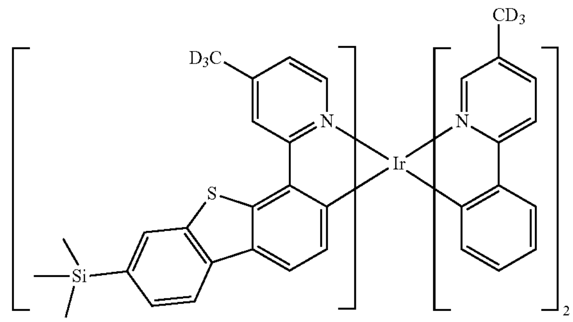
CD3
D3C
N
Ir
S
Si
2
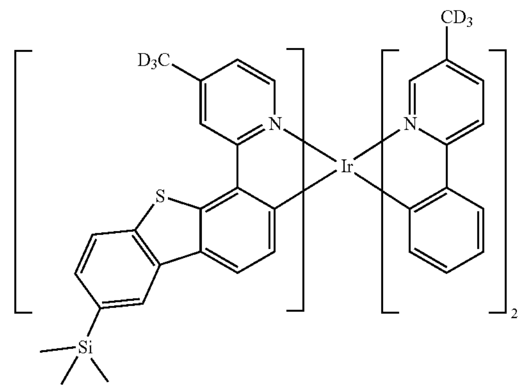
CD3
D3C
N
Ir
S
Si
2
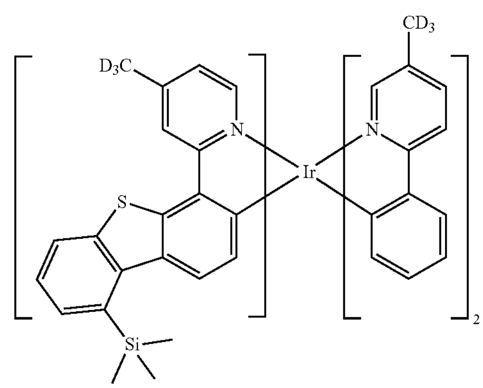
CD3
D3C
N
Ir
S
Si
2
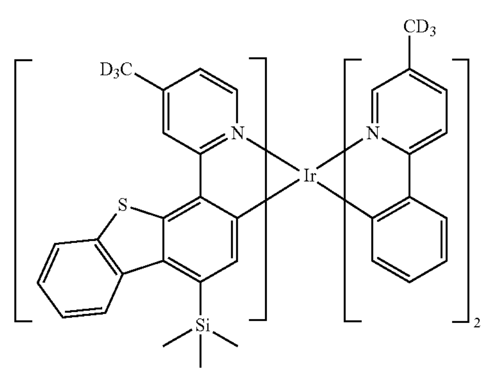
CD3
D3C
N
Ir
S
Si
2

-continued
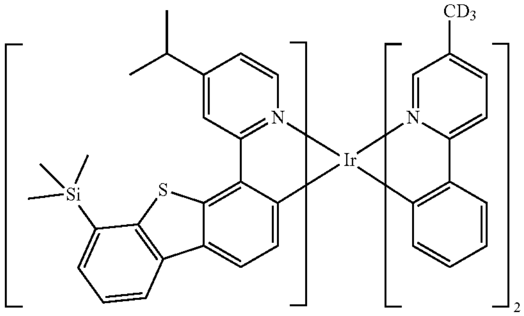
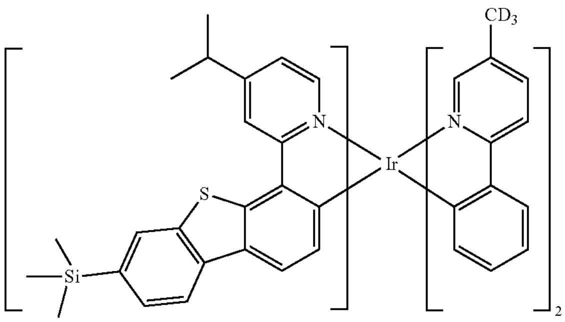
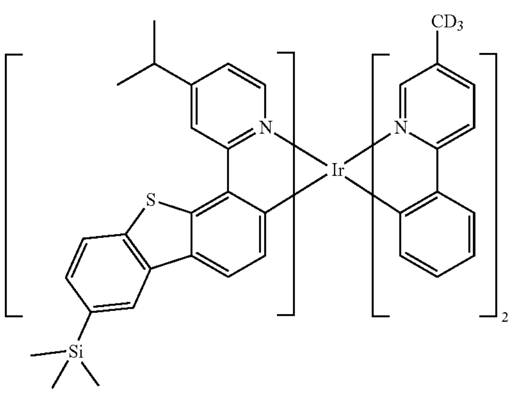
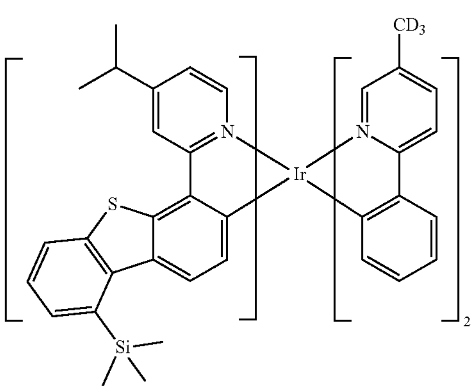
-continued
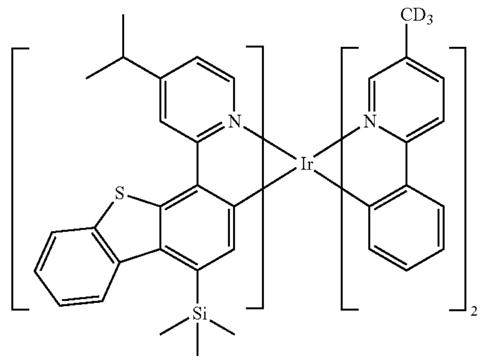
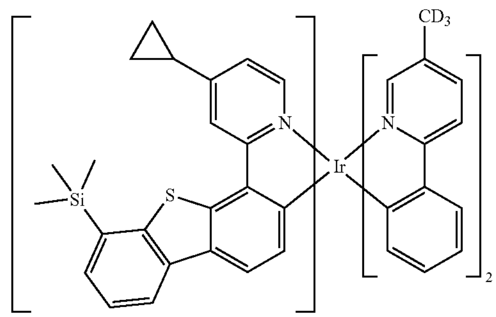
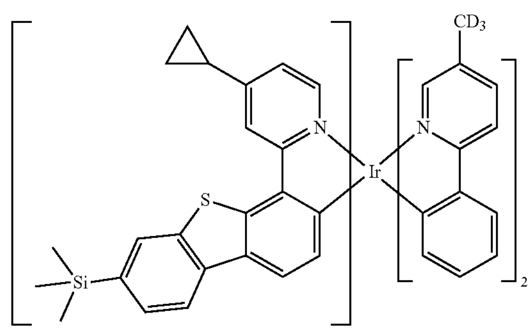
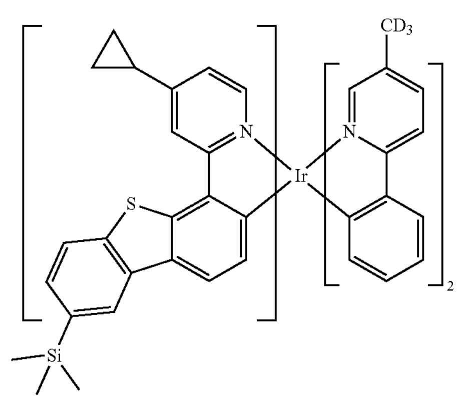

-continued
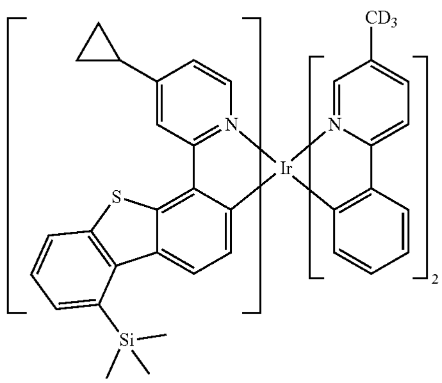
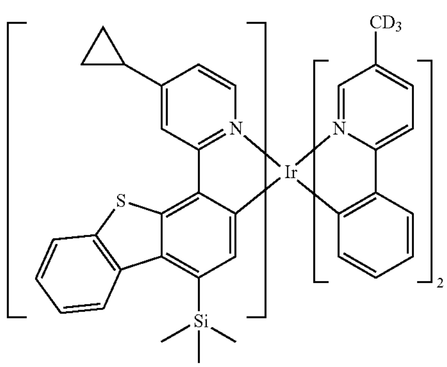
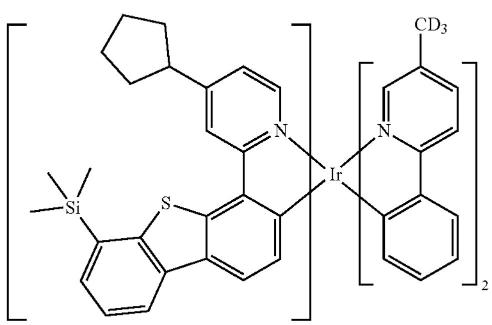
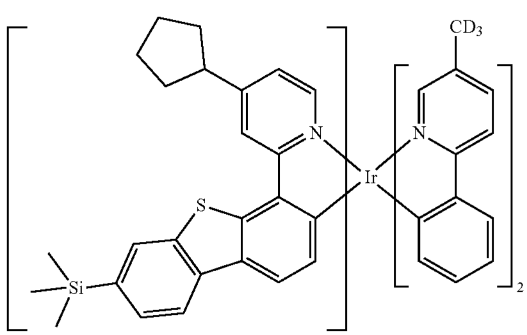
-continued
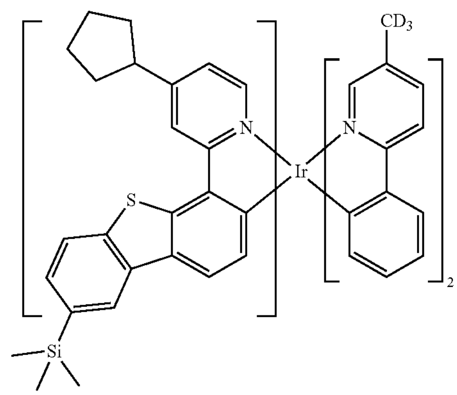
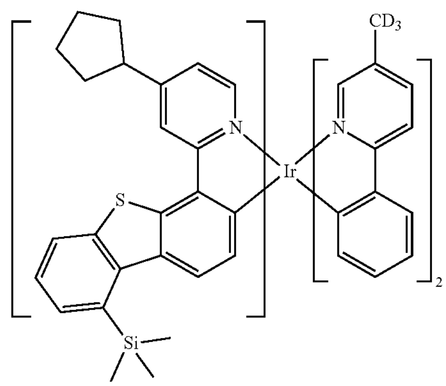
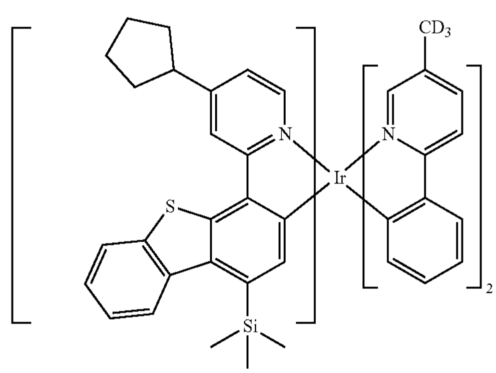
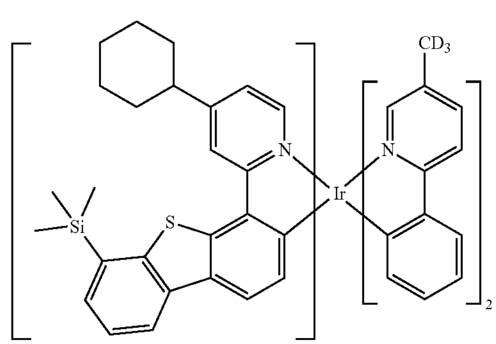

-continued
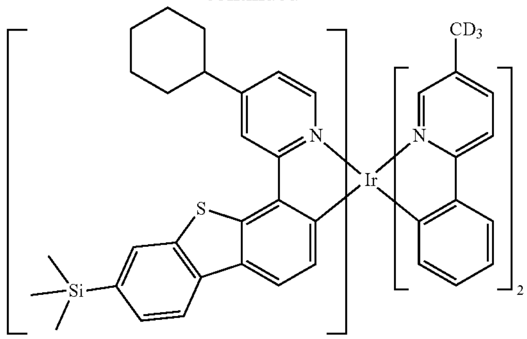
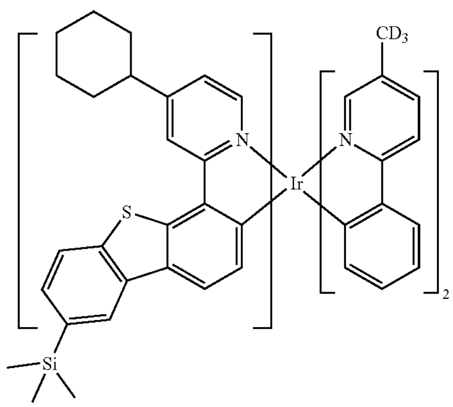
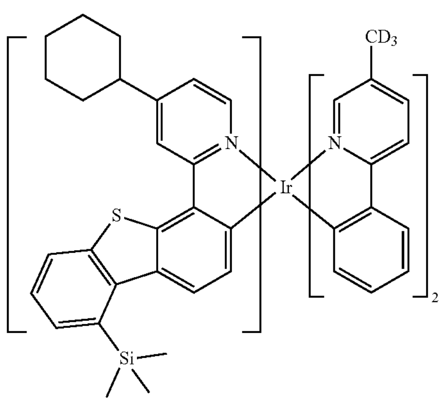
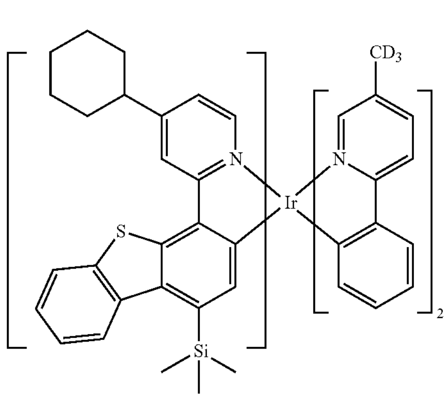
-continued
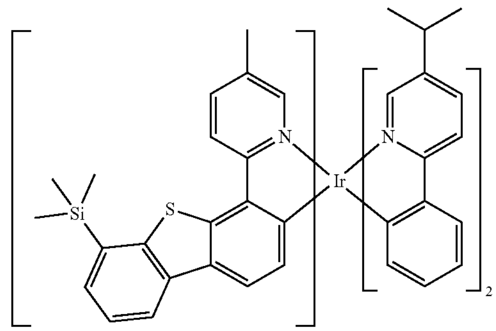
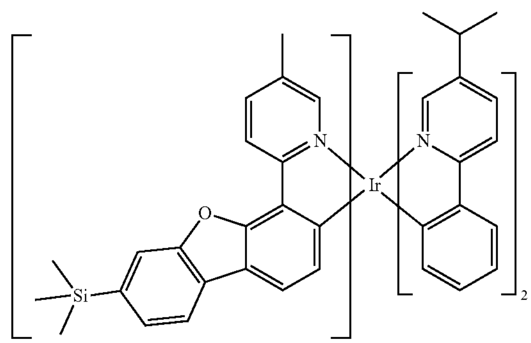
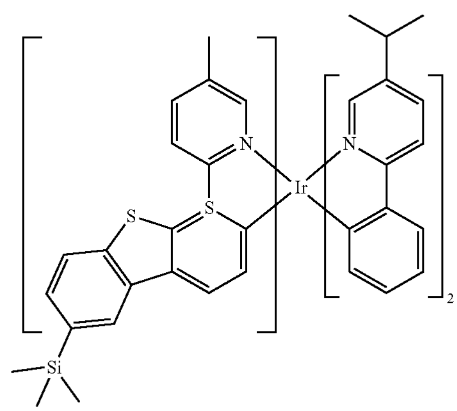
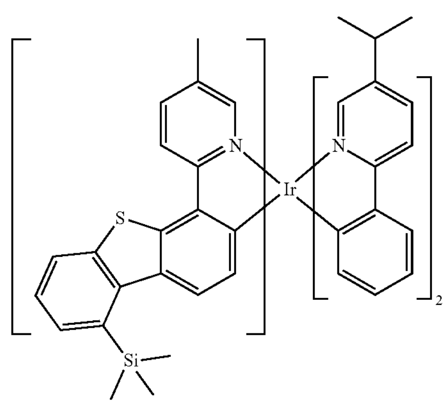

-continued
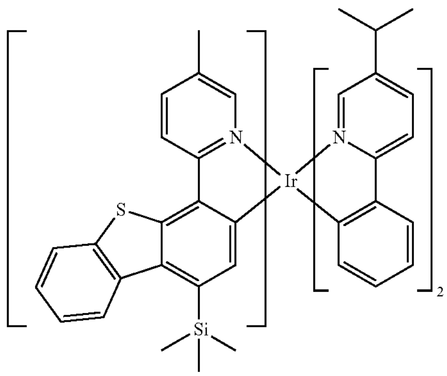
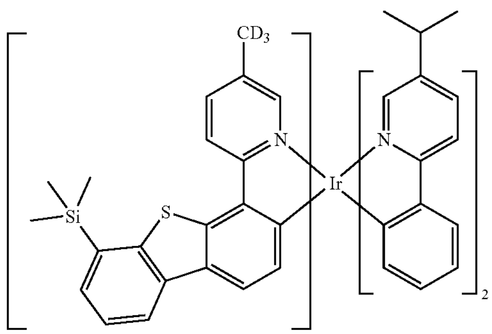
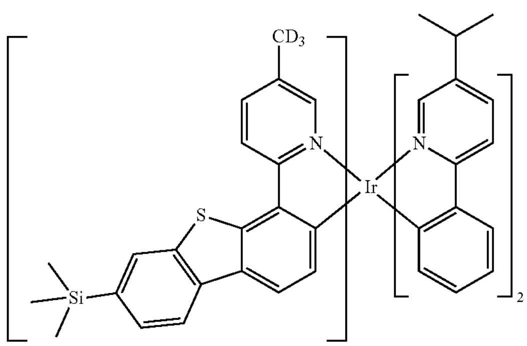
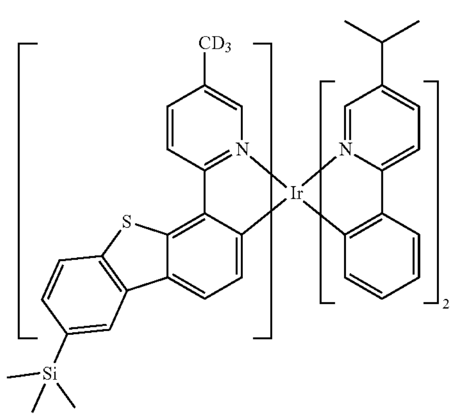
-continued
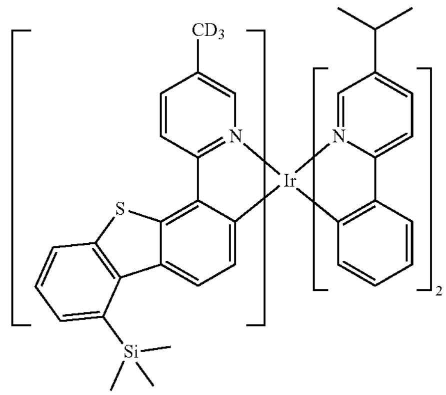
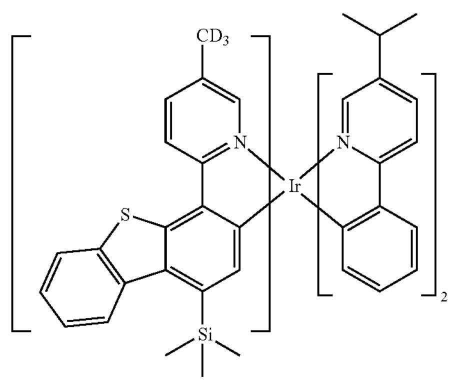
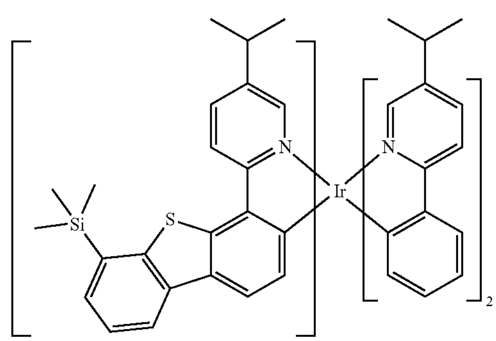
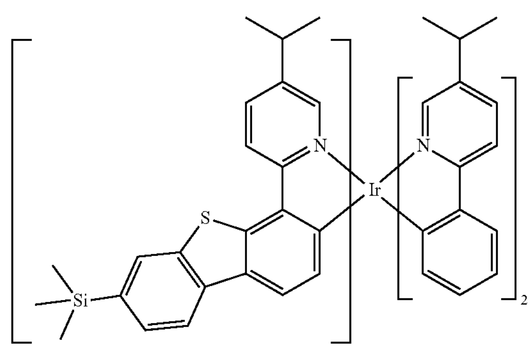

-continued
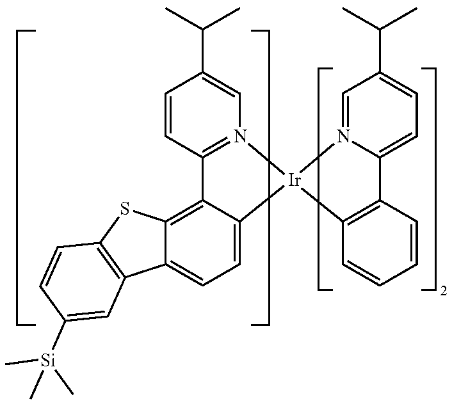
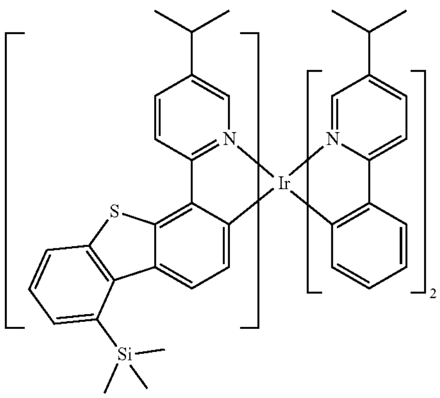
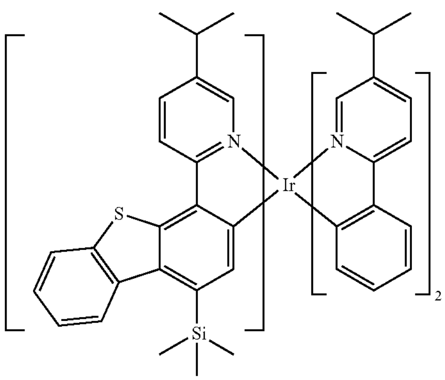
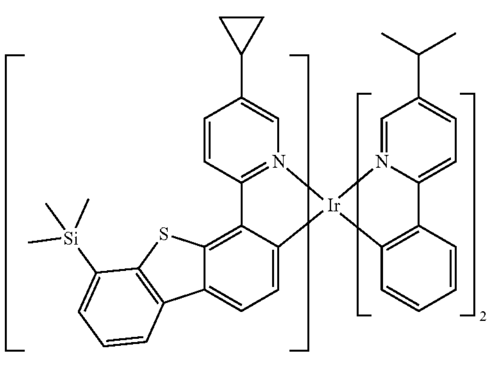
-continued
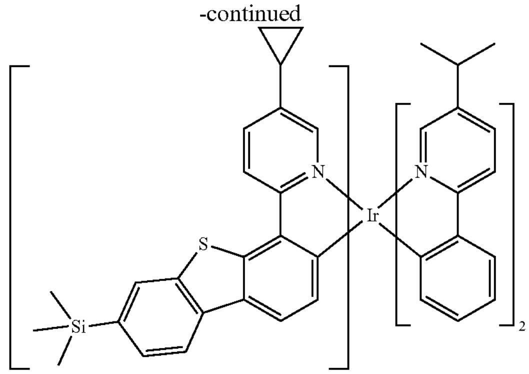
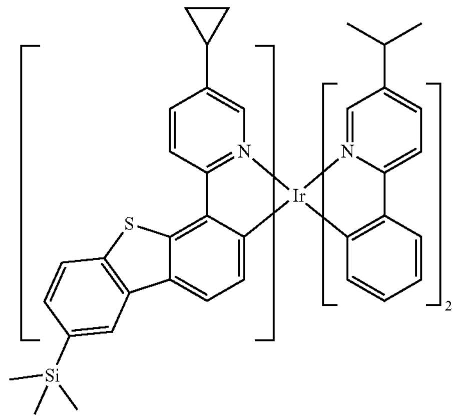
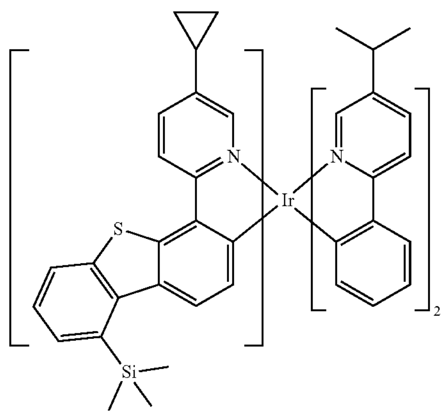
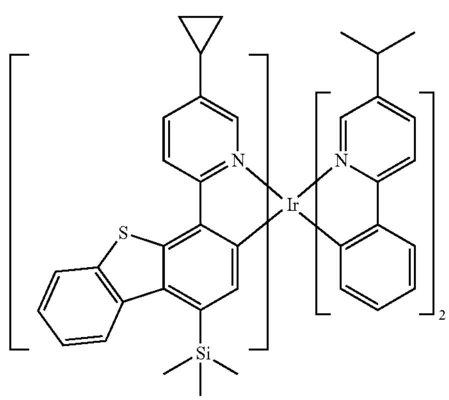

-continued
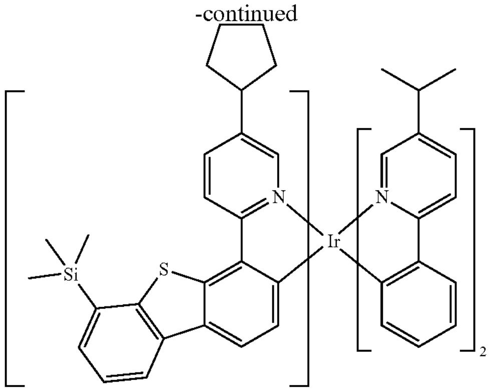
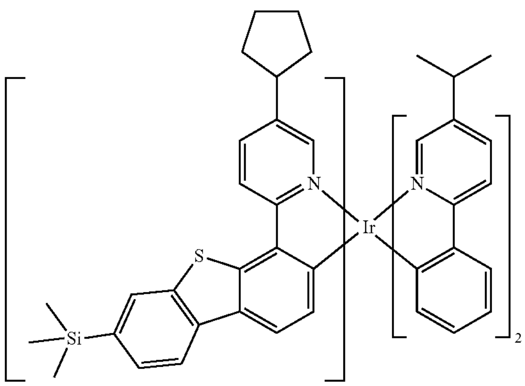
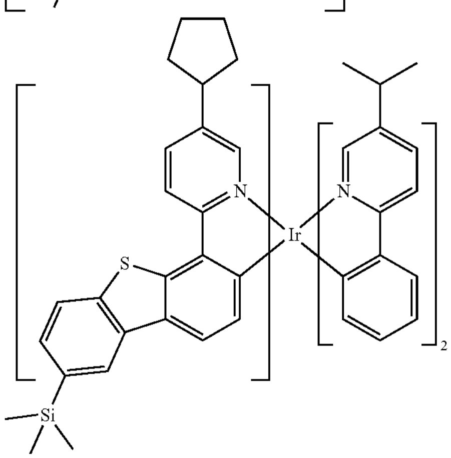
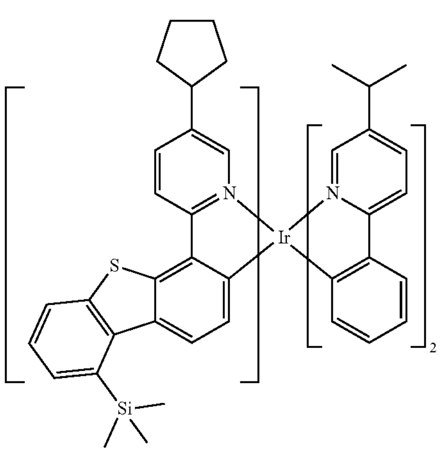
-continued
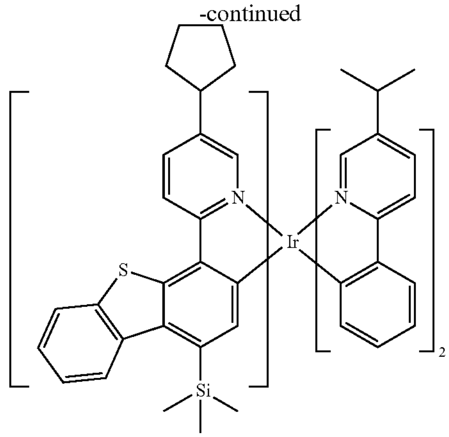
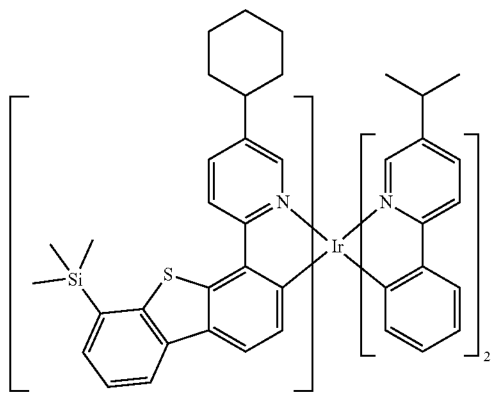
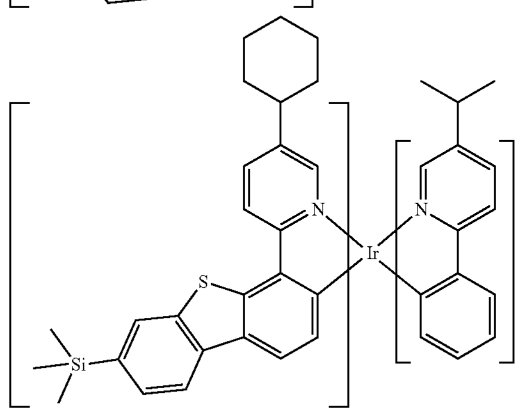
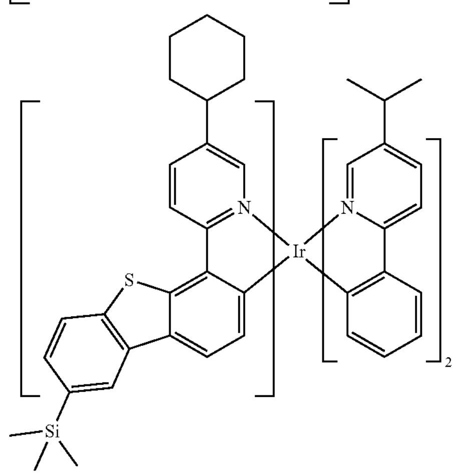

-continued
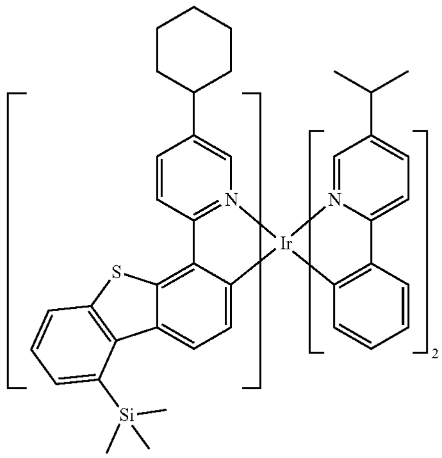
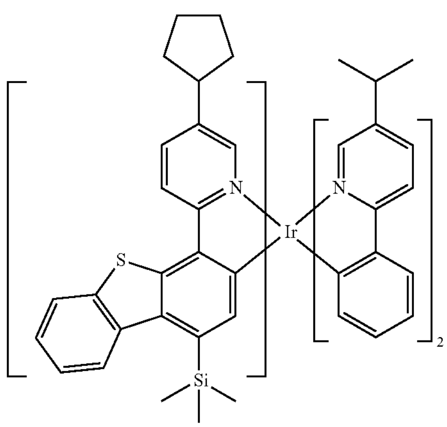
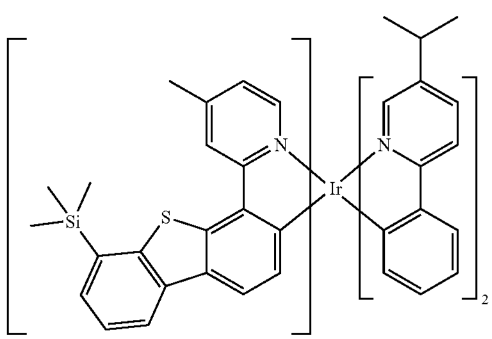
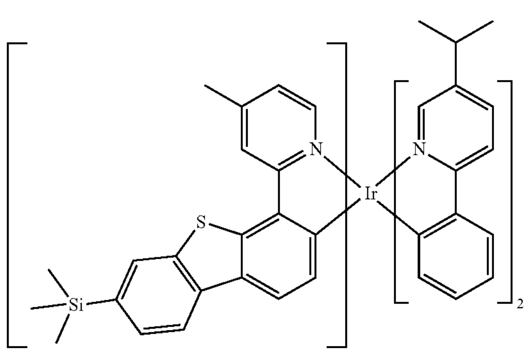
-continued
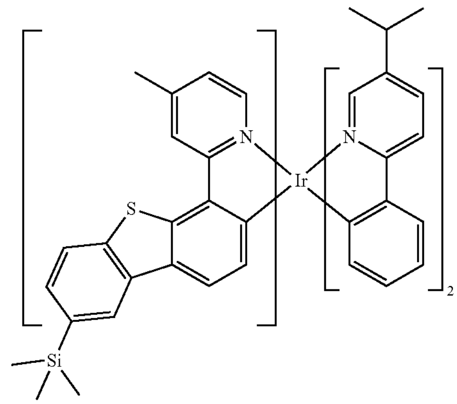
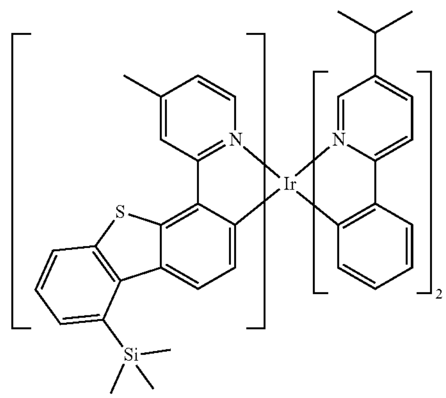
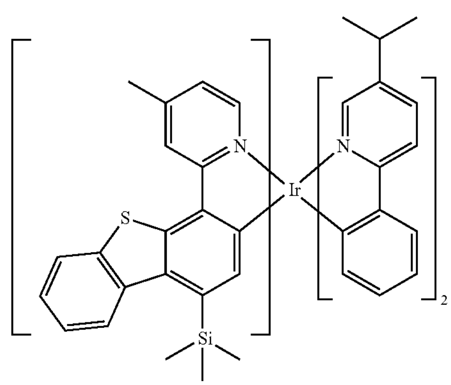
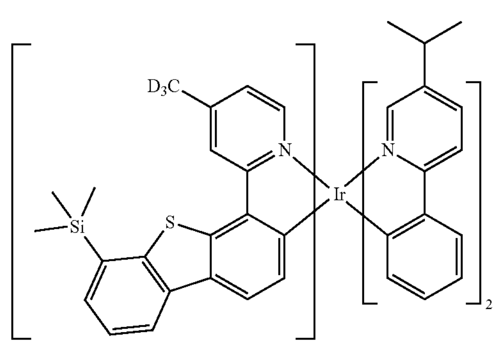

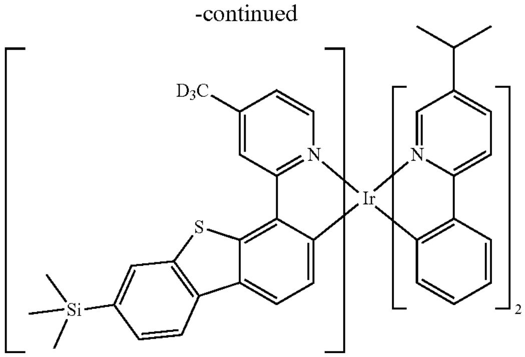
D3C
N
Ir
N
S
Si
2
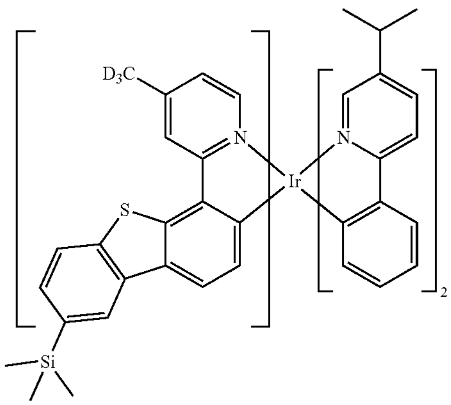
D3C
N
Ir
N
S
Si
2
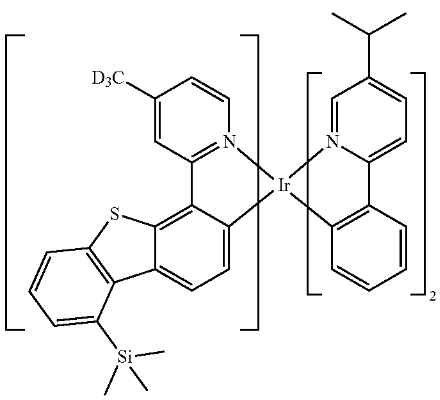
D3C
N
Ir
N
S
Si
2
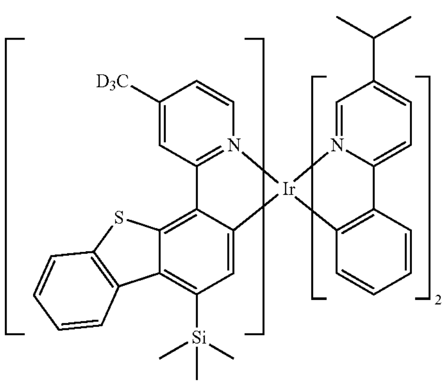
D3C
N
Ir
N
S
Si
2
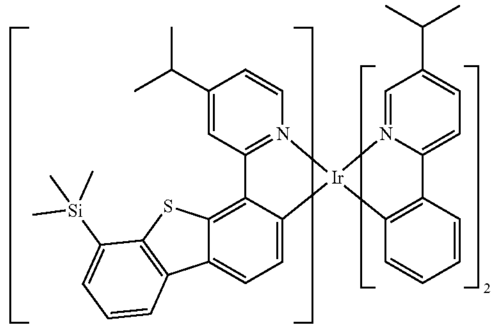
N
Ir
N
Si
S
2
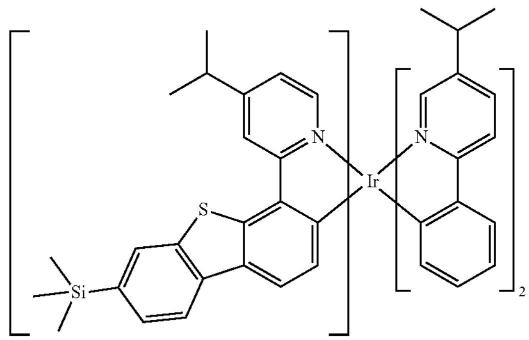
N
Ir
N
S
Si
2
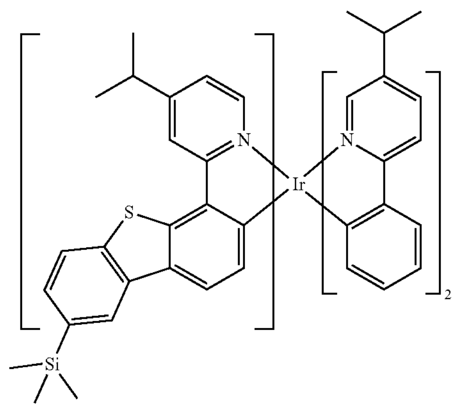
N
Ir
N
S
Si
2
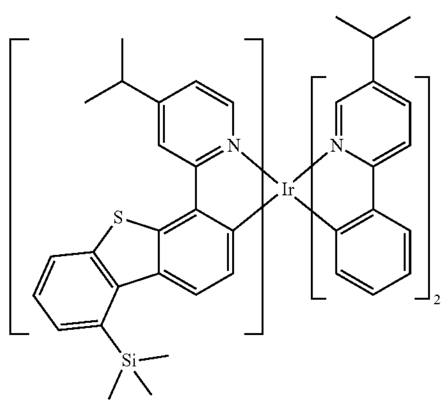
N
Ir
N
S
Si
2

-continued
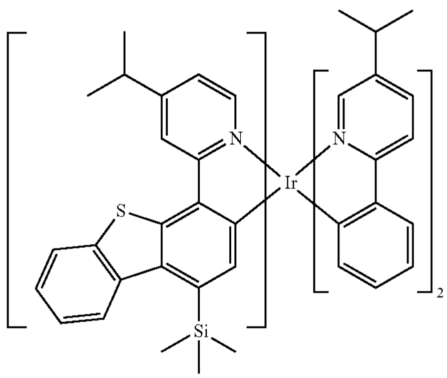
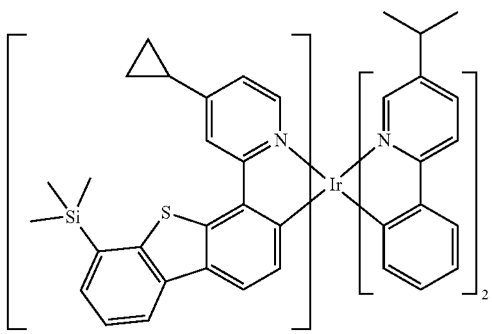
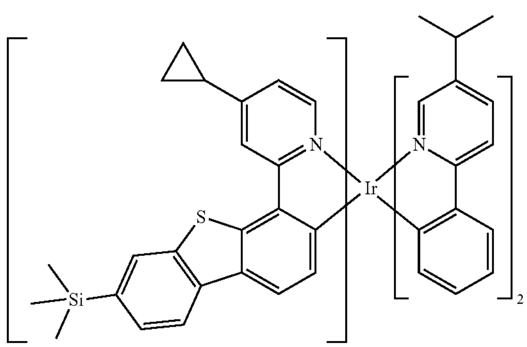
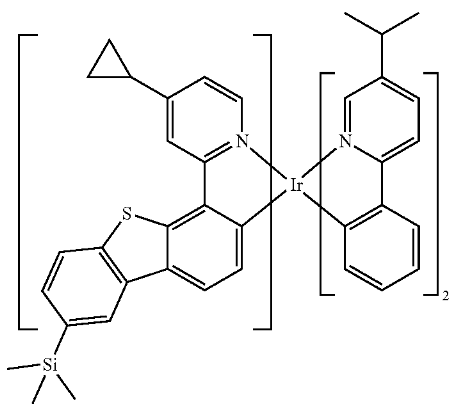
-continued
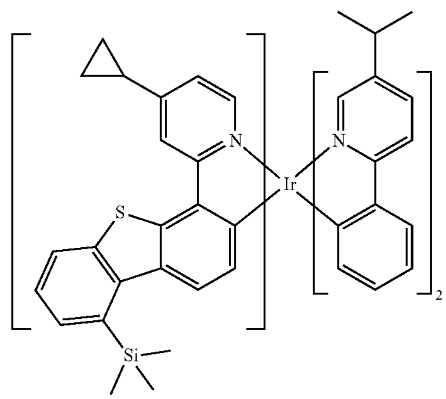
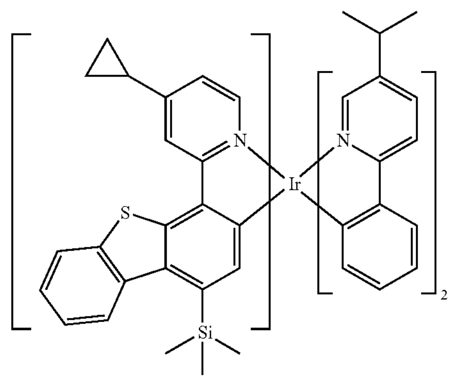
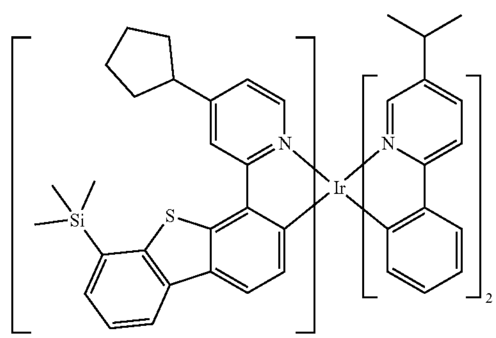
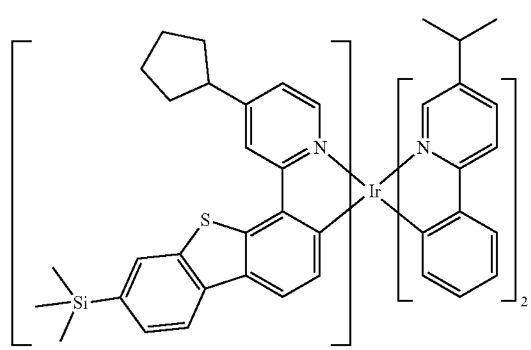

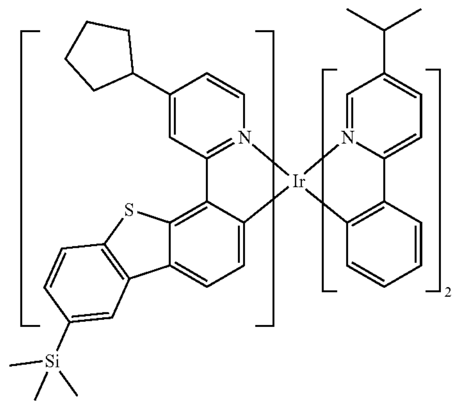
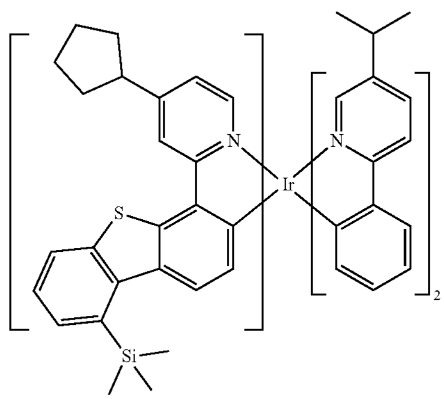
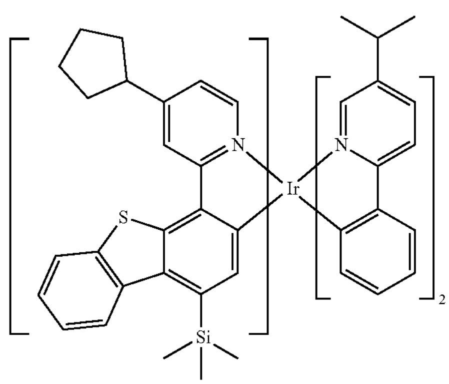
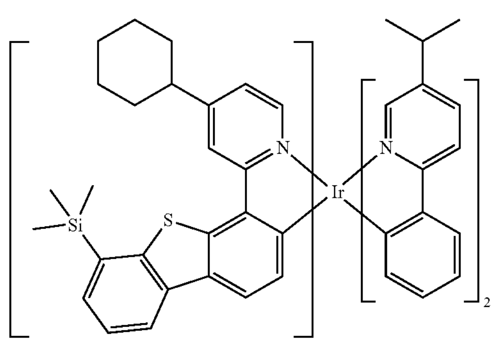
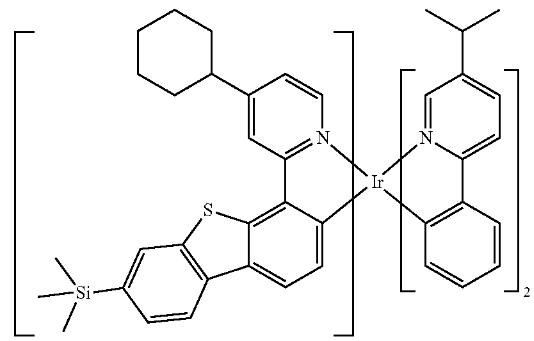
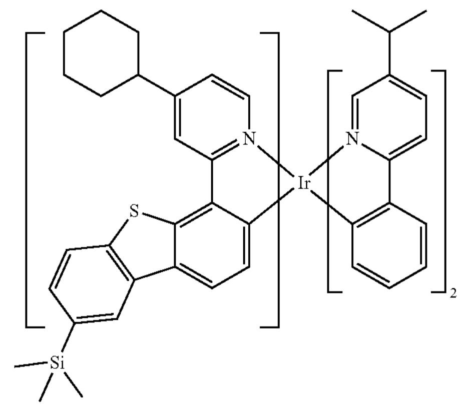
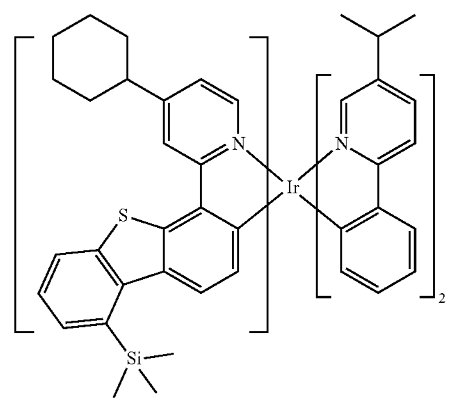
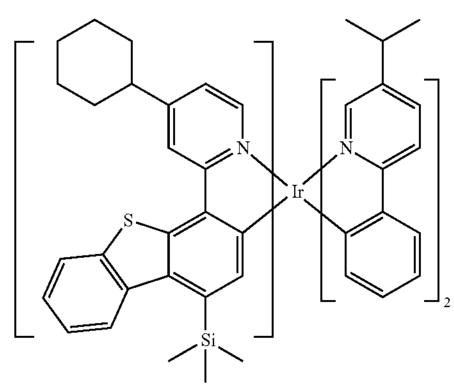

-continued
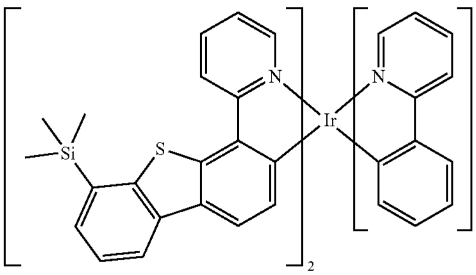
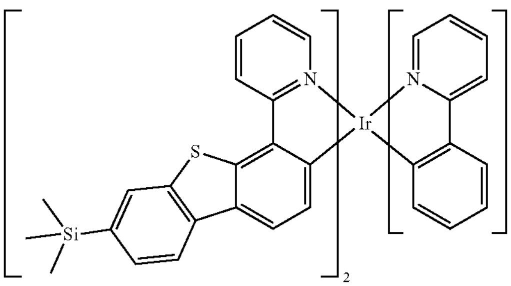
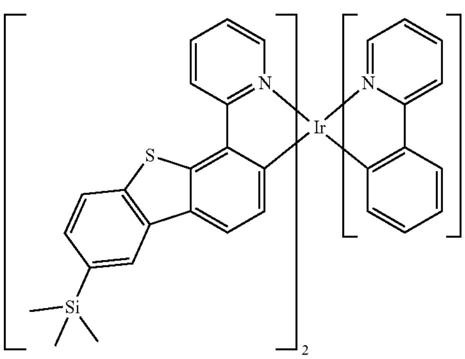
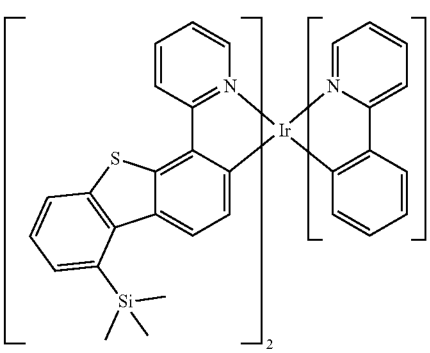
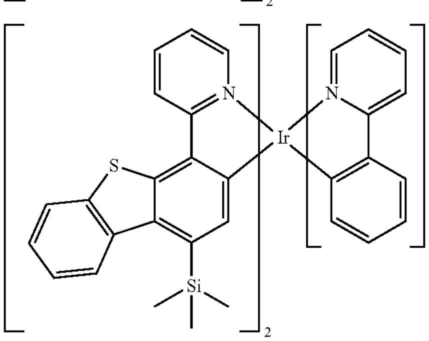
-continued
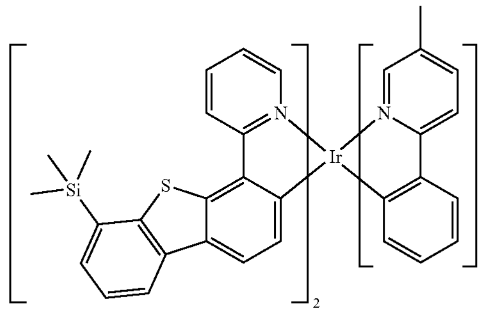
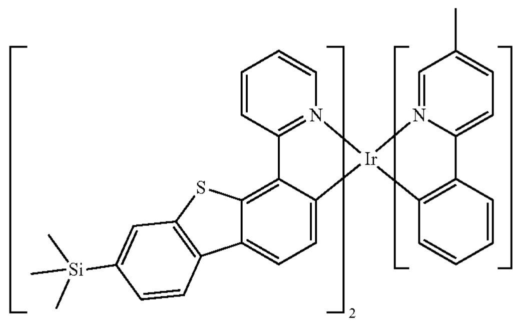
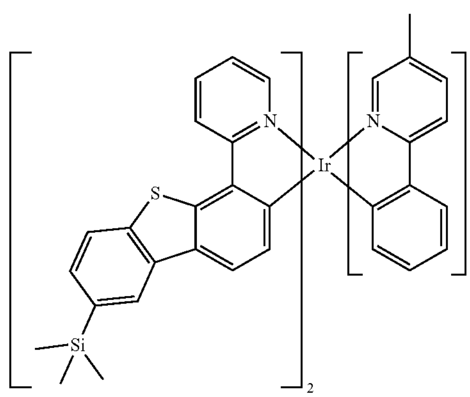
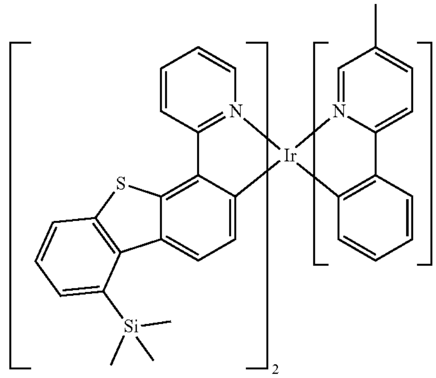

-continued
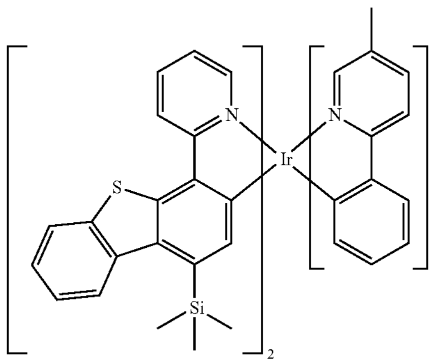
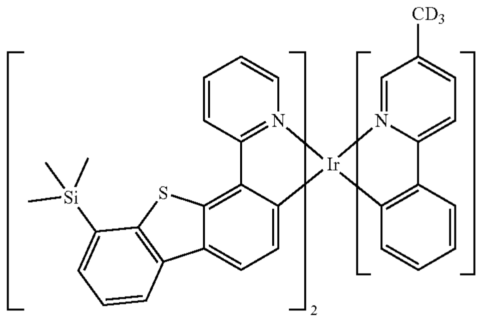
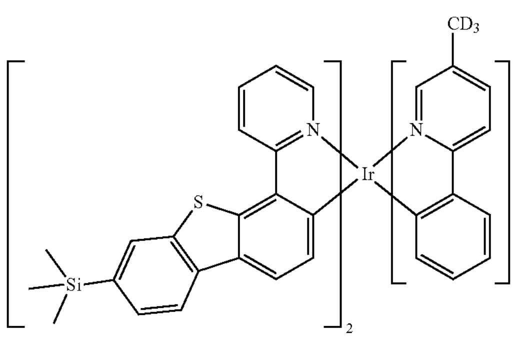
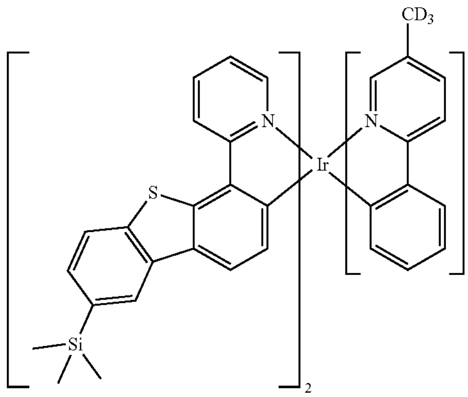
-continued
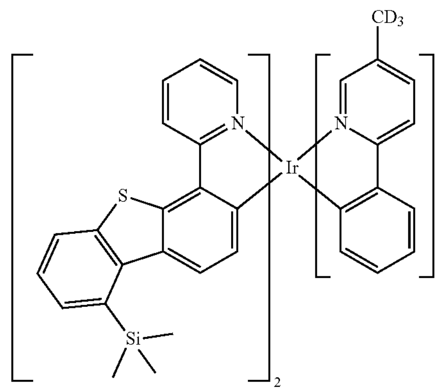
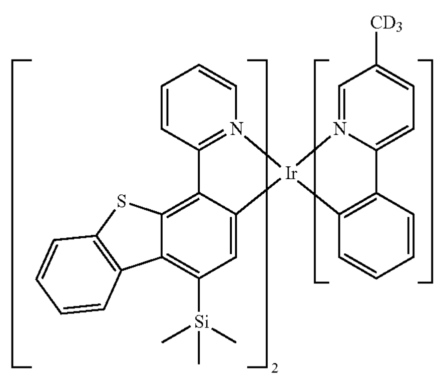
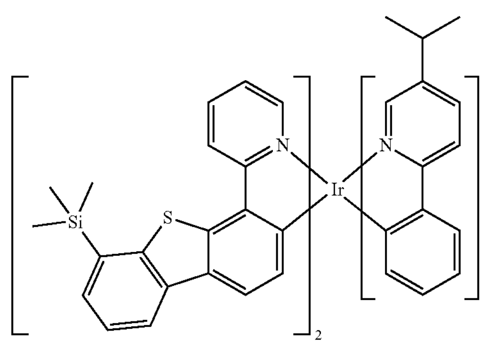
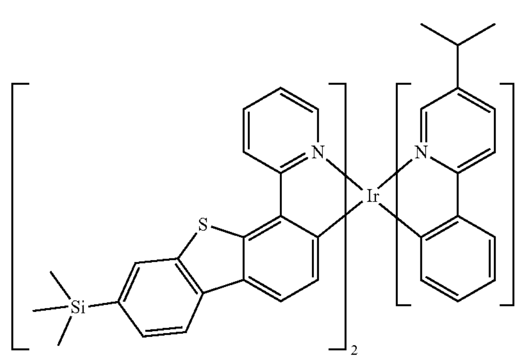

-continued
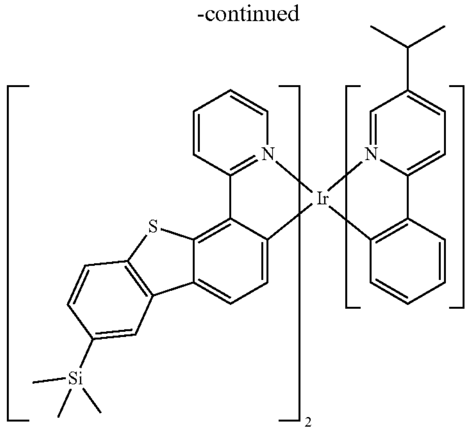
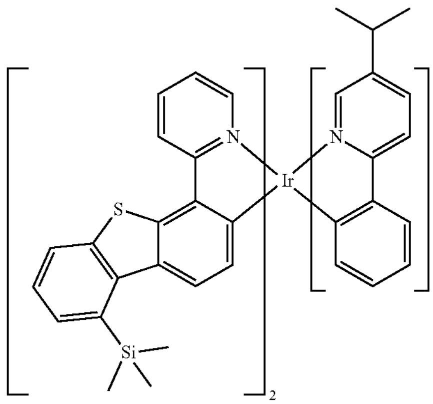
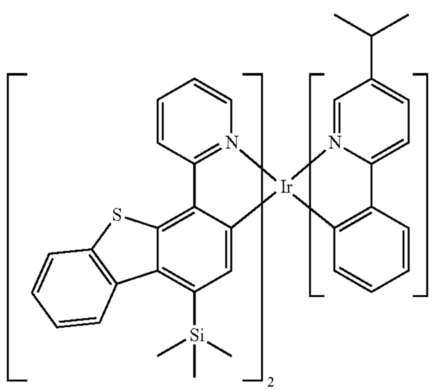
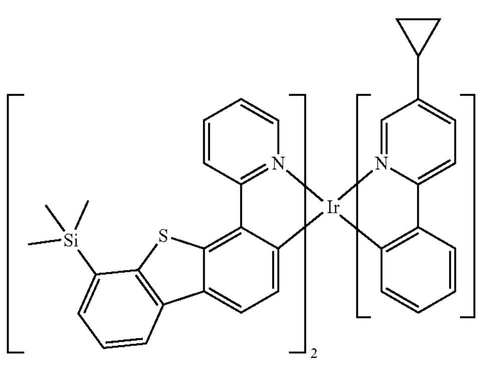
-continued
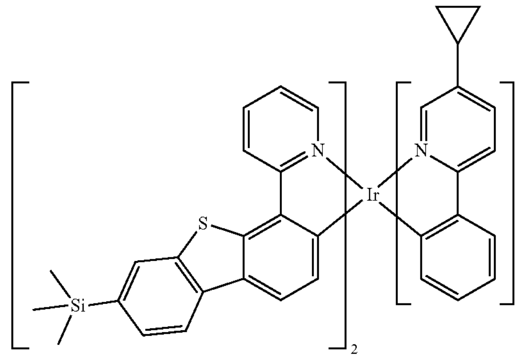
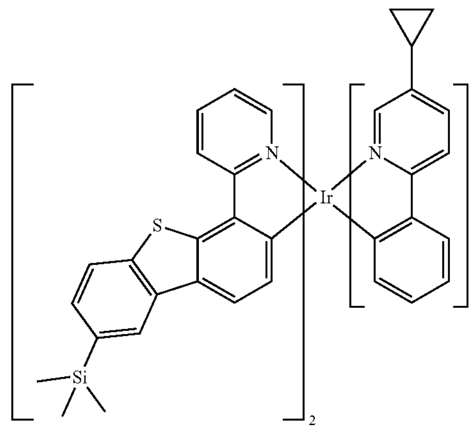
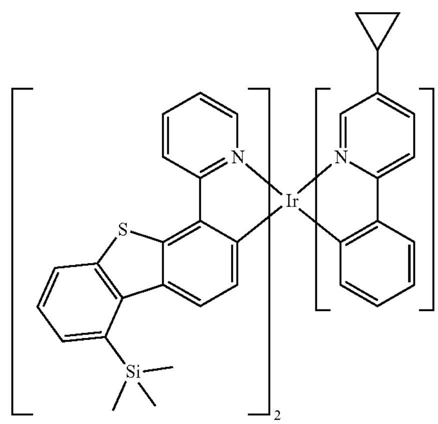
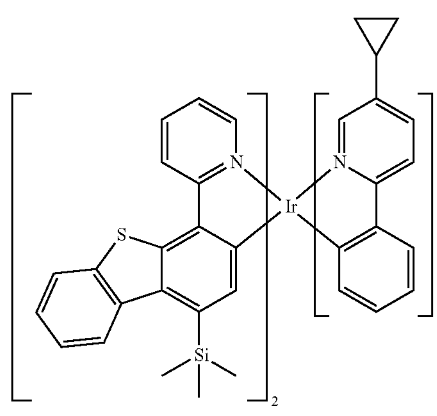

-continued
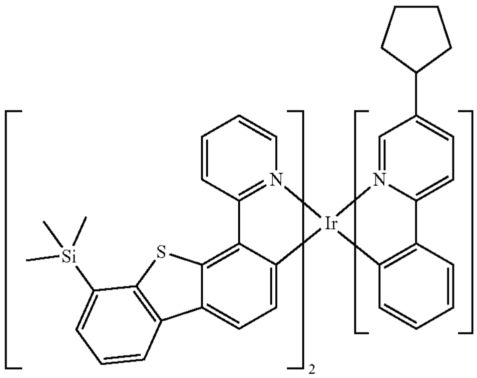
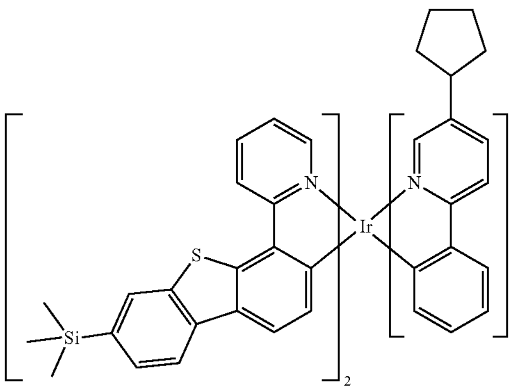
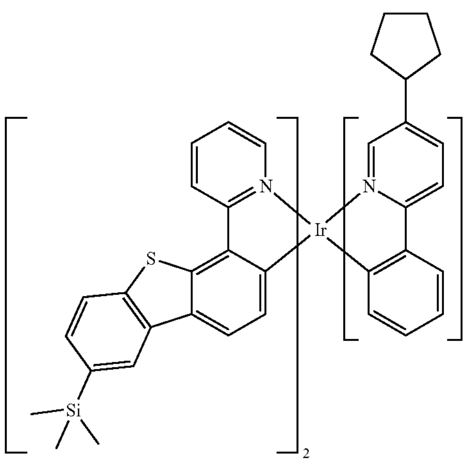
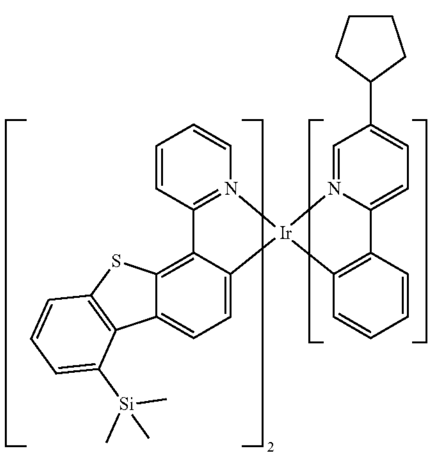
-continued
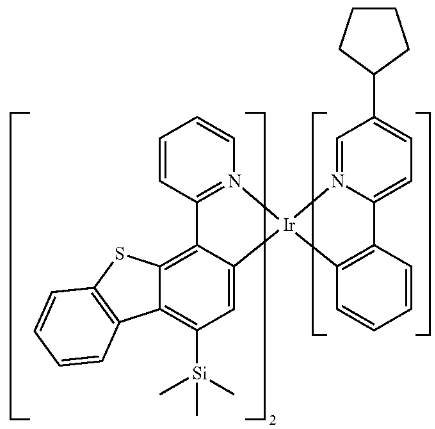
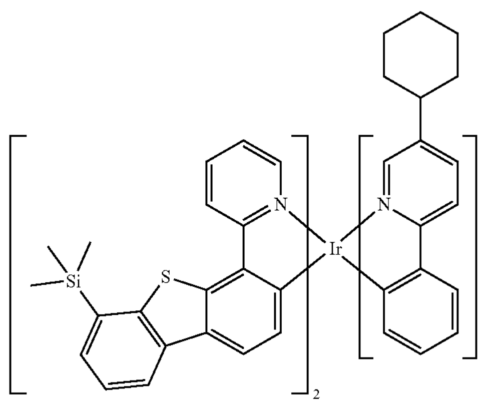
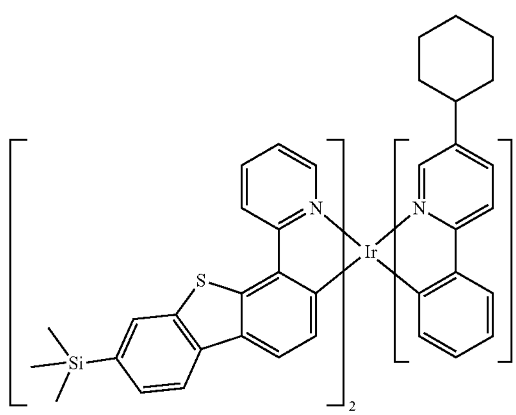

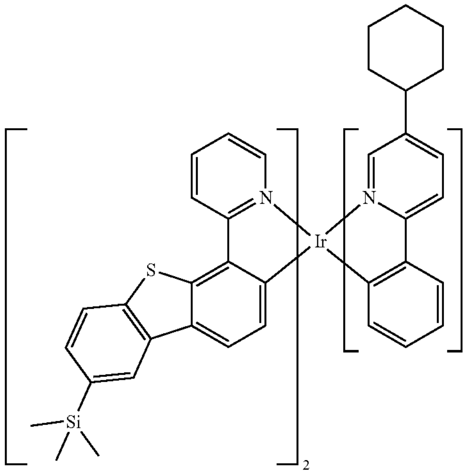
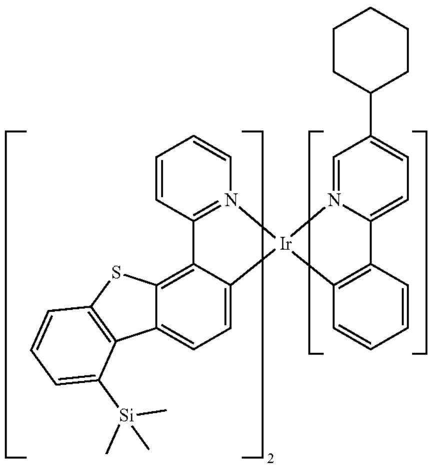
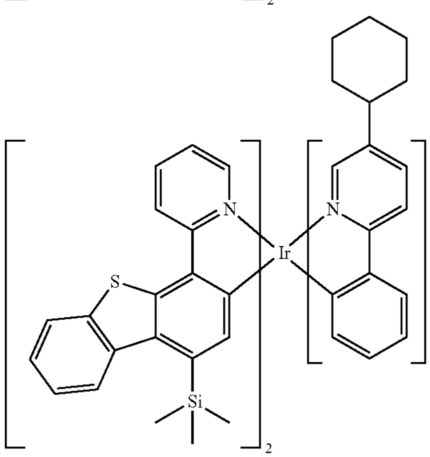
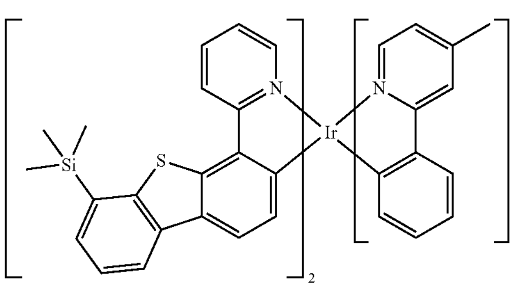
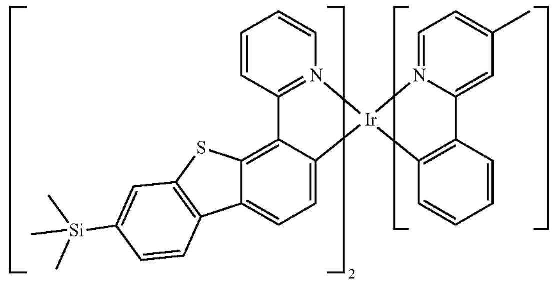
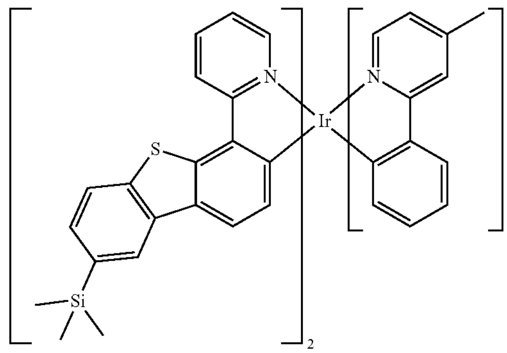
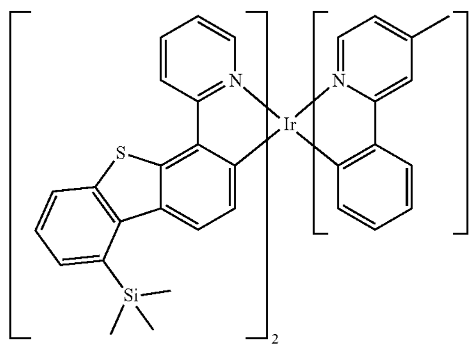
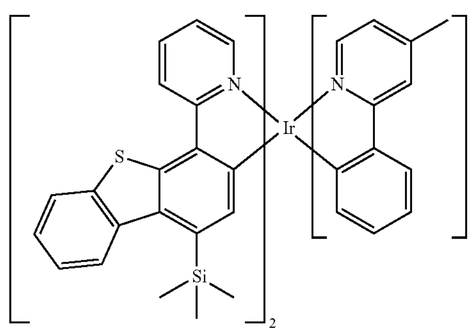
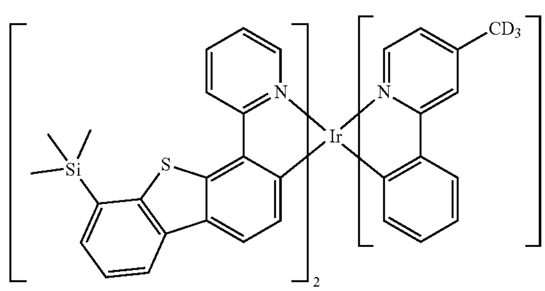

-continued
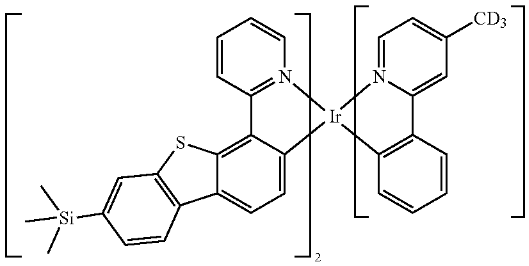
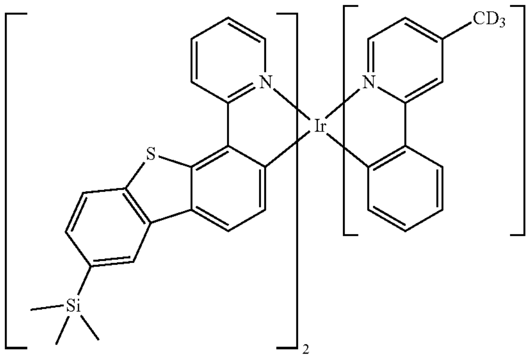
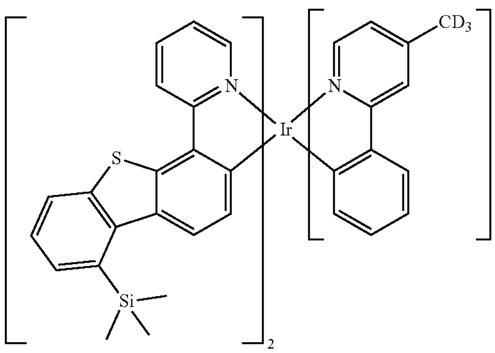
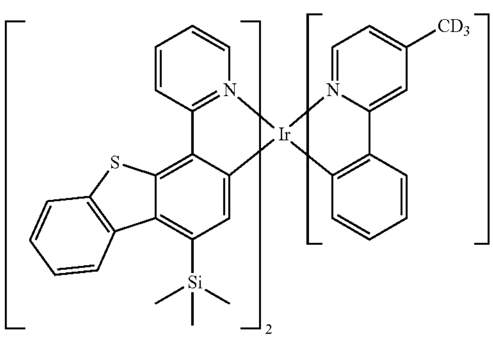
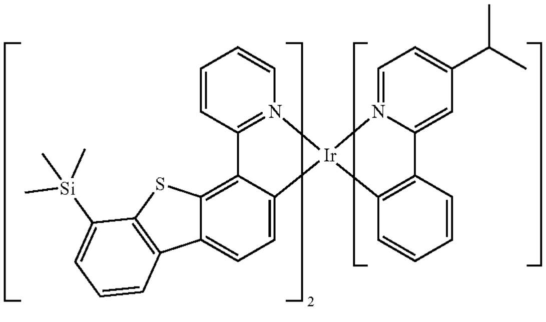
-continued
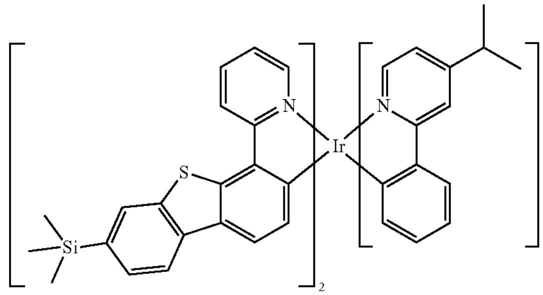
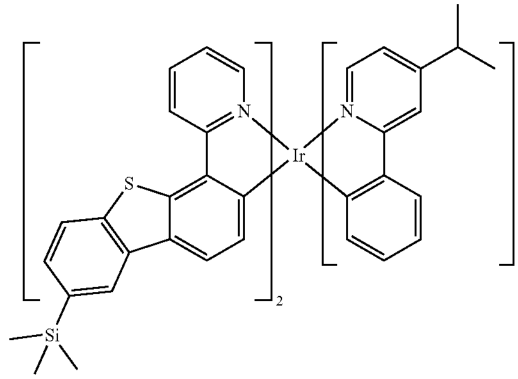
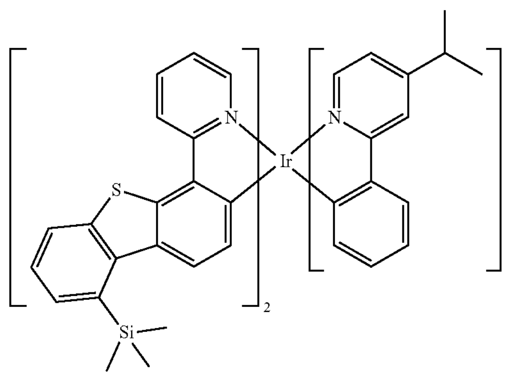
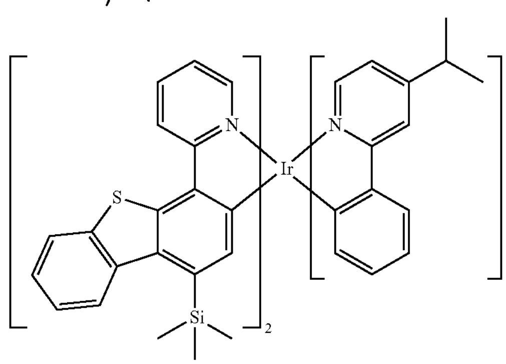
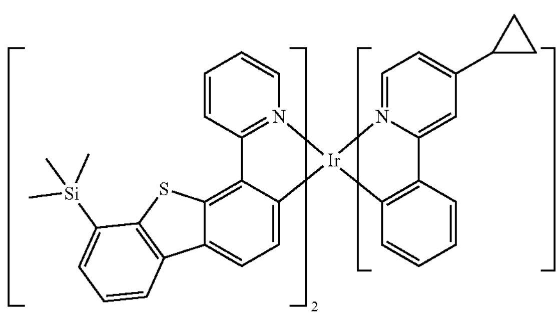

-continued
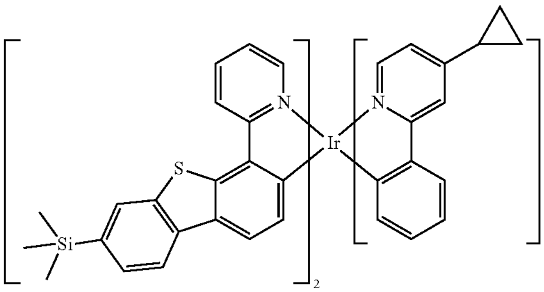
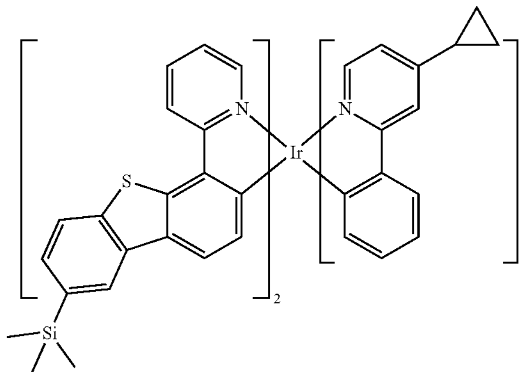
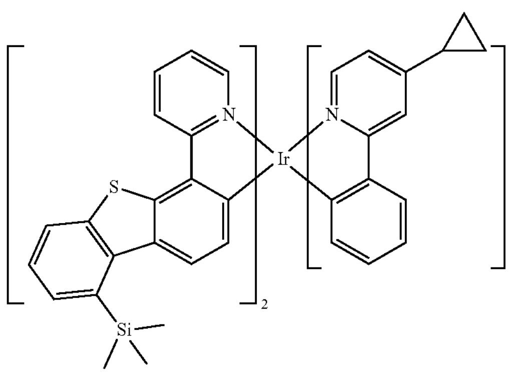
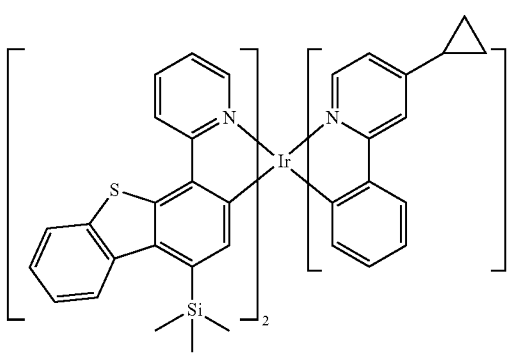
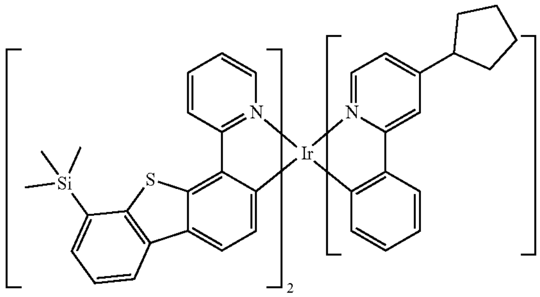
-continued
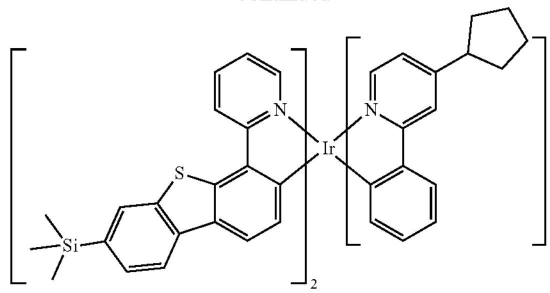
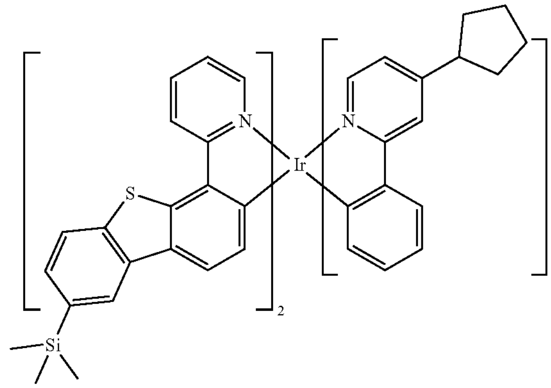
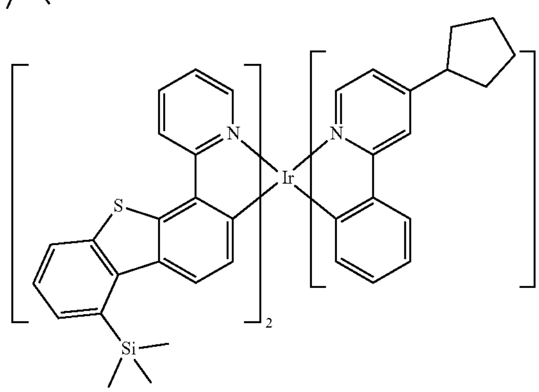
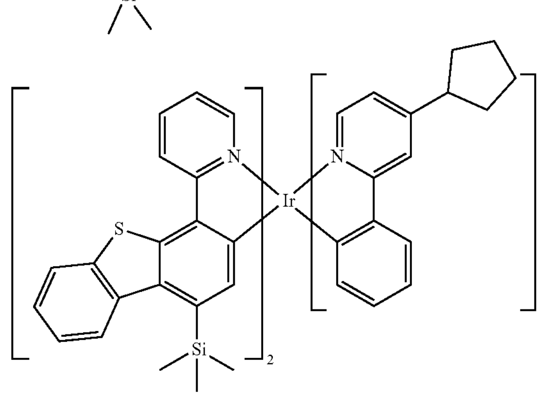
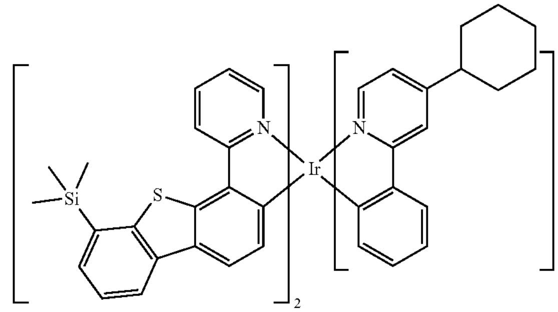

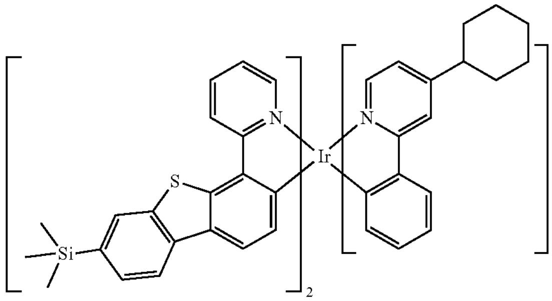
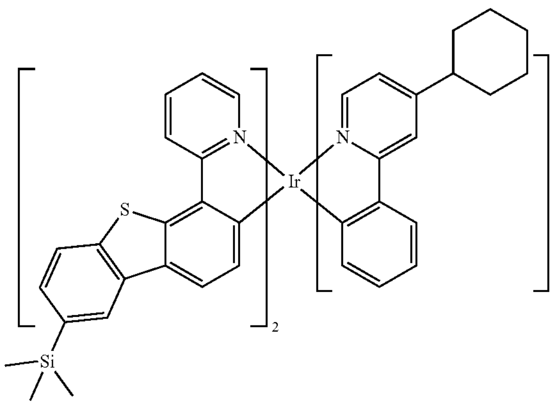
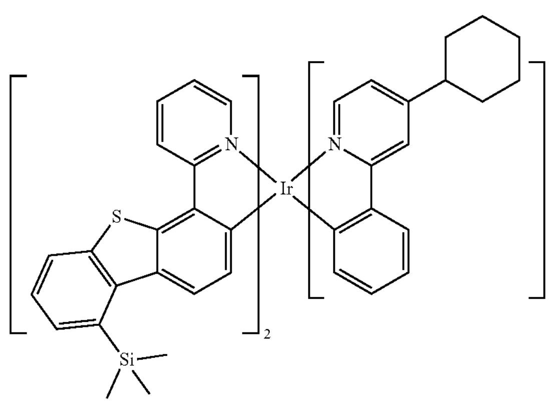
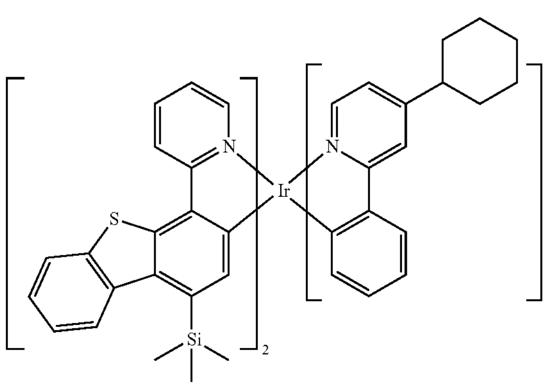
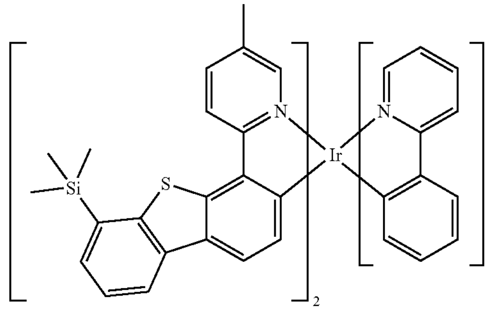
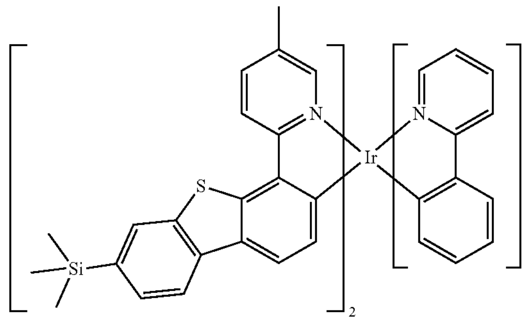
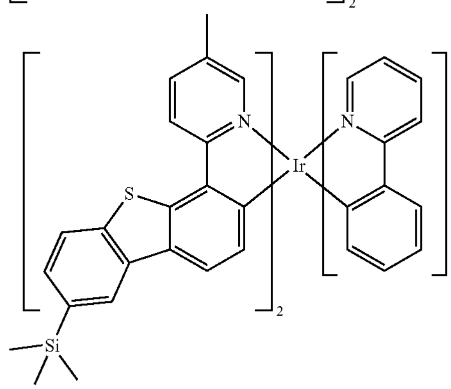
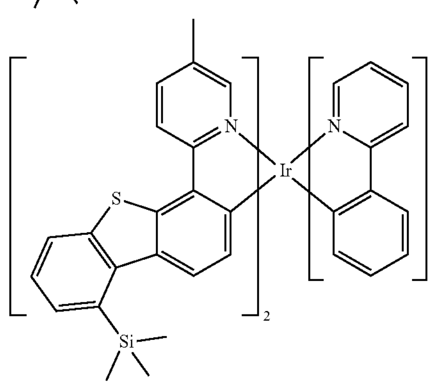
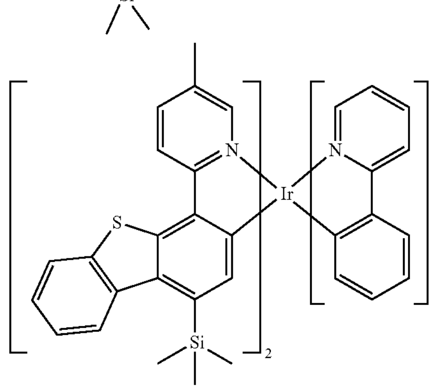

-continued
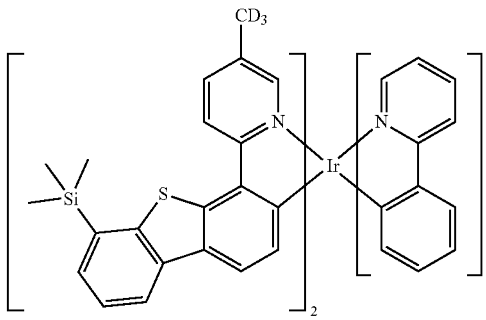
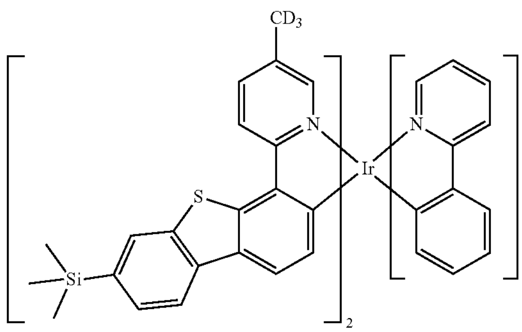
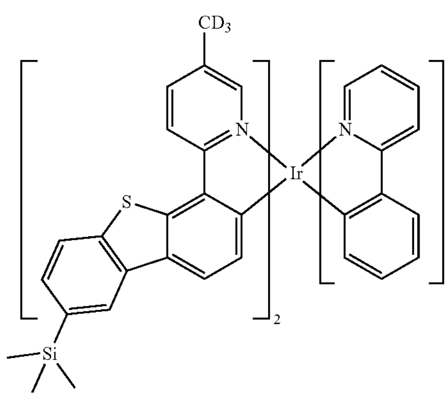
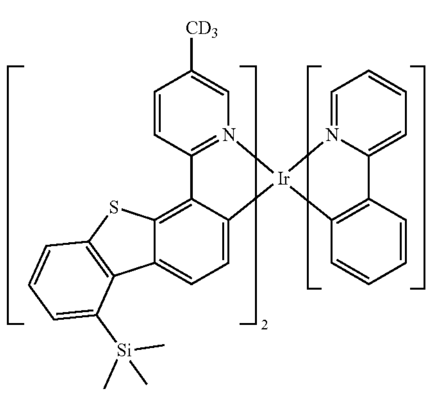
-continued
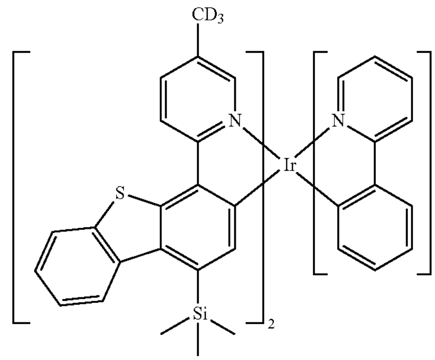
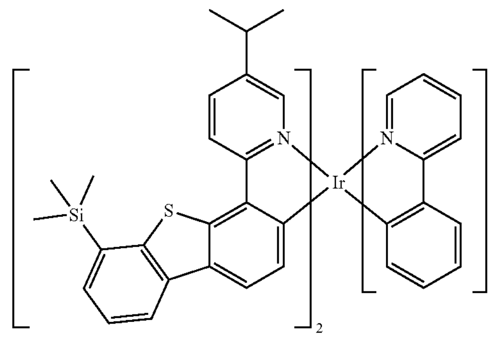
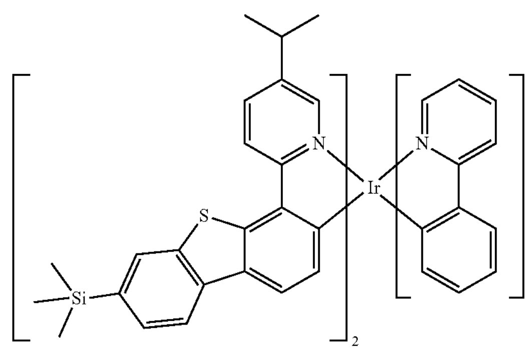
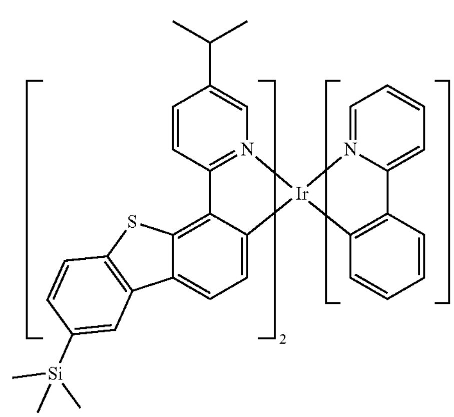

-continued
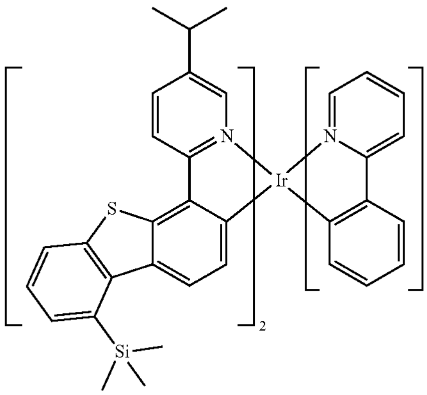
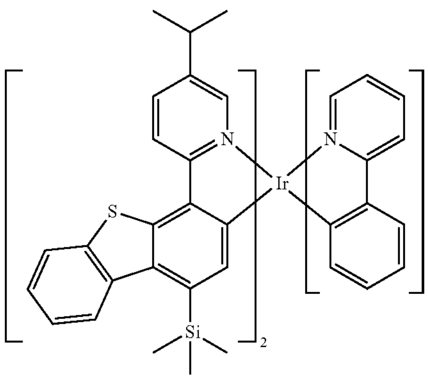
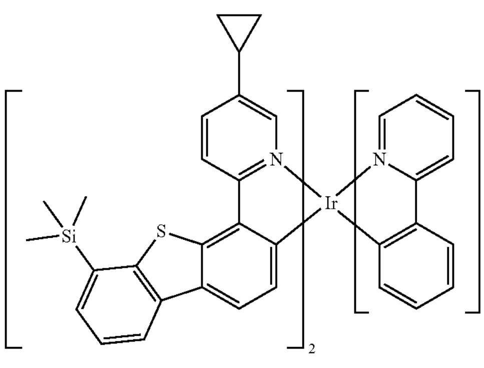
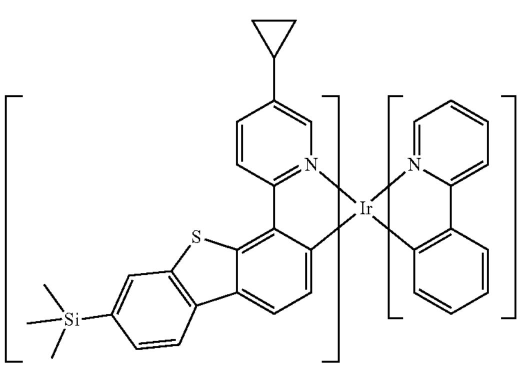
-continued
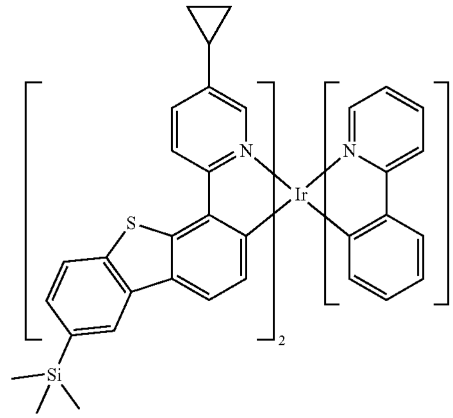
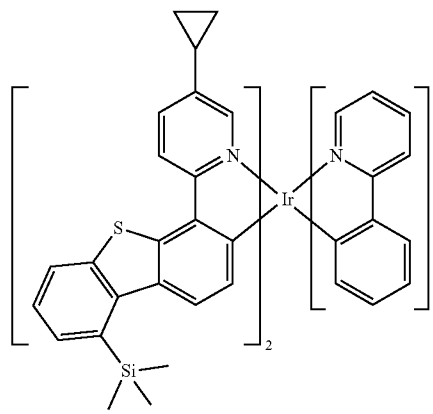
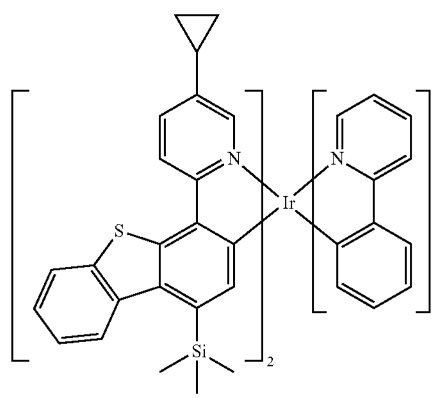
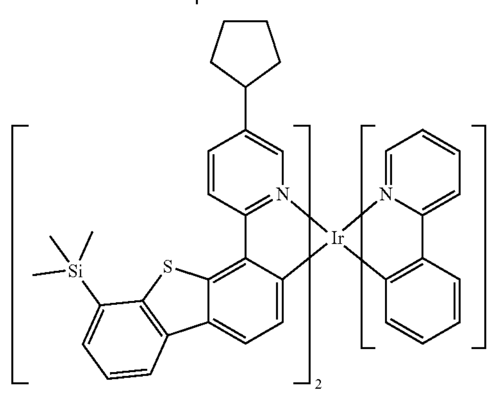

-continued
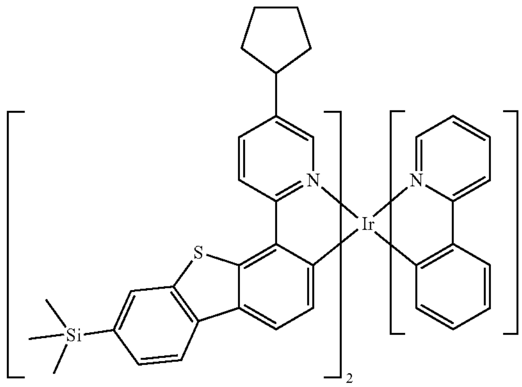
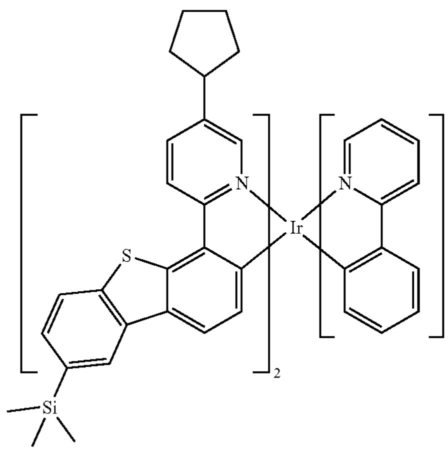
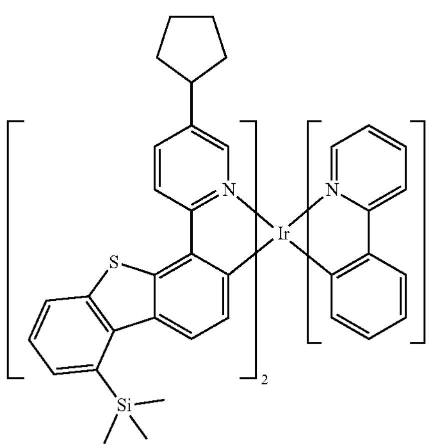
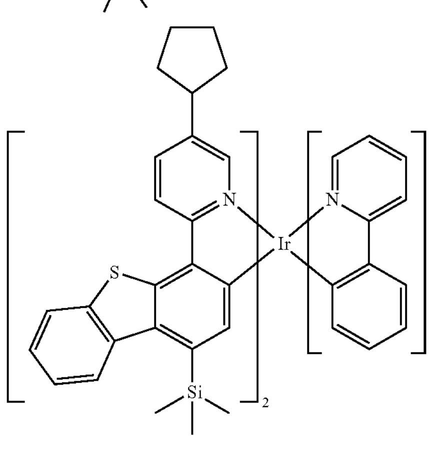
-continued
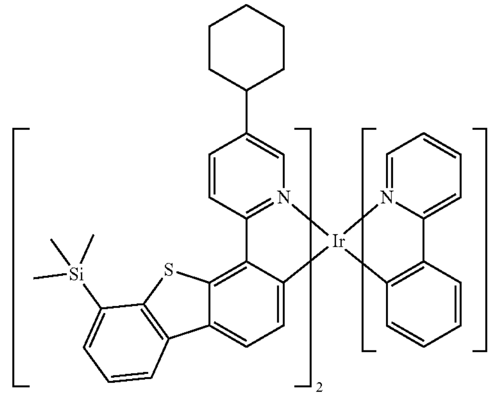
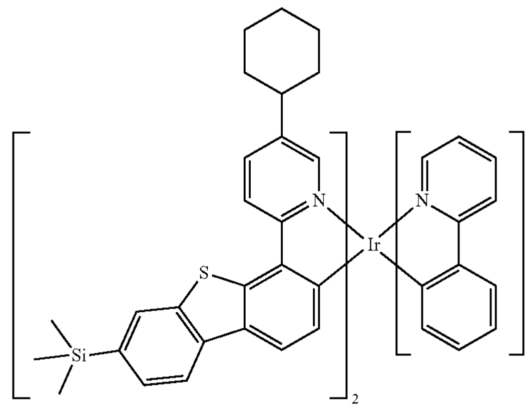
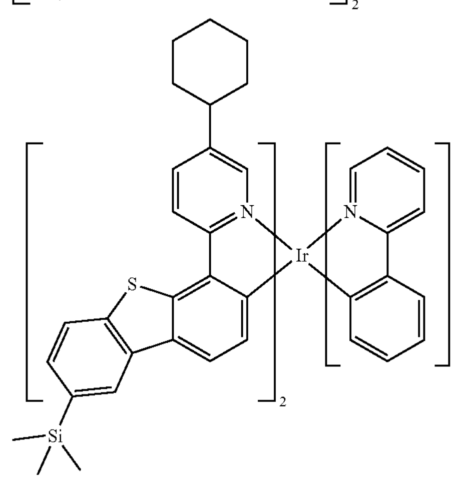
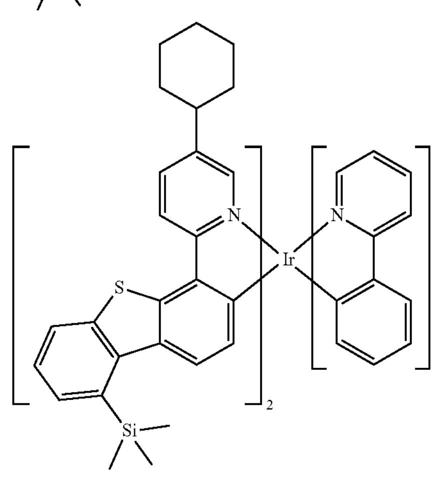

-continued
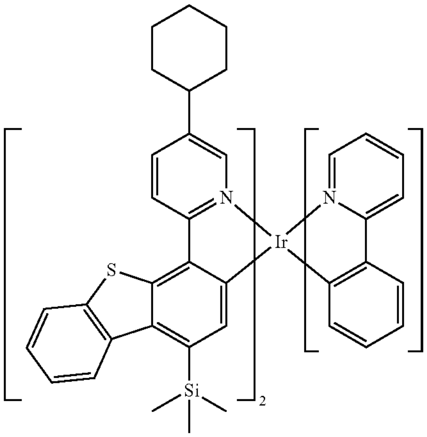
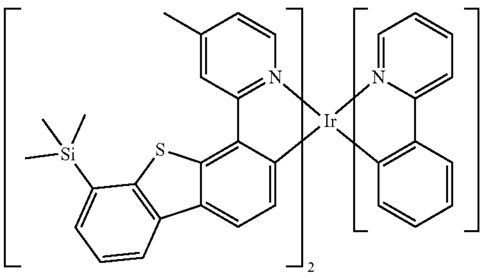
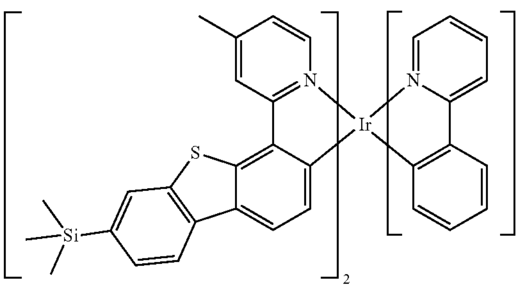
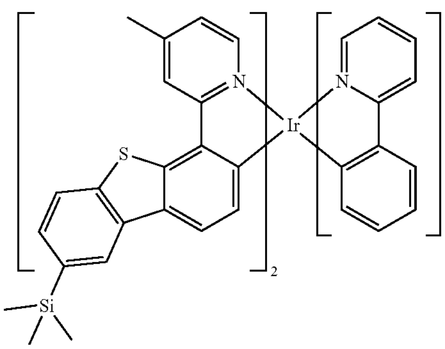
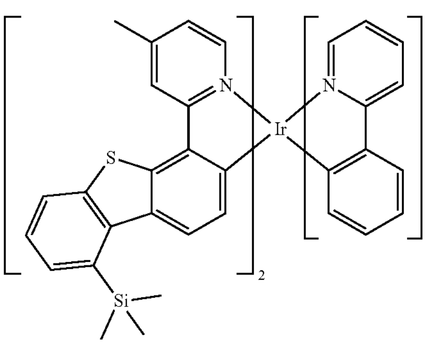
-continued
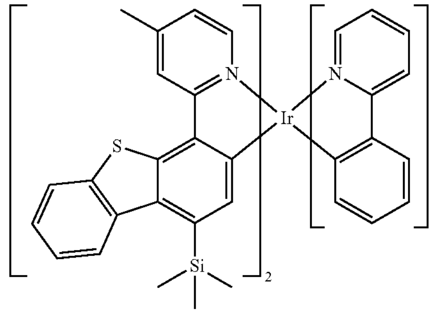
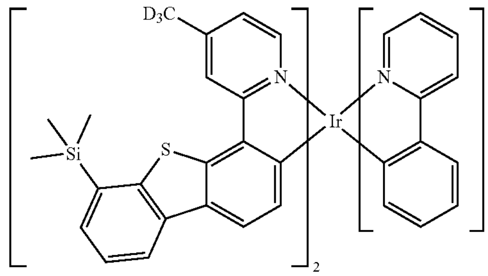
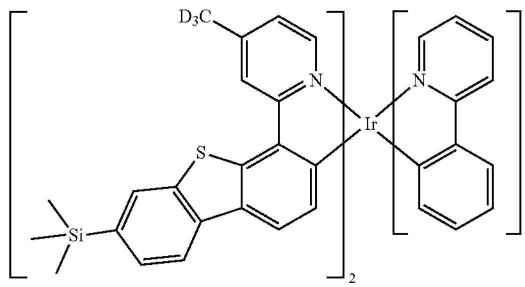
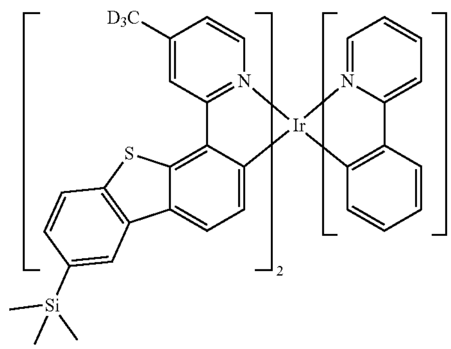
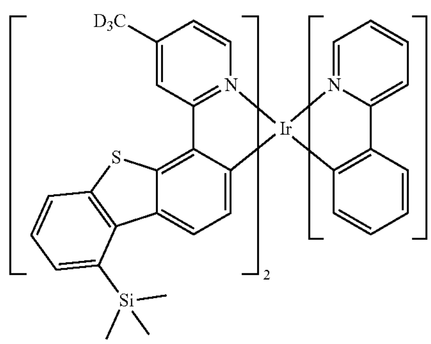

-continued
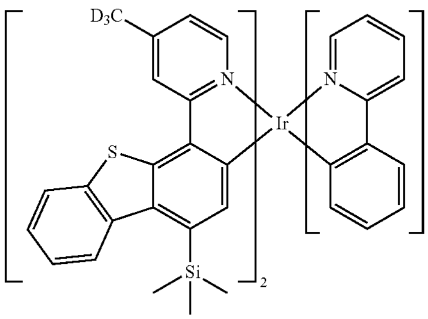
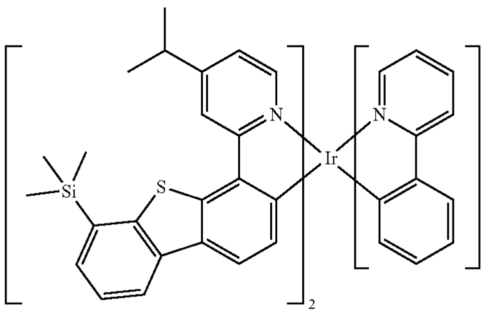
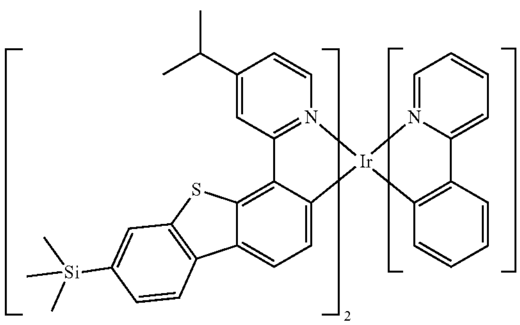
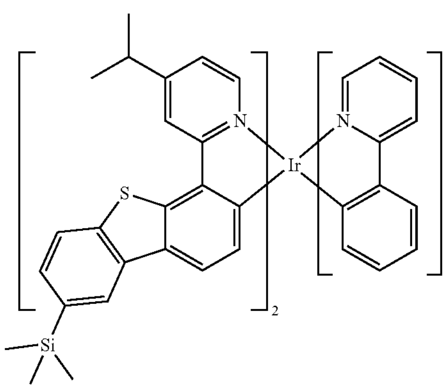
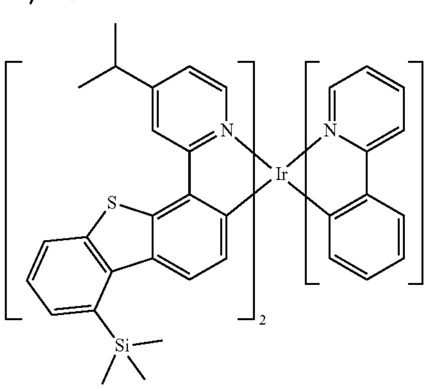
-continued
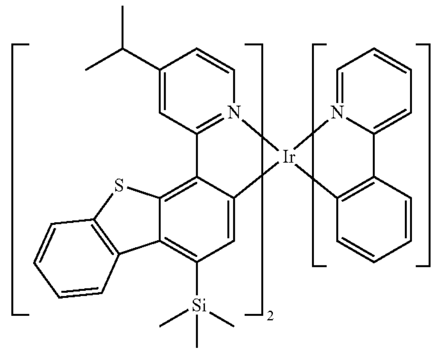
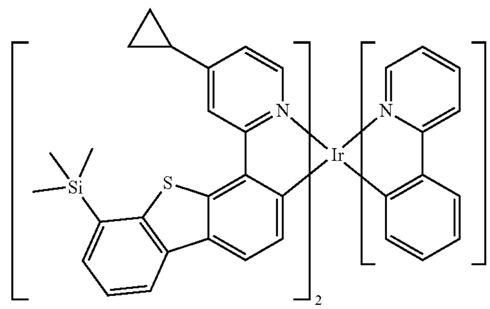
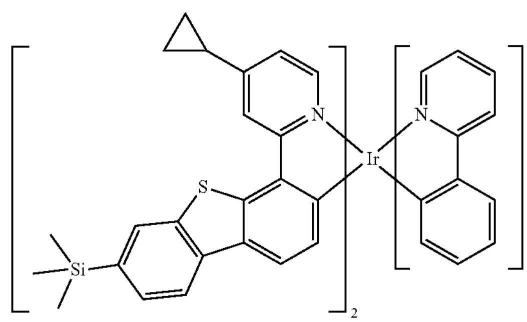
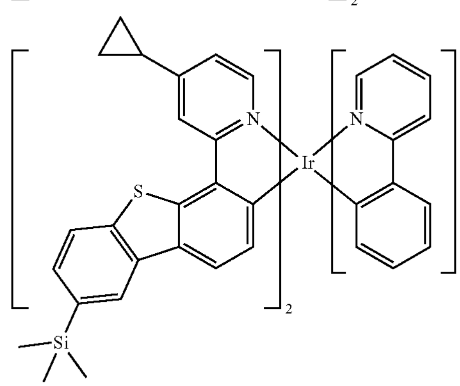
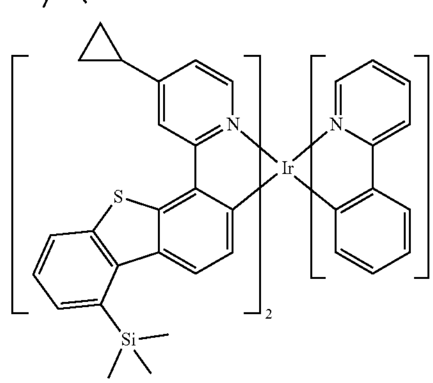

-continued
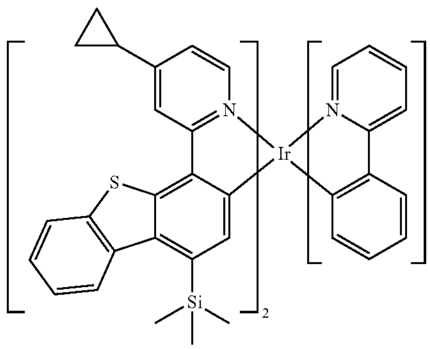
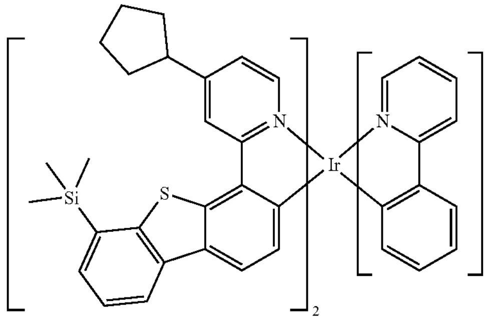
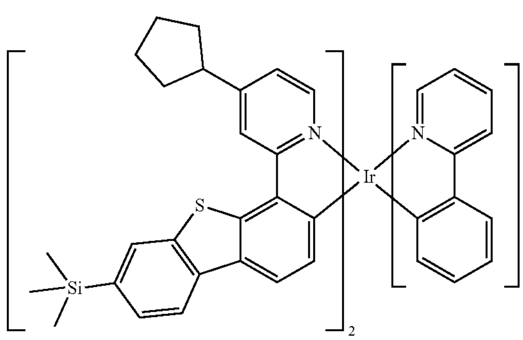
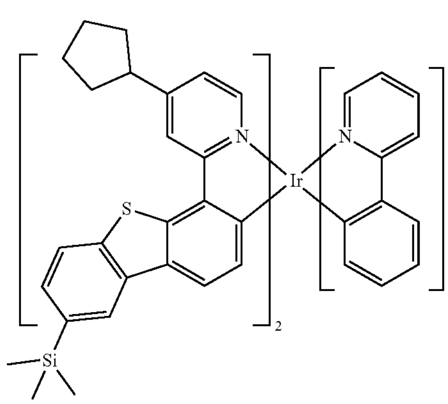
-continued
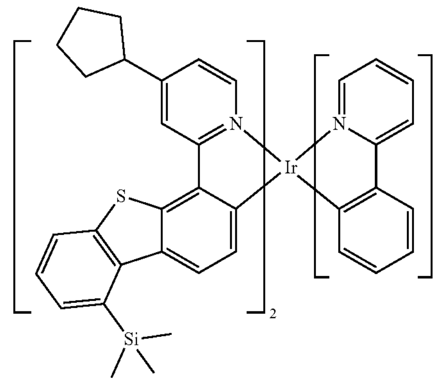
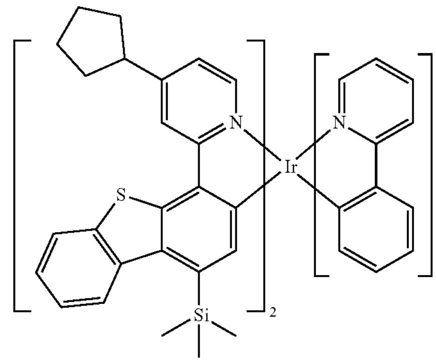
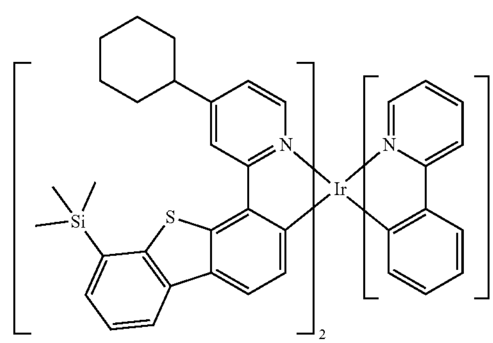
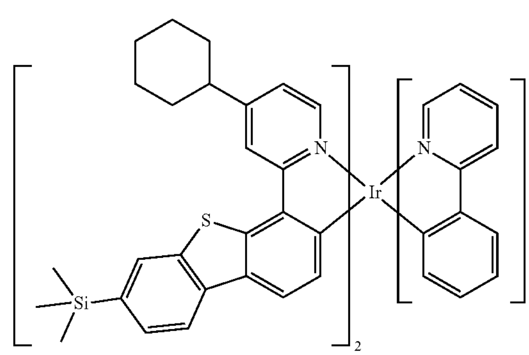

-continued
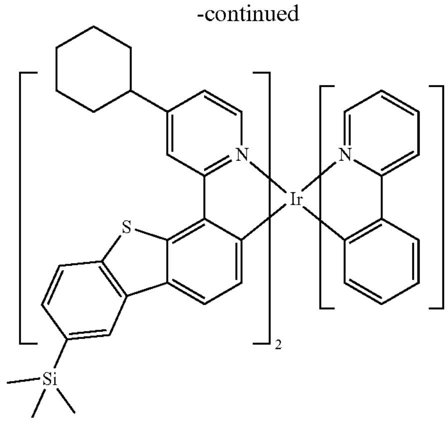
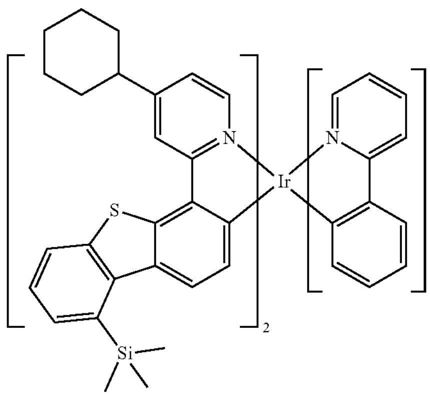
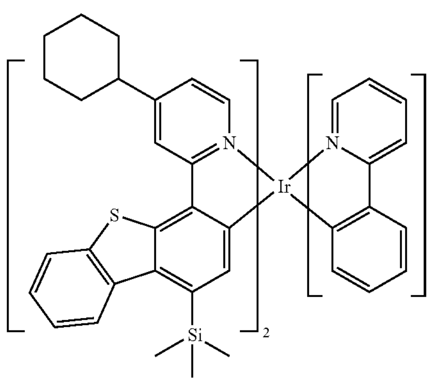
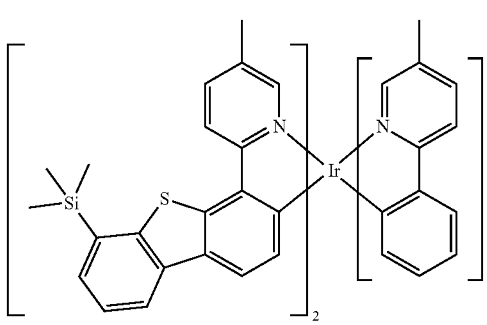
-continued
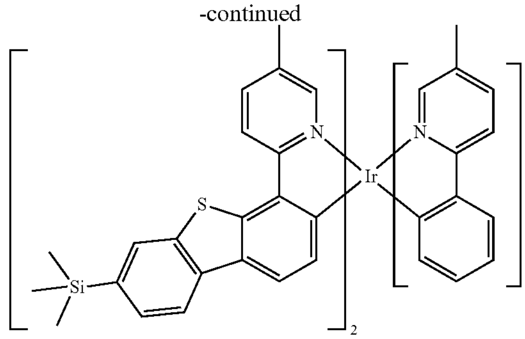
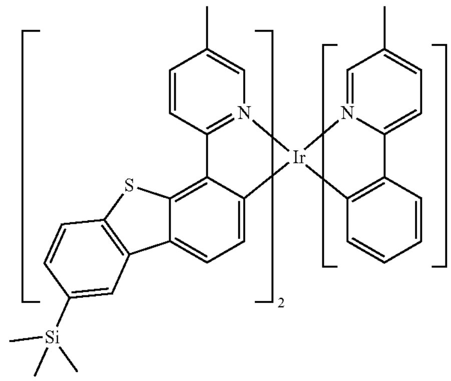
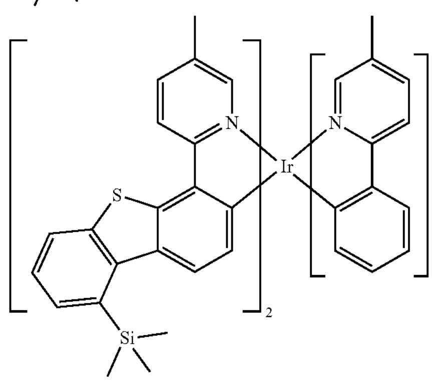
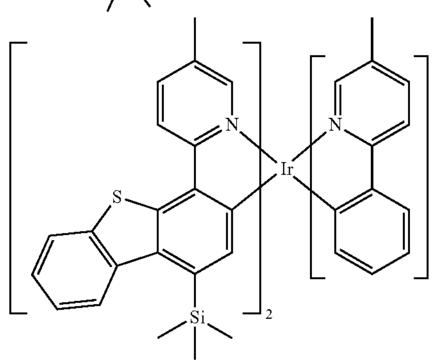
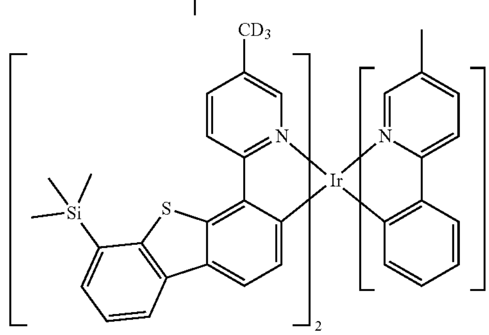

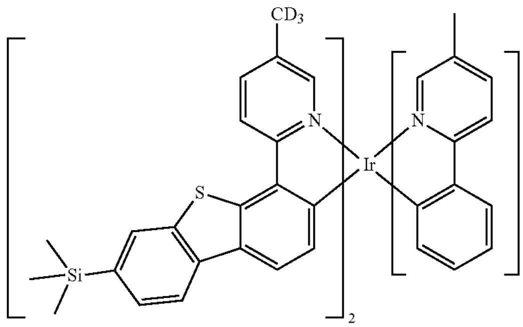
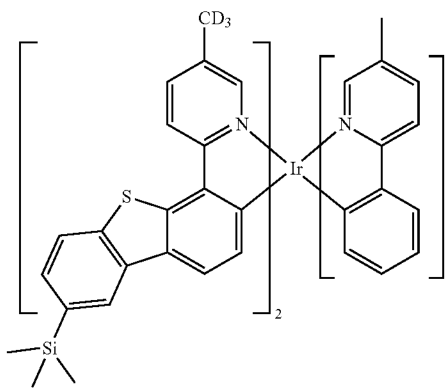
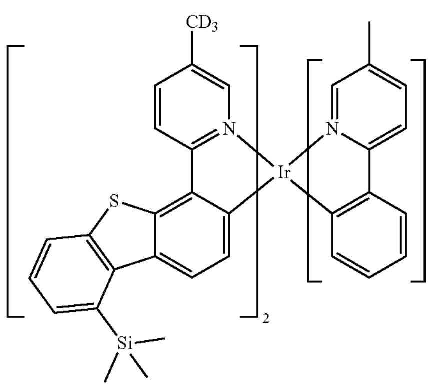
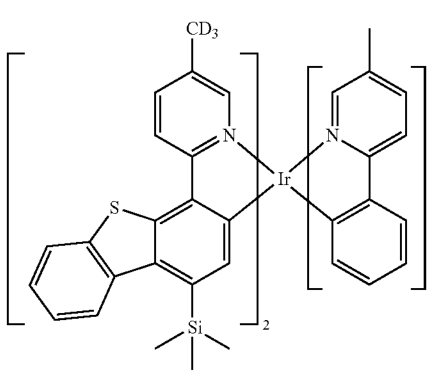
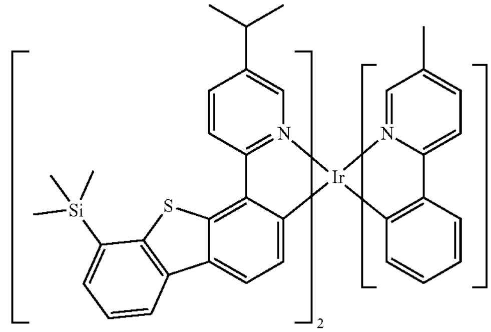
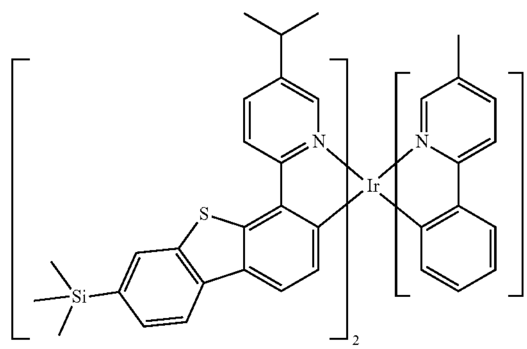
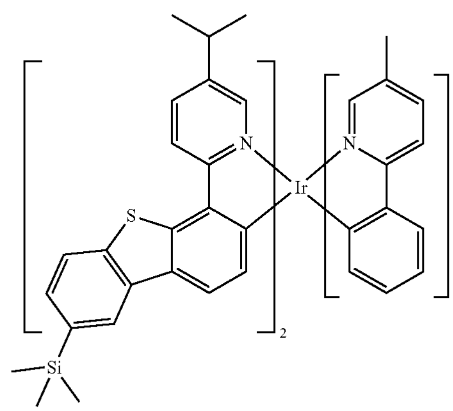
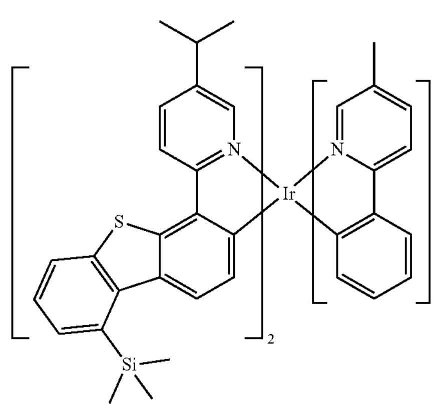

-continued
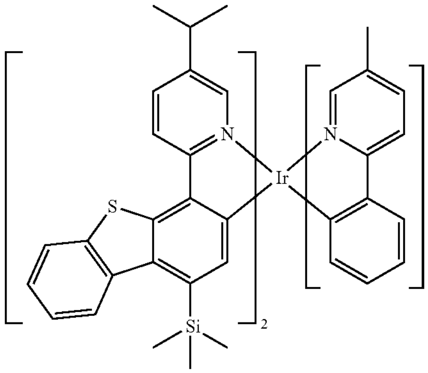
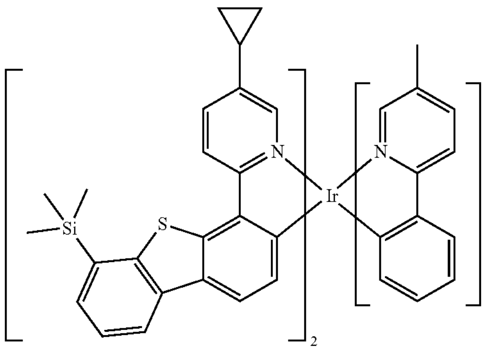
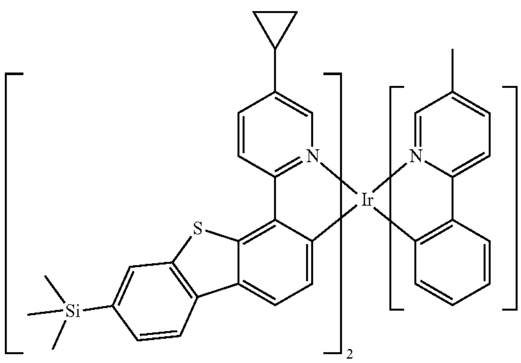
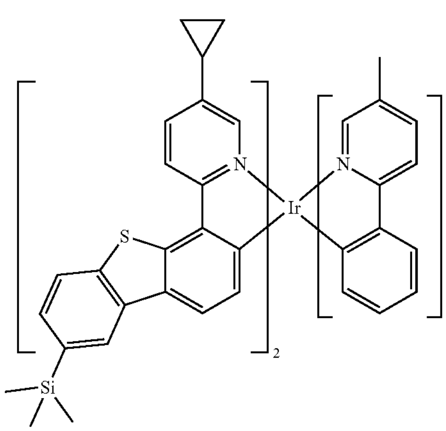
-continued
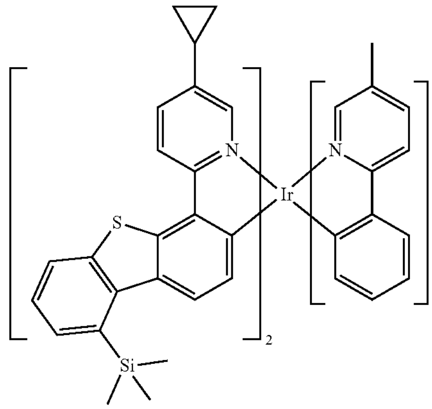
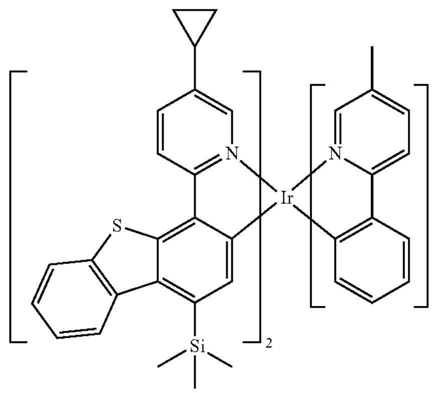
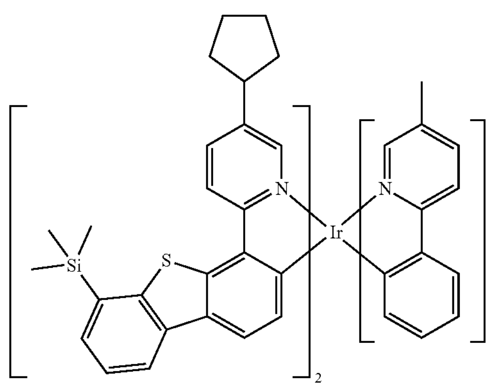
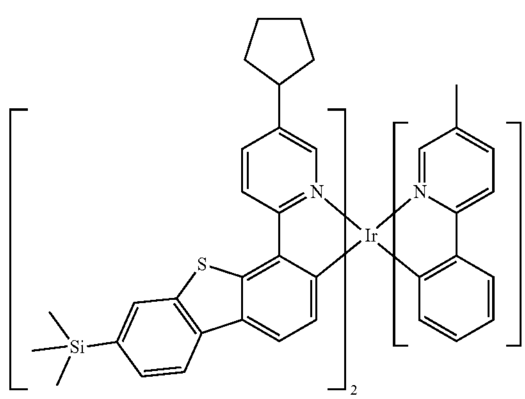

-continued
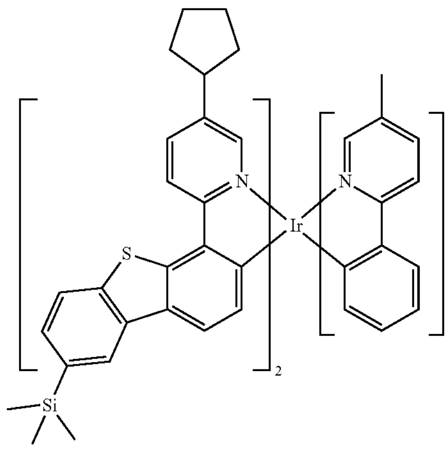
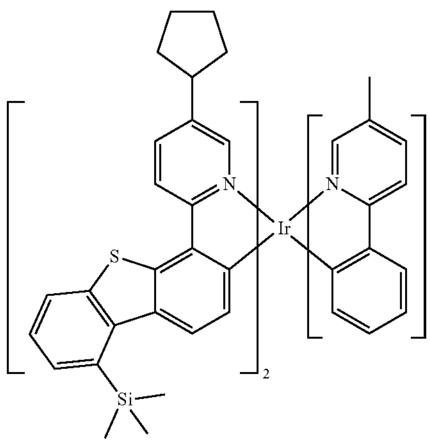
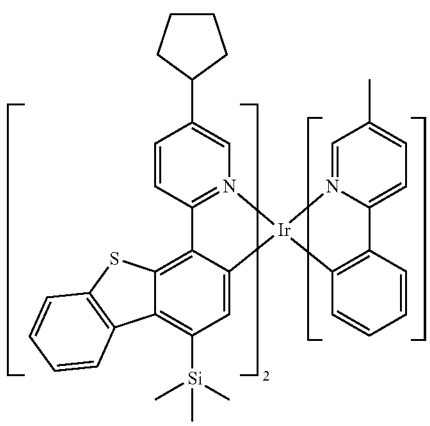
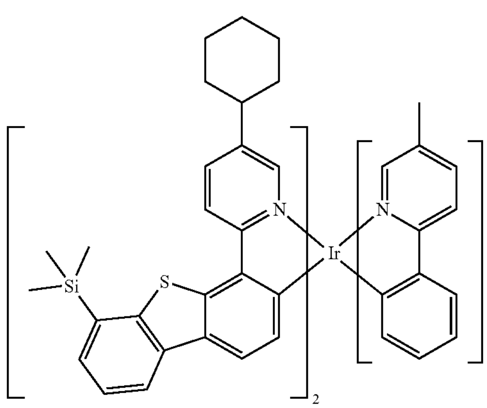
-continued
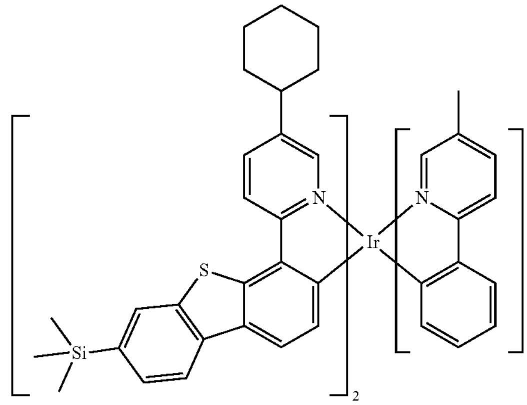
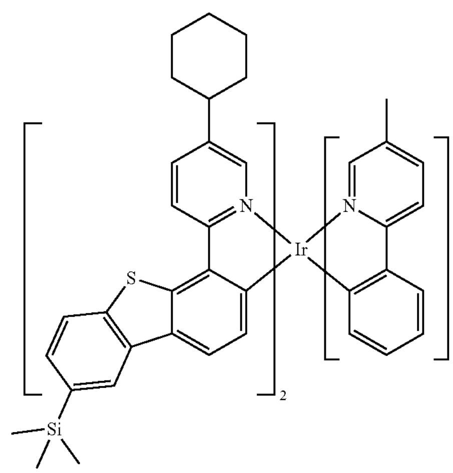
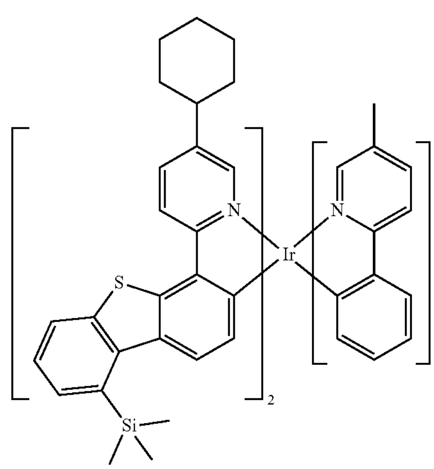

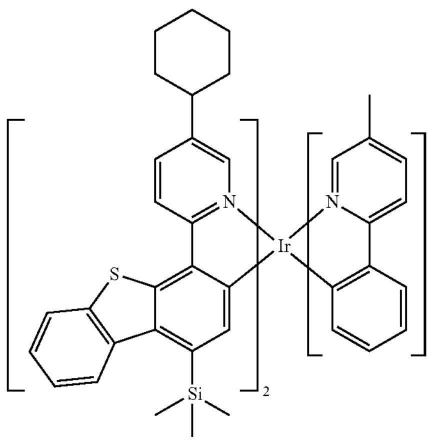
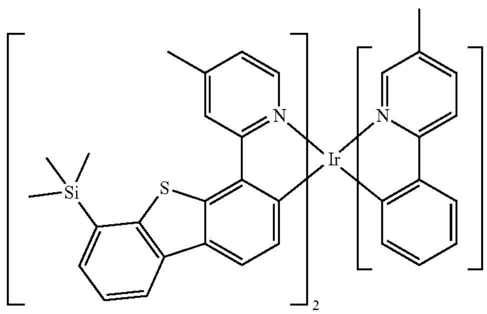
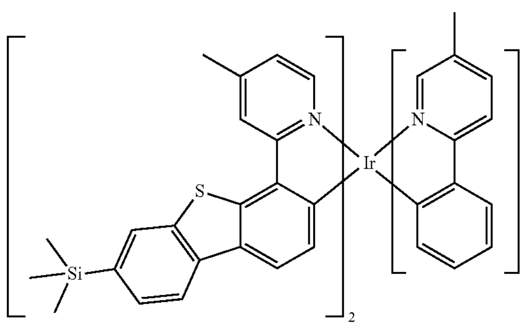
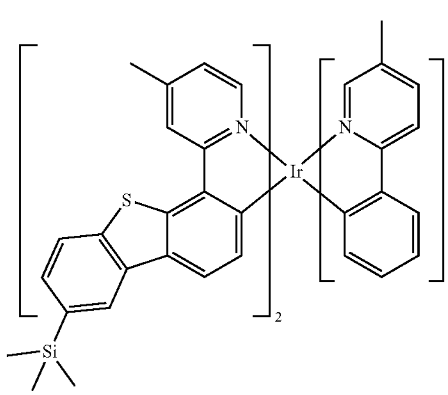
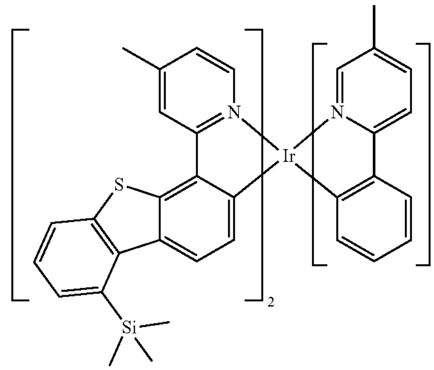
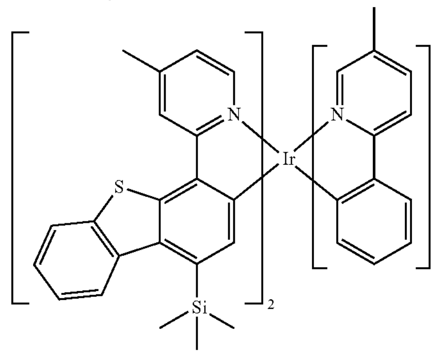
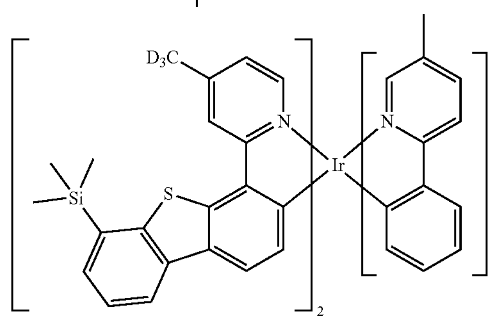
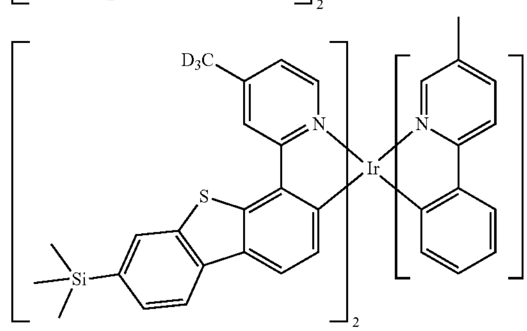
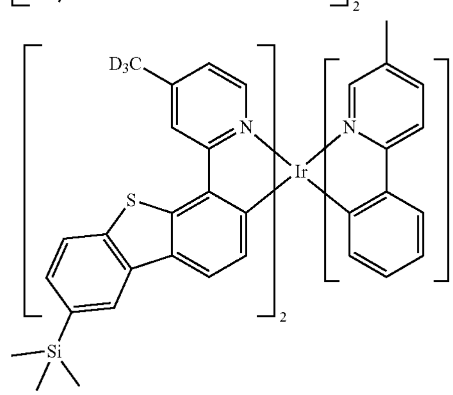

-continued
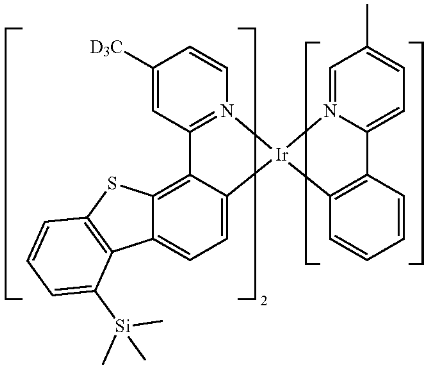
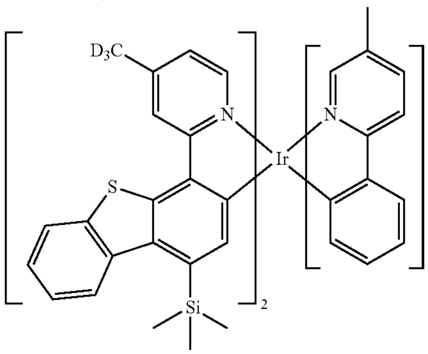
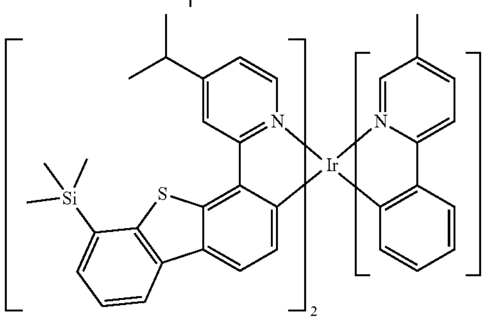
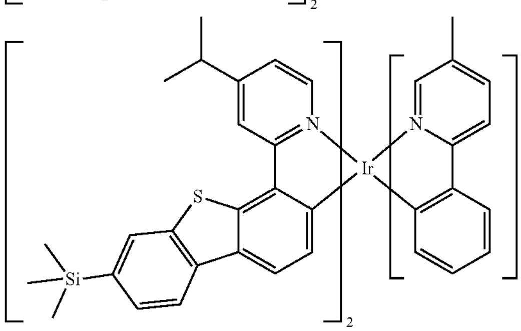
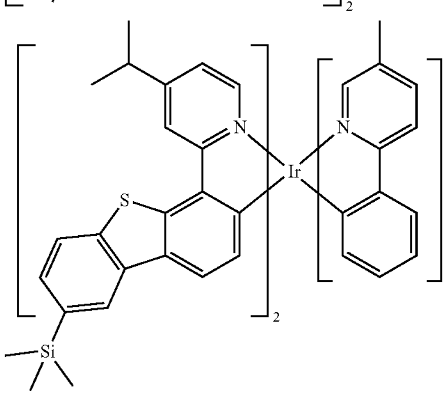
-continued
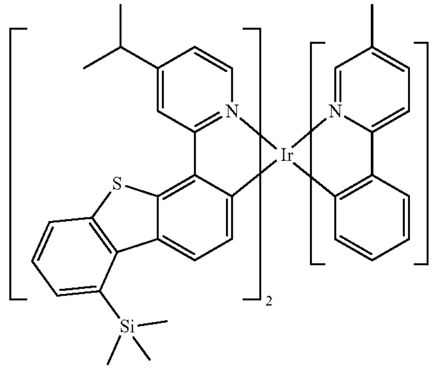
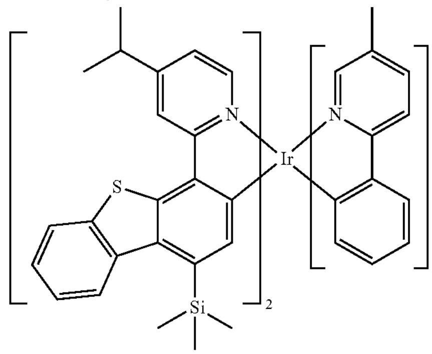
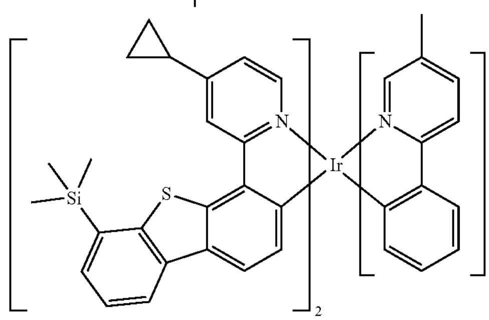
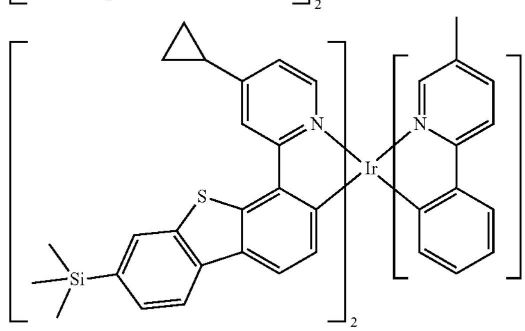
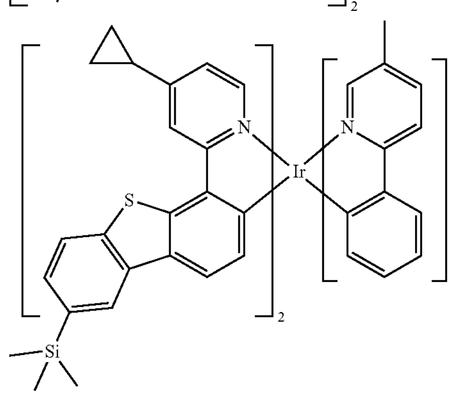

-continued
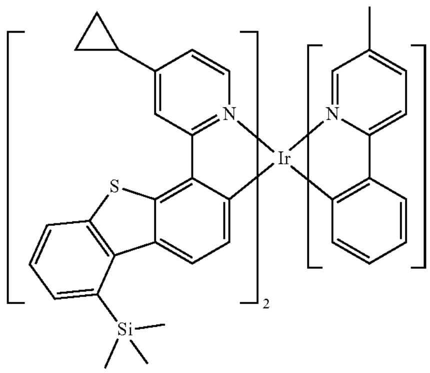
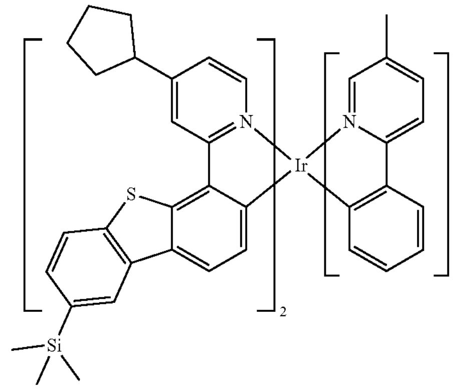
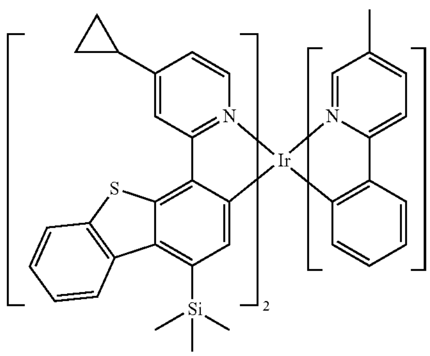
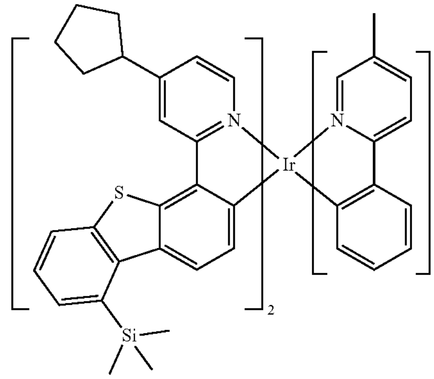
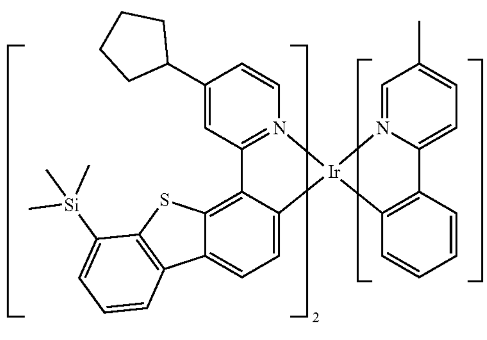
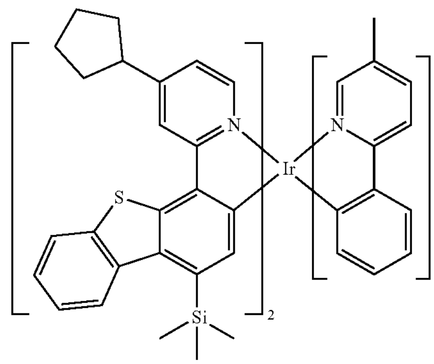
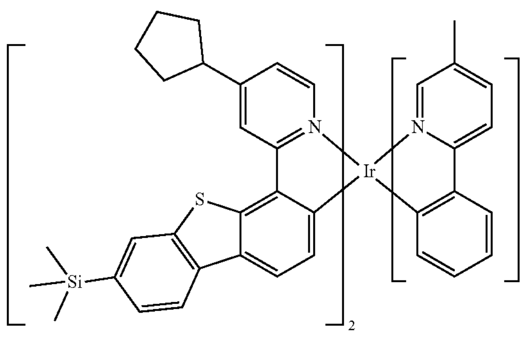
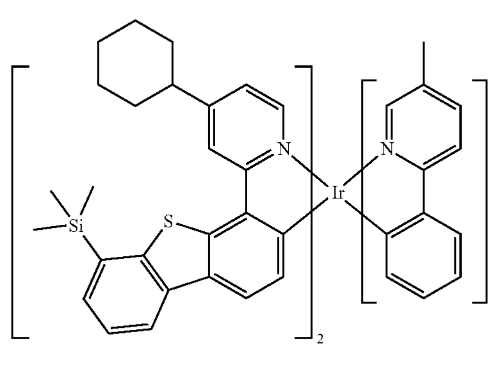

-continued
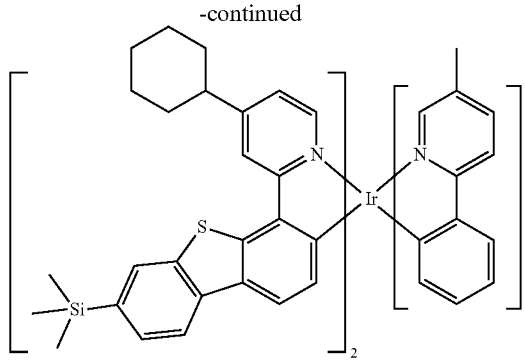
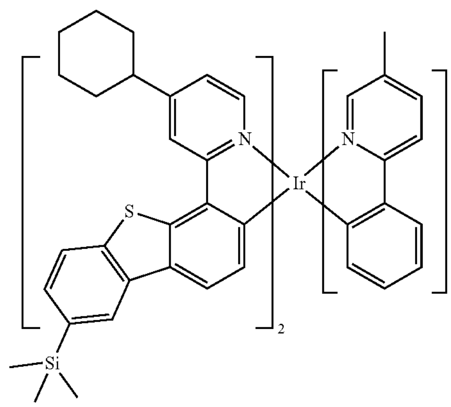
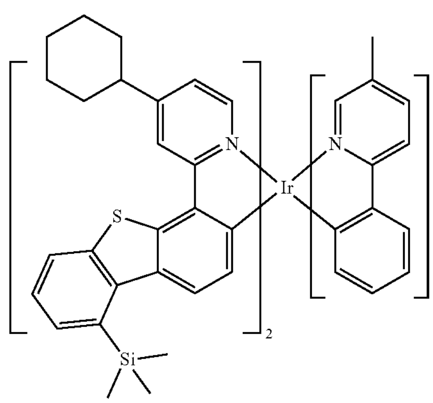
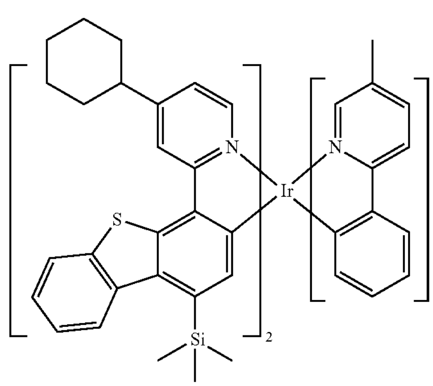
-continued
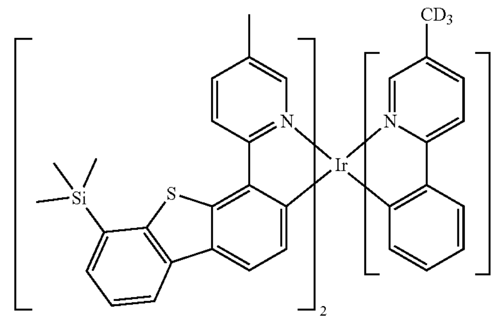
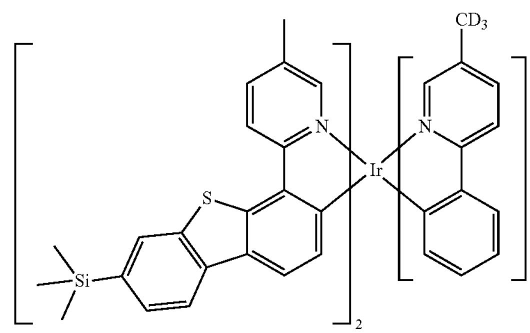
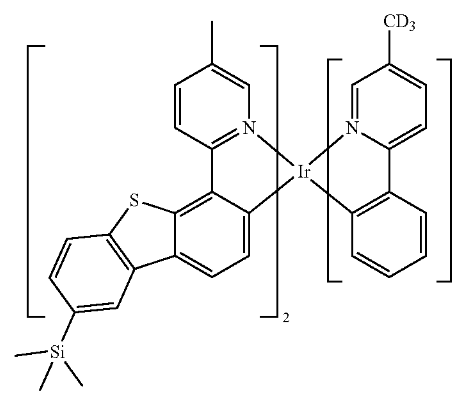
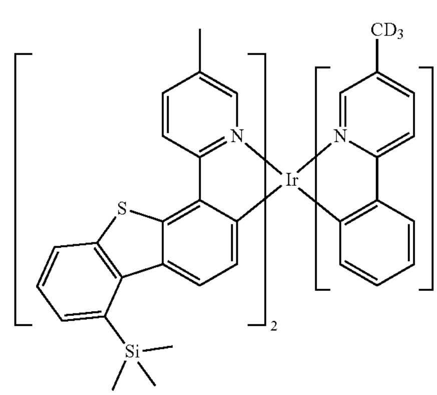

-continued
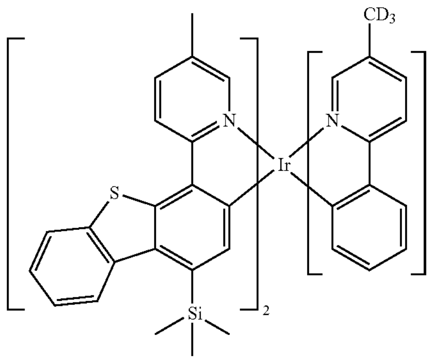
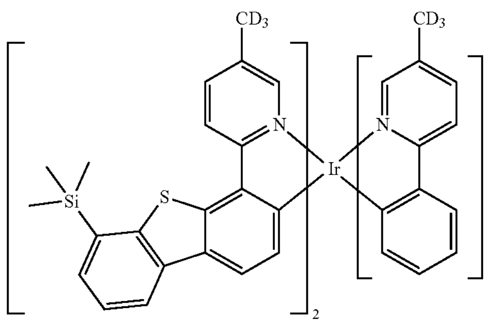
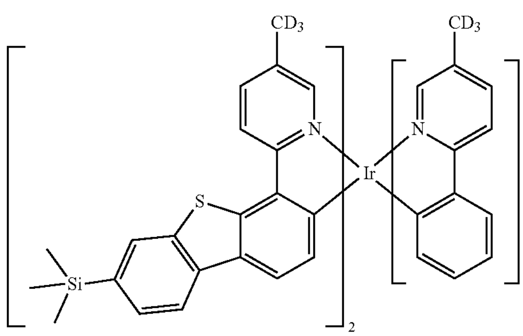
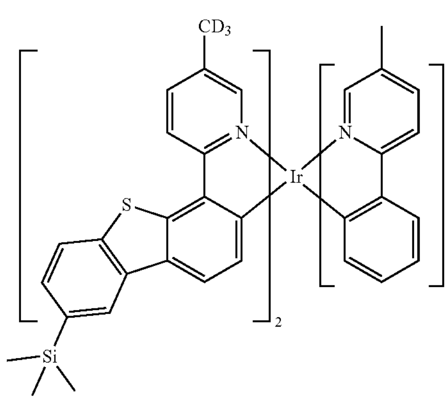
-continued
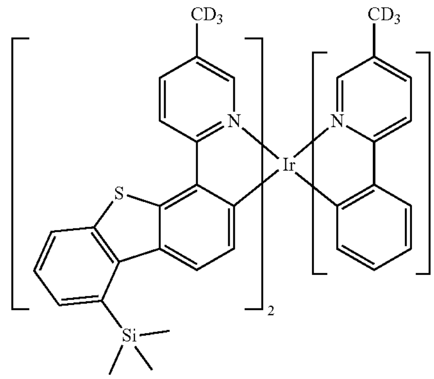
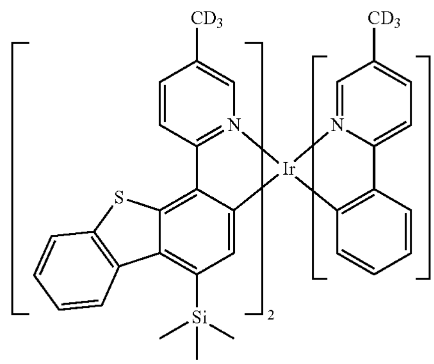
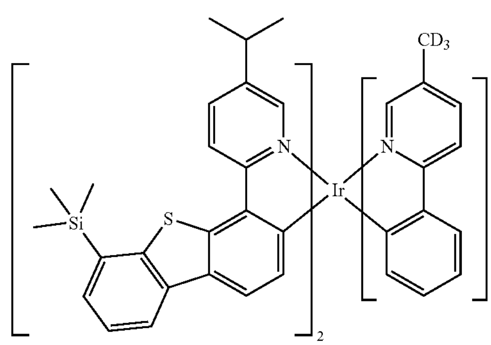
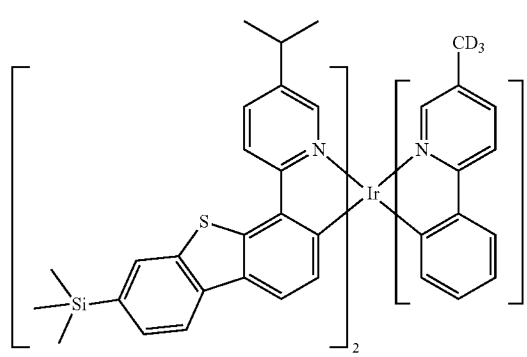

-continued
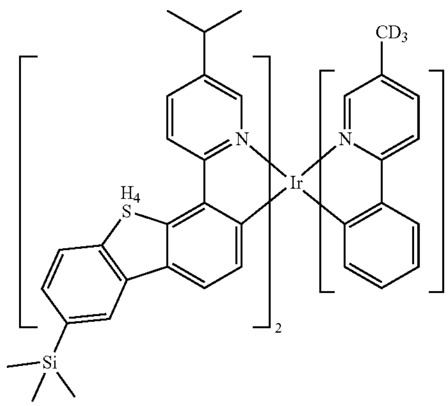
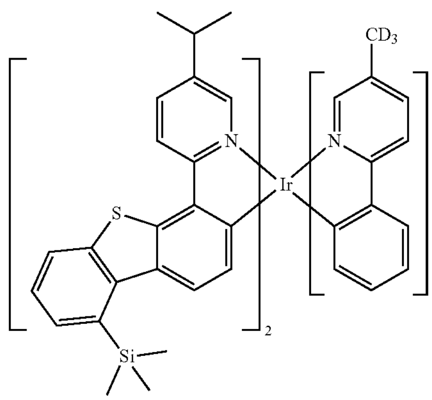
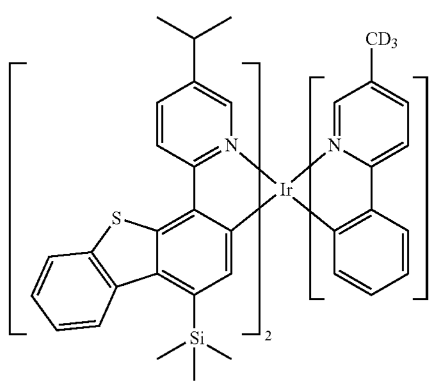
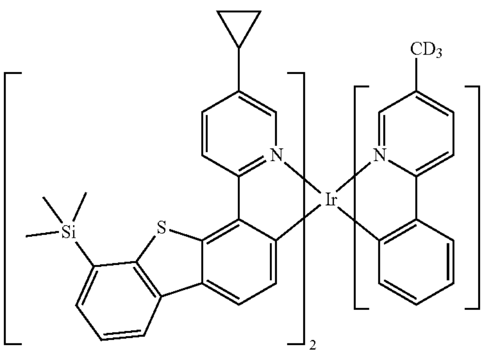
-continued
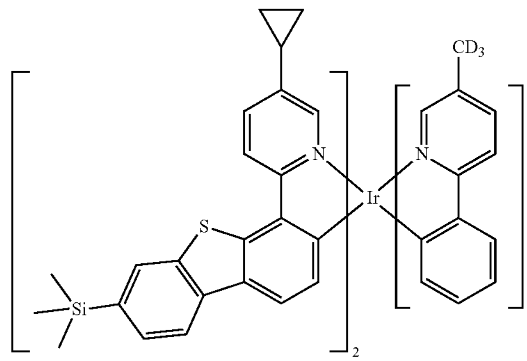
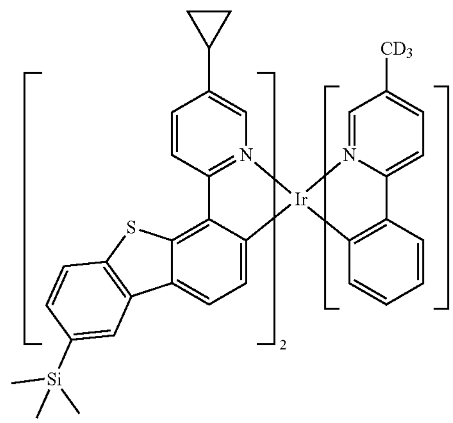
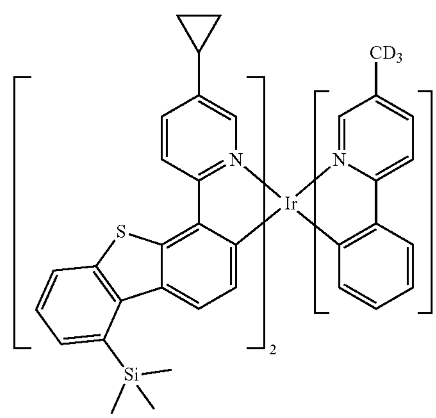
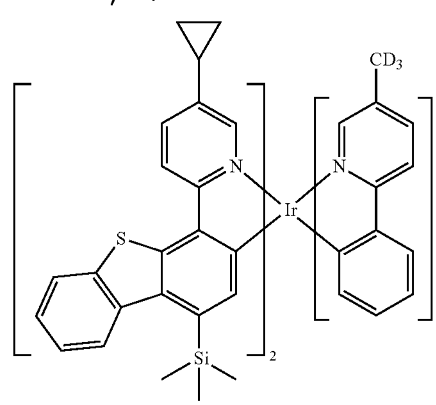

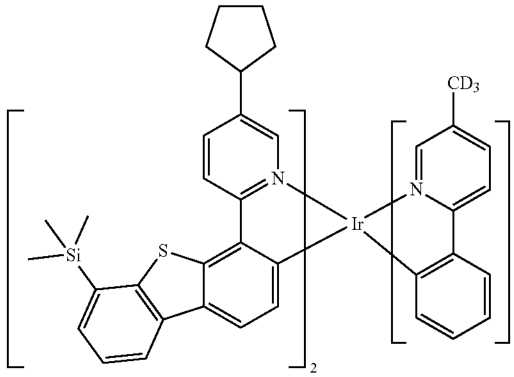
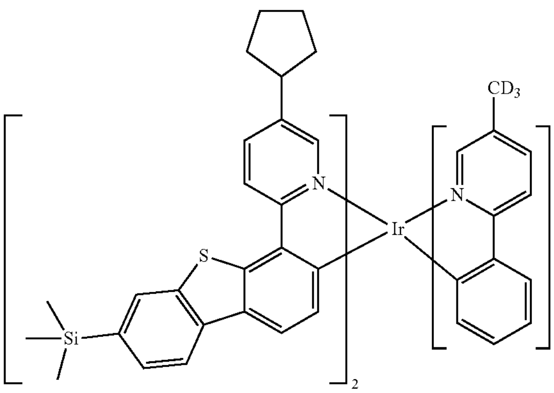
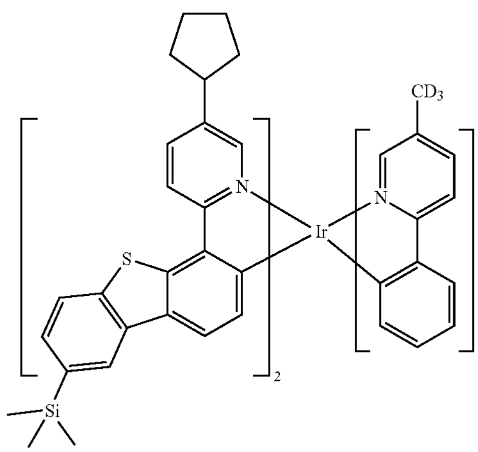
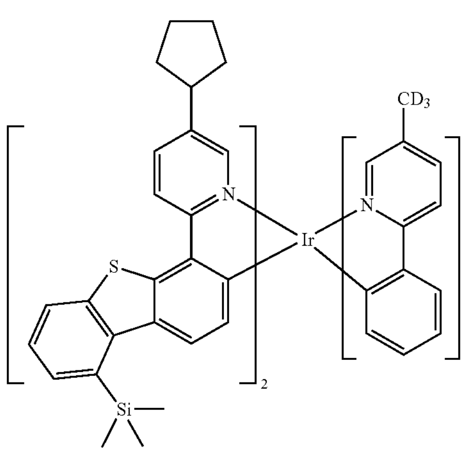
-continued
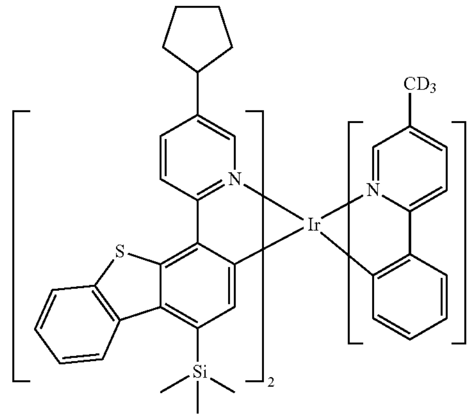
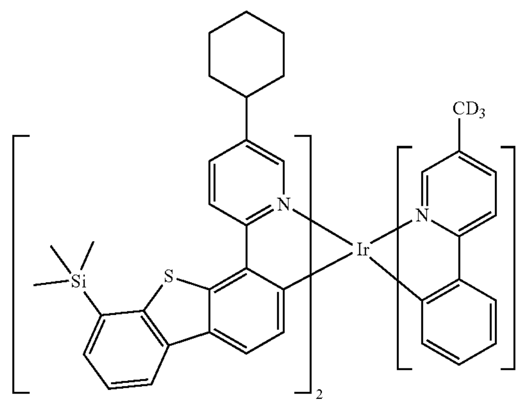
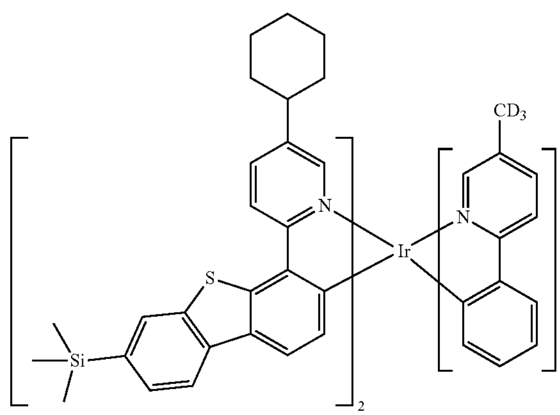
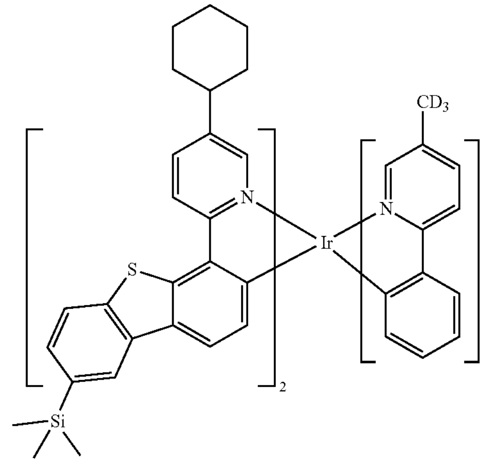

-continued
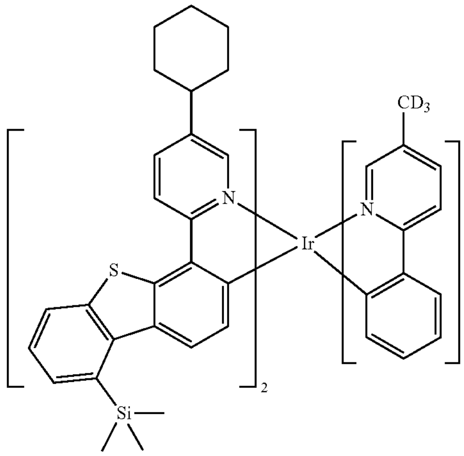
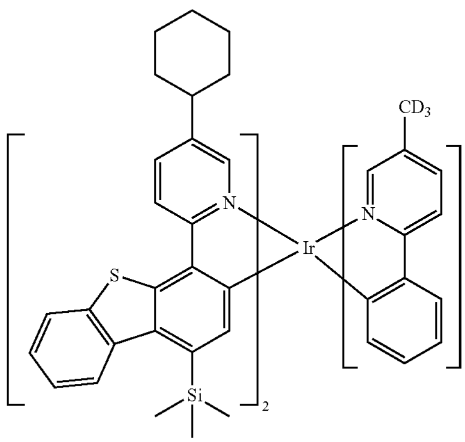
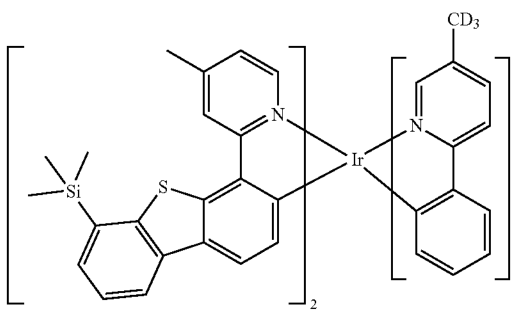
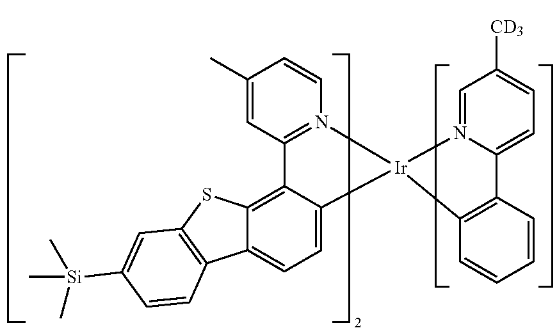
-continued
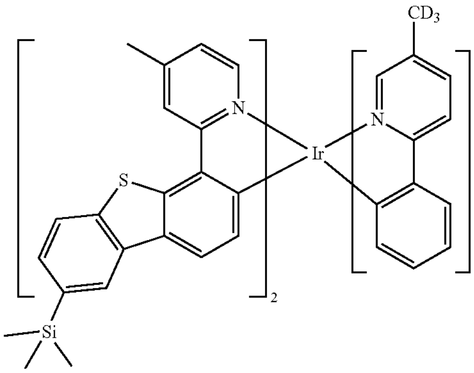
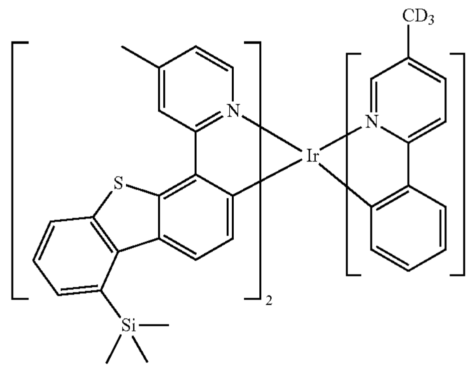
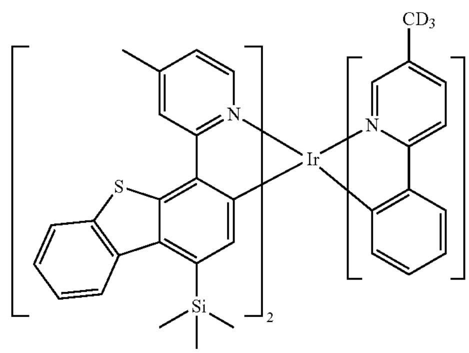
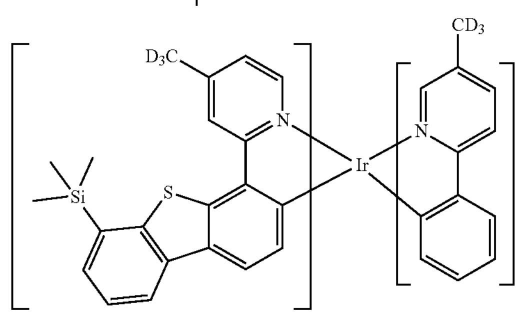
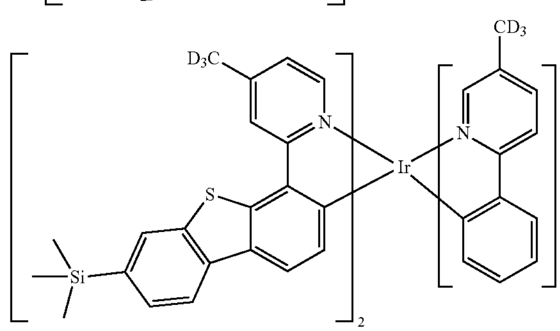

-continued
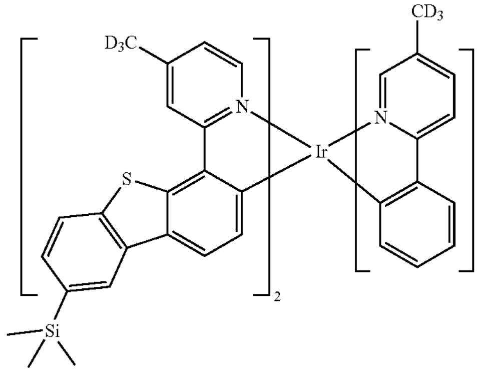
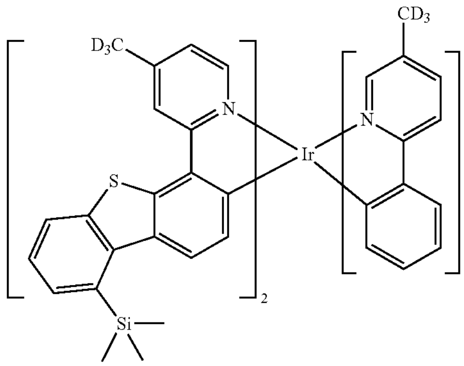
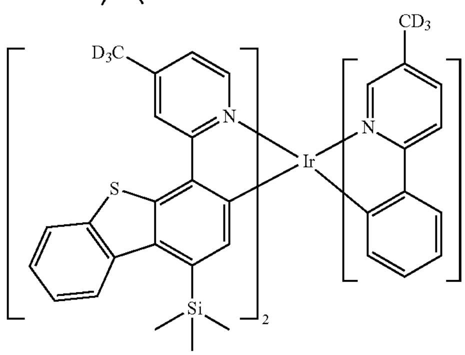
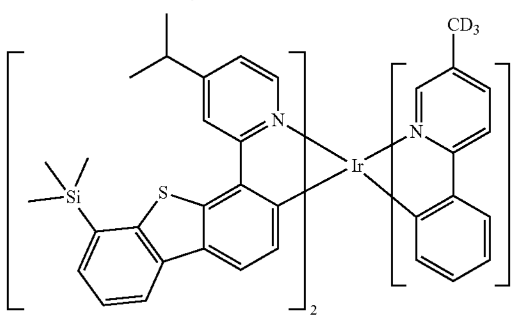
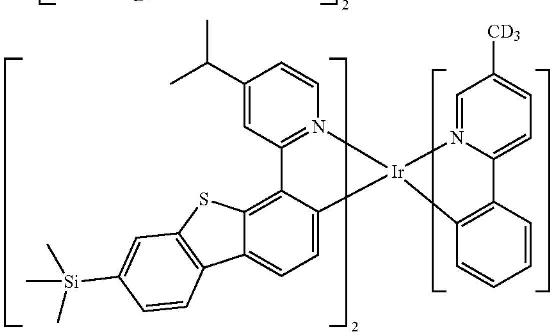
-continued
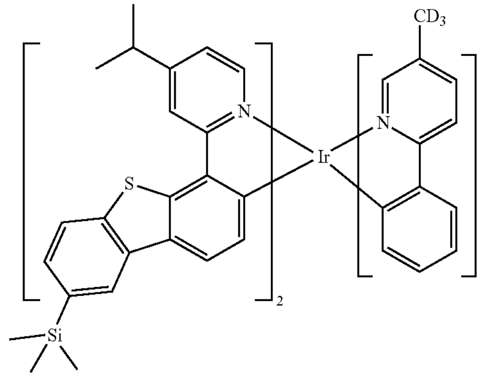
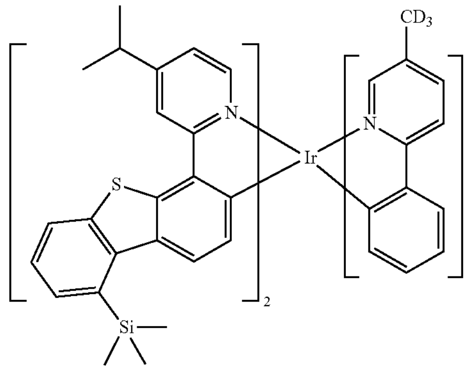
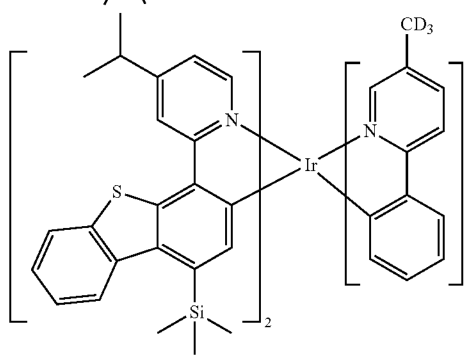
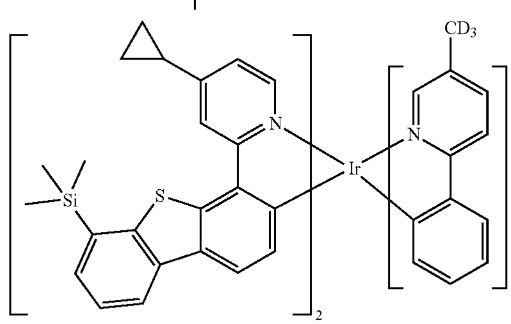
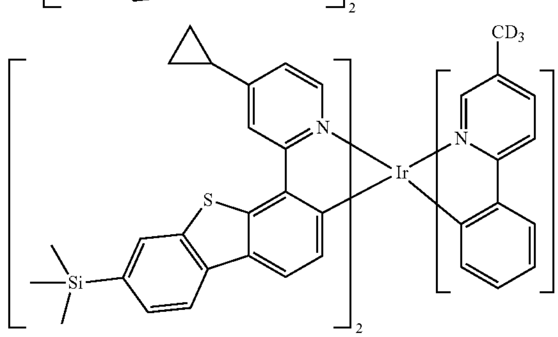

-continued
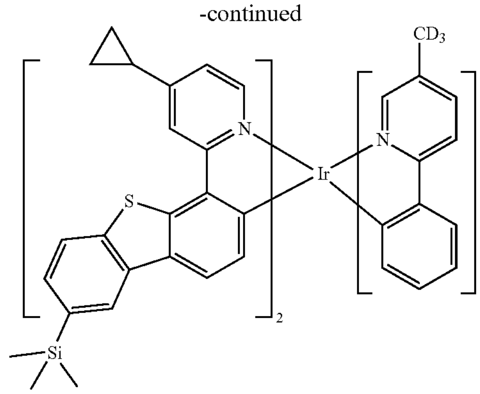
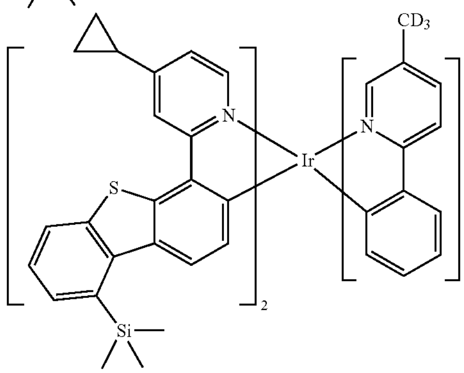
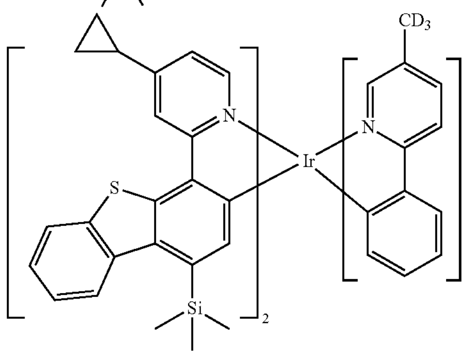
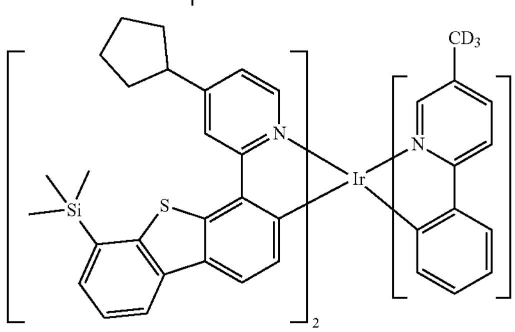
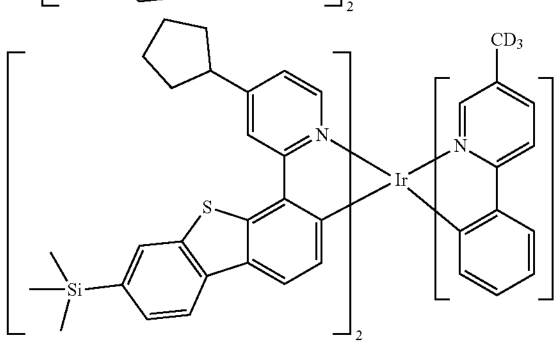
-continued
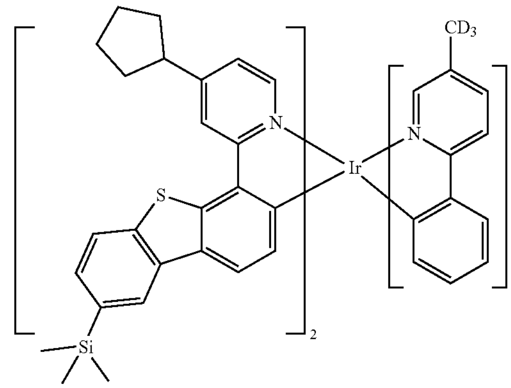
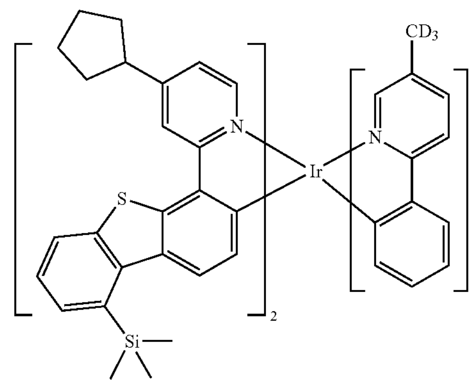
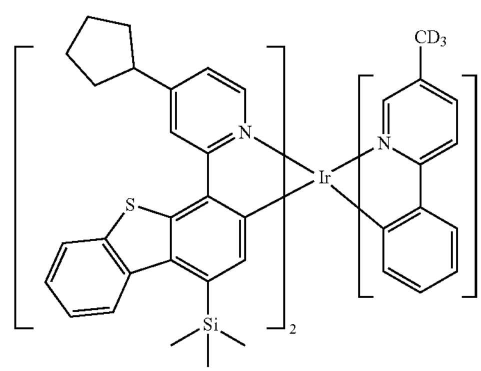
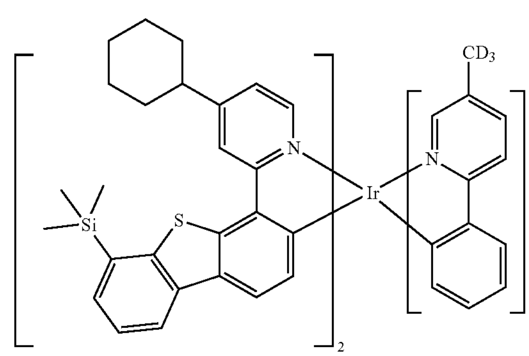

-continued
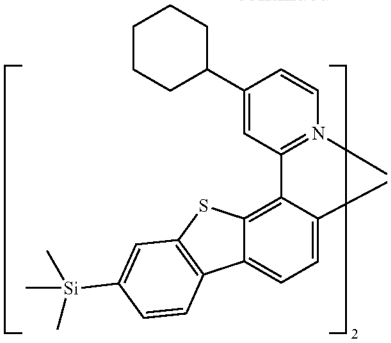
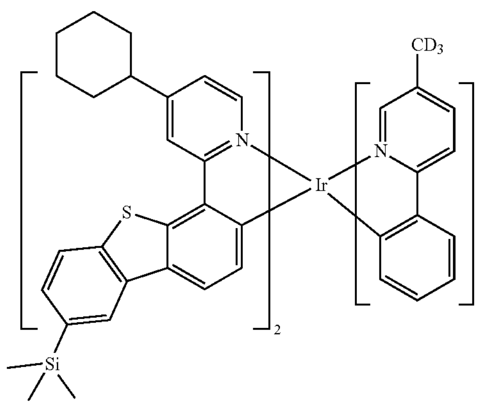
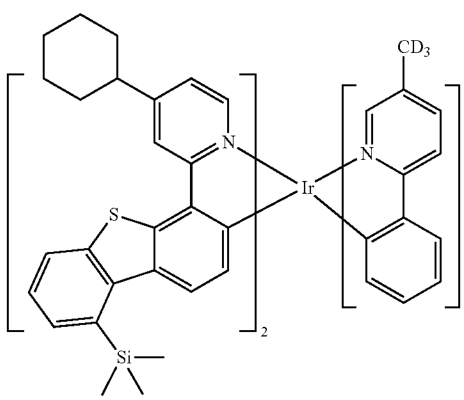
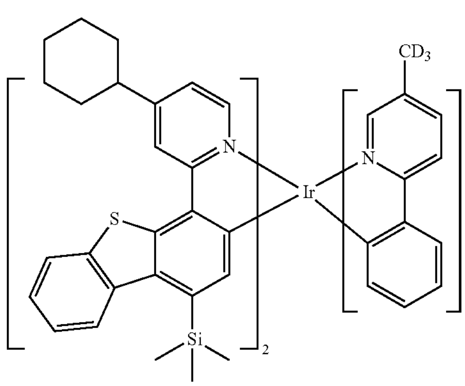
-continued
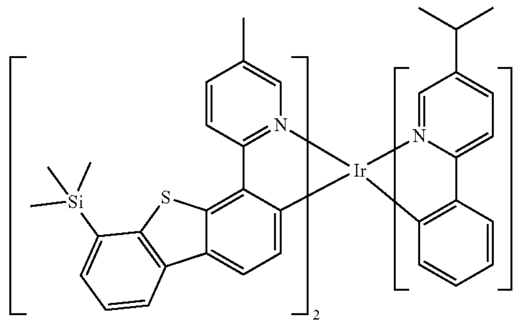
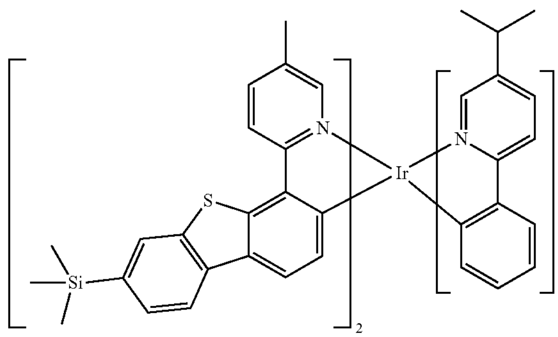
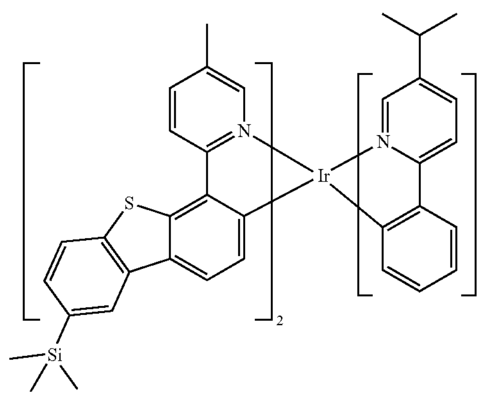
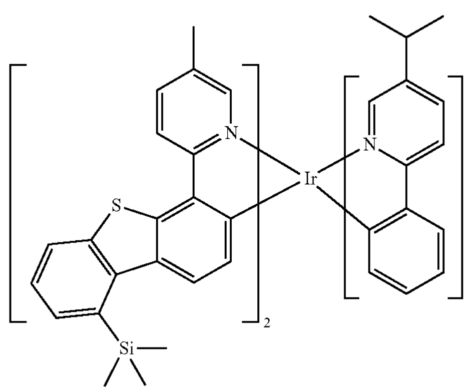

-continued
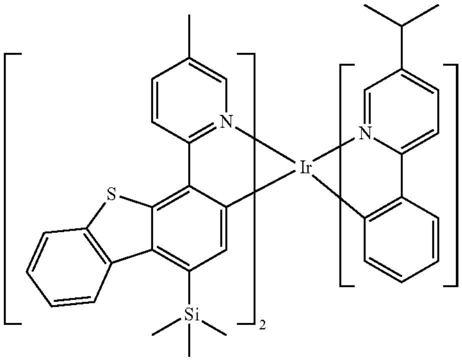
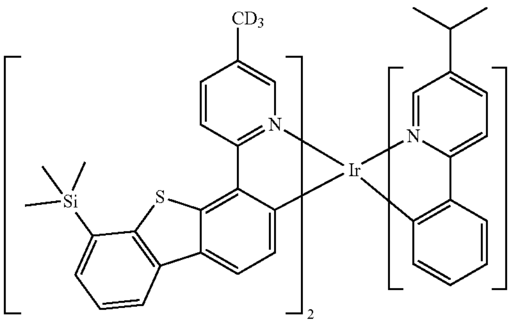
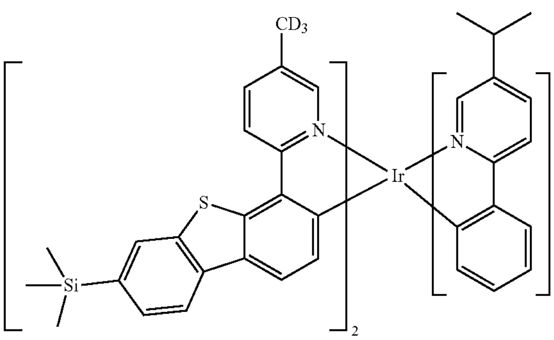
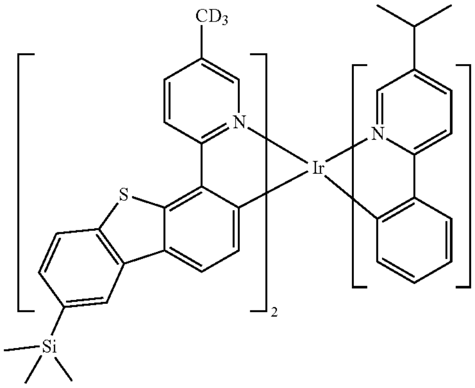
-continued
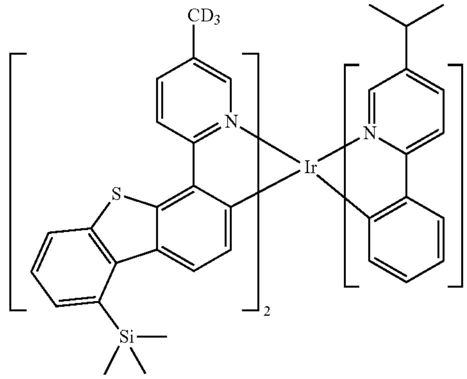
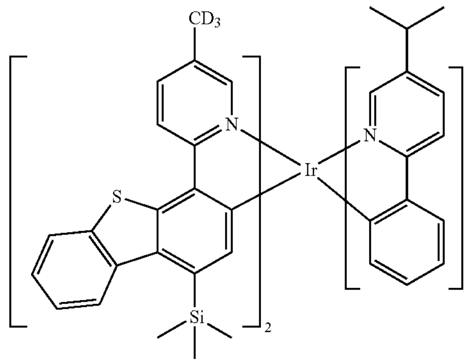
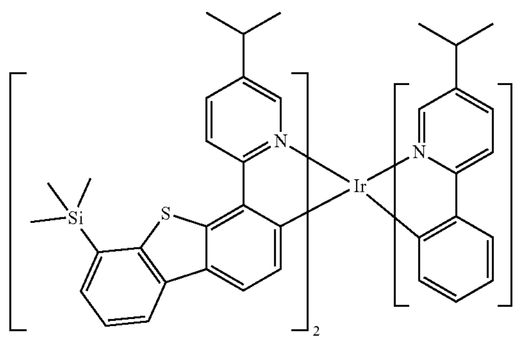
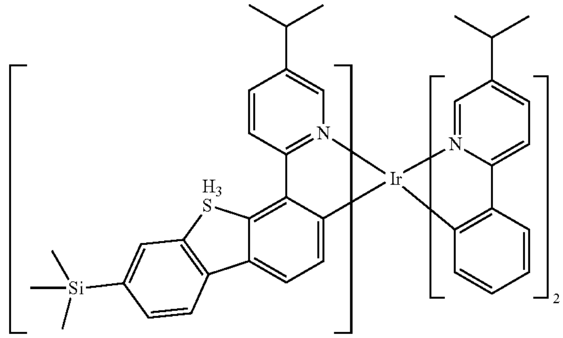

-continued
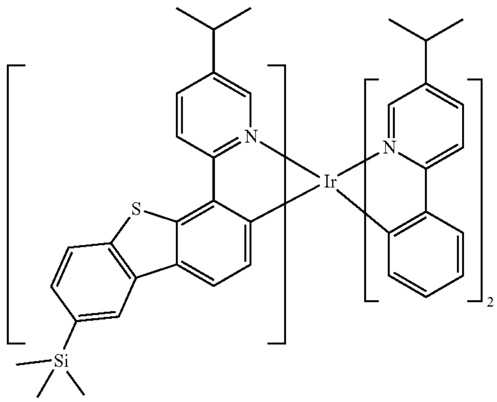
lp;1p
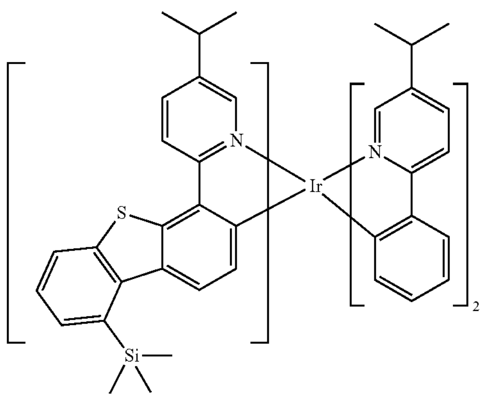
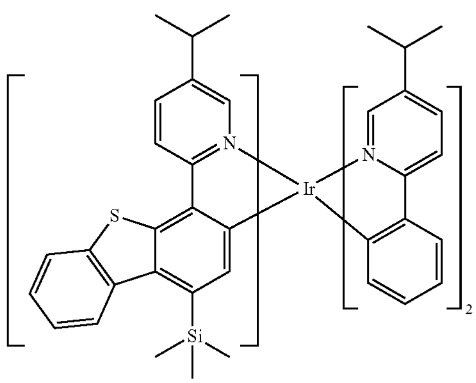
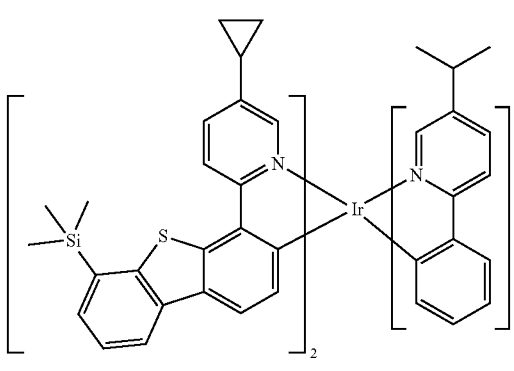
-continued
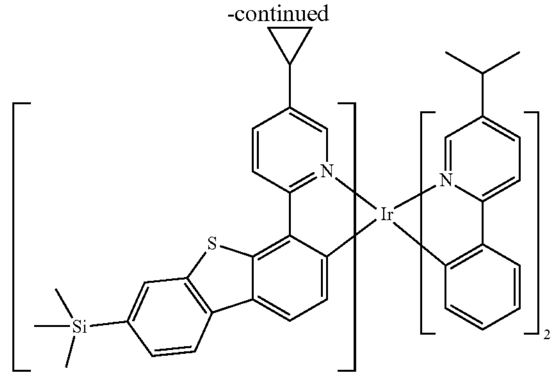
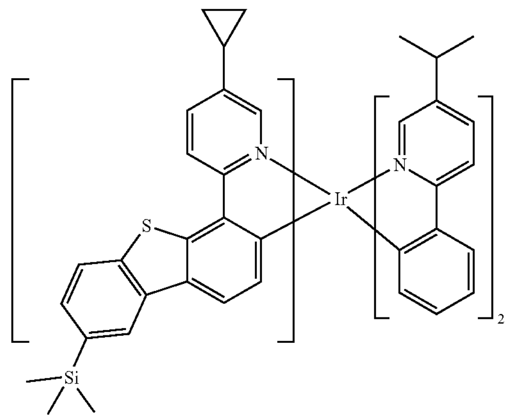
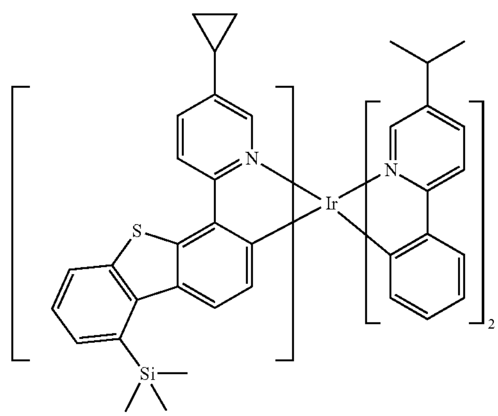
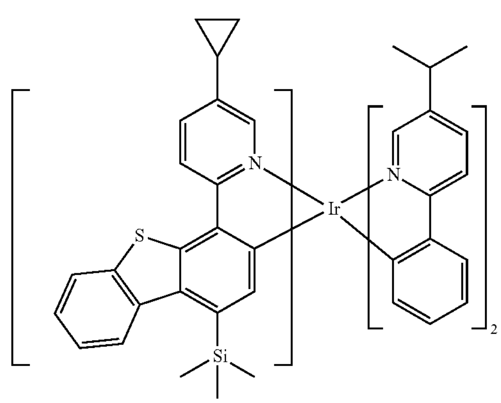

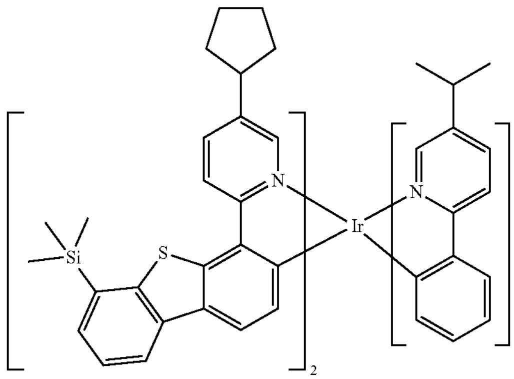
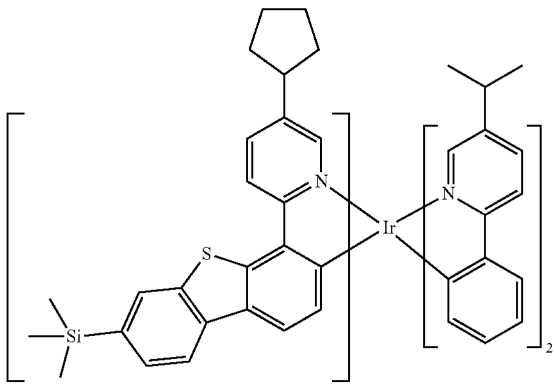
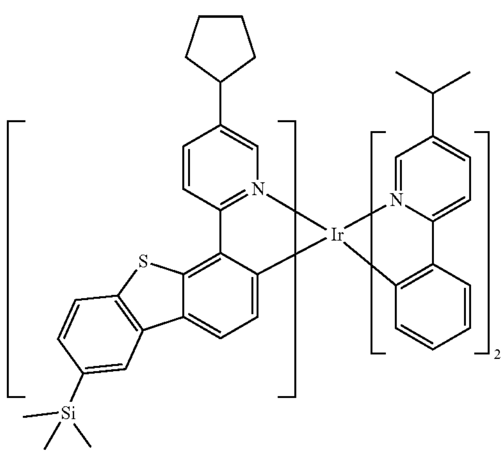
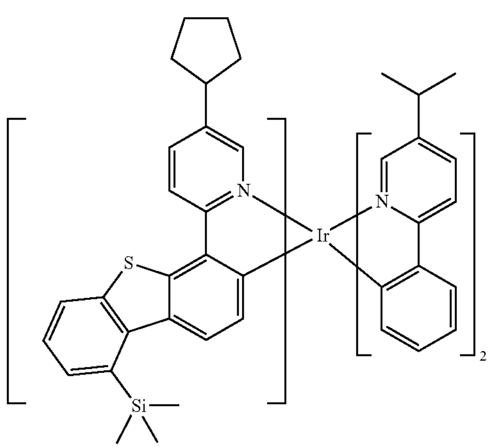
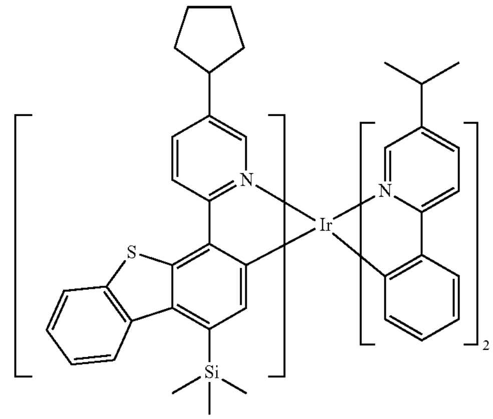
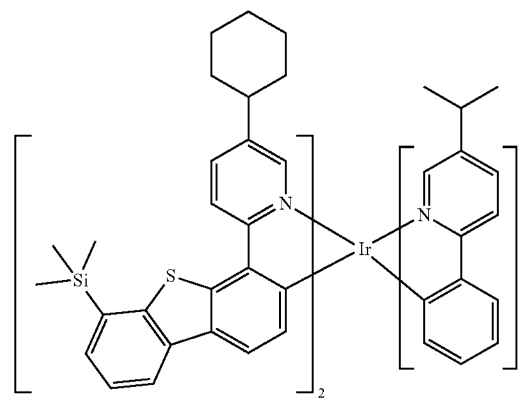
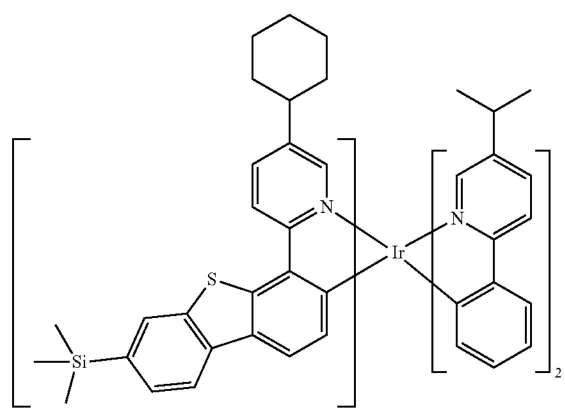
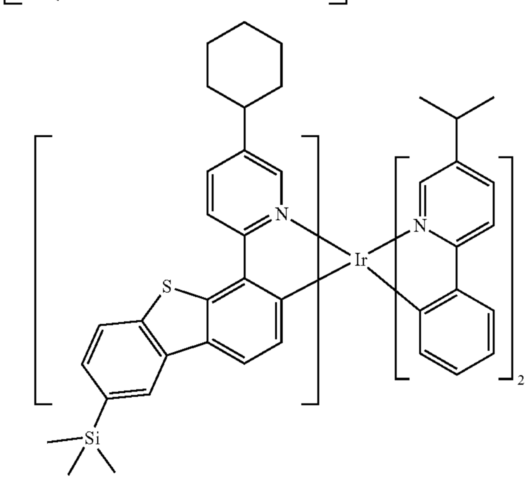

-continued
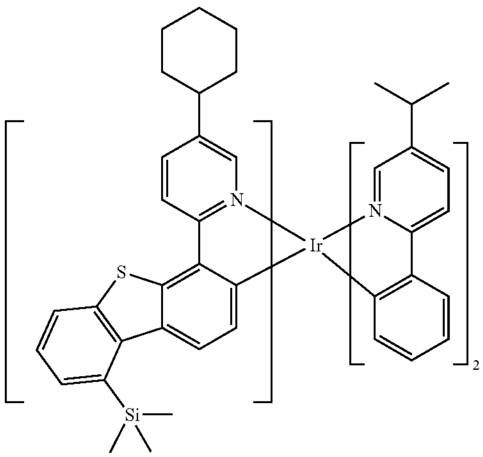
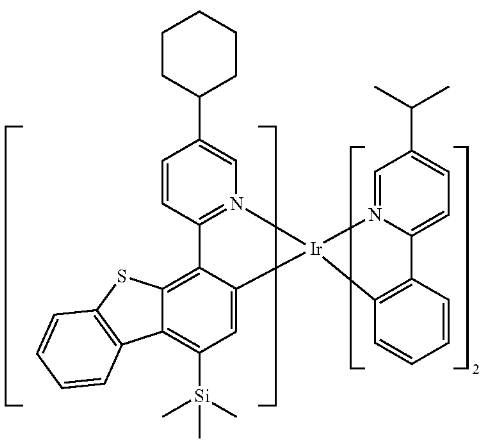
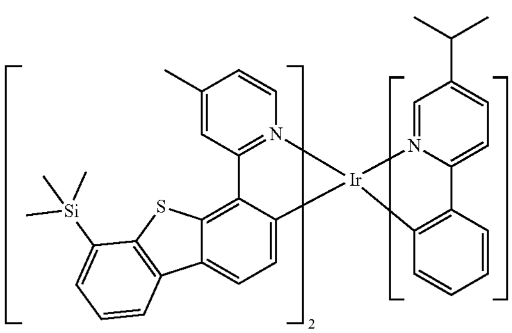
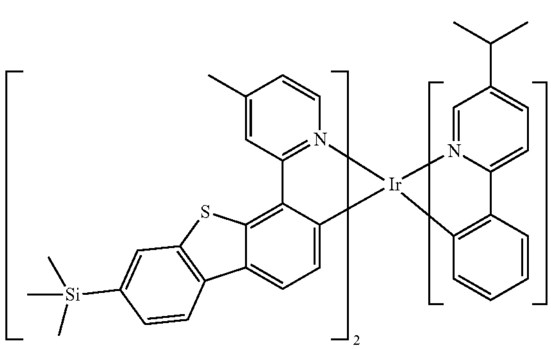
-continued
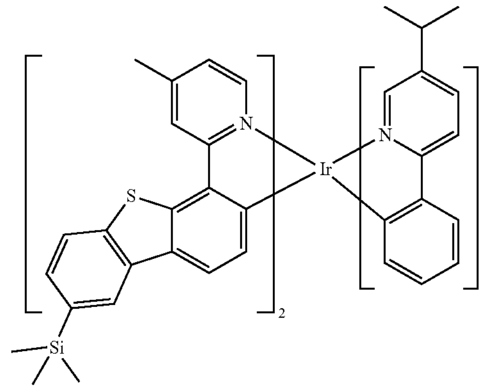
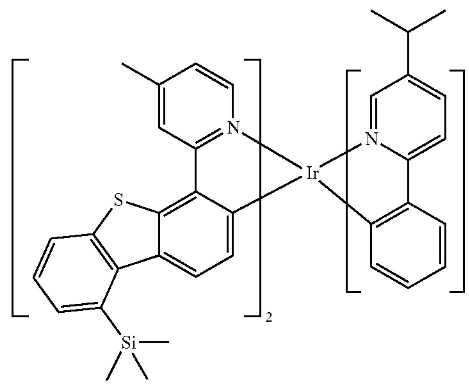
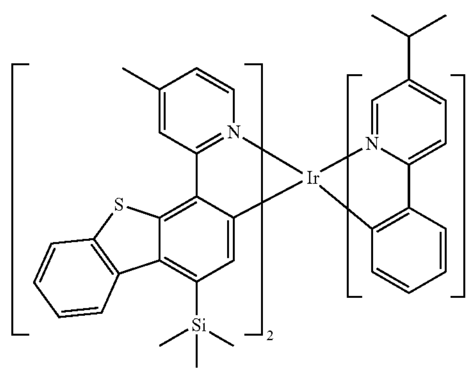
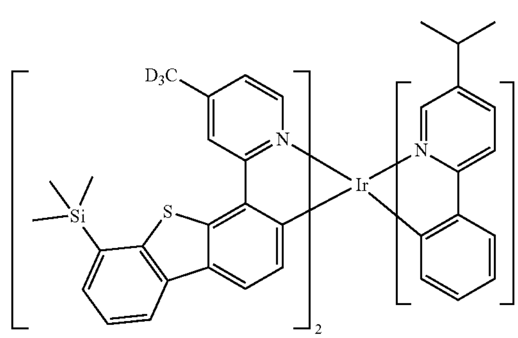

-continued
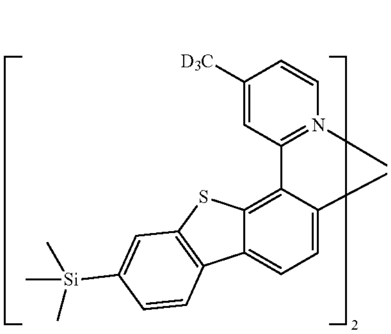
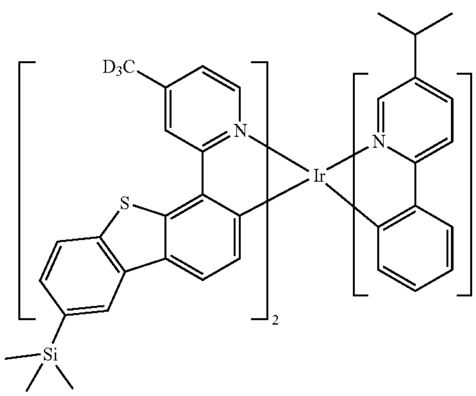
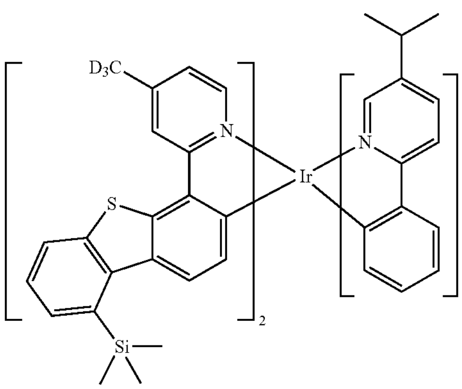
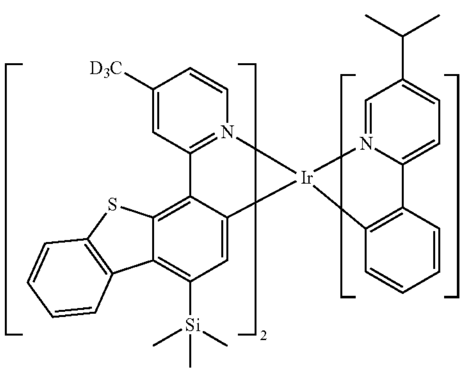
-continued
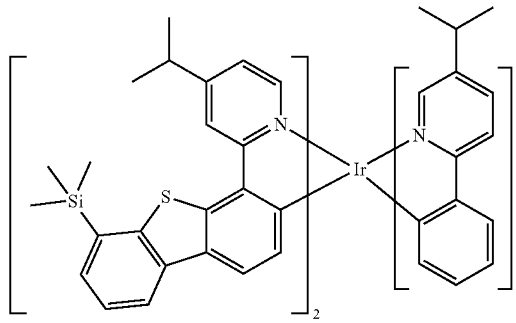
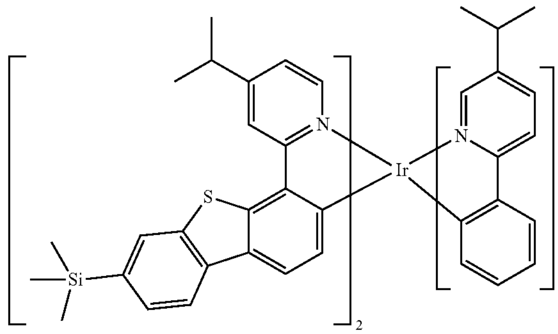
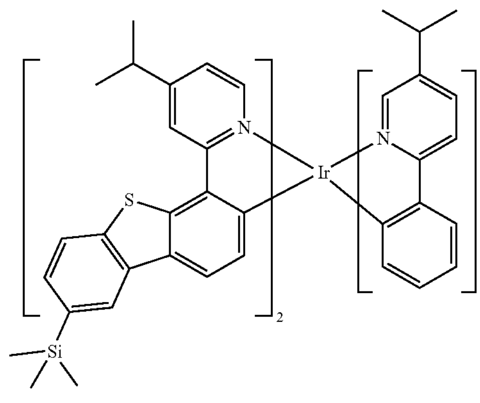
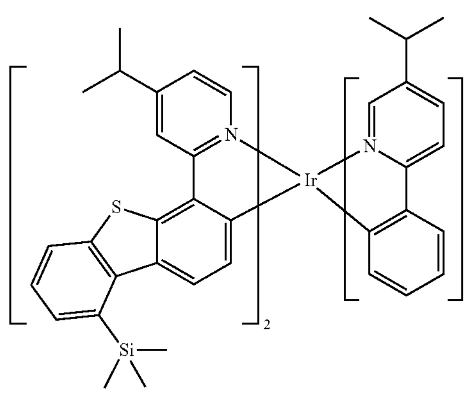

-continued
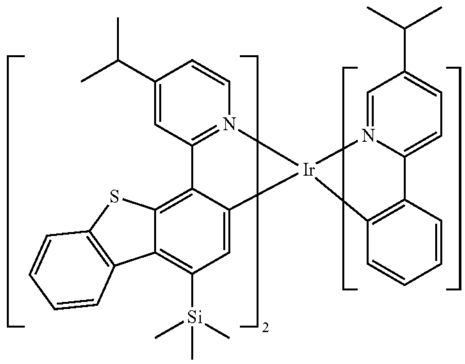
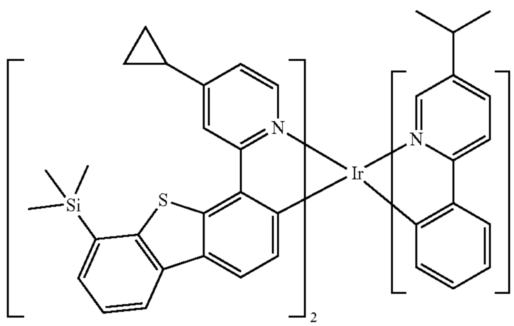
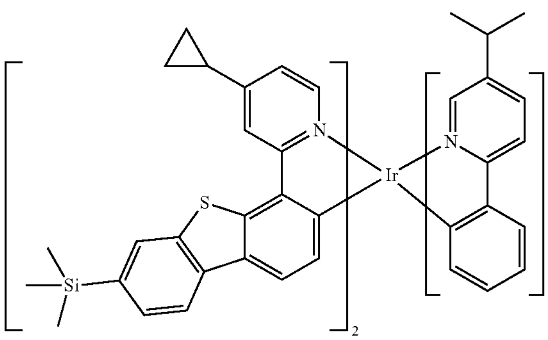
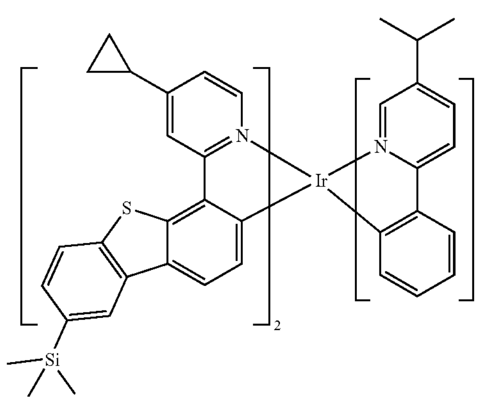
-continued
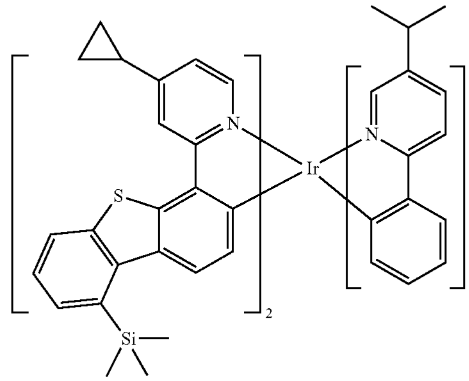
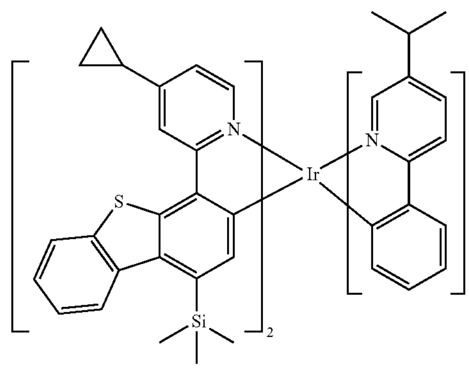
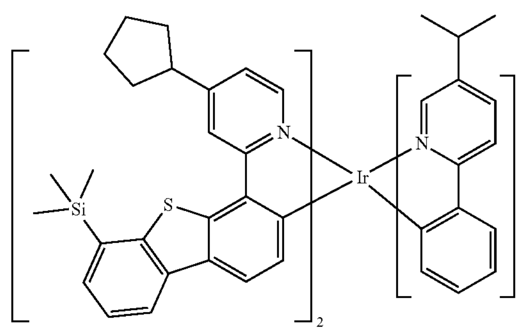
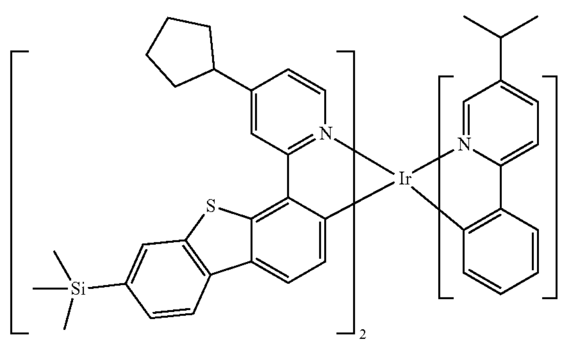

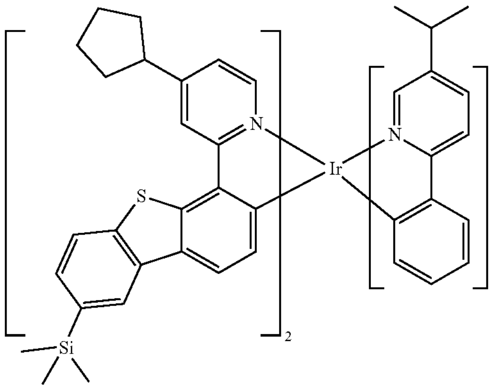
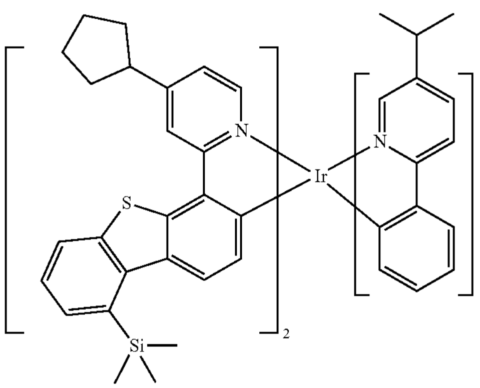
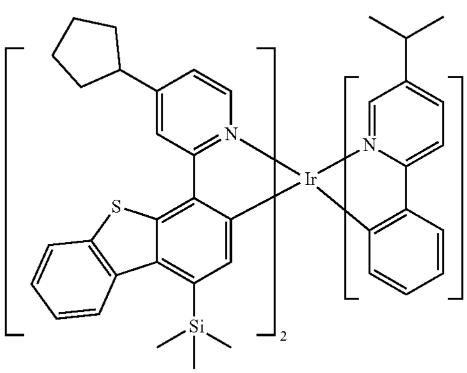
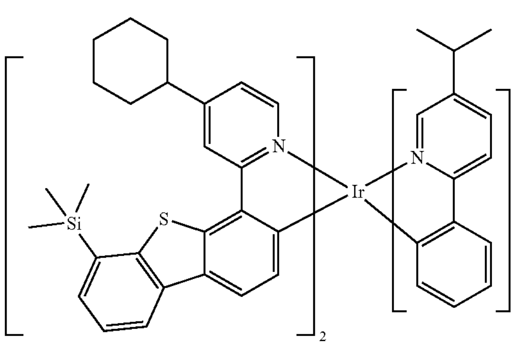
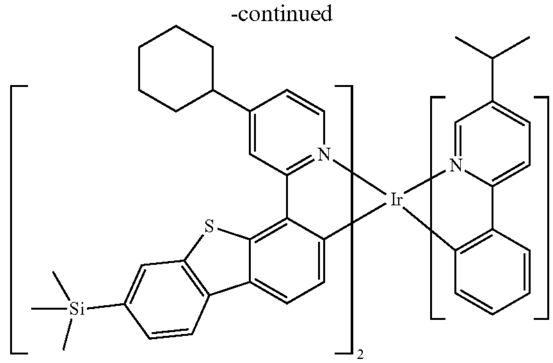
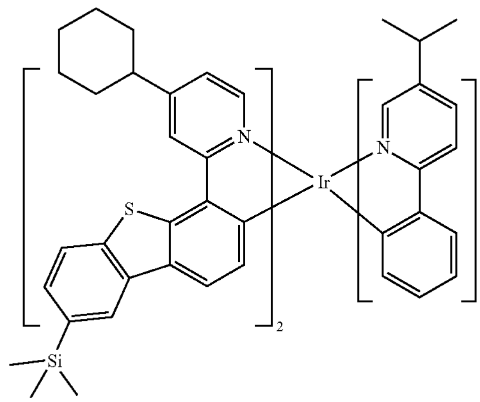
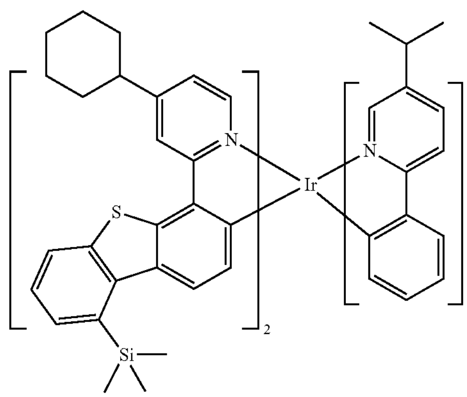
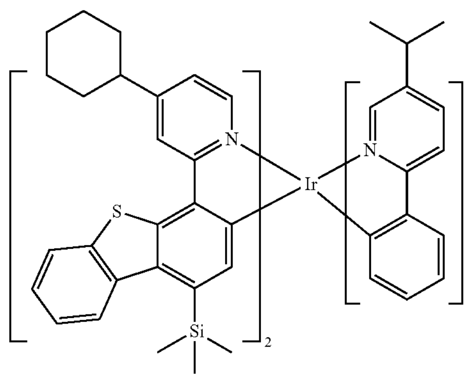
The compound of Chemical Formula 1 can be prepared by the preparation method as shown in the Reaction Scheme 1.

Reaction Scheme 1

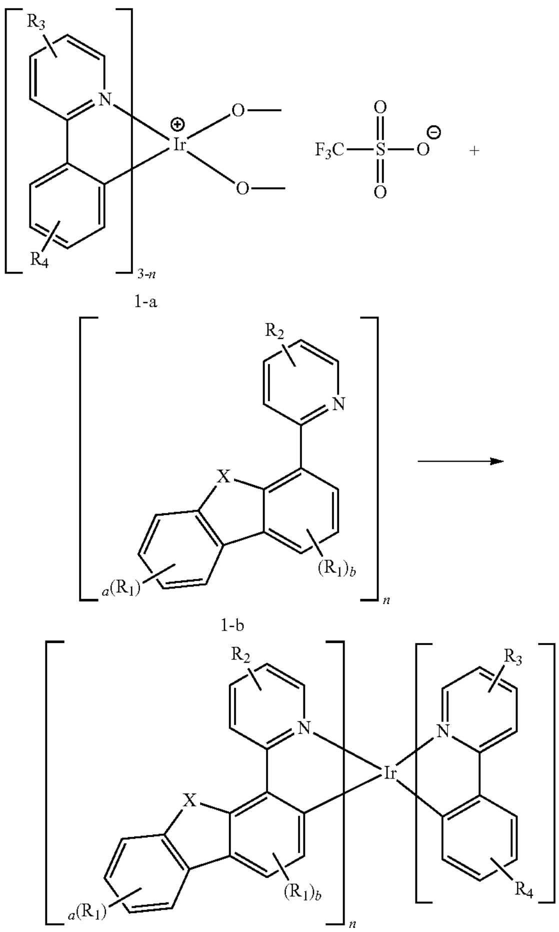

The above preparation method will be more specifically described in the Preparation Examples described hereinafter.

In another embodiment of the invention, there is provided an organic light emitting device including a compound of Chemical Formula 1 described above. As an example, there is provided an organic light emitting device including a first electrode: a second electrode that is disposed opposite to the first electrode, and one or more organic material layers that are disposed between the first electrode and the second electrode, wherein one or more layers of the organic material layers is a light emitting layer, and wherein the light emitting layer includes the compound of Chemical Formula 1.

The organic material layer of the organic light emitting device of the present invention can have a single-layer structure, or it can have a multilayered structure in which two or more organic material layers are stacked. For example, the organic light emitting device of the present invention can have a structure comprising a hole injection layer, a hole transport layer, a light emitting layer, an electron transport layer, an electron injection layer and the like as the organic material layer. However, the structure of the organic light emitting device is not limited thereto, and it can include a smaller number of organic layers.

Further, the organic light emitting device according to the present invention can be a normal type organic light emitting device in which an anode, one or more organic material layers and a cathode are sequentially stacked on a substrate. Further, the organic light emitting device according to the present invention can be an inverted type organic light emitting device in which a cathode, one or more organic material layers and an anode are sequentially stacked on a substrate. For example, the structure of an organic light emitting device according to an embodiment of the present invention is illustrated in FIGS. 1 and 2.

FIG. 1 shows an example of an organic light emitting device comprising a substrate 1, an anode 2, a light emitting layer 3, and a cathode 4. In such a structure, the compound of Chemical Formula 1 can be included in the light emitting layer.

FIG. 2 shows an example of an organic light emitting device comprising a substrate 1, an anode 2, a hole injection layer 5, a hole transport layer 6, a light emitting layer 7, an electron transport layer 8 and a cathode 4. In such a structure, the compound of Chemical Formula 1 can be included in the light emitting layer.

The organic light emitting device according to the present invention can be manufactured by materials and methods known in the art, except that one or more layers of the organic material layers include the compound of Chemical Formula 1. Moreover, when the organic light emitting device includes a plurality of organic material layers, the organic material layers can be formed of the same material or different materials.

For example, the organic light emitting device according to the present invention can be manufactured by sequentially stacking a first electrode, an organic material layer and a second electrode on a substrate. In this case, the organic light emitting device can be manufactured by depositing a metal, metal oxides having conductivity, or an alloy thereof on the substrate using a PVD (physical vapor deposition) method such as a sputtering method or an e-beam evaporation method to form an anode, forming organic material layers including the hole injection layer, the hole transport layer, the light emitting layer and the electron transport layer thereon, and then depositing a material that can be used as the cathode thereon. In addition to such a method, the organic light emitting device can be manufactured by sequentially depositing a cathode material, an organic material layer and an anode material on a substrate.

Further, the compound of Chemical Formula 1 can be formed into an organic layer by a solution coating method as well as a vacuum deposition method at the time of manufacturing an organic light emitting device. Herein, the solution coating method means a spin coating, a dip coating, a doctor blading, an inkjet printing, a screen printing, a spray method, a roll coating, or the like, but is not limited thereto.

In addition to such a method, the organic light emitting device can be manufactured by sequentially depositing a cathode material, an organic material layer and an anode material on a substrate (International Publication WO2003/012890). However, the manufacturing method is not limited thereto.

As an example, the first electrode is an anode, and the second electrode is a cathode, or alternatively, the first electrode is a cathode and the second electrode is an anode.

As the anode material, generally, a material having a large work function is preferably used so that holes can be smoothly injected into the organic material layer. Specific examples of the anode material include metals such as vanadium, chrome, copper, zinc, and gold, or an alloy thereof; metal oxides such as zinc oxides, indium oxides, indium tin oxides (ITO), and indium zinc oxides (IZO); a combination of metals and oxides, such as ZnO:Al or $SnO_2$:Sb; conductive polymers such as poly(3-methylthiophene), poly[3,4-(ethylene-1,2-dioxy)thiophene](PEDOT), polypyrrole, and polyaniline, and the like, but are not limited thereto.

As the cathode material, generally, a material having a small work function is preferably used so that electrons can be easily injected into the organic material layer. Specific examples of the cathode material include metals such as magnesium, calcium, sodium, potassium, titanium, indium, yttrium, lithium, gadolinium, aluminum, silver, tin, and lead, or an alloy thereof; a multilayered structure material such as LiF/Al or $LiO_2$/Al, and the like, but are not limited thereto.

The hole injection layer is a layer for injecting holes from the electrode, and the hole injection material is preferably a compound which has a capability of transporting the holes, thus has a hole injecting effect in the anode and an excellent hole-injecting effect to the light emitting layer or the light emitting material, prevents excitons produced in the light emitting layer from moving to an electron injection layer or the electron injection material, and is excellent in the ability to form a thin film. It is preferable that a HOMO (highest occupied molecular orbital) of the hole injection material is between the work function of the anode material and a HOMO of a peripheral organic material layer. Specific examples of the hole injection material include metal porphyrine, oligothiophene, an arylamine-based organic material, a hexanitrilehexaazatriphenylene-based organic material, a quinacridone-based organic material, a perylene-based organic material, anthraquinone, polyaniline and polythiophene-based conductive polymer, and the like, but are not limited thereto.

The hole transport layer is a layer that receives holes from a hole injection layer and transports the holes to the light emitting layer. The hole transport material is suitably a material having large mobility to the holes, which can receive holes from the anode or the hole injection layer and transfer the holes to the light emitting layer. Specific examples thereof include an arylamine-based organic material, a conductive polymer, a block copolymer in which a conjugate portion and a non-conjugate portion are present together, and the like, but are not limited thereto.

The light emitting layer can include a host material and a dopant material. The host material can be a fused aromatic ring derivative, a heterocyclic-containing compound or the like. Specific examples of the fused aromatic ring derivatives include anthracene derivatives, pyrene derivatives, naphthalene derivatives, pentacene derivatives, phenanthrene compounds, fluoranthene compounds, and the like. Examples of the heterocyclic-containing compounds include carbazole derivatives, dibenzofuran derivatives, ladder-type furan compounds, pyrimidine derivatives, and the like, but are not limited thereto.

The dopant material can be an aromatic amine derivative, a styrylamine compound, a boron complex, a fluoranthene compound, a metal complex, and the like. In particular, in the present invention, the compound of Chemical Formula 1 is used as a dopant.

The electron transport layer is a layer which receives electrons from an electron injection layer and transports the electrons to a light emitting layer, and an electron transport material is suitably a material which can receive electrons well from a cathode and transfer the electrons to a light emitting layer and has large mobility for electrons. Specific examples thereof include: an Al complex of 8-hydroxyquinoline, a complex including $Alq_3$, an organic radical compound, a hydroxyflavone-metal complex, and the like, but are not limited thereto. The electron transport layer can be used with any desired cathode material, as used according to the related art. In particular, appropriate examples of the cathode material are a typical material which has a low work function, followed by an aluminum layer or a silver layer. Specific examples thereof include cesium, barium, calcium, ytterbium, and samarium, in each case followed by an aluminum layer or a silver layer.

The electron injection layer is a layer which injects electrons from an electrode, and is preferably a compound which has a capability of transporting electrons, has an effect of injecting electrons from a cathode and an excellent effect of injecting electrons into a light emitting layer or a light emitting material, prevents excitons produced from the light emitting layer from moving to a hole injection layer, and is also excellent in the ability to form a thin film. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, a metal complex compound, a nitrogen-containing 5-membered ring derivative, and the like, but are not limited thereto.

Examples of the metal complex compound include 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato)gallium, bis(10-hydroxy-benzo[h]quinolinato)beryllium, bis(10-hydroxybenzo[h]quinolinato)zinc, bis(2-methyl-8-quinolinato)chlorogallium, bis(2-methyl-8-quinolinato)(o-cresolato)gallium, bis(2-methyl-8-quinolinato)(1-naphtholato)aluminum, bis(2-methyl-8-quinolinato)-(2-naphtholato)gallium, and the like, but are not limited thereto.

The organic light emitting device according to the present invention can be a front side emission type, a backside emission type, or a double-sided emission type according to the used material.

In addition, the compound of Chemical Formula 1 can be included in an organic solar cell or an organic transistor in addition to an organic light emitting device.

The preparation of the compound of Chemical Formula 1 and the organic light emitting device containing the same will be described in detail in the following examples. However, these examples are presented for illustrative purposes only, and are not intended to limit the scope of the present invention.

PREPARATION EXAMPLES

Preparation Example 1-1

Preparation of Compound A1 and B1

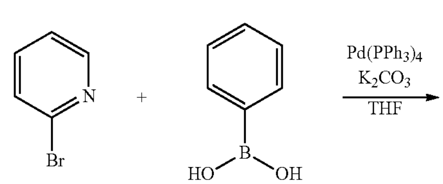

-continued

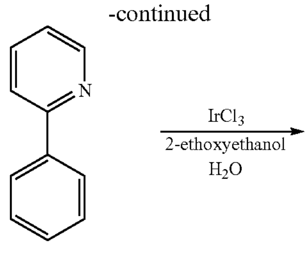

A1

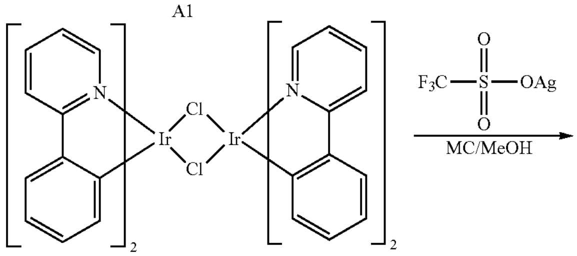

1-1a

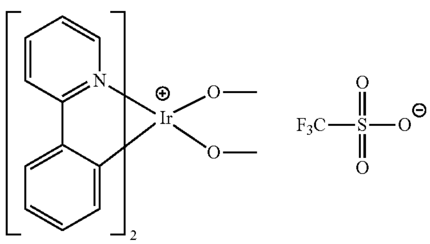

B1

(1) Preparation of Compound A1

After 2-bromopyridine (50 g, 0.32 mol) and phenylboronic add (43 g, 0.35 mol) were dissolved in tetrahydrofuran in a round bottom flask under a nitrogen atmosphere, 2M aqueous potassium carbonate solution (250 mL) was added and tetrakis(triphenylphosphine)palladium (7.4 g, 6.4 mmol) was added, and then the mixture was heated and stirred at 80° C. for 12 hours. After completion of the reaction, the temperature was lowered, the aqueous layer was separated, and the organic layer solvent was removed. The reaction mixture was dissolved in chloroform and then washed with water. Magnesium sulfate and acid clay were added thereto, stirred, filtered and concentrated under reduced pressure. Subsequently, the resultant product was subjected to column chromatographic separation under the conditions of ethyl acetate:hexane=1:50 (v:v) to produce Compound A1 (41 g, yield: 82%).

(2) Preparation of Compound 1-1a

Iridium chloride (10 g, 33 mmol) and Compound A1 (11.4 g, 0.073 mol) were added to 2-ethoxyethanol (1000 mL) and distilled water (330 mL) in a round bottom flask, and the mixture was heated and stirred for 24 hours. The reaction mixture was cooled to room temperature, filtered and washed with 2 L of ethanol to produce a solid compound 1-1a (9.7 g, yield: 55%).

(3) Preparation of Compound B1

After Compound 1-1a (9.7 g, 9 mmol) was dissolved in methylene chloride (500 mL), AgOTf (14.6 g, 18.9 mmol) was dissolved in methanol (250 mL) and added thereto, and the mixture was then stirred at room temperature while blocking light. After 24 hours, the resulting mixture was filtered to remove the solvent of the filtrate and precipitated with toluene to give Compound B1 without further purification (yield: 93%).

Preparation Example 1-2

Preparation of Compounds A2 and B2

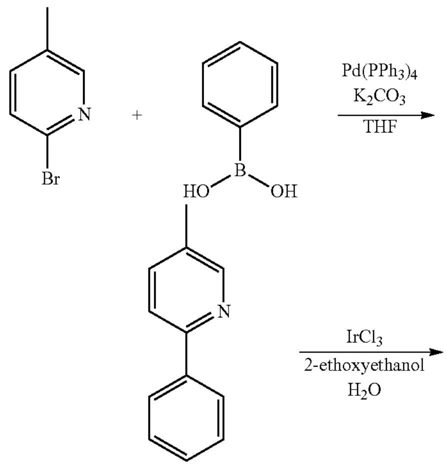

A2

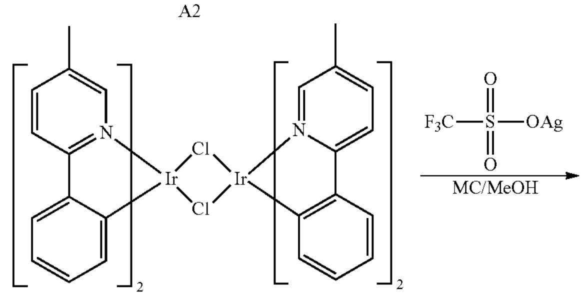

1-1b

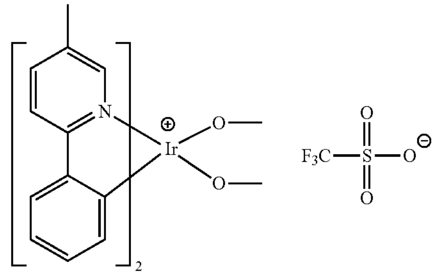

B2

(1) Preparation of Compound A2

Compound A2 (28 g, yield: 80%) was prepared in the same manner as in the method for preparing Compound A1, except that 2-bromo-5-methylpyridine (35.0 g, 0.20 mol) was used instead of 2-bromopyridine.

(2) Preparation of Compound 1-1b

Compound 1-1 b (10 g, yield 57%) was prepared in the same manner as in the method for preparing Compound 1-1a, except that Compound A2 was used instead of Compound A1.

(3) Preparation of Compound B2

Compound B2 (yield: 92%) was prepared in the same method as in the method for preparing Compound B1, except that Compound 1-1 b was used instead of Compound 1-1a.

Preparation Example 1-3

Preparation of Compounds A3 and B3

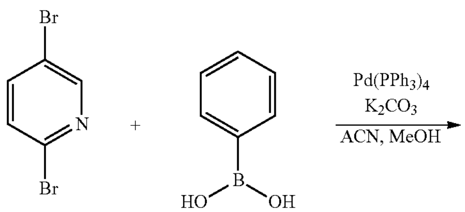

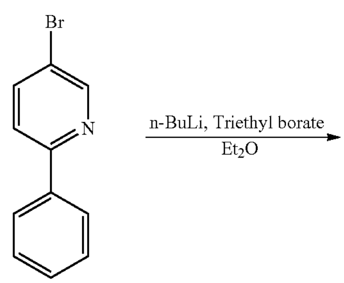

1-1c

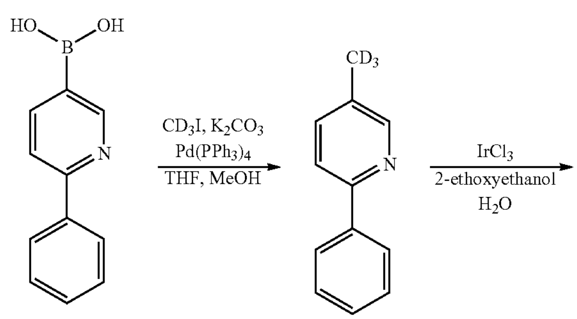

1-1d A3

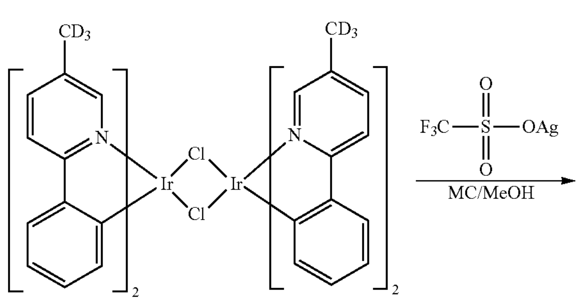

1-1e

-continued

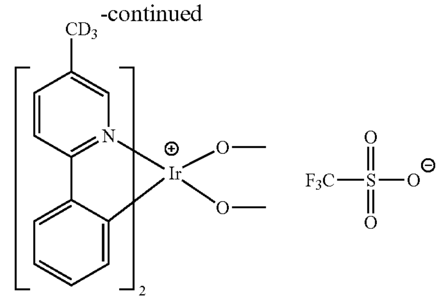

B3

(1) Preparation of Compound 1-1c

After 2,5-bromopyridine (55 g, 0.23 mol) and phenylboronic acid (31 g, 0.25 mol) were dissolved in acetonitrile (200 mL) and methanol (200 mL) in a round bottom flask under a nitrogen atmosphere, 2M aqueous potassium carbonate solution (150 mL) was added and tetrakis(triphenylphosphine)palladium (7.4 g, 6.4 mmol) was added, and then the mixture was heated and stirred at 50° C. for 18 hours. After completion of the reaction, the temperature was lowered, the aqueous layer was separated, and then the organic layer solvent was removed. The reaction mixture was dissolved in chloroform and then washed with water. Magnesium sulfate and acid clay were added thereto, stirred, filtered and concentrated under reduced pressure. Subsequently, the resultant product was subjected to column chromatographic separation under the conditions of hexane: methylene chloride=1:100 (v:v) to give Compound 1-1c (41 g, yield: 76%).

(2) Preparation of Compound 1-1d

After 5-brobo-2-phenylpyridine (41 g, 0.17 mol) was dissolved in diethylether in a round bottom flask under a nitrogen atmosphere, 2.5 M n-BuLi (12 g, 0.18 mol) was added thereto at −78° C., and then stirred for one hour. Triethyl borate (37 g, 0.25 mol) was added thereto at −78° C., and then stirred at room temperature for 4 hours. 2M aqueous hydrochloride solution (100 mL) was added and stirred for 30 minutes, and then neutralized with 20% aqueous sodium hydroxide solution (100 mL). The aqueous layer was separated and then the organic layer solvent was removed. The resultant product was subjected to column chromatographic separation under the conditions of hexane: methylene chloride=1:100 (v:v) to give Compound 1-1d (15 g, yield: 45%).

(3) Preparation of Compound A3

After (6-phenylpyridin-3-yl)boronic acid (15 g, 0.076 mol) and iodomethane-d3 (24.6 g, 0.17 mol) were dissolved in tetrahydrofuran (150 mL) and methanol (70 mL) in a round bottom flask under a nitrogen atmosphere, 2M aqueous potassium carbonate solution (100 mL) was added and tetrakis(triphenylphosphine)palladium (2.6 g, 2.3 mmol) was added, and then the mixture was heated and stirred at 40° C. for 16 hours. The reaction mixture was dissolved in chloroform and then washed with water. Magnesium sulfate and acid clay were added thereto, stirred, filtered and concentrated under reduced pressure. Subsequently, the resultant product was subjected to column chromatographic separation under the conditions of hexane:ethyl acetate=1: 50 (v:v) to give Compound A3 (6.9 g, yield: 53%).

(4) Preparation of Compound 1-1e

Compound 1-1e (4 g, yield: 60%) was prepared in the same manner as in the method of preparing Compound 1-1a, except that Compound A3 was used instead of Compound A1.

(5) Preparation of Compound B3

Compound B3 (yield: 96%) was prepared in the same manner as in the method of preparing Compound B1, except that Compound 1-1e was used instead of Compound 1-1a.

Preparation Example 1-4

Preparation of Compounds A4 and B4

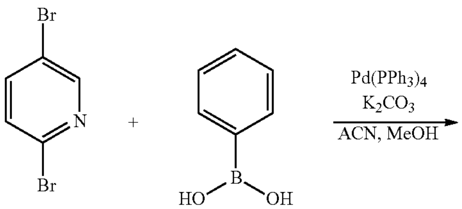

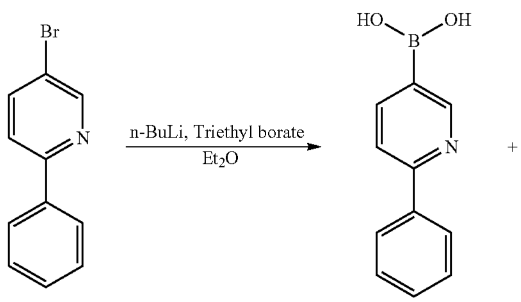

1-1c 1-1d

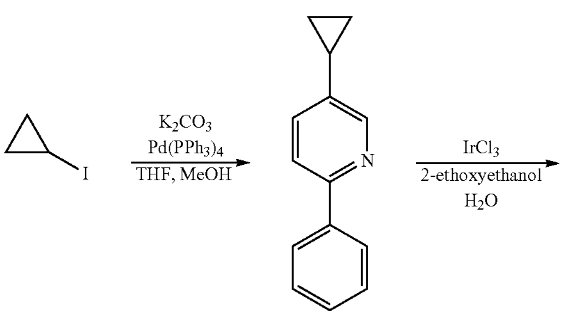

A4

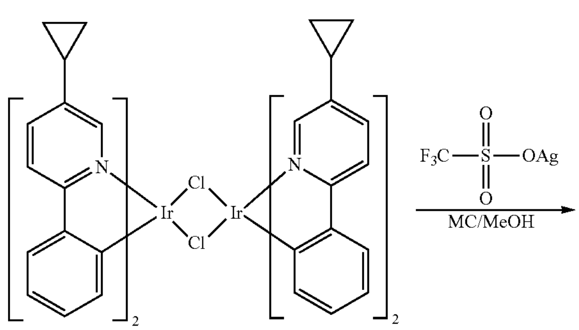

1-1f

-continued

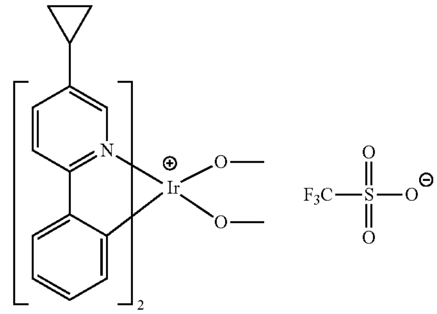

B4

(1) Preparation of Compound A4

Compound A4 (14 g, yield: 78%) was prepared in the same manner as in the method for preparing Compound A3, except that iodocyclopropane was used instead of iodomethane-d3.

(2) Preparation of Compound 1-1f

Compound 1-1f (8 g, yield: 63%) was prepared in the same manner as in the method for preparing Compound 1-1a, except that Compound A4 was used instead of Compound A1.

(3) Preparation of Compound B4

Compound B4 (yield: 91%) was prepared in the same manner as in the method for preparing Compound B1, except that Compound 1-1f was used instead of Compound 1-1a.

Preparation Example 1-5

Preparation of Compounds A5 and B5

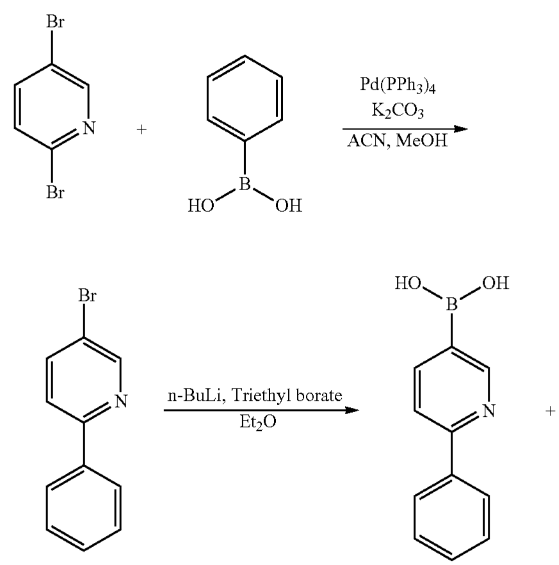

1-1c 1-1d

-continued

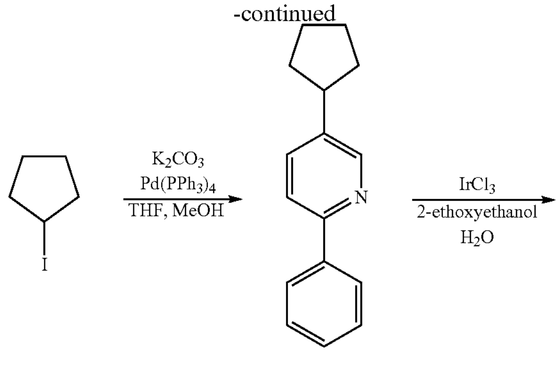

A5

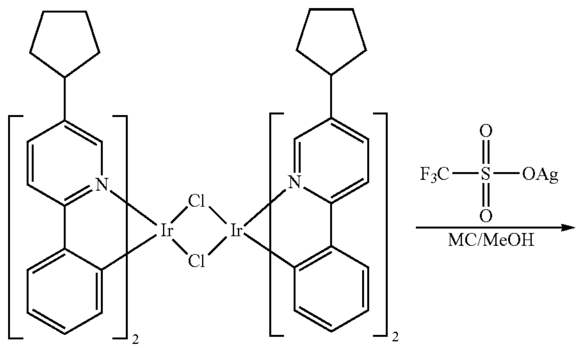

1-1g

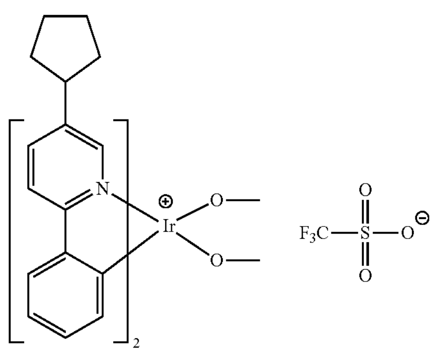

B5

(1) Preparation of Compound A5

Compound A5 (23 g, yield: 69%) was prepared in the same manner as in the method for preparing Compound A3, except that iodocyclopentane was used instead of iodomethane-d3.

(2) Preparation of Compound 1-1g

Compound 1-1g (12 g, yield: 52%) was prepared in the same manner as in the method for preparing Compound 1-1a, except that Compound A5 was used instead of Compound A1.

(3) Preparation of Compound B5

Compound B5 (yield: 93%) was prepared in the same manner as in the method for preparing Compound B1, except that Compound 1-1g was used instead of Compound 1-1a.

Preparation Example 1-6

Preparation of Compounds A6 and B6

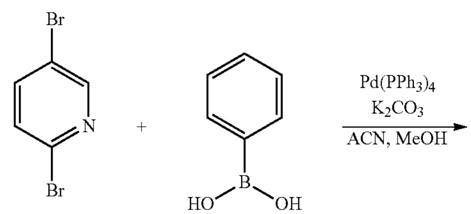

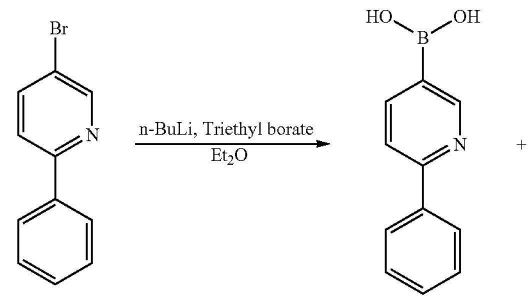

1-1c 1-1d

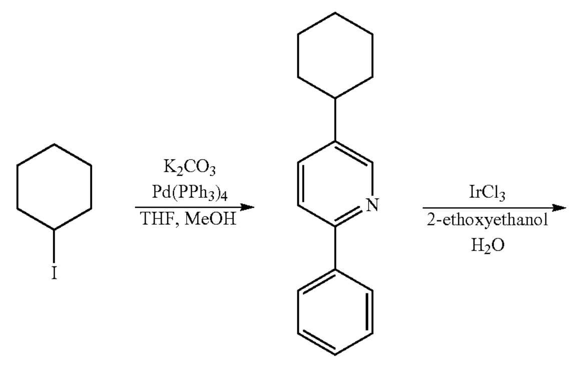

A6

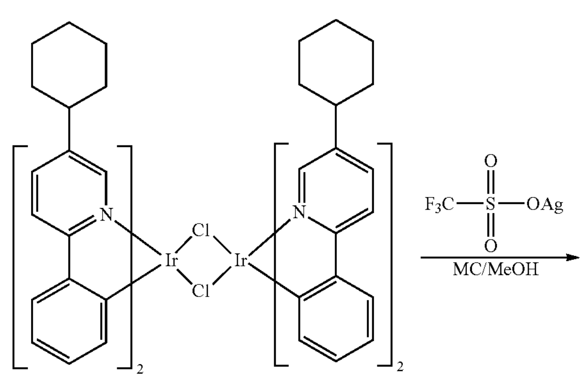

1-1h

-continued

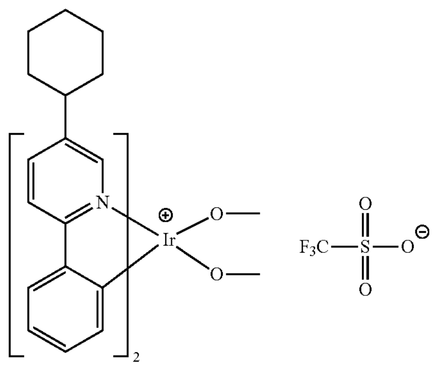

B6

(1) Preparation of Compound A6

Compound A6 (18 g, yield: 64%) was prepared in the same manner as in the method for preparing Compound A3, except that iodocyclohexane was used instead of iodomethane-d3.

(2) Preparation of Compound 1-1h

Compound 1-1h (9.4 g, yield: 53%) was prepared in the same manner as in the method for preparing Compound 1-1a, except that Compound A6 was used instead of Compound A1.

(3) Preparation of Compound B6

Compound B6 (yield: 95%) was prepared in the same manner as in the method for preparing Compound B1, except that Compound 1-1h was used instead of Compound 1-1a.

Preparation Example 2-1

Preparation of Compounds C1 and D1

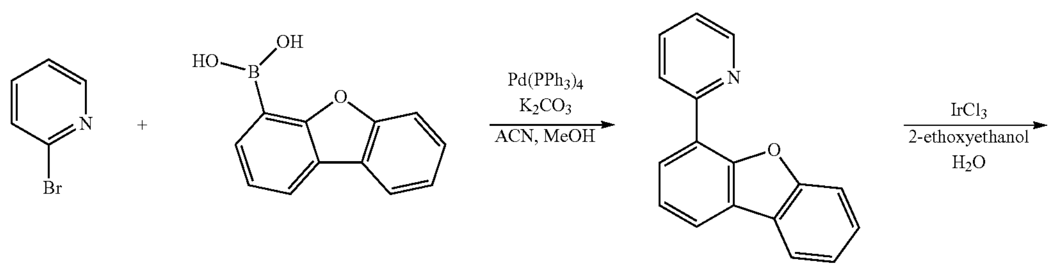

C1

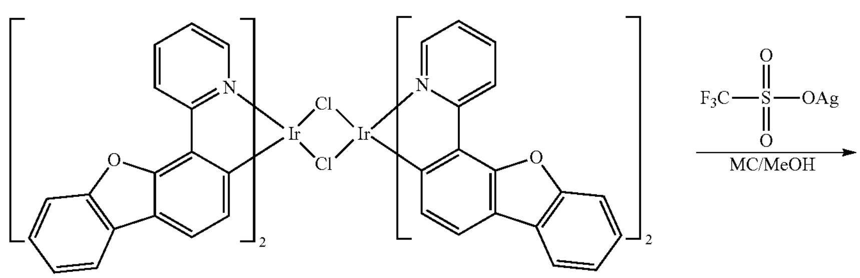

2-1a

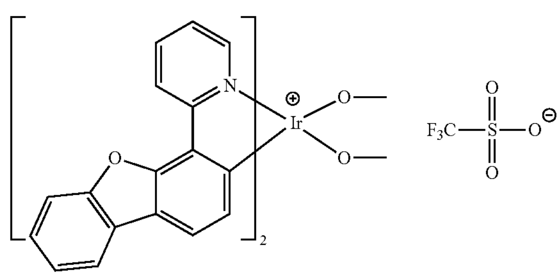

D1

(1) Preparation of Compound C1

After 2-bromopyridine (50 g, 0.32 mol) and 4-(dibenzofuranyl)boronic acid (71 g, 0.34 mol) were dissolved in tetrahydrofuran (500 mL) and methanol (250 mL) in a round bottom flask under a nitrogen atmosphere, 2M aqueous potassium carbonate solution (250 mL) was added and tetrakis(triphenylphosphine)palladium (7.4 g, 6.4 mmol) was added and then the mixture was heated and stirred at 80° C. for 8 hours. After completion of the reaction, the temperature was lowered, the aqueous layer was separated, and then the organic layer solvent was removed. The reaction mixture was dissolved in chloroform and then washed with water. Magnesium sulfate and add clay were added thereto, stirred, filtered and concentrated under reduced pressure. Subsequently, the resultant product was subjected to column chromatographic separation under the conditions of ethyl-acetate:hexane=1:50 (v:v) to produce Compound C1 (69 g, yield: 88%).

(2) Preparation of Compound 2-1 a

Compound 2-1a (21 g, yield: 48%) was prepared in the same manner as in the method for preparing Compound 1-1a, except that Compound C1 was used instead of Compound A1.

(3) Preparation of Compound D1

Compound D1 (yield: 93%) was prepared in the same manner as in the method for preparing Compound B1, except that Compound 2-1a was used instead of Compound 1-1a.

Preparation Example 2-2

Preparation of Compounds C2 and D2

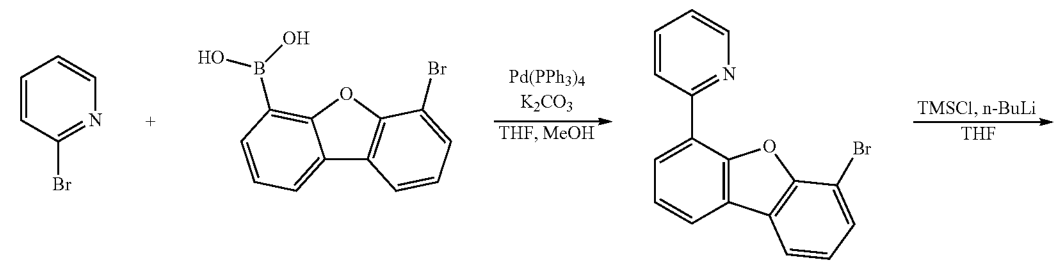

2-1b

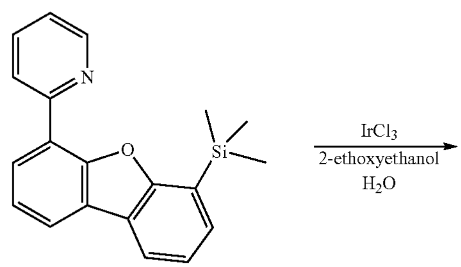

C2

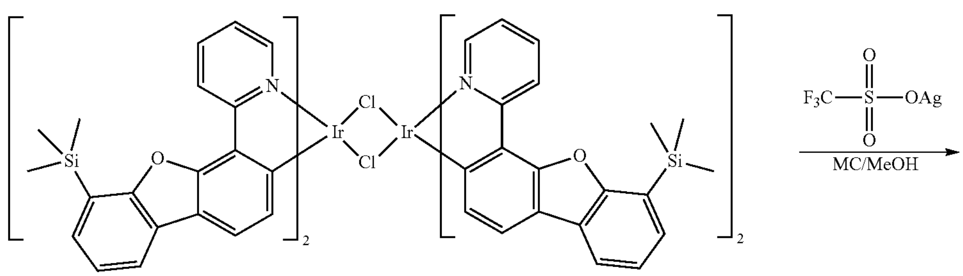

2-1c

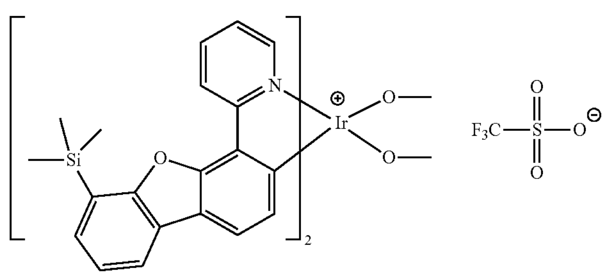

D2

(1) Preparation of Compound 2-1b

Compound 2-1b (52 g, yield: 81%) was prepared in the same manner as in the method for preparing Compound C1, except that (6-bromodibenzo[b,d]furan-4-yl)boronic acid was used instead of 4-(dibenzofuranyl)boronic acid.

(2) Preparation of Compound C2

After Compound 2-1 b (20 g, 0.061 mol) was dissolved in tetrahydrofuran (400 mL) in a round bottom flask under a nitrogen atmosphere, 2.5M n-BuLi (4.3 g, 0.67 mol) was added thereto at −78° C. and then stirred for 1 hour. Chlorotrimethylsilane (10.0 g, 0.10 mol) was added thereto at −78° C. and the mixture was stirred at room temperature for 10 hours. The organic layer was extracted using methylene chloride, magnesium sulfate and add day were added thereto, stirred, and filtered and concentrated under reduced pressure. Subsequently, the resultant product was subjected to column chromatographic separation under the conditions of hexane:ethylacetate=1:50 (v:v) to give Compound C2 (13 g, yield: 65%).

(3) Preparation of Compound 2-1c

Compound 2-1c (6g, yield: 54%) was prepared in the same manner as in the method for preparing Compound 1-1a, except that Compound C2 was used instead of Compound A1.

(4) Preparation of Compound D2

Compound D2 (yield: 90%) was prepared in the same manner as in the method for preparing Compound B1, except that Compound 2-1c was used instead of Compound 1-1a.

Preparation Example 2-3

Preparation of Compounds C3 and D3

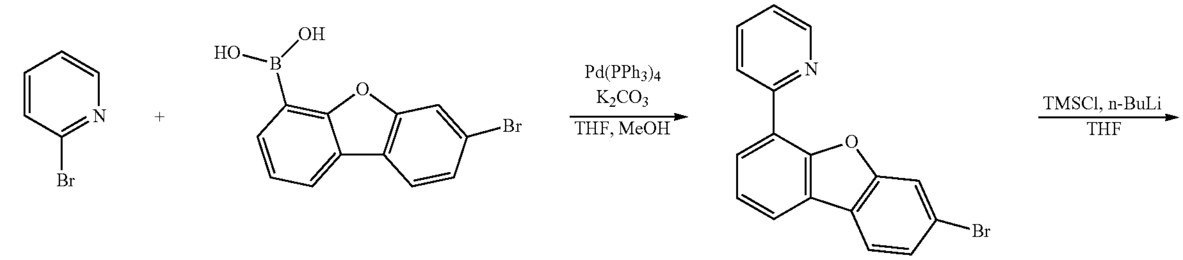

2-1d

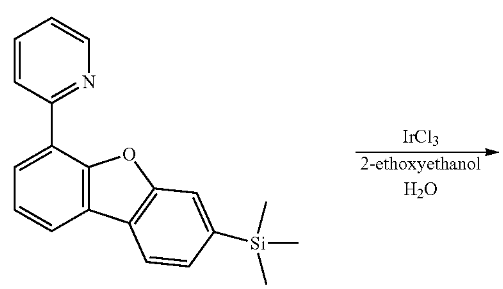

C3

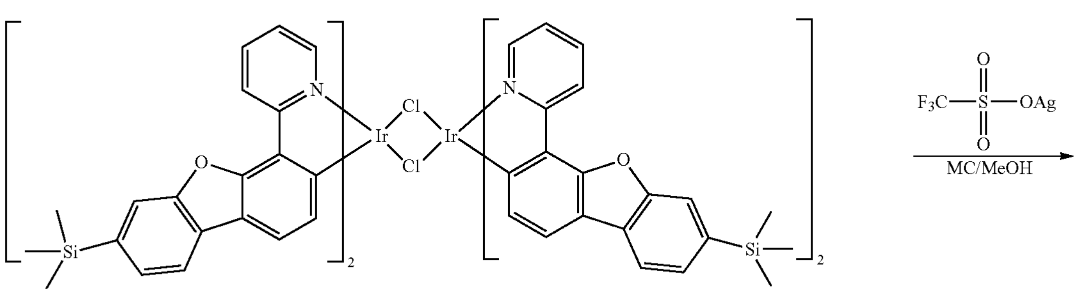

2-1e

-continued

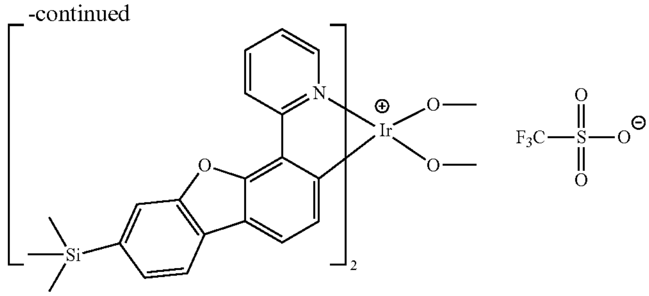

D3

(1) Preparation of Compound 2-1d

Compound 2-1d (60g, yield: 84%) was prepared in the same manner as in the method for preparing Compound C1, except that (7-bromodibenzo[b,d]furan-4-yl)boronic acid was used instead of 4-(dibenzofuranyl)boronic acid.

(2) Preparation of Compound C3

Compound C3 (53 g, yield: 91%) was prepared in the same manner as in the method for preparing Compound C2, except that Compound 2-1d was used instead of Compound 2-1b.

(3) Preparation of Compound 2-1e

Compound 2-1e (26 g, yield: 55%) was prepared in the same manner as in the method for preparing Compound 1-1a, except that Compound C3 was used instead of Compound A1.

(4) Preparation of Compound D3

Compound D3 (yield: 93%) was prepared in the same manner as in the method for preparing Compound B1, except that Compound 2-1e was used instead of Compound 1-1a.

Preparation Example 2-4

Preparation of Compounds C4 and D4

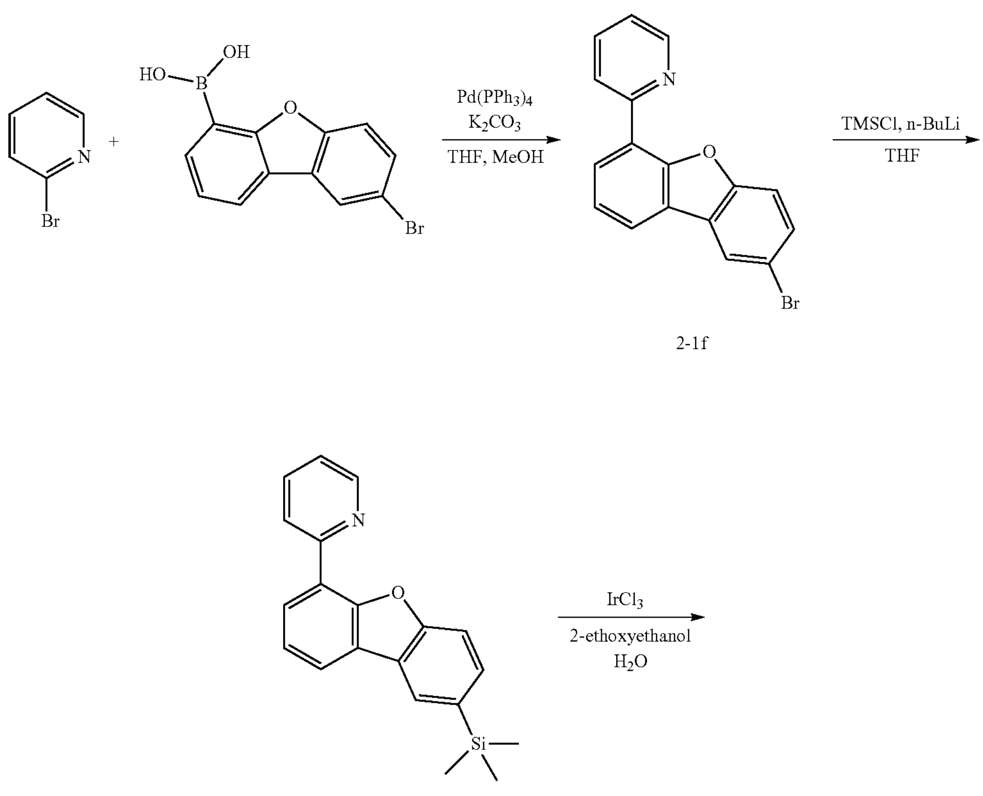

-continued

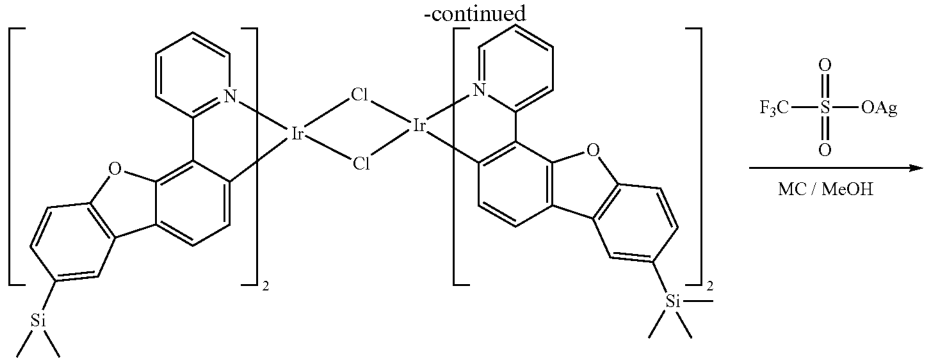

2-1g

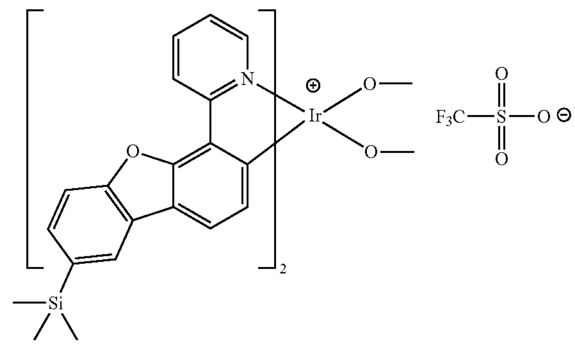

D4

(1) Preparation of Compound 2-1f

Compound 2-1f (54 g, yield: 77%) was prepared in the same manner as in the method for preparing Compound C1, except that (8-bromodibenzo[b,d]furan-4-yl)boronic acid was used instead of 4-(dibenzofuranyl)boronic acid.

(2) Preparation of Compound C4

Compound C4 (49 g, yield: 92%) was prepared in the same manner as in the method for preparing Compound C2, except that Compound 2-1f was used instead of Compound 2-1b.

(3) Preparation of Compound 2-1g

Compound 2-1g (28 g, yield: 54%) was prepared in the same manner as in the method for preparing Compound 1-1a, except that Compound C4 was used instead of Compound A1.

(4) Preparation of Compound D4

Compound D4 (yield: 92%) was prepared in the same manner as in the method for preparing Compound B1, except that Compound 2-1g was used instead of Compound 1-1a.

Preparation Example 2-5

Preparation of Compounds C5 and D5

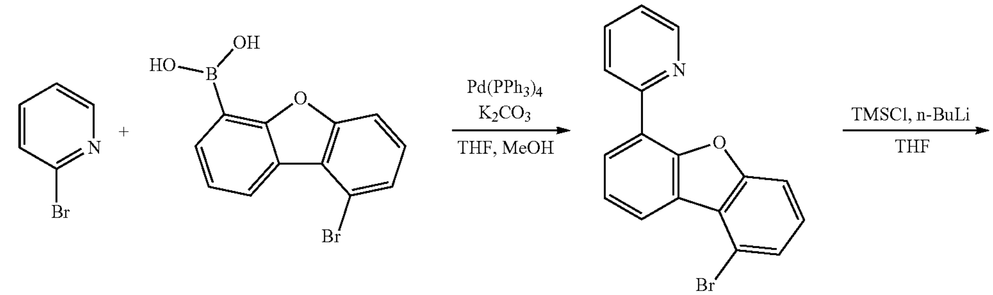

2-1h

-continued

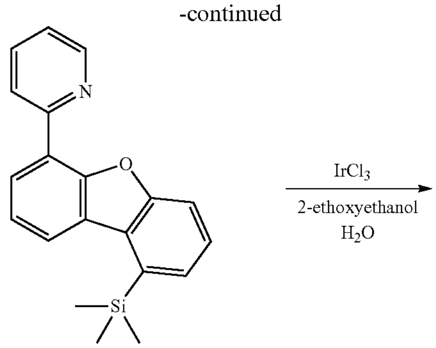

C5

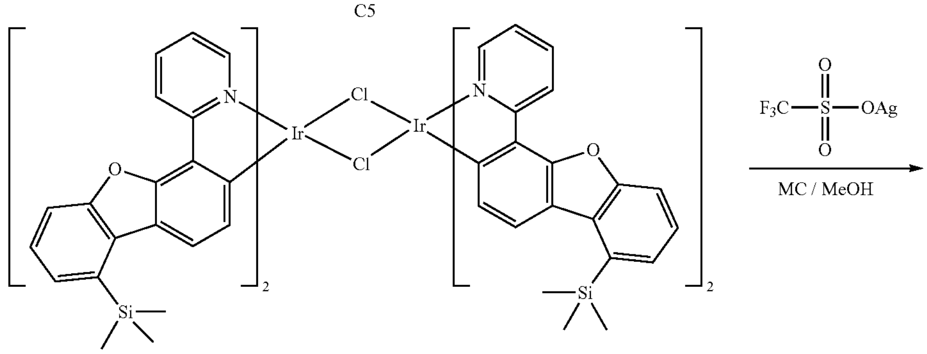

2-11

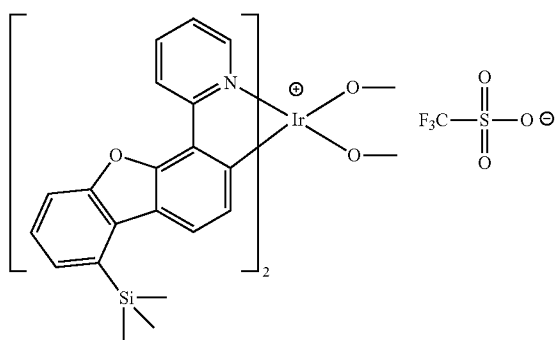

D5

(1) Preparation of Compound 2-1h

Compound 2-1h (66 g, yield: 82%) was prepared in the same manner as in the method for preparing Compound C1, except that (9-bromodibenzo[b,d]furan-4-yl)boronic acid was used instead of 4-(dibenzofuranyl)boronic acid.

(2) Preparation of Compound C5

Compound C5 (47 g, yield: 78%) was prepared in the same manner as in the method for preparing Compound C2, except that Compound 2-1h was used instead of Compound 2-1b.

(3) Preparation of Compound 2-1i

Compound 2-1i (22 g, yield: 48%) was prepared in the same manner as in the method for preparing Compound 1-1a, except that Compound C5 was used instead of Compound A1.

(4) Preparation of Compound D5

Compound D5 (yield: 90%) was prepared in the same manner as in the method for preparing Compound B1, except that Compound 2-1i was used instead of Compound 1-1a.

EXAMPLES

Example 1

Preparation of Compound 1

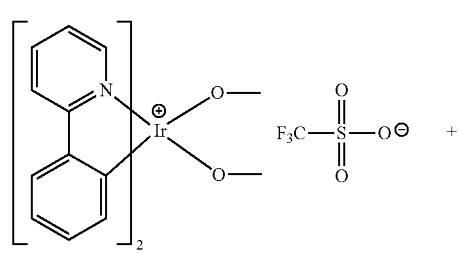

B1

-continued

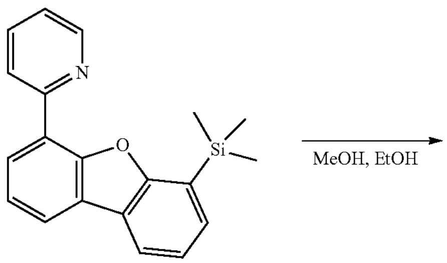

C2

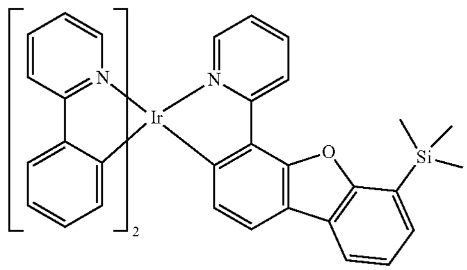

1

Compound B1 (10.2 g, 14 mmol), Compound C2 (11 g, 35 mmol), methanol (100 mL), and ethanol (100 mL) were added under a nitrogen atmosphere, and the mixture wad heated and stirred at 80° C. for 48 hours. After completion of the reaction, the reaction mixture was filtered and washed with ethanol and subjected to column chromatographic separation under the conditions of hexane:ethyl acetate=1:5 (v:v) to give Compound 1 (yield: 37%).

MS: $[M+H]^+$=818.3

Example 2

Preparation of Compound 2

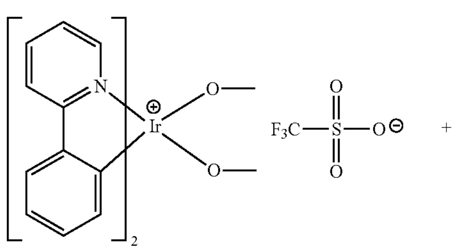

B1

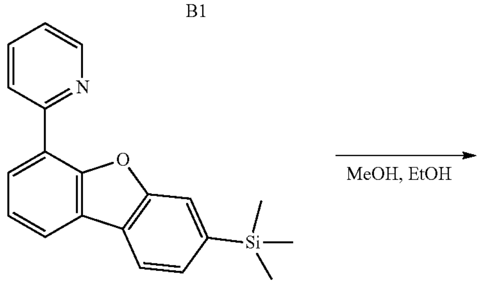

C3

-continued

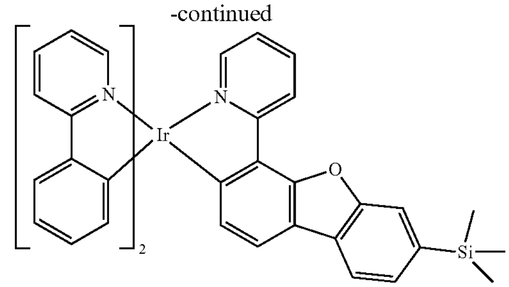

2

Compound 2 (yield: 49%) was prepared in the same manner as in the method for preparing Compound 1, except that Compound C3 was used instead of Compound C2.

MS: $[M+H]^+$=818.3

Example 3

Preparation of Compound 3

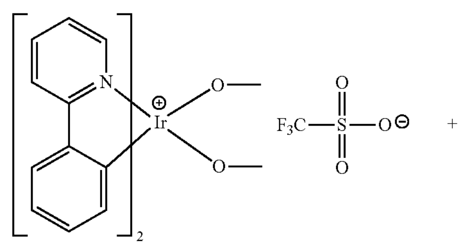

B1

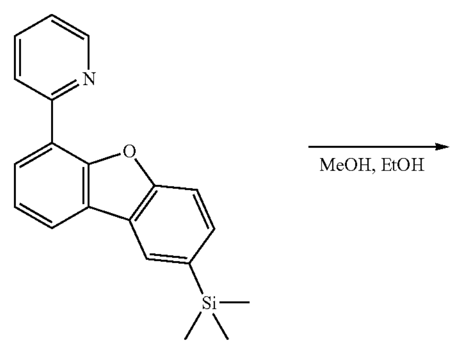

C4

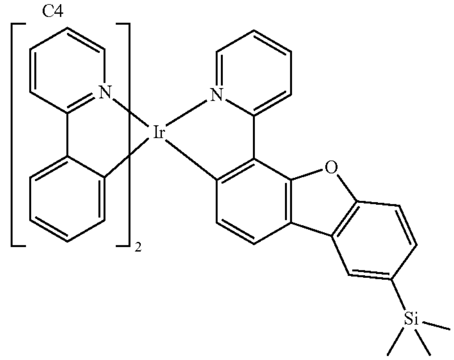

3

Compound 3 (yield: 41%) was prepared in the same manner as in the method for preparing Compound 1, except that Compound C4 was used instead of Compound C2.

MS: $[M+H]^+$=818.3

Example 4

Preparation of Compound 4

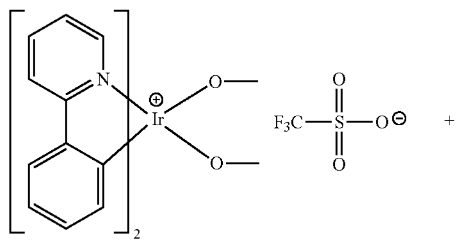

B1

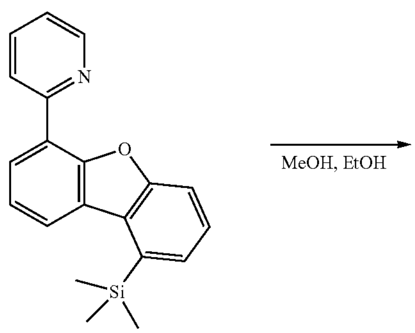

C5

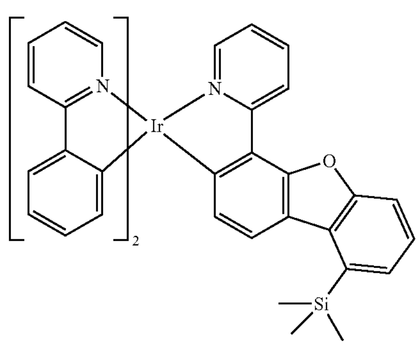

4

Compound 4 (yield: 38%) was prepared in the same manner as in the method for preparing Compound 1, except that Compound C5 was used instead of Compound C2.

MS: $[M+H]^+$=818.3

Example 5

Preparation of Compound 5

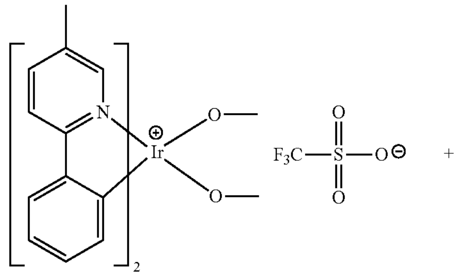

B2

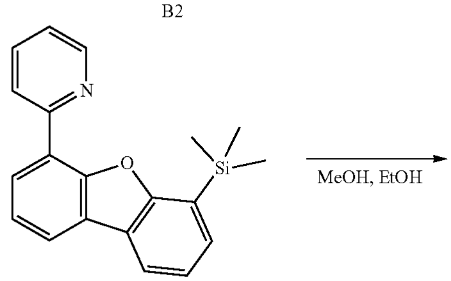

C2

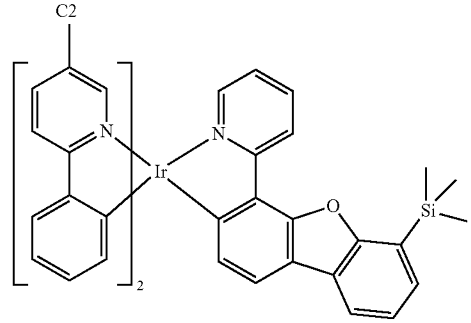

5

Compound 5 (yield: 51%) was prepared in the same manner as in the method for preparing Compound 1, except that Compound B2 was used instead of Compound B1.

MS: $[M+H]^+$=846.3

Example 6

Preparation of Compound 6

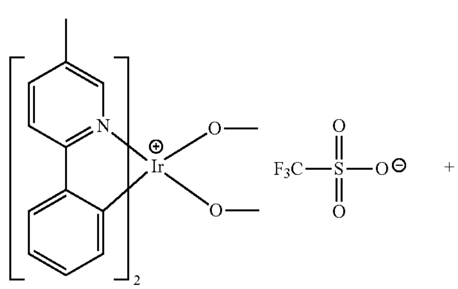

B2

-continued

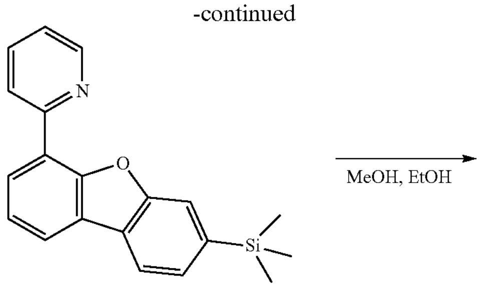

C3

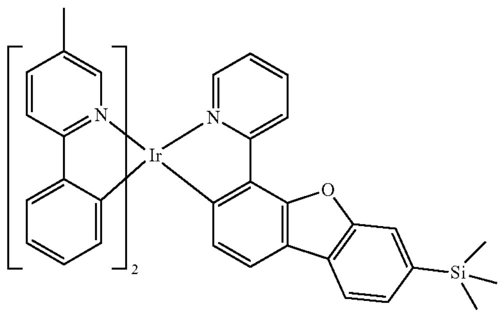

6

Compound 6 (yield: 49%) was prepared in the same manner as in the method for preparing Compound 1, except that Compound B2 and Compound C3 were used instead of Compound B1 and Compound C2, respectively.

MS: $[M+H]^+$=846.3

Example 7

Preparation of Compound 7

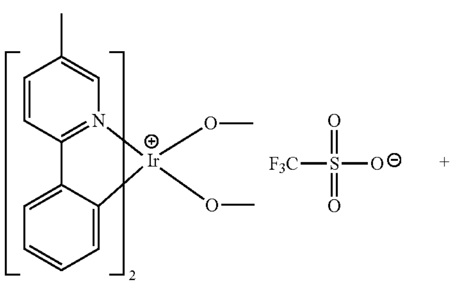

B2

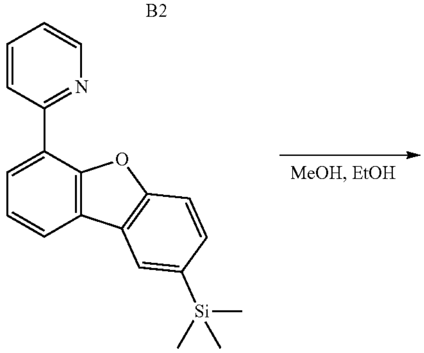

C4

-continued

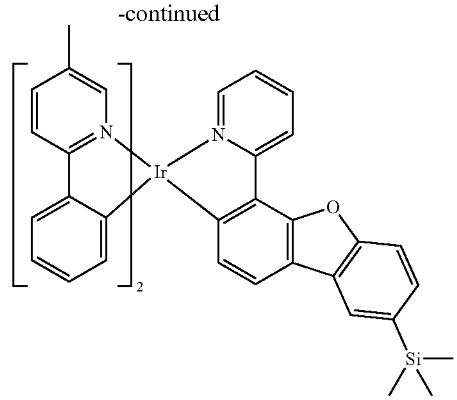

7

Compound 7 (yield: 43%) was prepared in the same manner as in the method for preparing Compound 1, except that Compound B2 and Compound C4 were used instead of Compound B1 and Compound C2, respectively.

MS: $[M+H]^+$=846.3

Example 8

Preparation of Compound 8

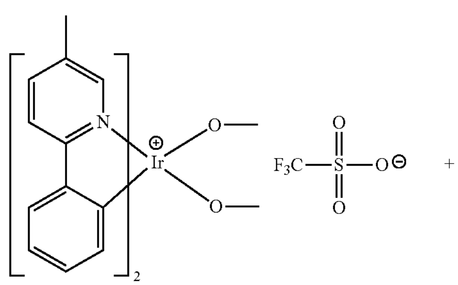

B2

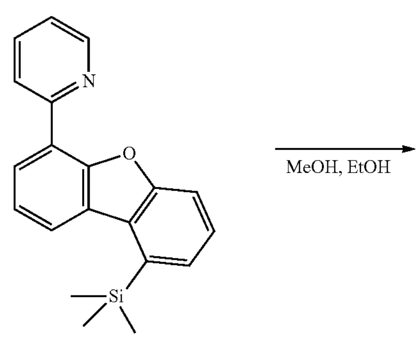

C5

-continued

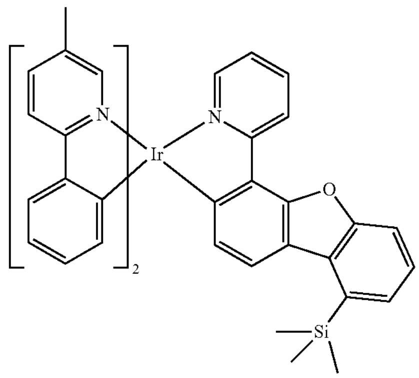

8

Compound 8 (yield: 51%) was prepared in the same manner as in the method for preparing Compound 1, except that Compound B2 and Compound C5 were used instead of Compound B1 and Compound C2, respectively.

MS: $[M+H]^{+}$=846.3

Example 9

Preparation of Compound 9

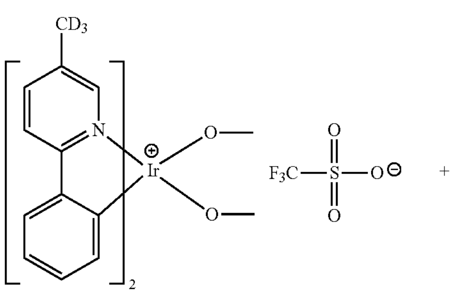

B3

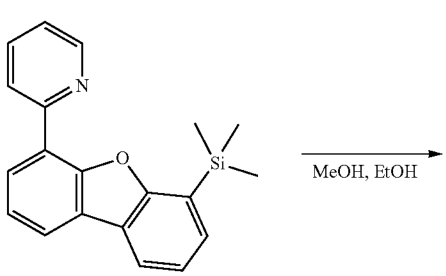

C2

-continued

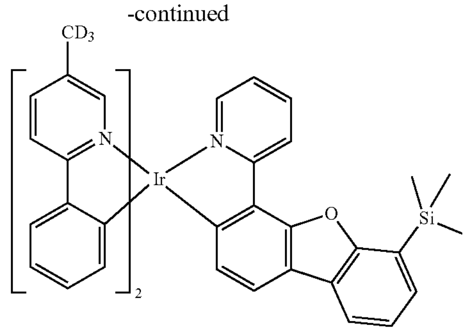

9

Compound 9 (yield: 45%) was prepared in the same manner as in the method for preparing Compound 1, except that Compound B3 was used instead of Compound B1.

MS: $[M+H]^{+}$=852.3

Example 10

Preparation of Compound 10

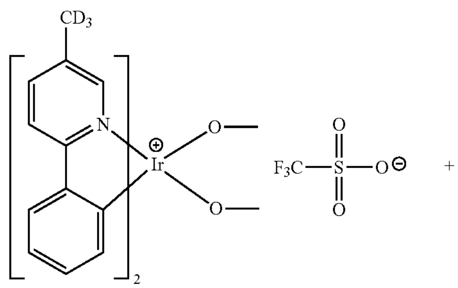

B3

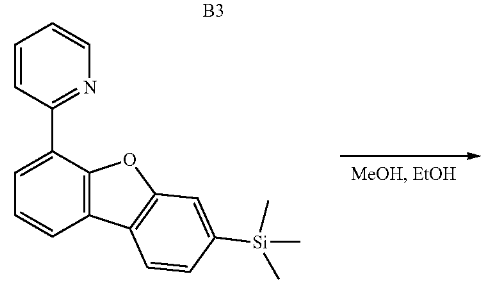

C3

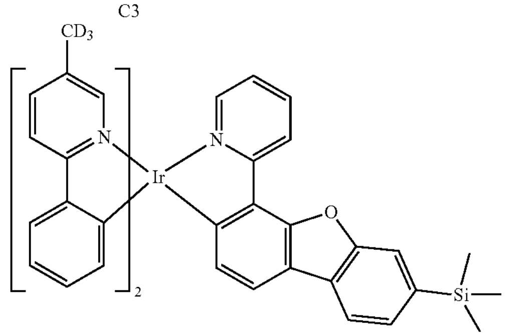

10

Compound 10 (yield: 39%) was prepared in the same manner as in the method for preparing Compound 1, except that Compound B3 and Compound C3 were used instead of Compound B1 and Compound C2, respectively.

MS: $[M+H]^+$=852.3

Example 11

Preparation of Compound 11

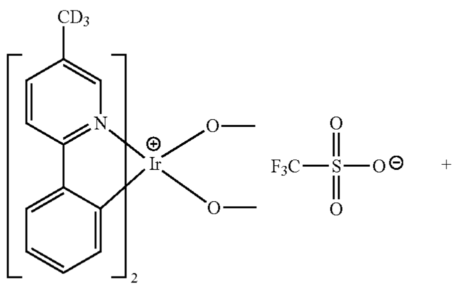

B3

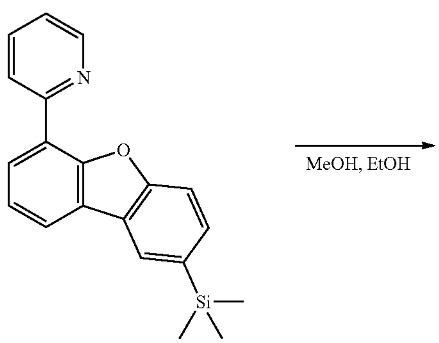

C4

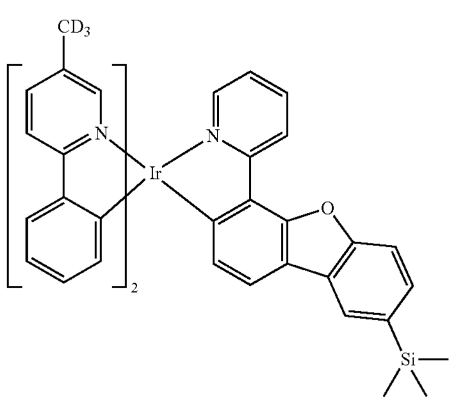

11

Compound 11 (yield: 45%) was prepared in the same manner as in the method for preparing Compound 1, except that Compound B3 and Compound C4 were used instead of Compound B1 and Compound C2, respectively.

MS: $[M+H]^+$=852.3

Example 12

Preparation of Compound 12

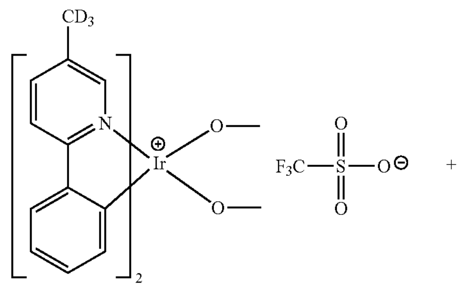

B3

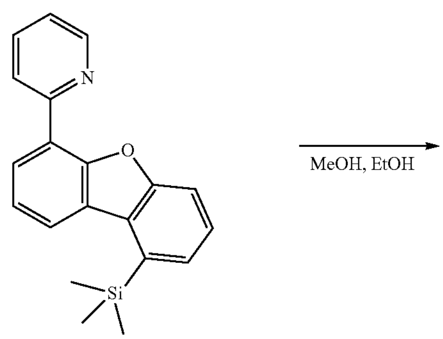

C5

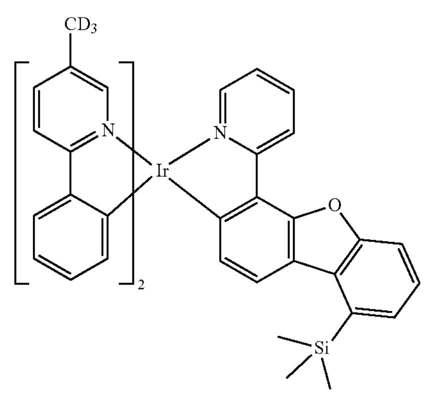

12

Compound 12 (yield: 45%) was prepared in the same manner as in the method for preparing Compound 1, except that Compound B3 and Compound C5 were used instead of Compound B1 and Compound C2, respectively.

MS: $[M+H]^+$=852.3

Example 13

Preparation of Comnound 13

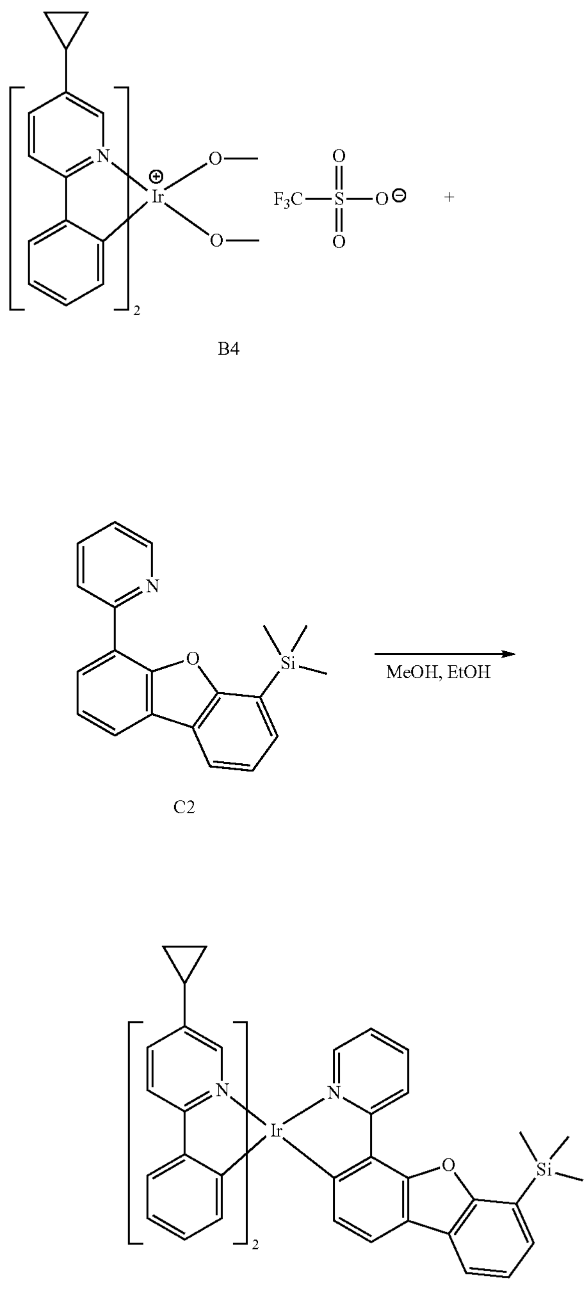

B4

C2

13

Compound 13 (yield: 41%) was prepared in the same manner as in the method for preparing Compound 1, except that Compound B4 was used instead of Compound B1.

MS: $[M+H]^+$=898.3

Example 14

Preparation of Compound 14

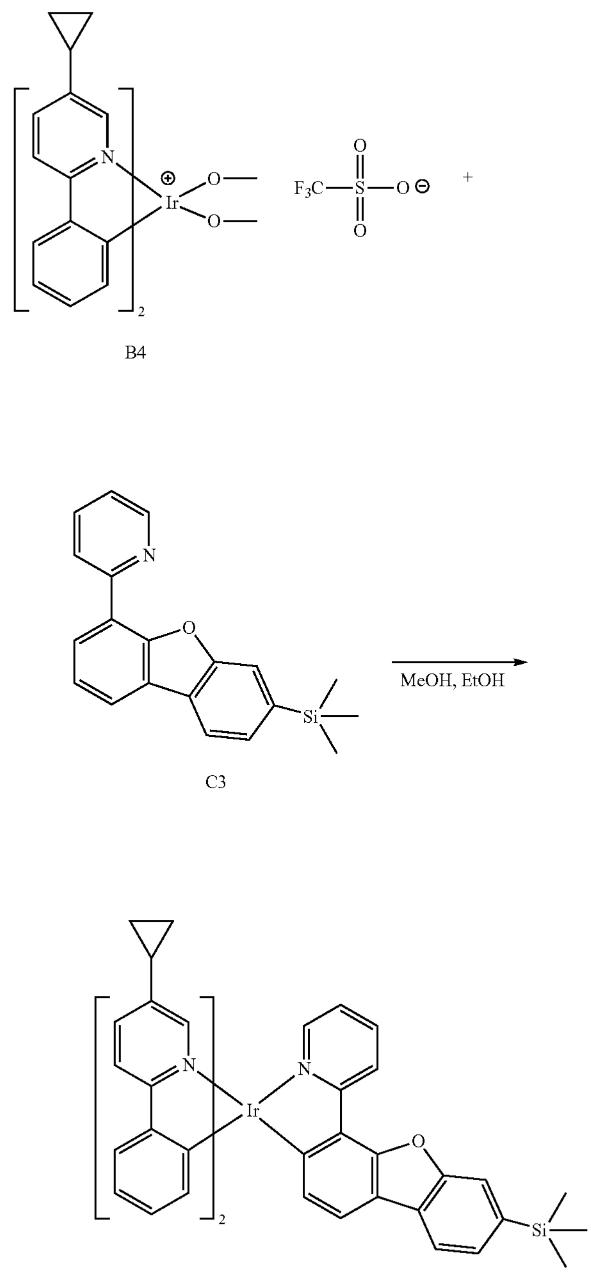

B4

C3

14

Compound 14 (yield: 41%) was prepared in the same manner as in the method for preparing Compound 1, except that Compound B4 and Compound C3 were used instead of Compound B1 and Compound C2, respectively.

MS: $[M+H]^+$=898.3

Example 15

Preparation of Compound 15

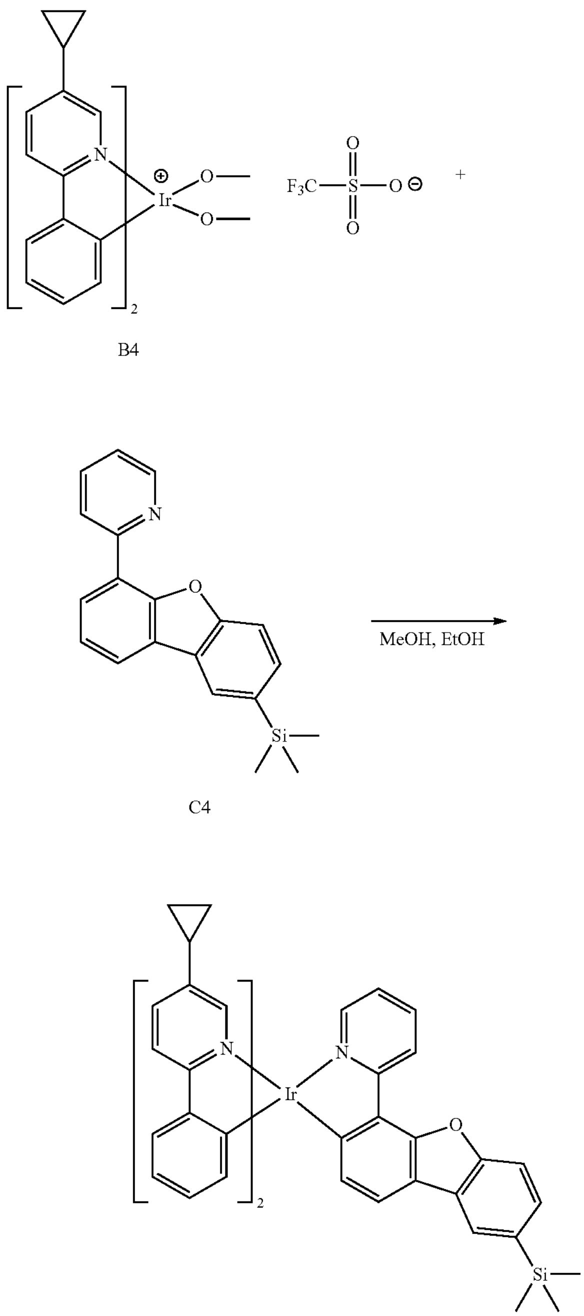

15

Compound 15 (yield: 38%) was prepared in the same manner as in the method for preparing Compound 1, except that Compound B4 and Compound C4 were used instead of Compound B1 and Compound C2, respectively.

MS: $[M+H]^+$=898.3

Example 16

Preparation of Compound 16

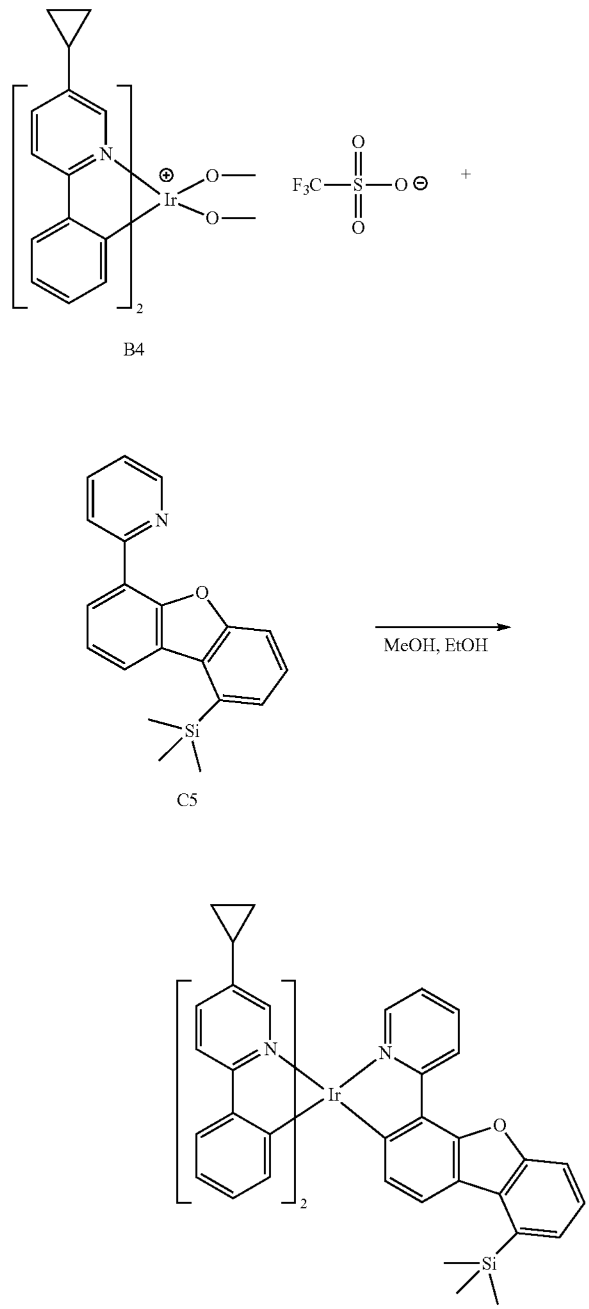

16

Compound 16 (yield: 45%) was prepared in the same manner as in the method for preparing Compound 1, except that Compound B4 and Compound C5 were used instead of Compound B1 and Compound C2, respectively.

MS: $[M+H]^+$=898.3

Example 17

Preparation of Compound 17

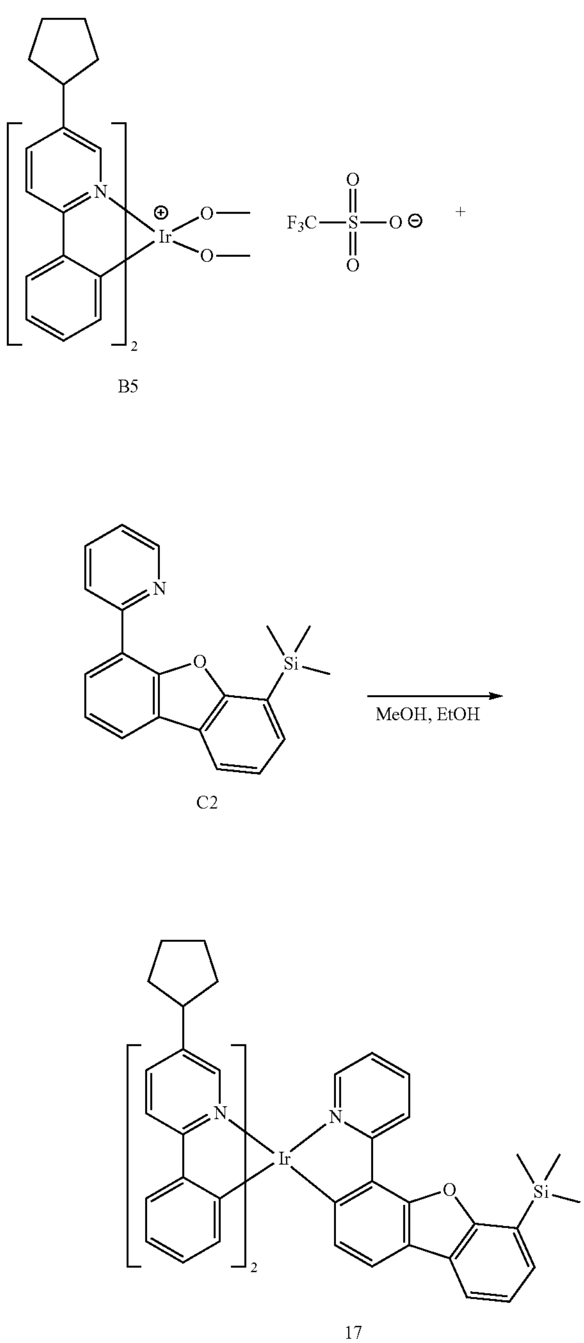

Compound 17 (yield: 43%) was prepared in the same manner as in the method for preparing Compound 1, except that Compound B5 was used instead of Compound B1.

MS: $[M+H]^+$=954.4

Example 18

Preparation of Compound 18

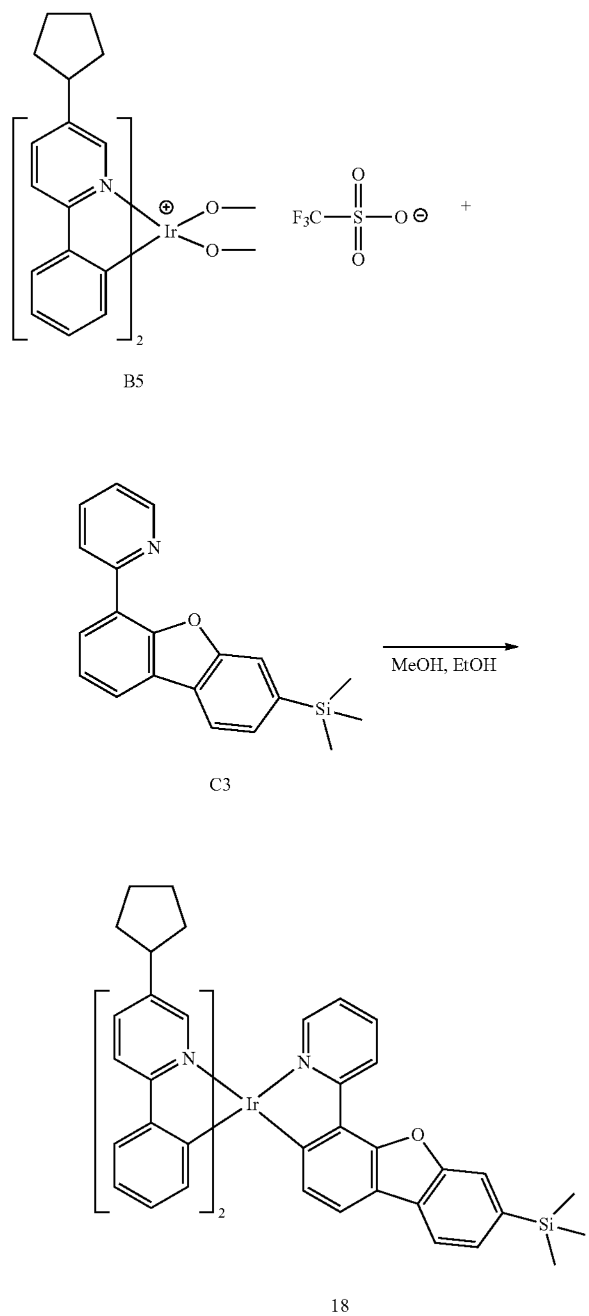

Compound 18 (yield: 40%) was prepared in the same manner as in the method for preparing Compound 1, except that Compound B5 and Compound C3 were used instead of Compound B1 and Compound C2.

MS: $[M+H]^+$=954.4

Example 19

Preparation of Compound 19

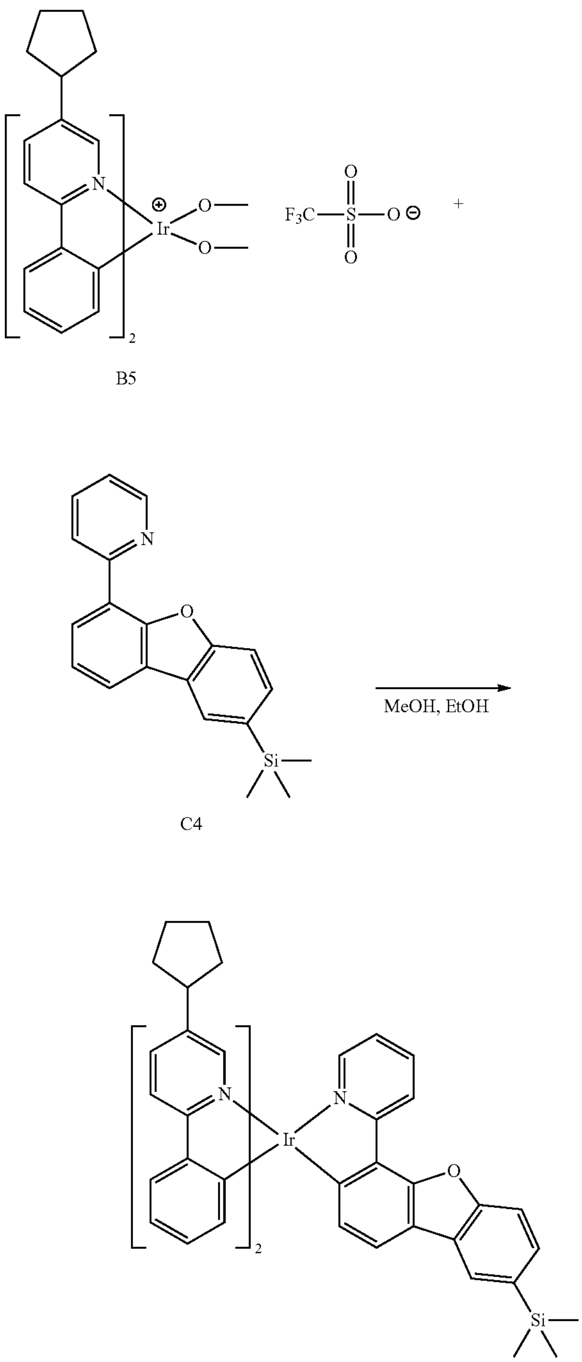

B5

C4

19

Compound 19 (yield: 41%) was prepared in the same manner as in the method for preparing Compound 1, except that Compound B5 and Compound C4 were used instead of Compound B1 and Compound C2, respectively.

MS: $[M+H]^+$=954.4

Example 20

Preparation of Compound 20

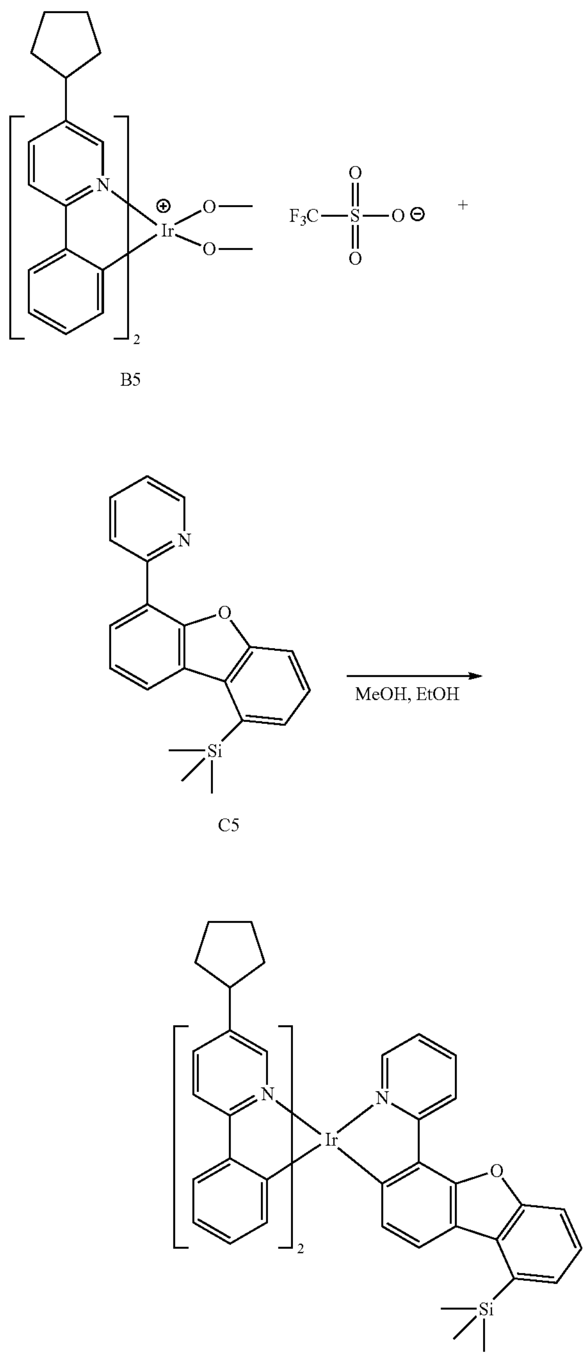

B5

C5

20

Compound 20 (yield: 44%) was prepared in the same manner as in the method for preparing Compound 1, except that Compound B5 and Compound C5 were used instead of Compound B1 and Compound C2.

MS: $[M+H]^+$=954.4

Example 21

Preparation of Compound 21

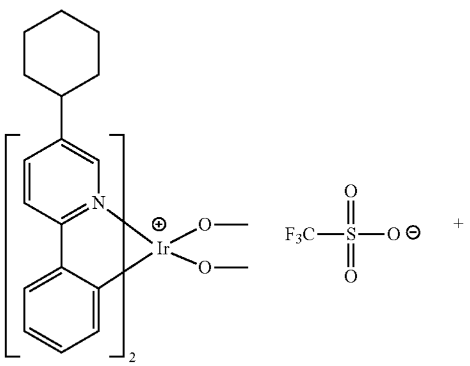

B6

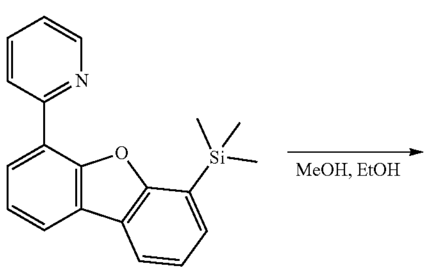

C2

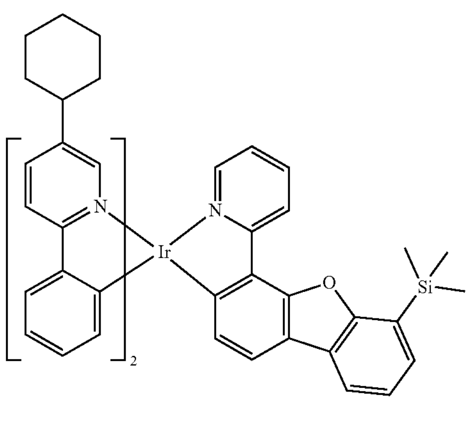

21

Compound 21 (yield: 39%) was prepared in the same manner as in the method for preparing Compound 1, except that Compound B6 was used instead of Compound B1.

MS: $[M+H]^+$=982.4

Example 22

Preparation of Compound 22

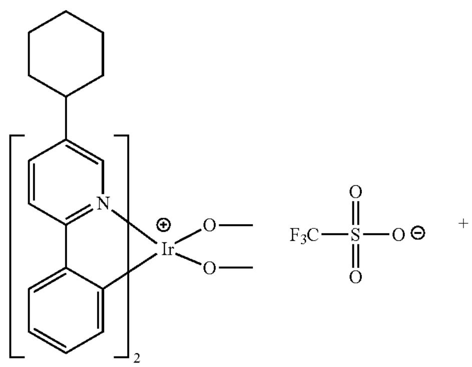

B6

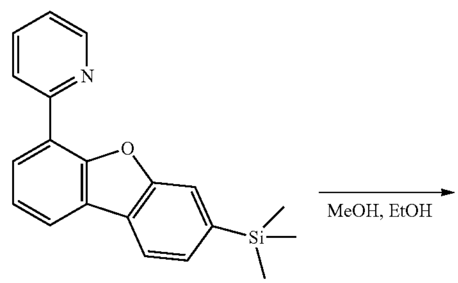

C3

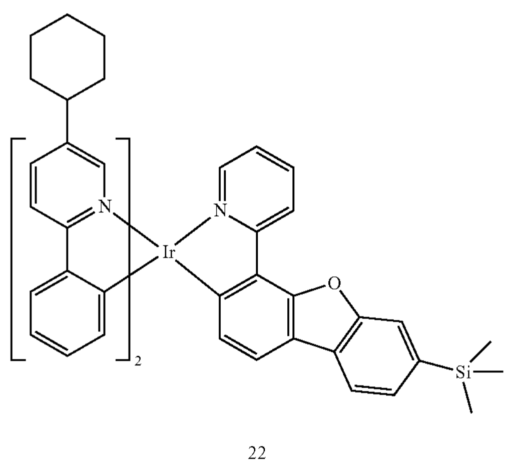

22

Compound 22 (yield: 48%) was prepared in the same manner as in the method for preparing Compound 1, except that Compound B6 and Compound C3 were used instead of Compound B1 and Compound C2, respectively.

MS: $[M+H]^+$=982.4

Example 23

Preparation of Compound 23

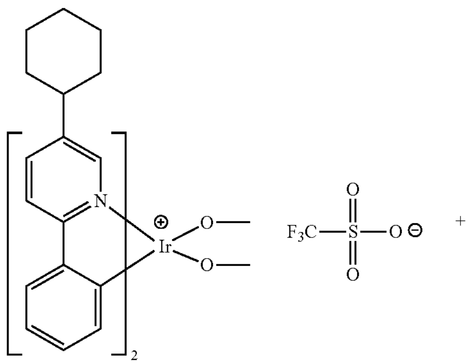

B6

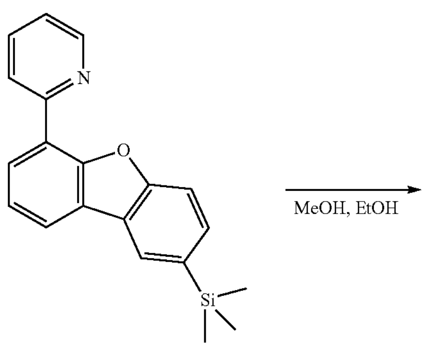

C4

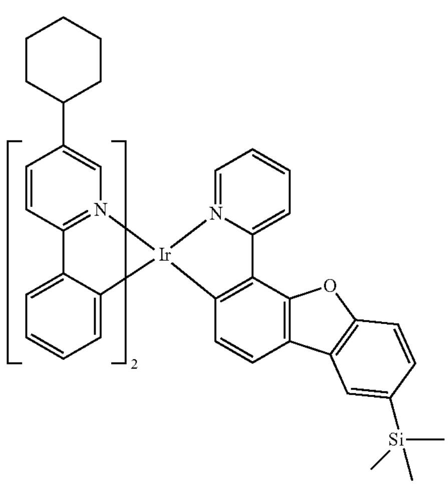

23

Compound 23 (yield: 46%) was prepared in the same manner as in the method for preparing Compound 1, except that Compound B6 and Compound C4 were used instead of Compound B1 and Compound C2, respectively.

MS: $[M+H]^+$=982.4

Example 24

Preparation of Compound 24

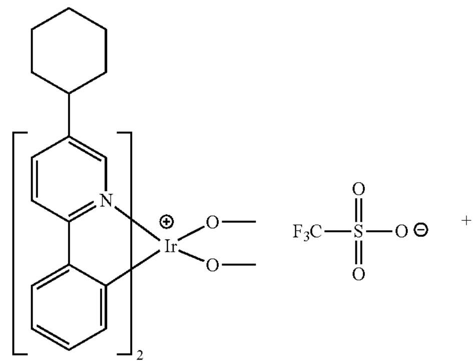

B6

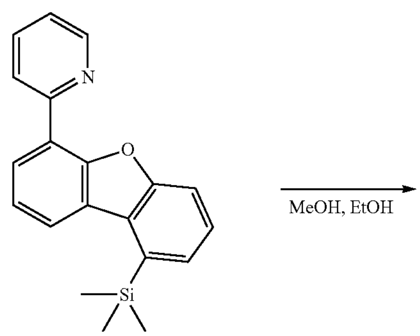

C5

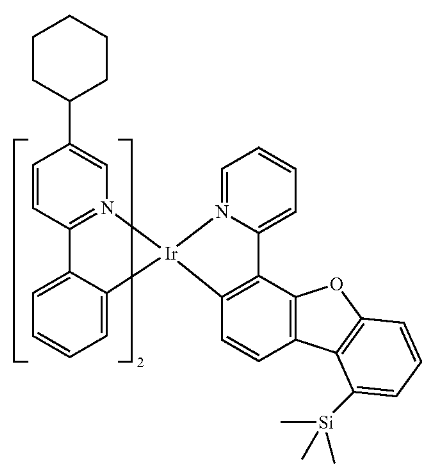

24

Compound 24 (yield: 46%) was prepared in the same manner as in the method for preparing Compound 1, except that Compound B6 and Compound C5 were used instead of Compound B1 and Compound C2, respectively.

MS: $[M+H]^+$=982.4

Example 25

Preparation of Compound 25

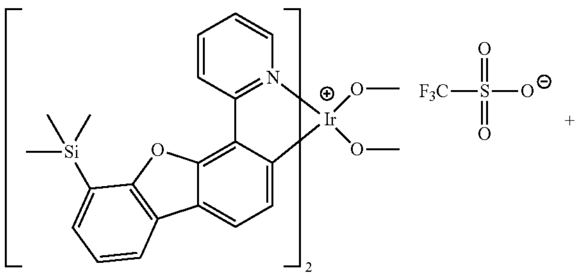

D2

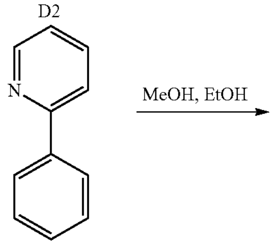

A1

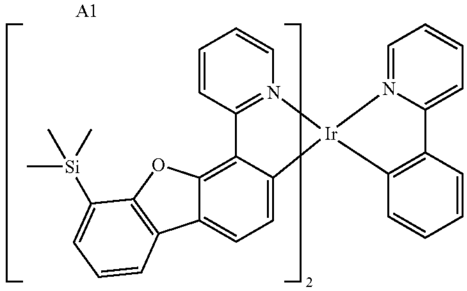

25

Compound 25 (yield: 39%) was prepared in the same manner as in the method for preparing Compound 1, except that Compound D2 and Compound A1 were used instead of Compound B1 and Compound C2, respectively.

MS: $[M+H]^+$=980.3

Example 26

Preparation of Compound 26

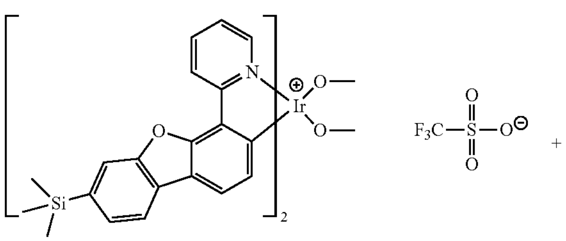

D3

-continued

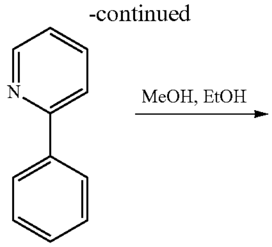

A1

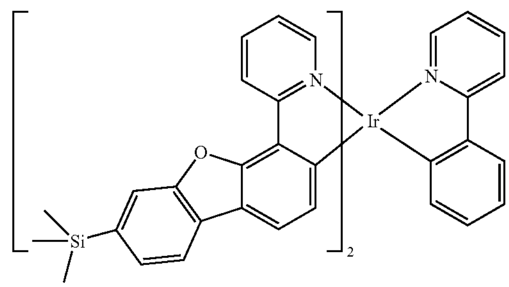

26

Compound 26 (yield: 42%) was prepared in the same manner as in the method for preparing Compound 1, except that Compound D3 and Compound A1 were used instead of Compound B1 and Compound C2, respectively.

MS: $[M+H]^+$=980.3

Example 27

Preparation of Compound 27

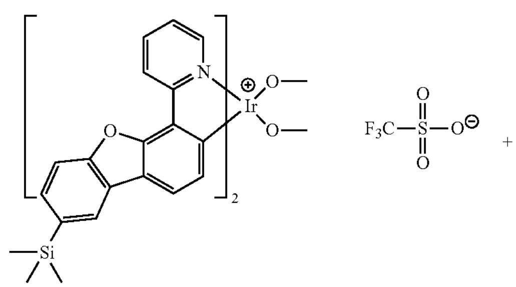

D3

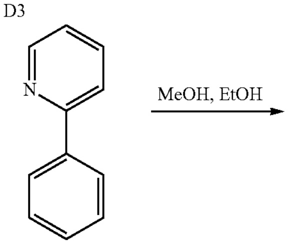

A1

-continued

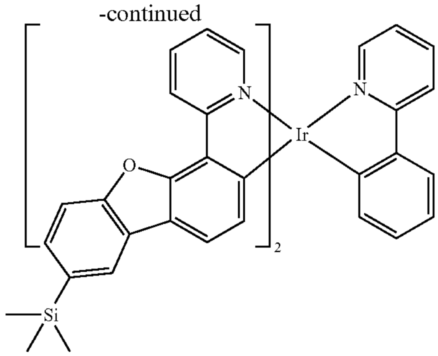

27

Compound 27 (yield: 39%) was prepared in the same manner as in the method for preparing Compound 1, except that Compound D4 and Compound A1 were used instead of Compound B1 and Compound C2, respectively.

MS: $[M+H]^+$=980.3

Example 28

Preparation of Compound 28

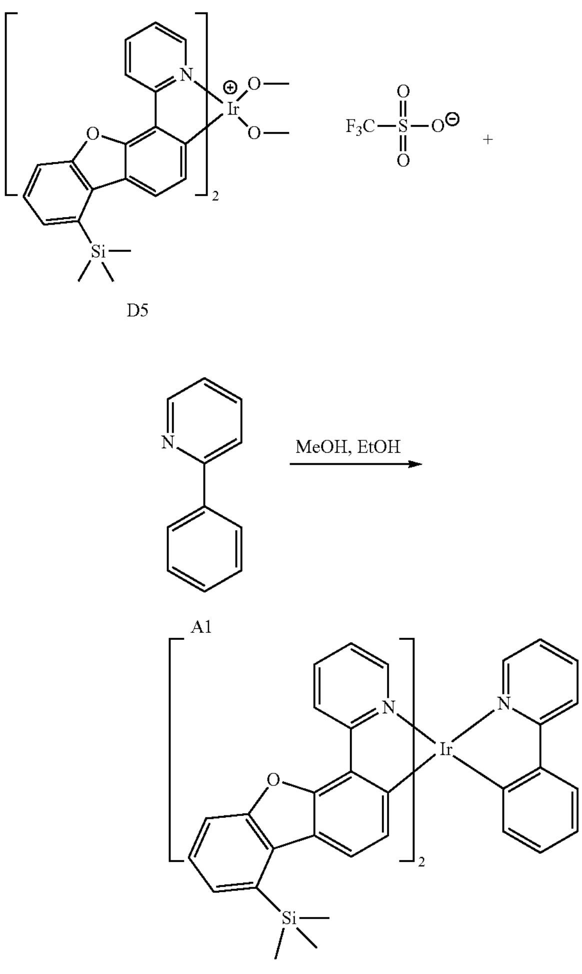

28

Compound 28 (yield: 35%) was prepared in the same manner as in the method for preparing Compound 1, except that Compound D5 and Compound A1 were used instead of Compound B1 and Compound C2, respectively.

MS: $[M+H]^+$=980.3

EXPERIMENTAL EXAMPLES

Experimental Example 1

A glass substrate on which ITO (indium tin oxide) was coated as a thin film to a thickness of 1,300 Å was put into distilled water in which a detergent was dissolved, and ultrasonically cleaned. A product manufactured by Fischer Co. was used as the detergent, and as the distilled water, distilled water filtered twice using a filter manufactured by Millipore Co. was used. After the ITO was cleaned for 30 minutes, ultrasonic cleaning was repeated twice using distilled waterfor 10 minutes. After the cleaning with distilled water was completed, the substrate was ultrasonically cleaned with solvents of isopropyl alcohol, acetone, and methanol, dried, and then transferred to a plasma cleaner. The substrate was cleaned for 5 minutes using oxygen plasma and then transferred to a vacuum depositor.

On the ITO transparent electrode thus prepared, the compound HI-1 shown below was thermally vacuum-deposited in a thickness of 50 Å to form a hole injection layer. The compound HT-1 shown below was thermally vacuum-deposited in a thickness of 250 Å on the hole injection layer to form a hole transport layer, and the compound HT-2 shown below was vacuum-deposited in a thickness of 50 Å on the HT-1 deposited layer to form an electron blocking layer. Then, the compound H1 shown below, the compound H2 shown below and the compound 1 prepared previously were co-deposited at a weight ratio of 44:44:12 as a host on the HT-2 deposited layer to form a light emitting layer with a thickness of 400 Å. The compound ET-1 shown below was vacuum-deposited in a thickness of 250 Å on the light emitting layer, and further the compound ET-2 shown below was co-deposited with 2 wt % Li to a thickness of 100 Å to form an electron transport layer and an electron injection layer. Aluminum was deposited in a thickness of 1000 Å on the electron injection layer to form a cathode.

HI-1

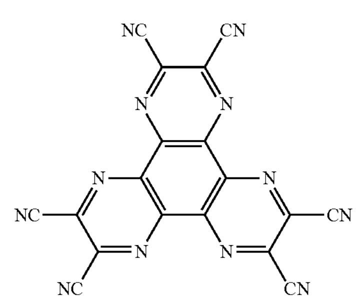

-continued

HT-1

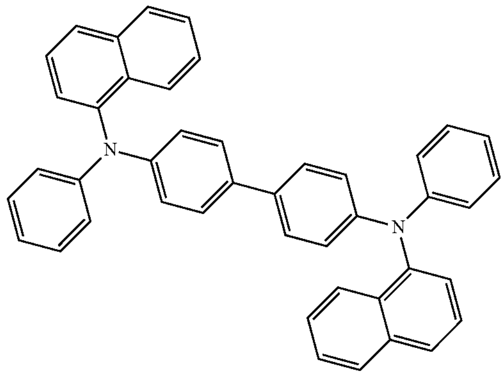

HT-2

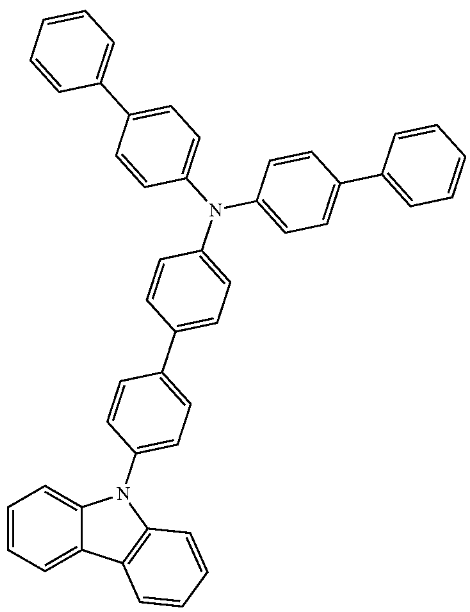

H1

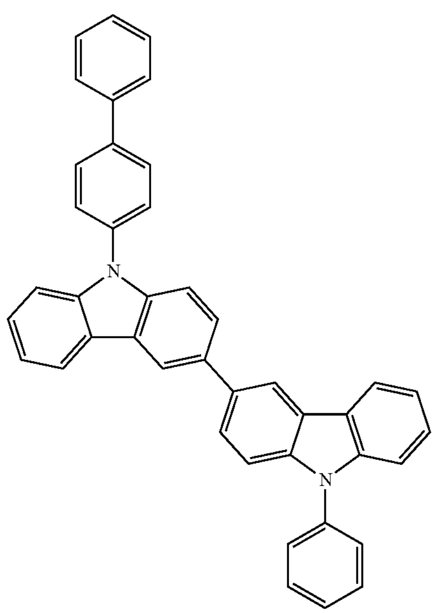

-continued

H2

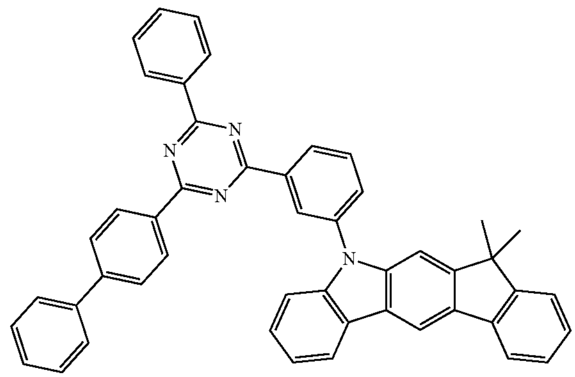

ET-1

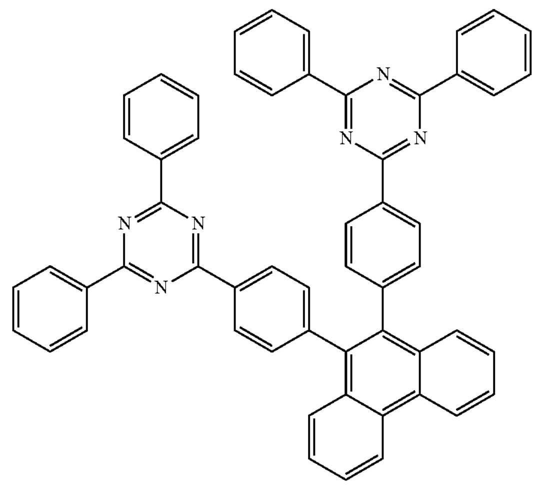

ET-2

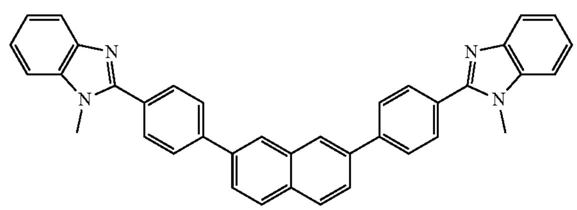

In the above-mentioned process, the vapor deposition rate of the organic material was maintained at 0.4 to 0.7 Å/sec, the deposition rate of aluminum was maintained at 2 Å/sec, and the degree of vacuum during the deposition was maintained at $1\times10^{-7}$ to $5\times10^{-8}$ torr.

Experimental Examples 2 to 7

The organic light emitting devices were manufactured in the same manner as in Experimental Example 1, except that the compounds shown in Table 2 below were used instead of Compound 1 when forming the light emitting layer.

Comparative Experimental Examples 1 to 4

The organic light emitting devices was manufactured in the same manner as in Experimental Example 1, except that the compounds shown in Table 2 below were used instead of Compound 1 as a dopant when forming the light emitting layer. In Table 1 below, the compounds $Ir(ppy)_3$, E1, E2 and E3 are as follows.

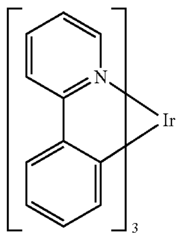

Ir(ppy)$_3$

E1

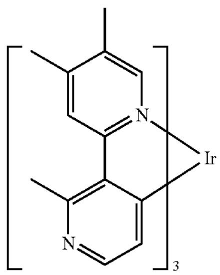

E2

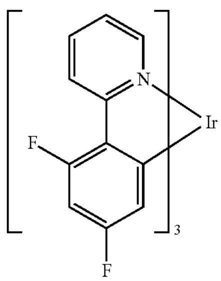

-continued

E3

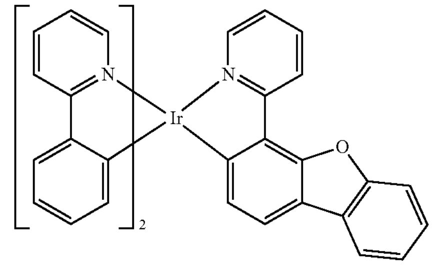

HOMO, LUMO, and Ti (triplet energy levels) were measured for Compounds 1, 9, 25 and Ir(ppy)$_3$, E1 to E3 used in the Experimental Examples and Comparative Experimental Examples, and the results are shown in Table 1 below.

TABLE 1

| Dopant material | HOMO(eV) | LUMO(eV) | $T_1$(eV) |
|---|---|---|---|
| Compound 1 | 5.34 | 2.56 | 2.56 |
| Compound 9 | 5.29 | 2.52 | 2.57 |
| Compound 25 | 5.27 | 2.56 | 2.45 |
| Ir(ppy)$_3$ | 5.12 | 2.10 | 2.59 |
| E1 | 5.44 | 2.15 | 2.63 |
| E2 | 5.58 | 2.30 | 2.72 |
| E3 | 5.25 | 2.47 | 2.58 |

In addition, the maximum light emission wavelength (λ max), voltage, efficiency, Color coordinate and lifetime were measured by applying a current to the organic light emitting device manufactured in the Experimental Examples and Comparative Experimental Examples, and the results are shown in Table 2 below. T95 means the time required for the luminance to be reduced to 95% of the initial luminance.

TABLE 2

| | Dopant material | λ max (nm) | Voltage (V) (@10 mA/cm$^2$) | Efficiency (cd/A) (@10 mA/cm$^2$) | Color coordinate (x, y) | Lifetime (T95, h) (@50 mA/cm$^2$) |
|---|---|---|---|---|---|---|
| Experimental Example 1 | Compound 1 | 532 | 3.32 | 78 | (0.429, 0.560) | 252 |
| Experimental Example 2 | Compound 2 | 528 | 3.26 | 80 | (0.420, 0.544) | 227 |
| Experimental Example 3 | Compound 3 | 527 | 3.05 | 81 | (0.386, 0.552) | 210 |
| Experimental Example 4 | Compound 4 | 528 | 3.18 | 78 | (0.421, 0.530) | 197 |
| Experimental Example 5 | Compound 9 | 531 | 3.23 | 74 | (0.445, 0.520) | 288 |
| Experimental Example 6 | Compound 10 | 530 | 3.21 | 80 | (0.433, 0.512) | 220 |
| Experimental Example 7 | Compound 11 | 528 | 3.30 | 83 | (0.379, 0.542) | 256 |
| Experimental Example 8 | Compound 12 | 528 | 3.29 | 76 | (0.398, 0.517) | 221 |
| Experimental Example 9 | Compound 25 | 527 | 3.40 | 82 | (0.415, 0.560) | 218 |
| Comparative Experimental Example 1 | Ir(ppy)$_3$ | 508 | 3.52 | 66 | (0.381, 0.582) | 120 |
| Comparative Experimental Example 2 | E3 | 526 | 3.49 | 70 | (0.411, 0.568) | 140 |

As shown in Table 2, it was confirmed that when the compound of the present invention was used as a phosphorescent dopant material, it exhibited excellent characteristics in terms of the lifetime as compared with Comparative Experimental Examples using the compound $Ir(ppy)_3$. This confirmed that the silyl substituent affects the lifetime. In addition, in the case of Experimental Examples 1, 5, 7, and 9, the lifetime characteristics increased up to 200% compared to Comparative Experimental Example 2. From the above results, it can be seen that the lifetime difference is remarkable depending on the presence or absence of a silyl substituent and the position of substitution.

EXPLANATION OF SYMBOLS

| | |
|---|---|
| 1: substrate | 2: anode |
| 3: light emitting layer | 4: cathode |
| 5: hole injection layer | 6: hole transport layer |
| 7: light emitting layer | 8: electron transport layer |

The invention claimed is:

1. A compound of Chemical Formula 1:

[Chemical Formula 1]

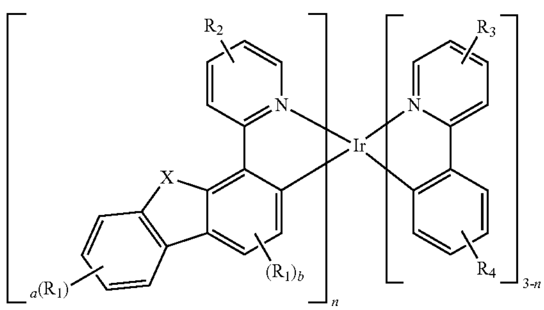

wherein, in Chemical Formula 1:

X is O, S, NH, or Se;

$R_1$ is —Si($R_a$)($R_b$)($R_c$), where $R_a$, $R_b$, and $R_c$ are hydrogen, deuterium, or a substituted or unsubstituted $C_{1-10}$ alkyl;

$R_2$, $R_3$ and $R_4$ are each independently hydrogen, deuterium, halogen, cyano, amino, a substituted or unsubstituted $C_{1-60}$ alkyl, a substituted or unsubstituted $C_{1-60}$ haloalkyl, a substituted or unsubstituted $C_{1-60}$ alkoxy, a substituted or unsubstituted $C_{1-60}$ haloalkoxy, a substituted or unsubstituted $C_{3-60}$ cycloalkyl, a substituted or unsubstituted $C_{2-60}$ alkenyl, a substituted or unsubstituted $C_{6-60}$ aryl, a substituted or unsubstituted $C_{6-60}$ aryloxy, or a substituted or unsubstituted $C_{2-60}$ heterocyclic group containing one or more heteroatoms selected from the group consisting of N, O and S;

a and b are each 0 and 1, or 1 and 0, respectively; and n is 1 or 2.

2. The compound according to claim 1, wherein:

$R_1$ is —$Si(CH_3)_3$.

3. The compound according to claim 1, wherein:

$R_2$ is hydrogen, methyl, $CD_3$, ethyl, propyl, isopropyl, cyclopropyl, cyclobutyl, cyclopentyl, or cyclohexyl.

4. The compound according to claim 1, wherein:

$R_3$ is hydrogen, methyl, $CD_3$, ethyl, propyl, isopropyl, cyclopropyl, cyclobutyl, cyclopentyl, or cyclohexyl.

5. The compound according to claim 1, wherein:

$R_4$ is hydrogen.

6. The compound according to claim 1, wherein:

a triplet energy level of the compound is 2.6 eV or less.

7. The compound according to claim 1, wherein:

a maximum light emission wavelength of the compound is 500 nm to 550 nm.

8. The compound according to claim 1, wherein the compound of Chemical Formula 1 is any one compound selected from the group consisting of the following:

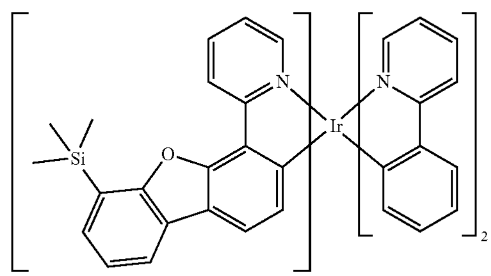

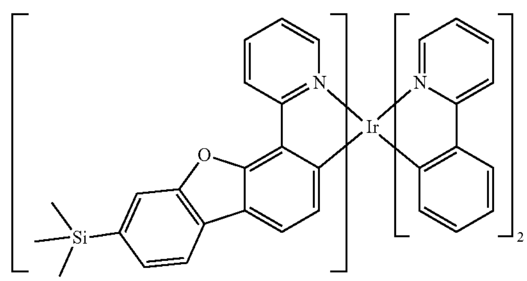

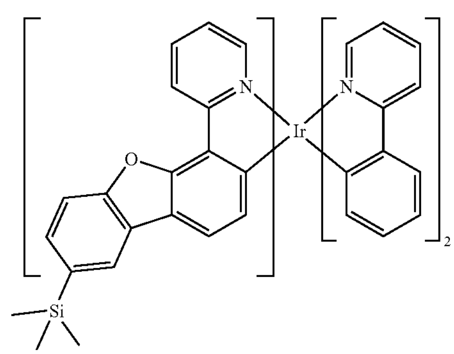

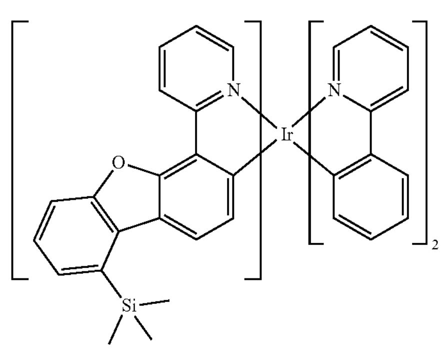

-continued
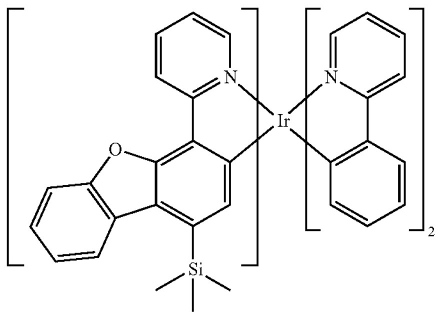
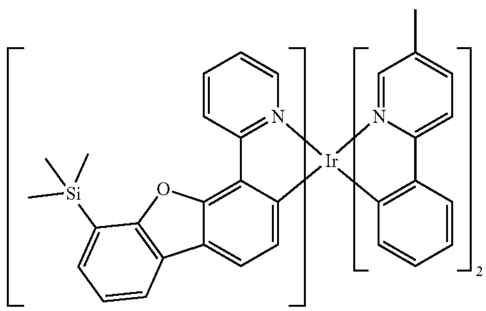
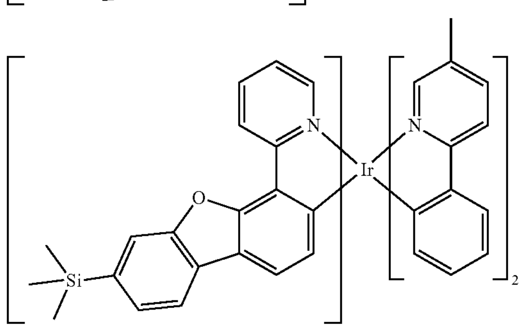
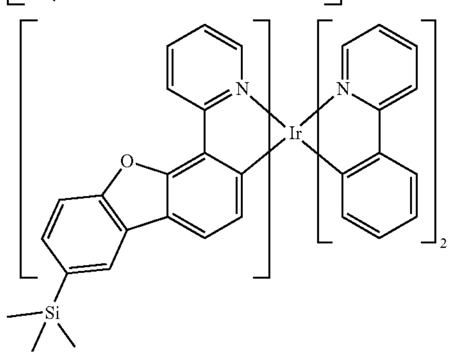
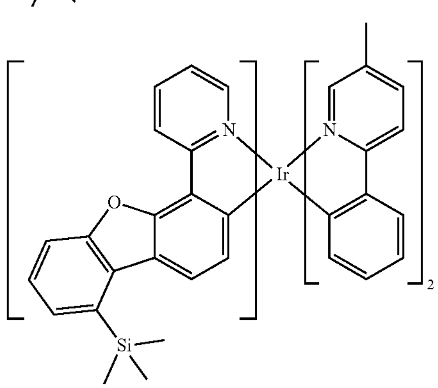
-continued
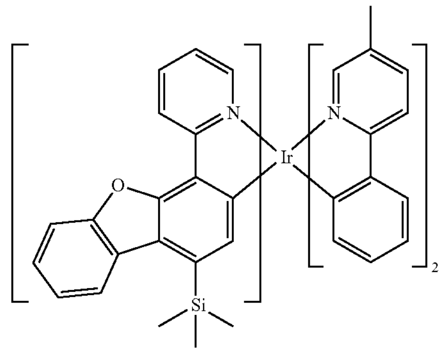
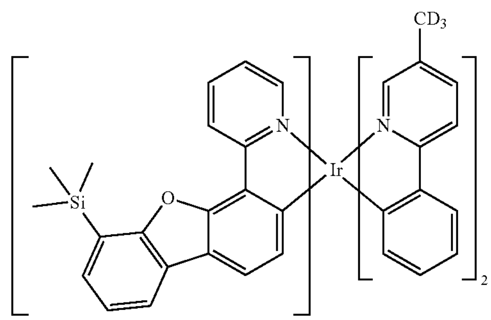
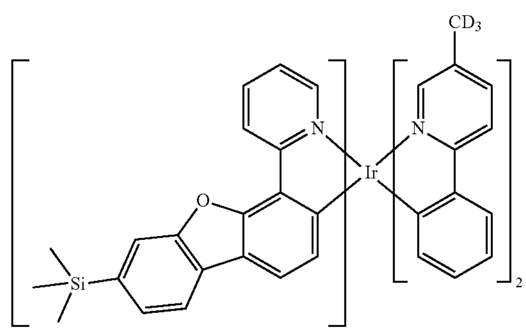
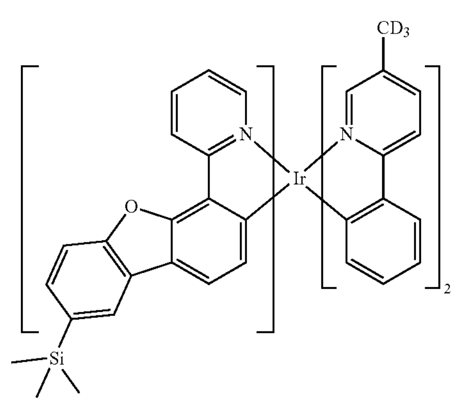

-continued
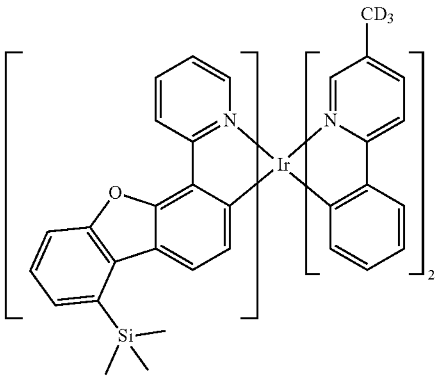
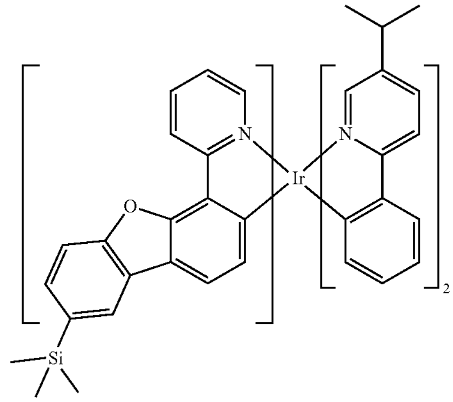
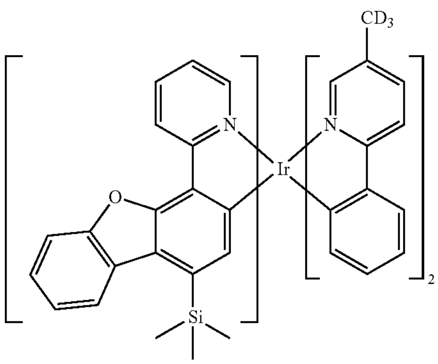
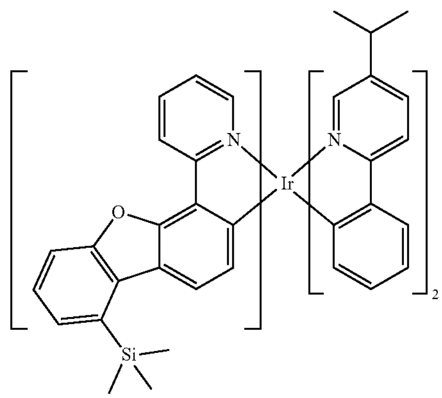
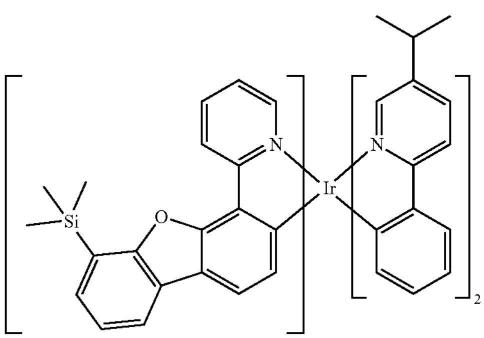
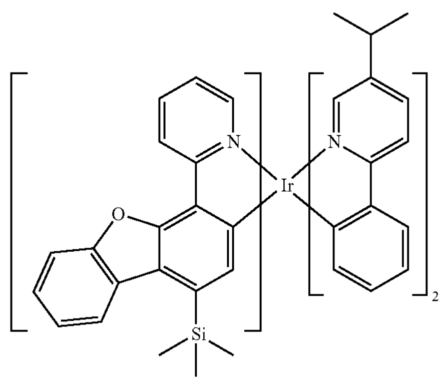
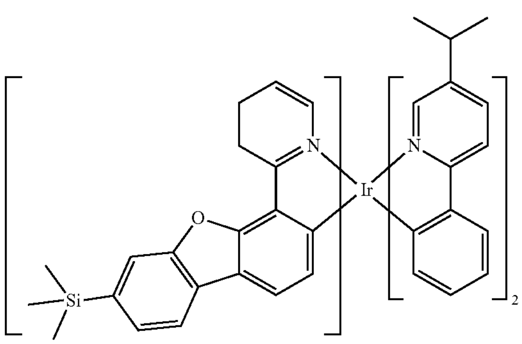
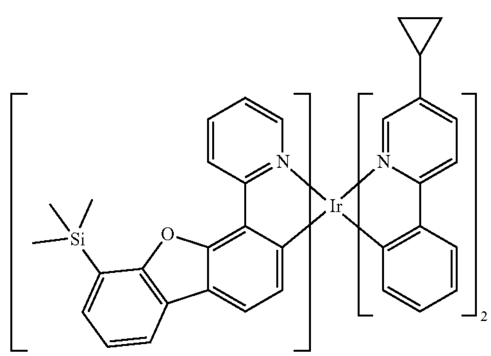
-continued -continued
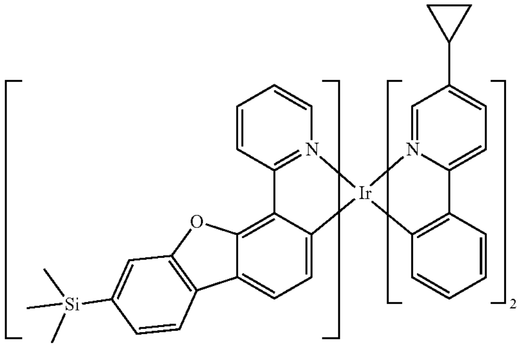
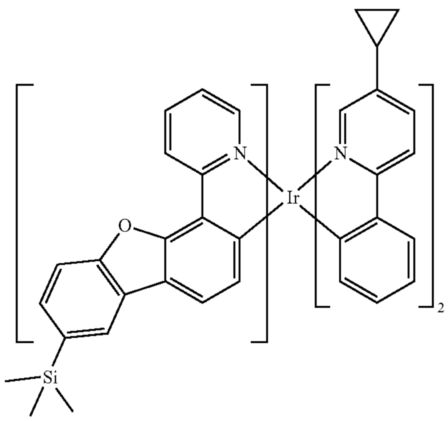
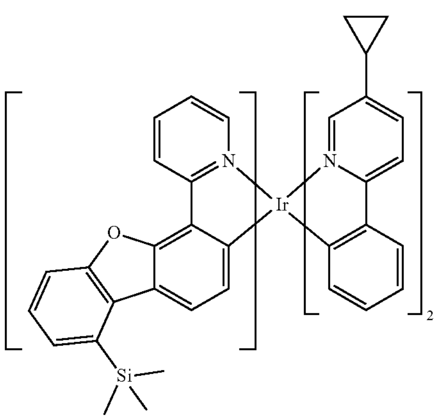
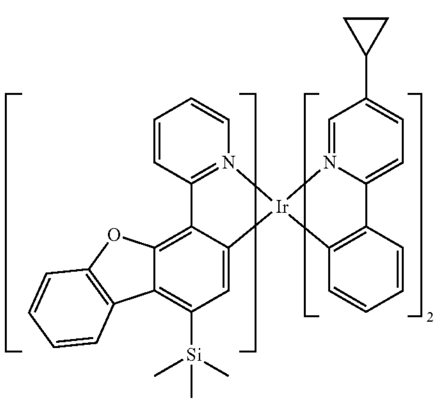
-continued
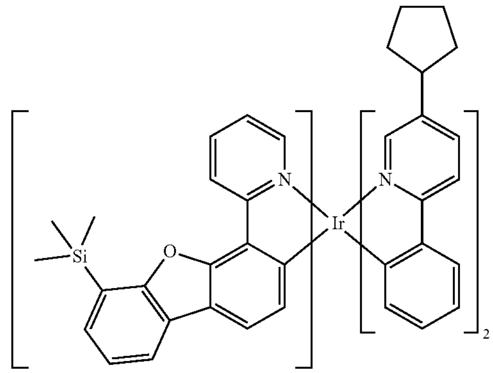
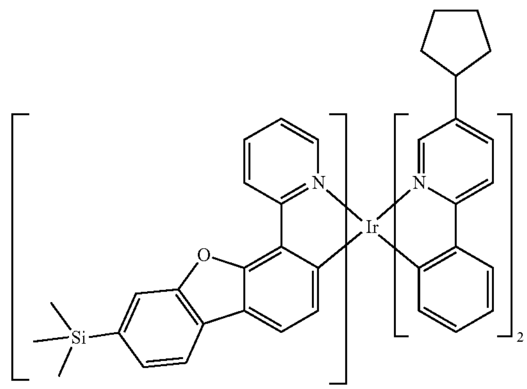
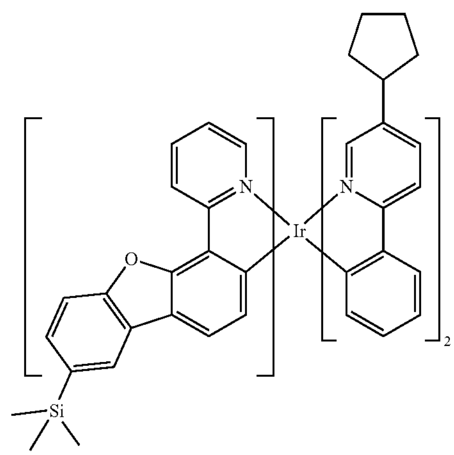
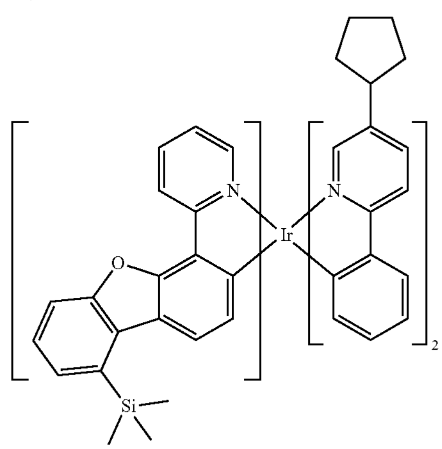

-continued
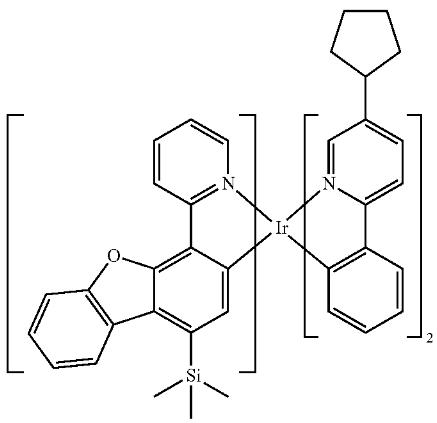
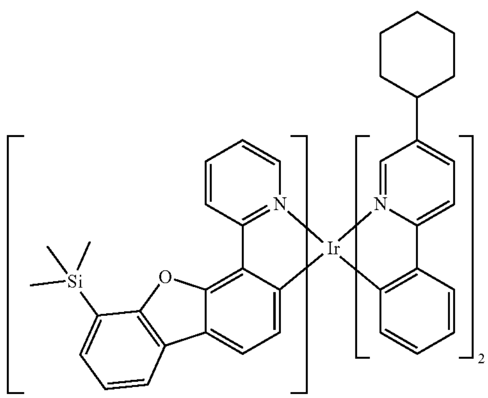
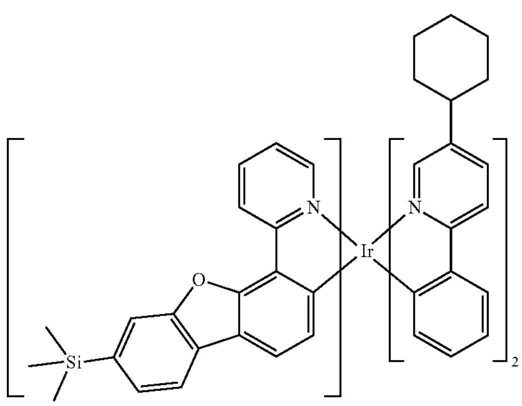
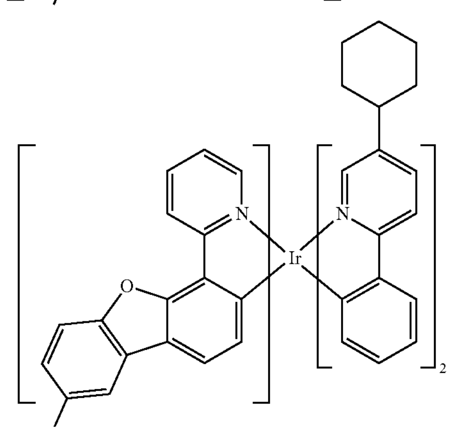
-continued
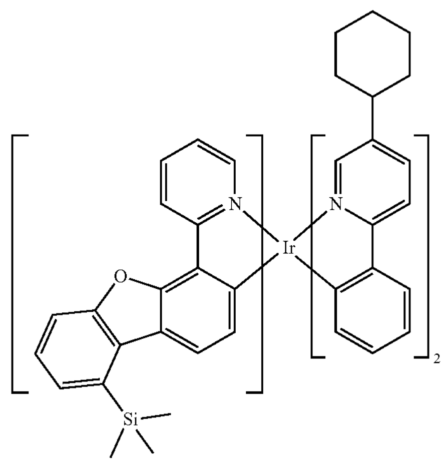
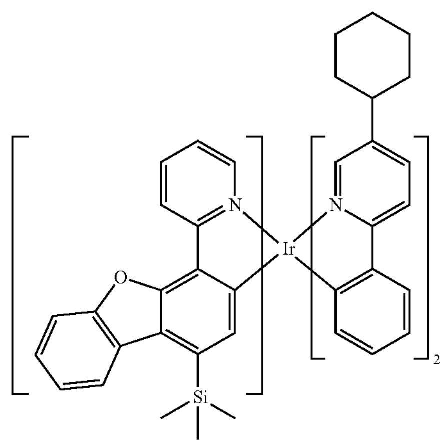
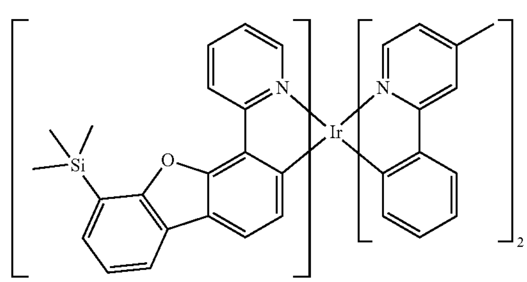
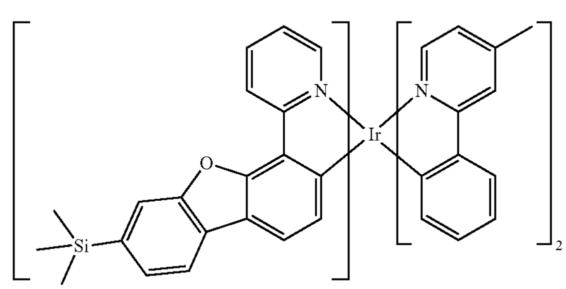

-continued
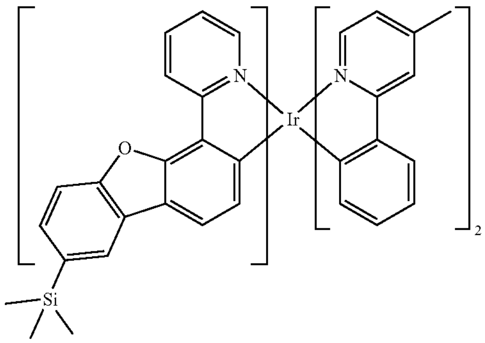
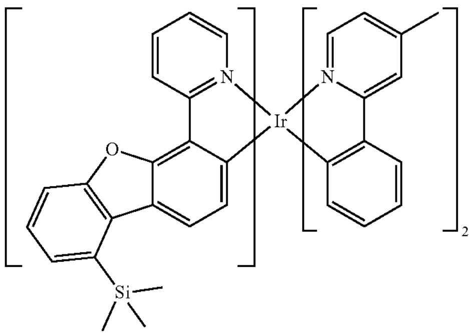
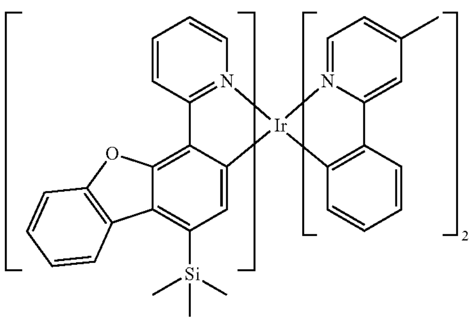
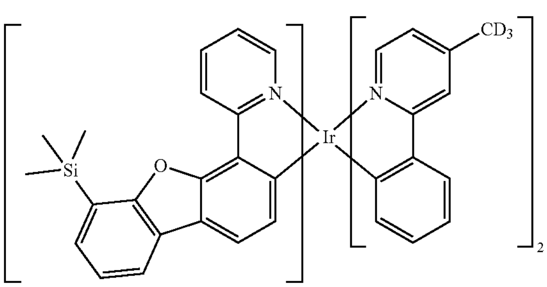
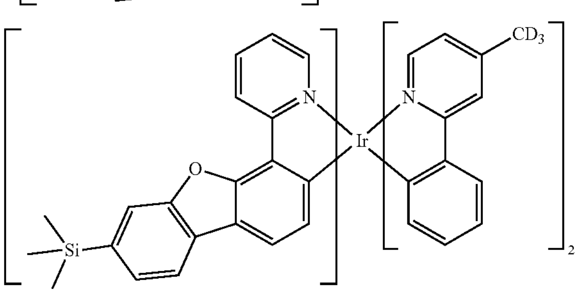
-continued
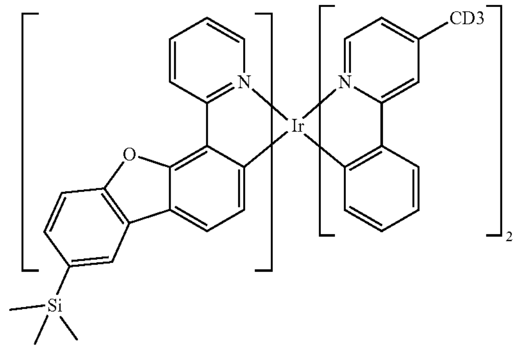
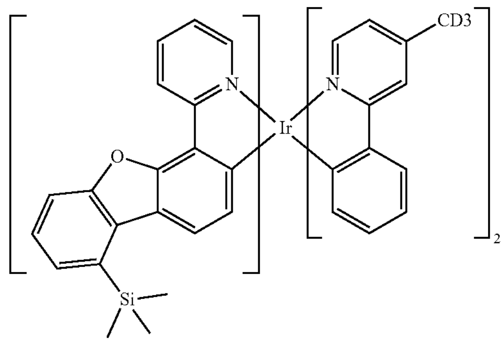
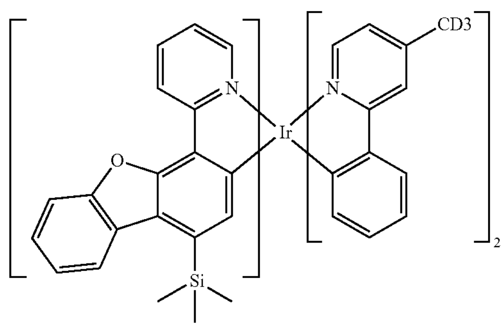
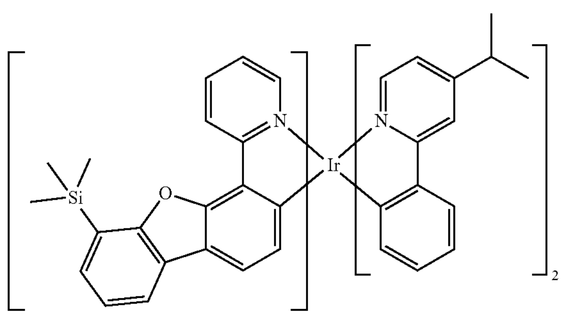
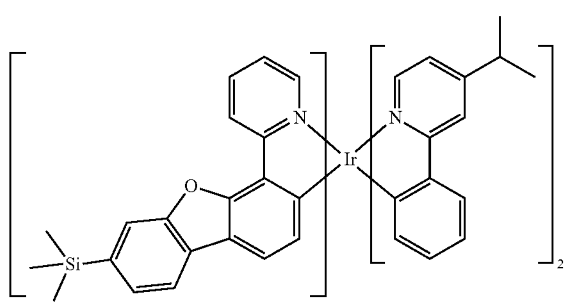

-continued
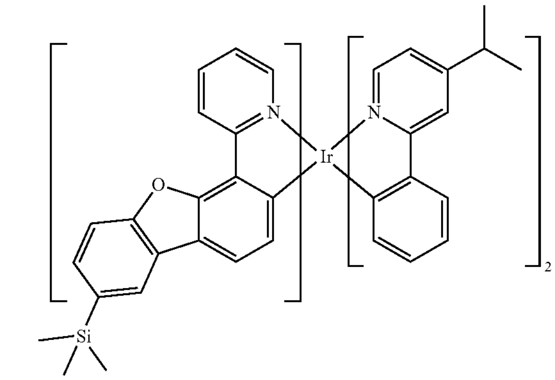
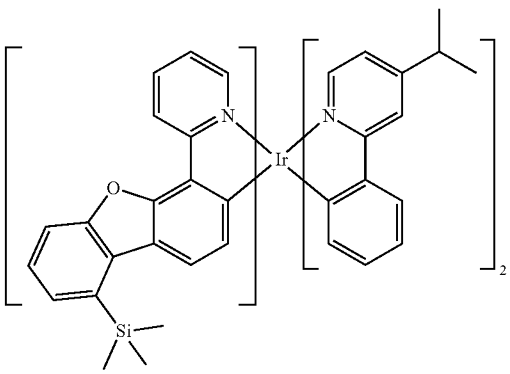
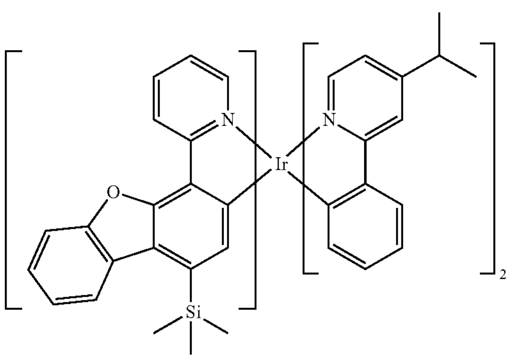
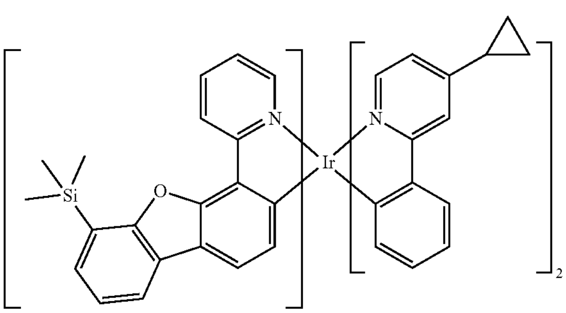
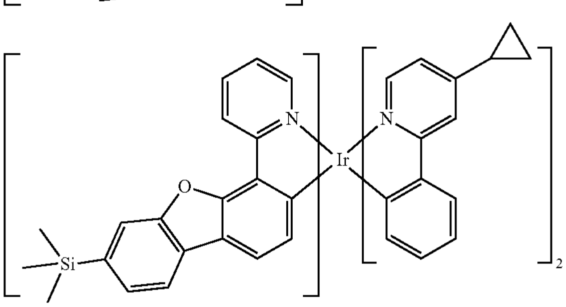
-continued
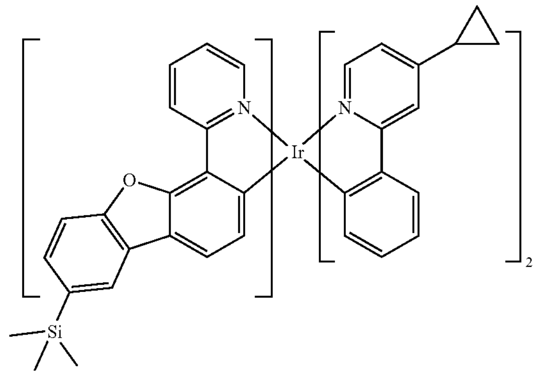
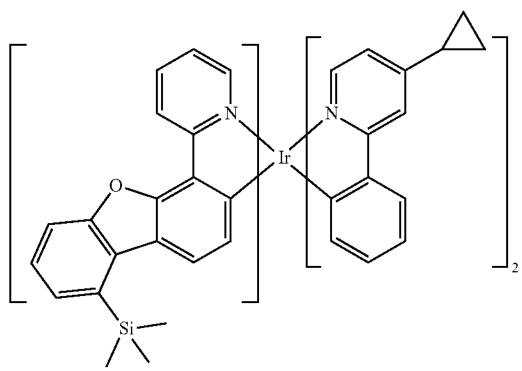
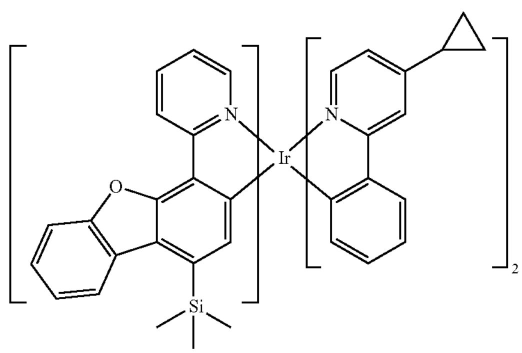
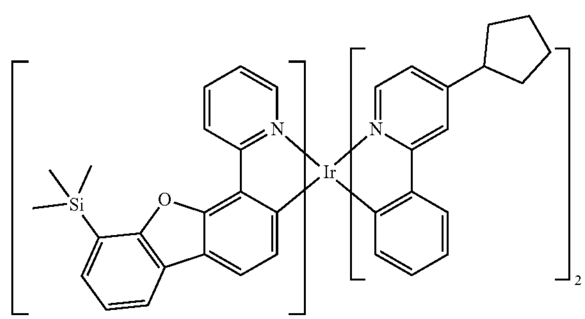
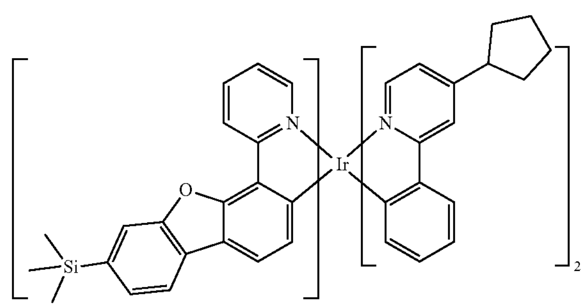

-continued
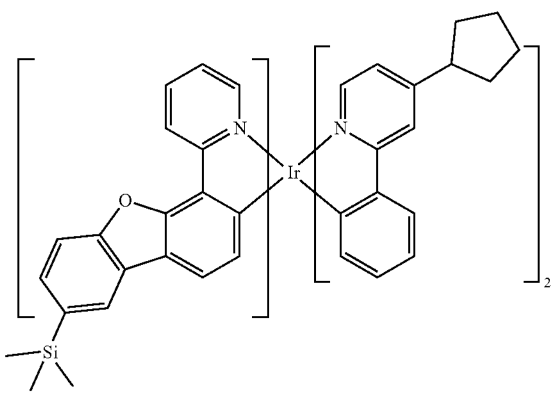
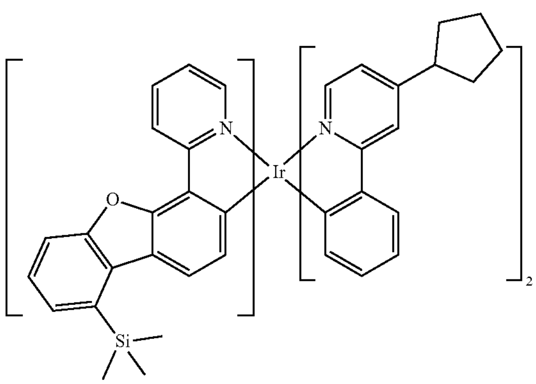
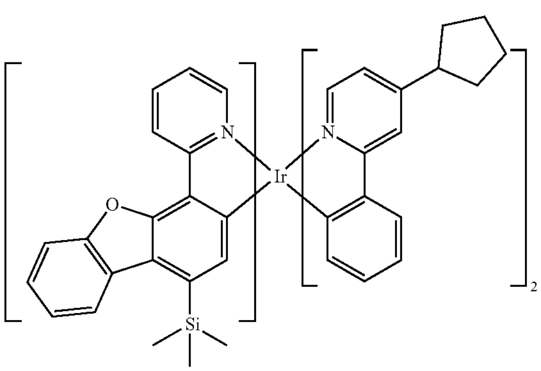
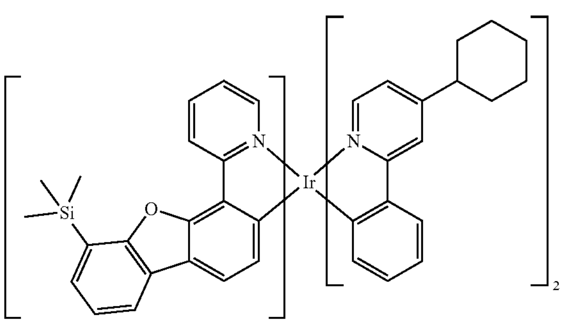
-continued
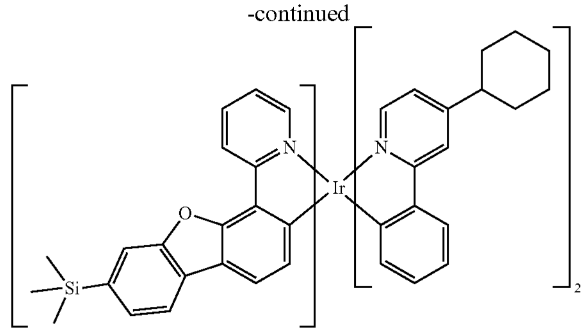
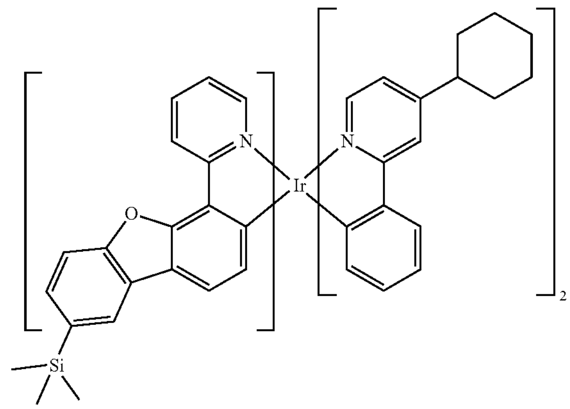
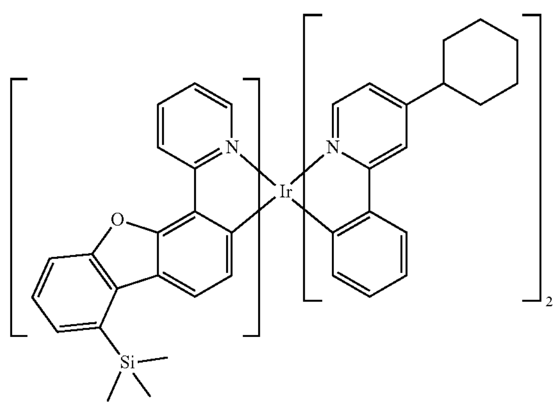
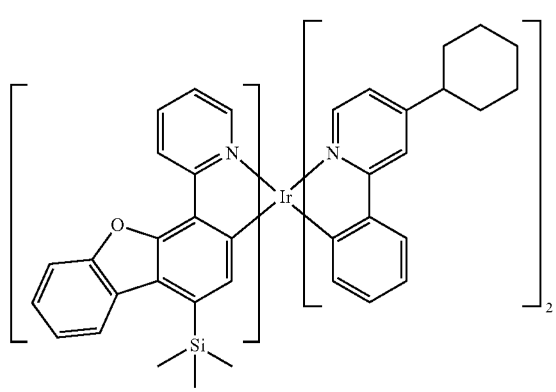

-continued
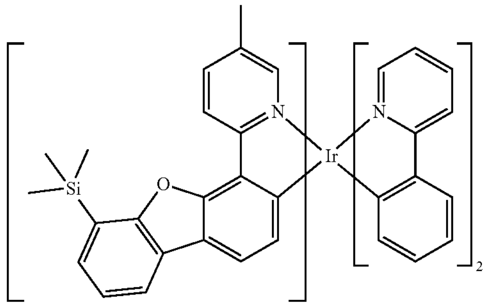
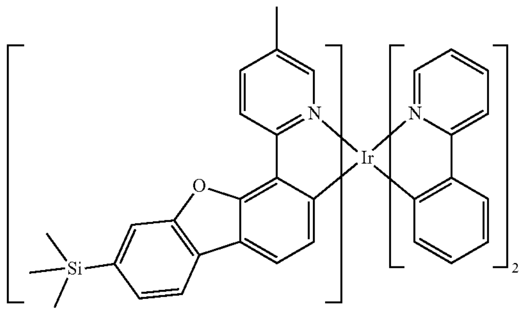
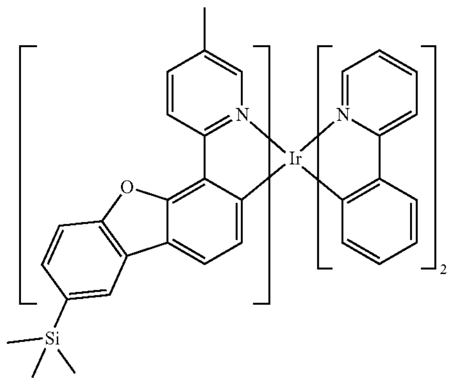
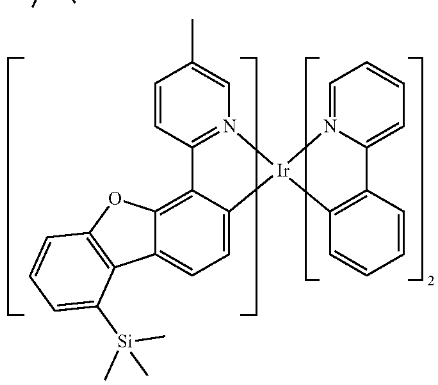
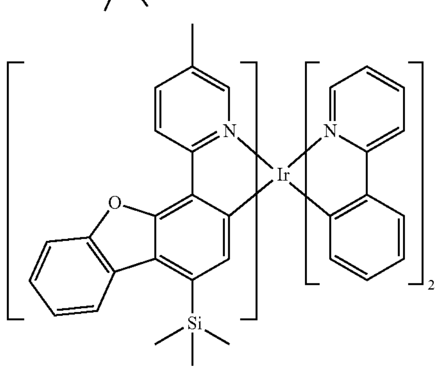
-continued
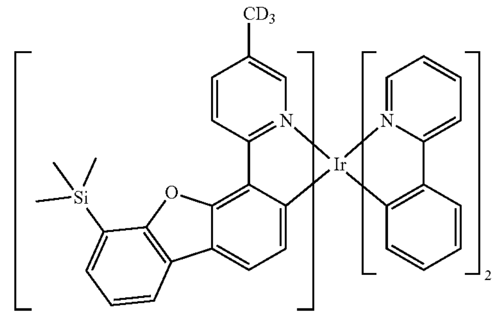
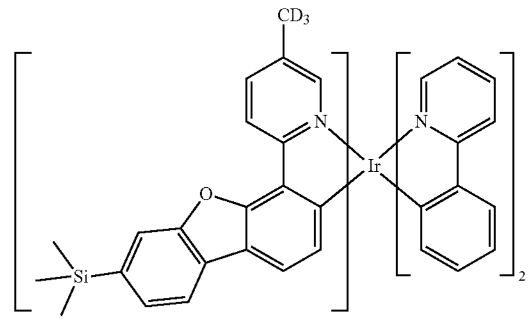
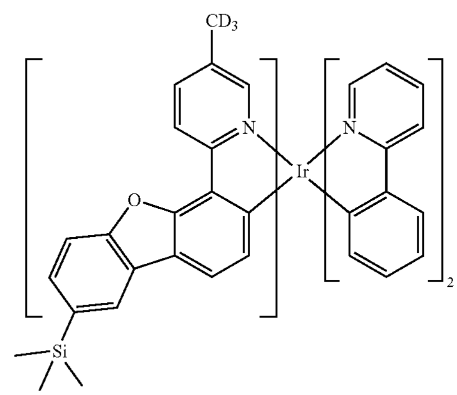
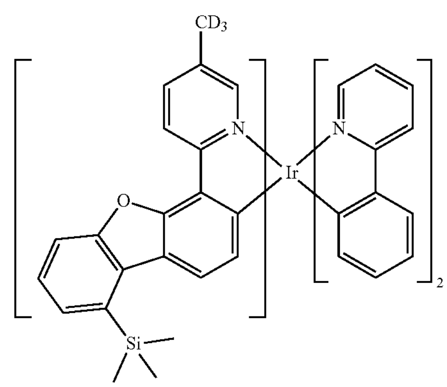

-continued
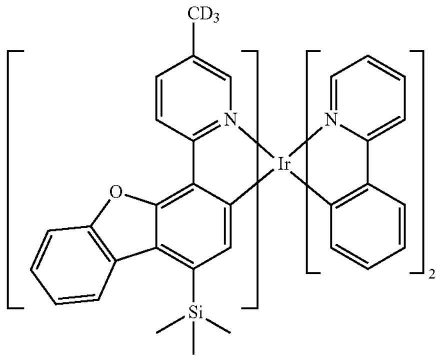
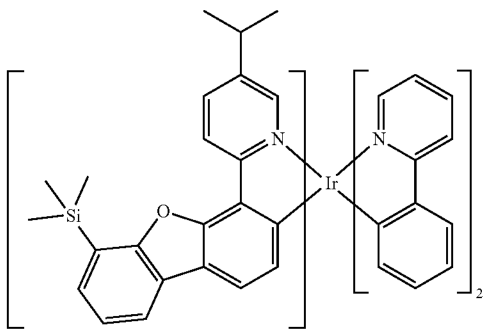
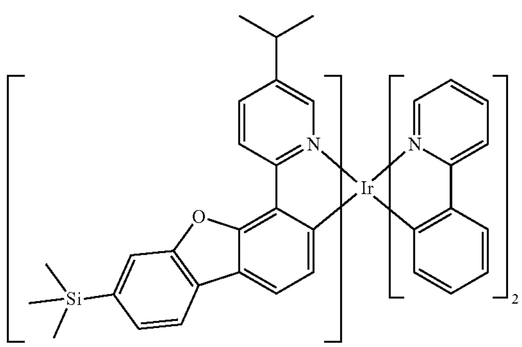
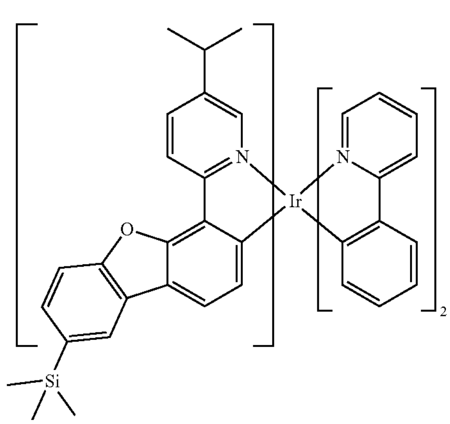
-continued
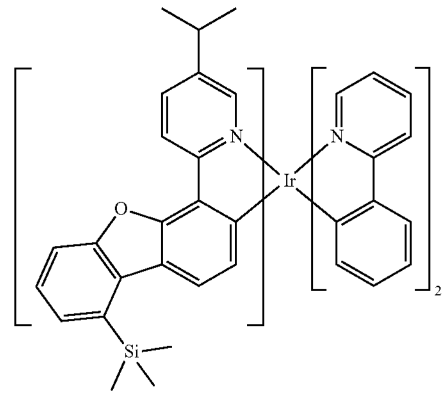
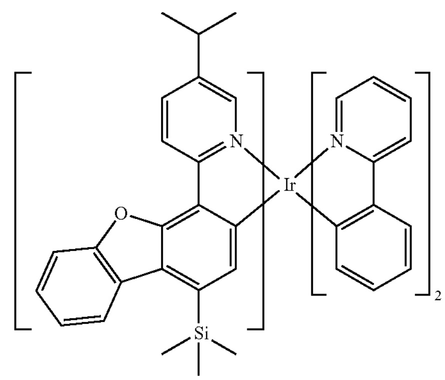
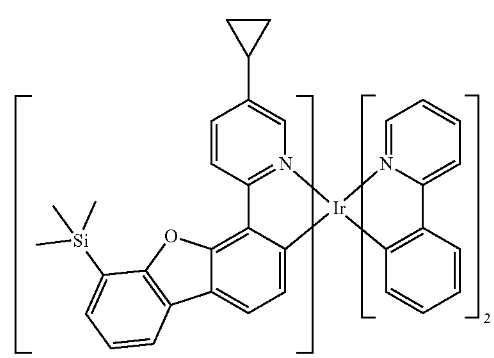
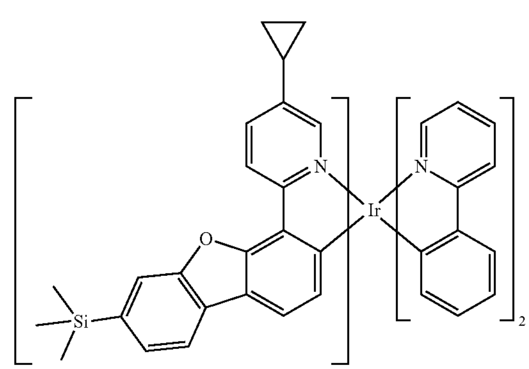

-continued
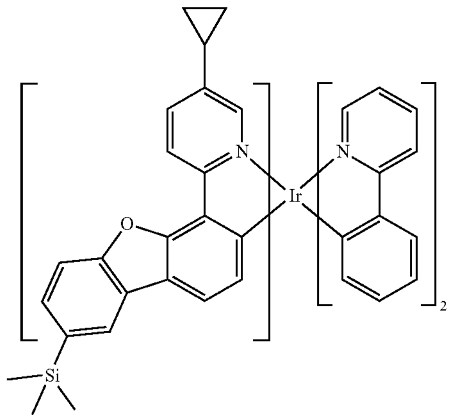
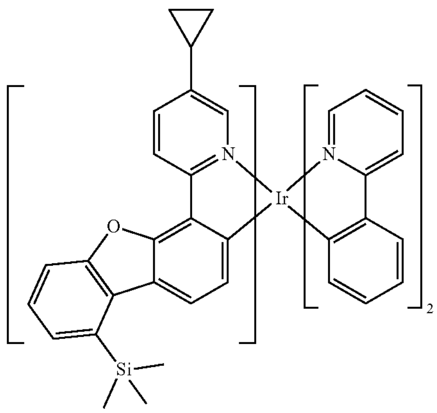
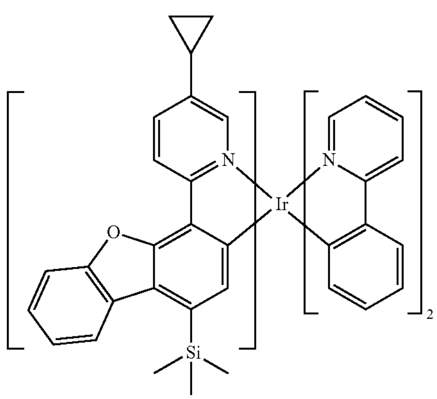
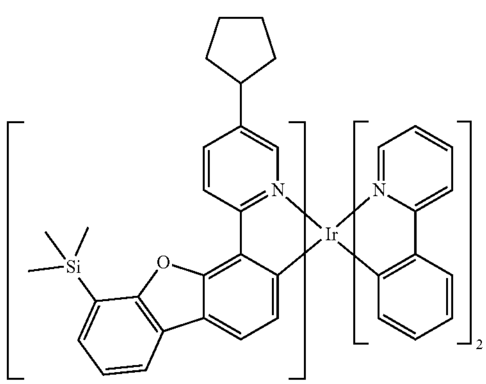
-continued
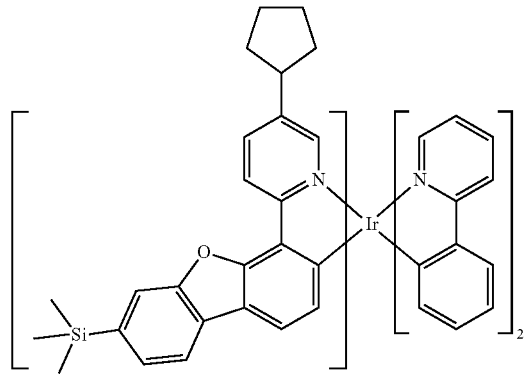
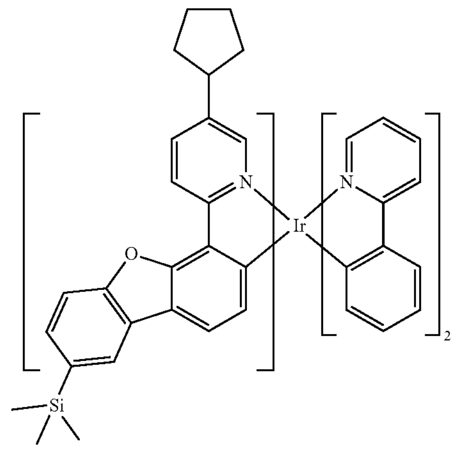
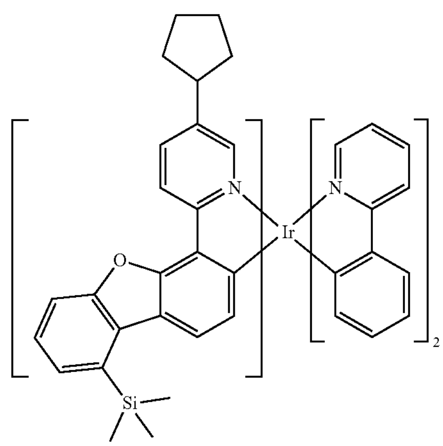
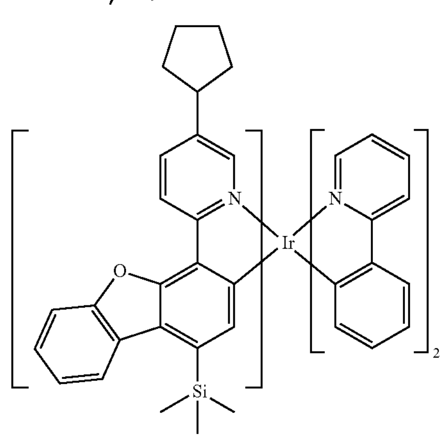

-continued
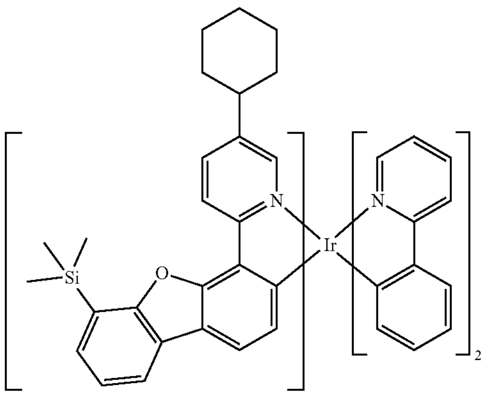
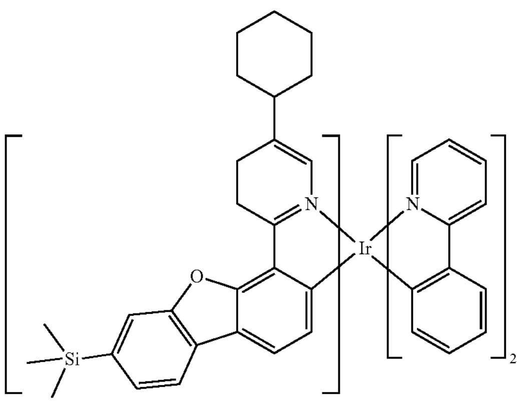
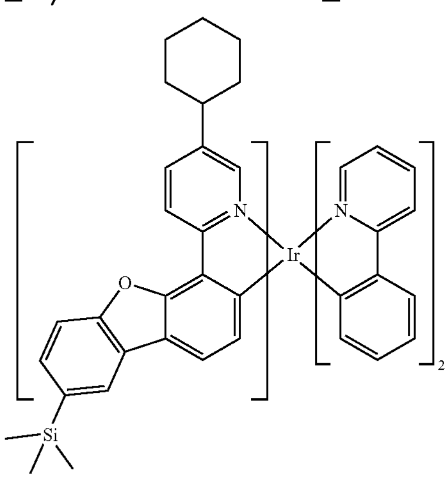
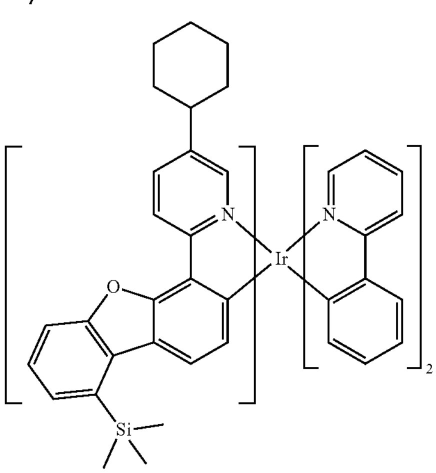
-continued
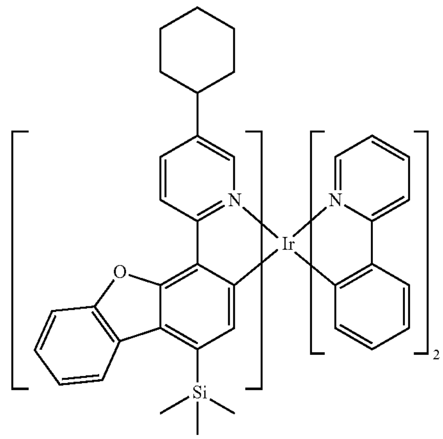
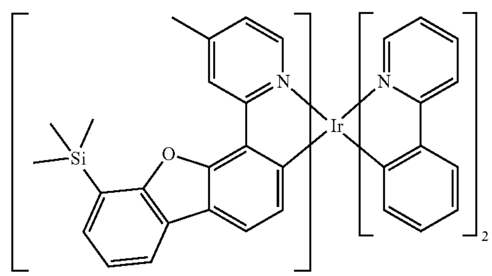
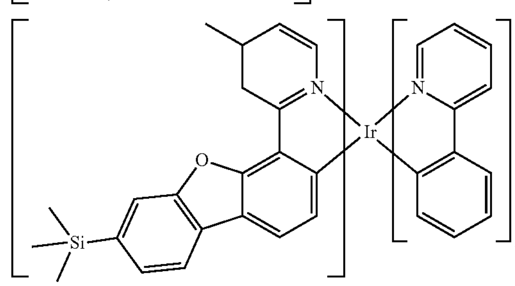
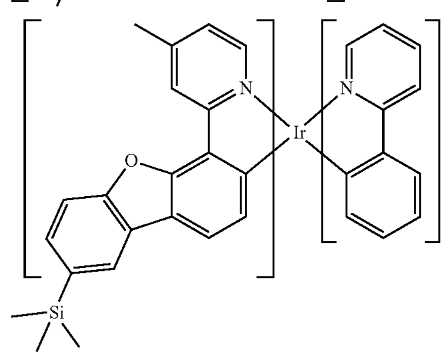
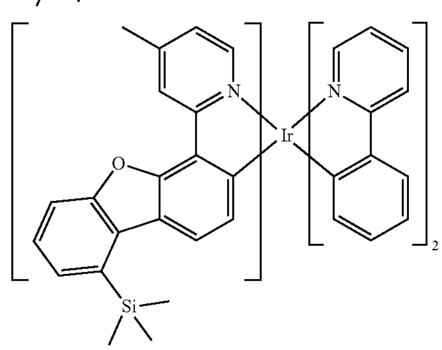

-continued
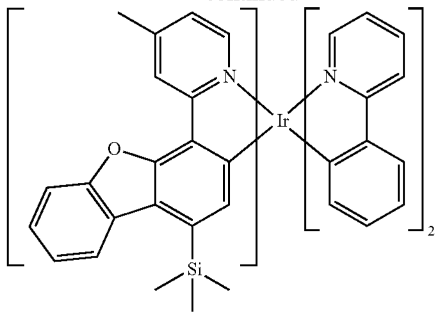
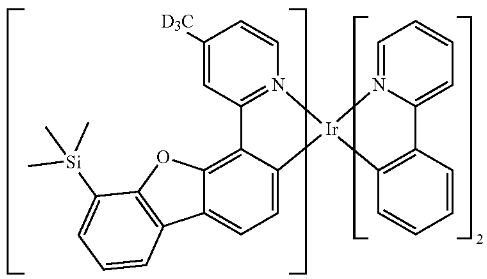
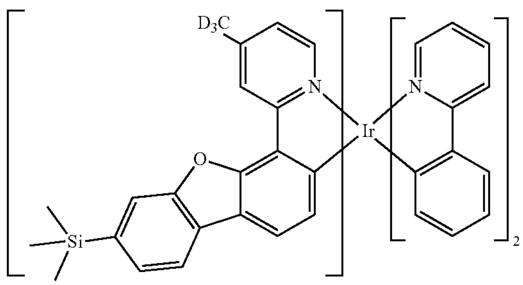
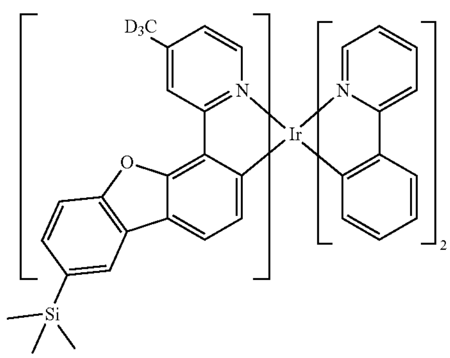
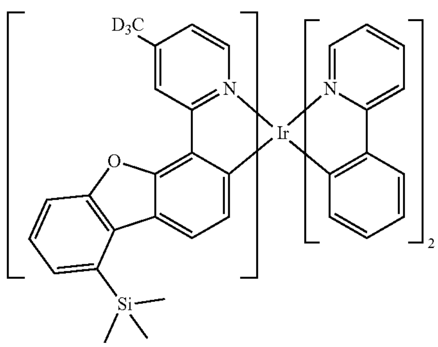
-continued
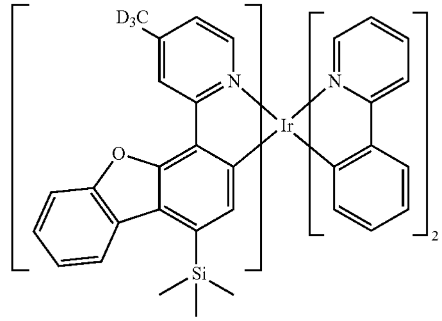
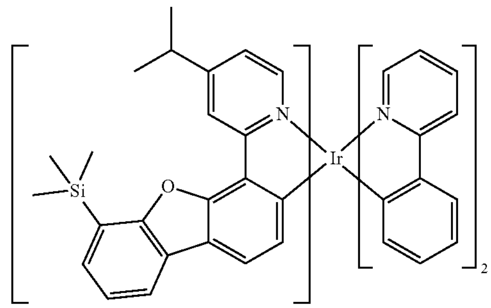
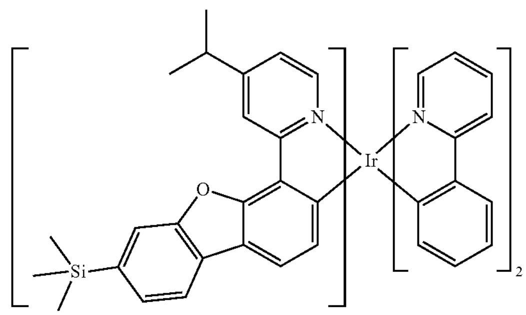
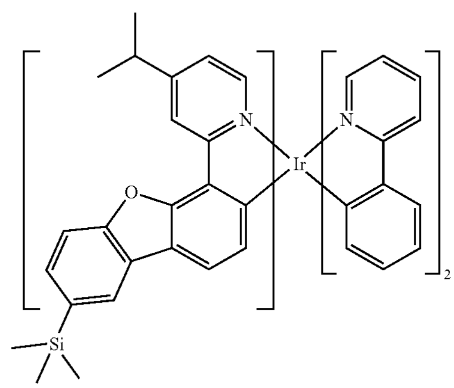
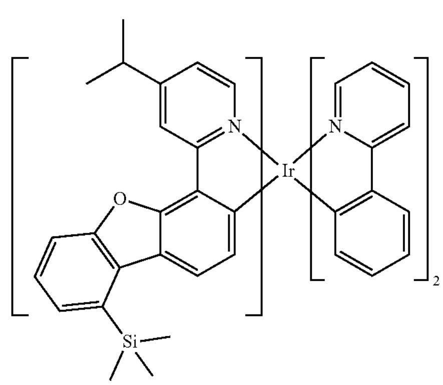

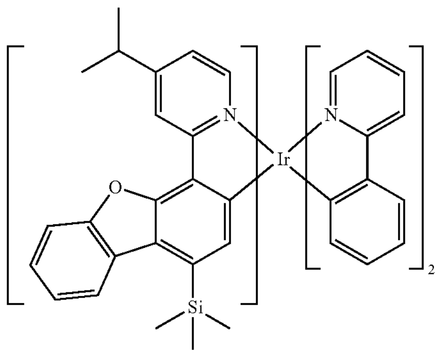
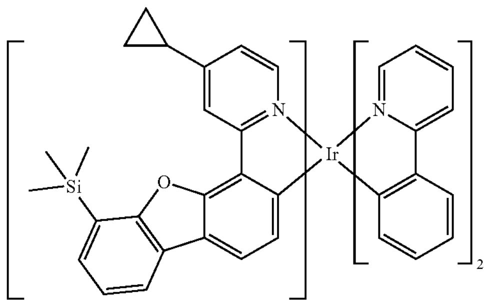
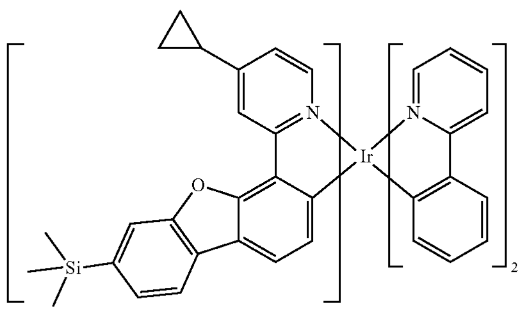
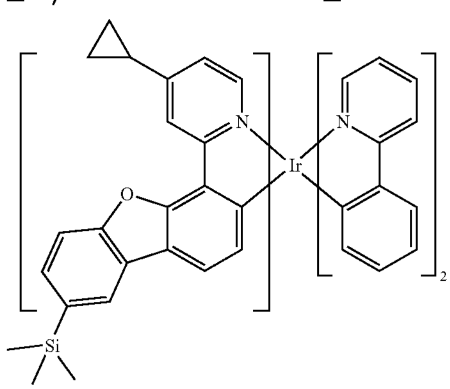
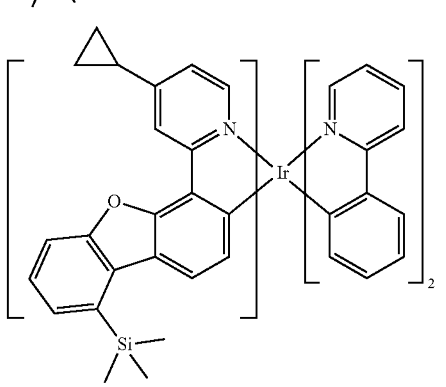
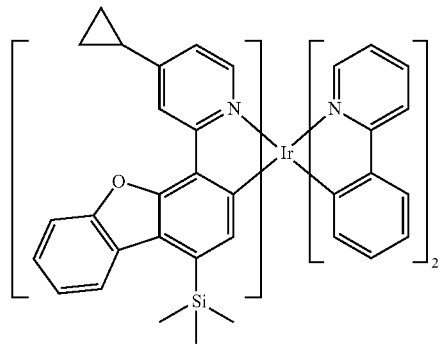
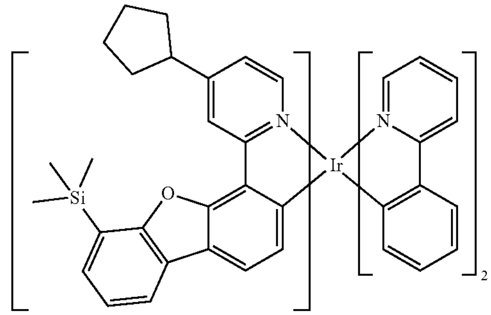
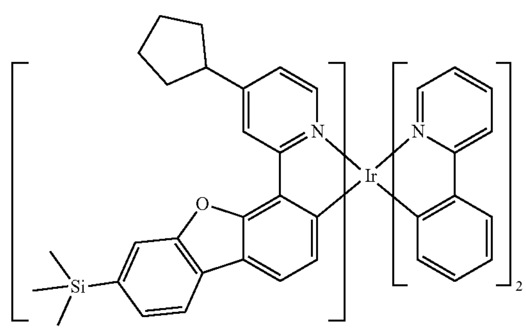
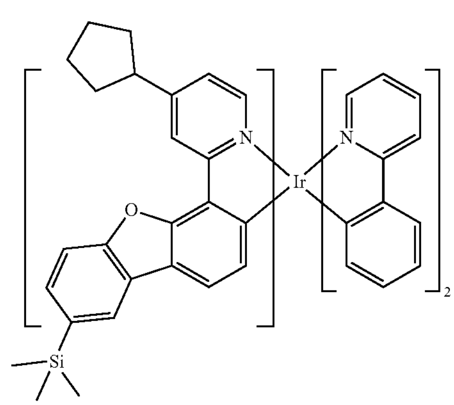

-continued
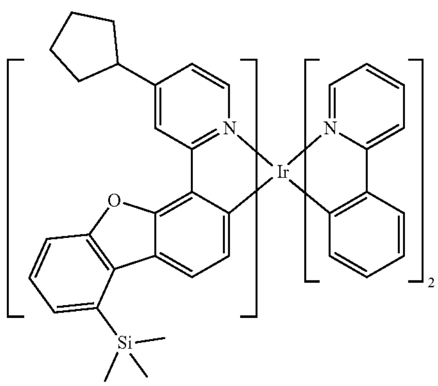
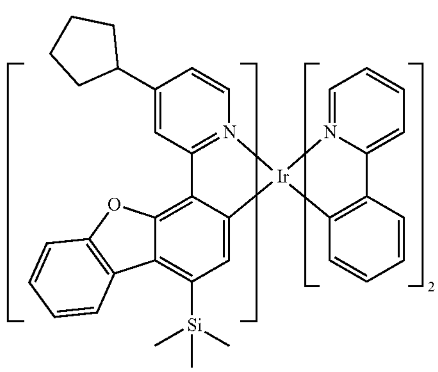
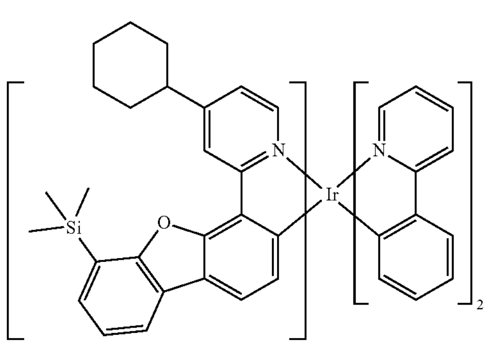
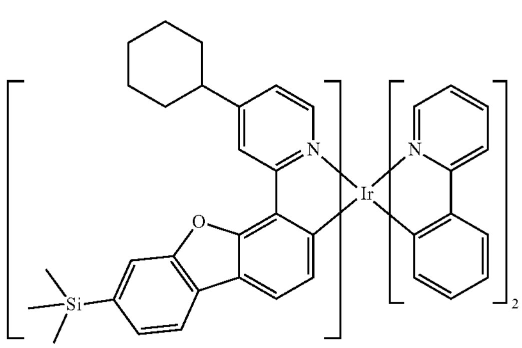
-continued
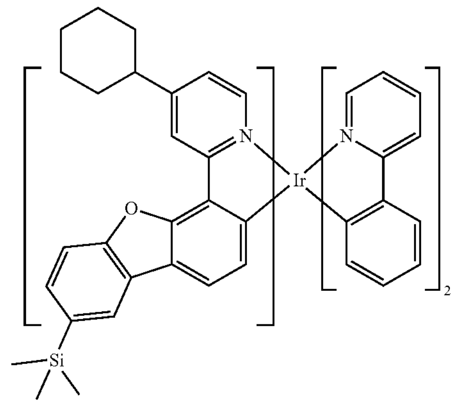
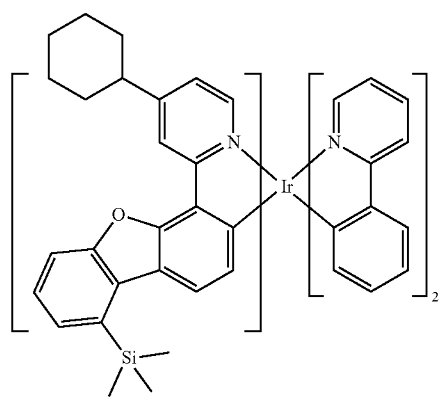
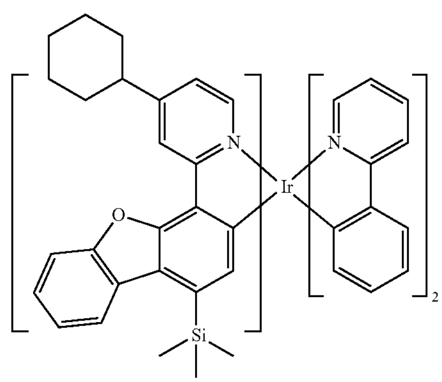
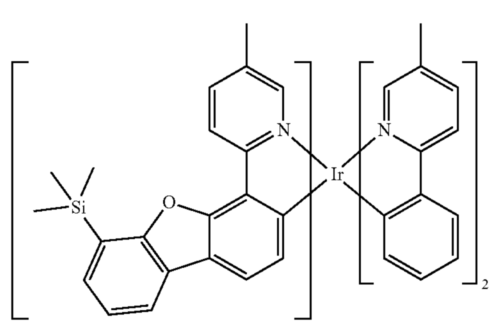

-continued
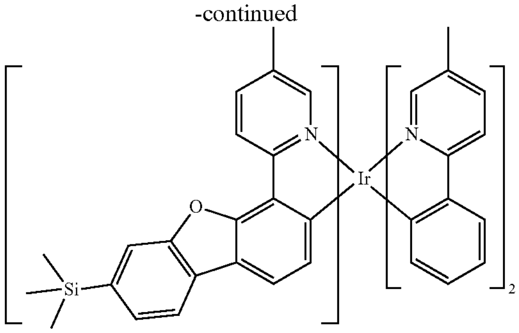
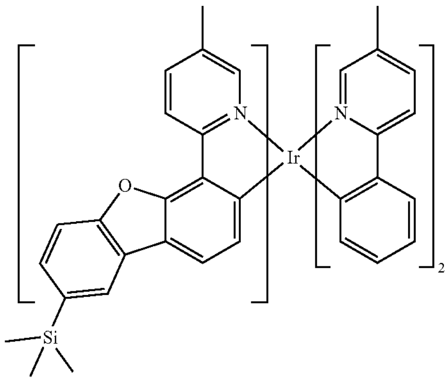
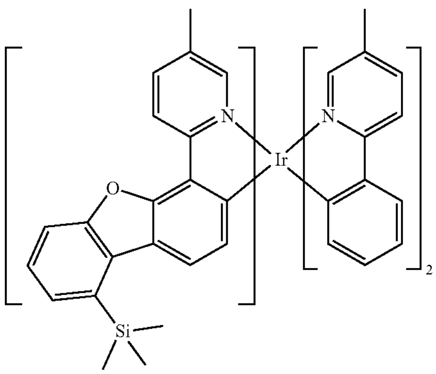
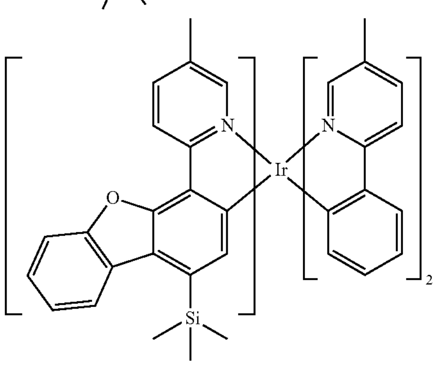
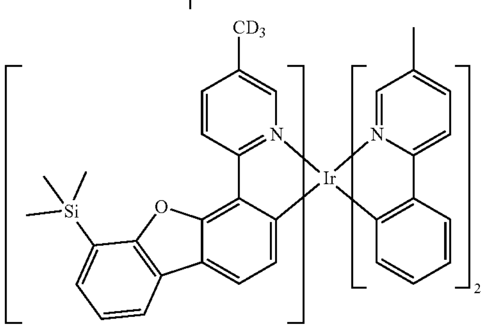
-continued
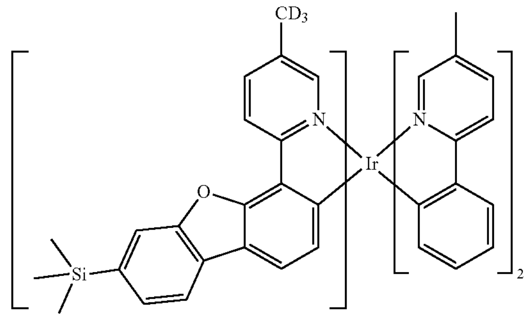
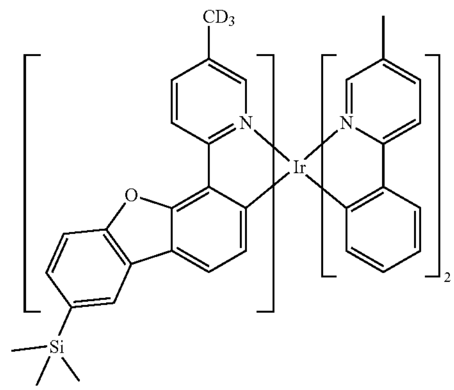
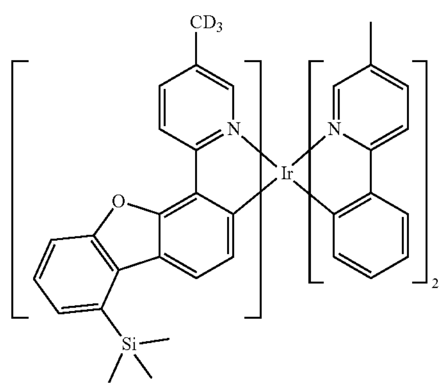
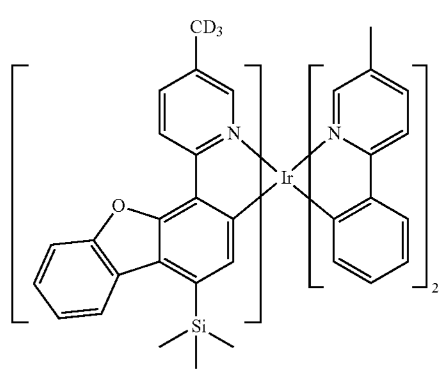

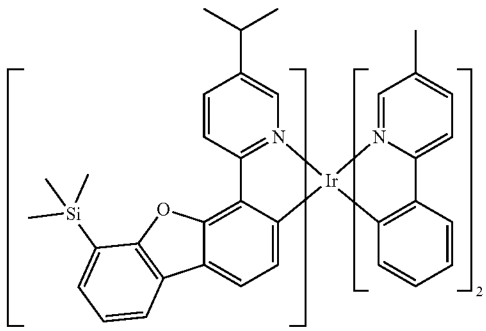
Si
O
N
Ir
N
2
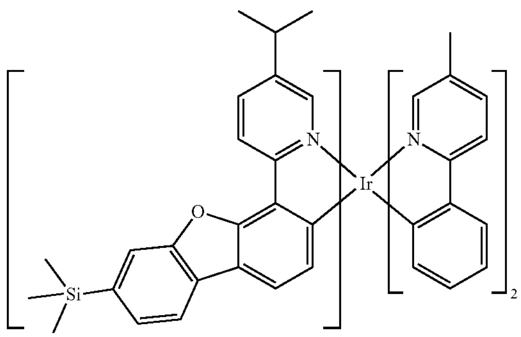
Si
O
N
Ir
N
2
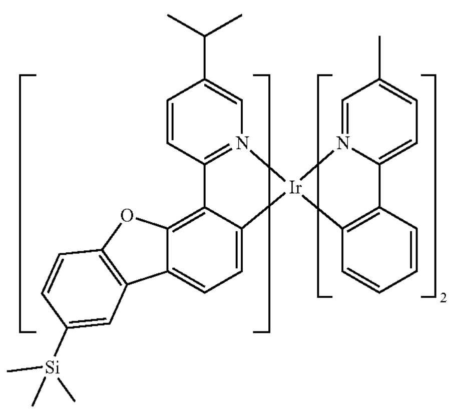
Si
O
N
Ir
N
2
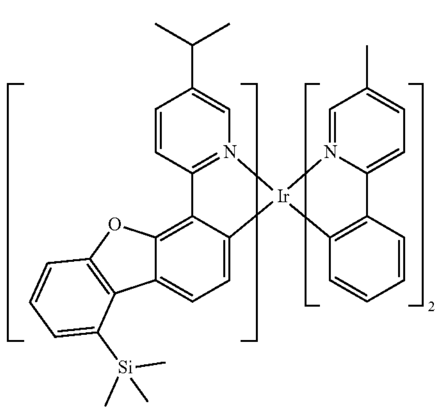
Si
O
N
Ir
N
2
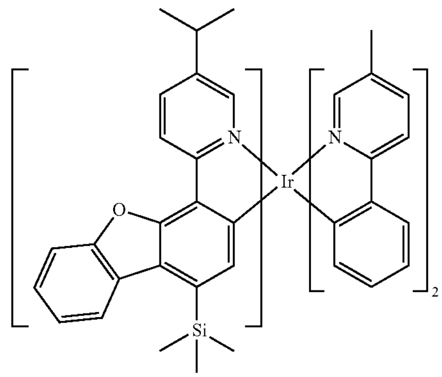
Si
O
N
Ir
N
2
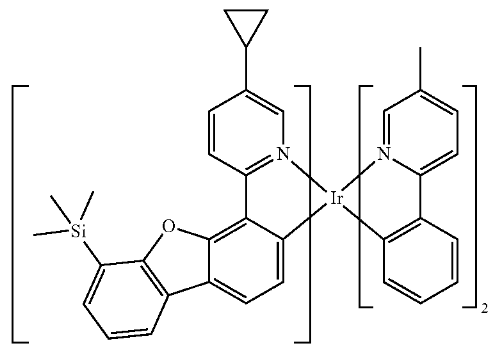
Si
O
N
Ir
N
2
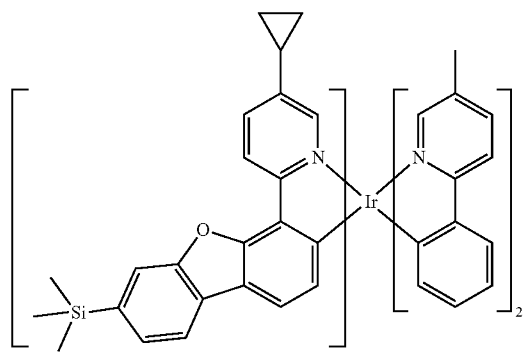
Si
O
N
Ir
N
2
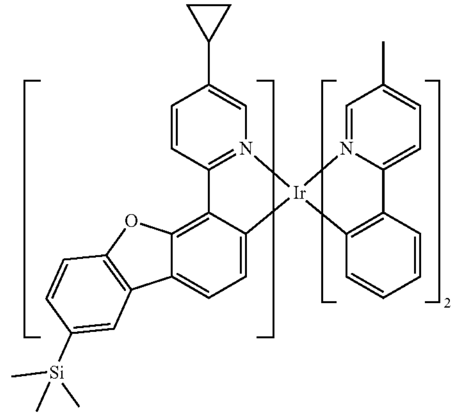
Si
O
N
Ir
N
2

-continued
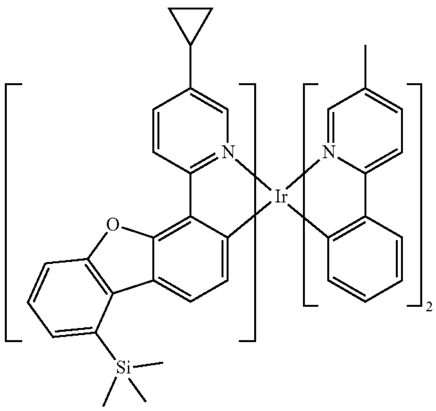
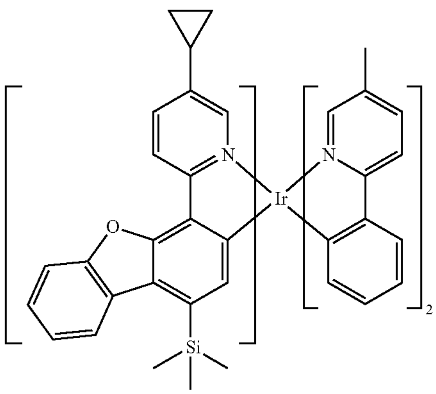
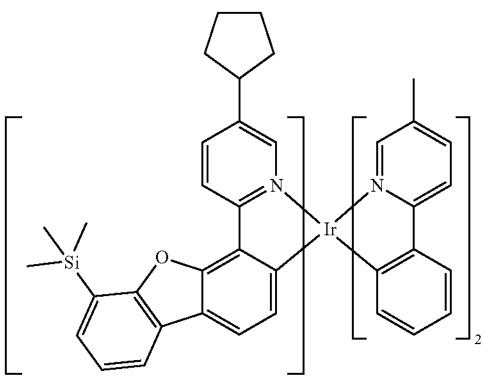
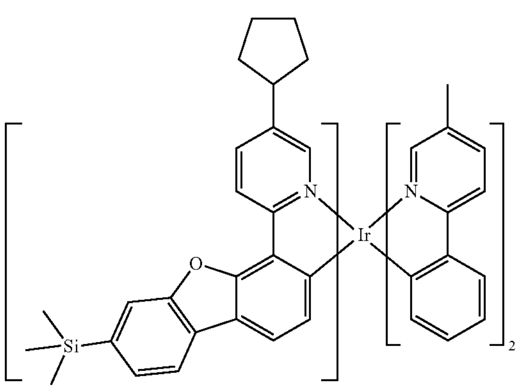
-continued
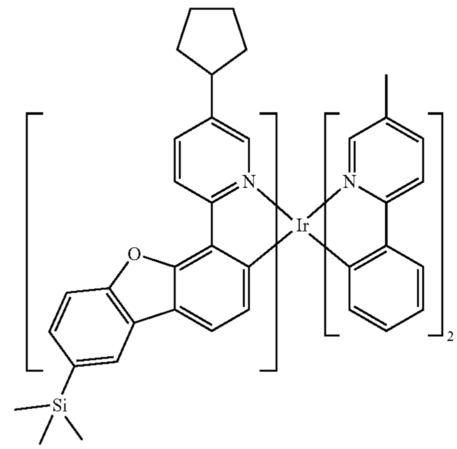
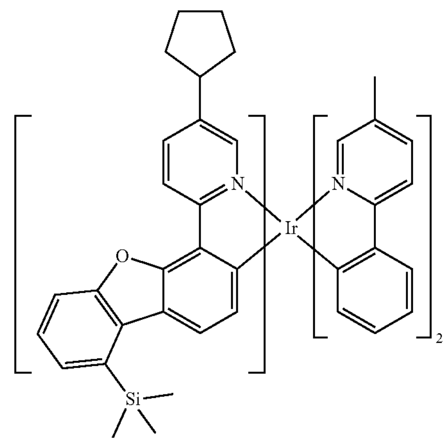
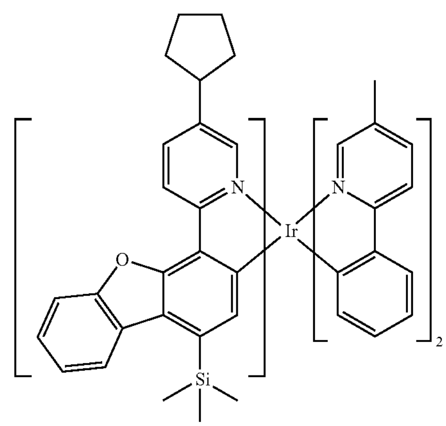
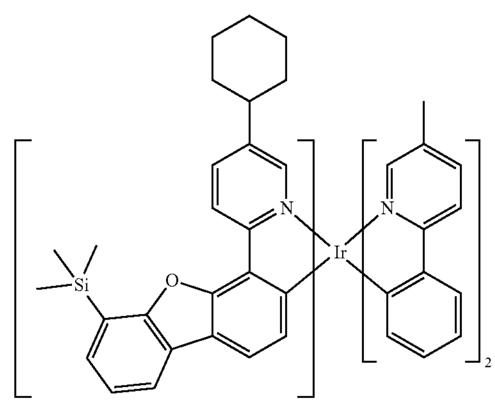

-continued
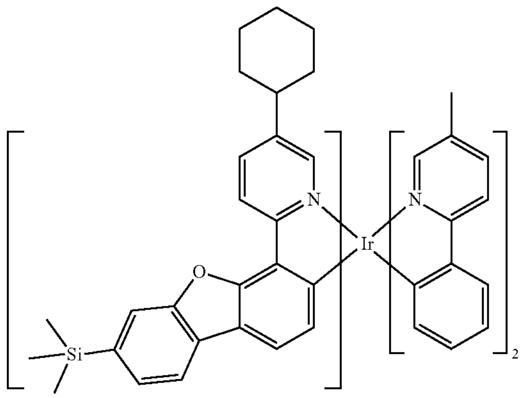
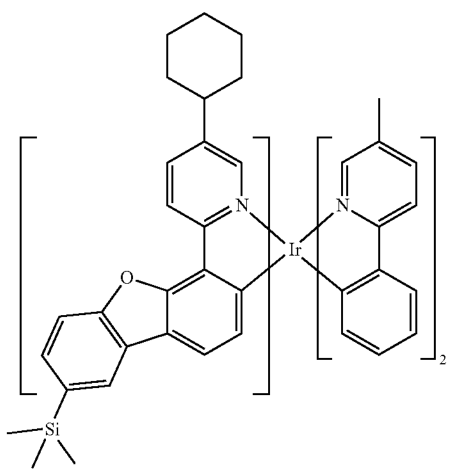
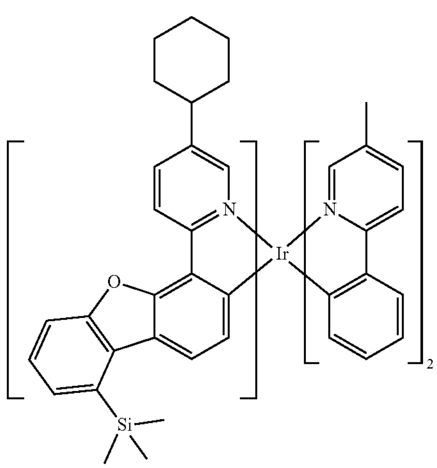
-continued
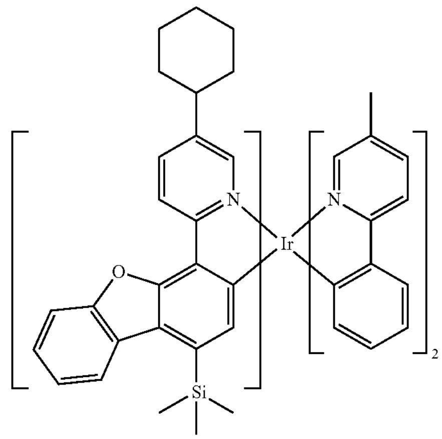
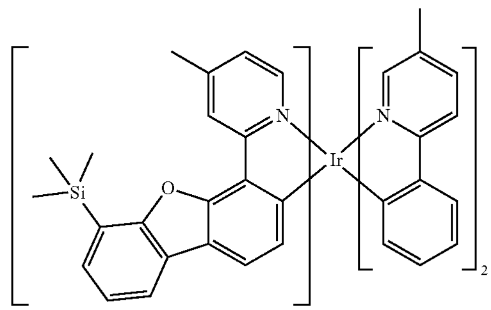
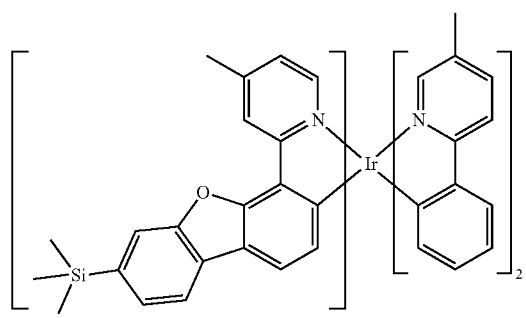
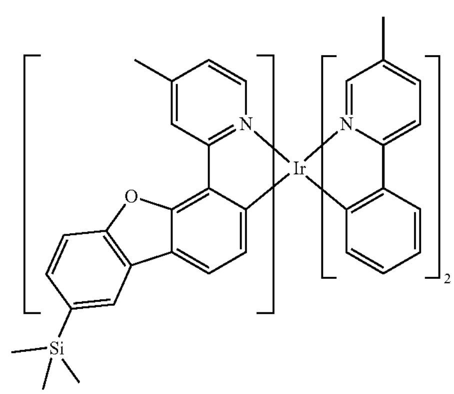

-continued
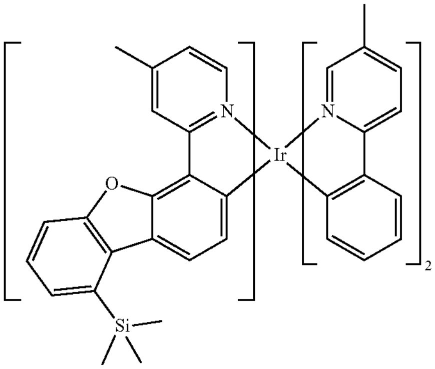
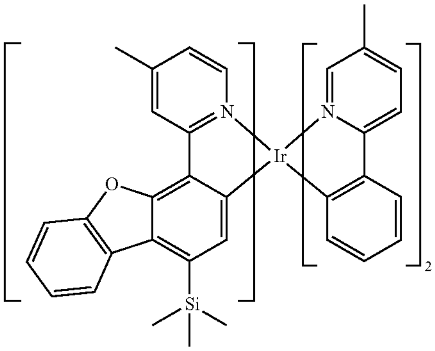
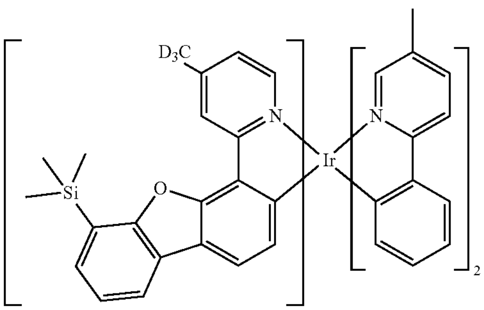
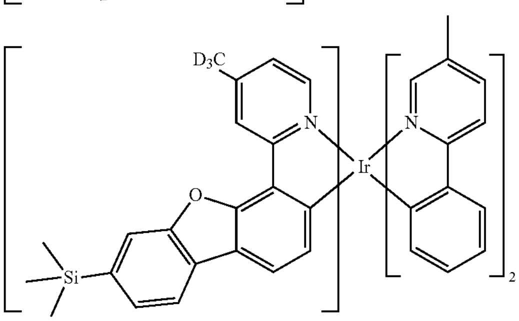
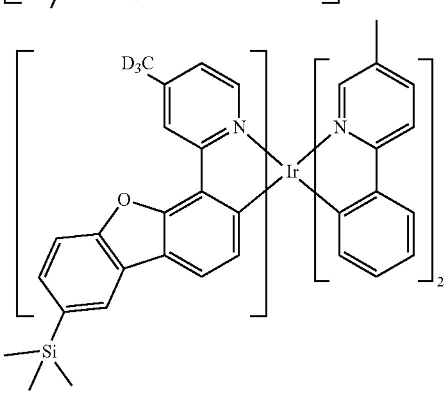
-continued
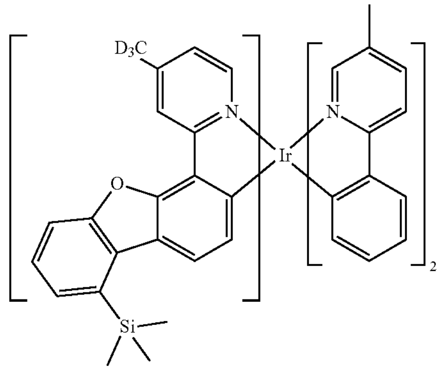
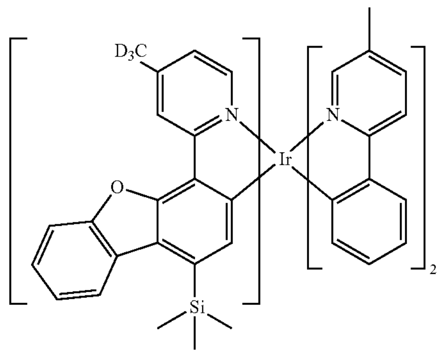
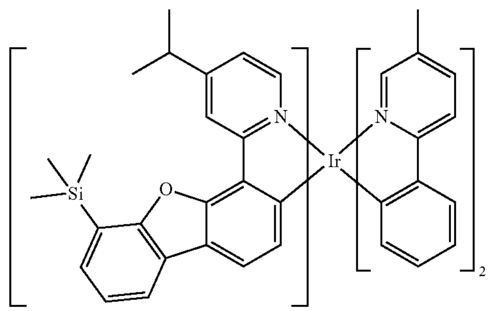
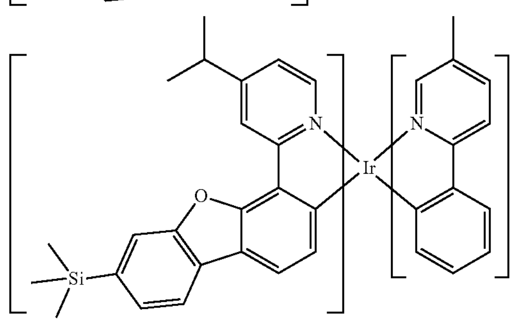
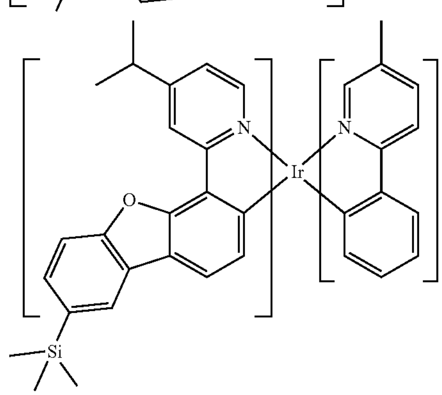

-continued
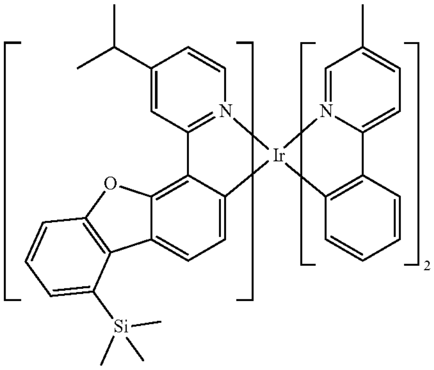
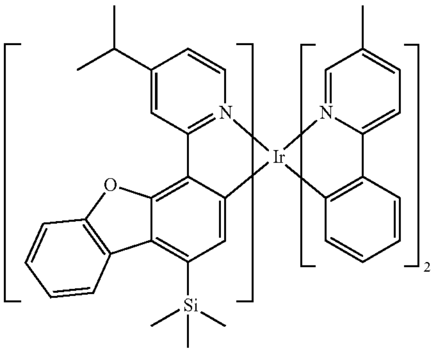
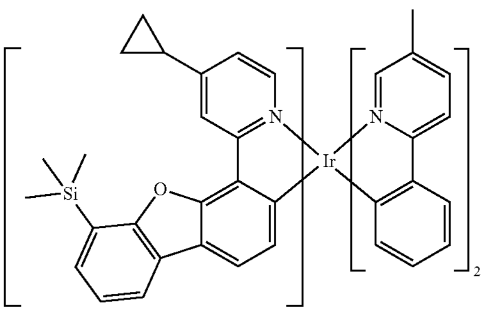
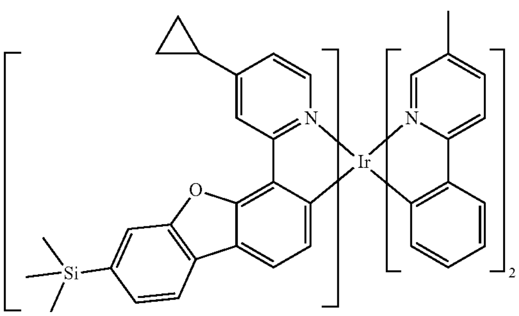
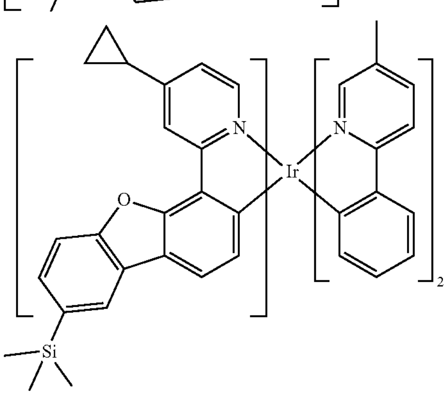
-continued
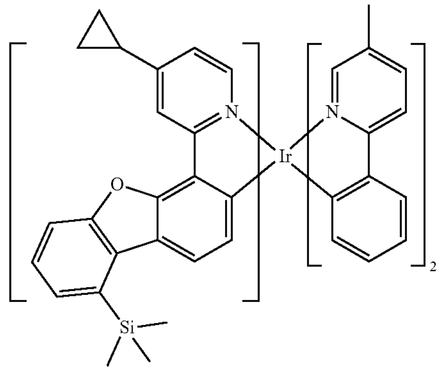
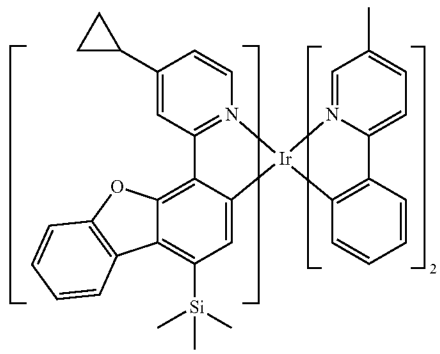
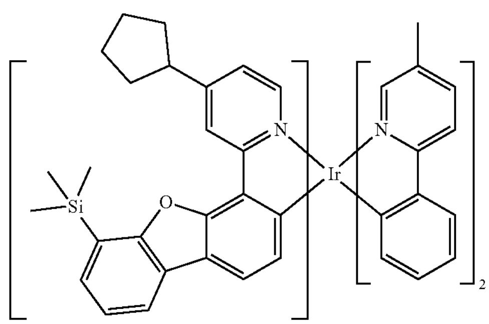
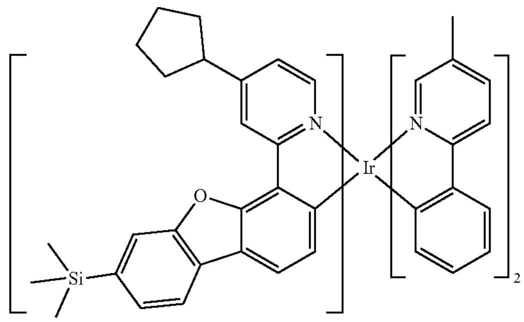

-continued
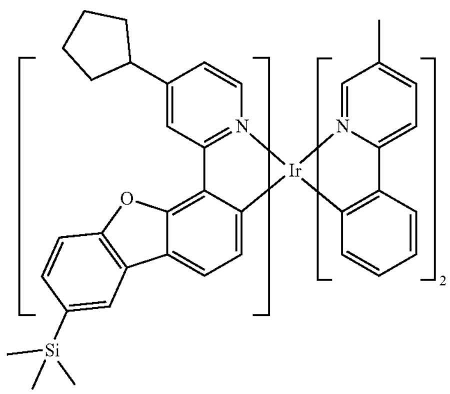
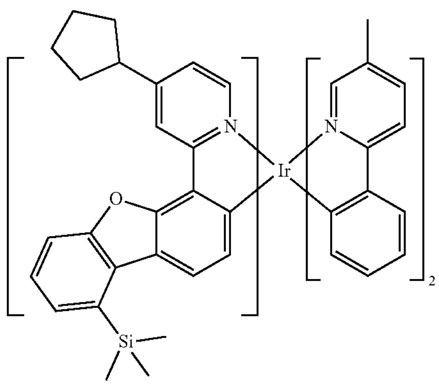
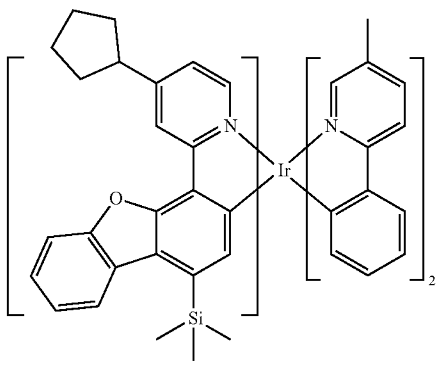
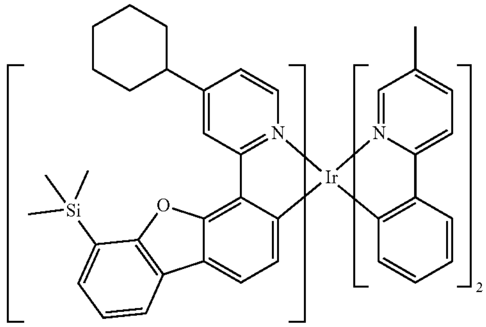
-continued
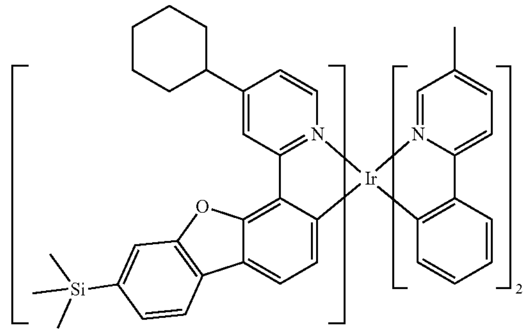
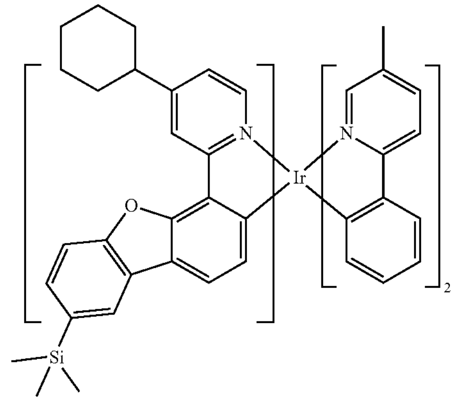
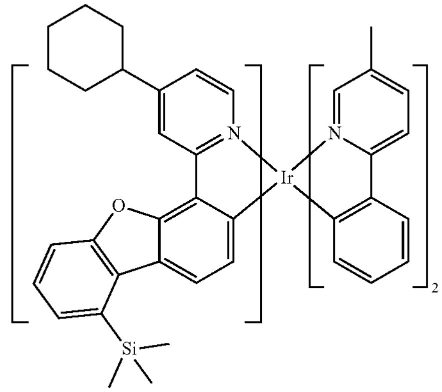
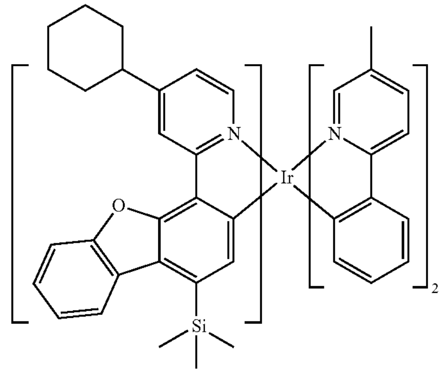

-continued
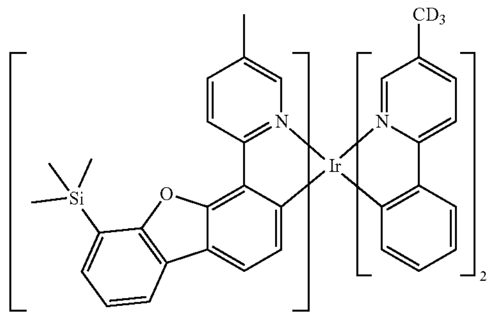
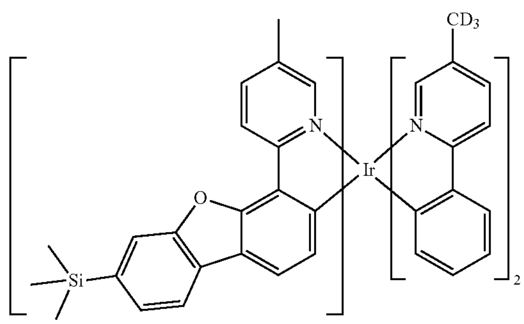
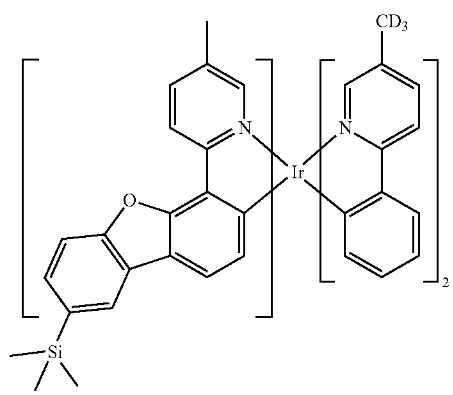
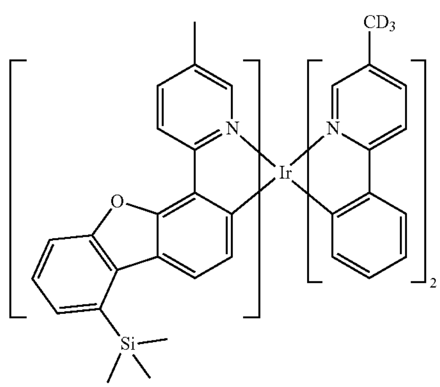
-continued
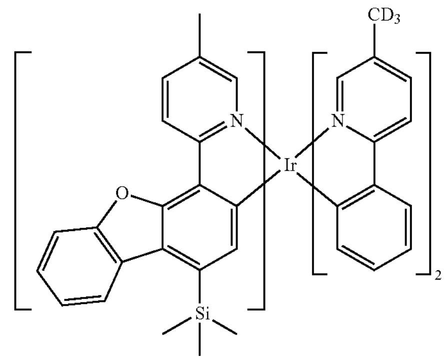
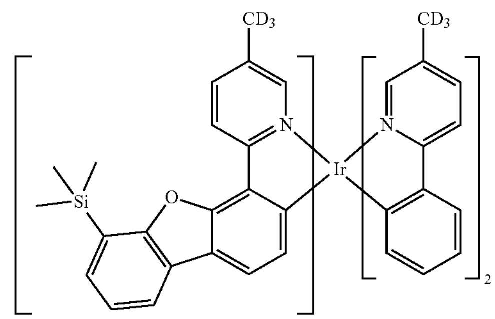
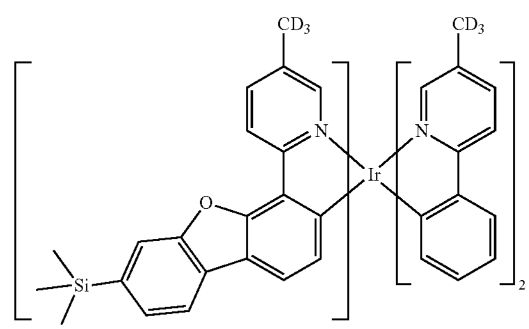
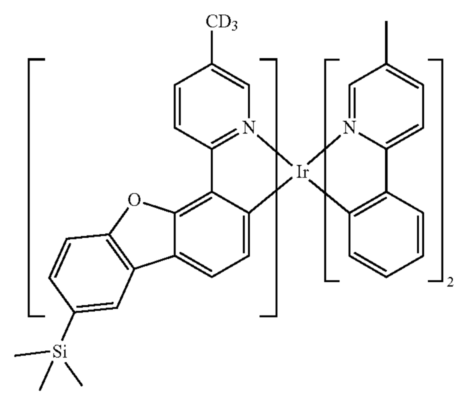

-continued
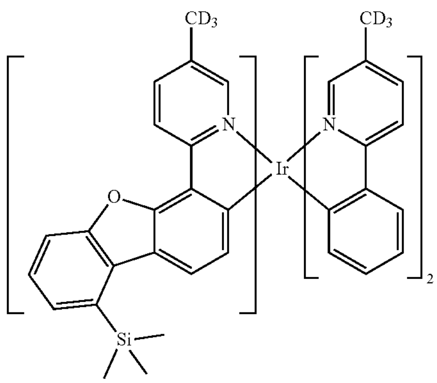
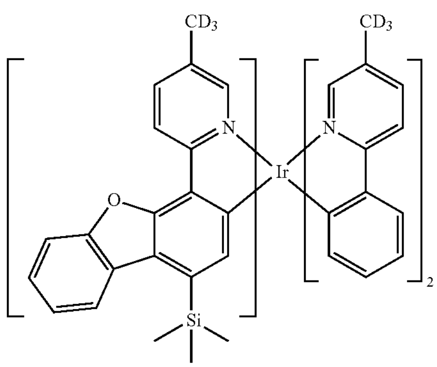
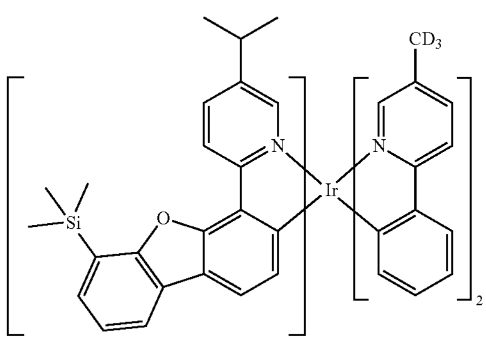
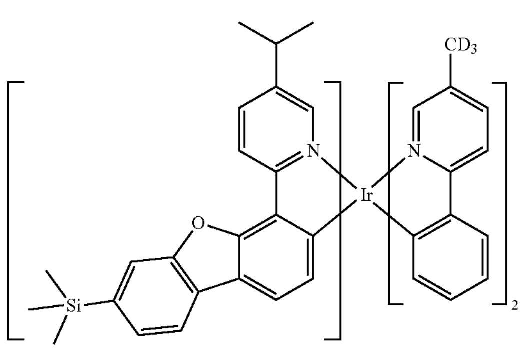
-continued
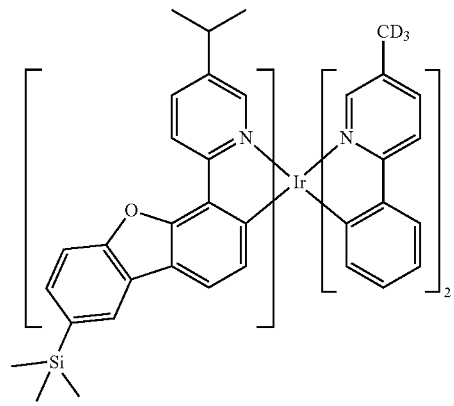
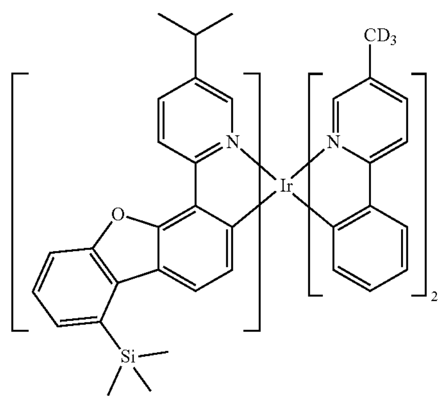
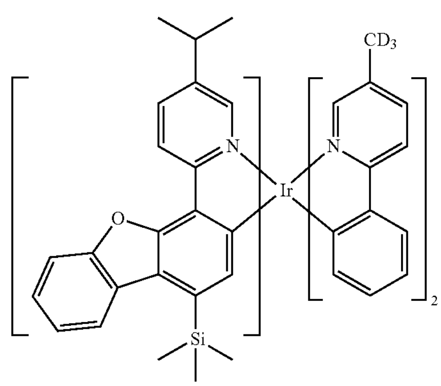
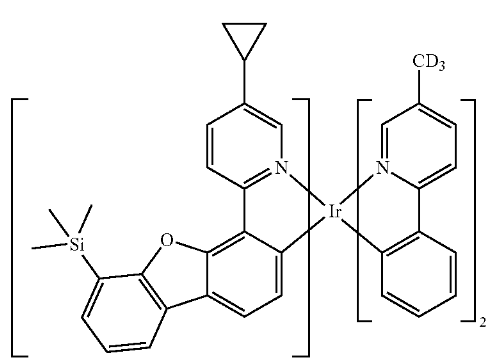

-continued
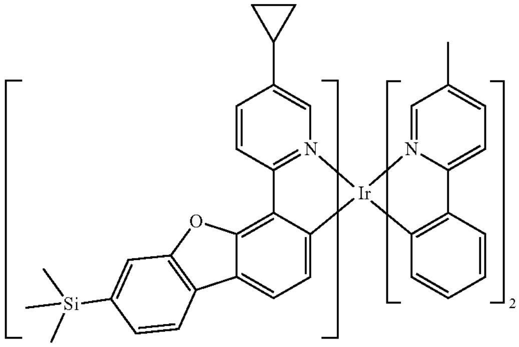
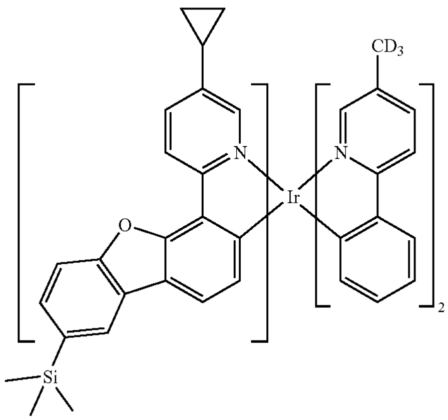
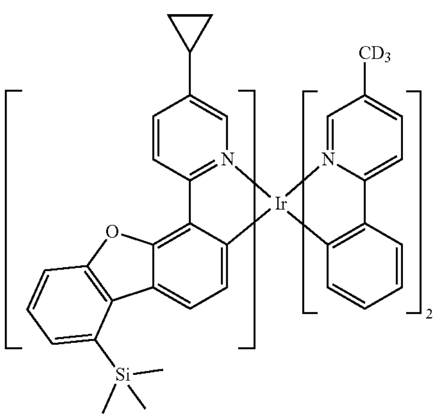
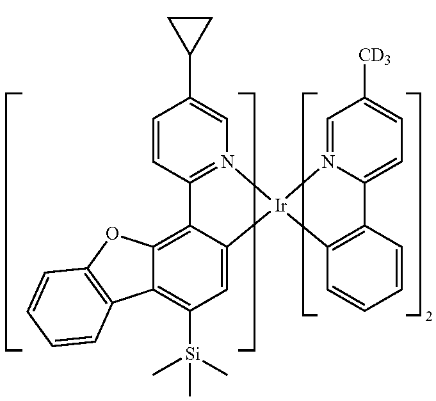
-continued
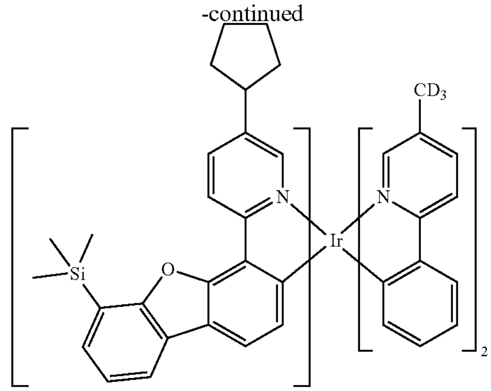
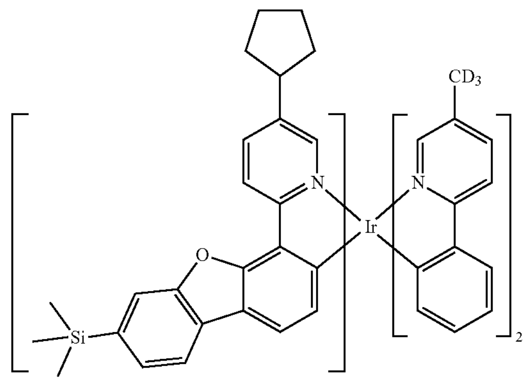
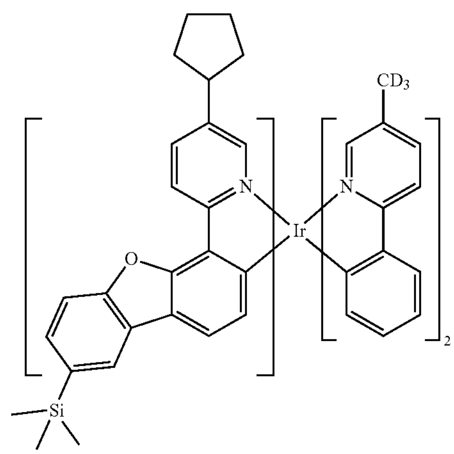
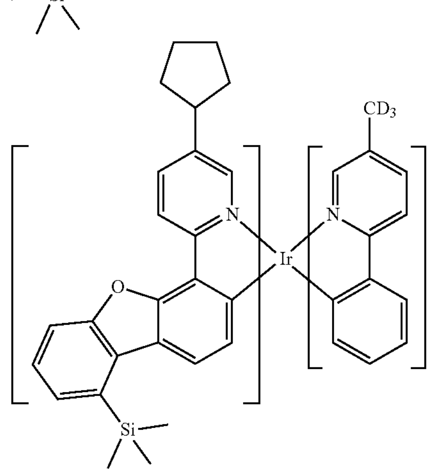

-continued
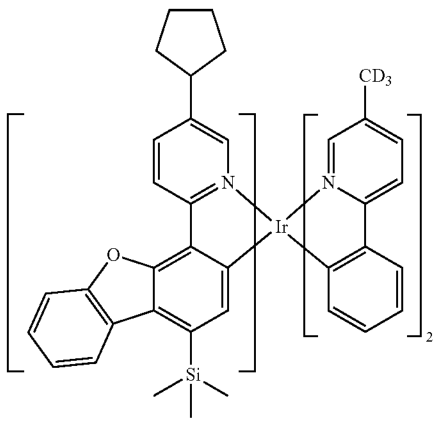
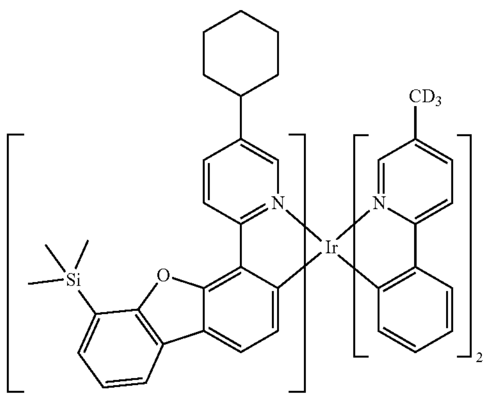
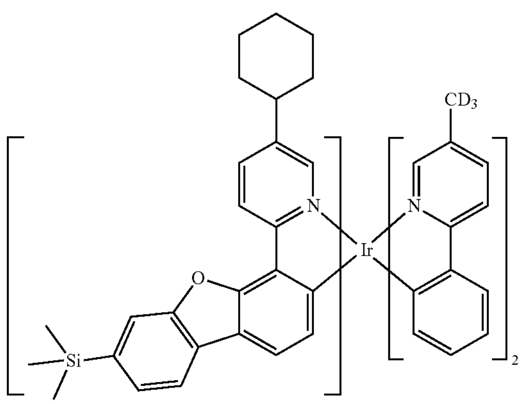
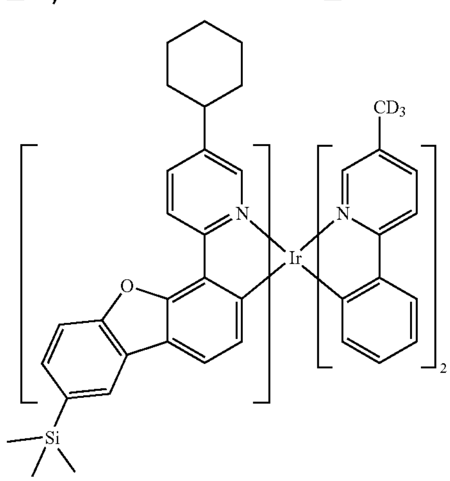
-continued
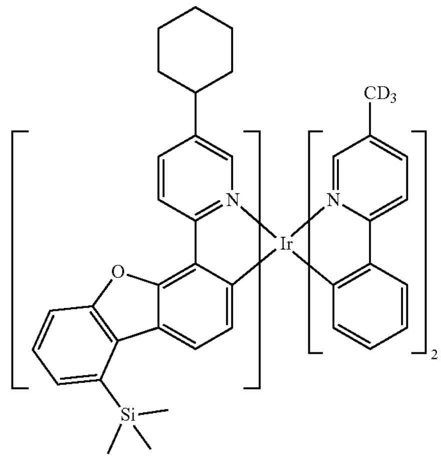
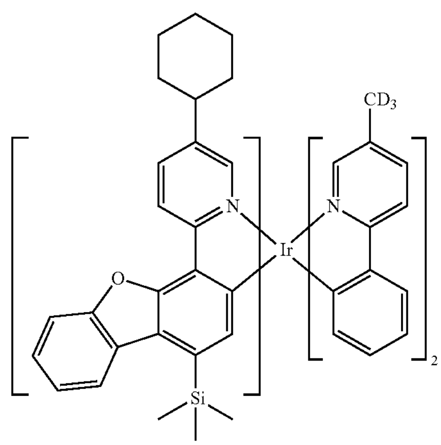
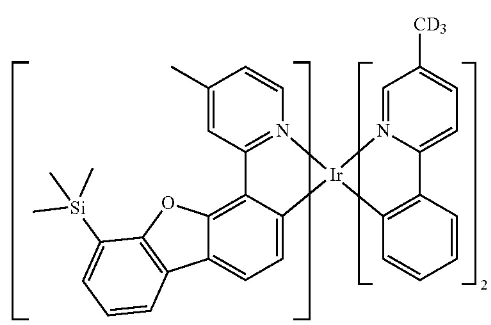
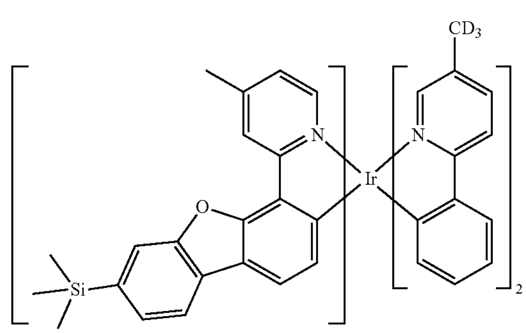

-continued
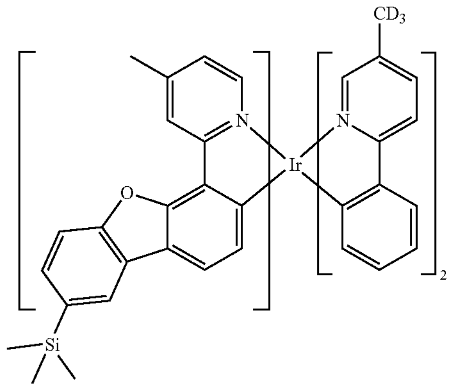
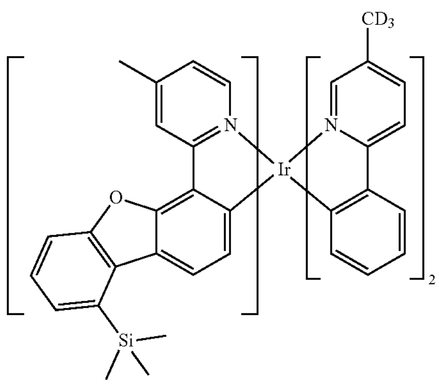
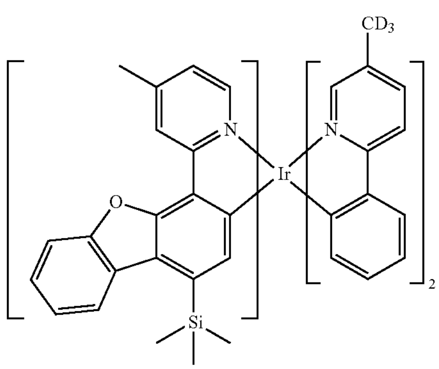
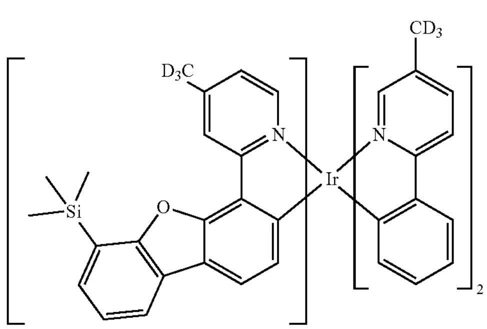
-continued
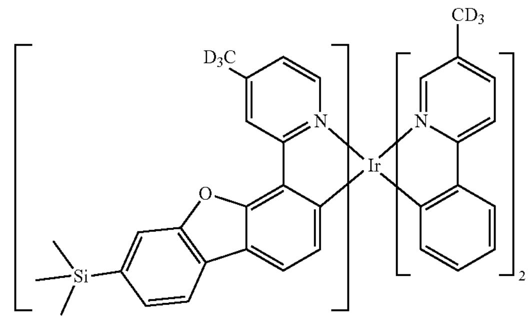
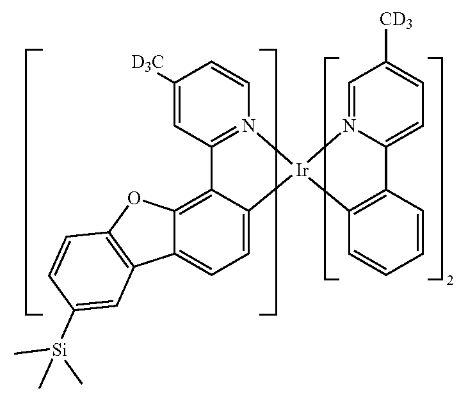
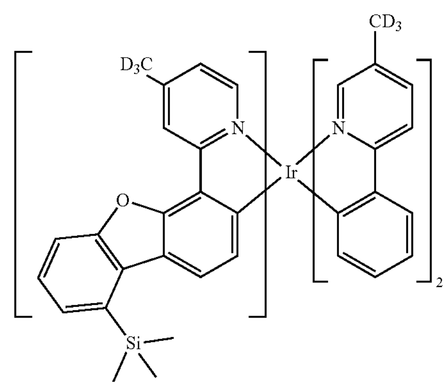
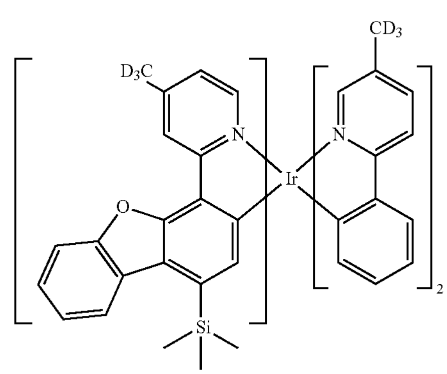

-continued
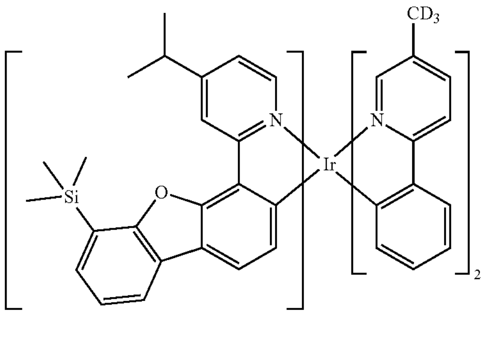
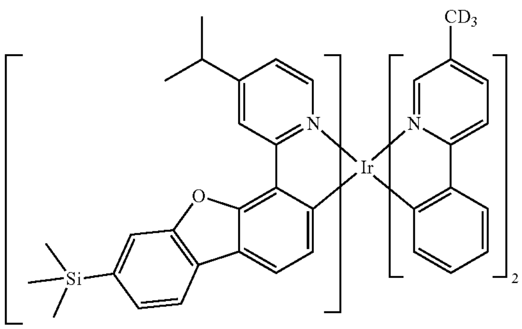
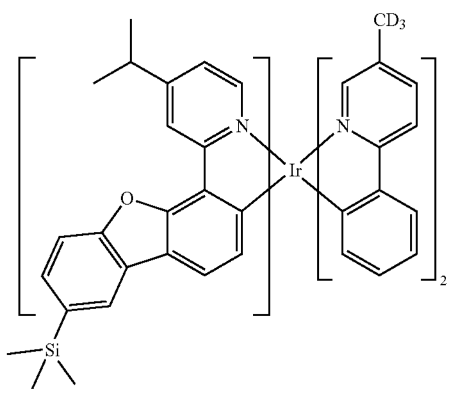
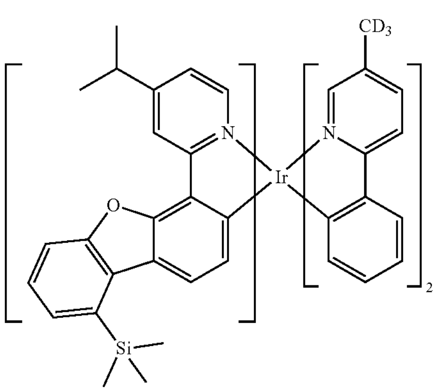
-continued
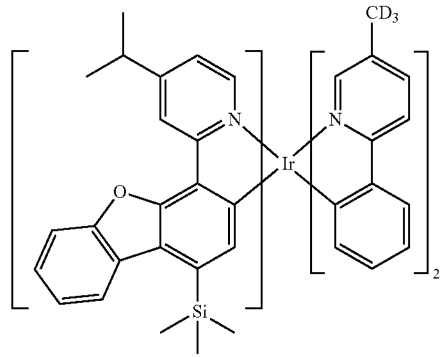
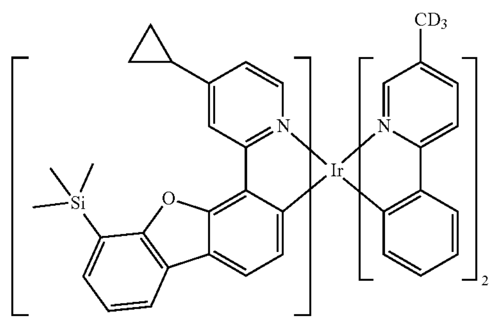
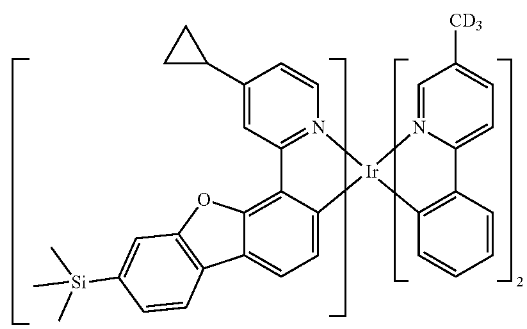
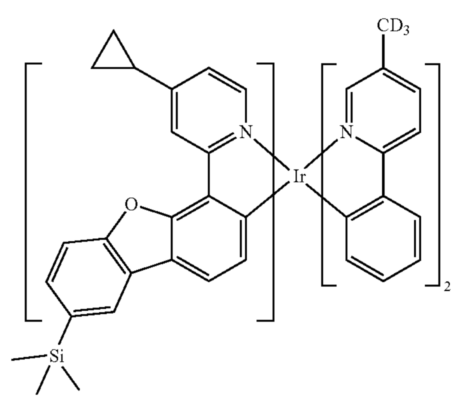

-continued
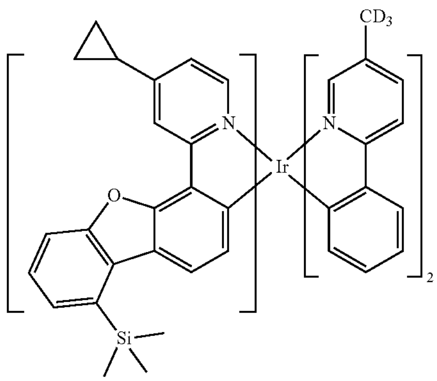
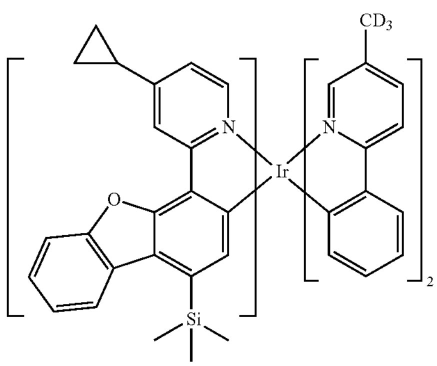
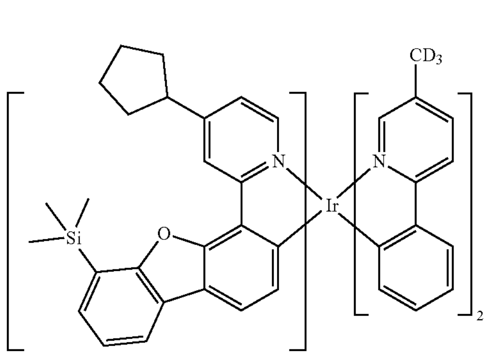
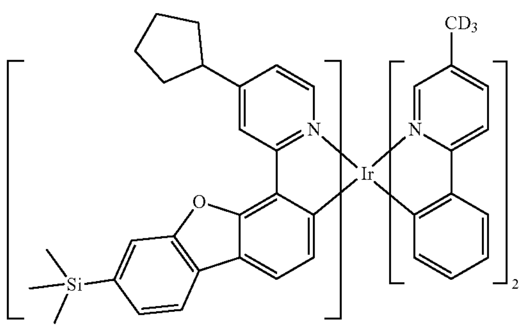
-continued
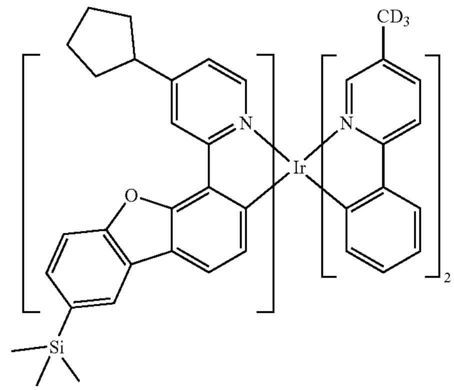
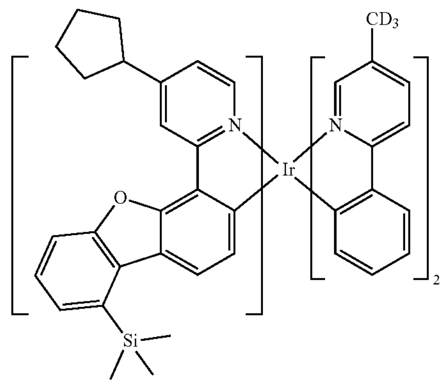
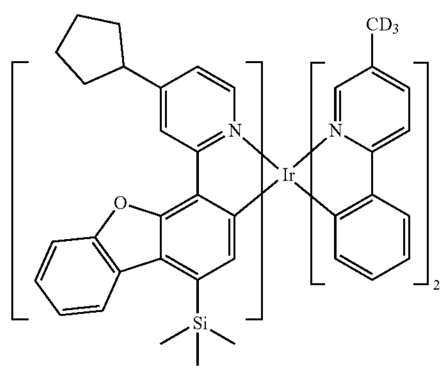
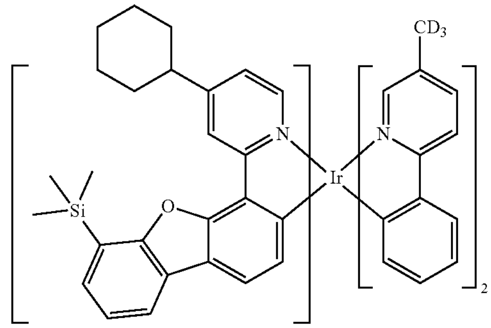

-continued
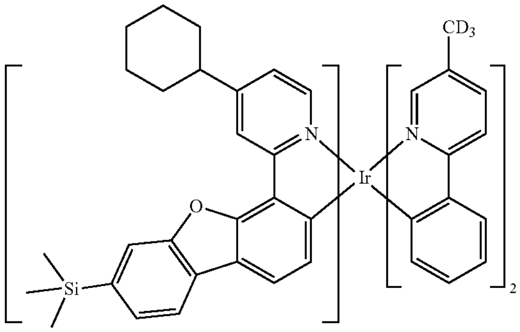
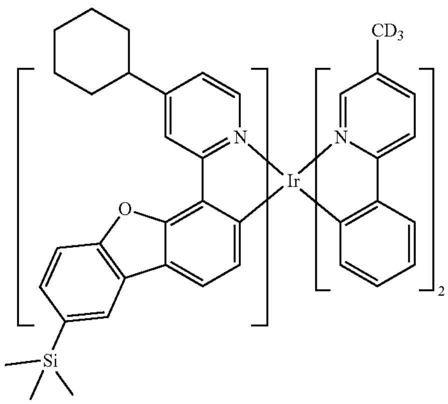
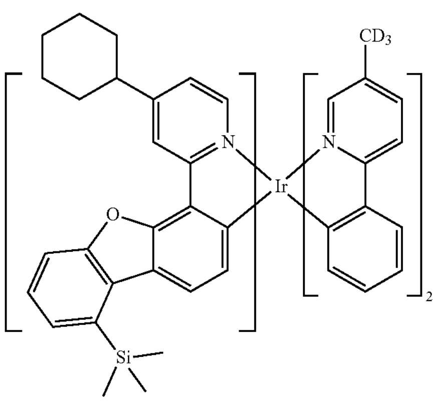
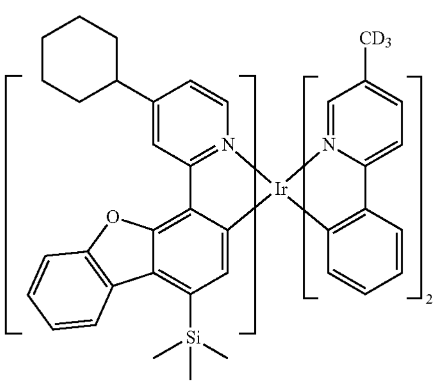
-continued
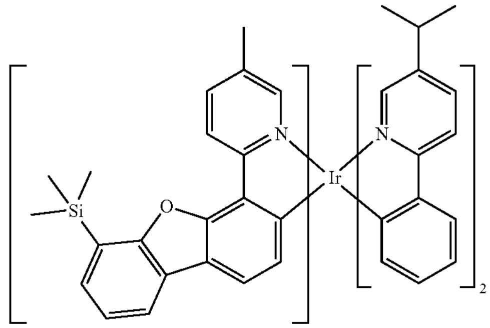
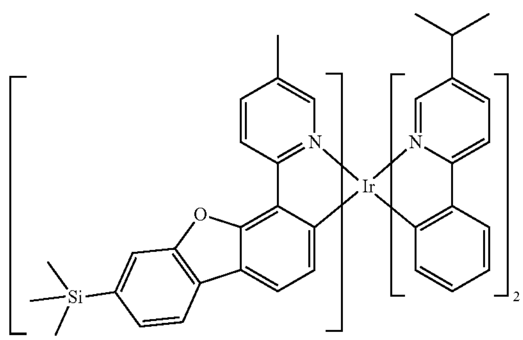
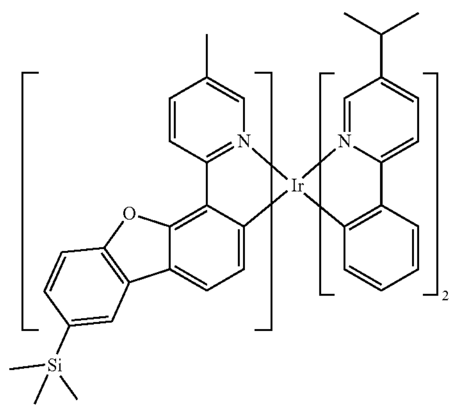
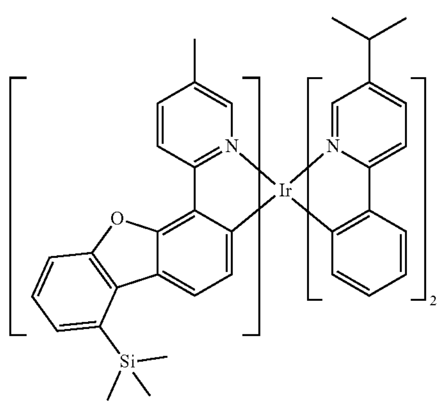

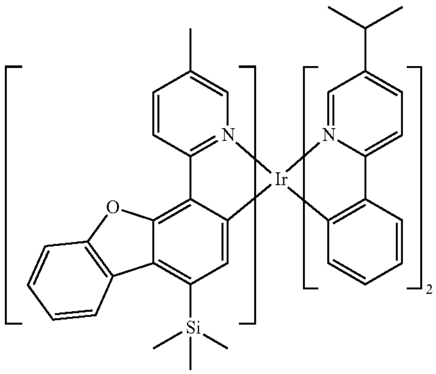
N
Ir
N
O
Si
2
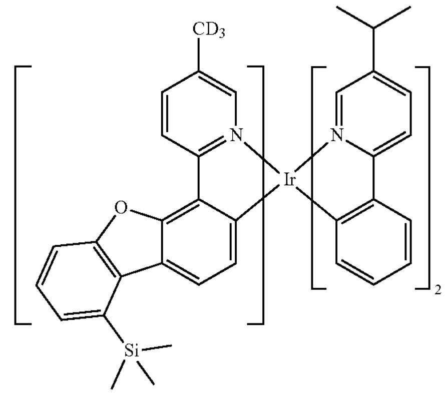
CD3
N
Ir
N
O
Si
2
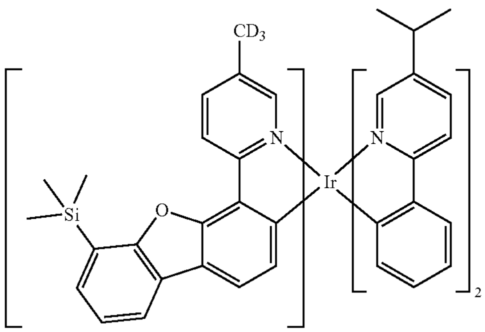
CD3
N
Ir
N
Si
O
2
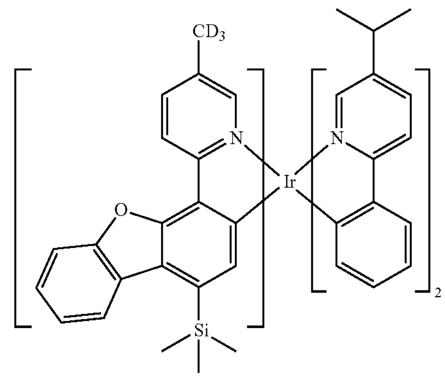
CD3
N
Ir
N
O
Si
2
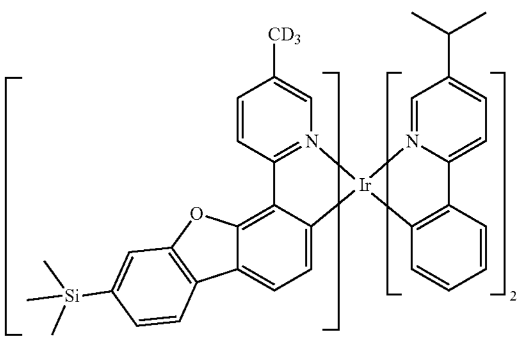
CD3
N
Ir
N
O
Si
2
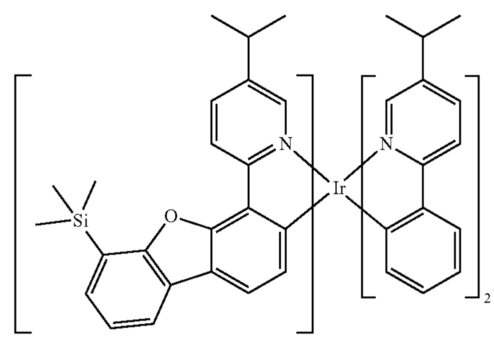
N
Ir
N
Si
O
2
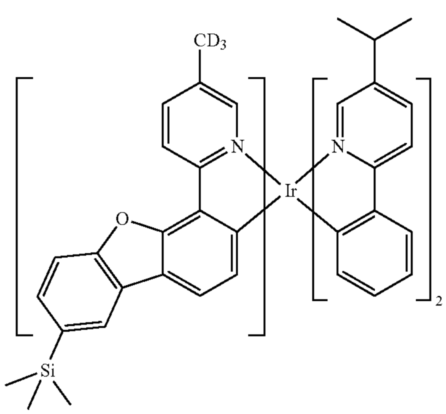
CD3
N
Ir
N
O
Si
2
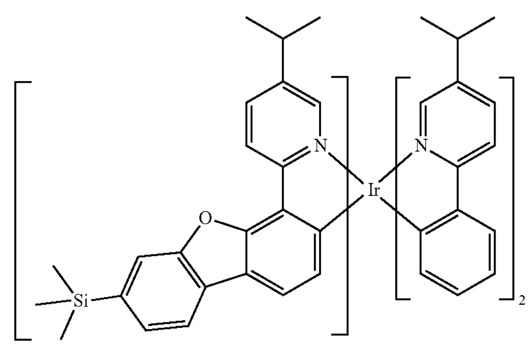
N
Ir
N
O
Si
2

-continued
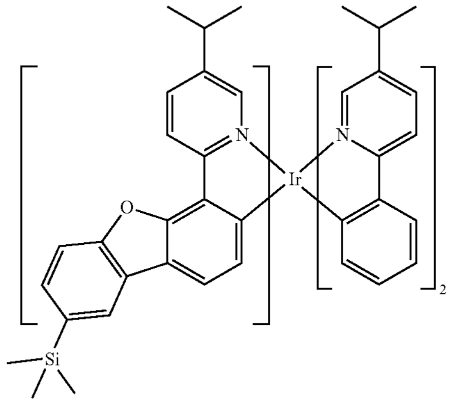
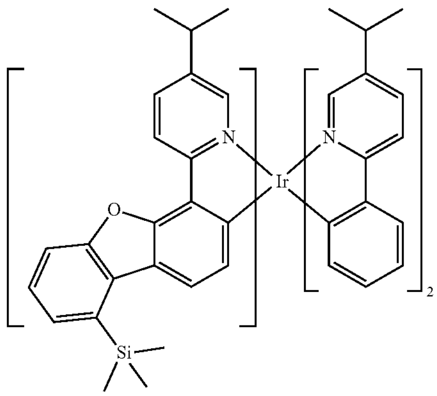
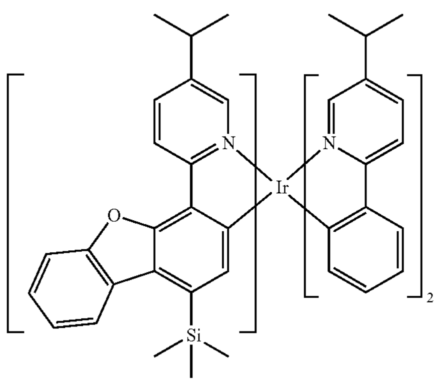
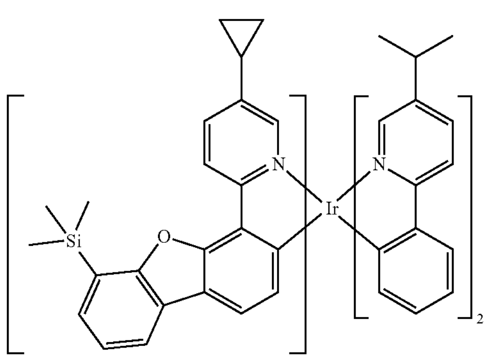
-continued
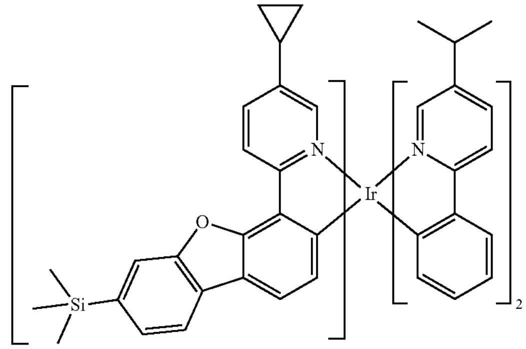
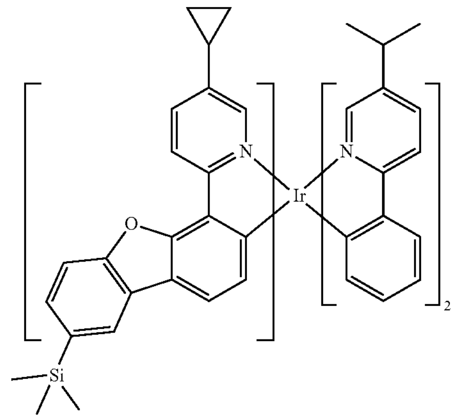
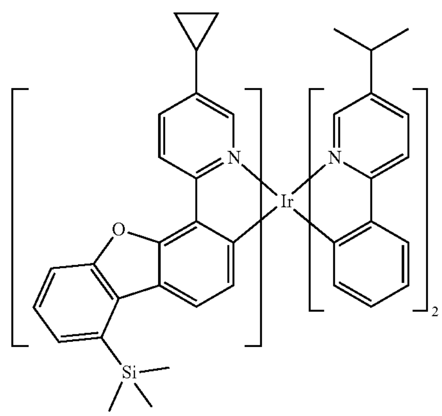
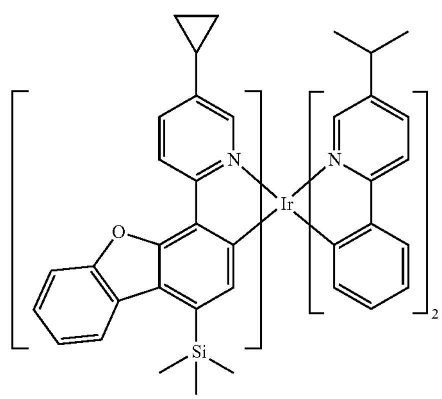

-continued
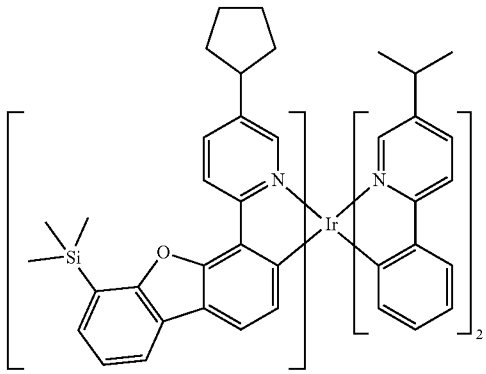
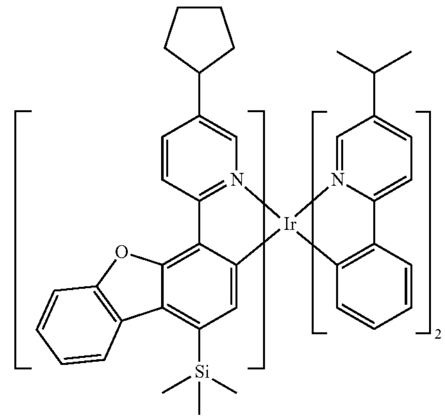
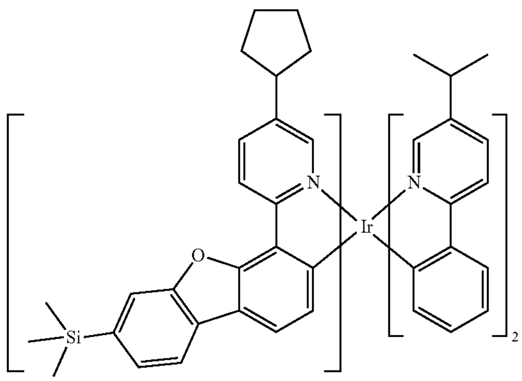
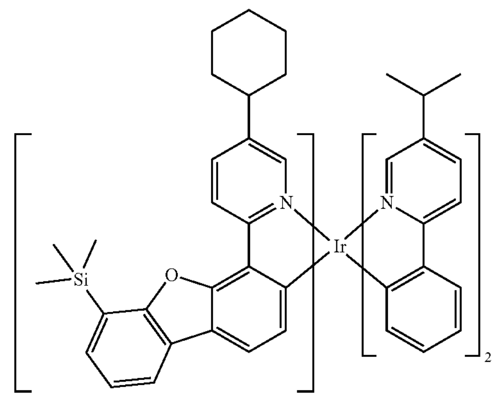
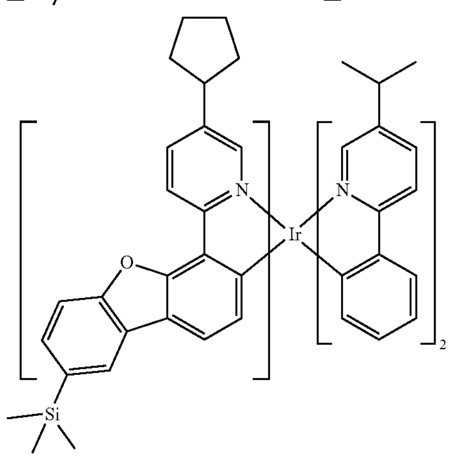
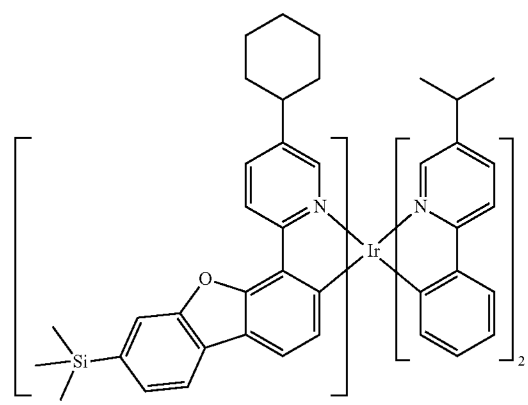
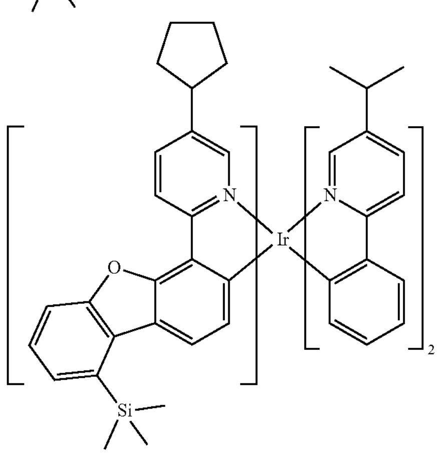
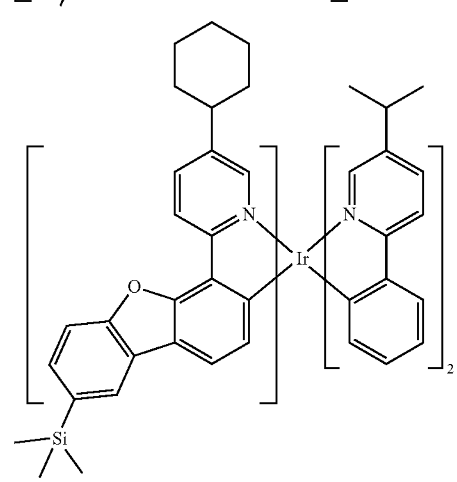

-continued
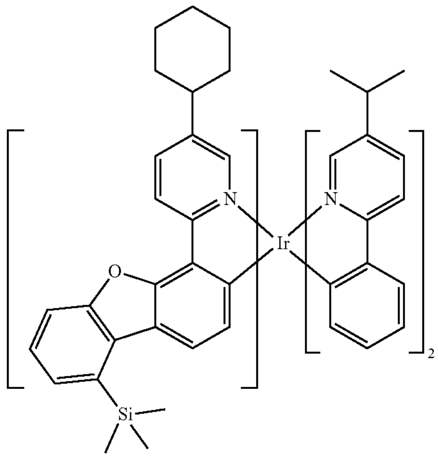
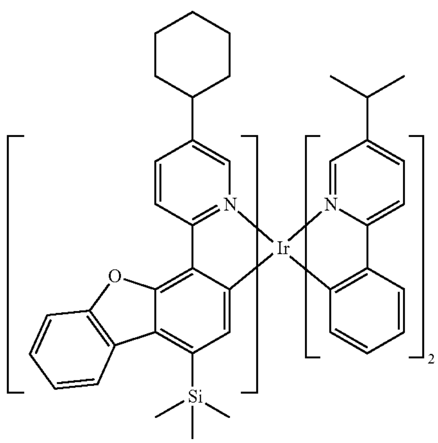
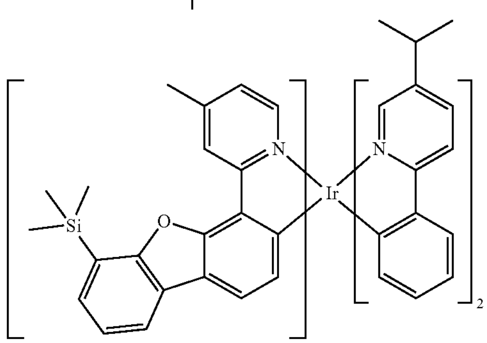
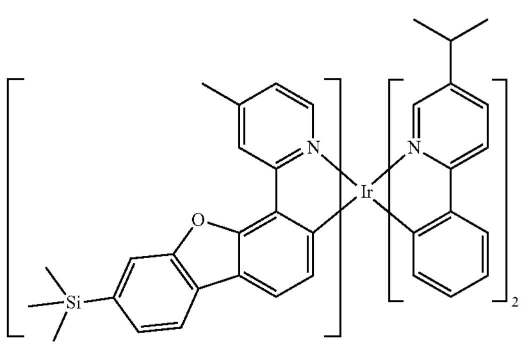
-continued
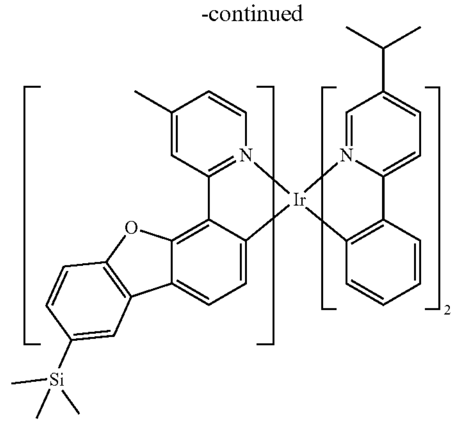
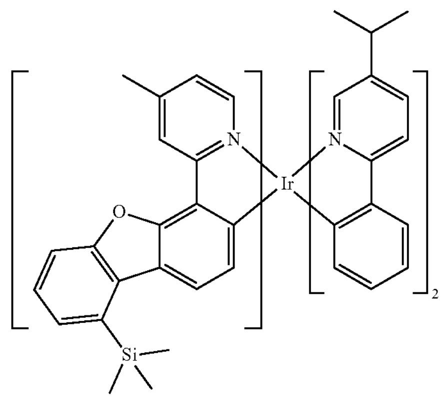
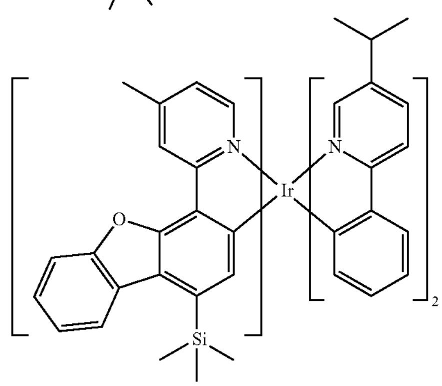
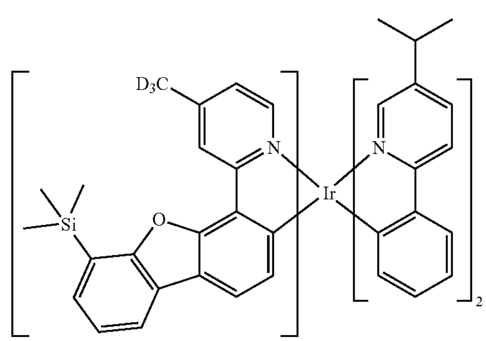

-continued
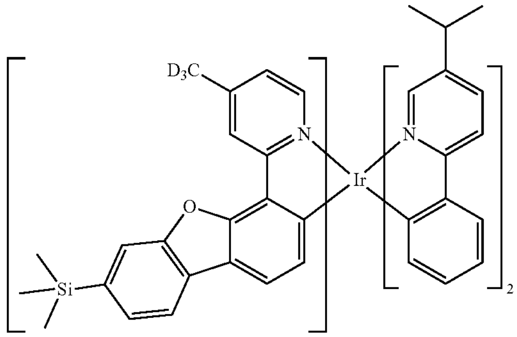
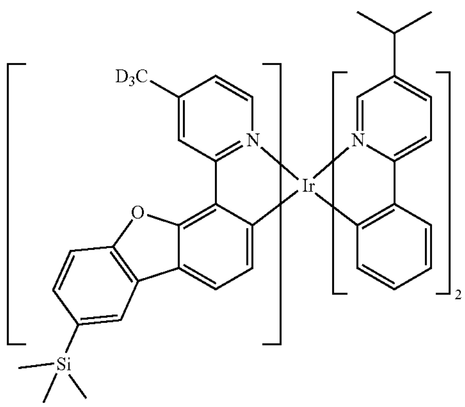
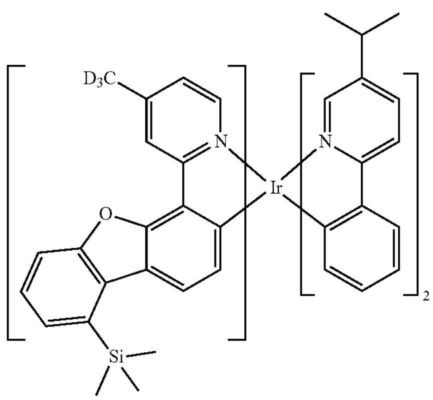
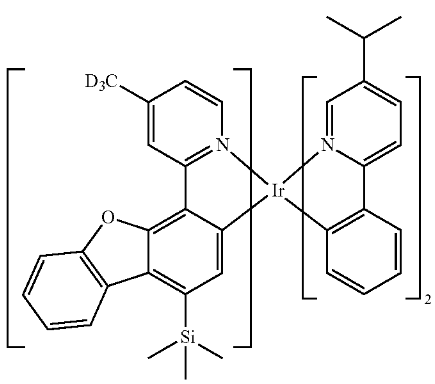
-continued
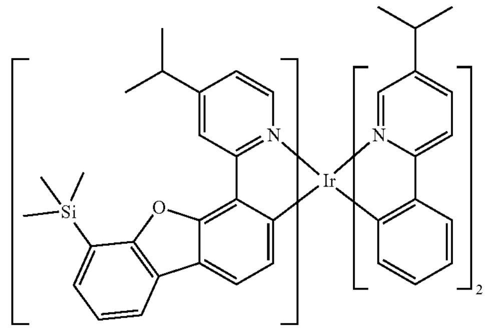
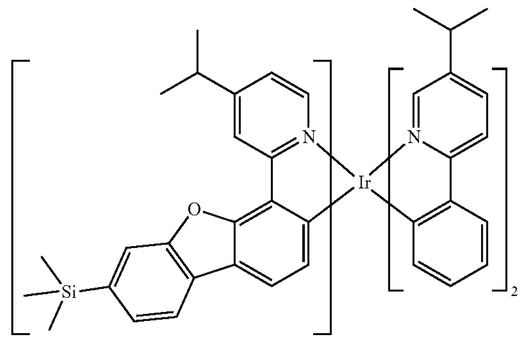
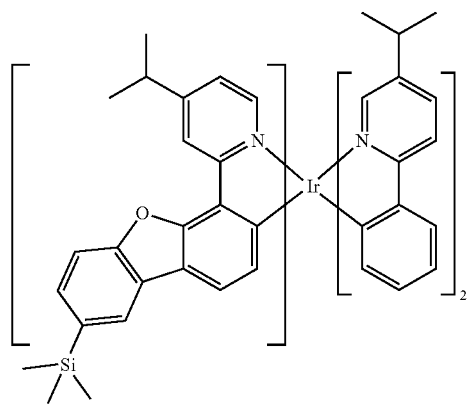
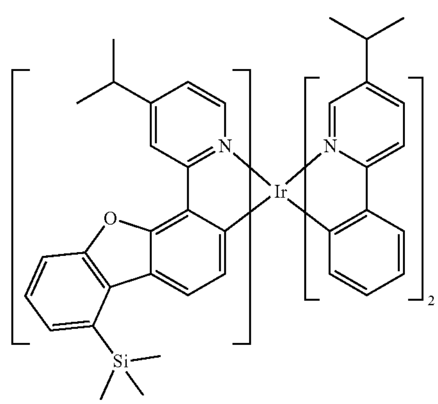

-continued
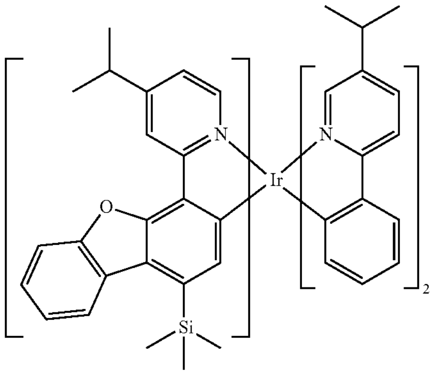
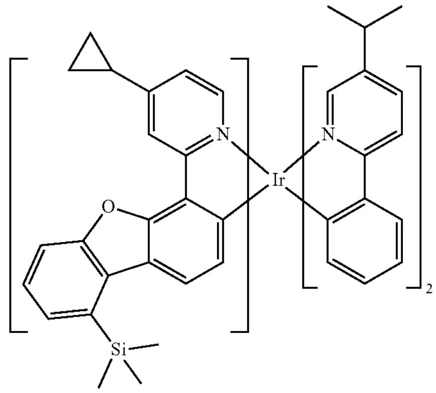
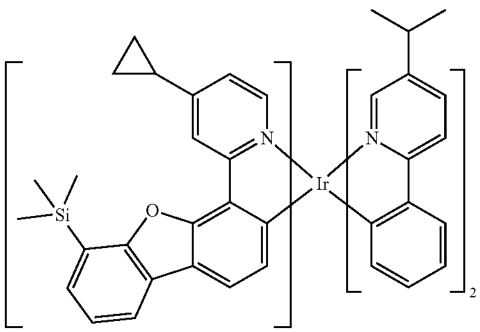
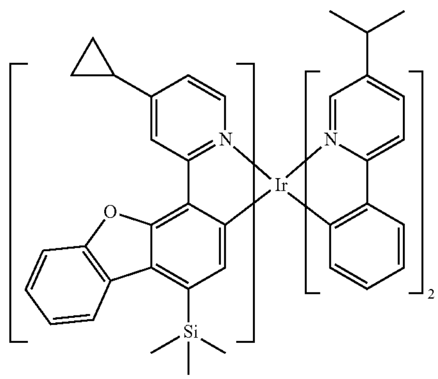
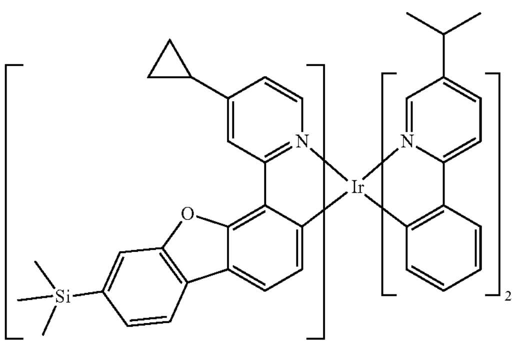
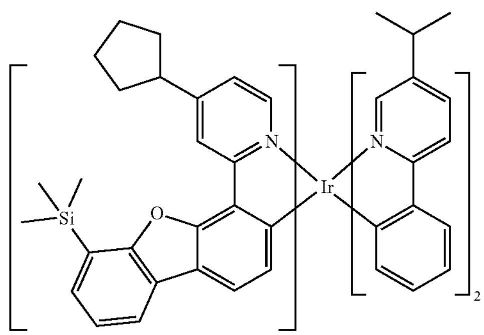
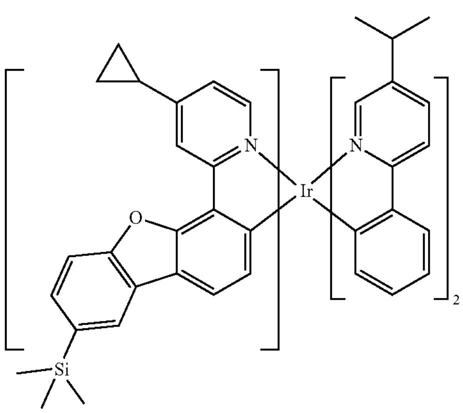
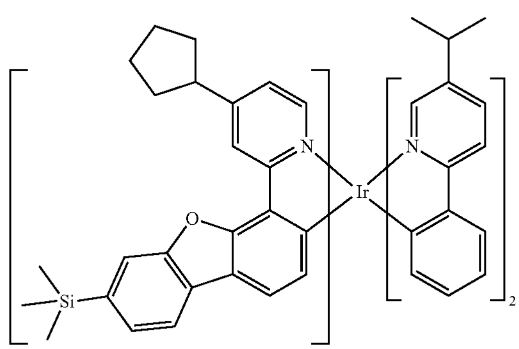
-continued -continued
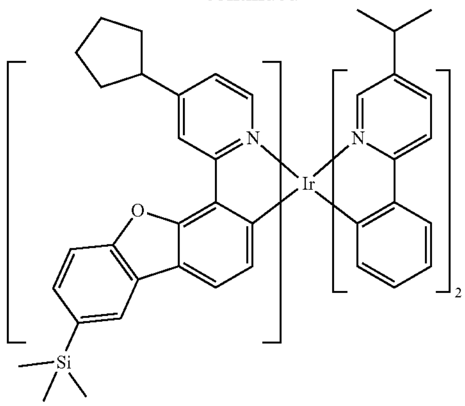
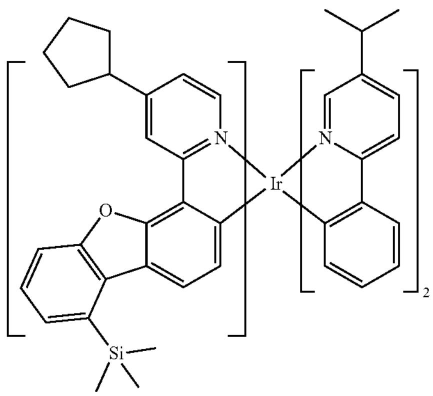
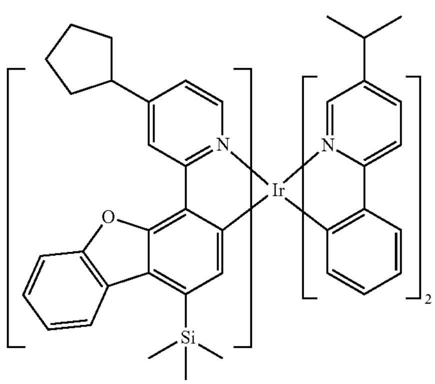
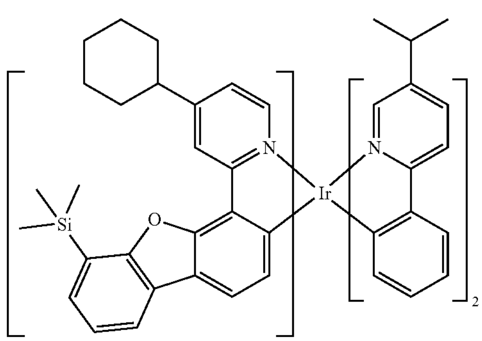
-continued
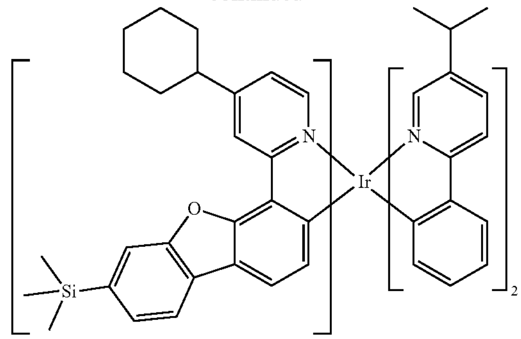
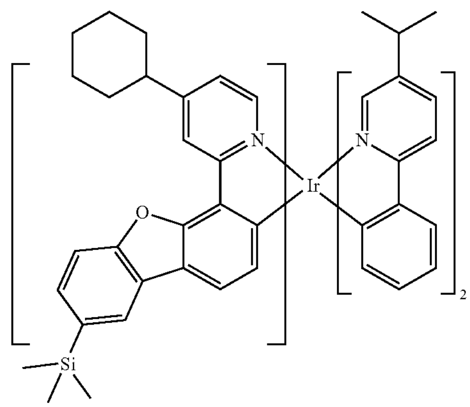
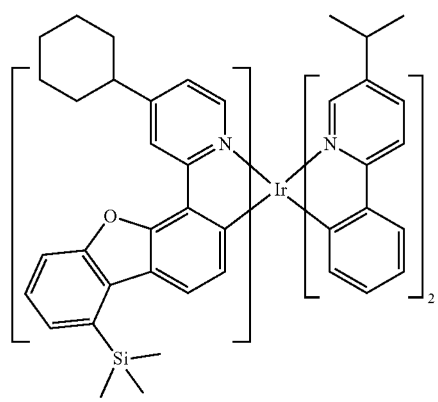
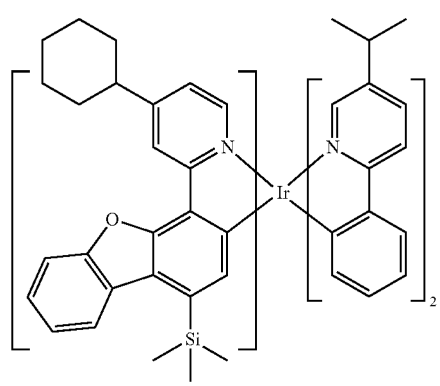

-continued
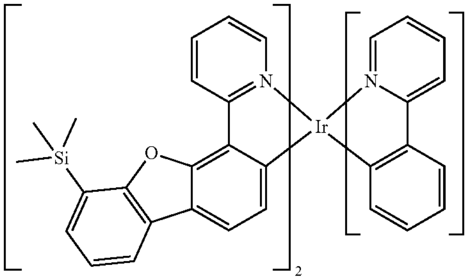
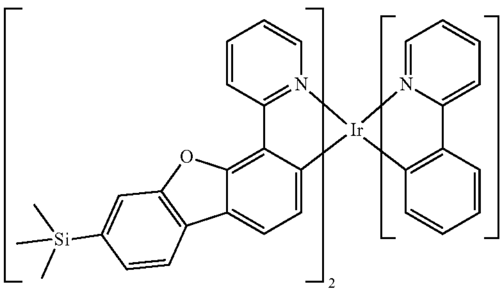
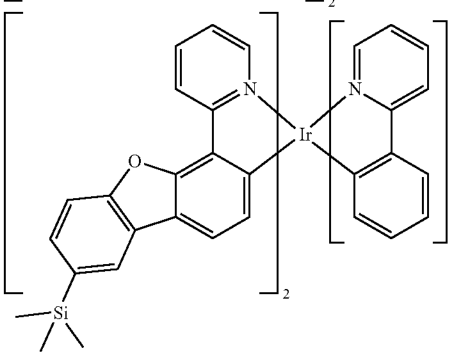
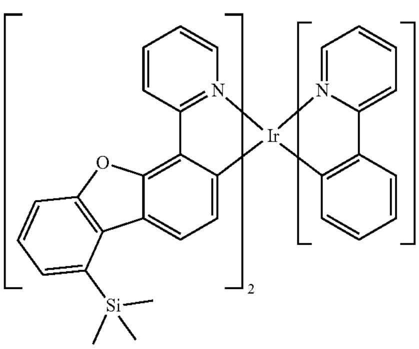
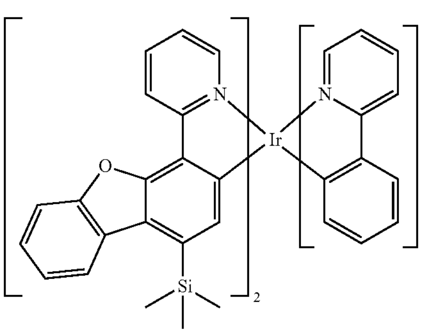
-continued
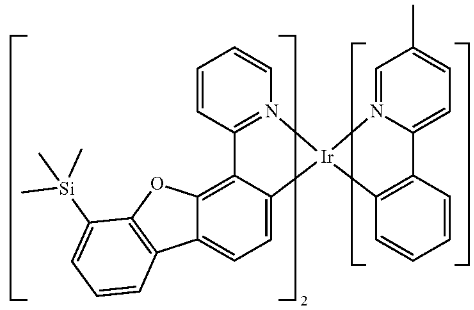
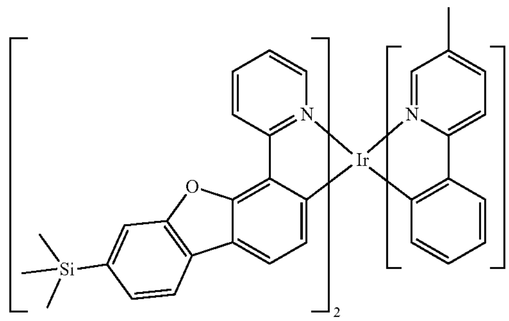
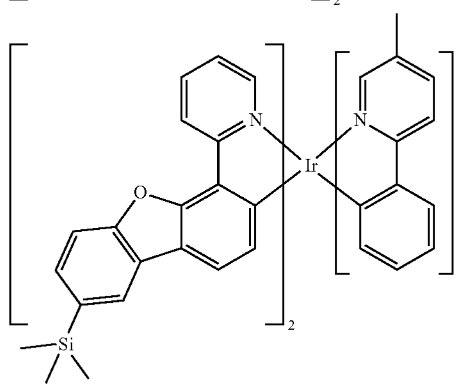
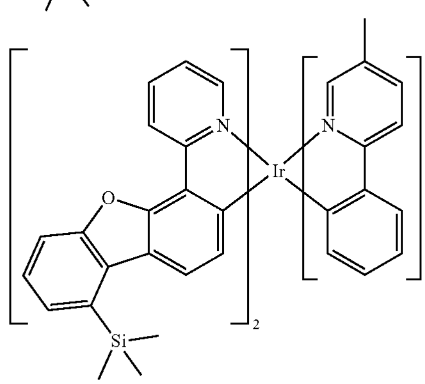
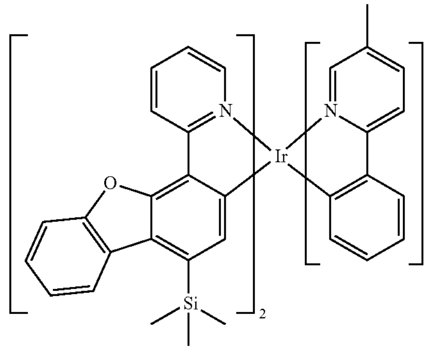

-continued
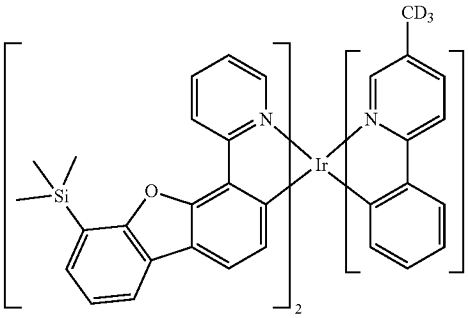
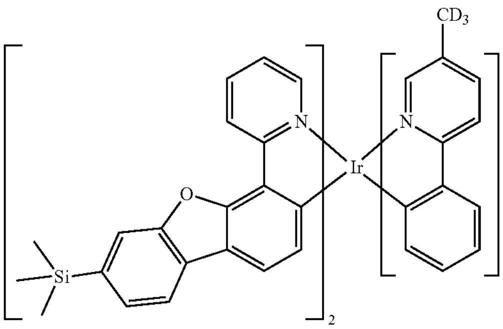
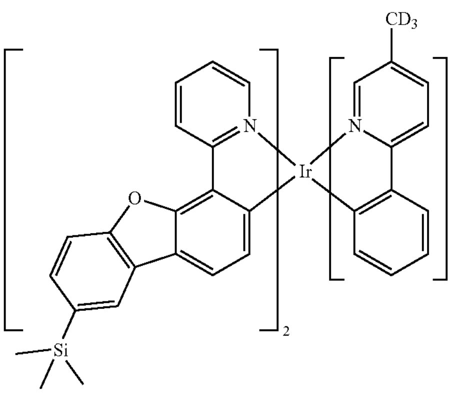
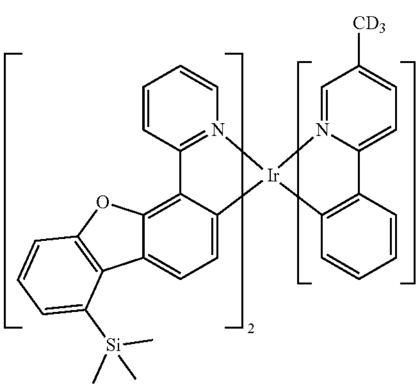
-continued
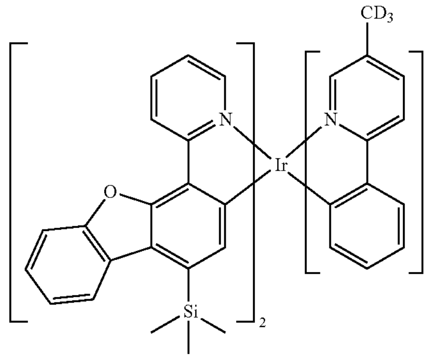
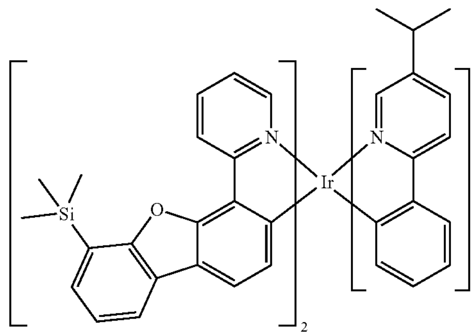
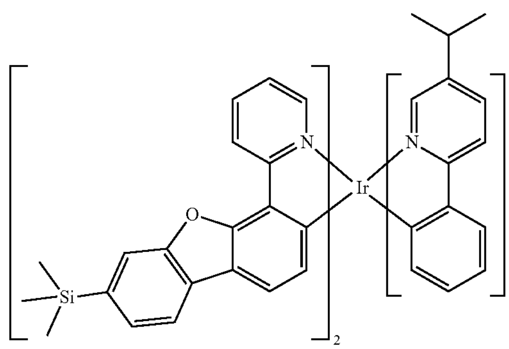
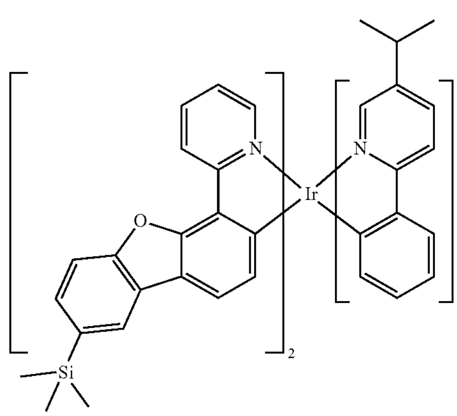

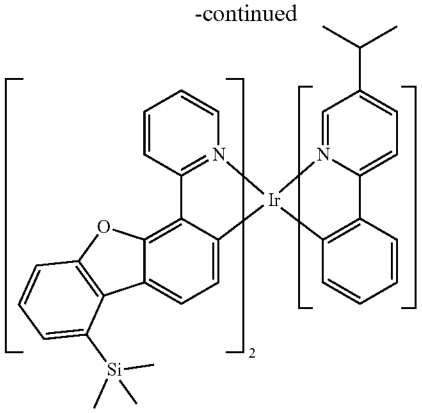
N
N
Ir
O
Si
2
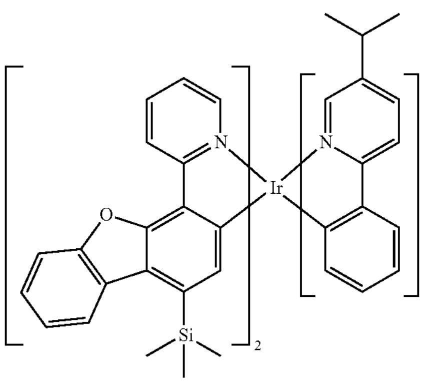
N
N
Ir
O
Si
2
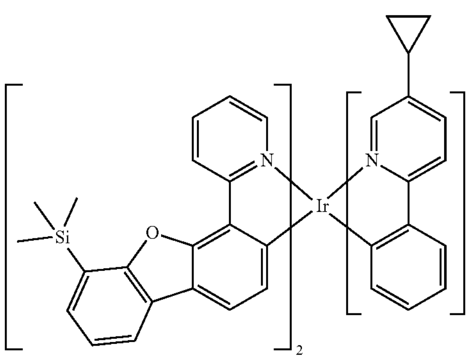
N
N
Ir
Si
O
2
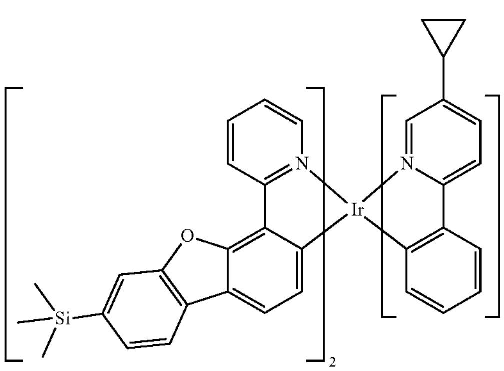
N
N
Ir
O
Si
2
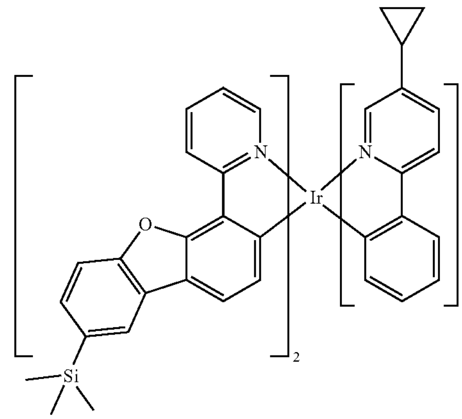
N
N
Ir
O
Si
2
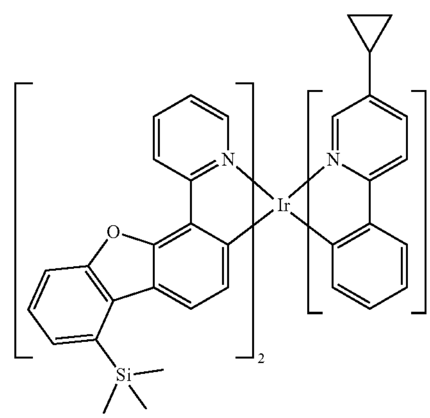
N
N
Ir
O
Si
2
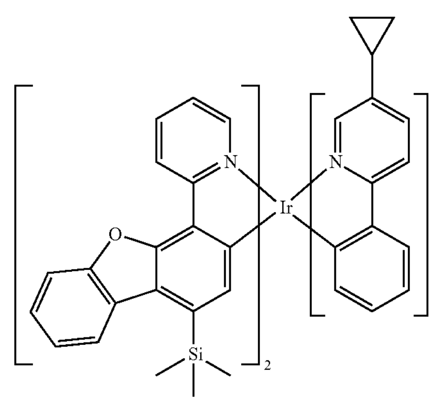
N
N
Ir
O
Si
2
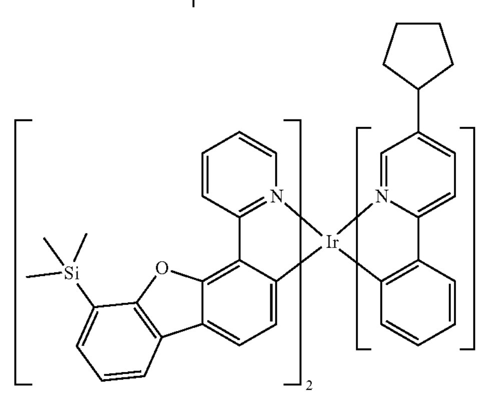
N
N
Ir
Si
O
2

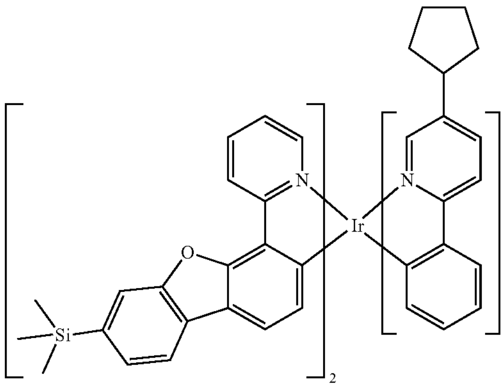
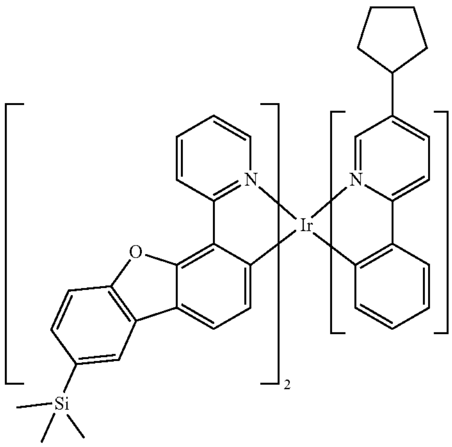
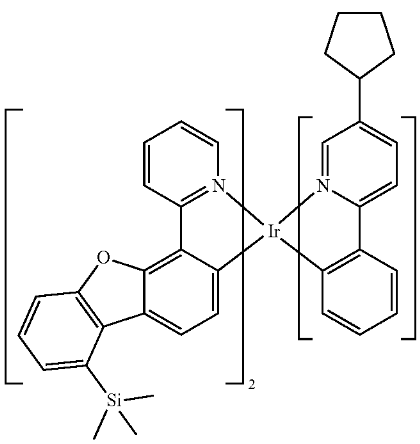
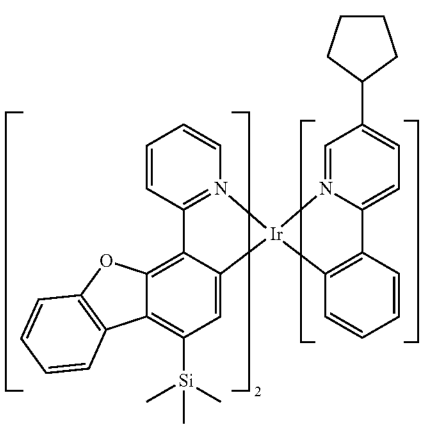
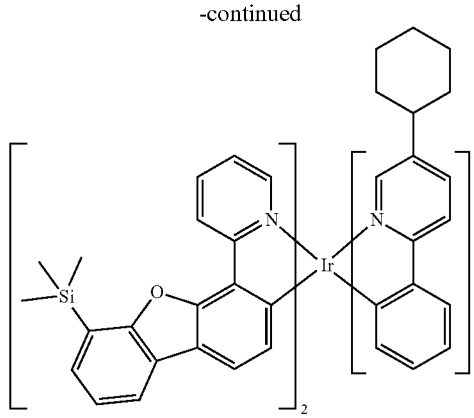
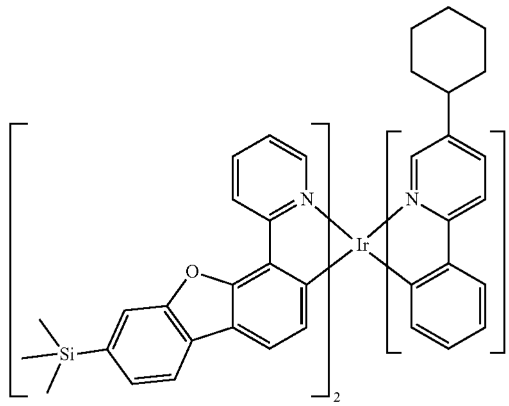
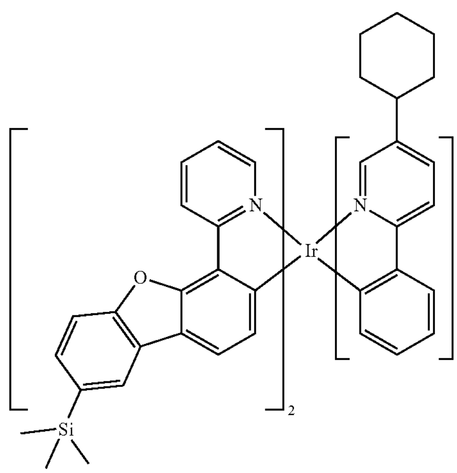
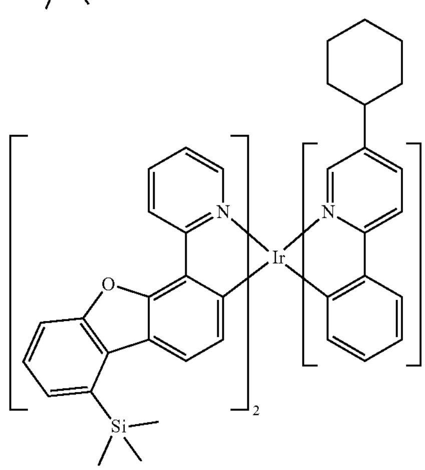

-continued
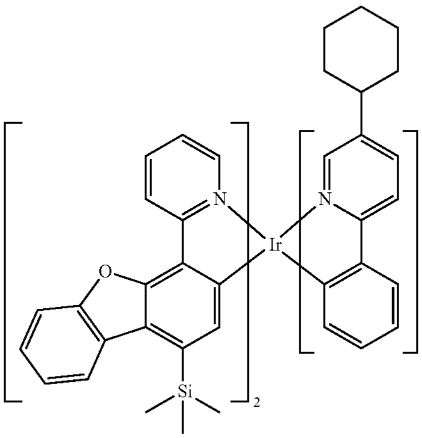
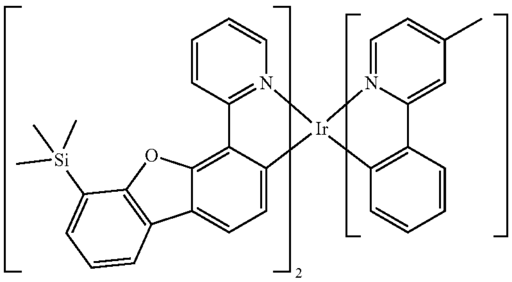
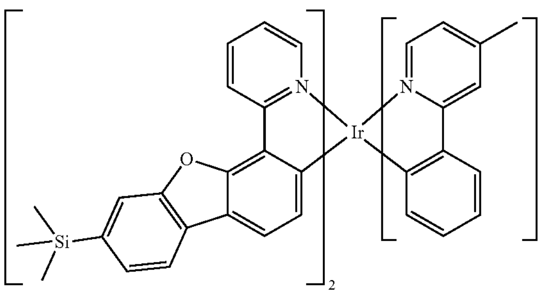
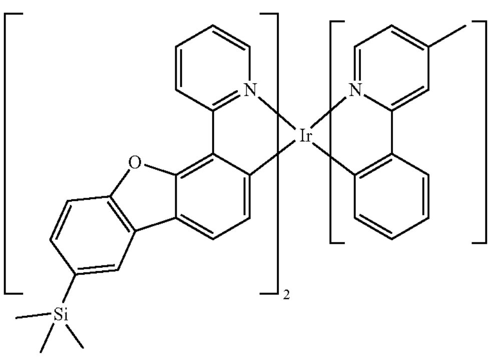
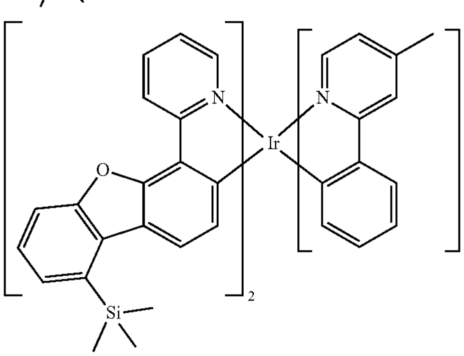
-continued
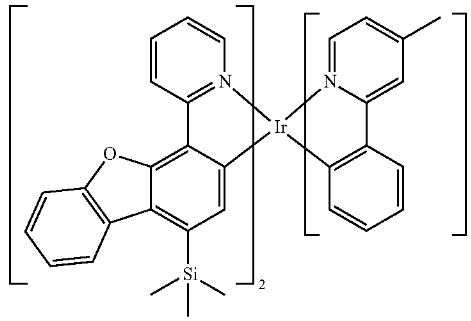
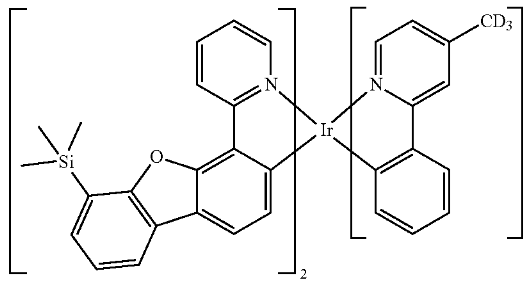
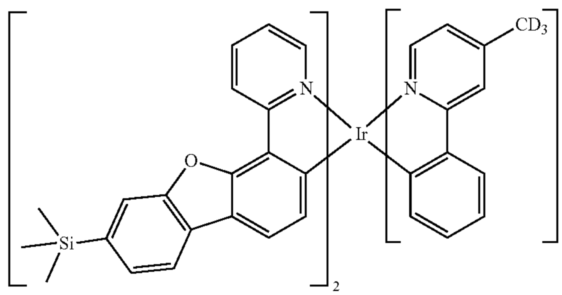
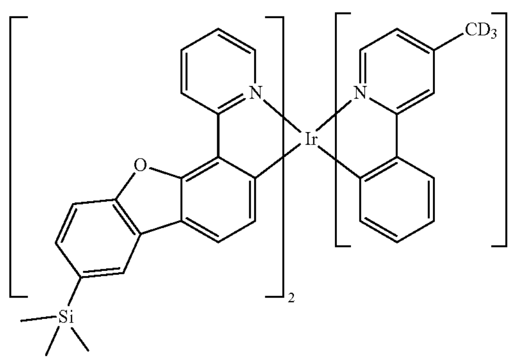
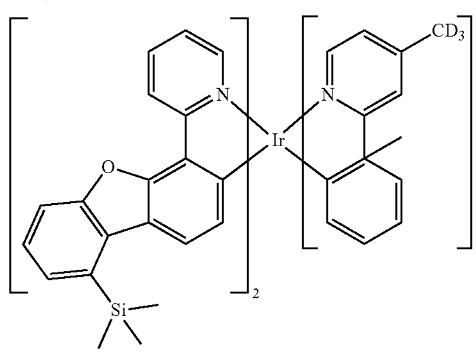

-continued
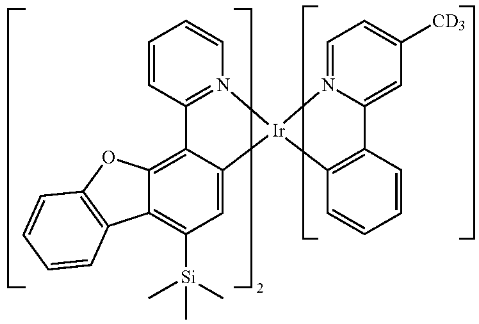
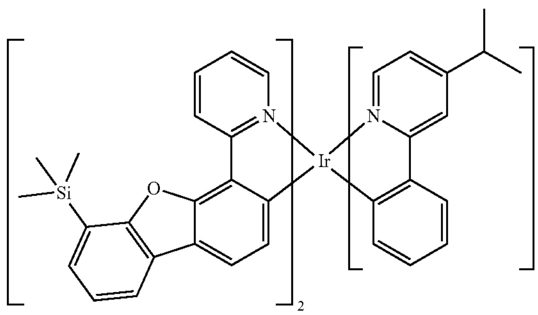
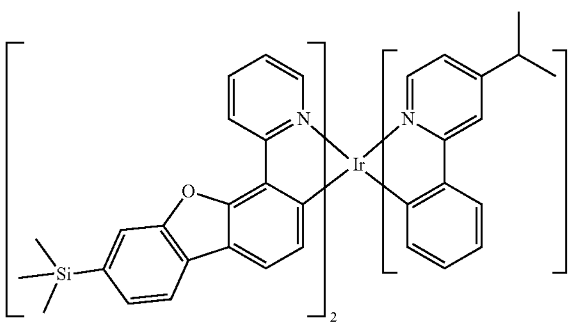
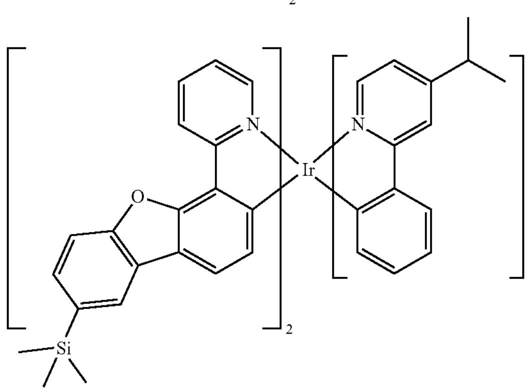
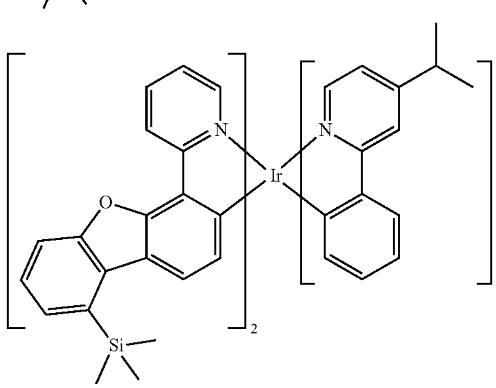
-continued
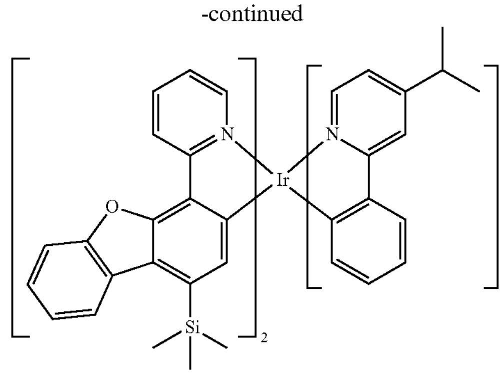
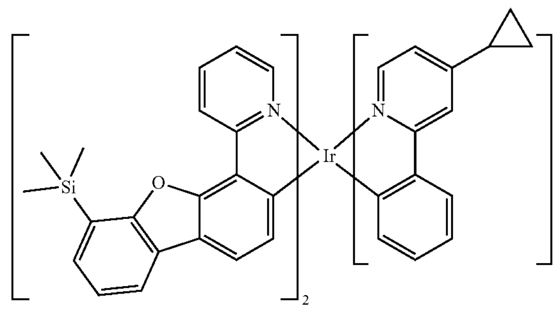
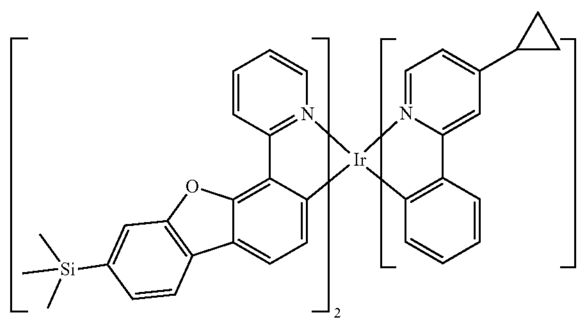
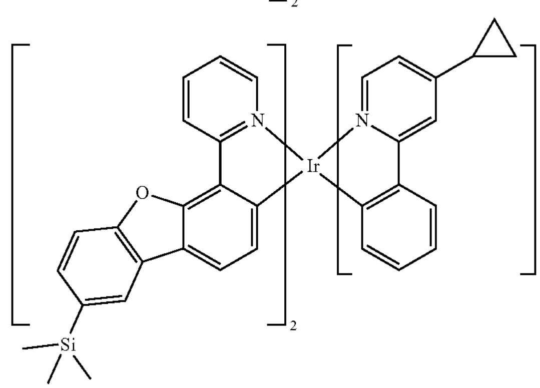
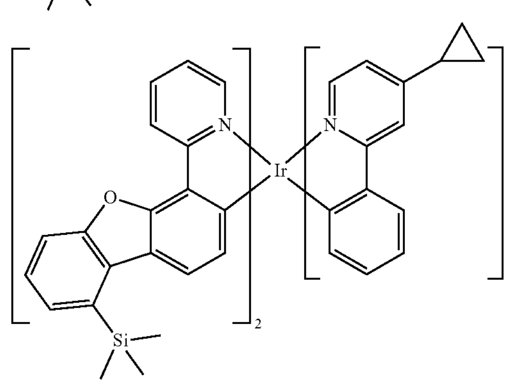

-continued
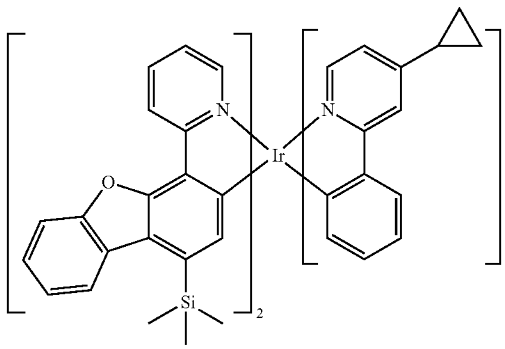
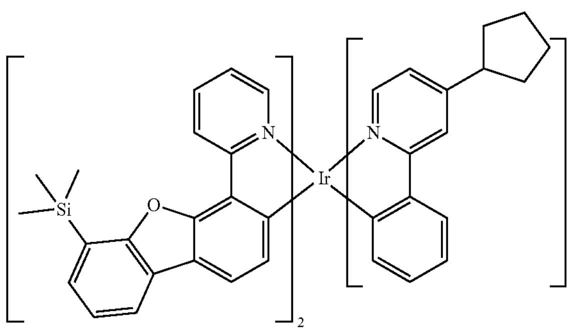
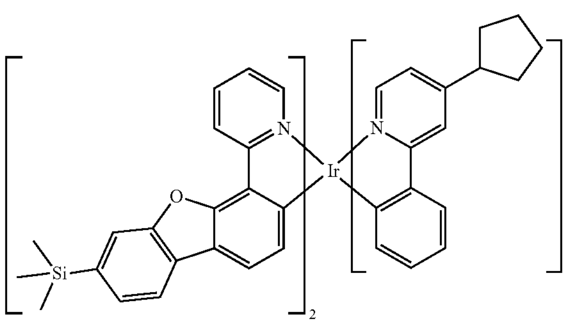
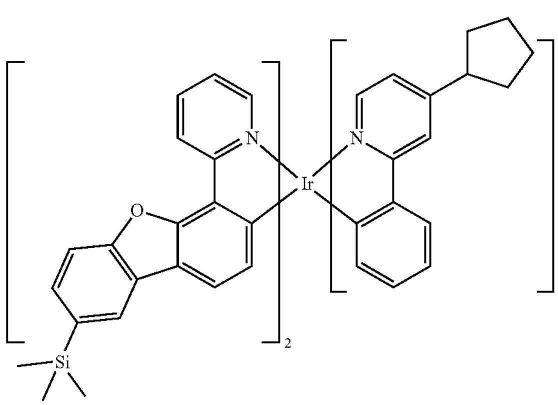
-continued
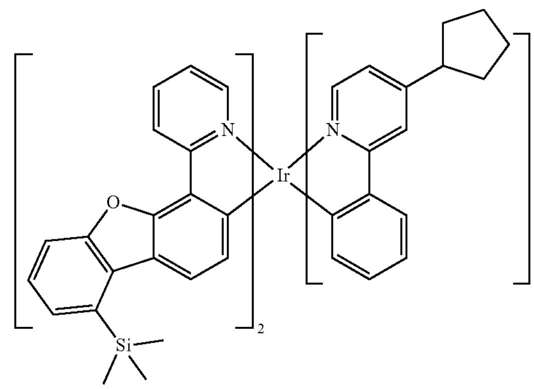
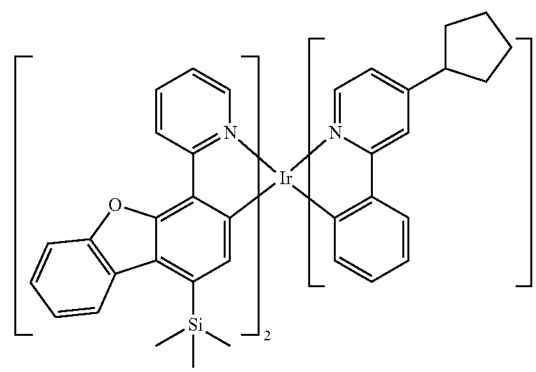
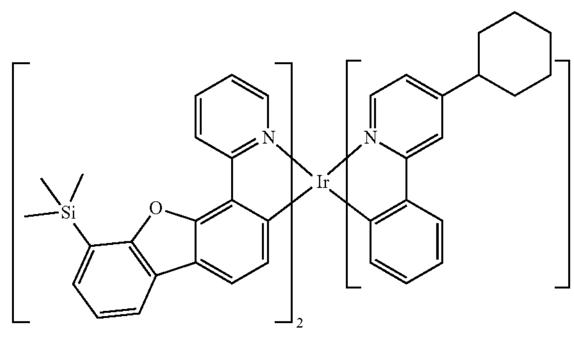
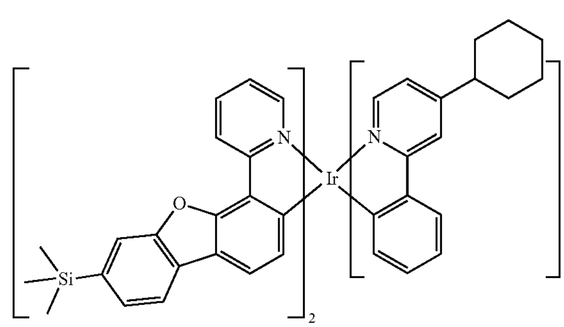

-continued
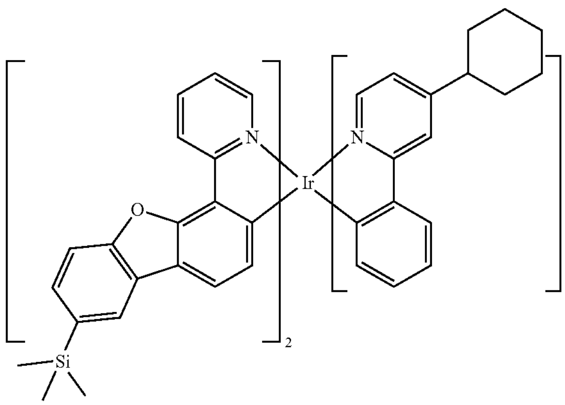
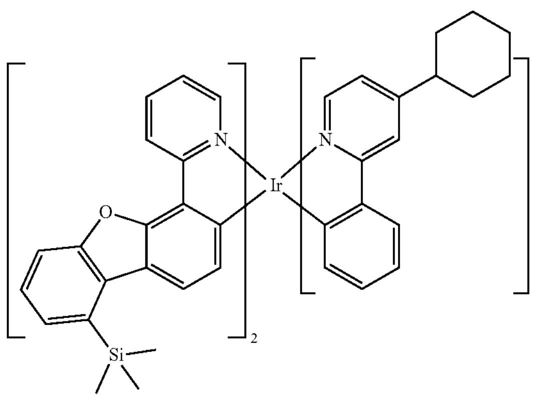
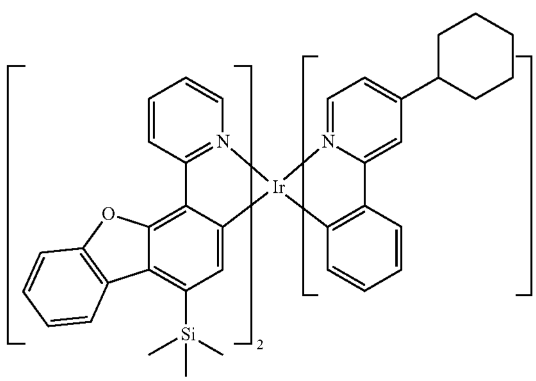
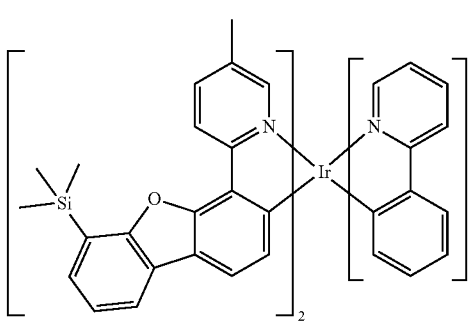
-continued
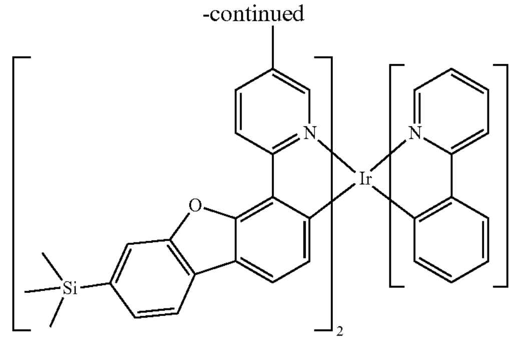
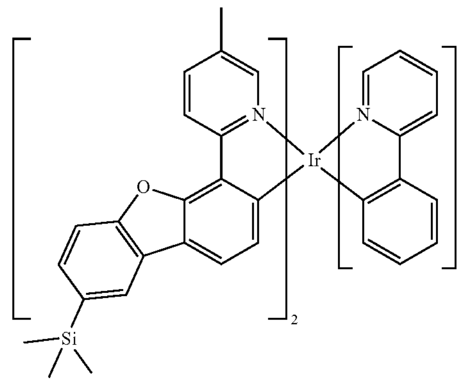
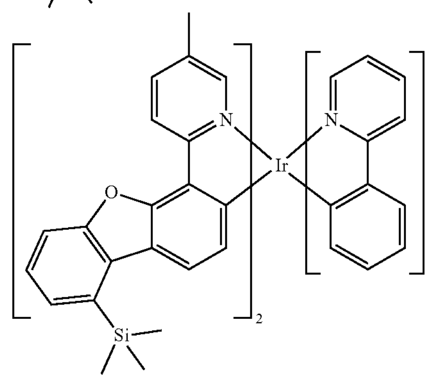
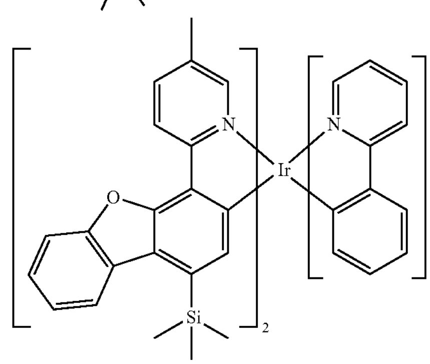
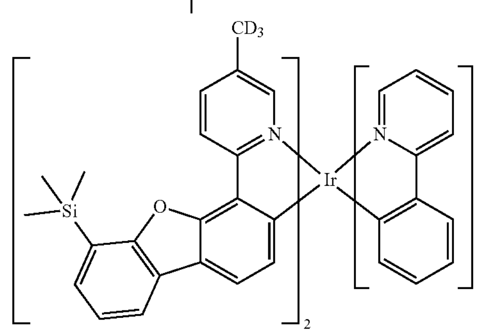

-continued
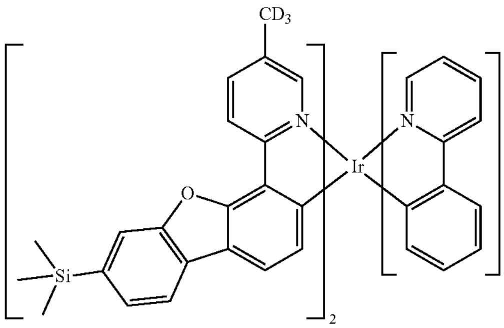
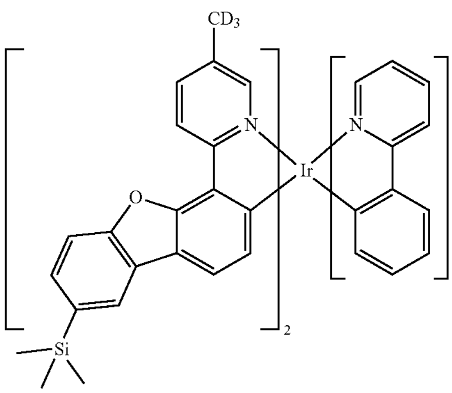
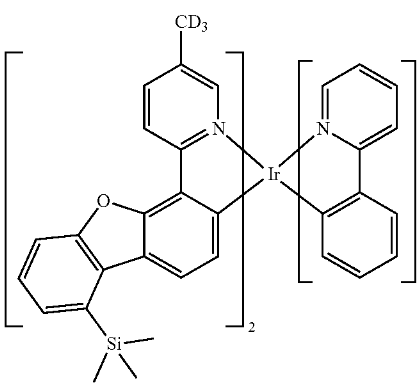
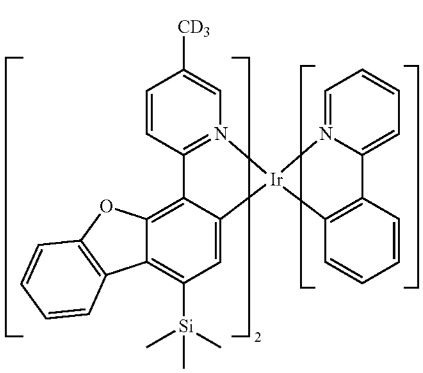
-continued
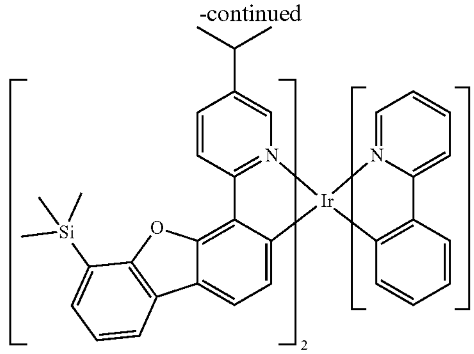
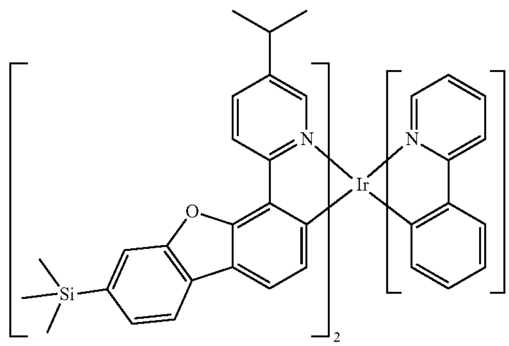
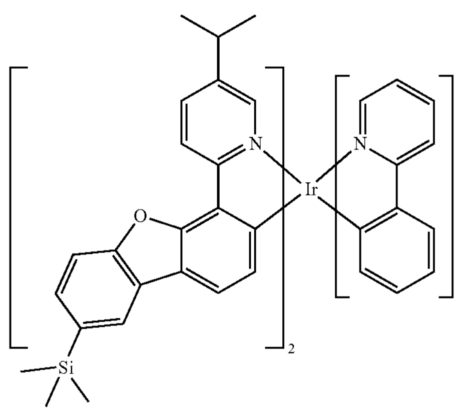
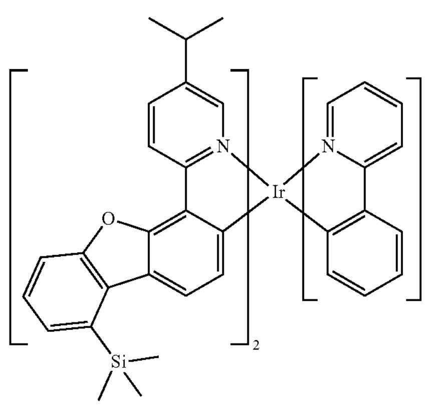

-continued
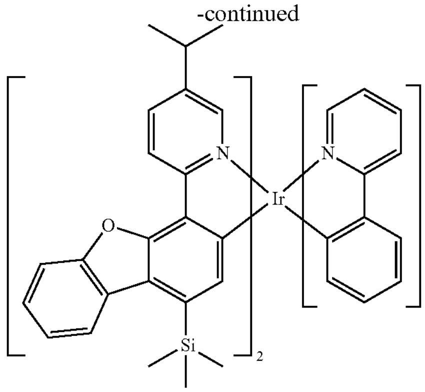
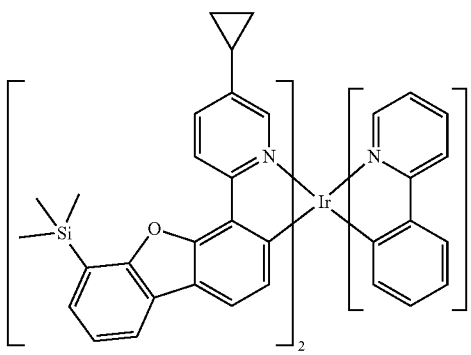
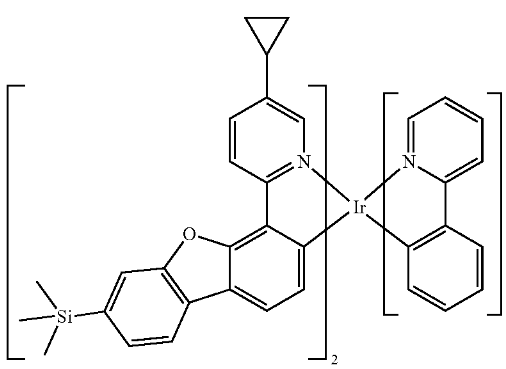
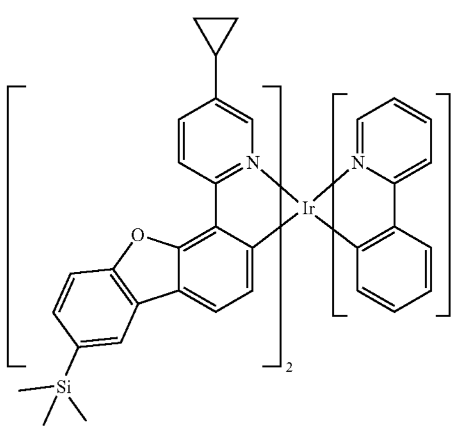
-continued
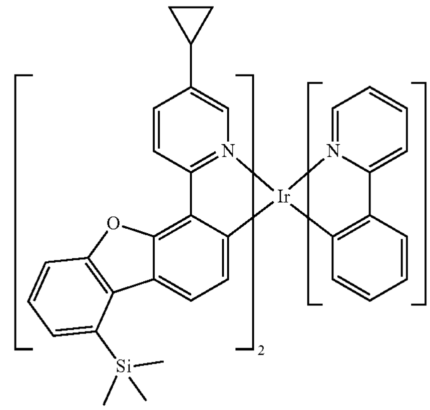
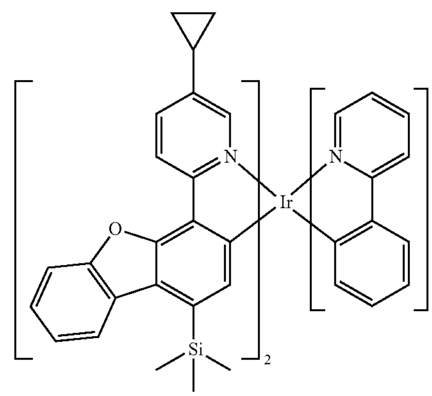
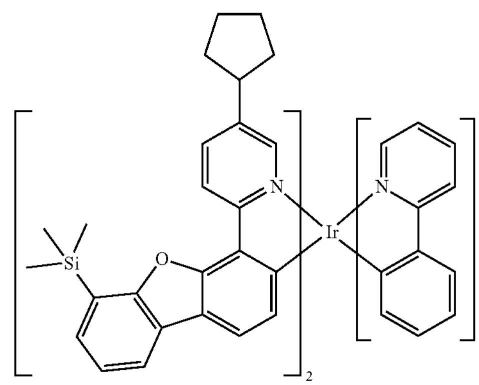
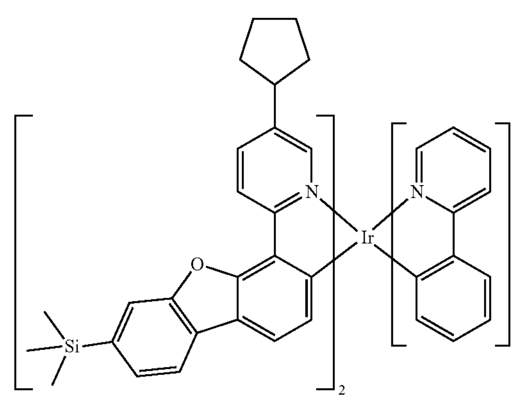

-continued
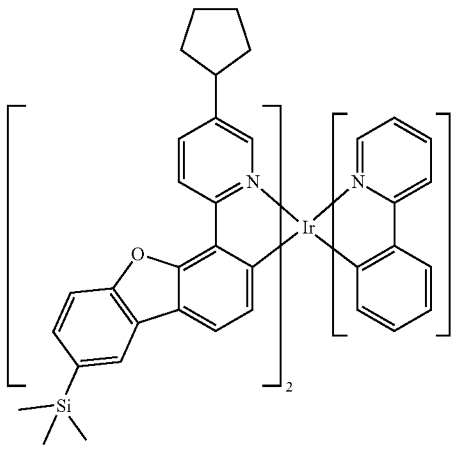
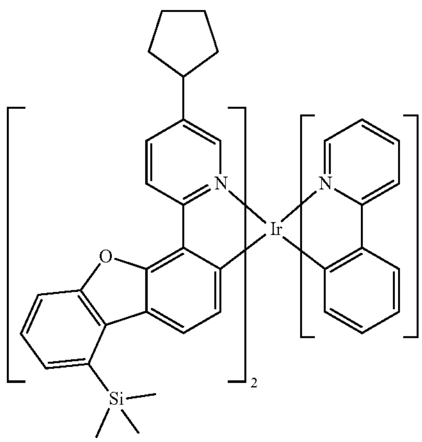
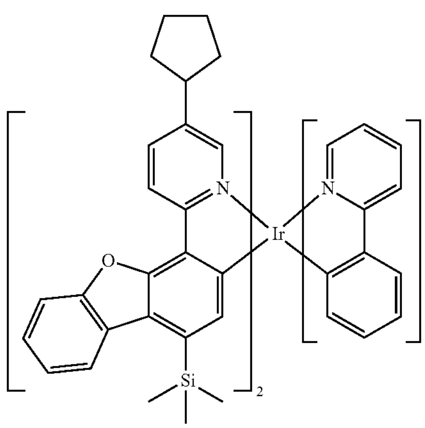
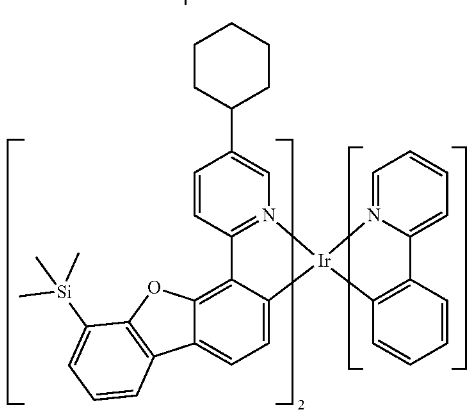
-continued
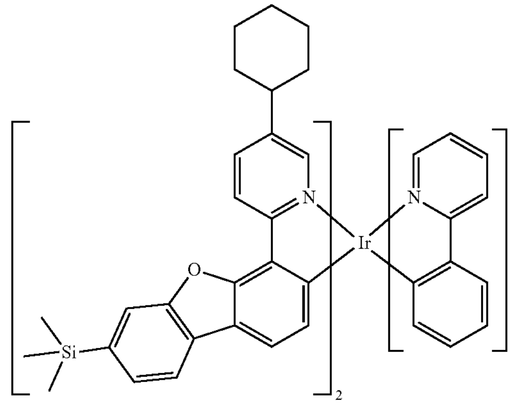
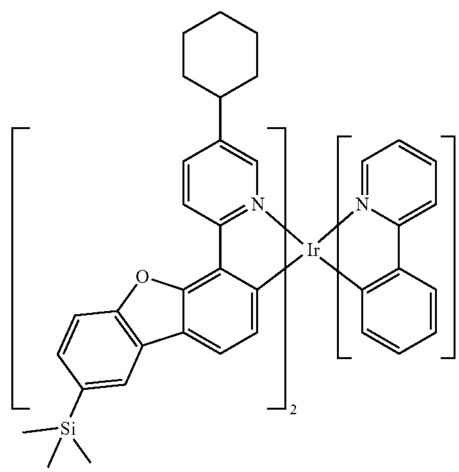
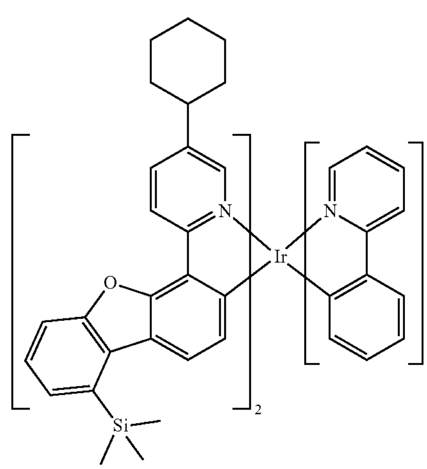

-continued
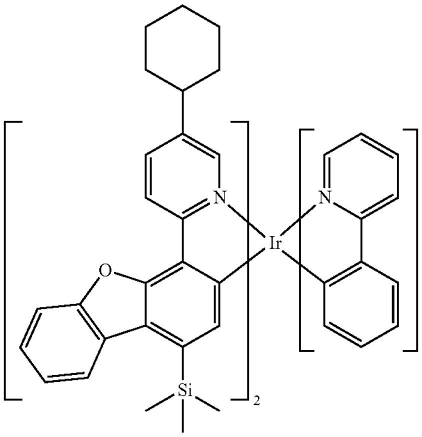
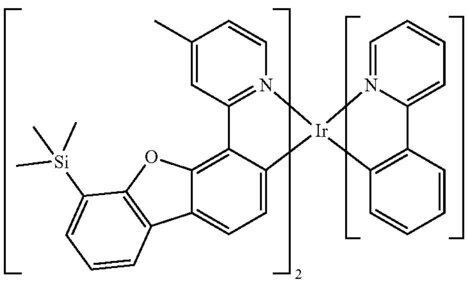
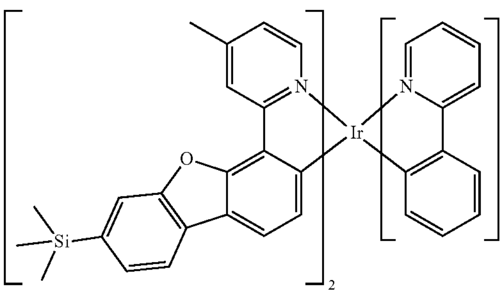
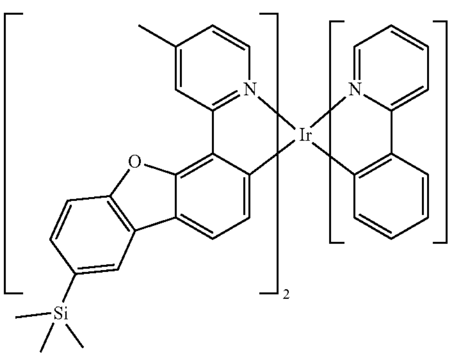
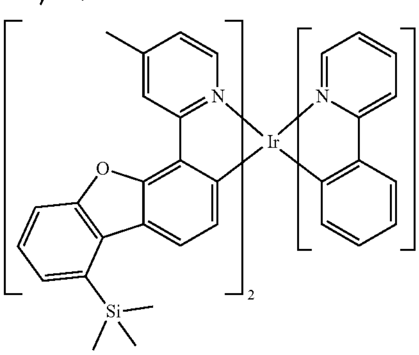
-continued
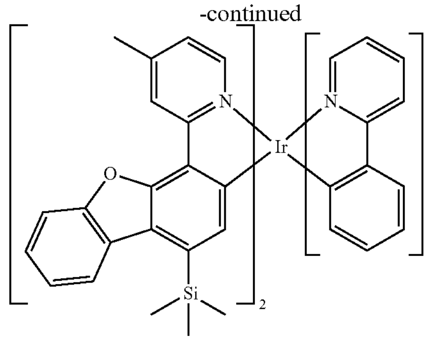
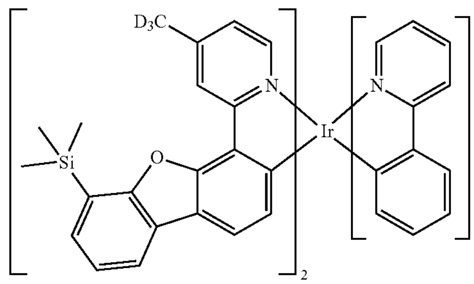
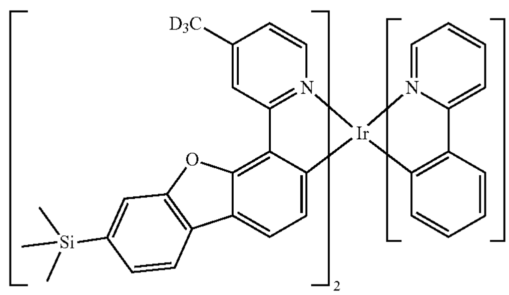
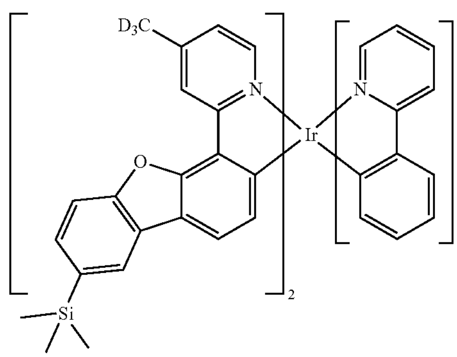
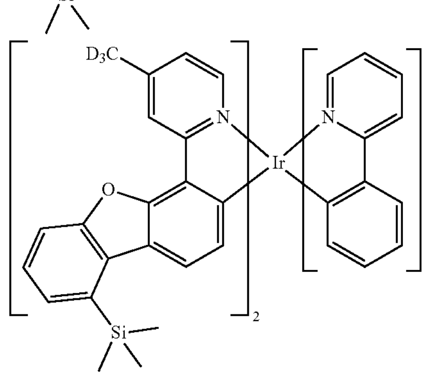

-continued
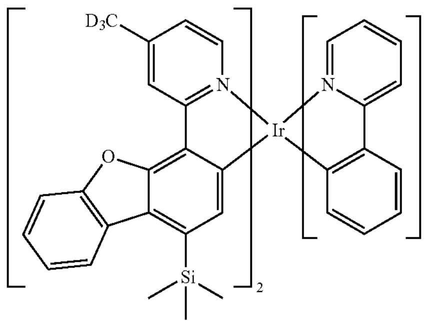
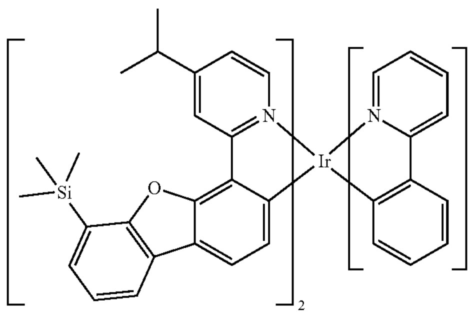
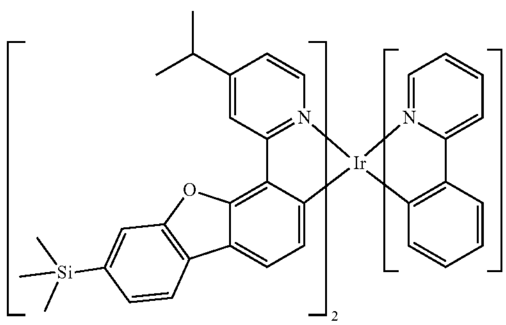
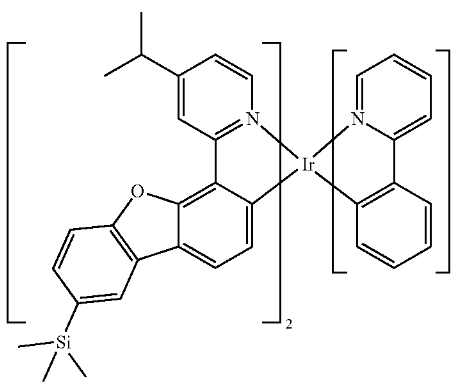
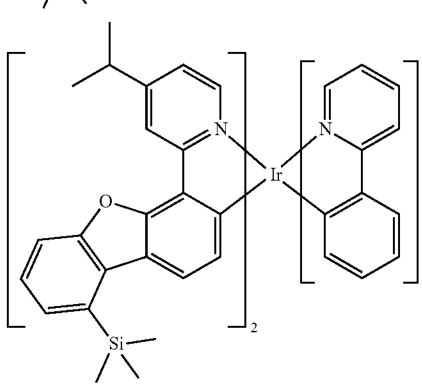
-continued
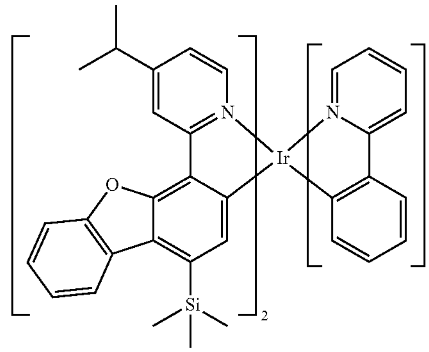
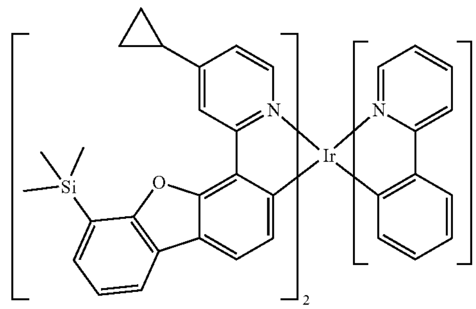
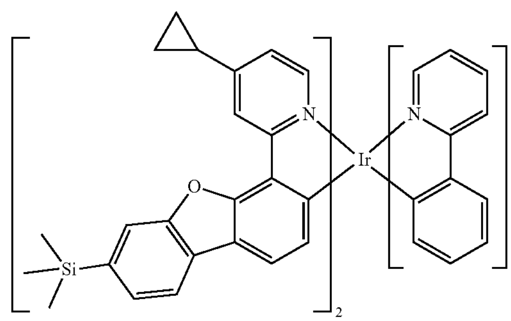
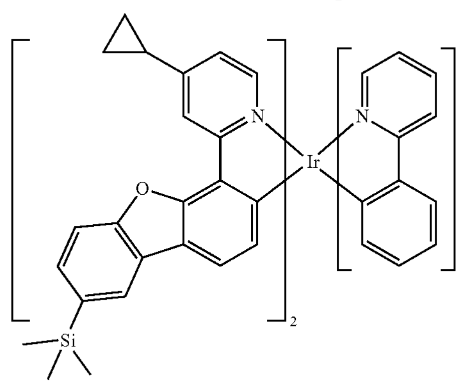
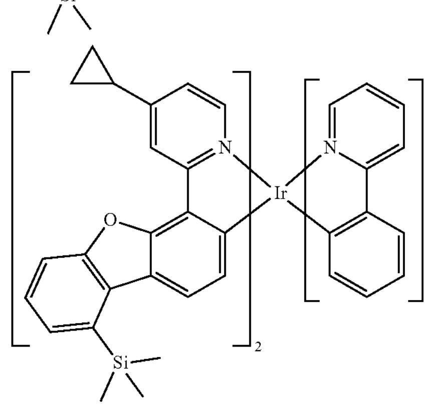

-continued
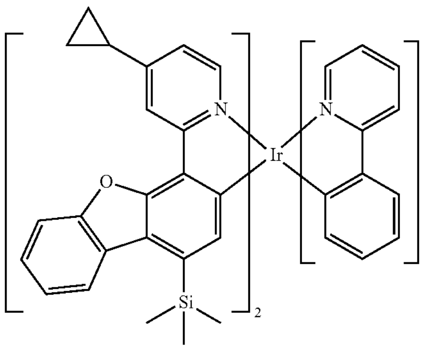
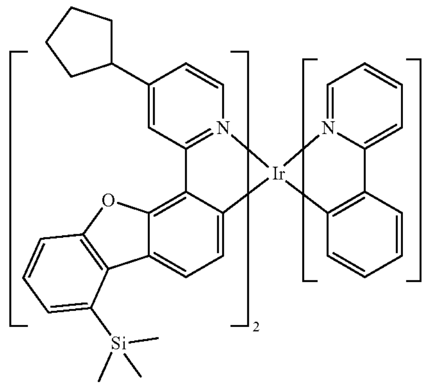
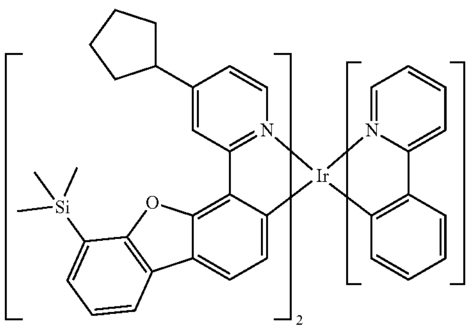
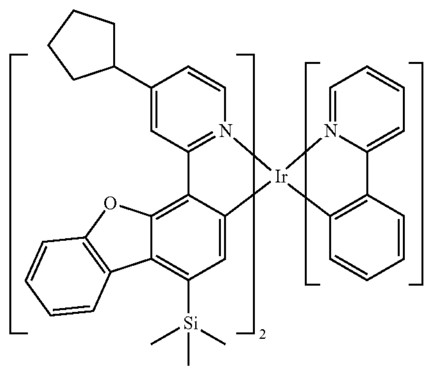
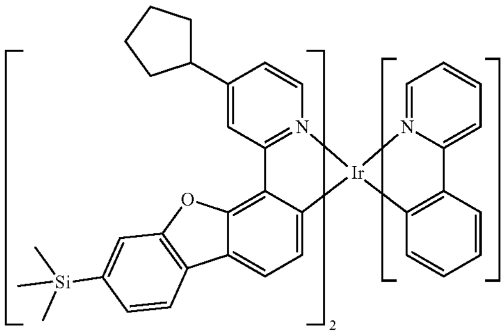
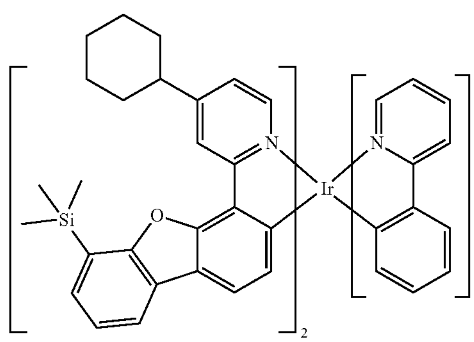
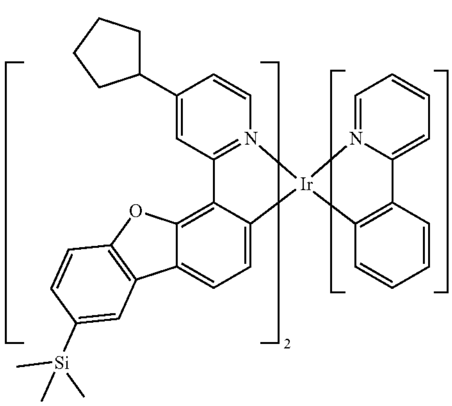
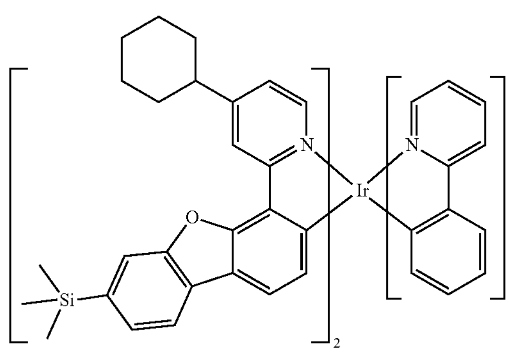

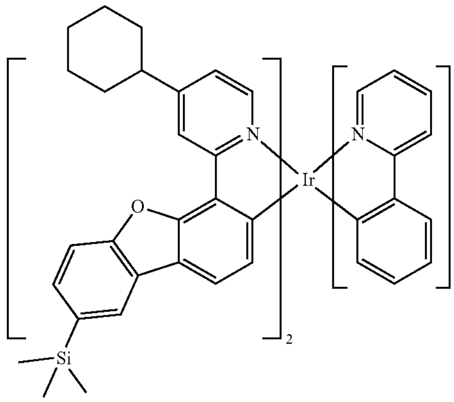
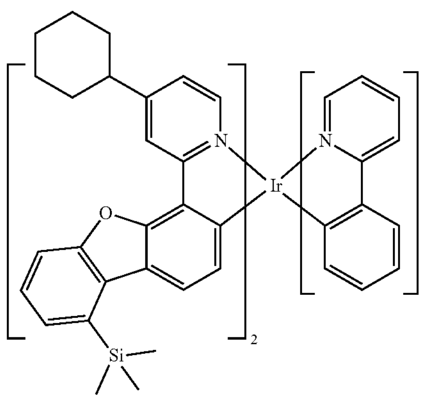
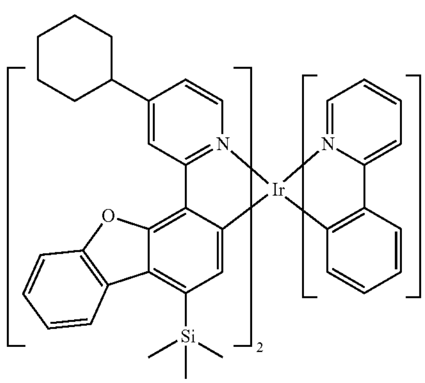
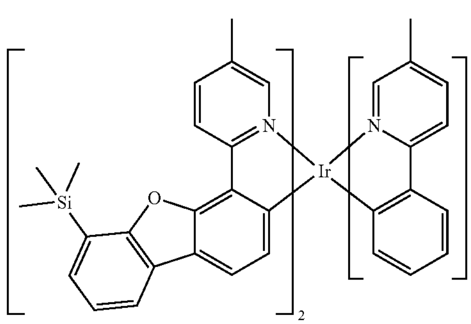
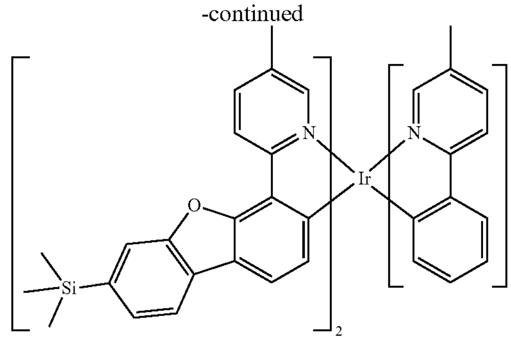
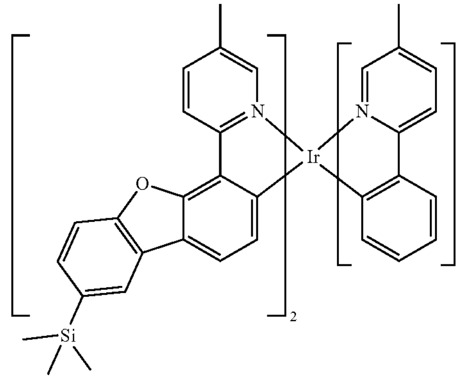
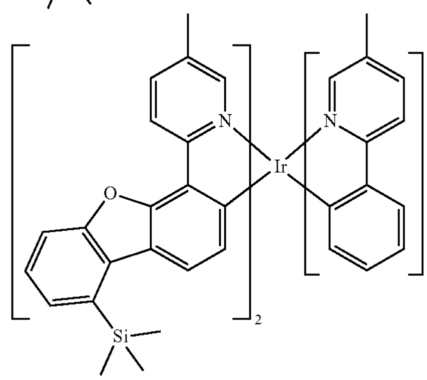
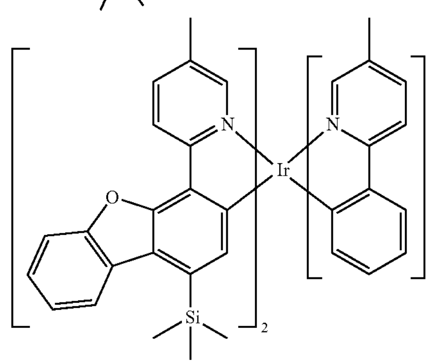
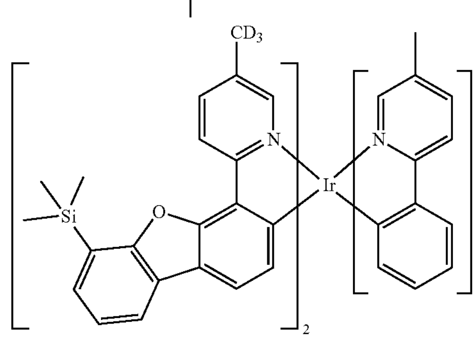
CD3

-continued
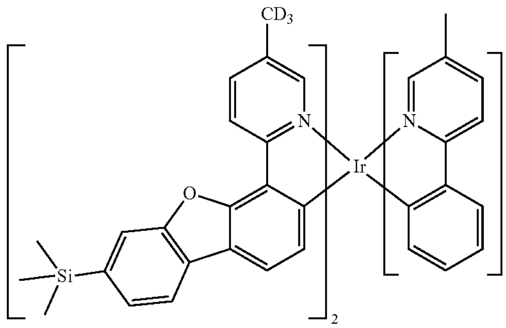
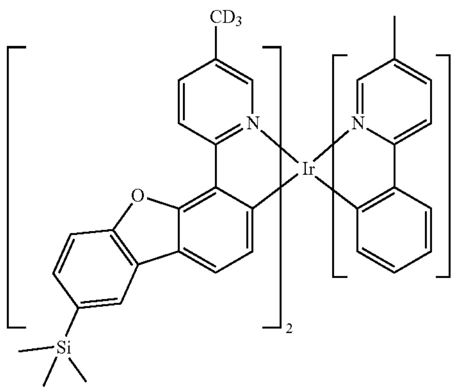
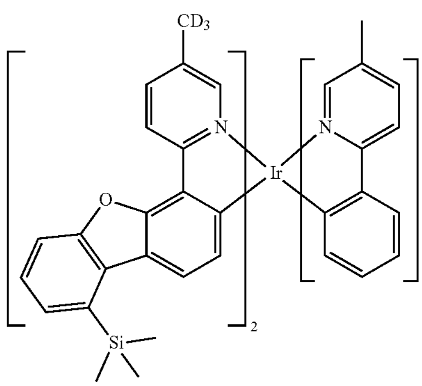
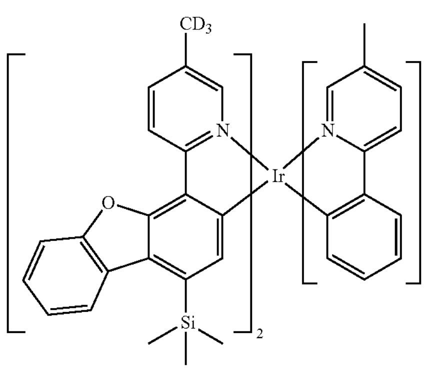
-continued
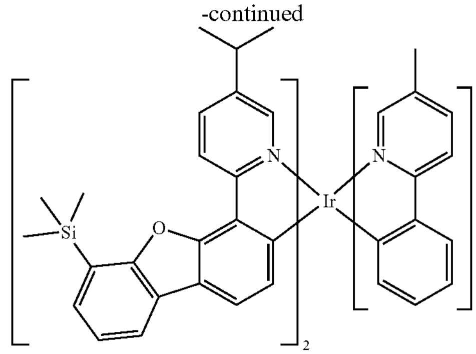
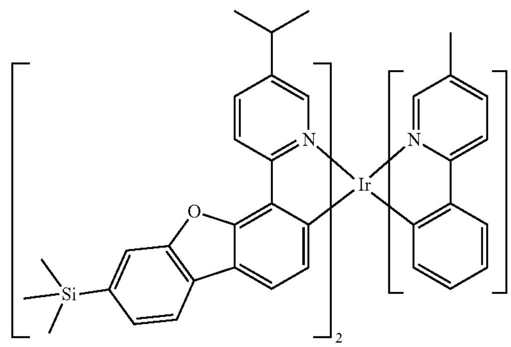
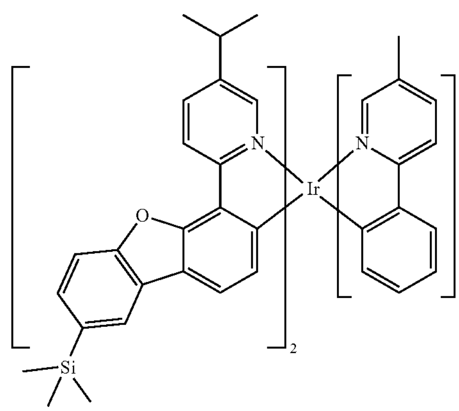
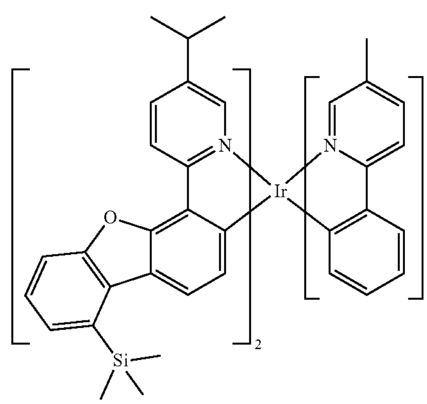

-continued
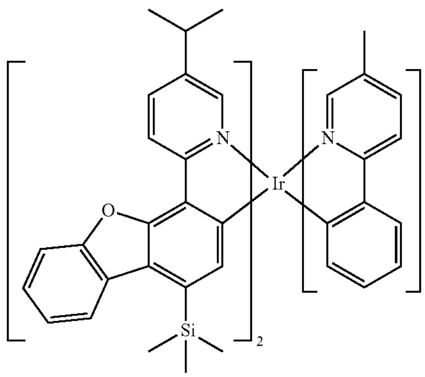
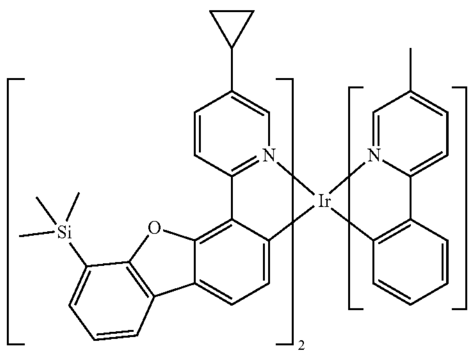
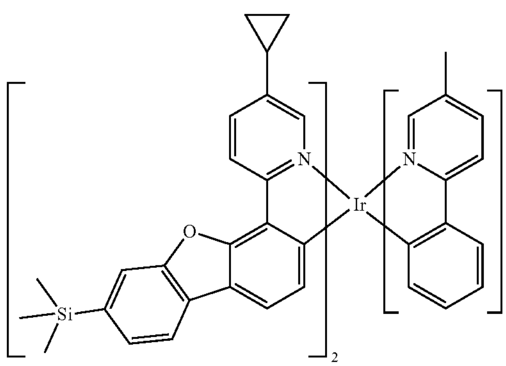
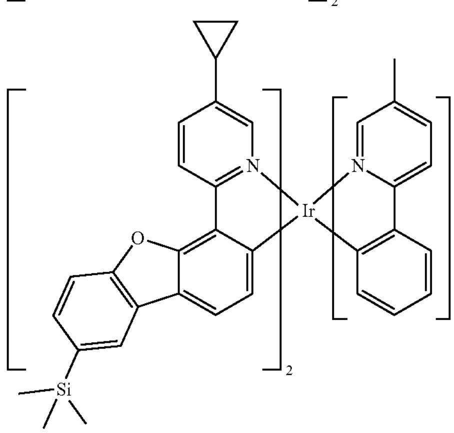
-continued
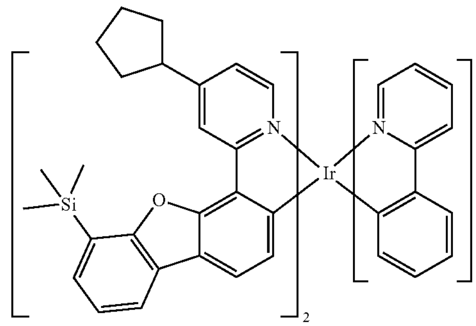
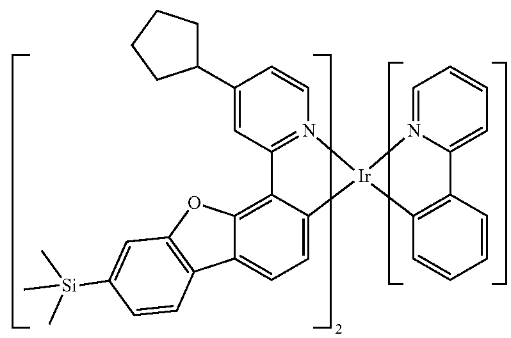
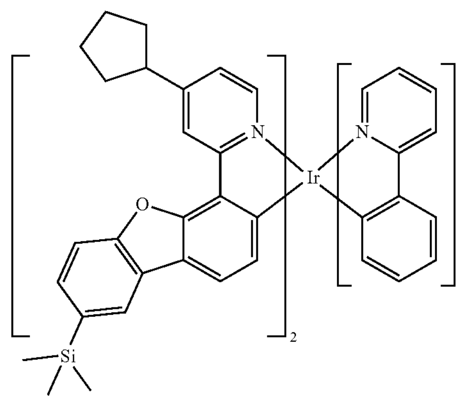
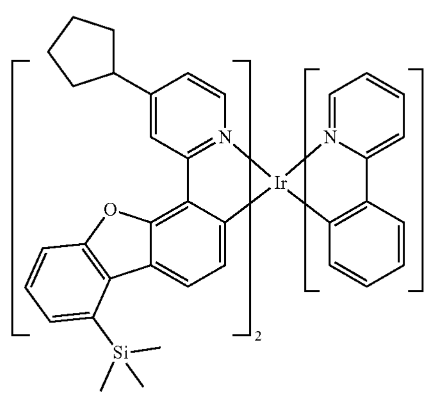

-continued
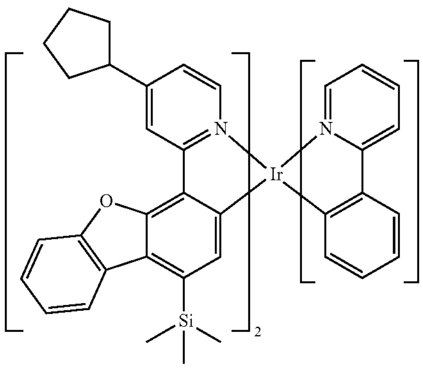
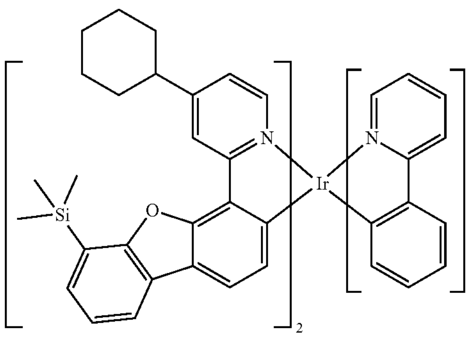
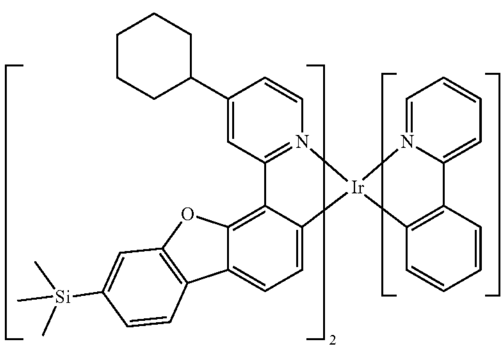
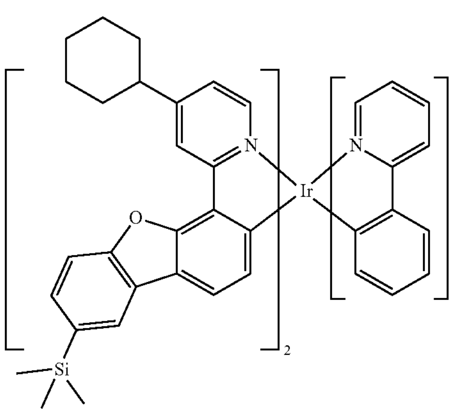
-continued
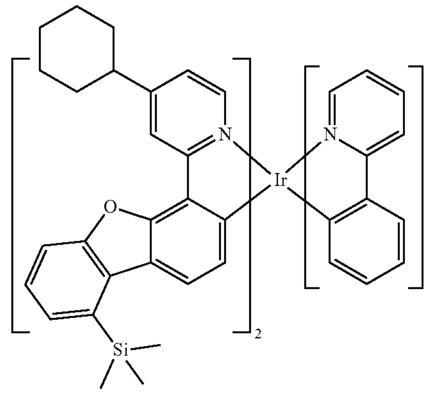
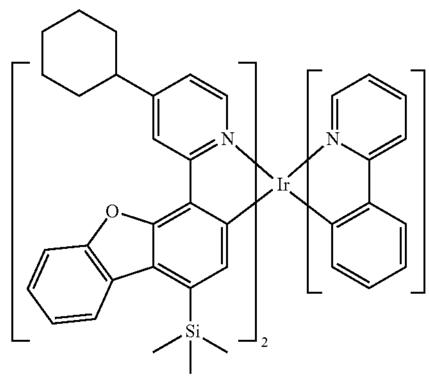
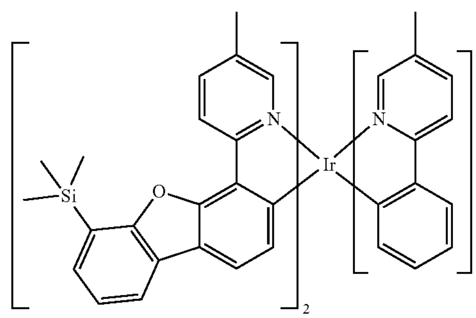
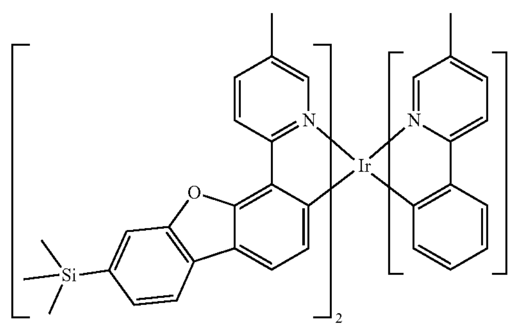

-continued
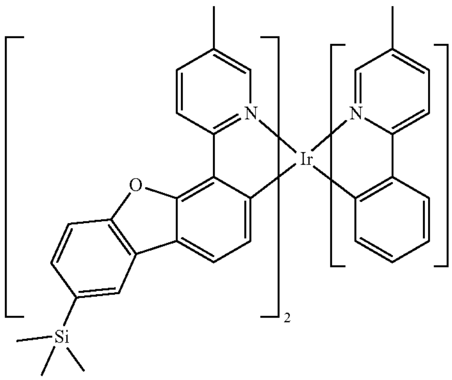
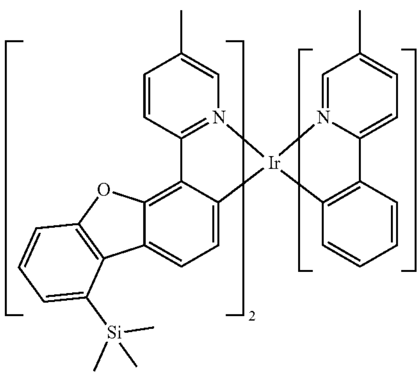
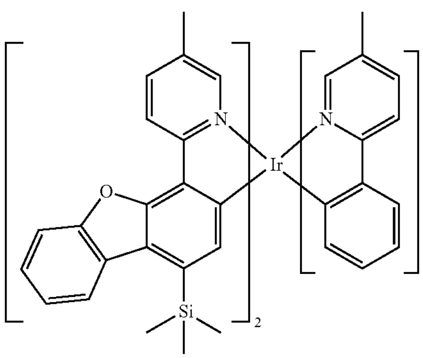
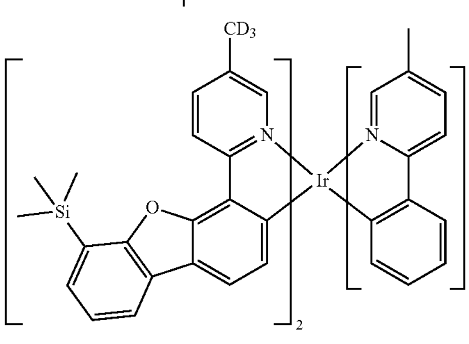
-continued
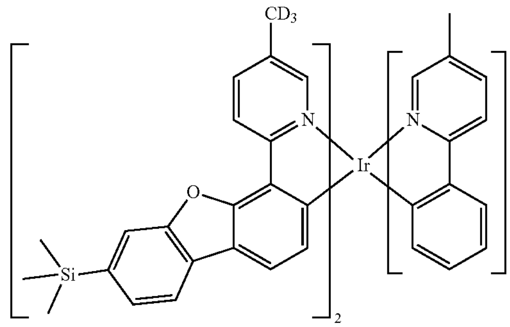
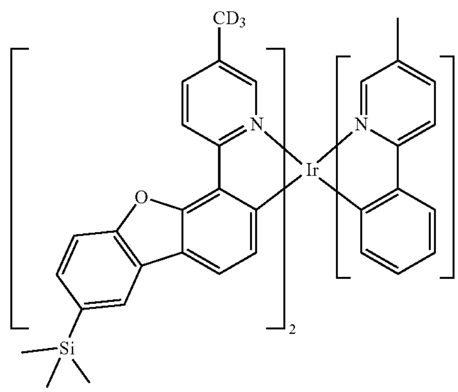
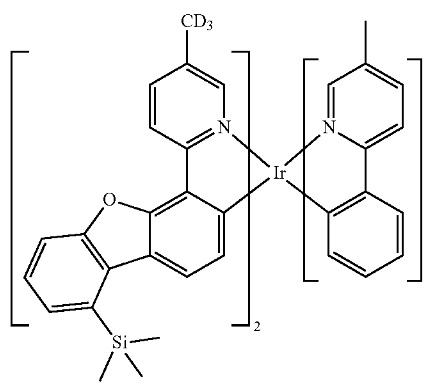
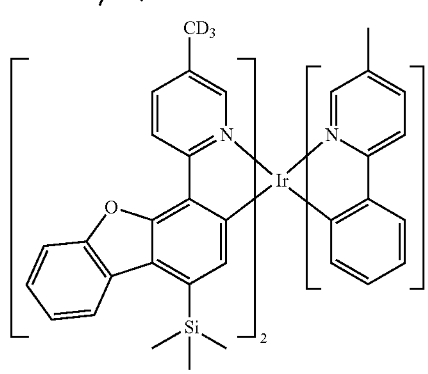

-continued
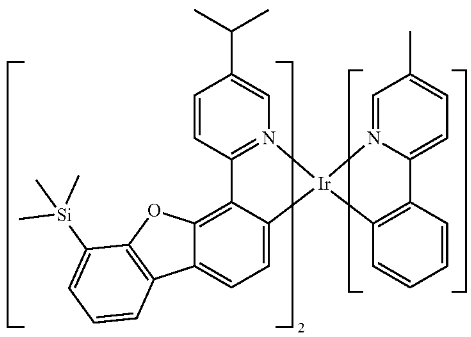
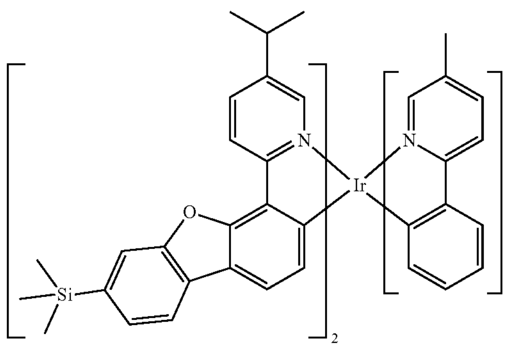
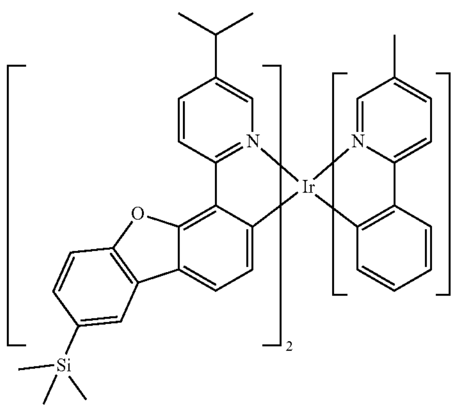
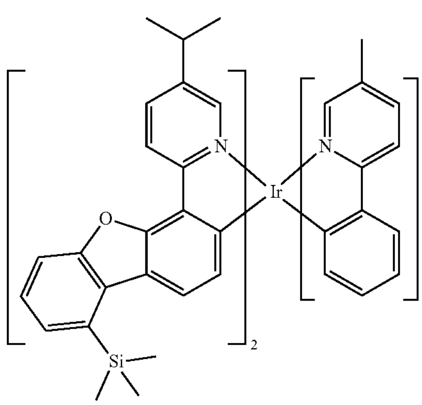
-continued
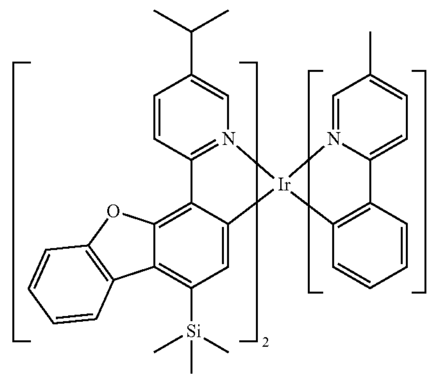
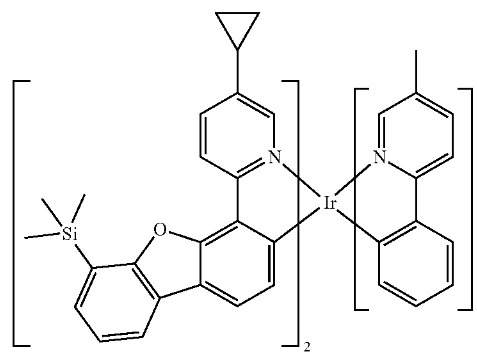
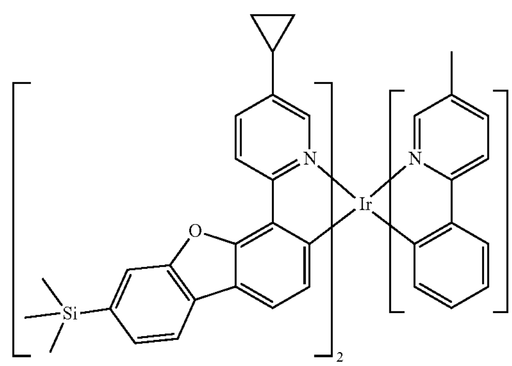
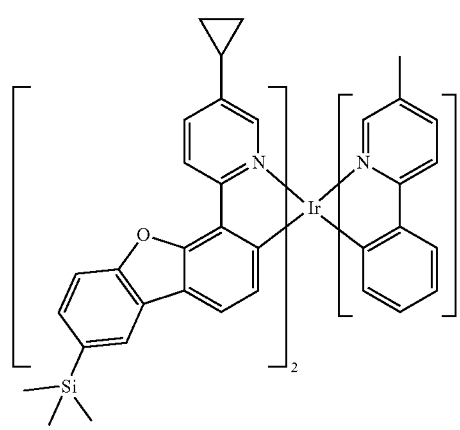

-continued
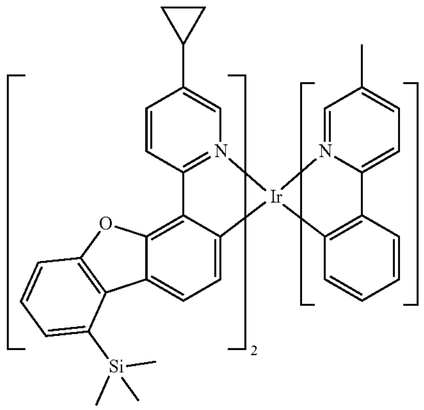
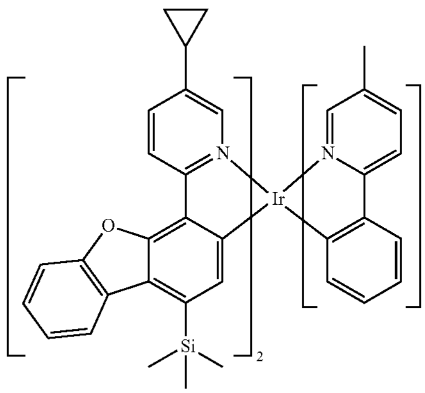
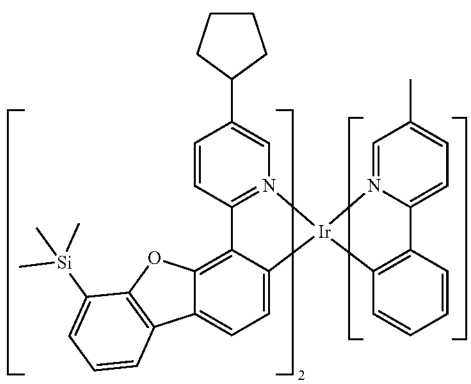
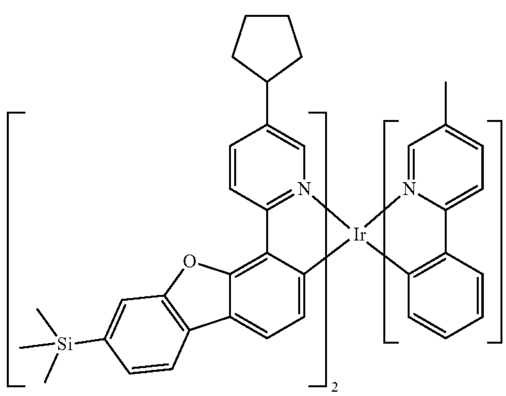
-continued
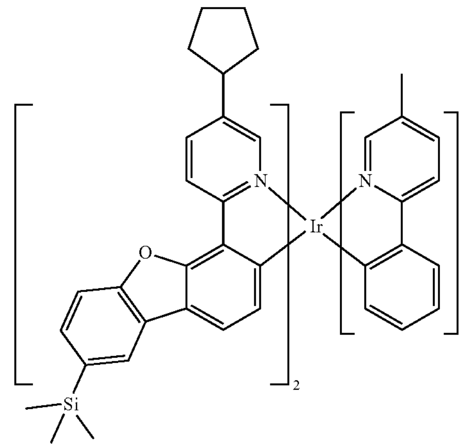
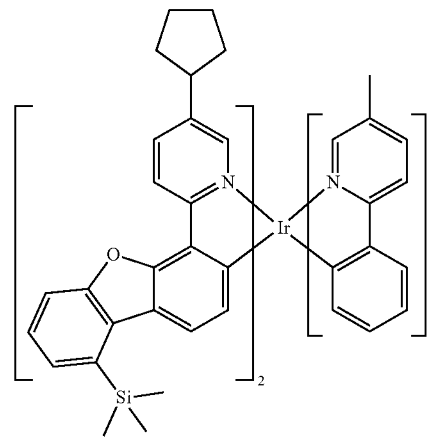
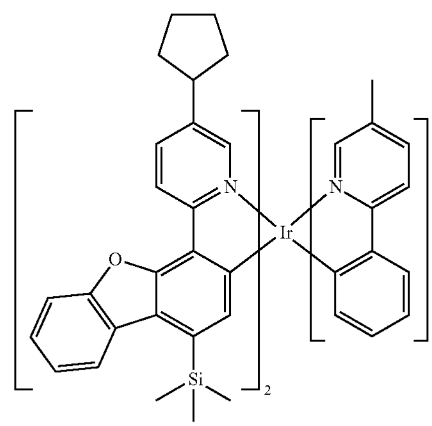
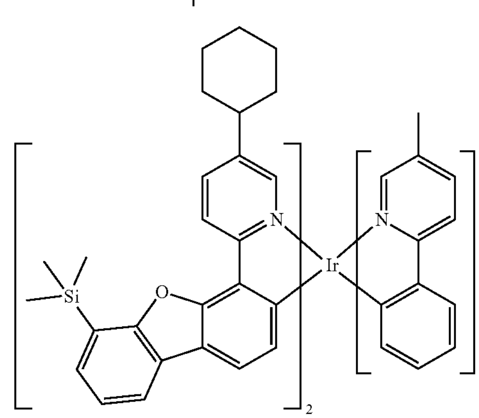

-continued
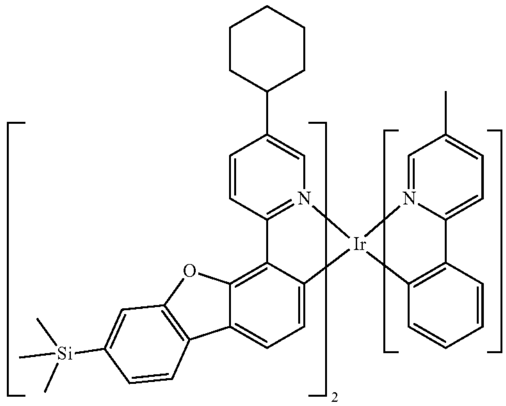
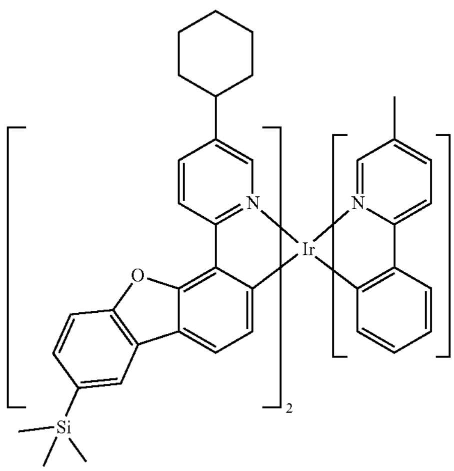
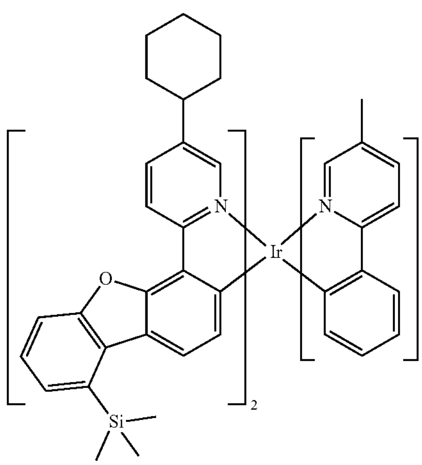
-continued
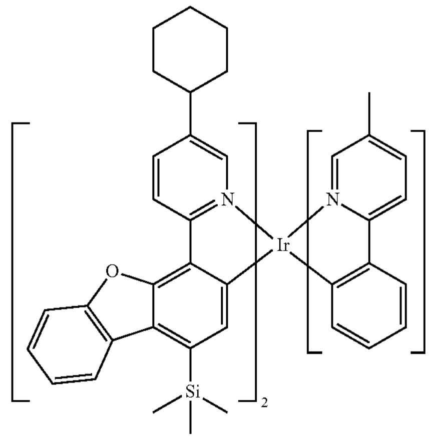
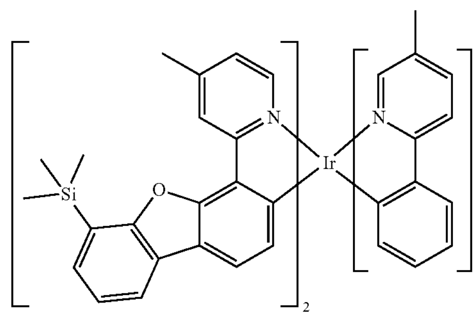
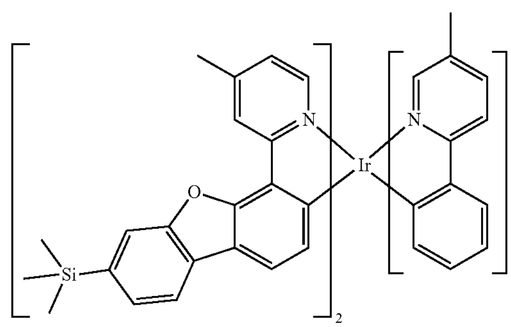
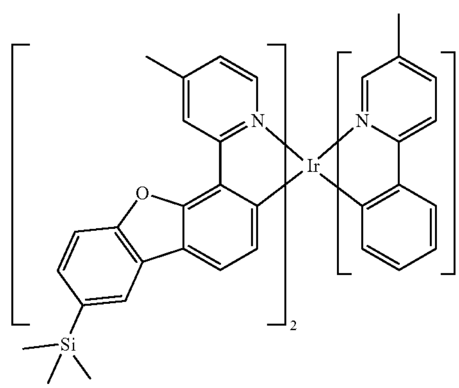

-continued
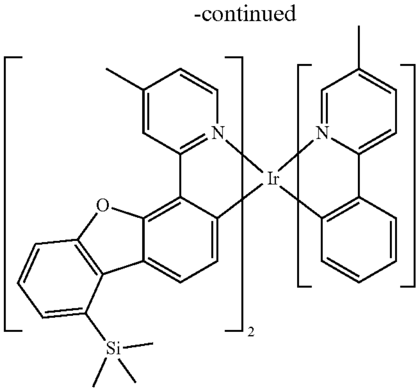
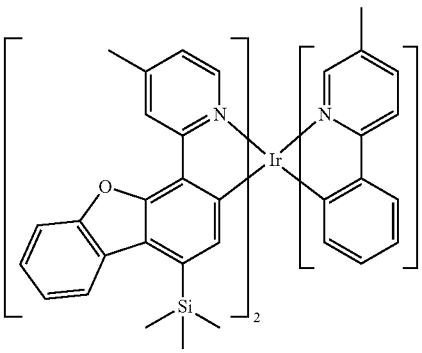
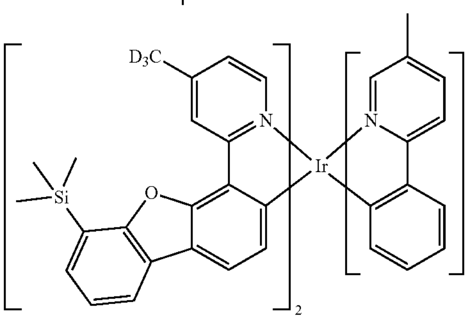
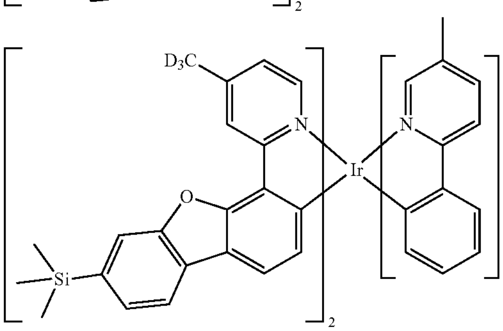
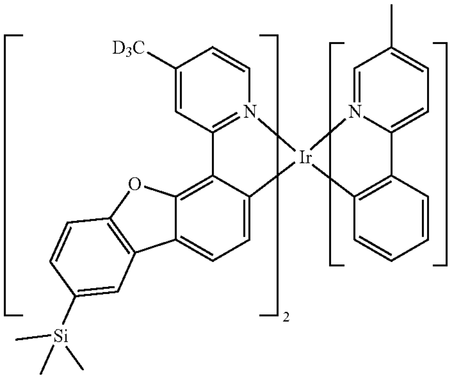
-continued
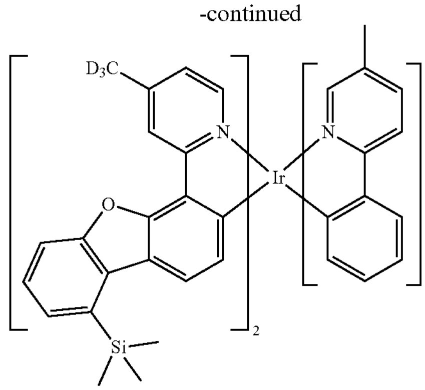
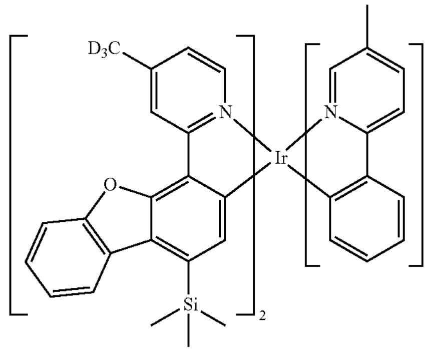
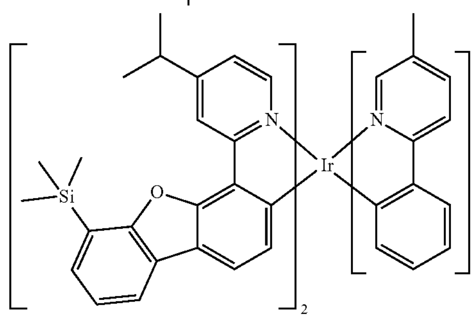
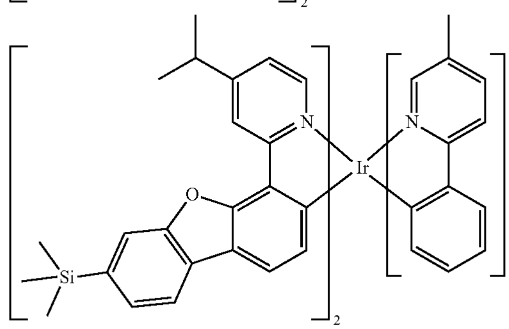
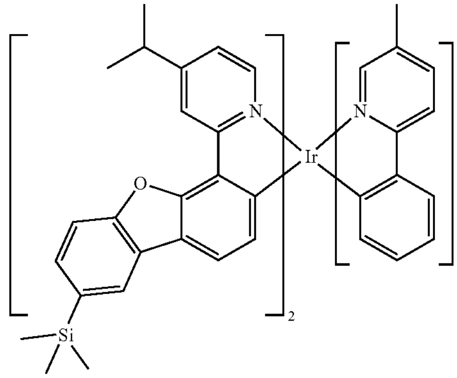

-continued
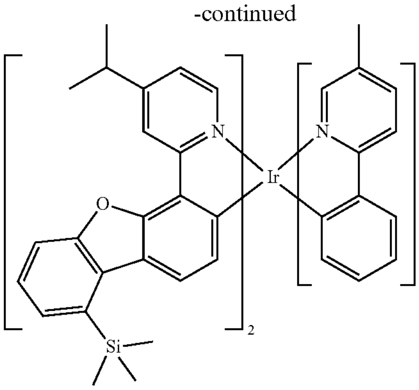
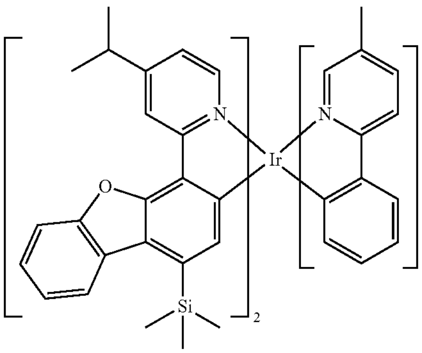
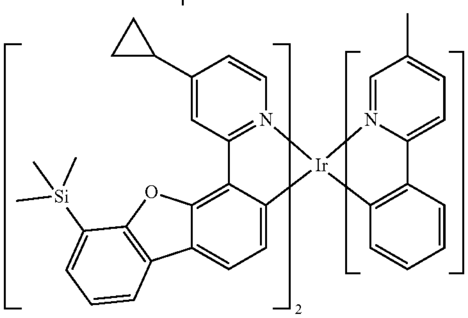
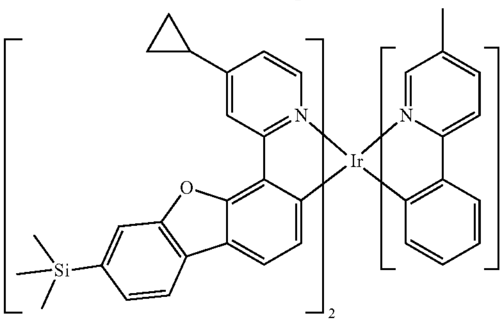
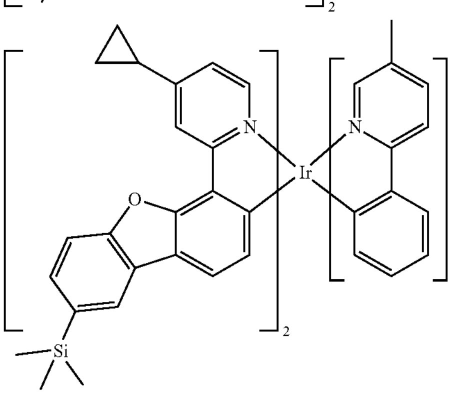
-continued
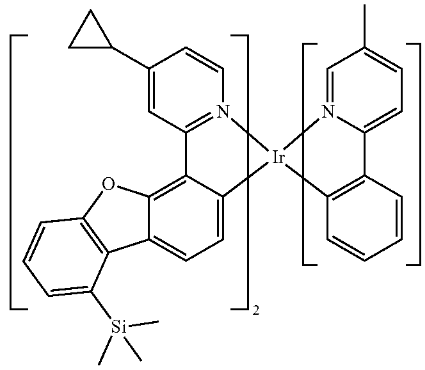
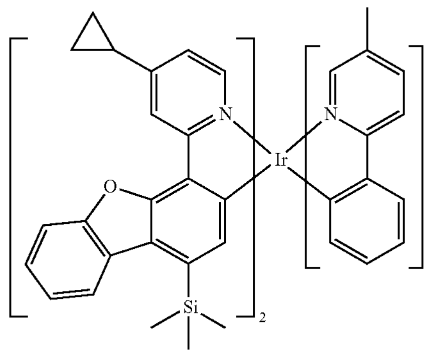
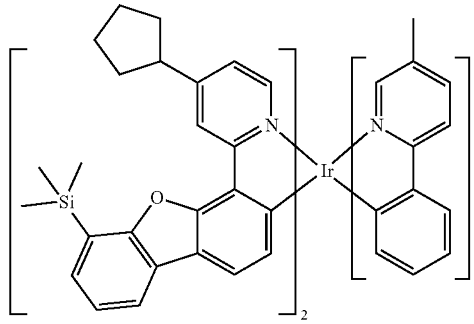
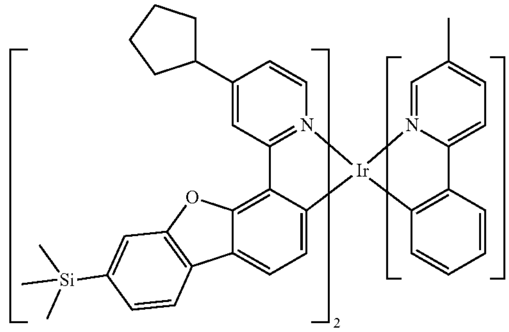

-continued
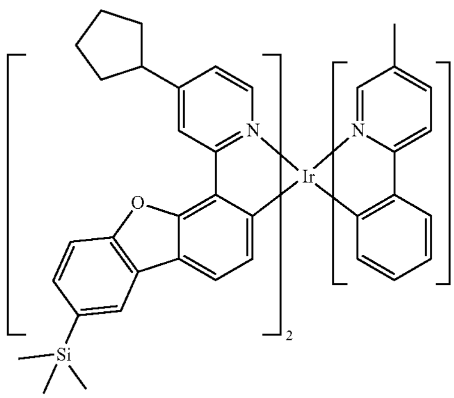
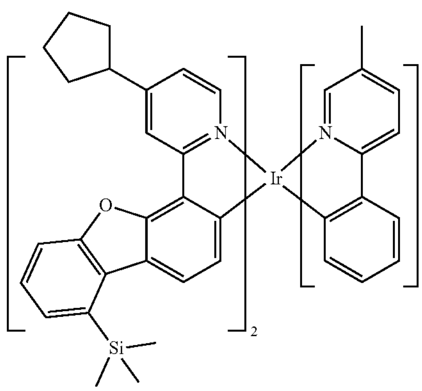
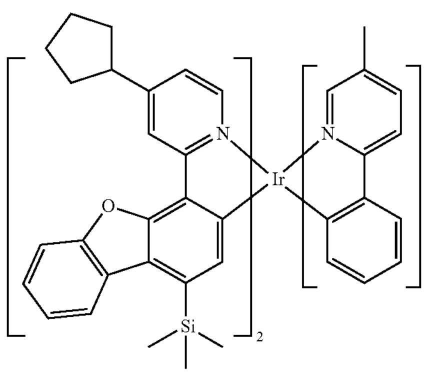
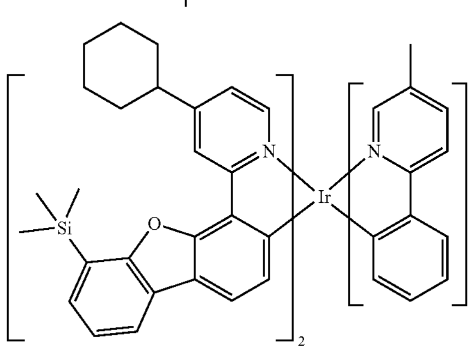
-continued
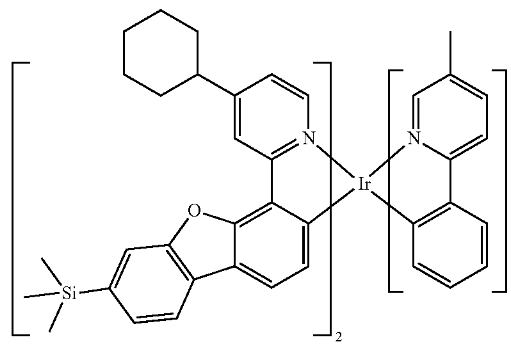
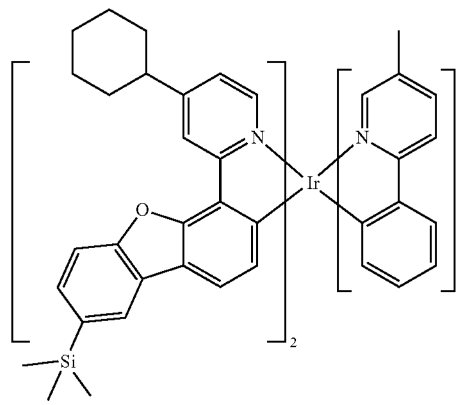
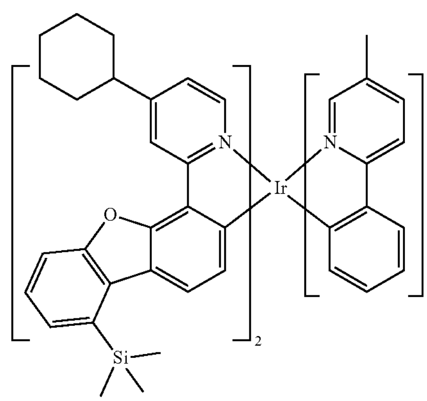
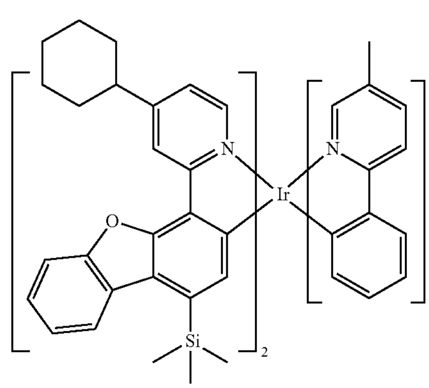

-continued
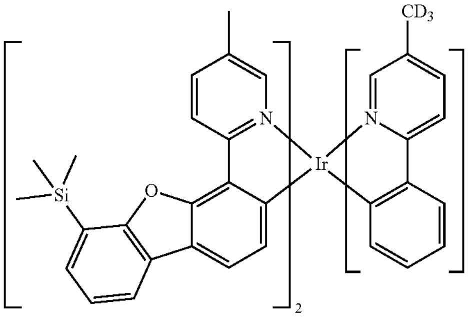
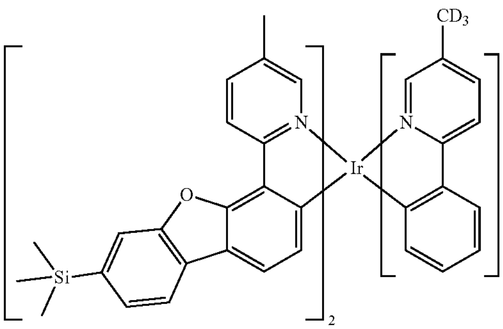
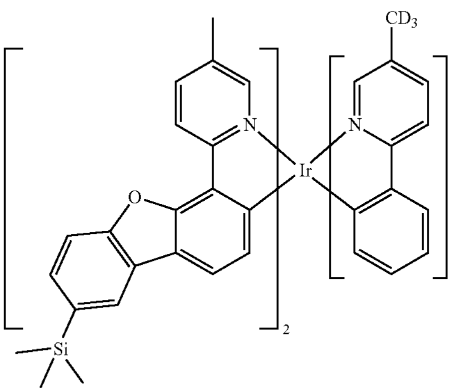
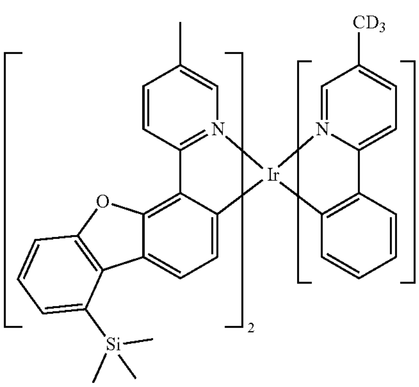
-continued
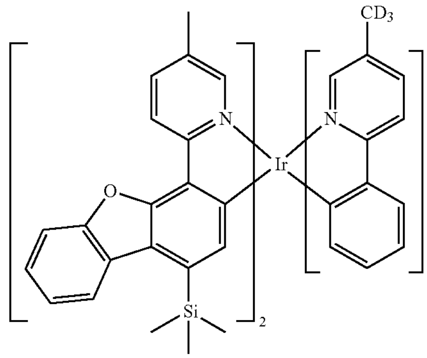
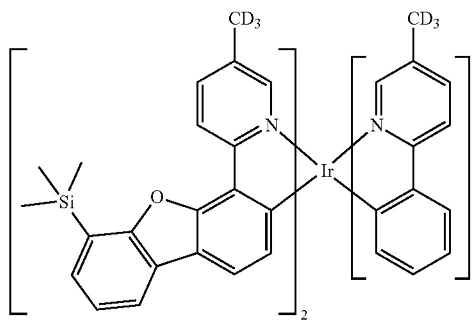
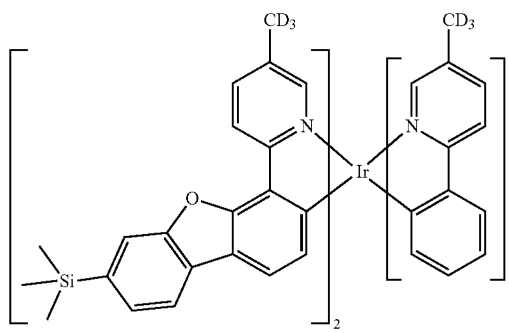
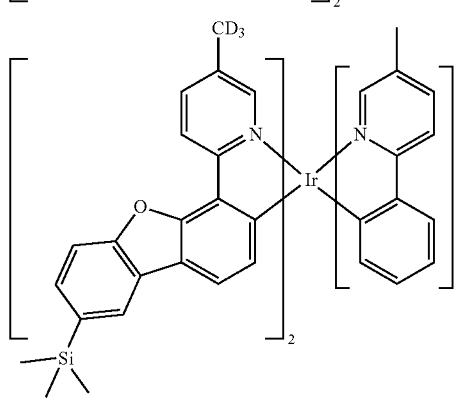

-continued
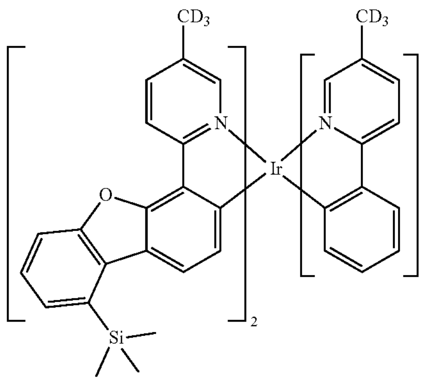
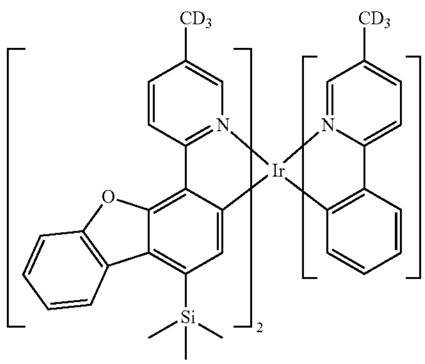
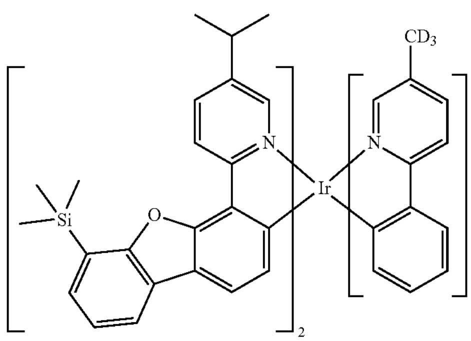
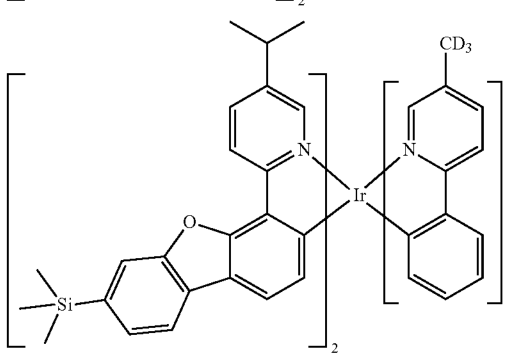
-continued
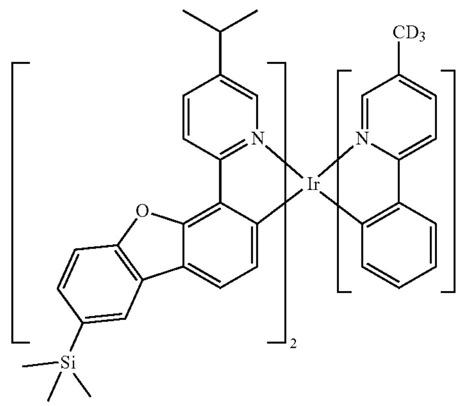
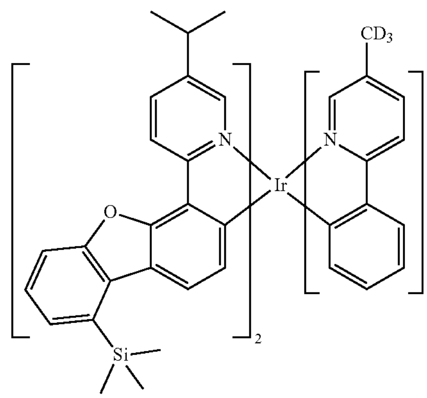
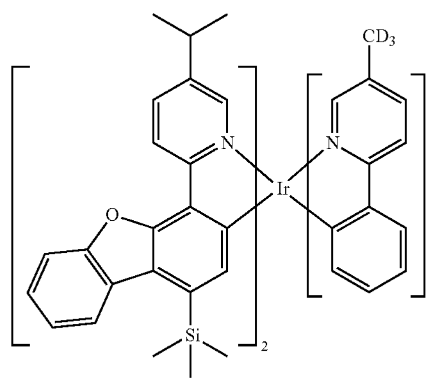
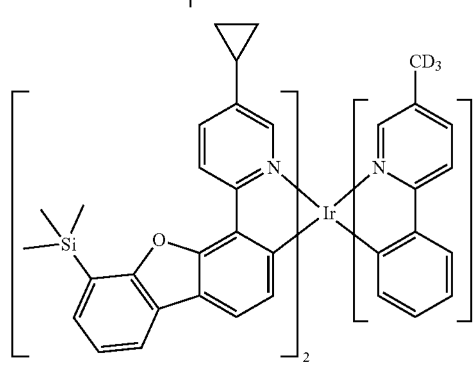

-continued
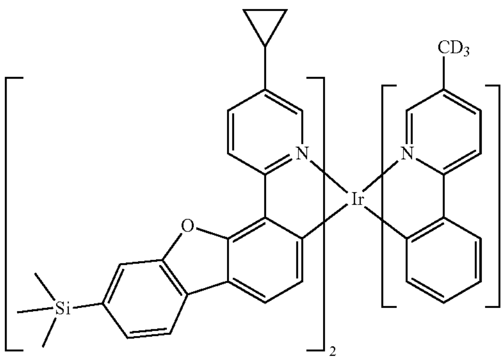
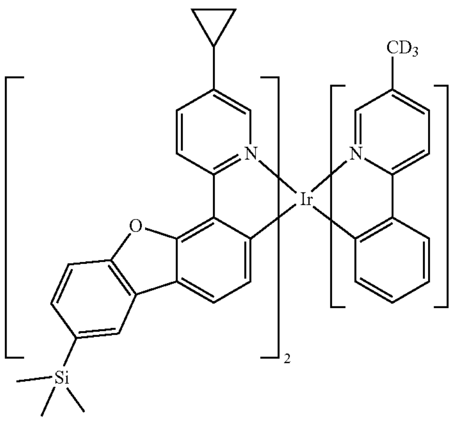
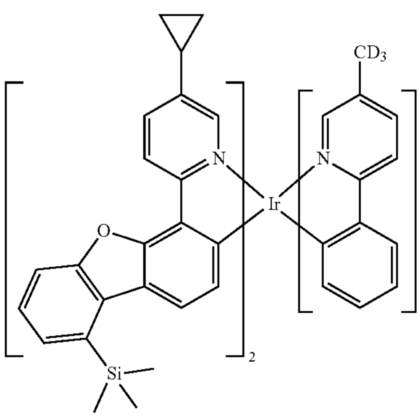
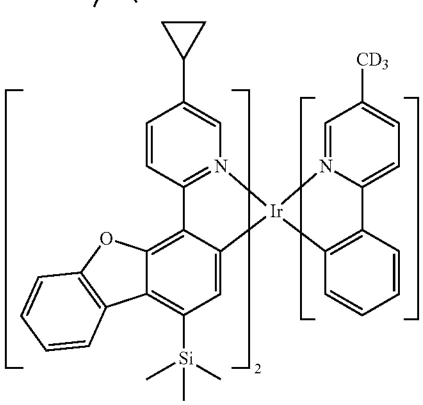
-continued
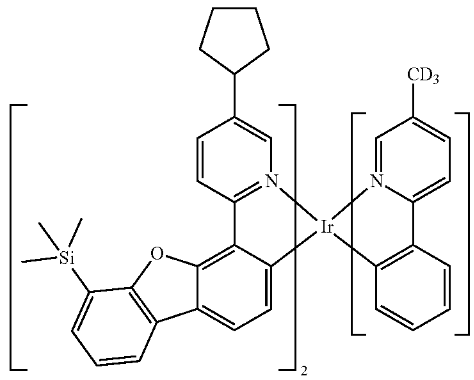
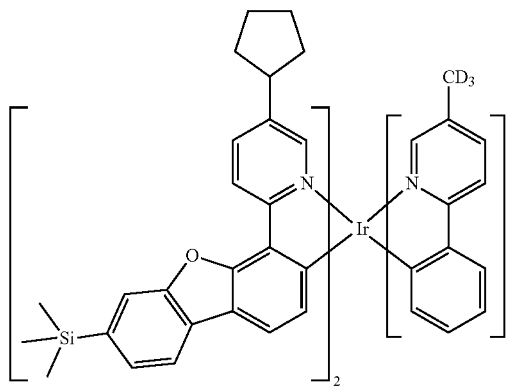
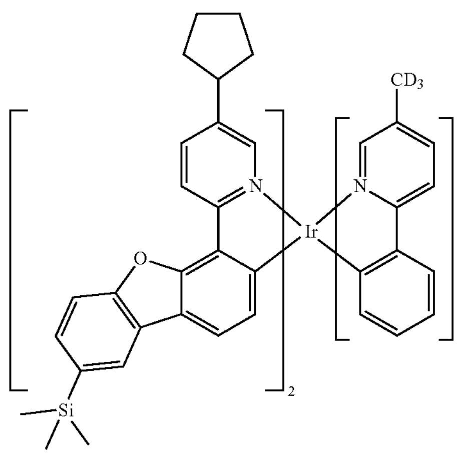
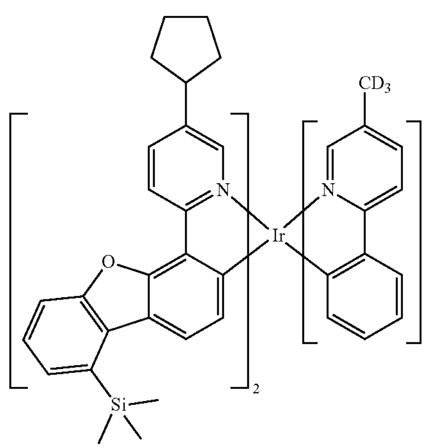

-continued
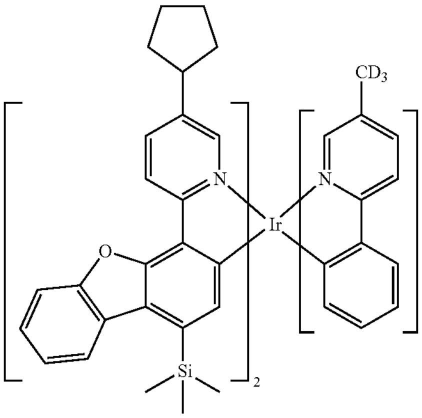
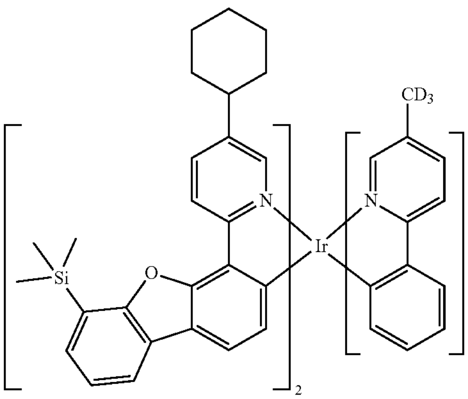
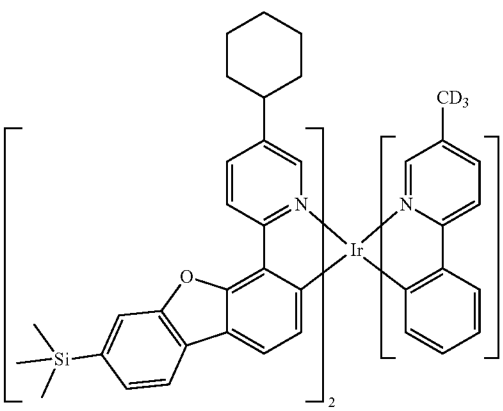
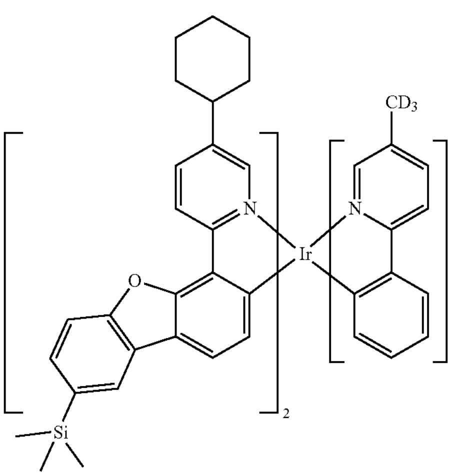
-continued
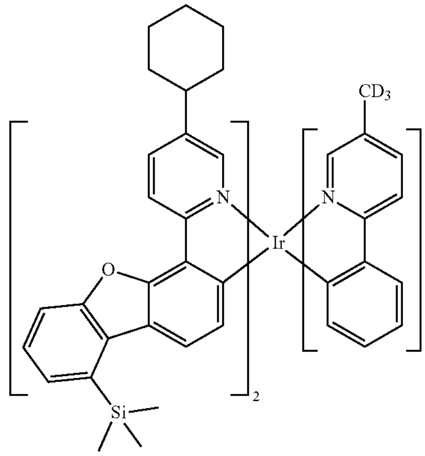
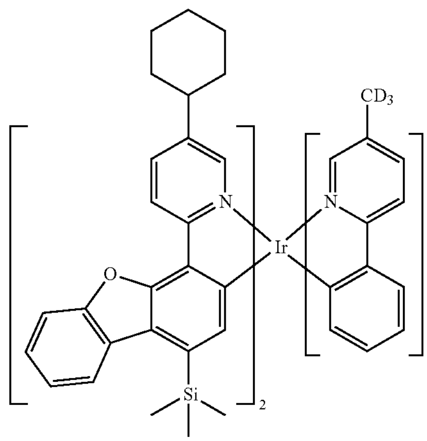
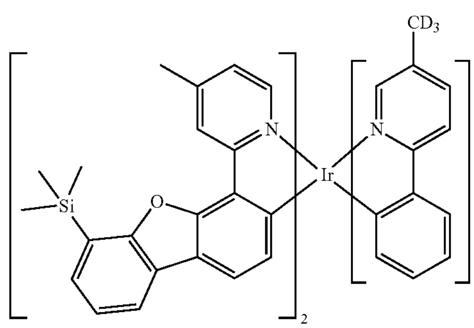
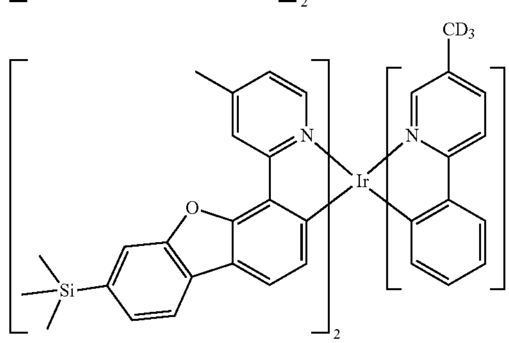

-continued
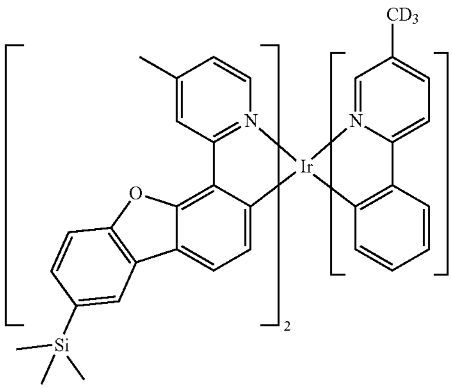
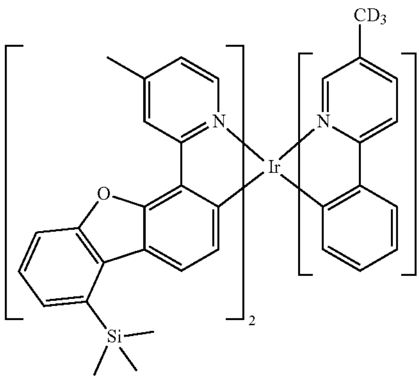
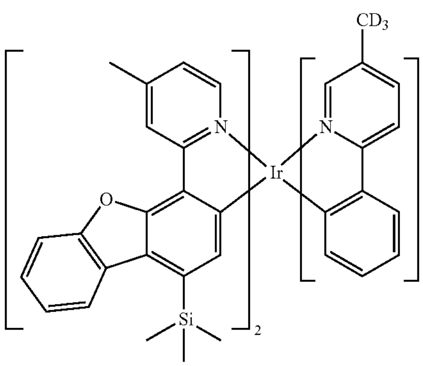
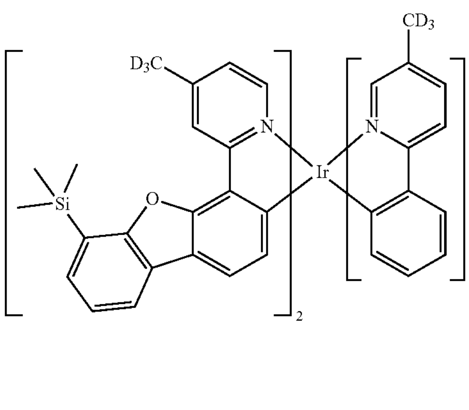
-continued
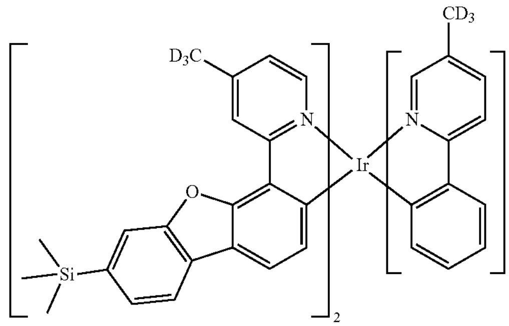
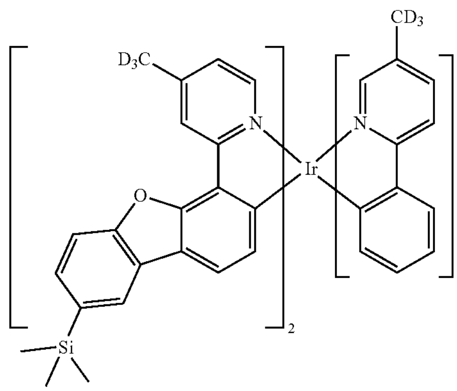
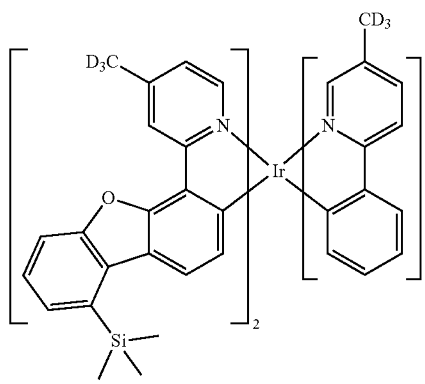
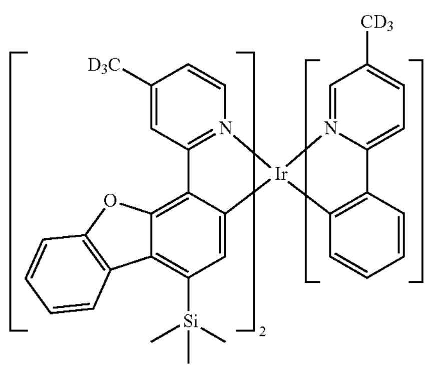

-continued
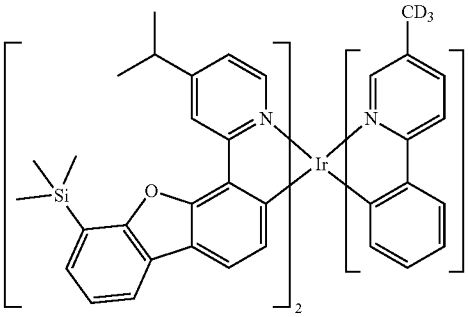
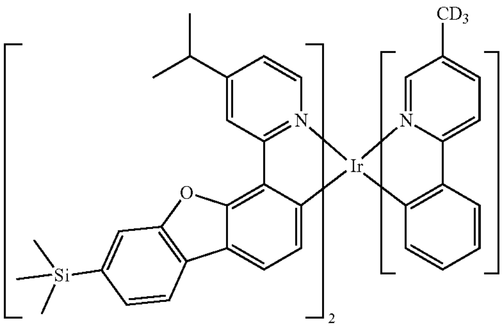
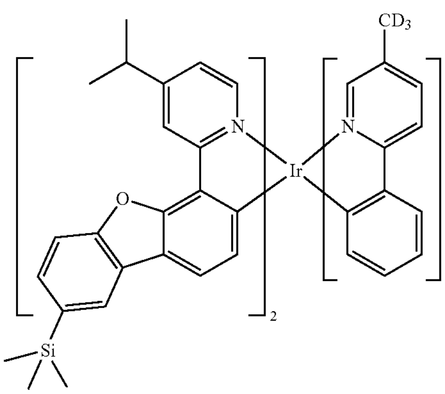
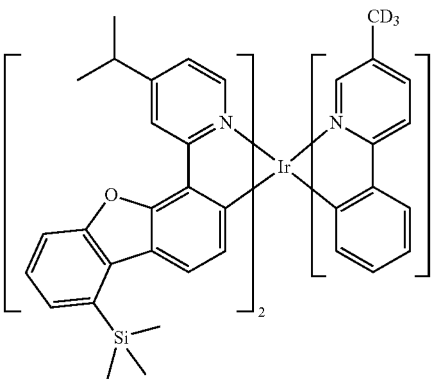
-continued
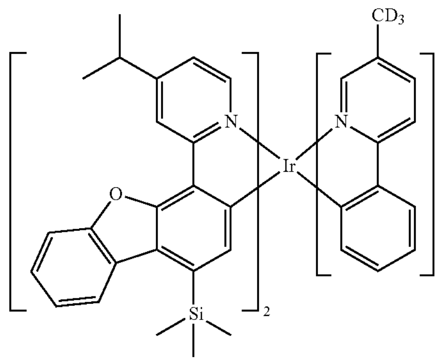
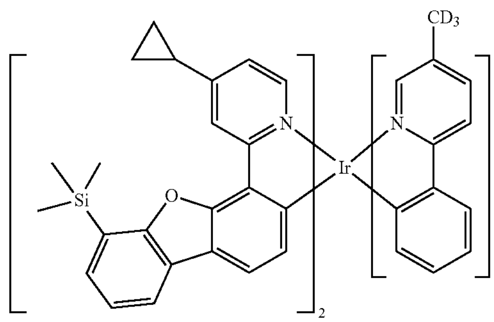
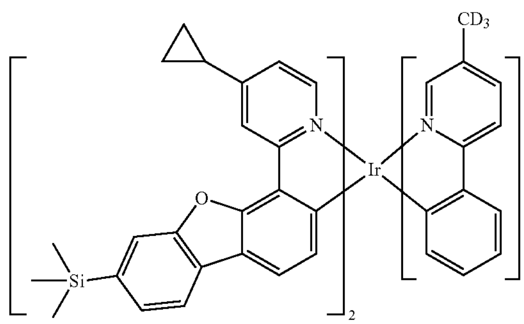
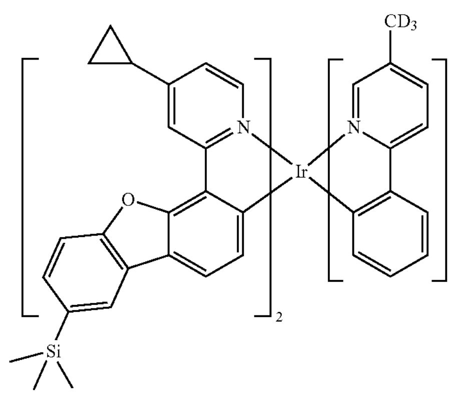

-continued
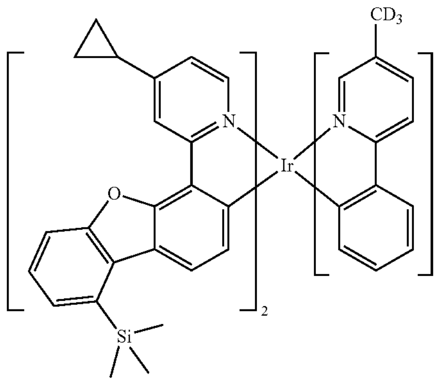
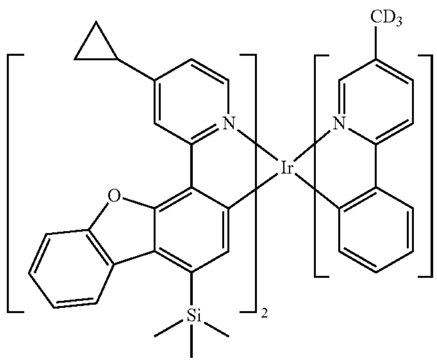
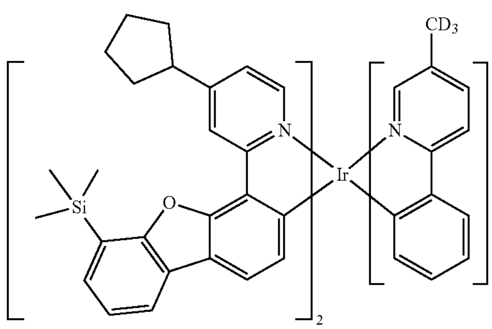
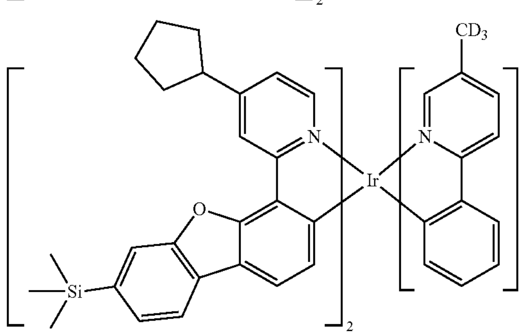
-continued
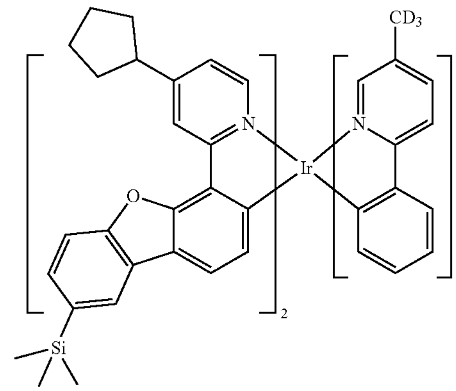
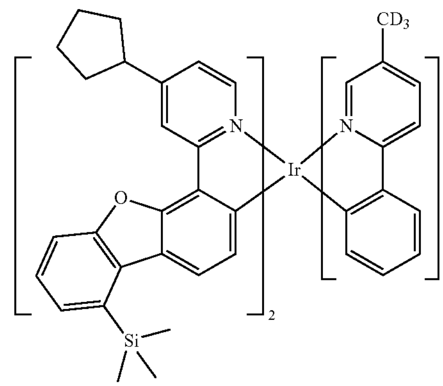
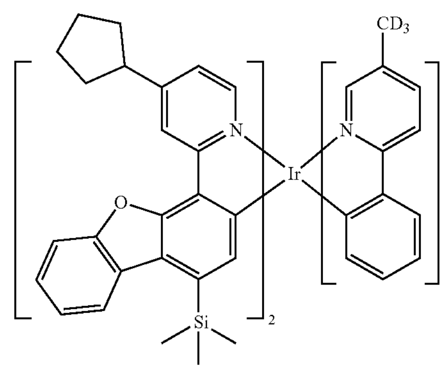
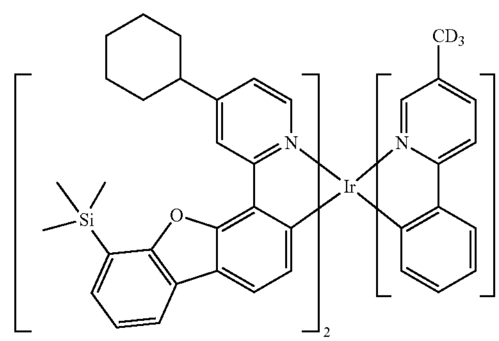

-continued
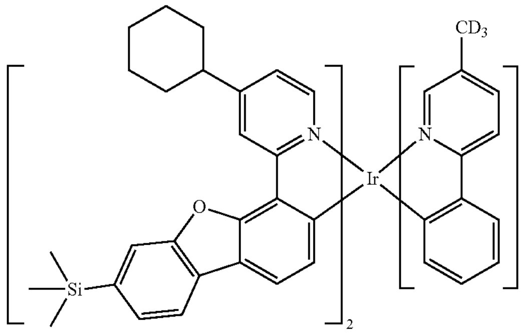
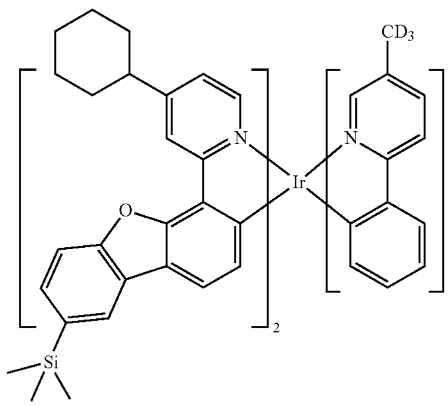
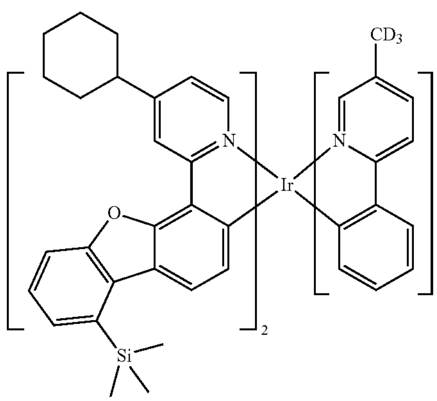
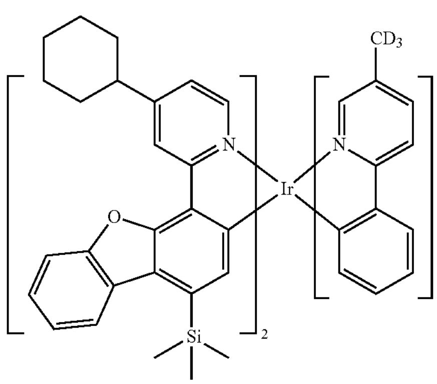
-continued
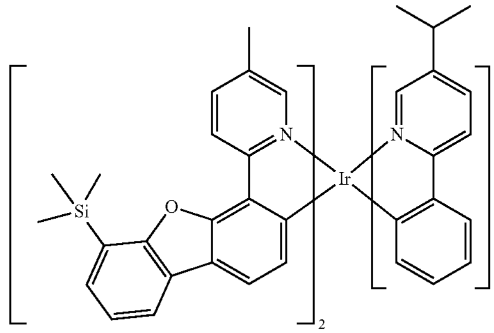
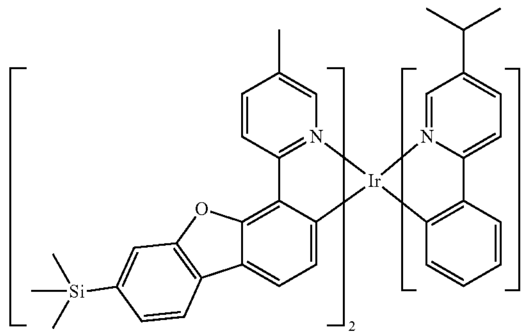
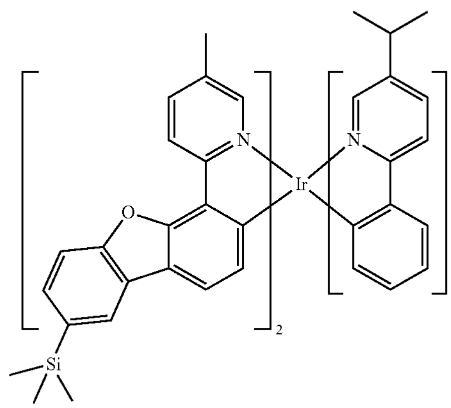
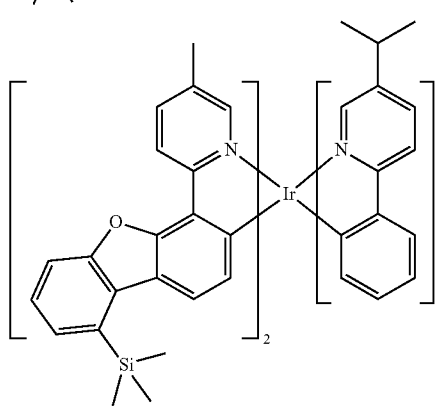

-continued
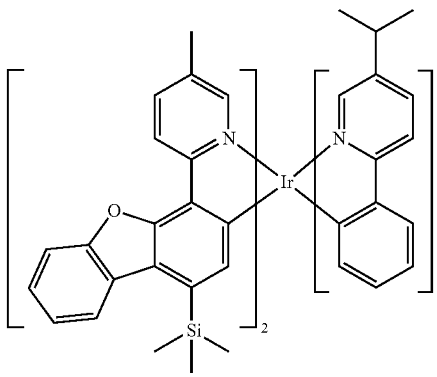
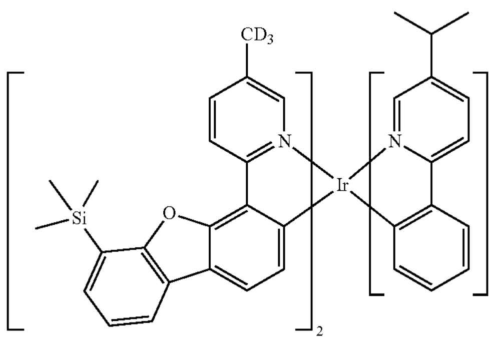
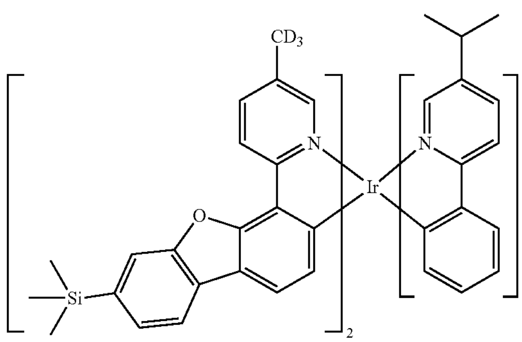
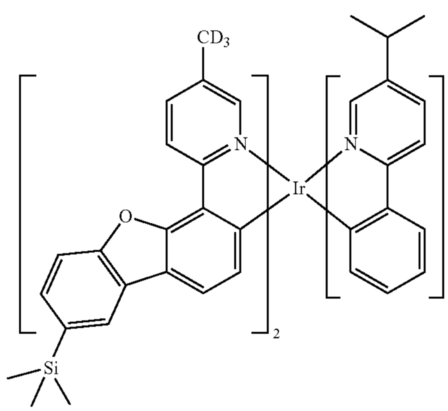
-continued
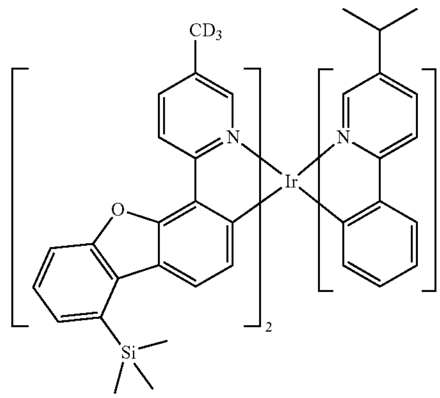
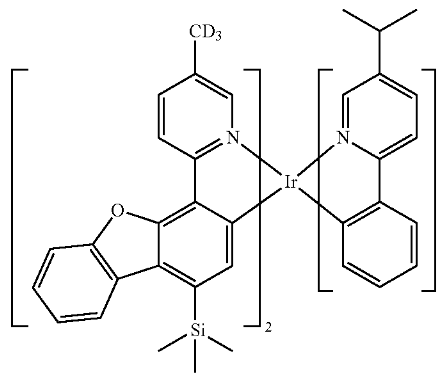
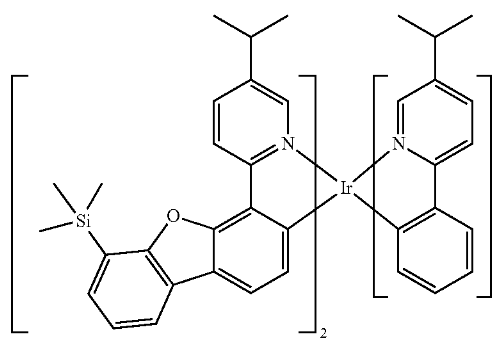
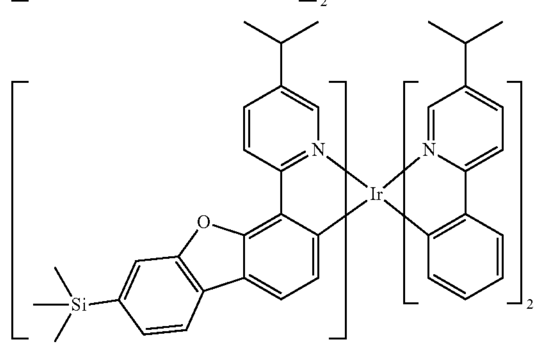

-continued
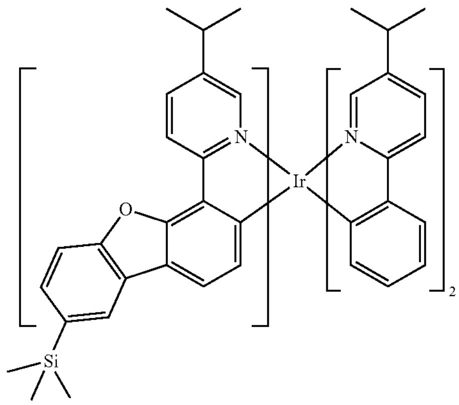
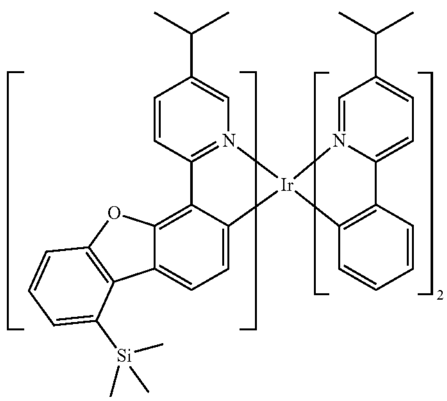
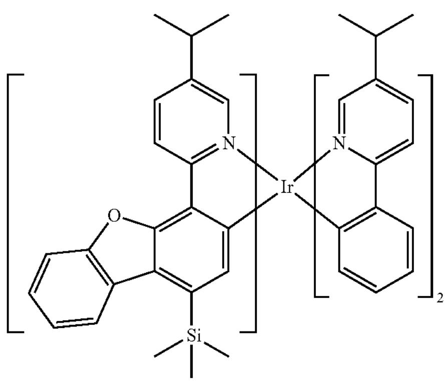
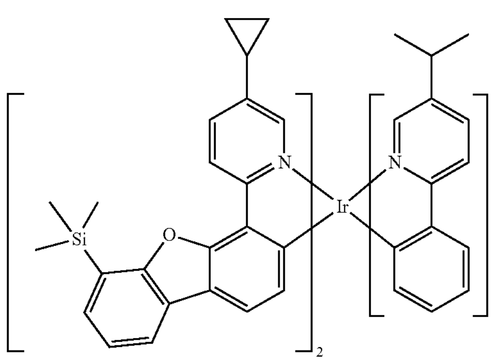
-continued
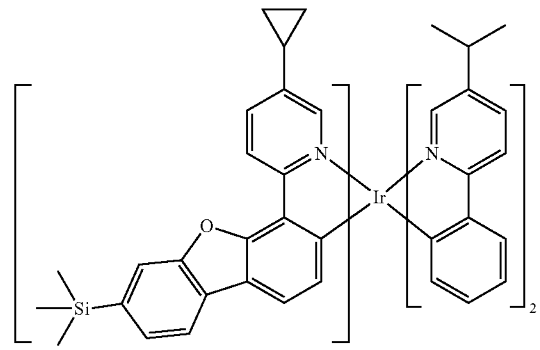
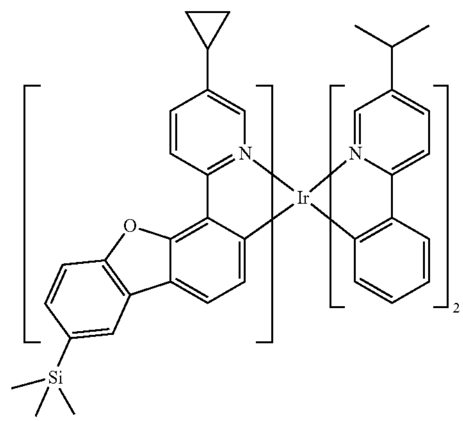
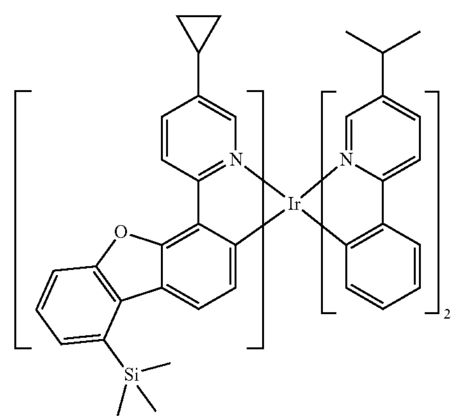
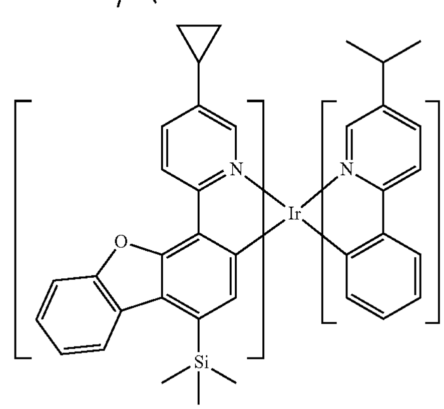

-continued
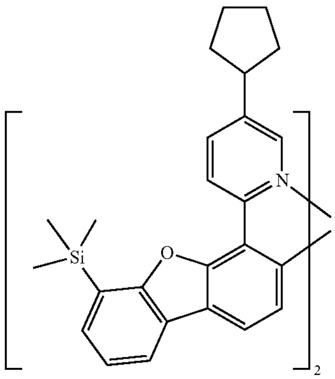
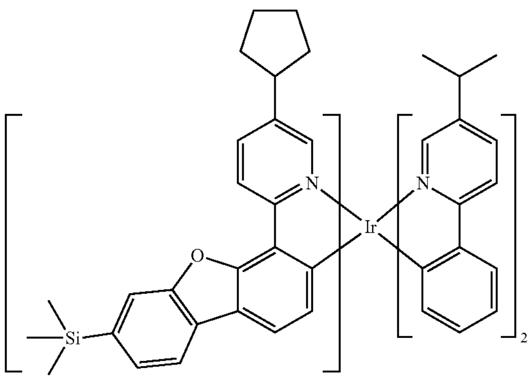
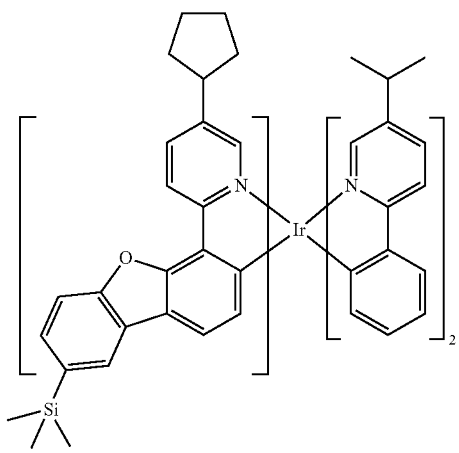
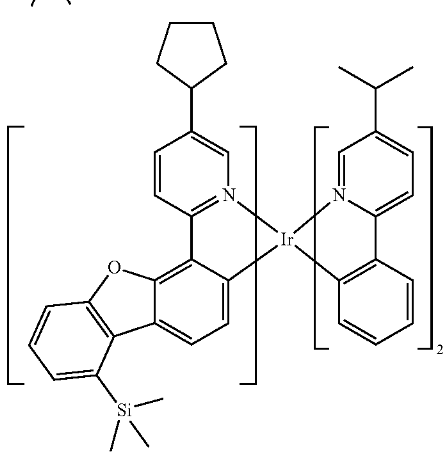
-continued
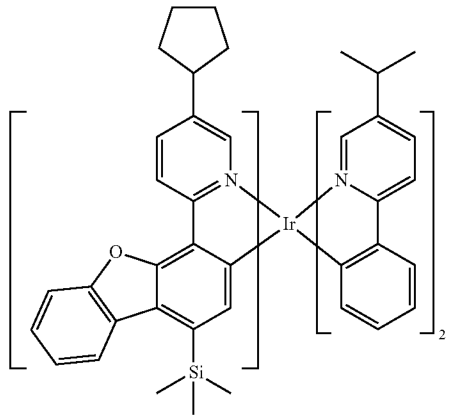
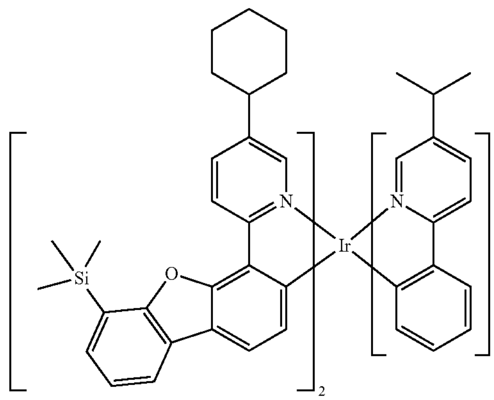
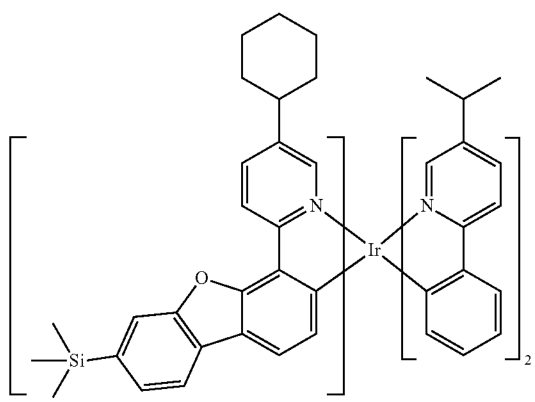
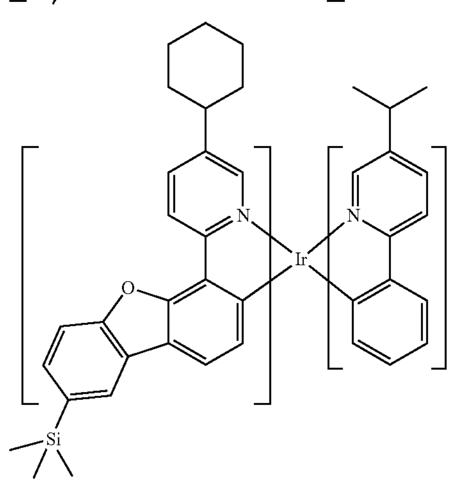

-continued
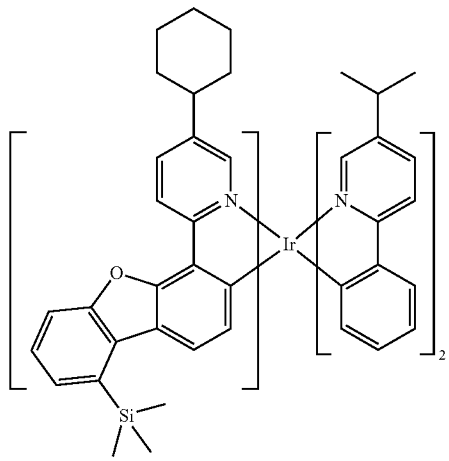
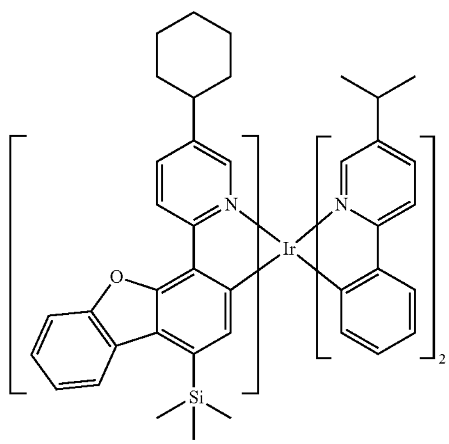
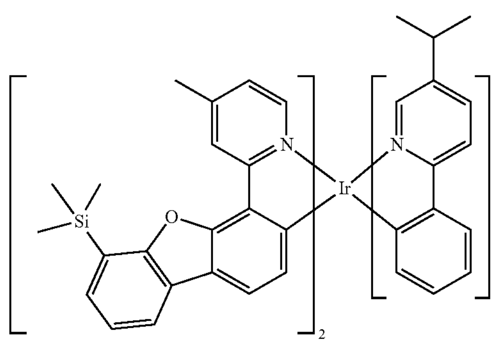
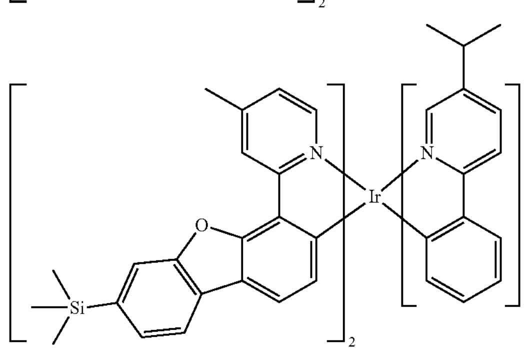
-continued
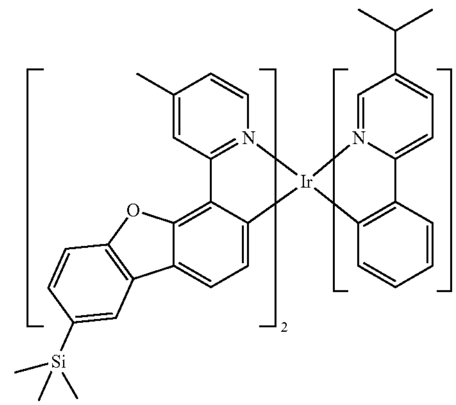
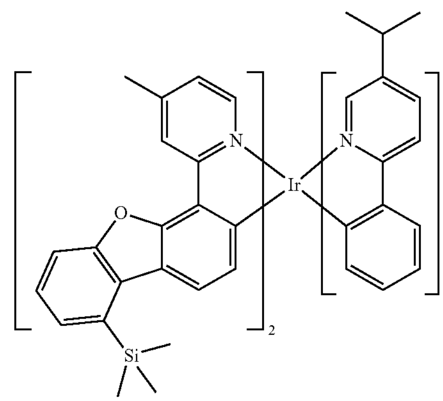
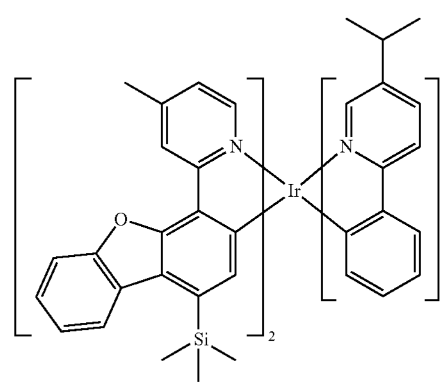
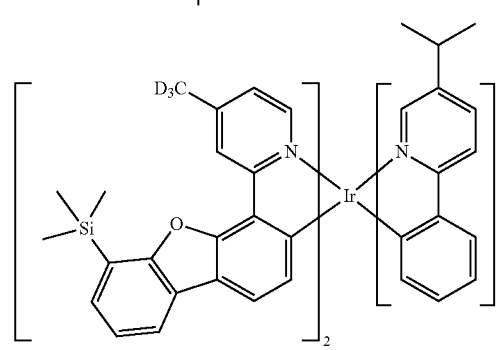

-continued
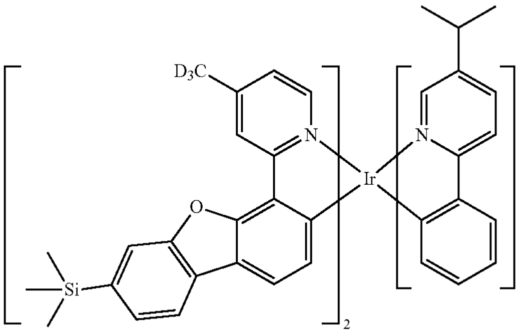
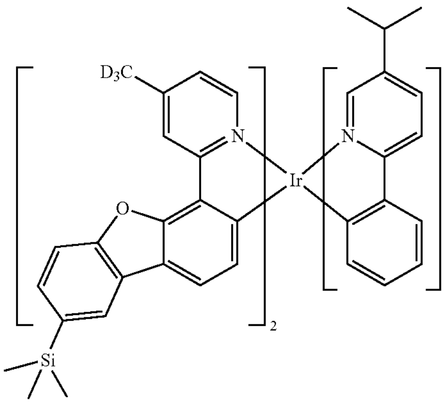
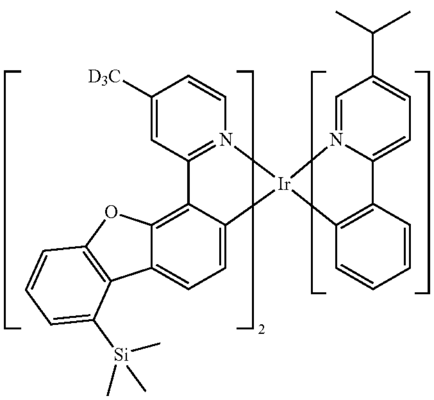
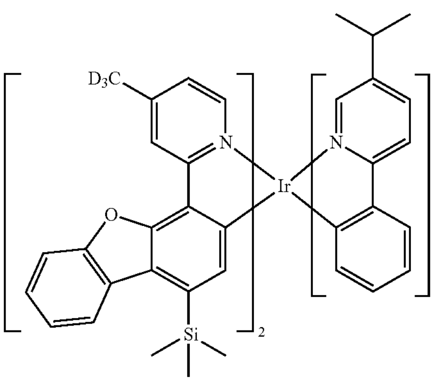
-continued
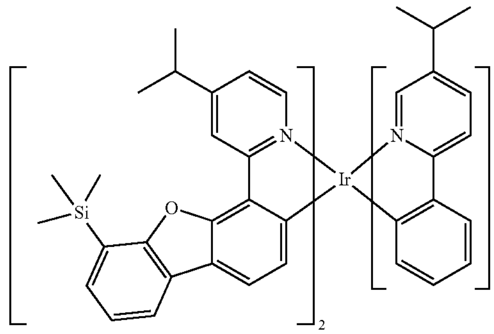
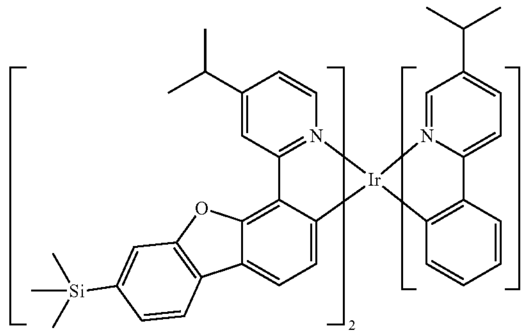
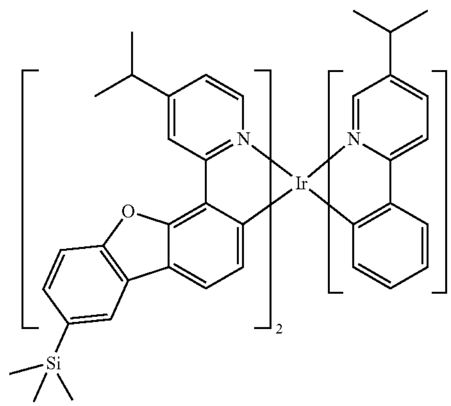
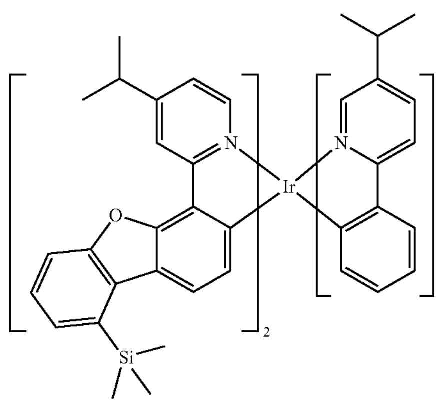

-continued
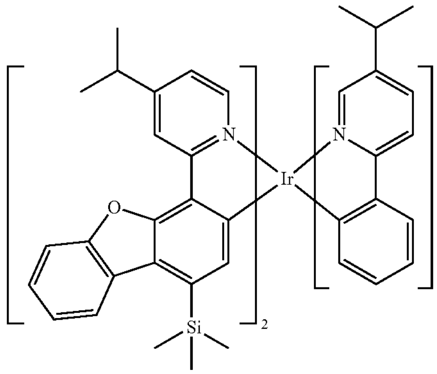
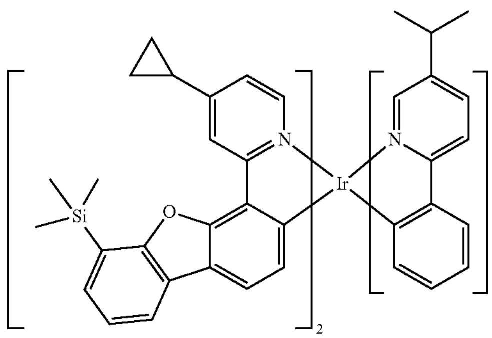
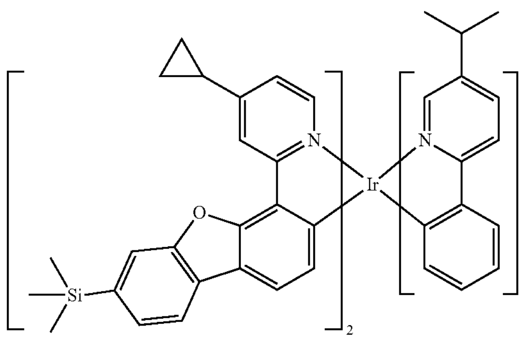
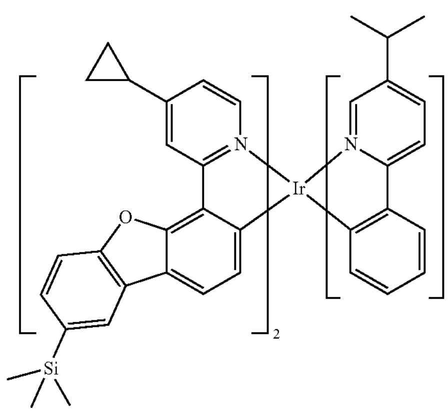
-continued
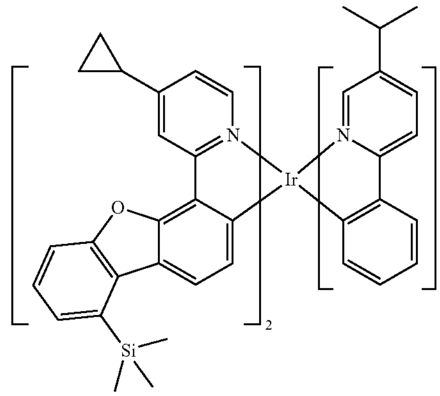
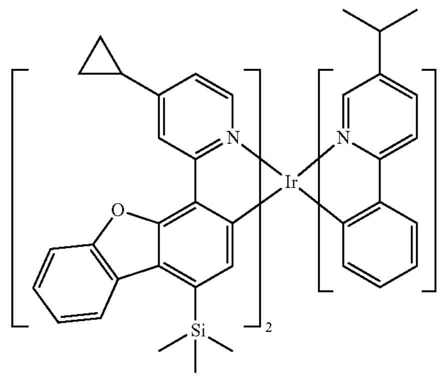
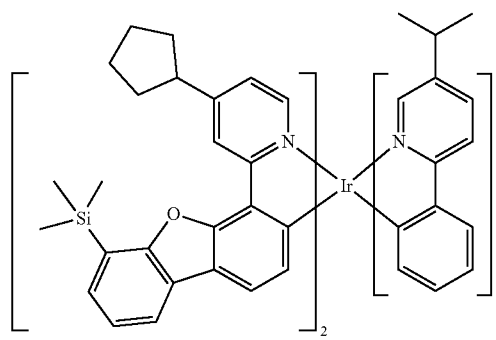
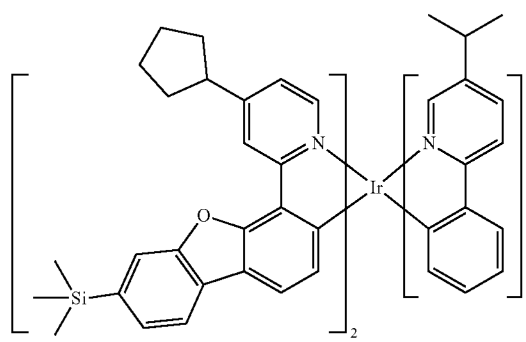

-continued
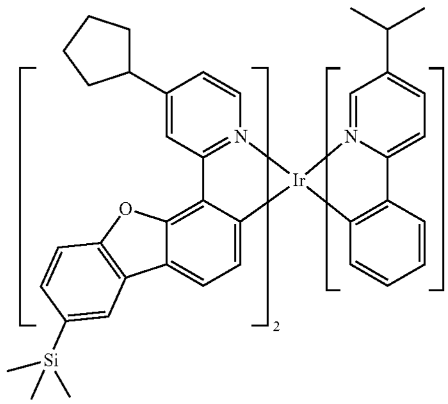
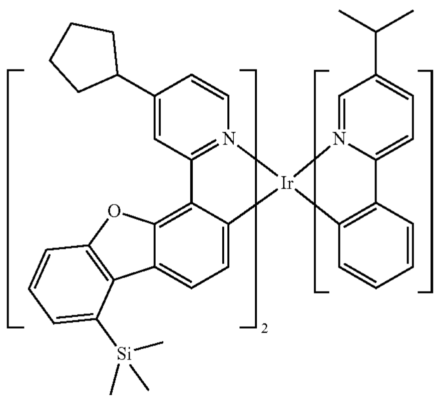
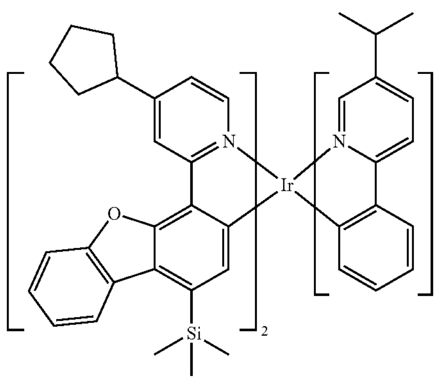
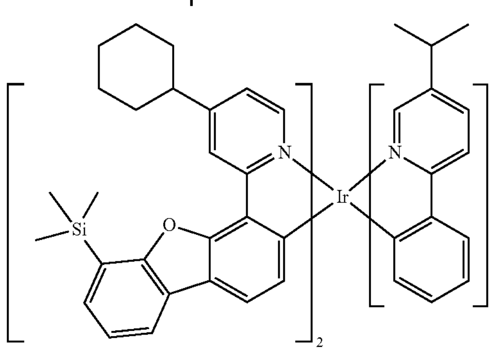
-continued
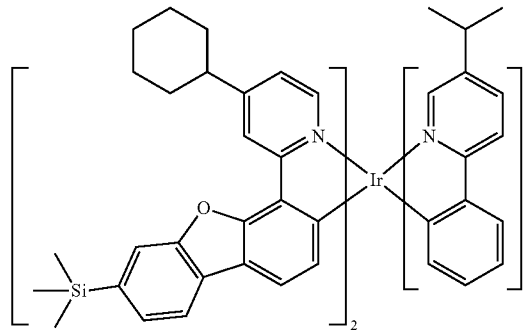
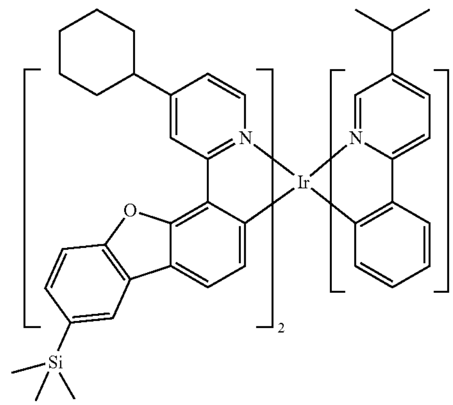
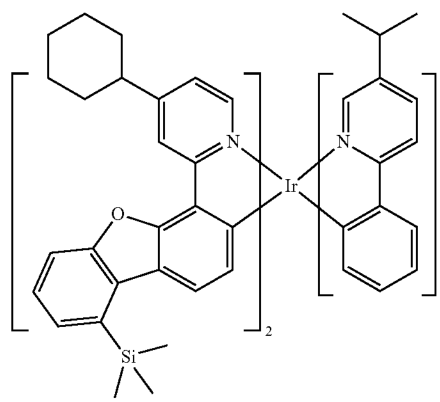
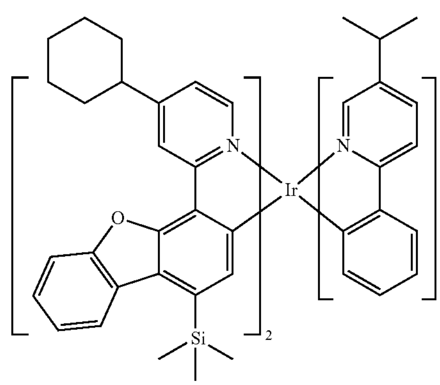

-continued
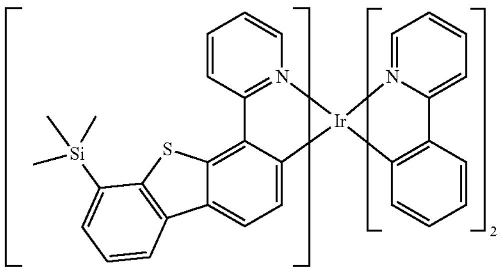
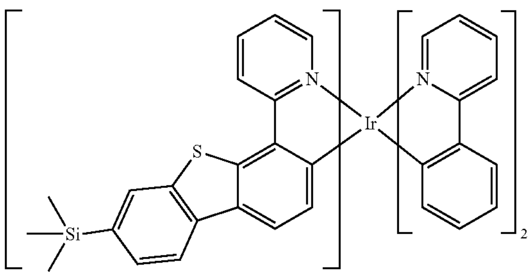
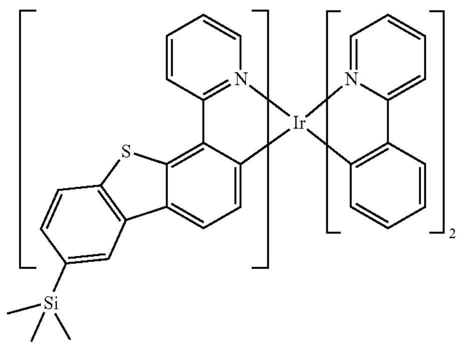
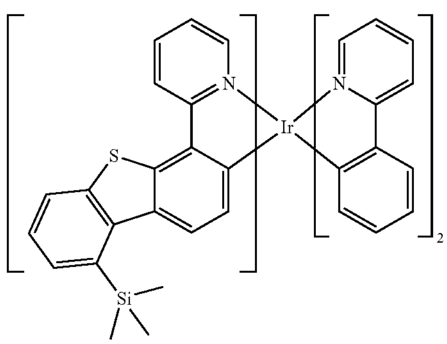
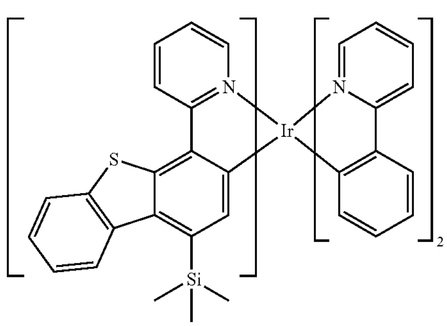
-continued
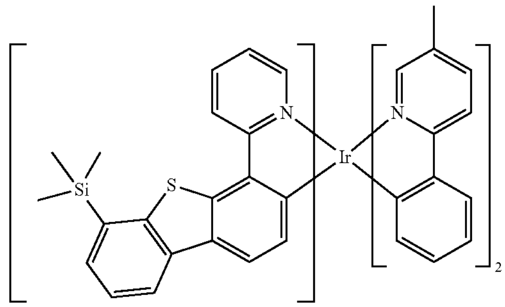
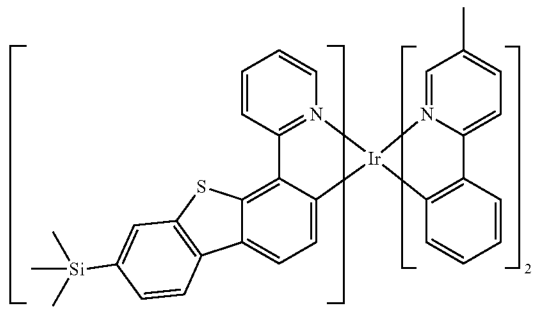
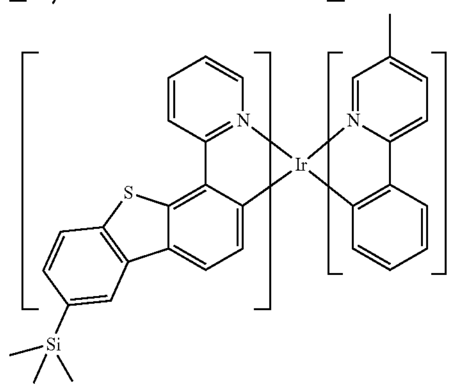
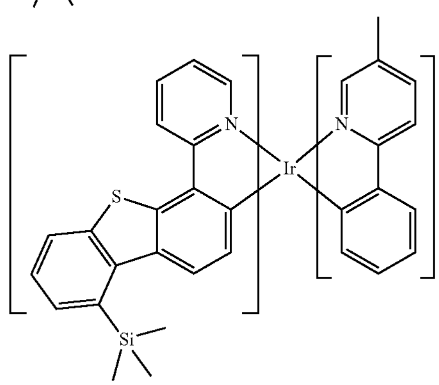
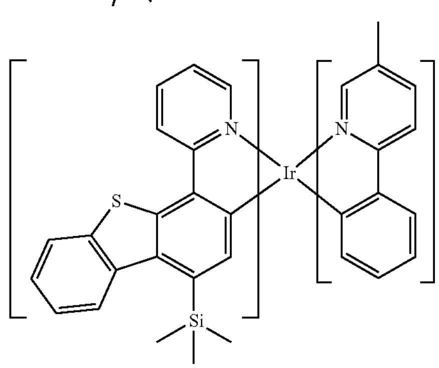

-continued
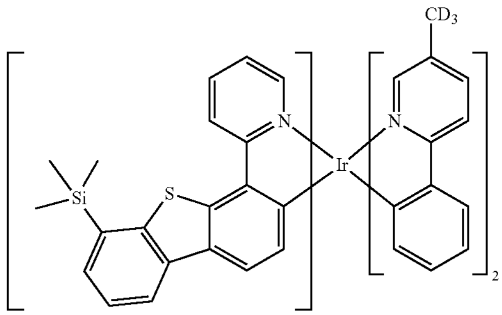
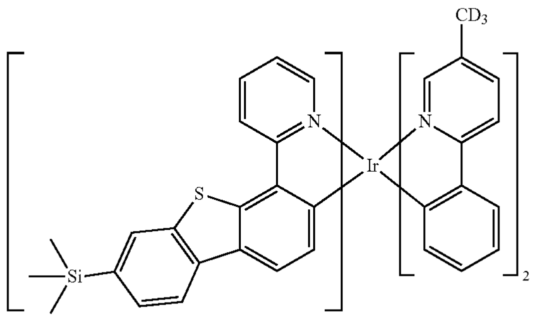
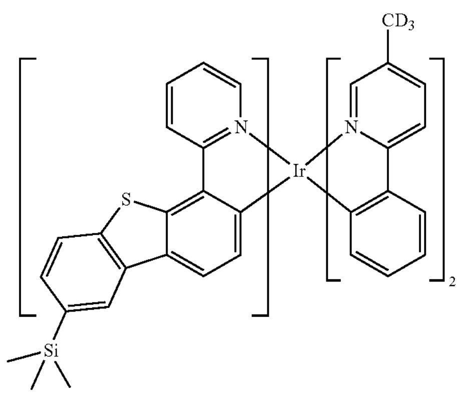
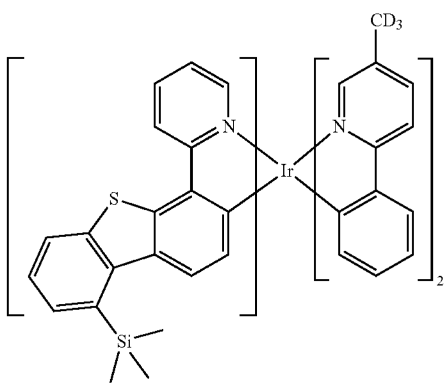
-continued
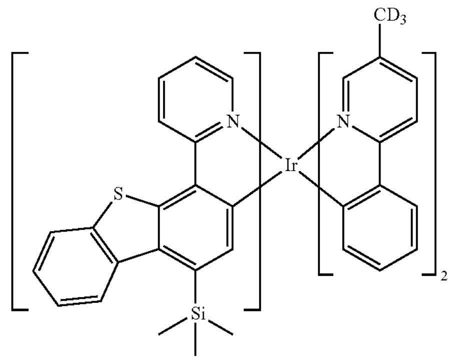
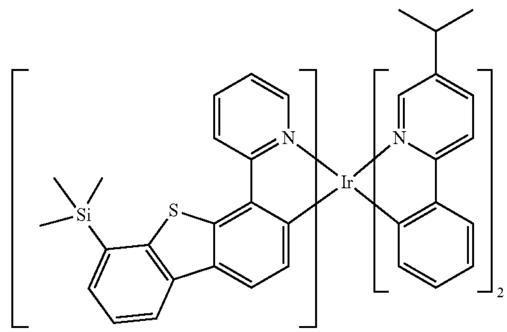
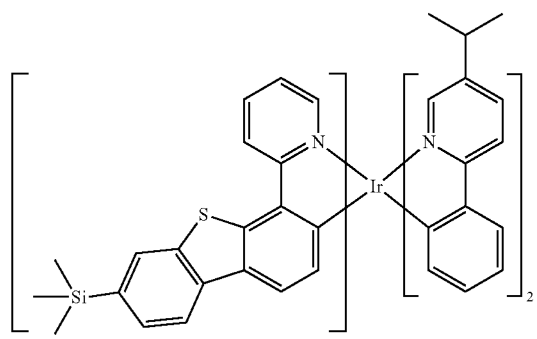
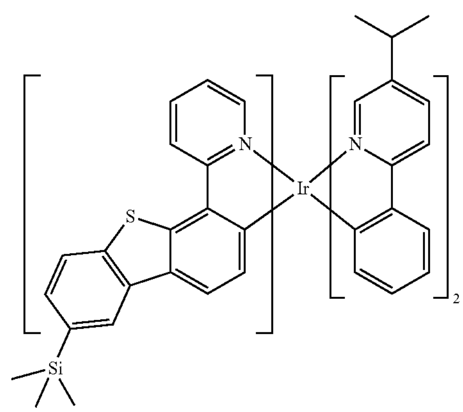

-continued
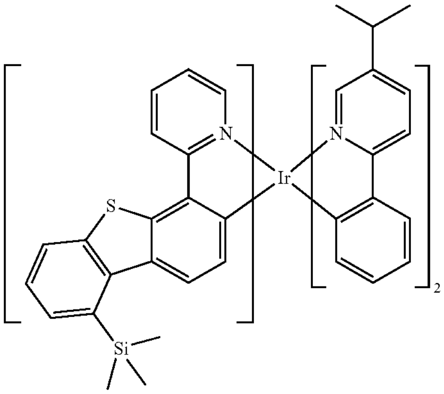
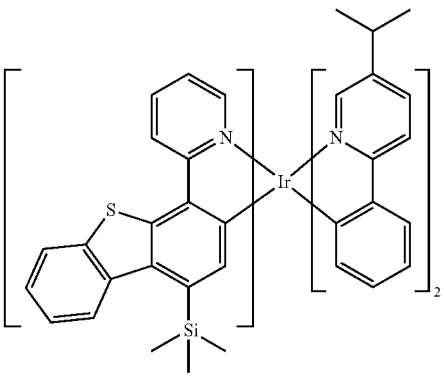
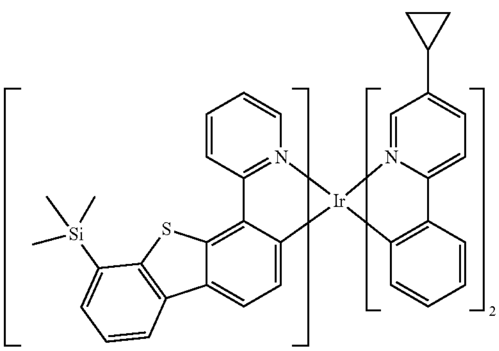
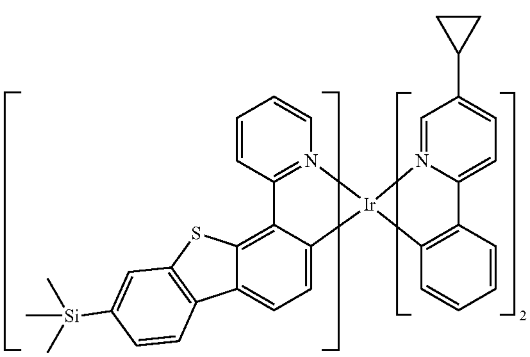
-continued
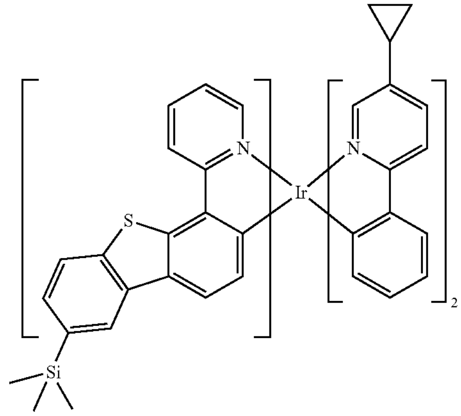
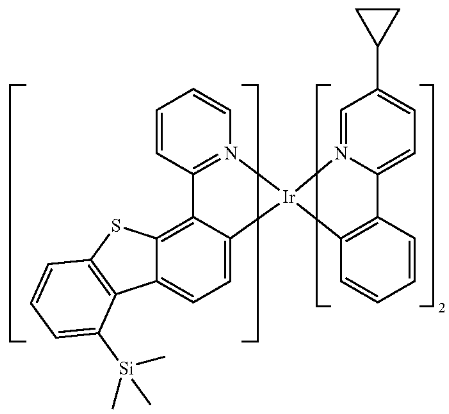
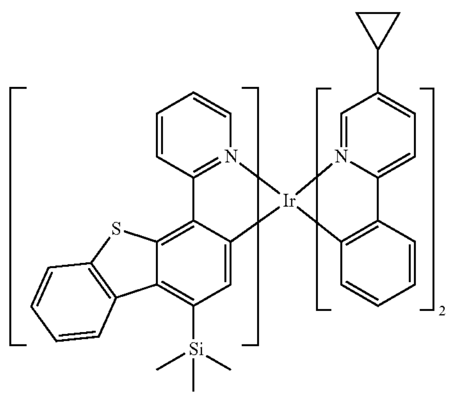
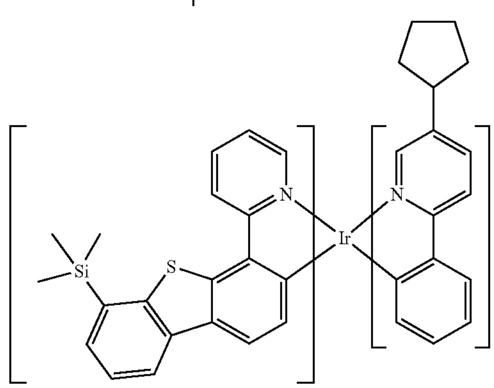

-continued
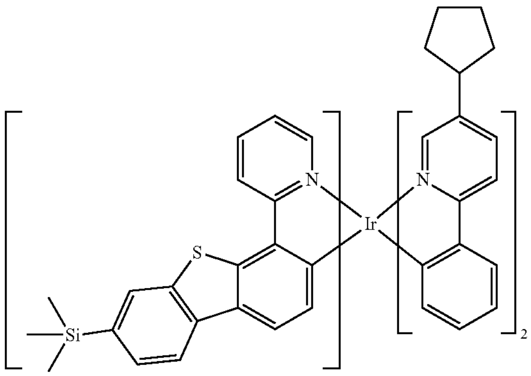
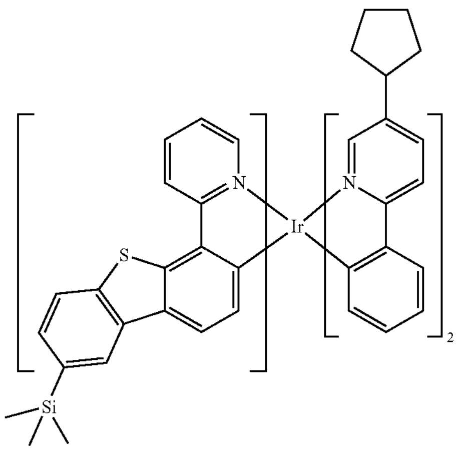
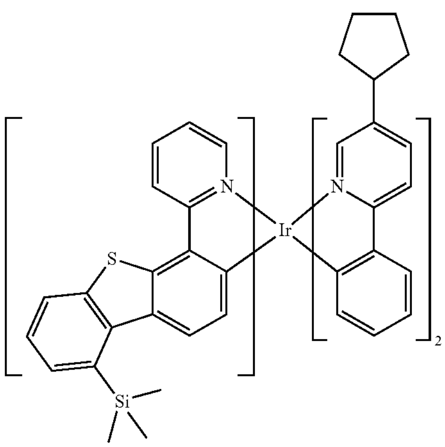
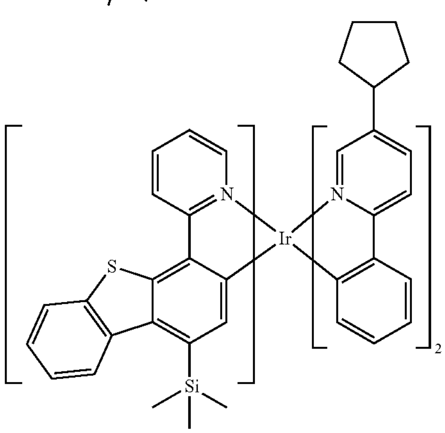
-continued
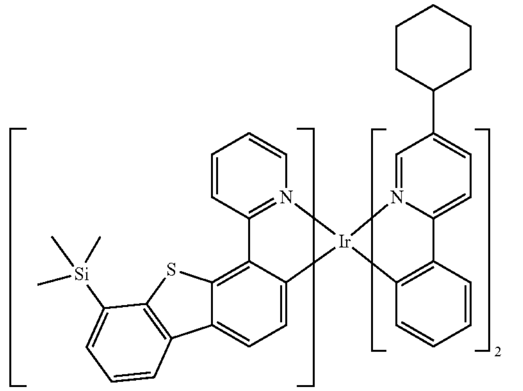
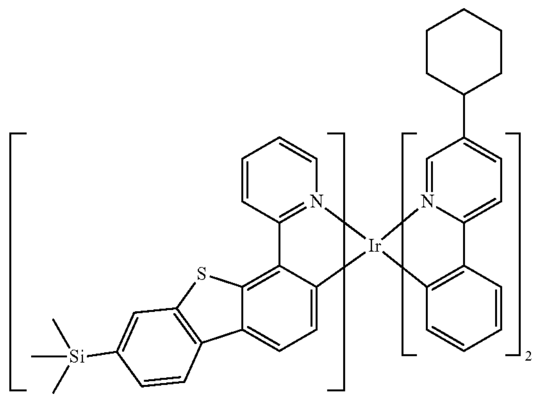
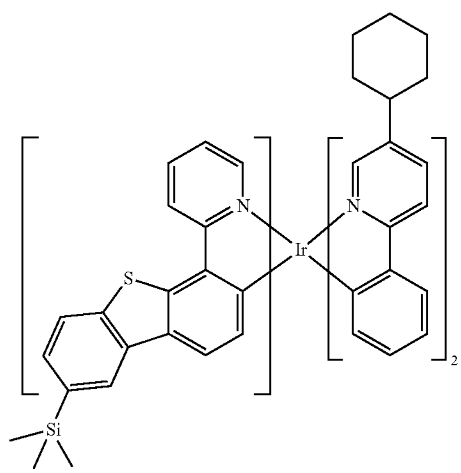
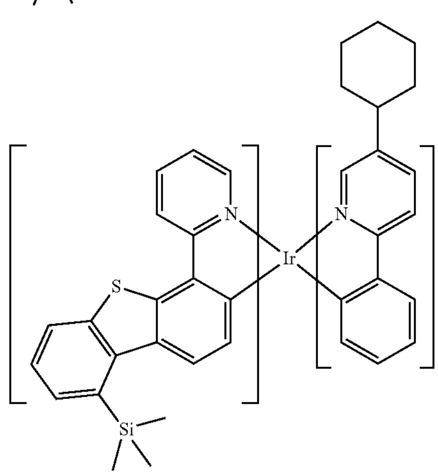

-continued
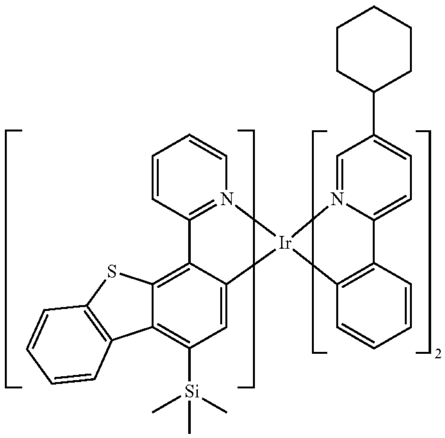
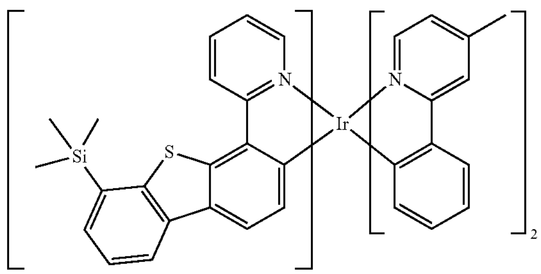
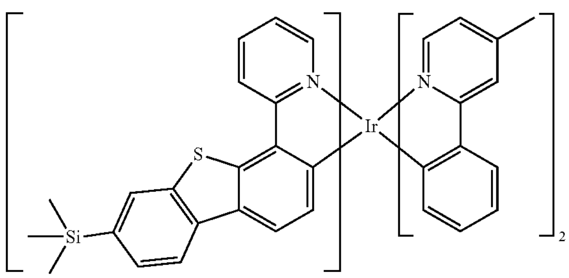
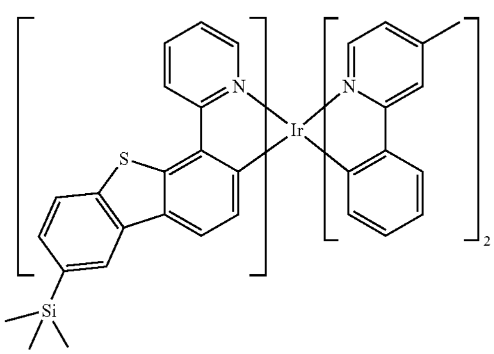
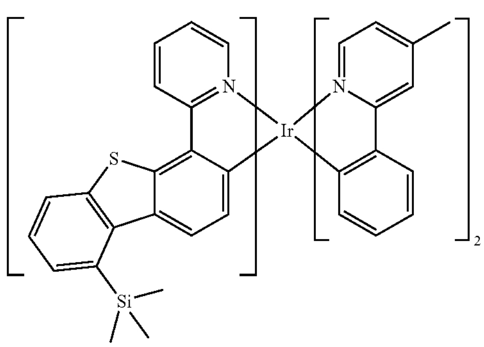
-continued
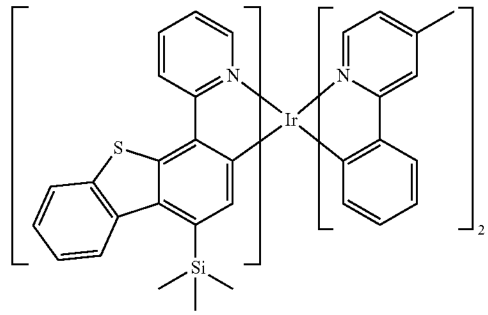
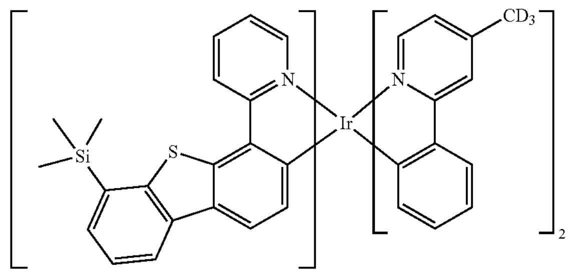
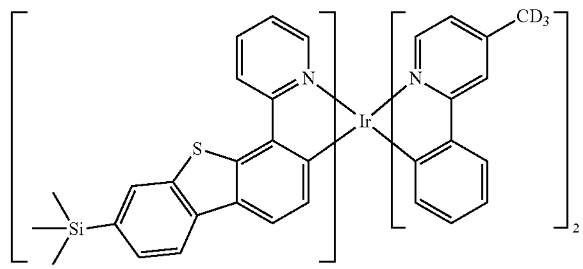
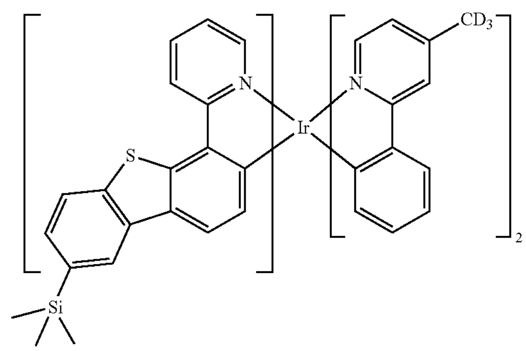
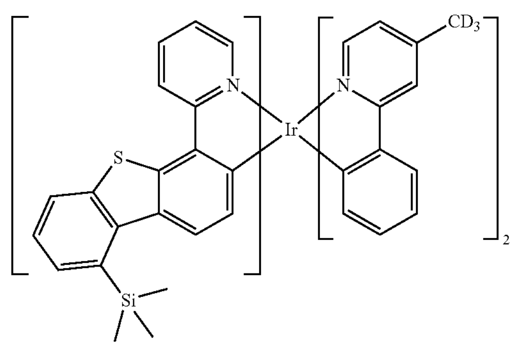

-continued
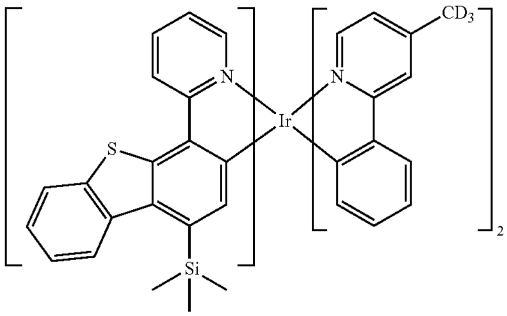
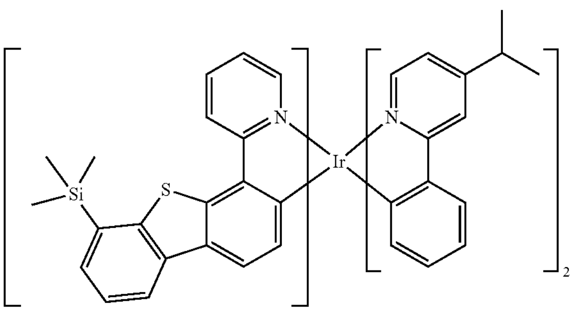
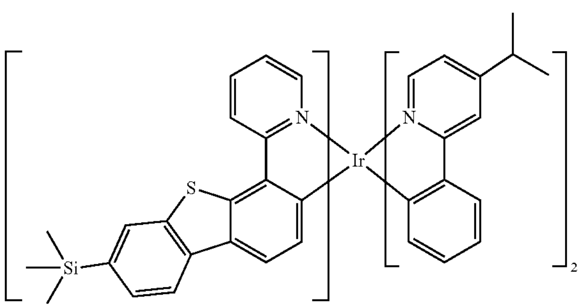
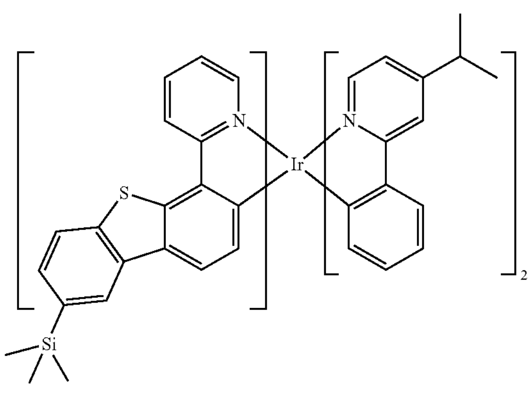
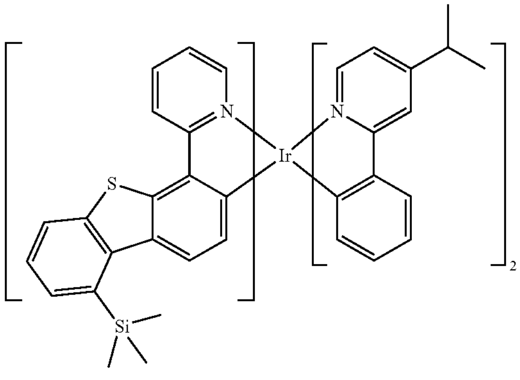
-continued
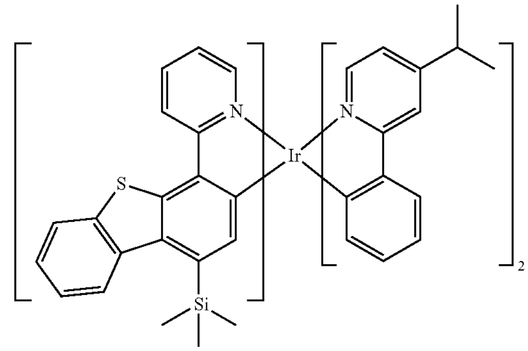
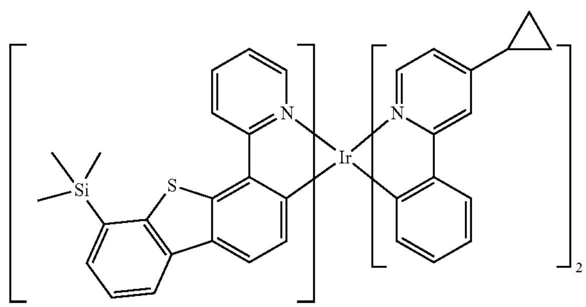
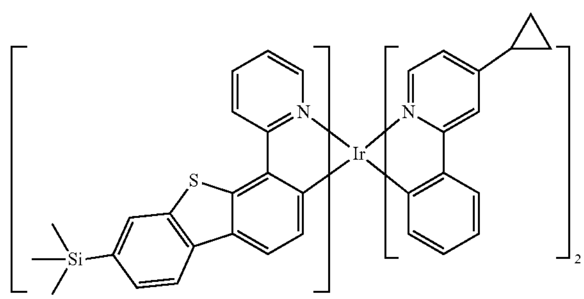
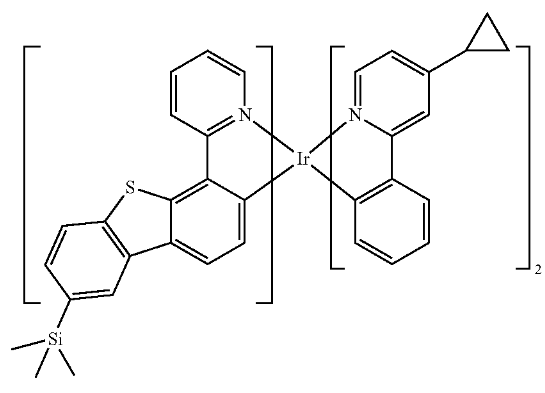
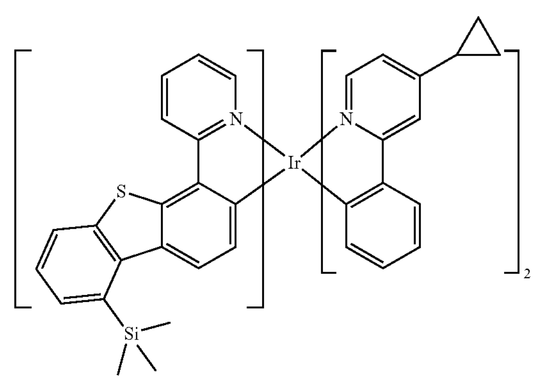

-continued
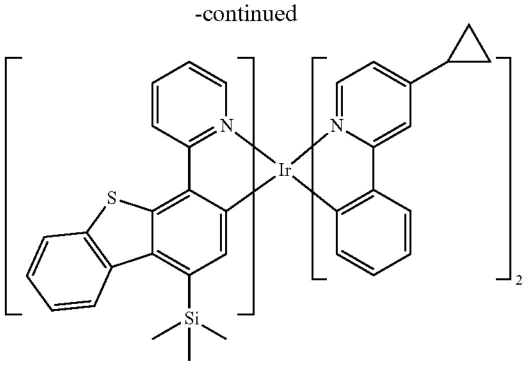
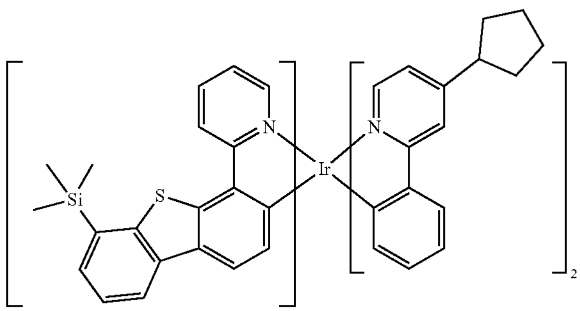
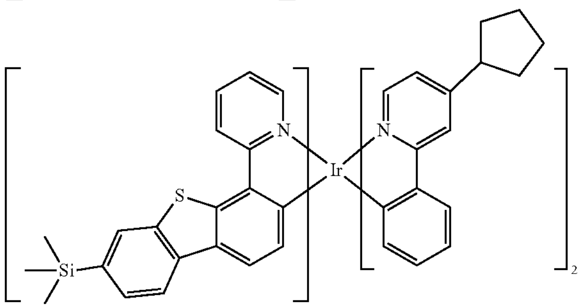
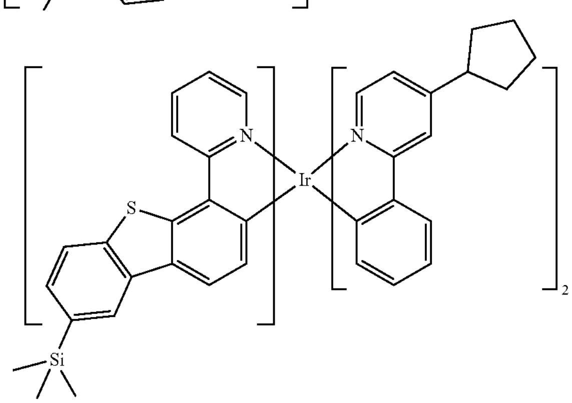
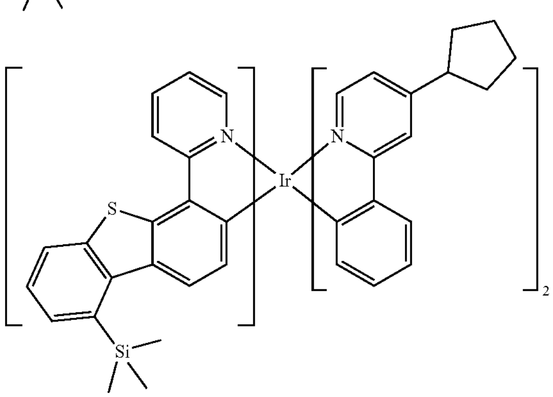
-continued
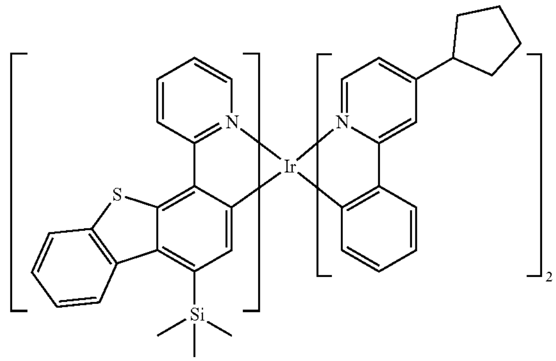
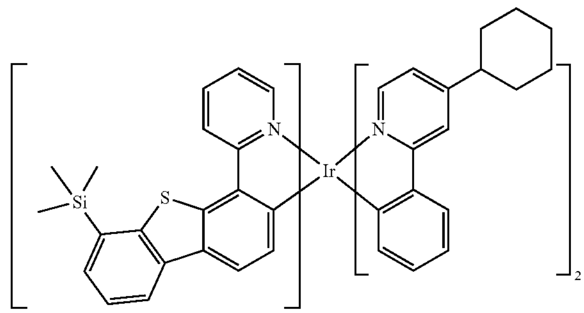
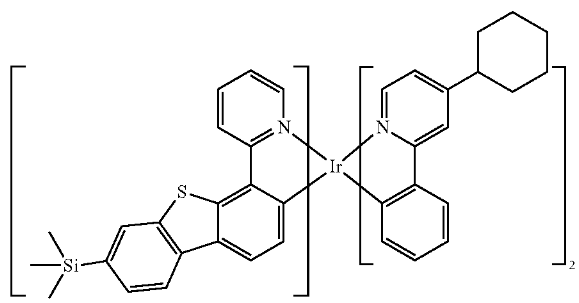
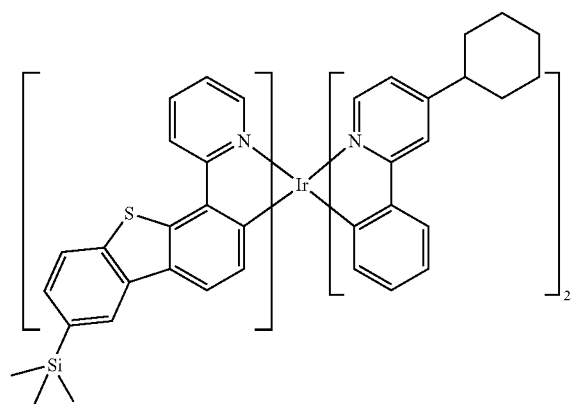

-continued
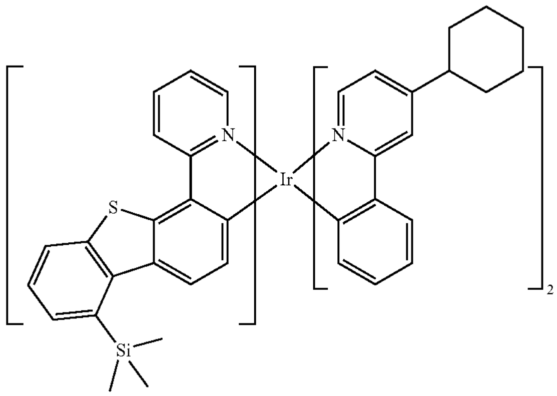
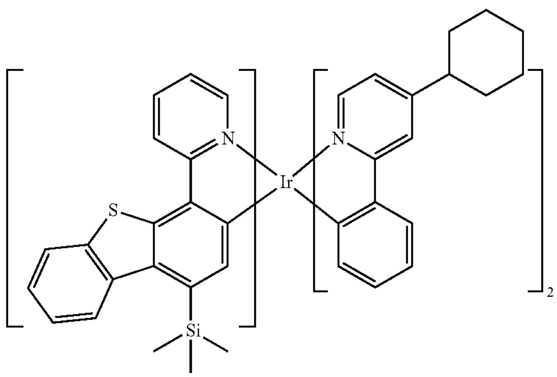
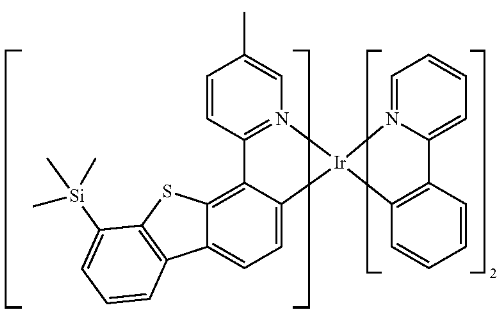
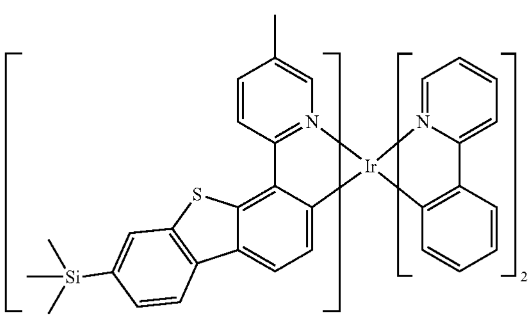
-continued
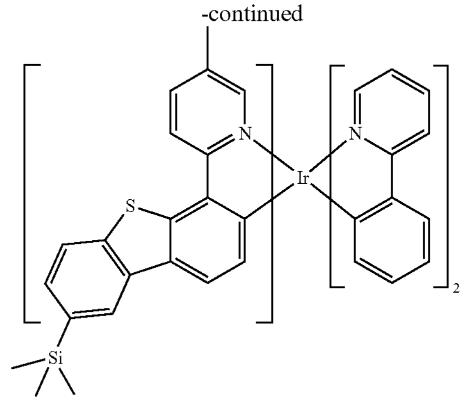
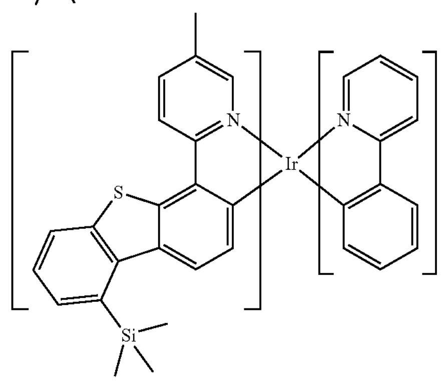
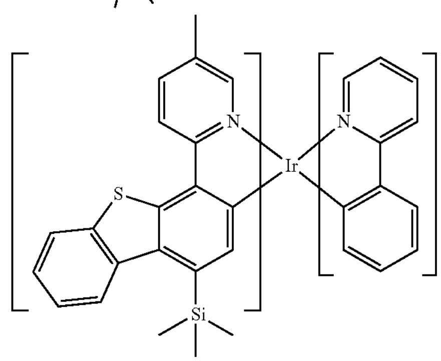
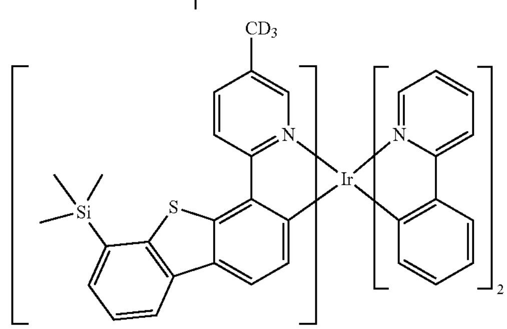
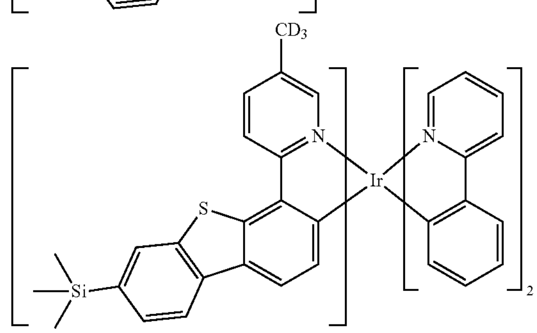

-continued
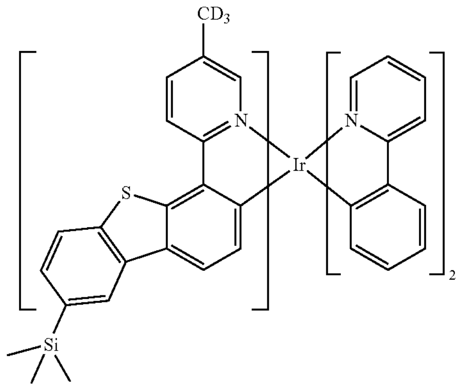
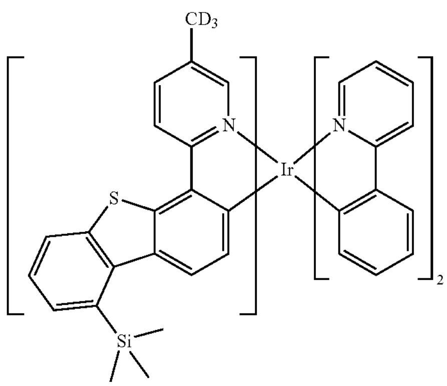
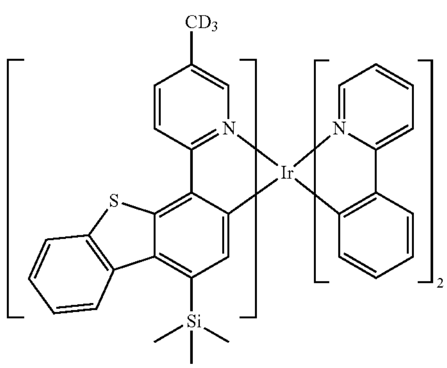
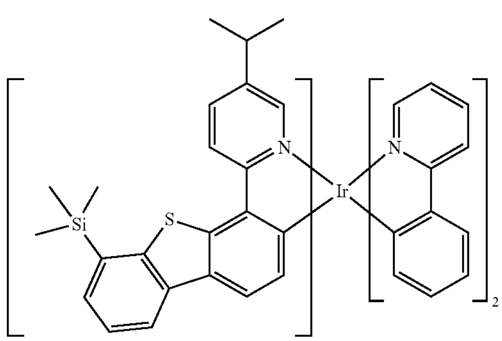
-continued
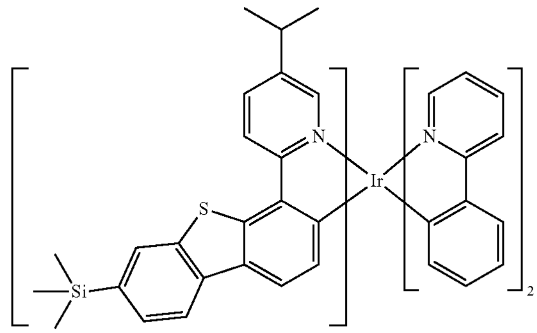
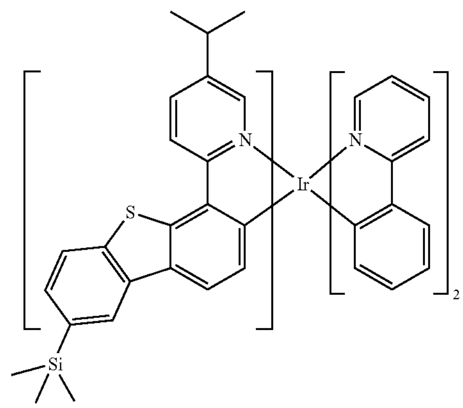
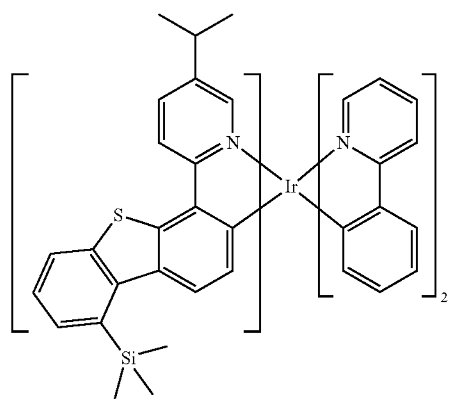
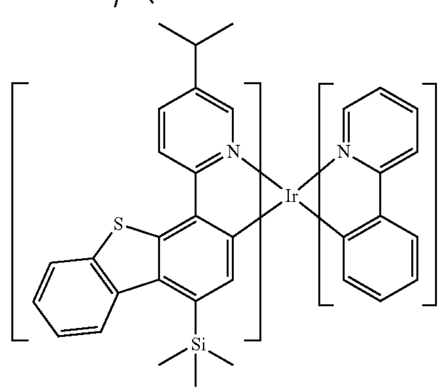

-continued
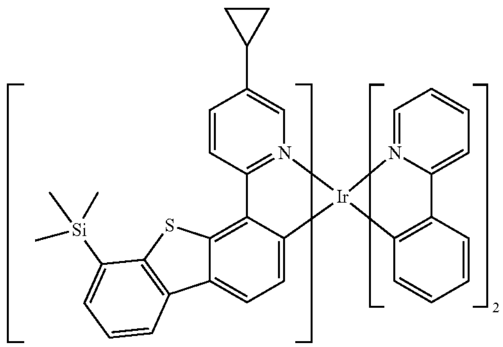
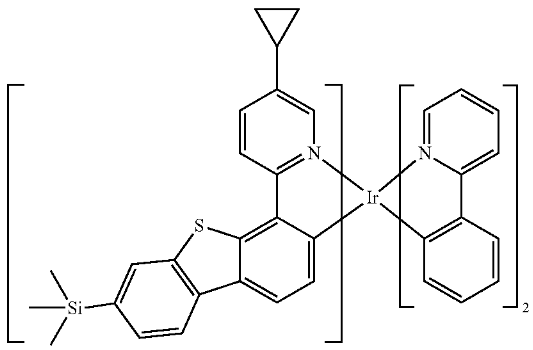
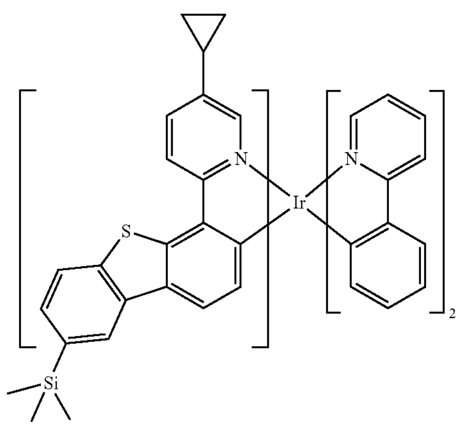
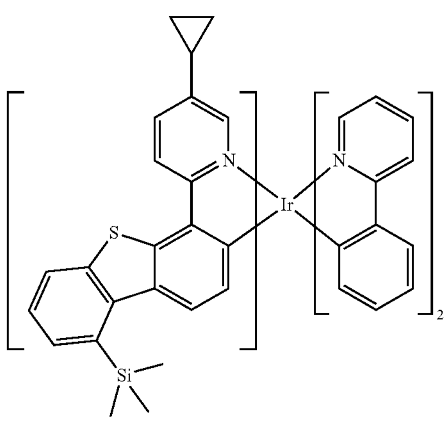
-continued
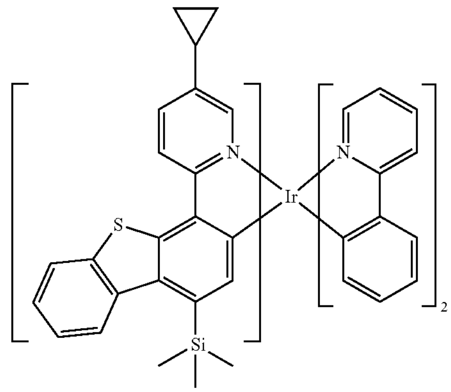
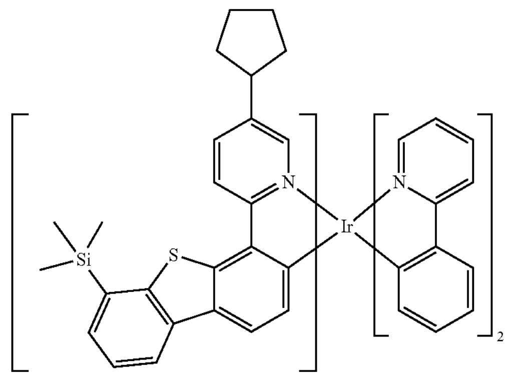
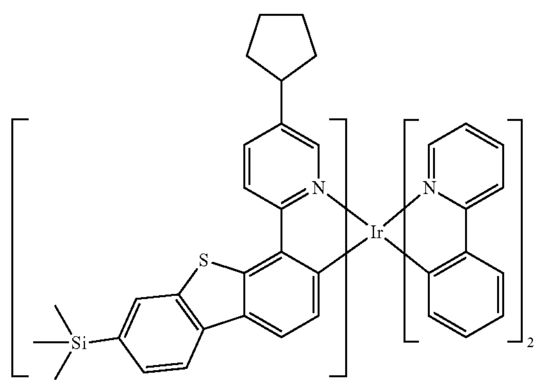
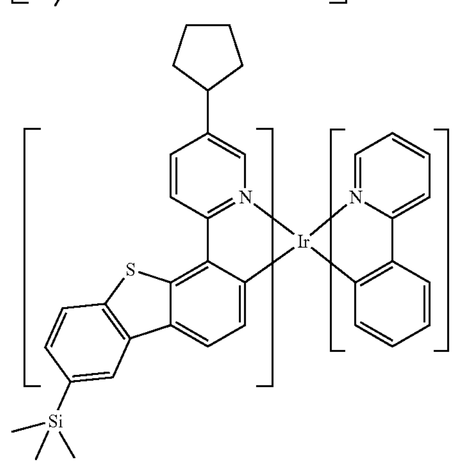

-continued
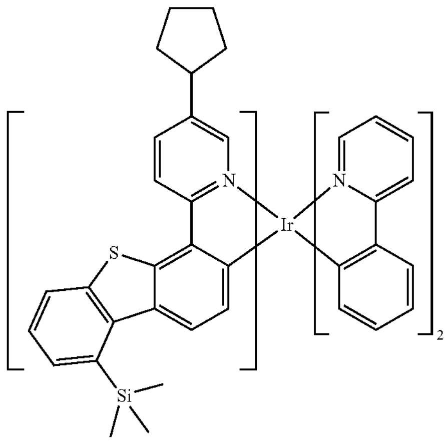
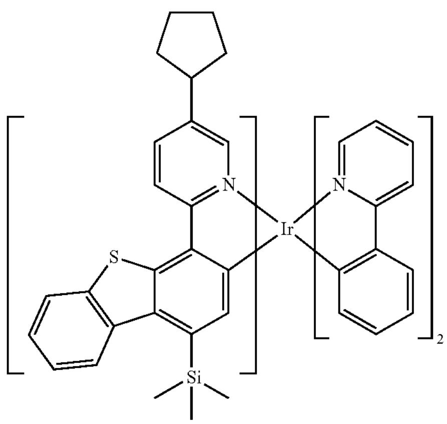
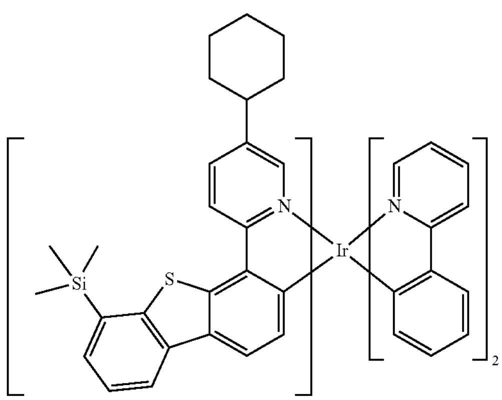
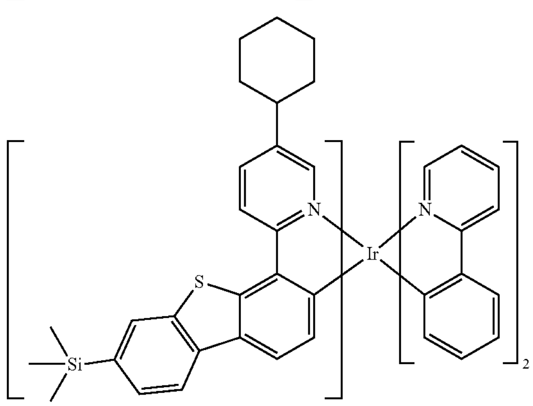
-continued
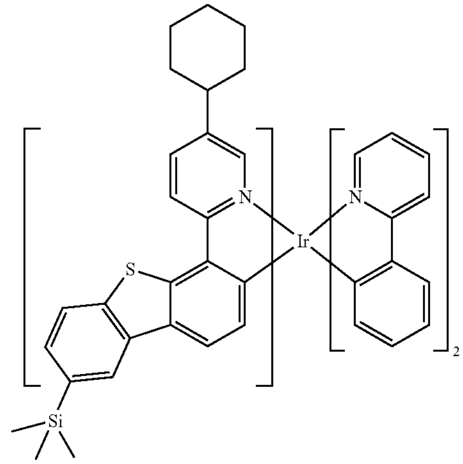
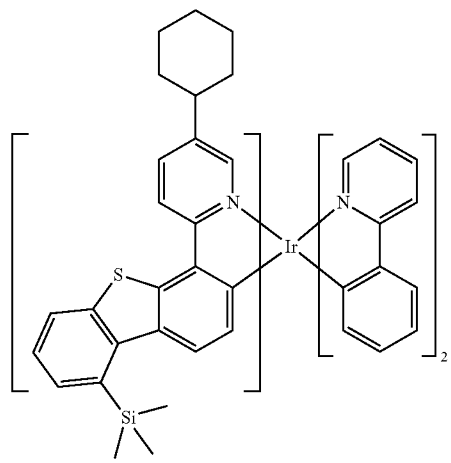
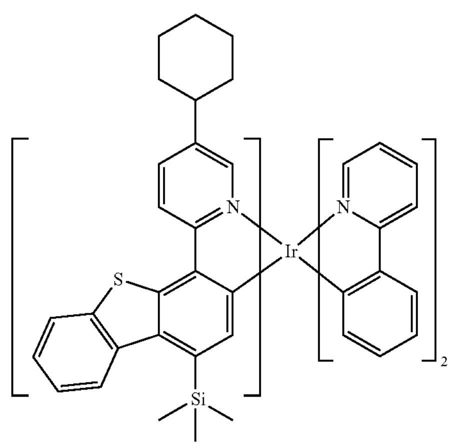
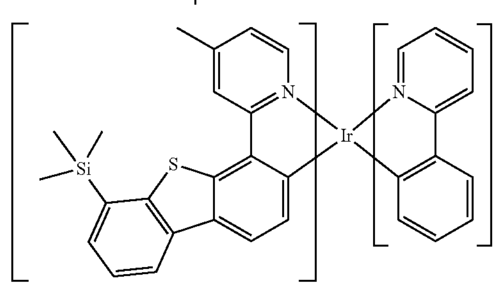

-continued
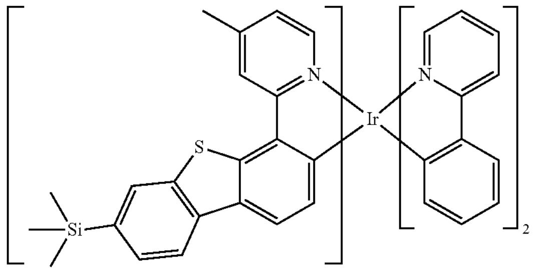
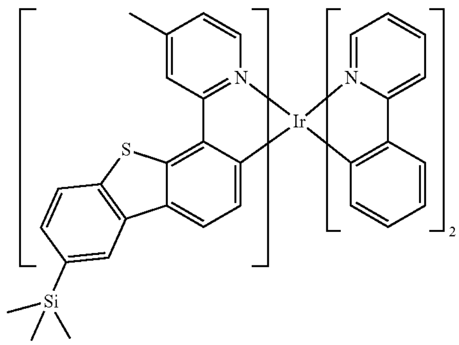
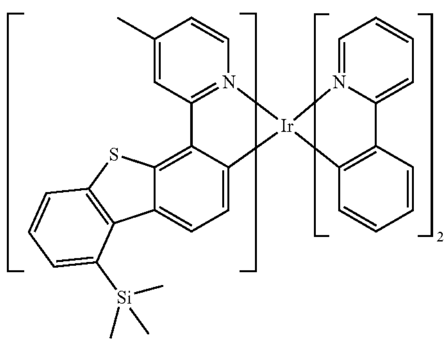
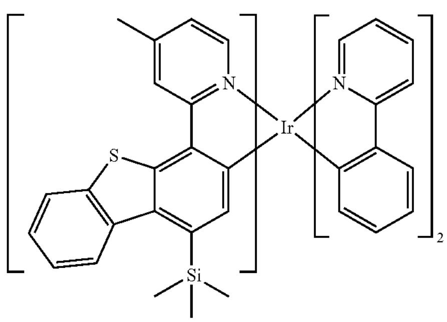
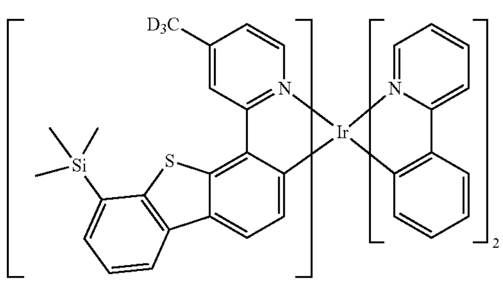
-continued
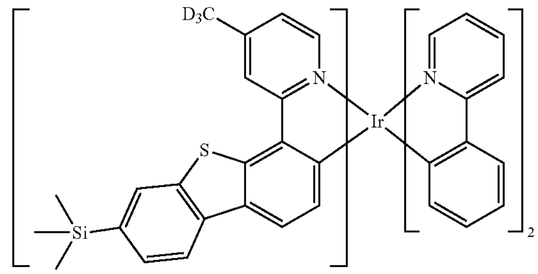
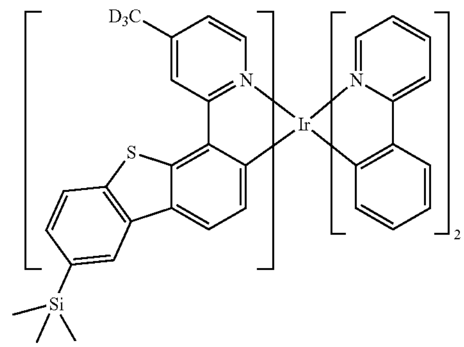
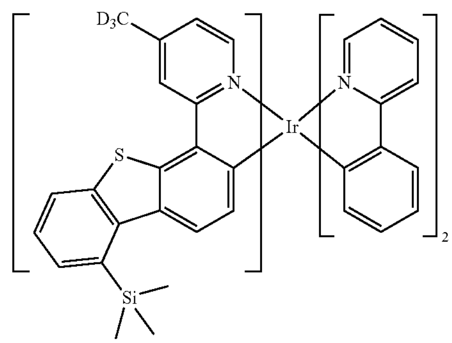
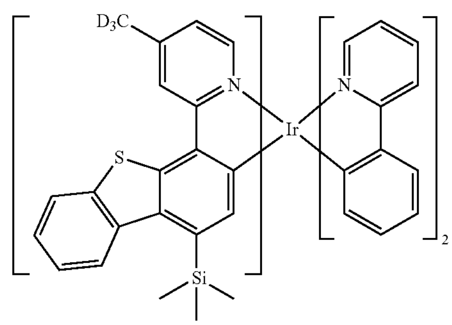
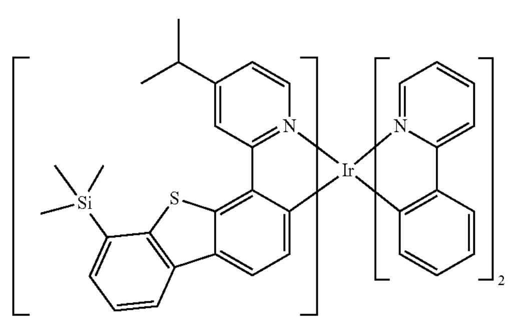

-continued
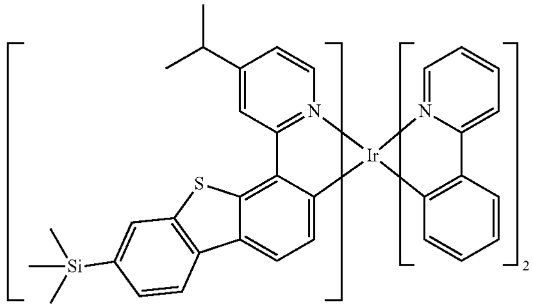
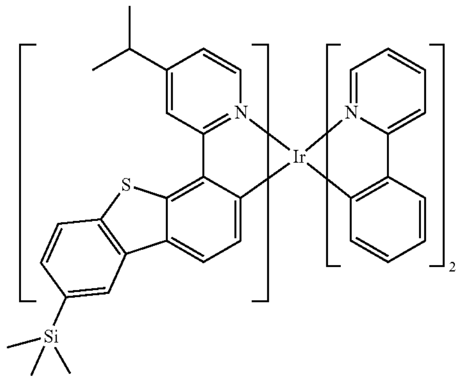
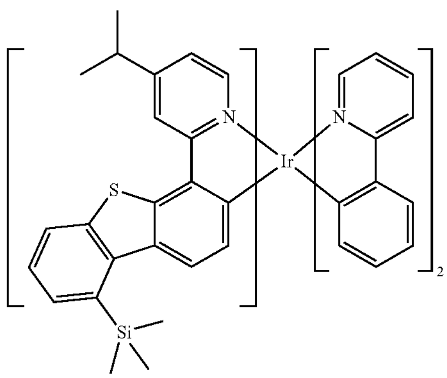
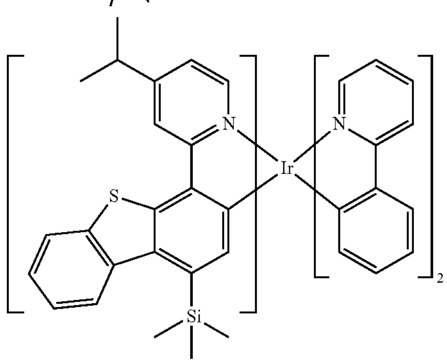
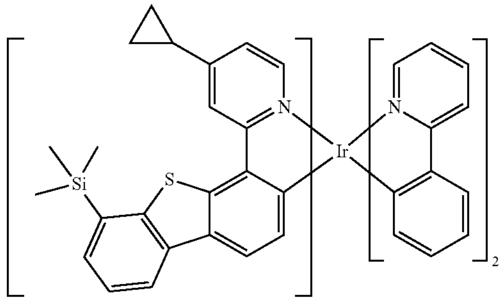
-continued
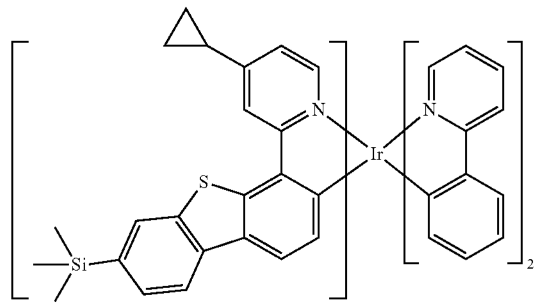
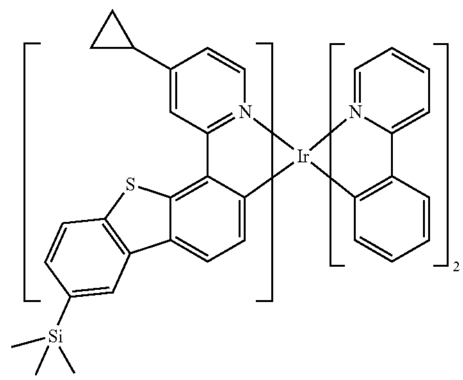
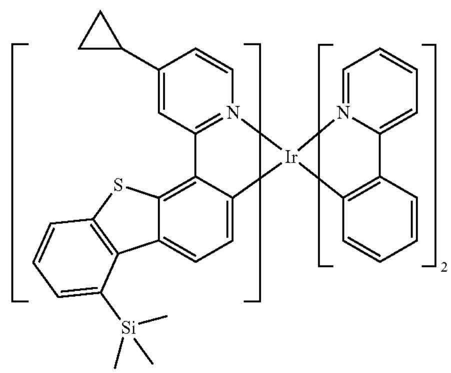
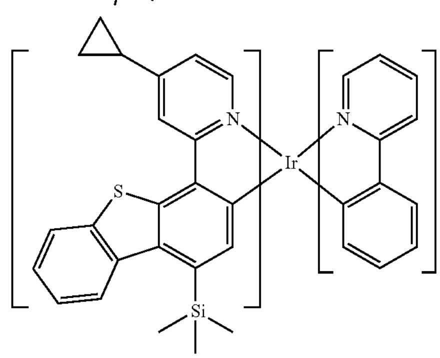
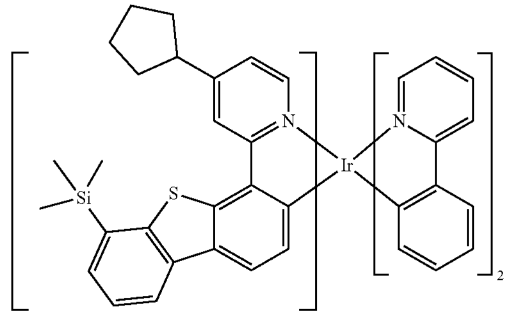

-continued
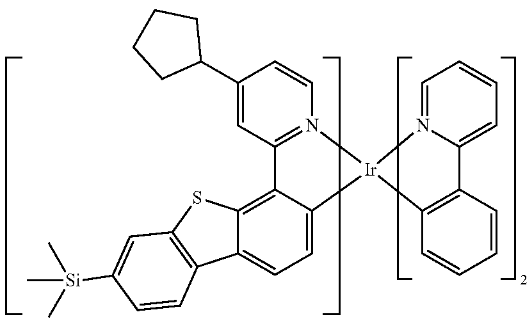
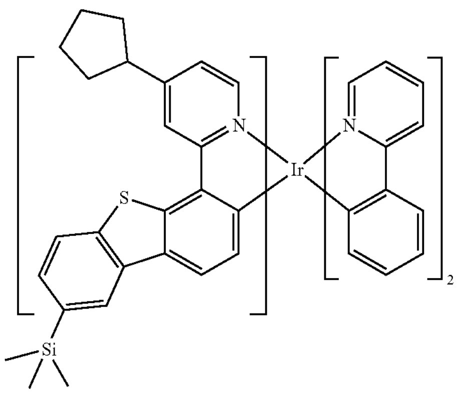
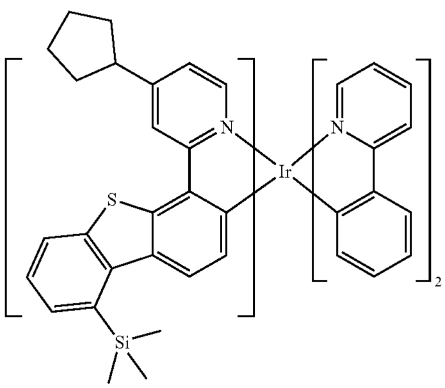
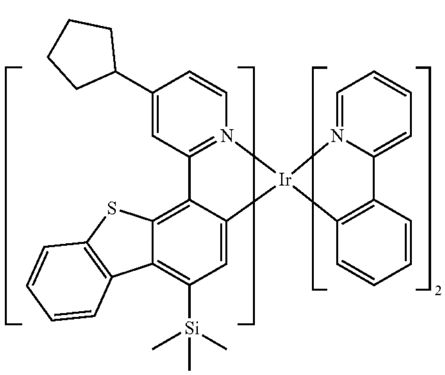
-continued
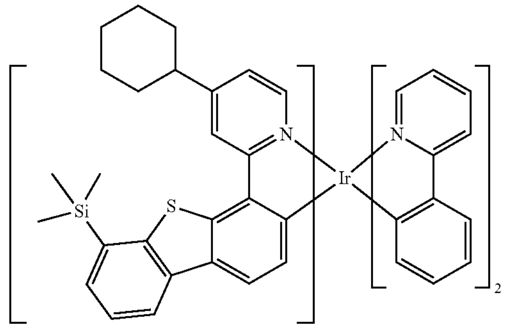
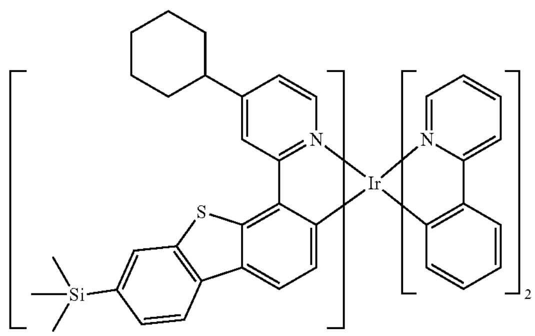
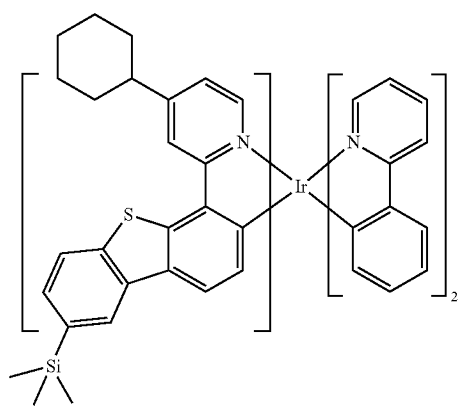
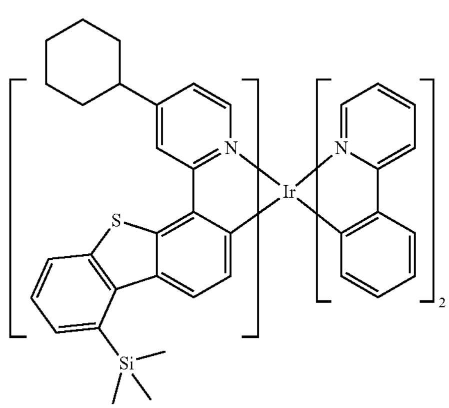

-continued
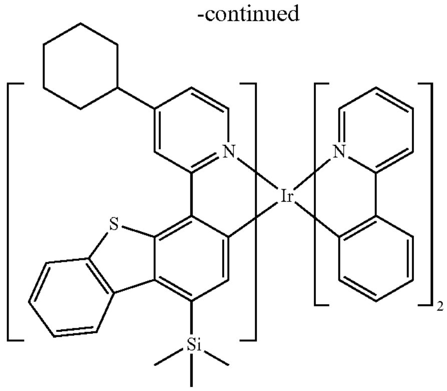
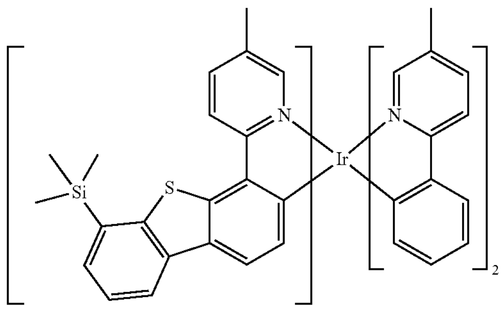
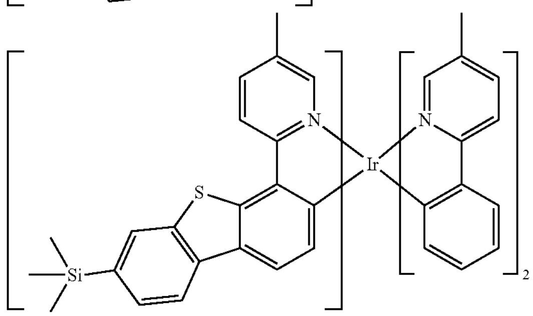
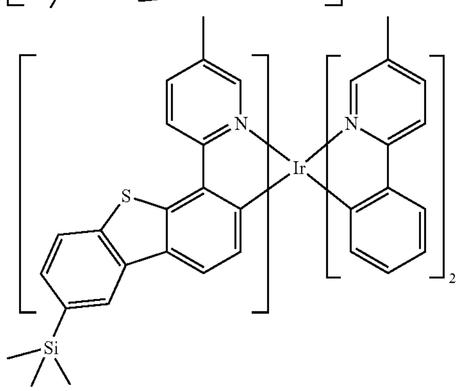
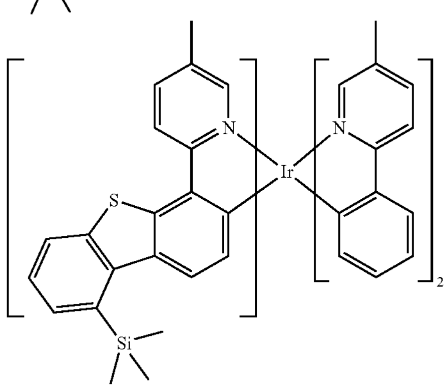
-continued
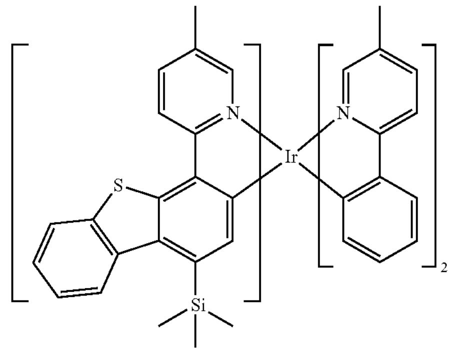
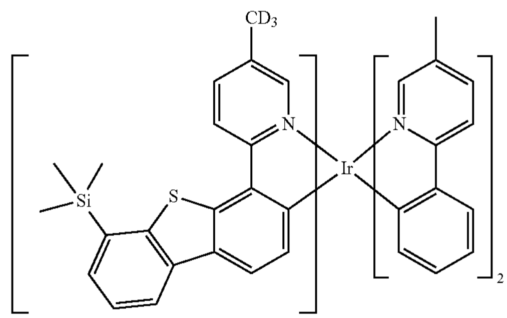
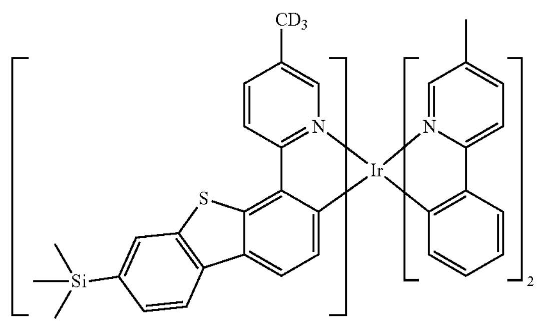
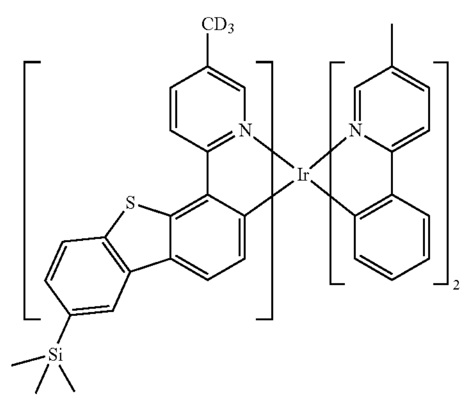

-continued
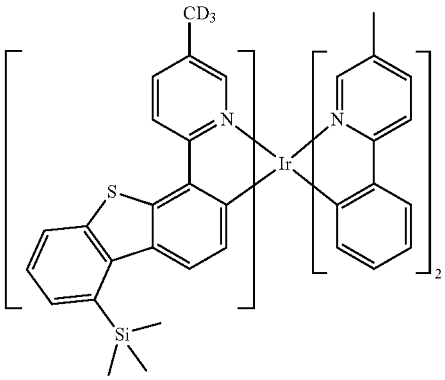
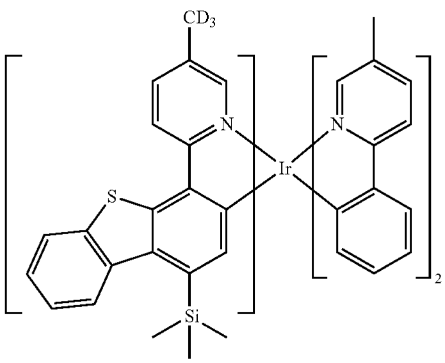
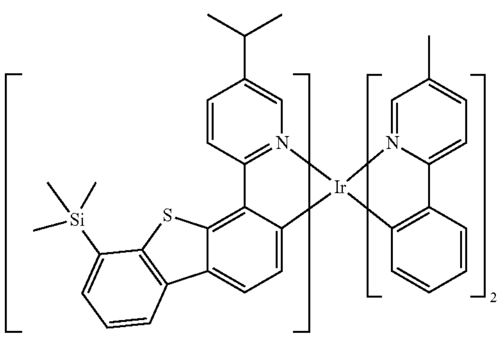
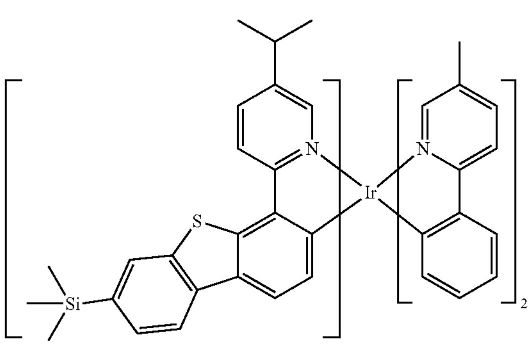
-continued
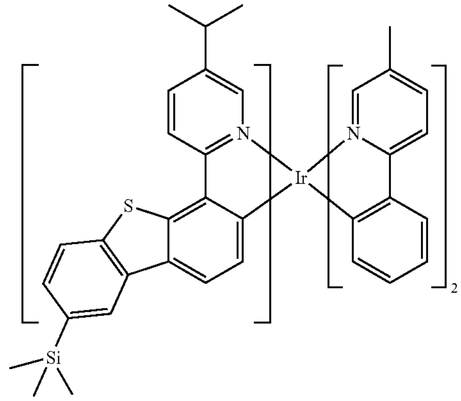
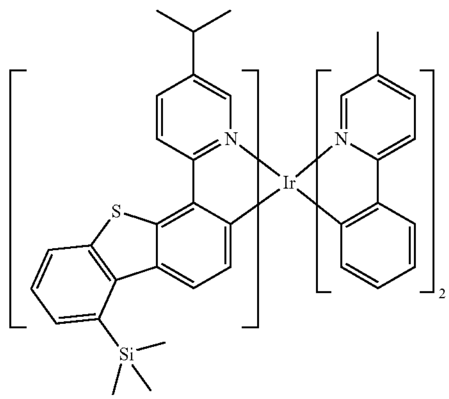
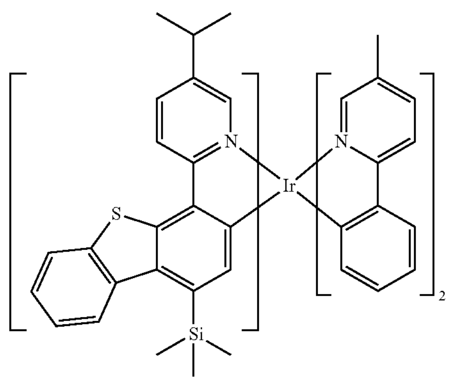
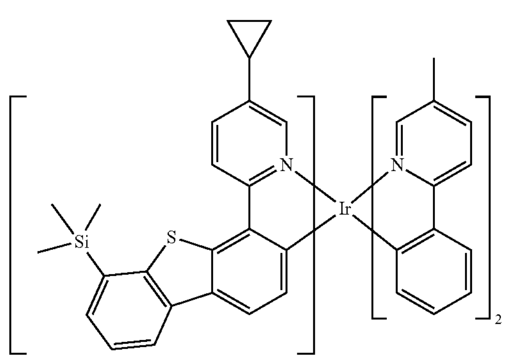

-continued
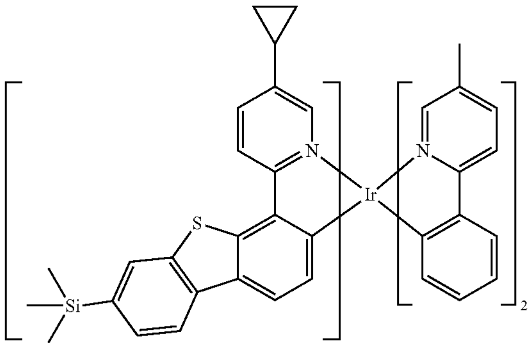
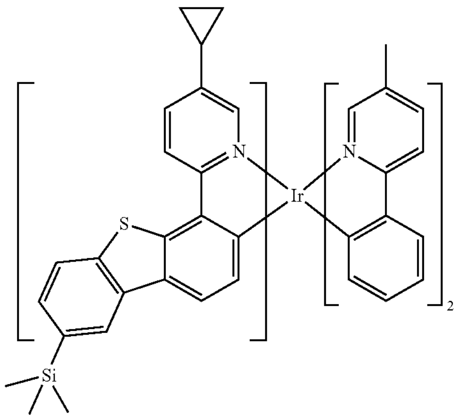
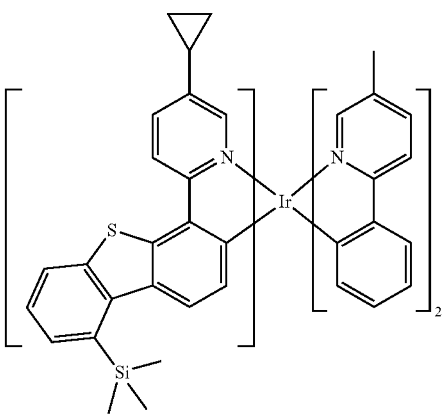
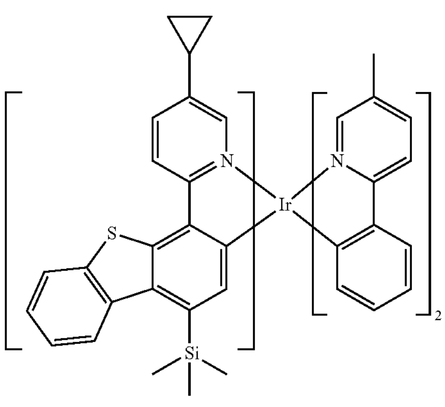
-continued
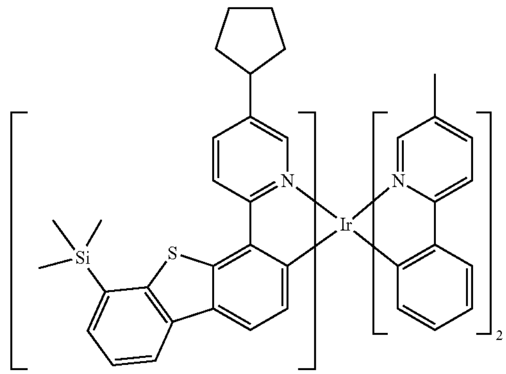
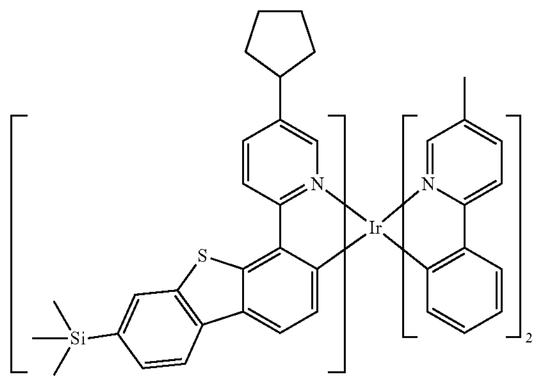
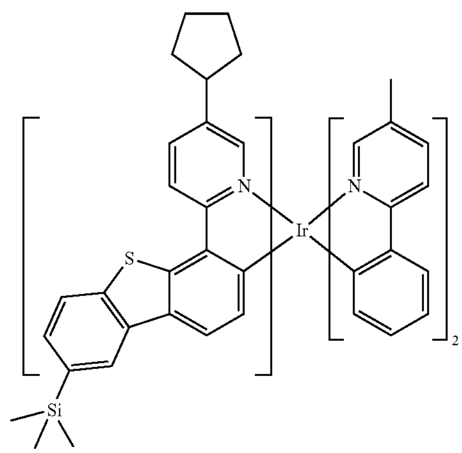
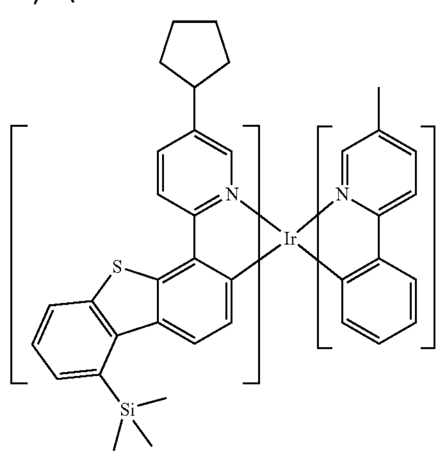

-continued
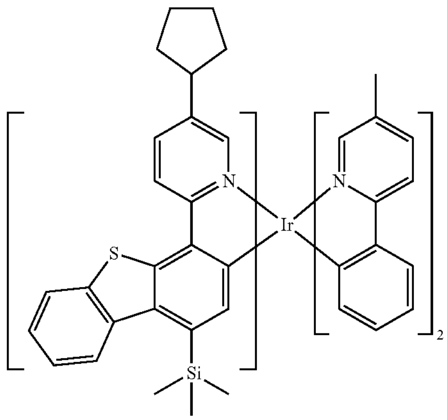
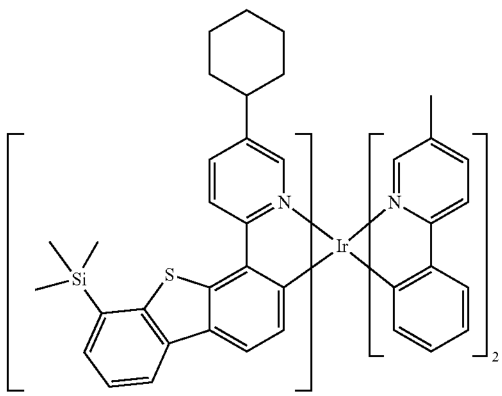
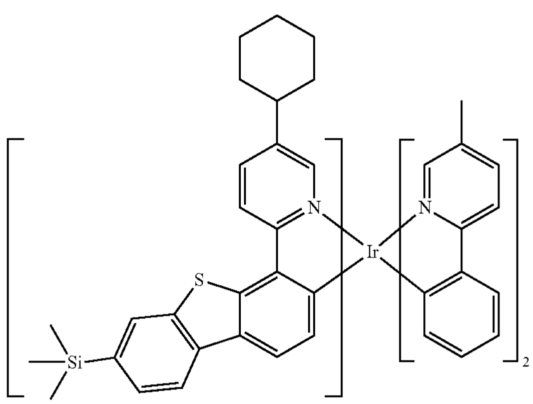
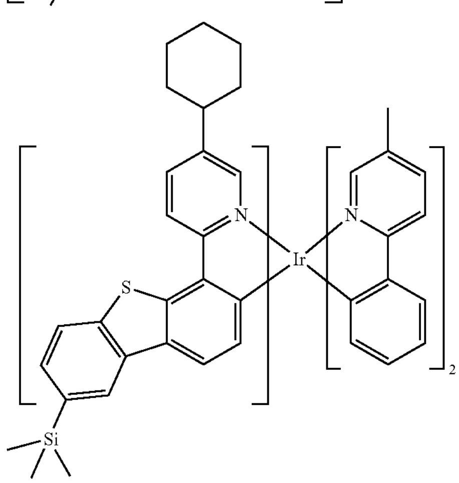
-continued
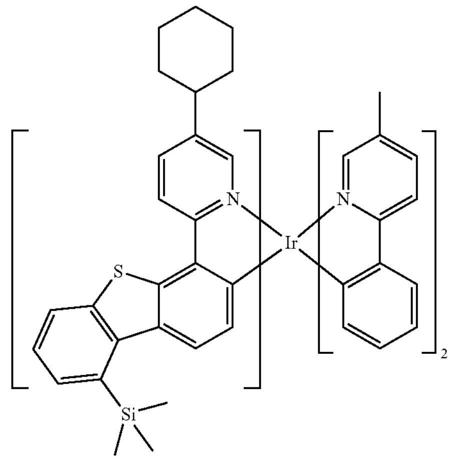
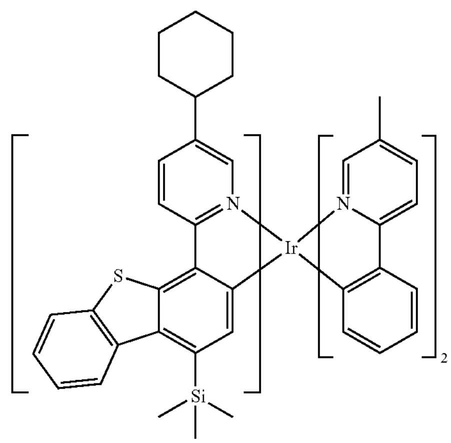
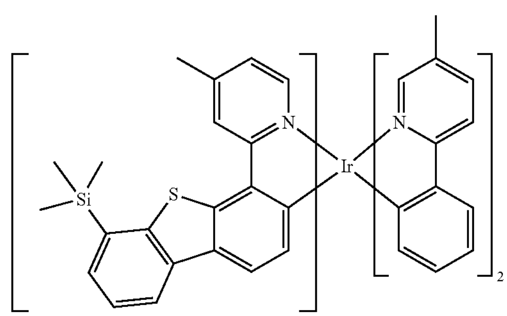
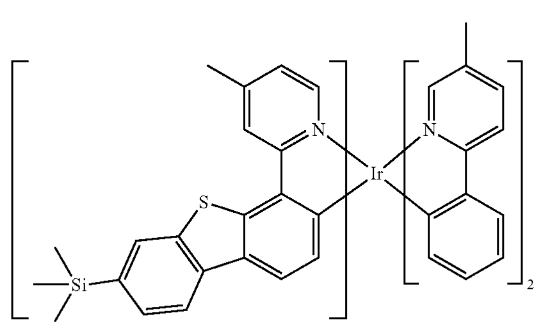

-continued
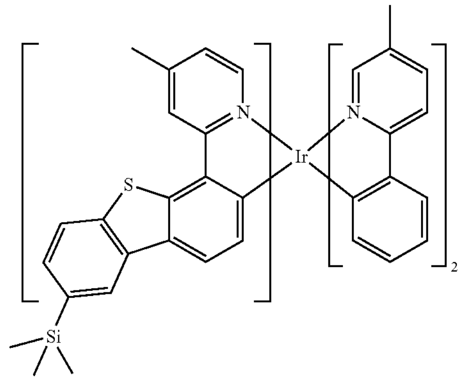
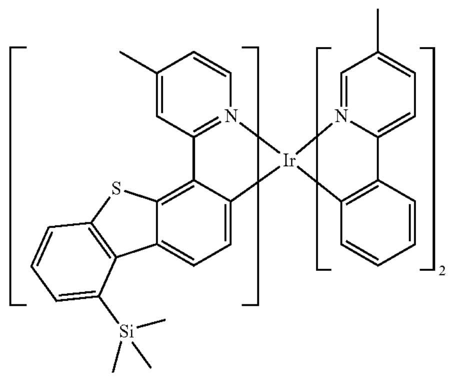
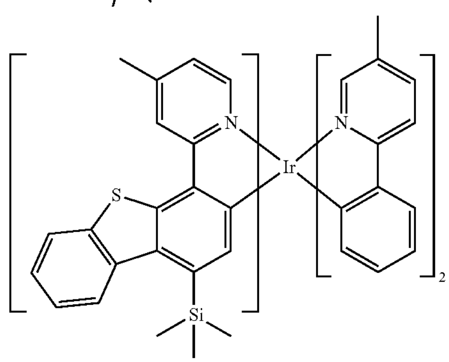
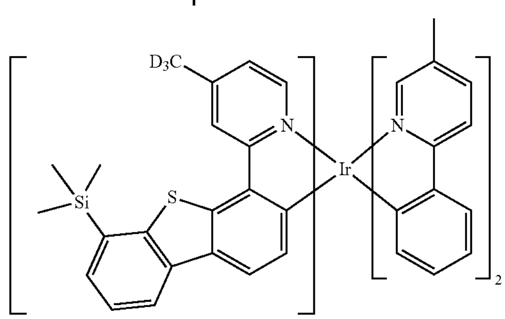
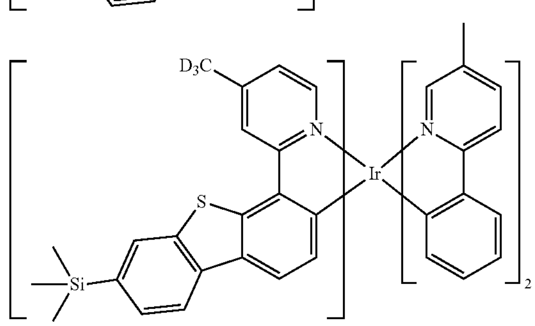
-continued
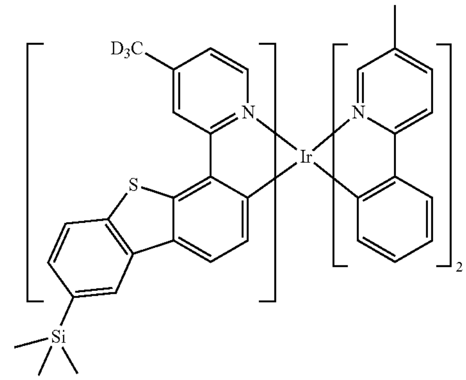
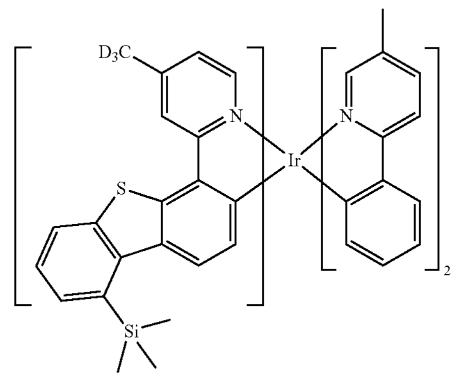
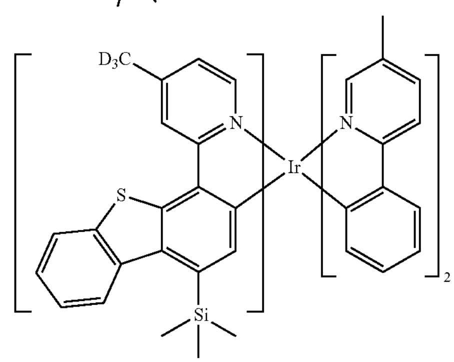
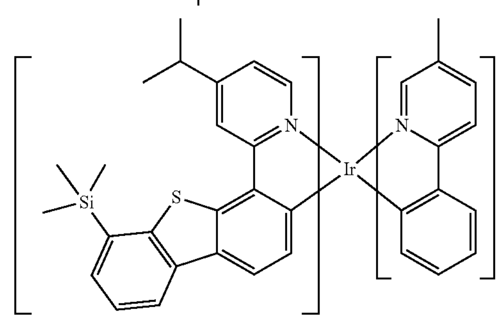
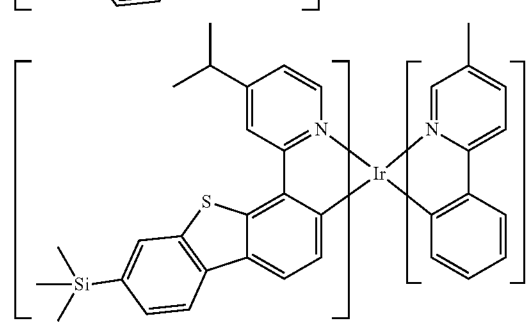

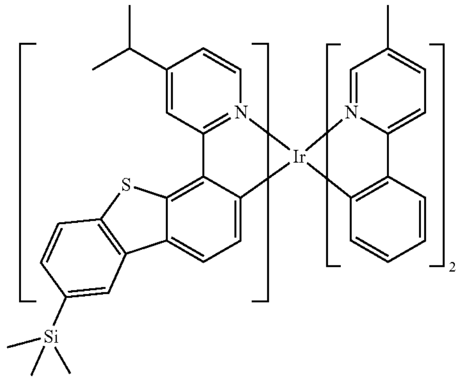
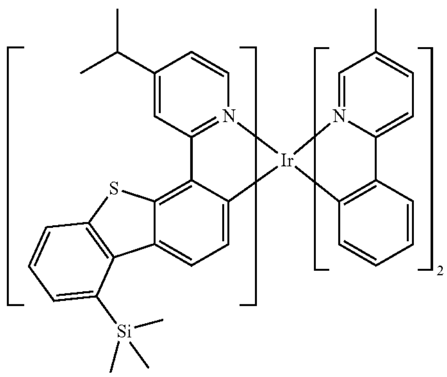
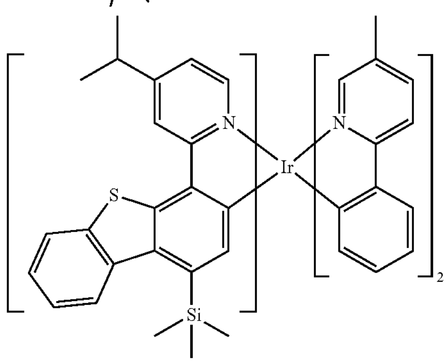
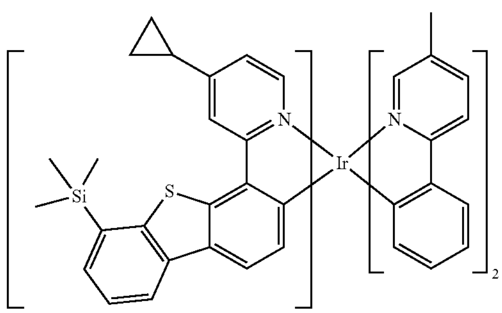
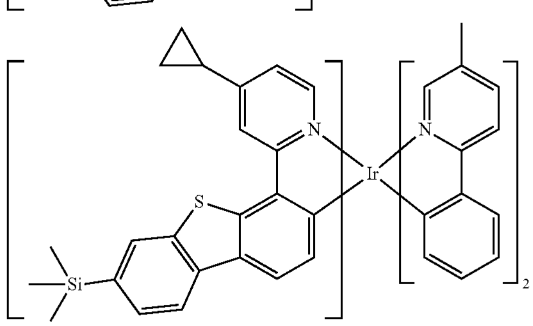
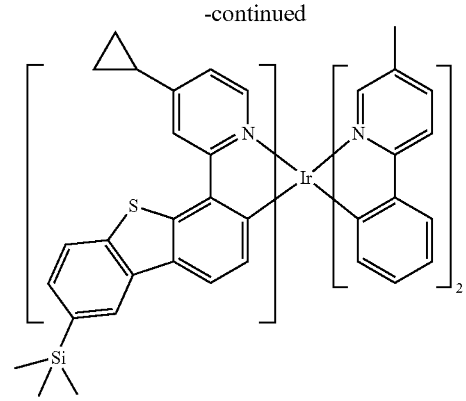
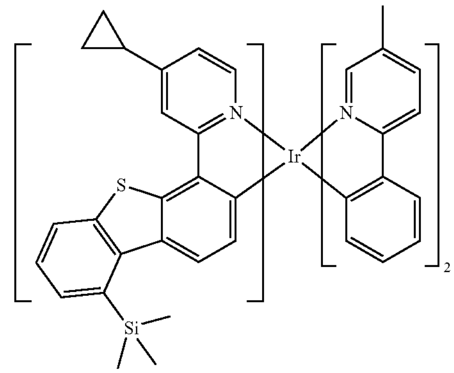
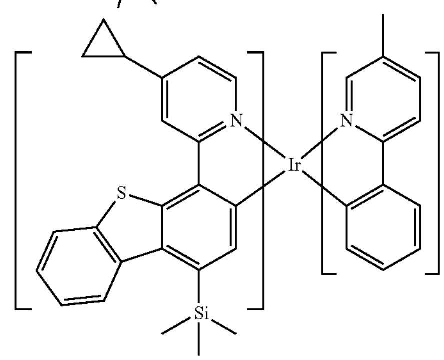
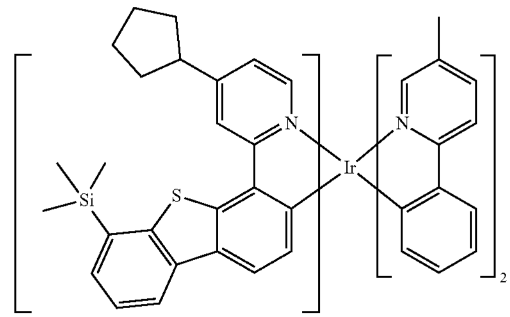
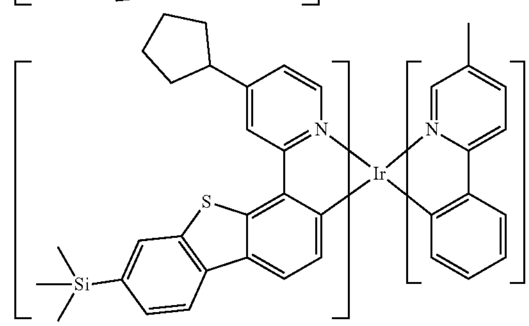

-continued
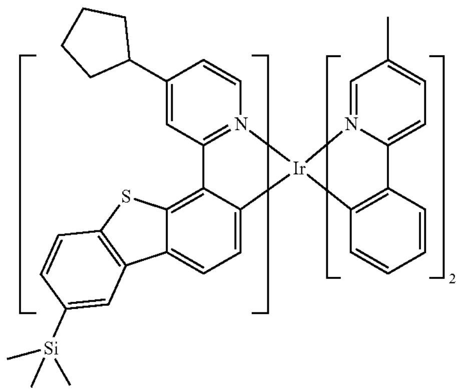
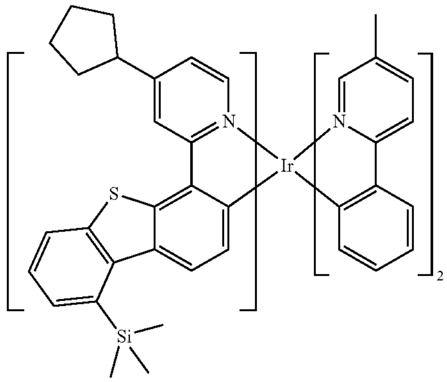
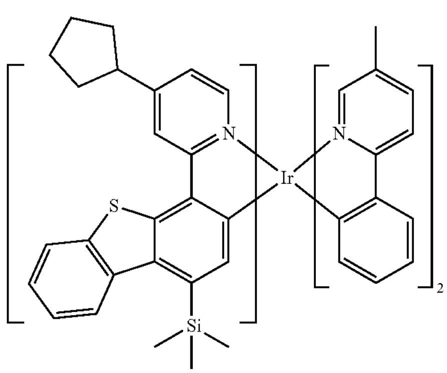
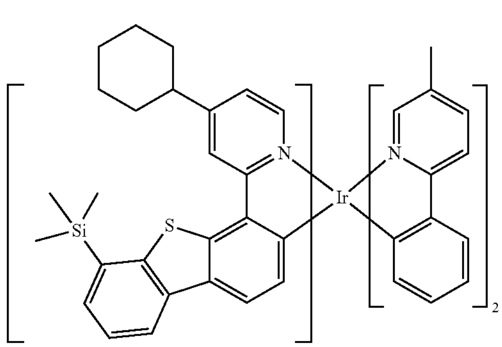
-continued
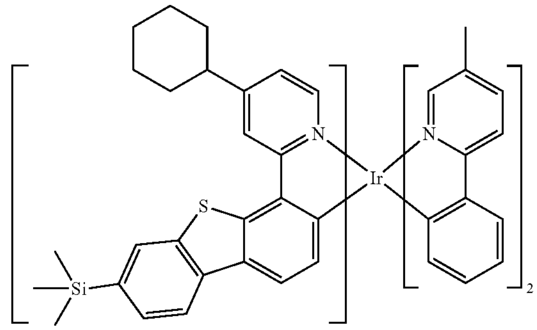
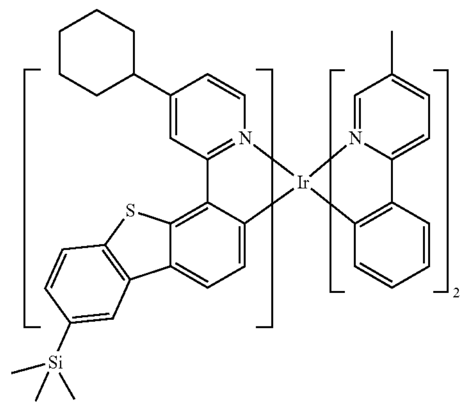
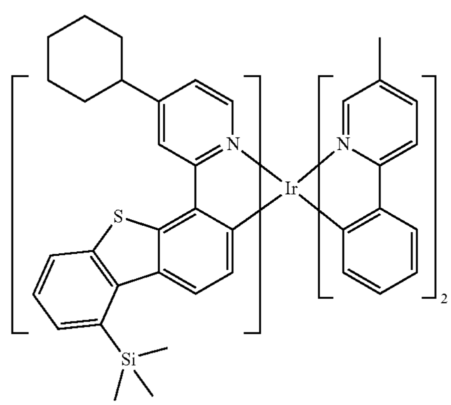
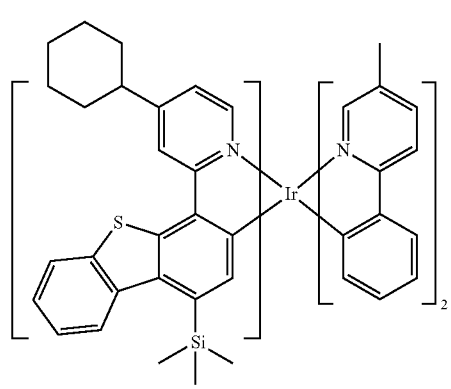

-continued
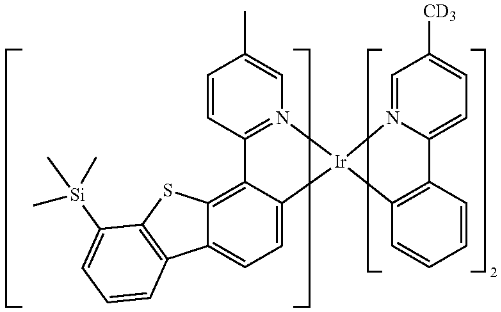
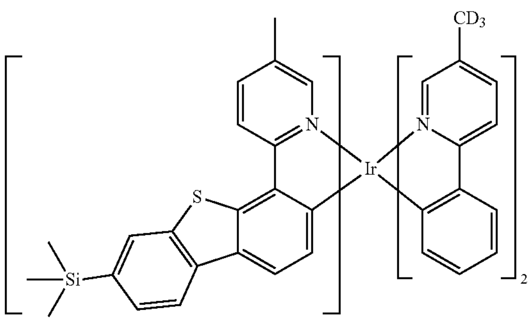
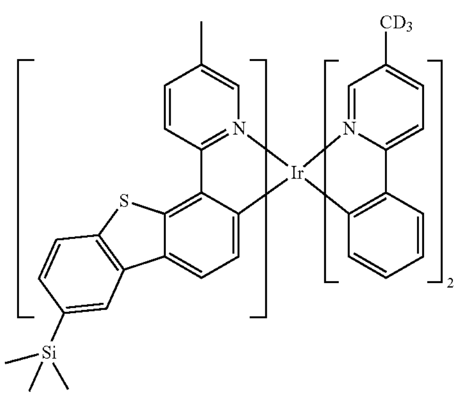
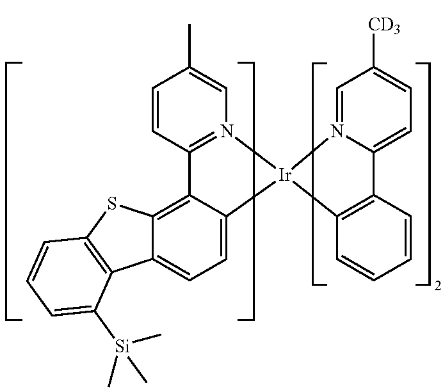
-continued
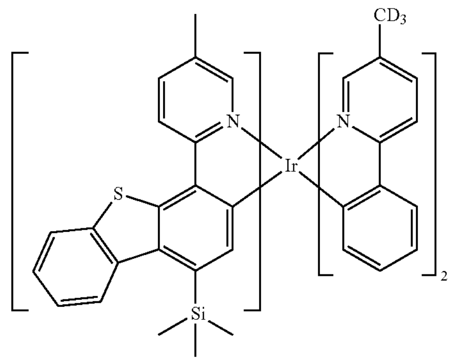
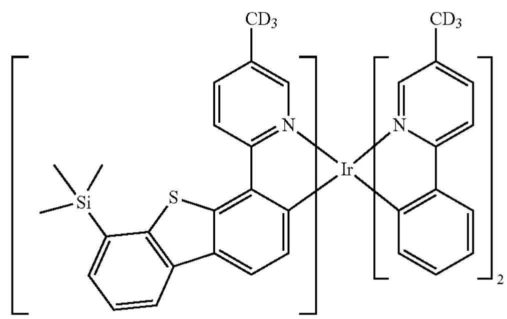
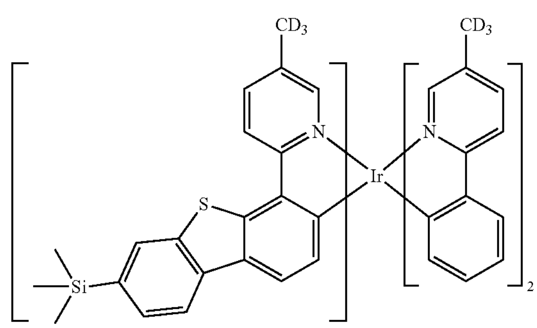
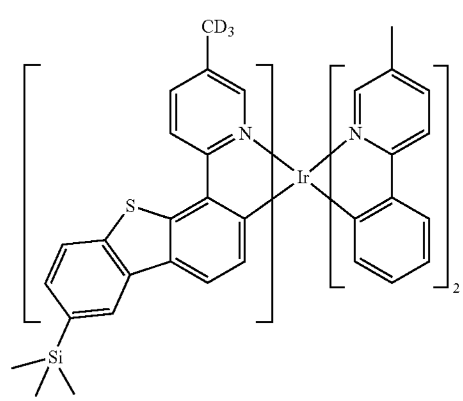

-continued
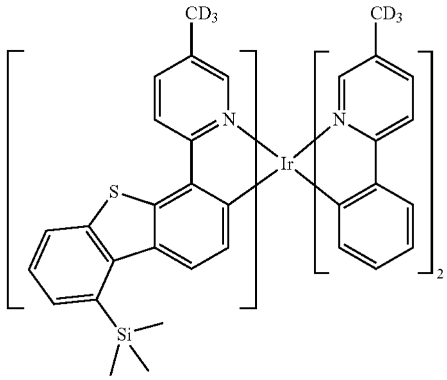
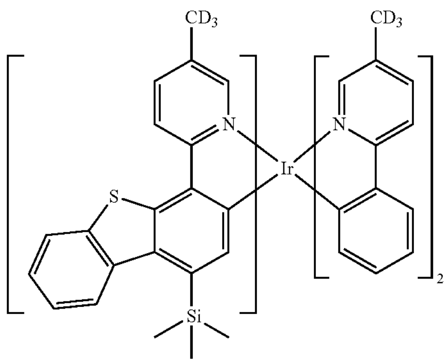
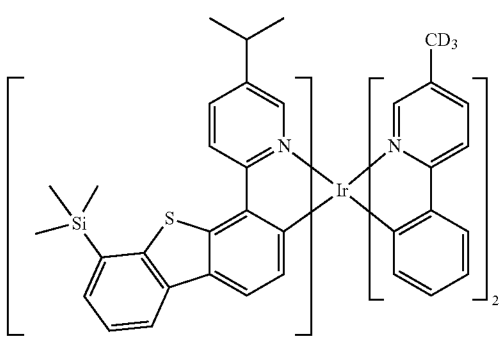
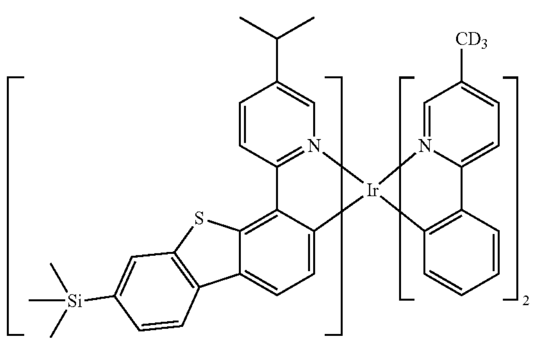
-continued
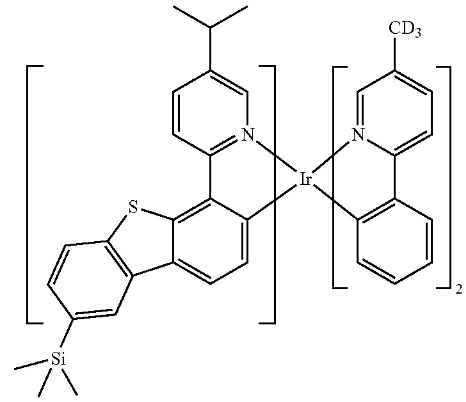
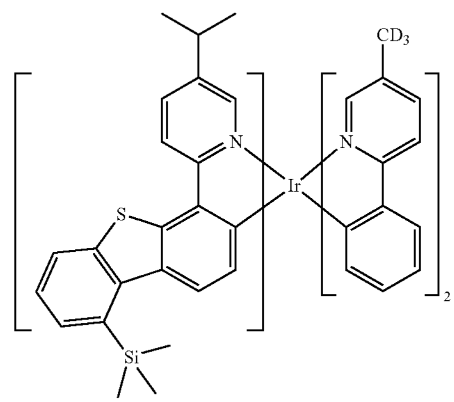
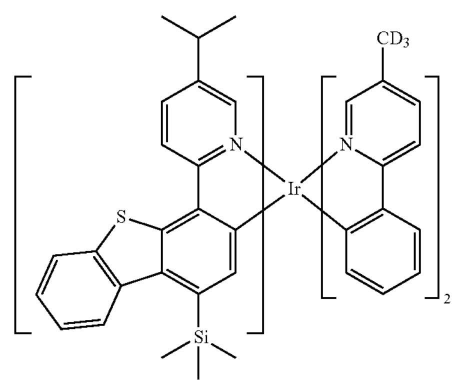
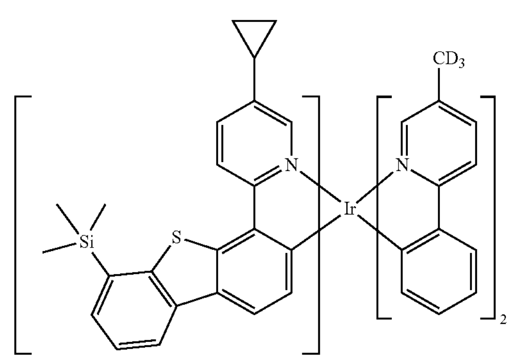

-continued
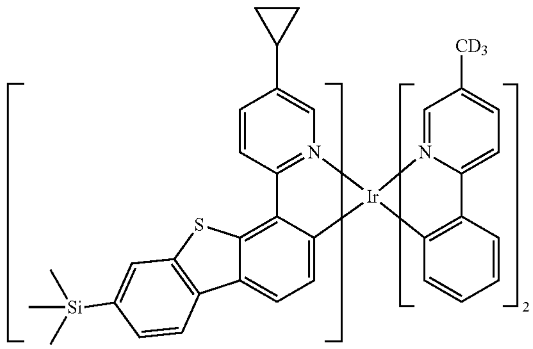
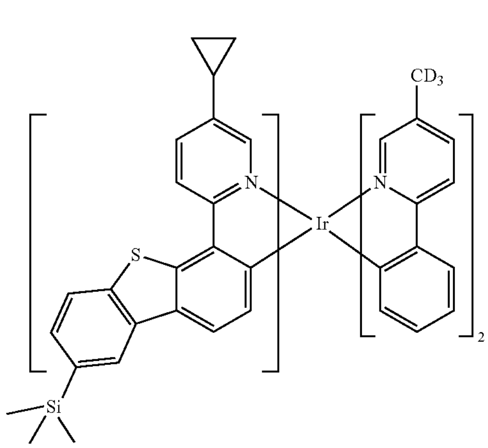
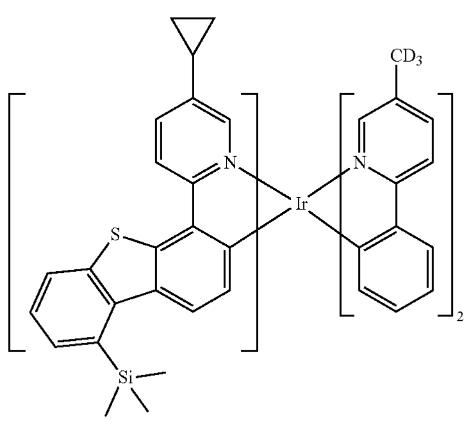
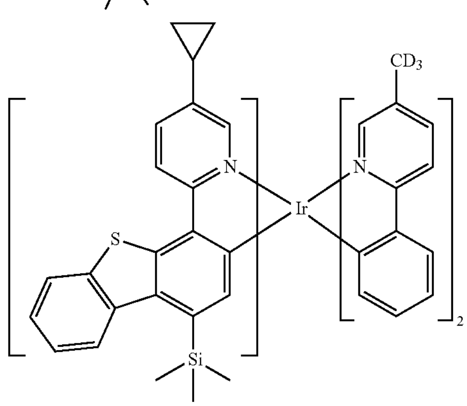
-continued
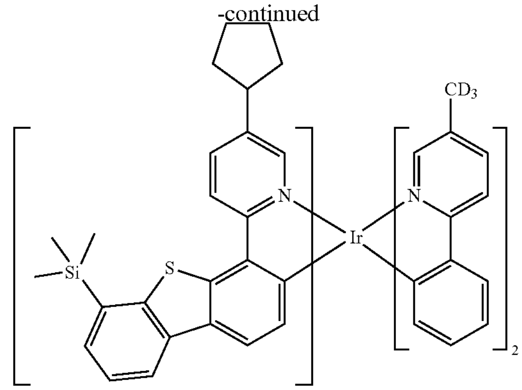
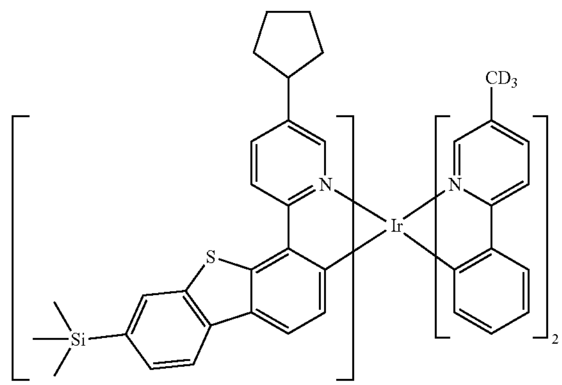
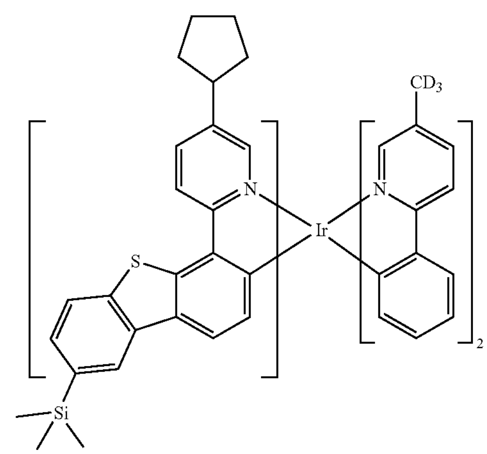
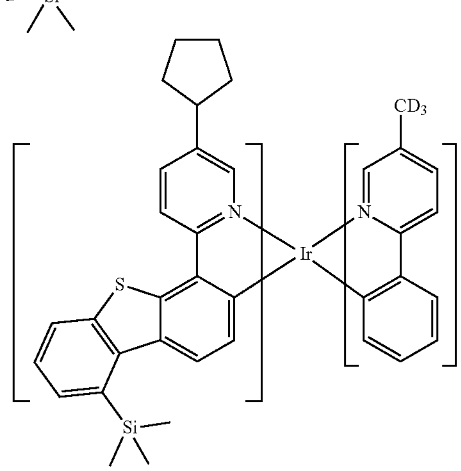

-continued
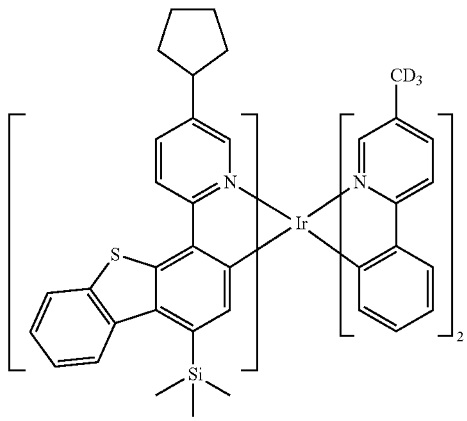
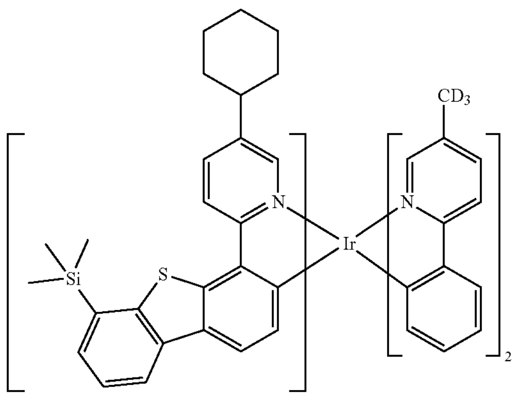
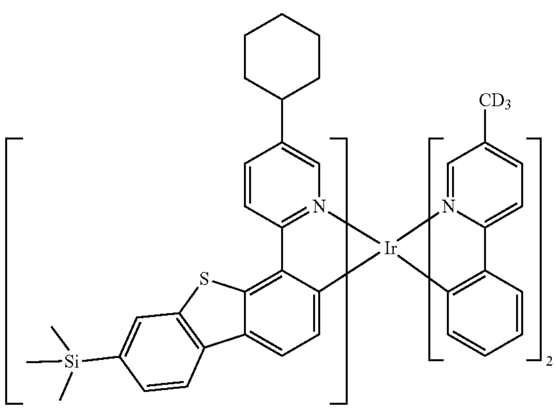
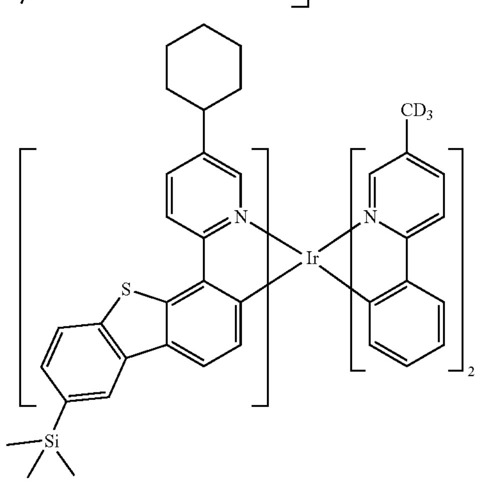
-continued
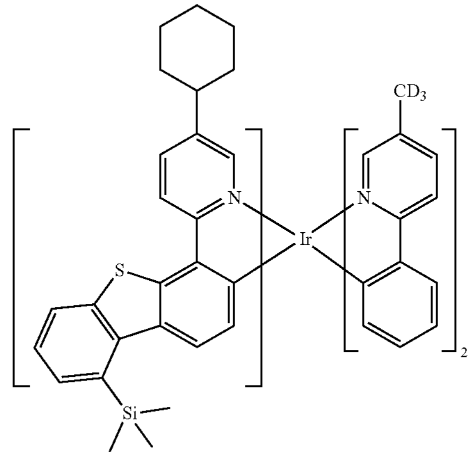
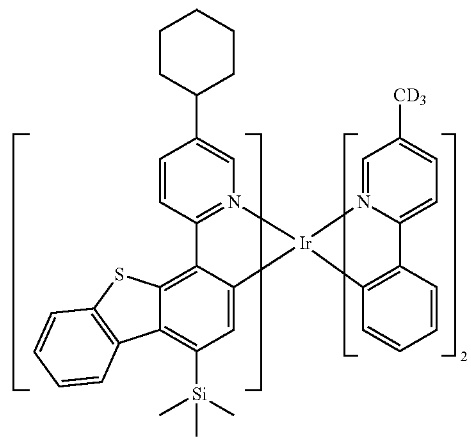
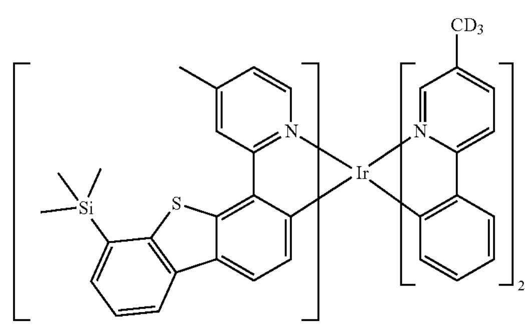
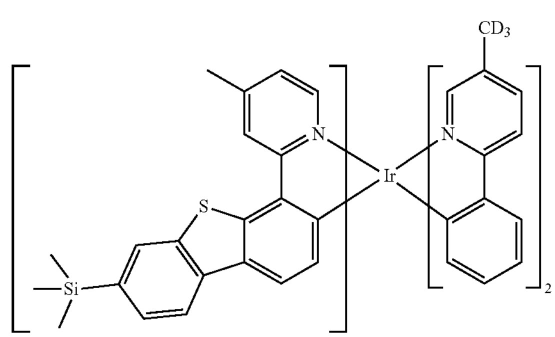

-continued
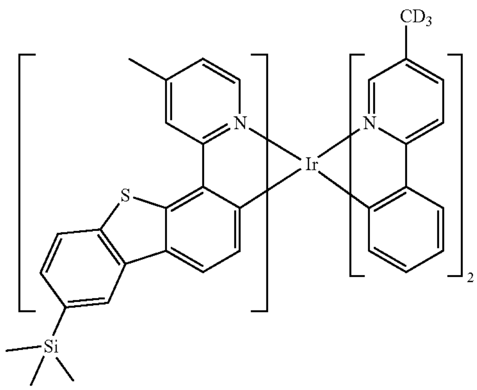
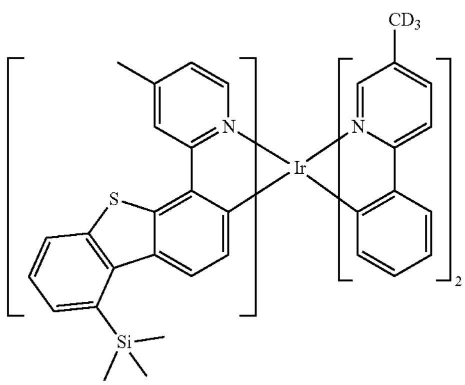
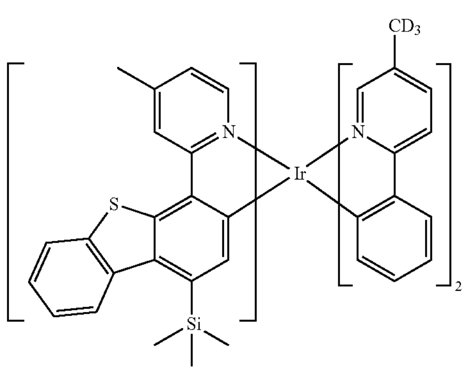
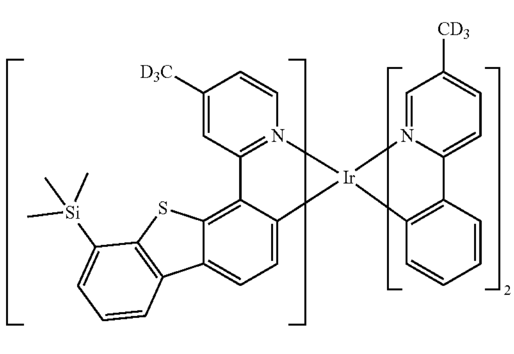
-continued
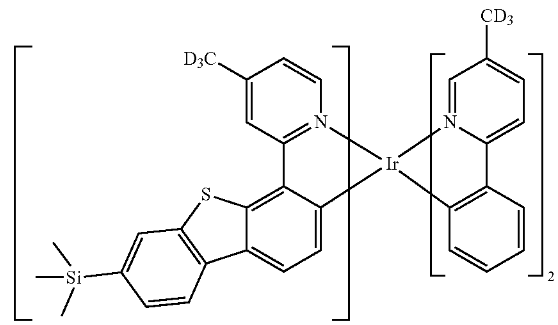
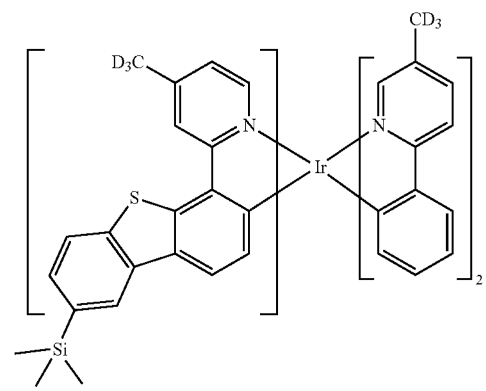
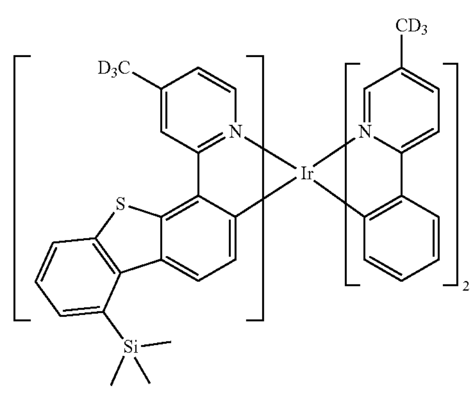
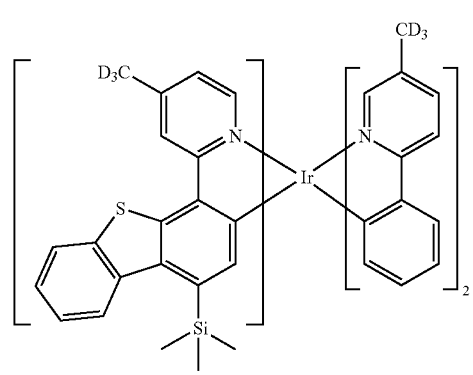

-continued
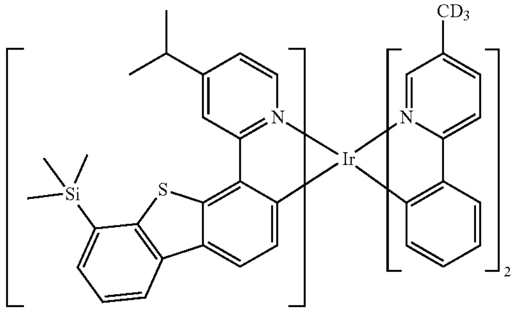
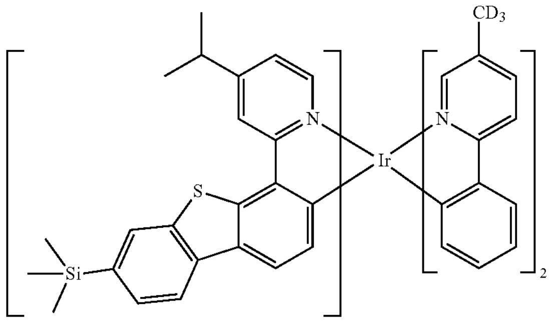
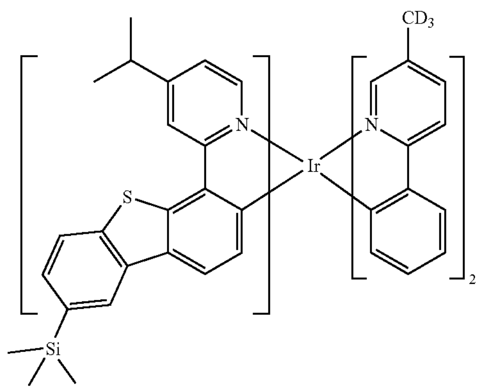
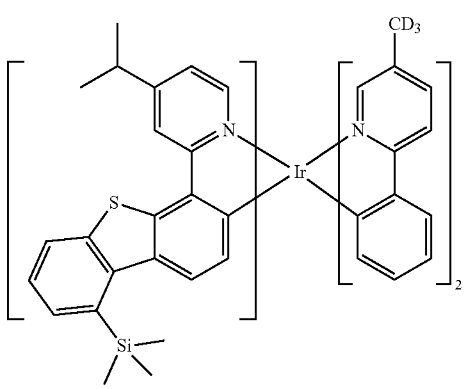
-continued
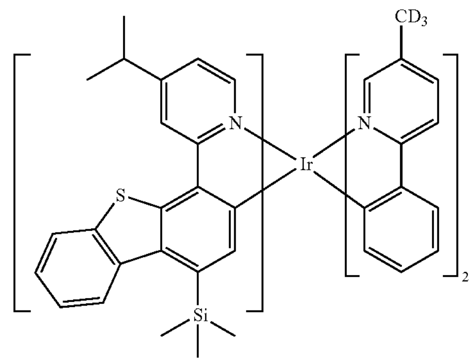
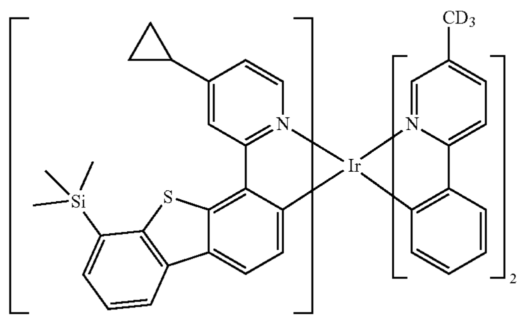
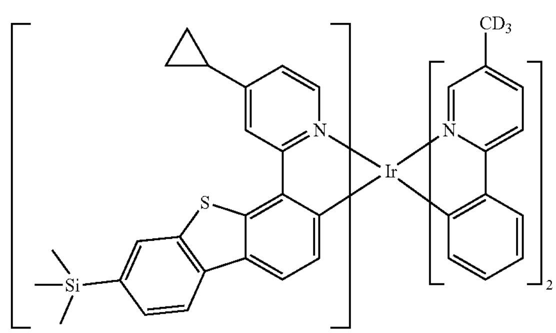
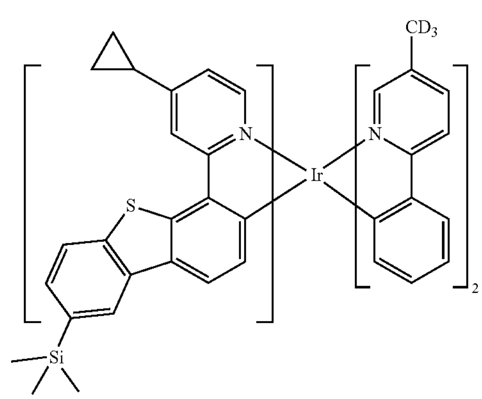

-continued
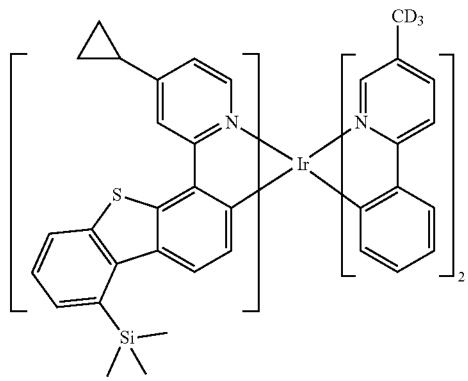
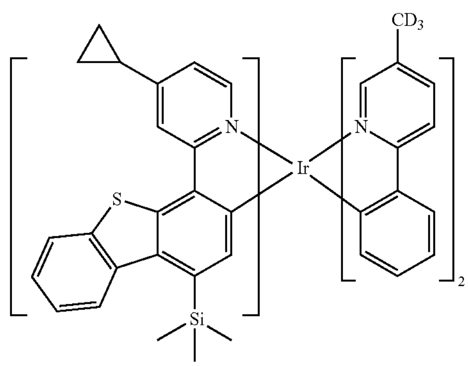
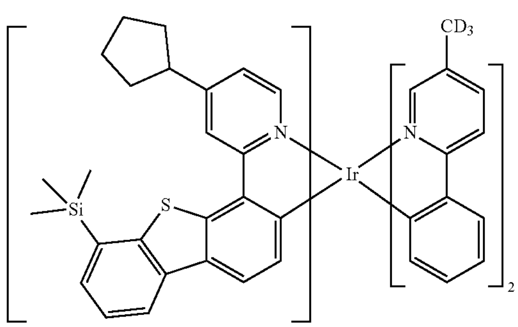
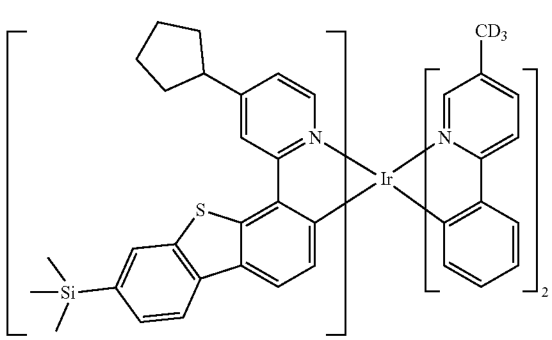
-continued
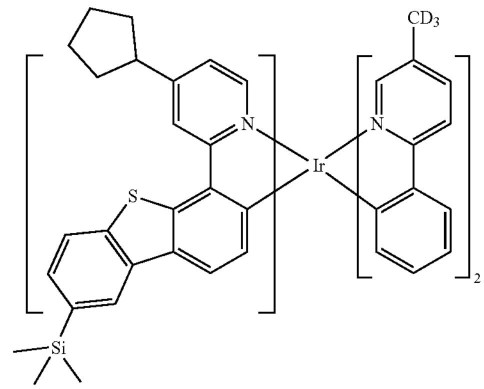
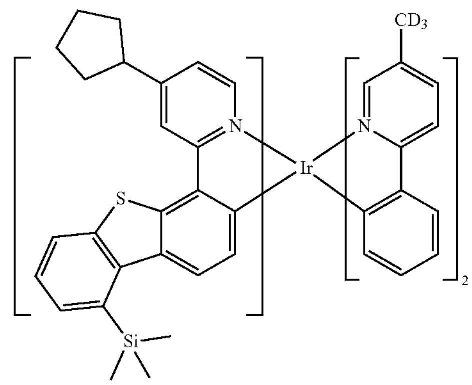
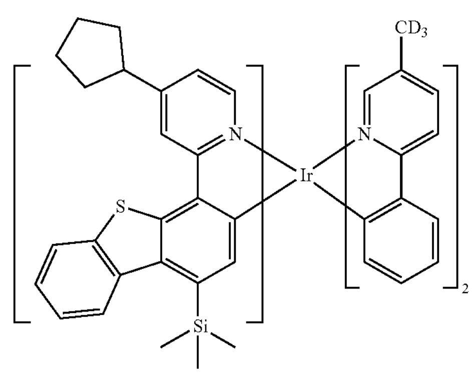
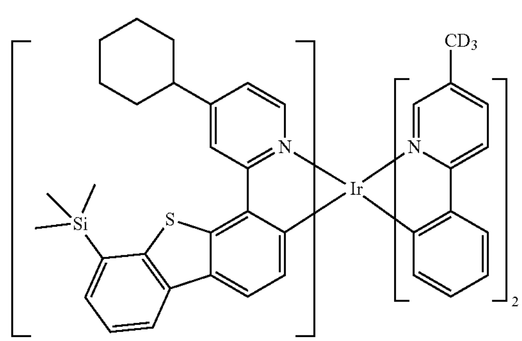

-continued
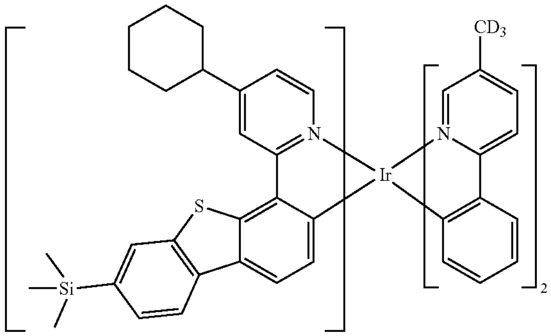
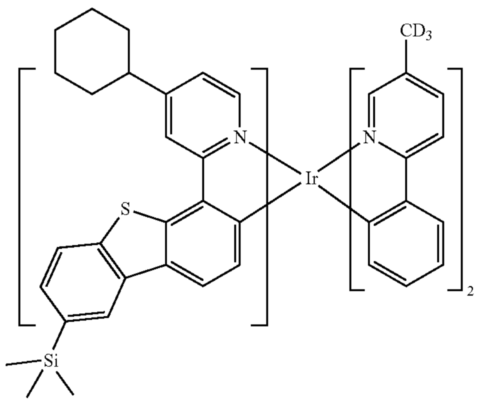
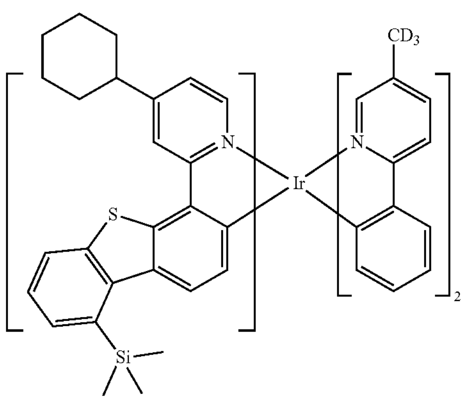
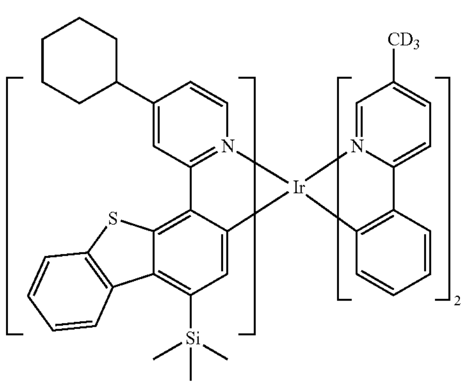
-continued
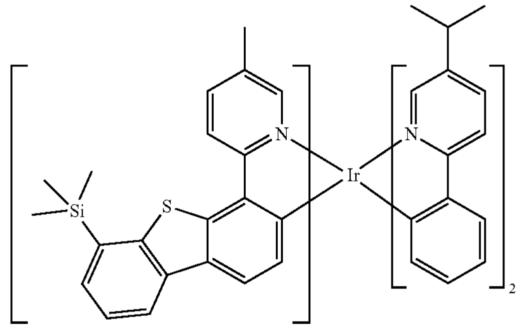
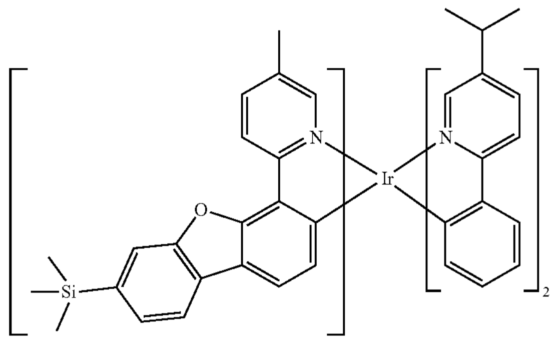
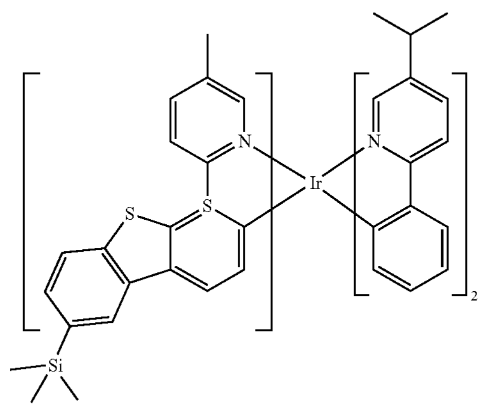
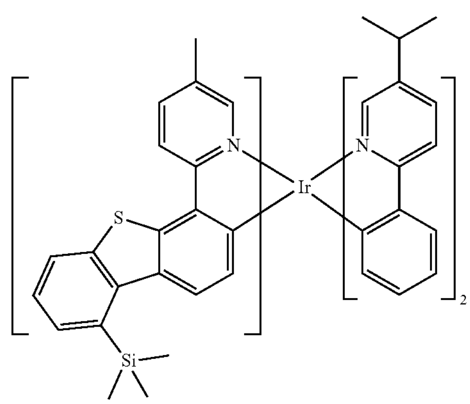

-continued
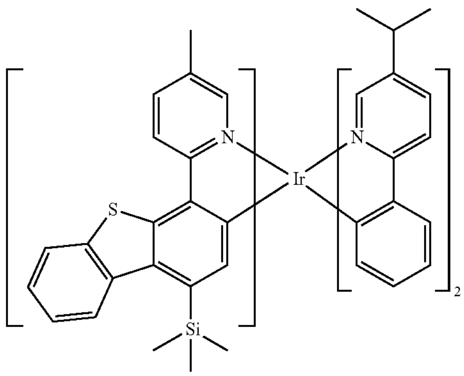
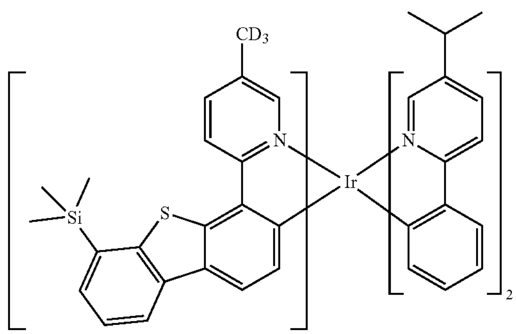
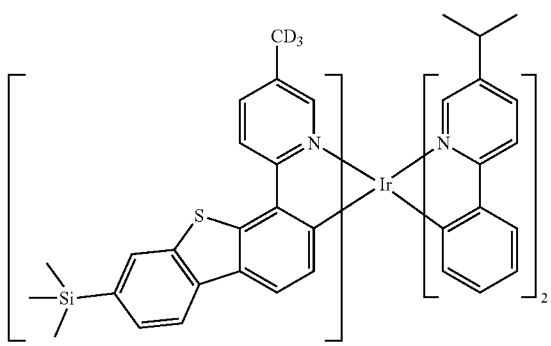
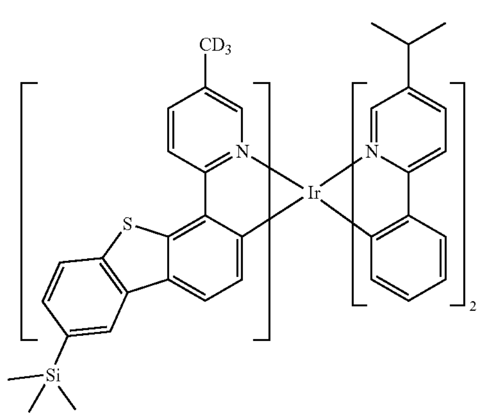
-continued
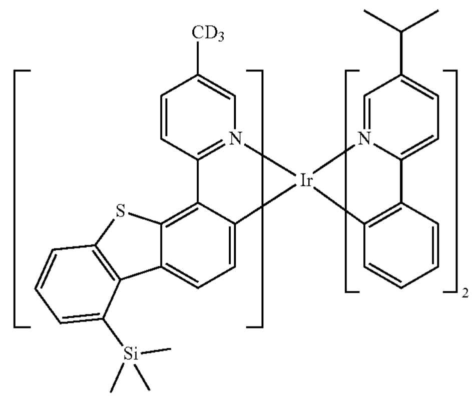
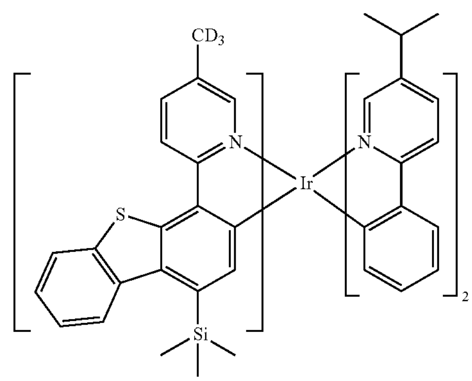
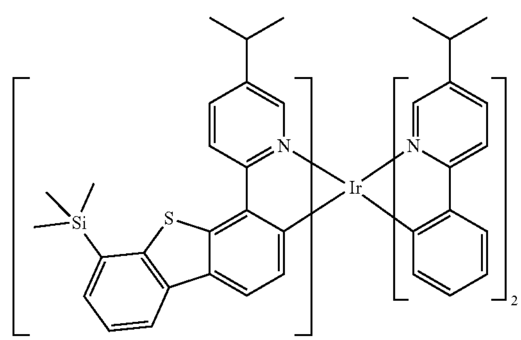
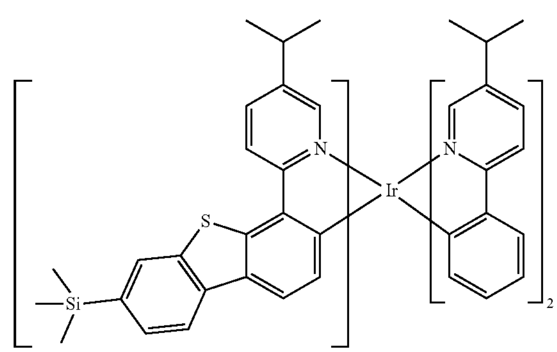

-continued
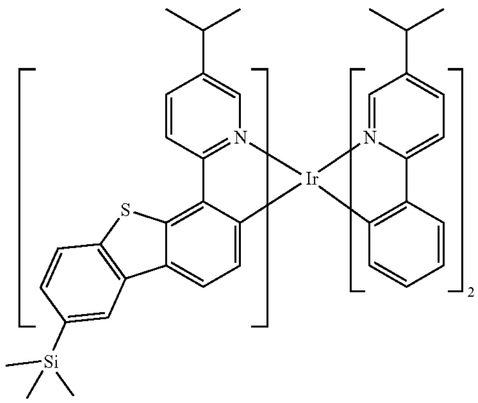
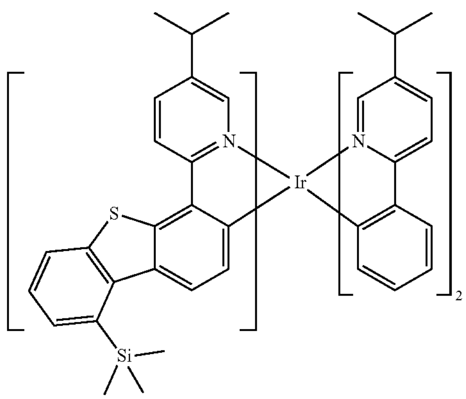
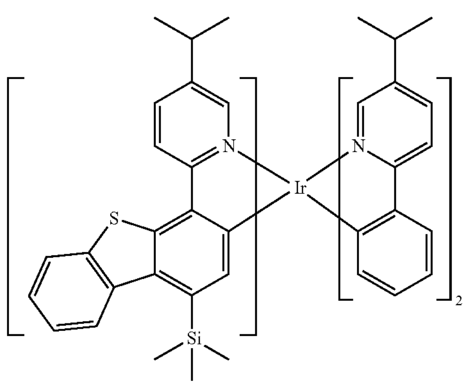
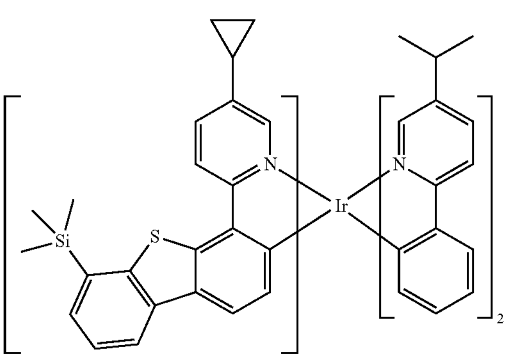
-continued
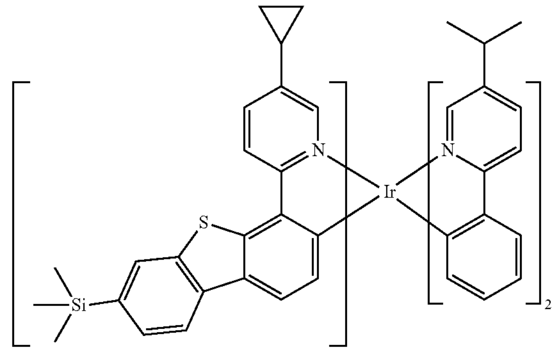
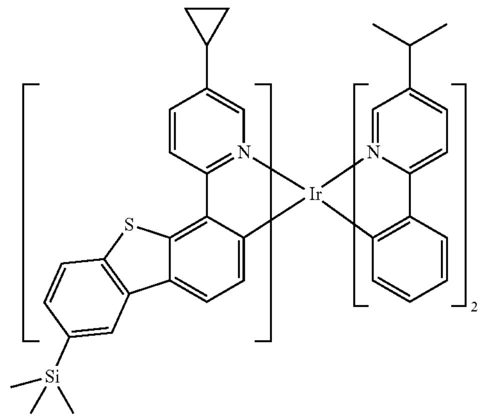
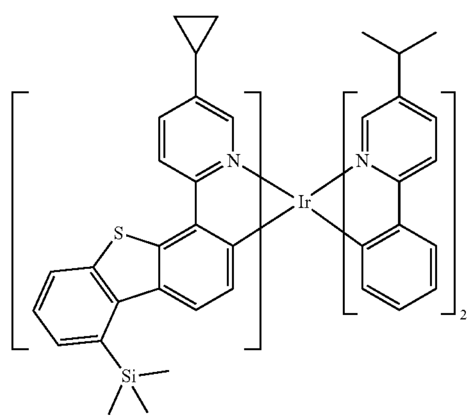
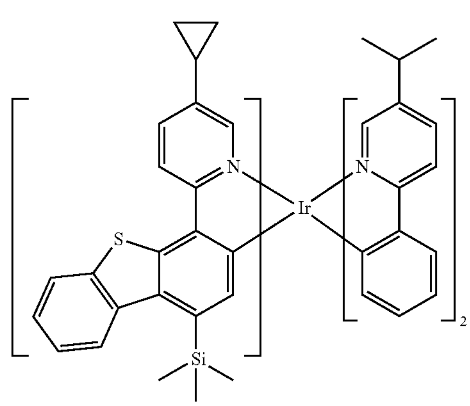

-continued
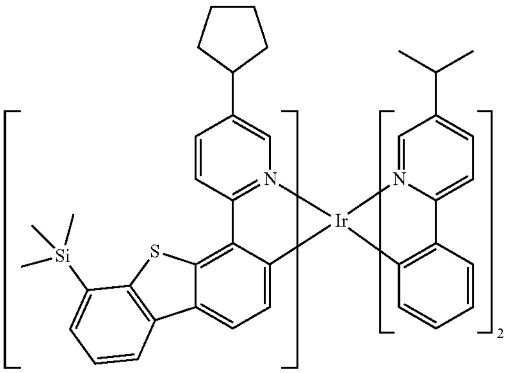
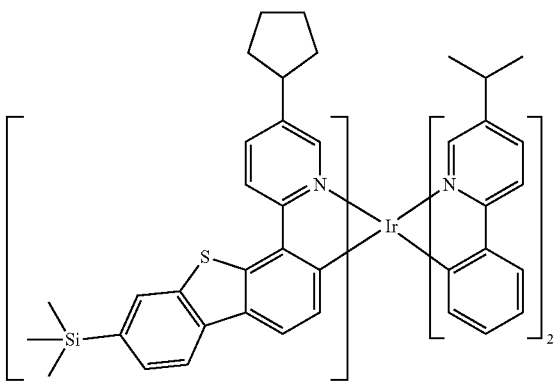
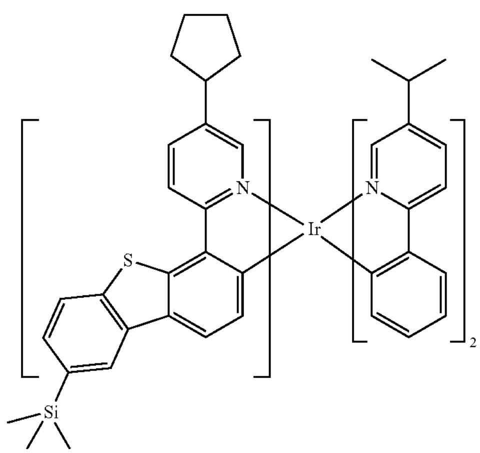
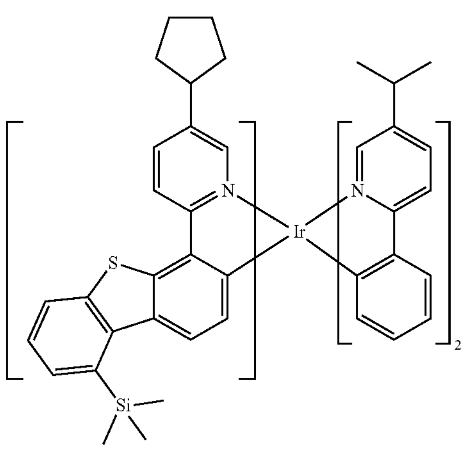
-continued
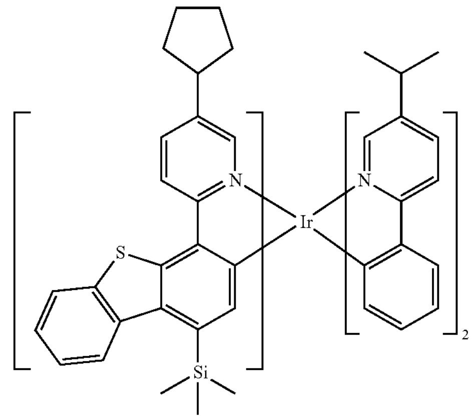
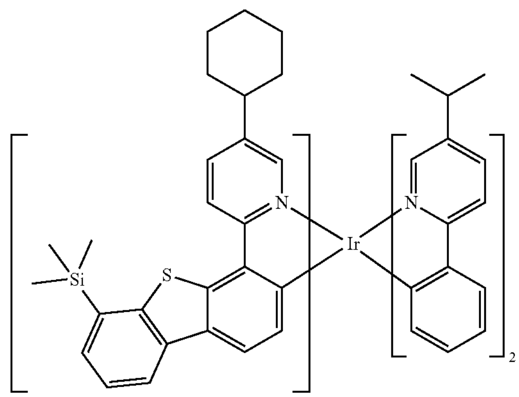
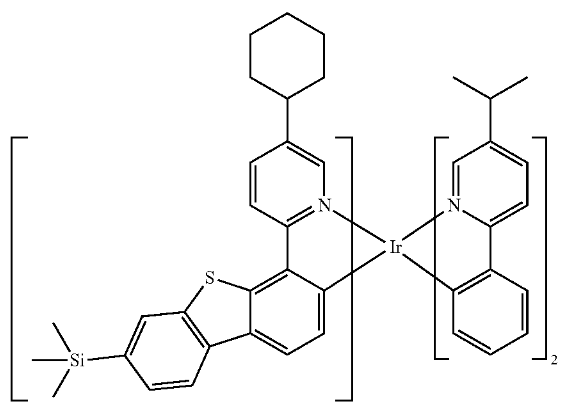
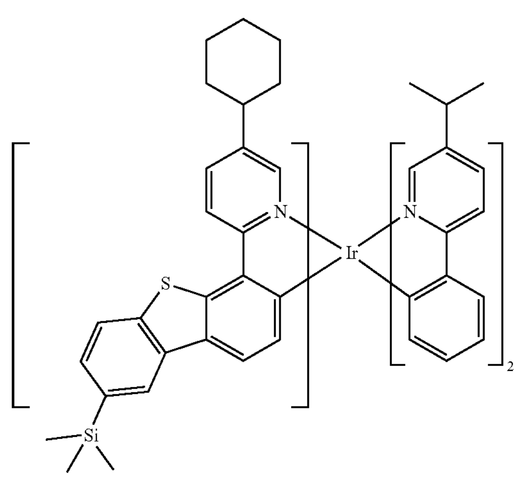

-continued
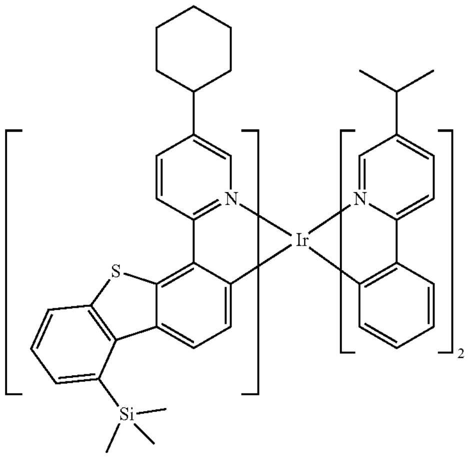
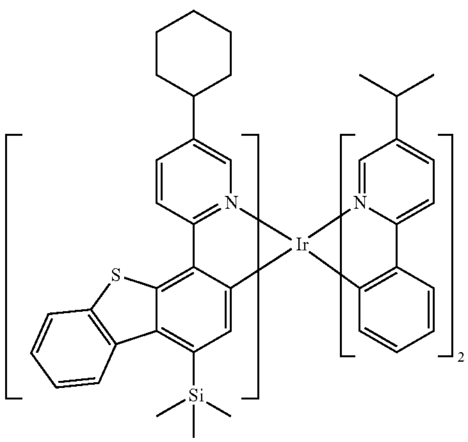
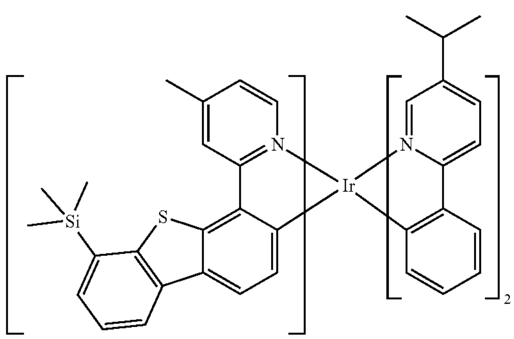
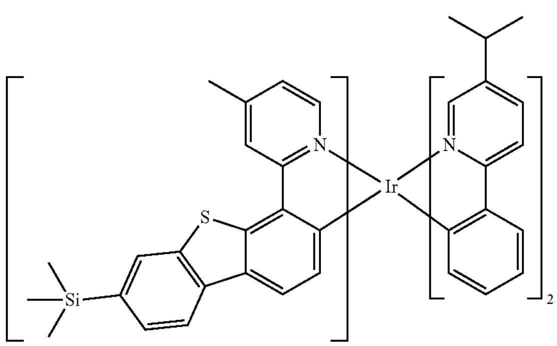
-continued
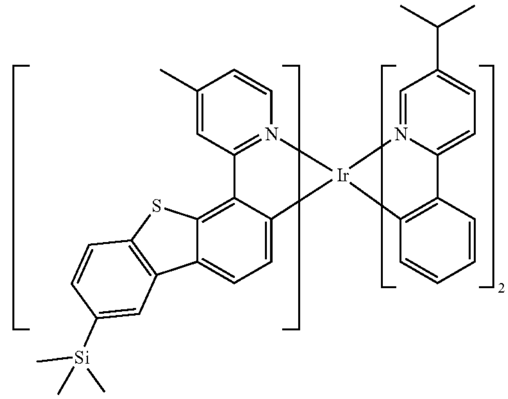
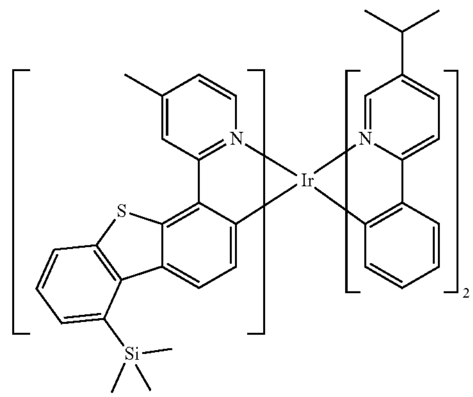
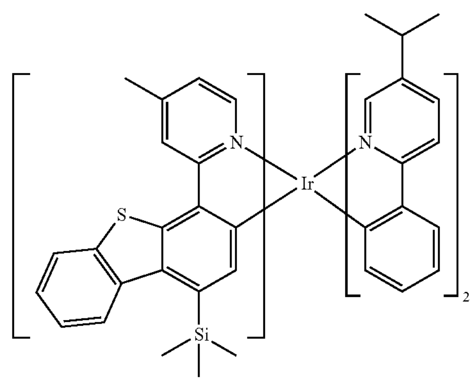
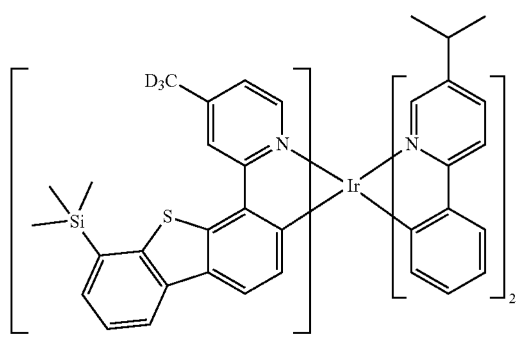

-continued
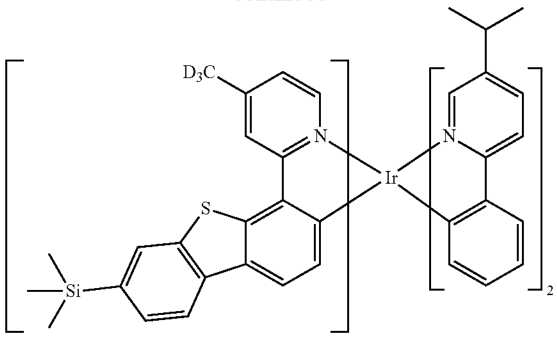
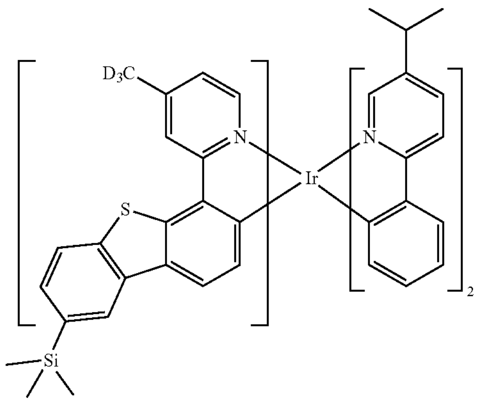
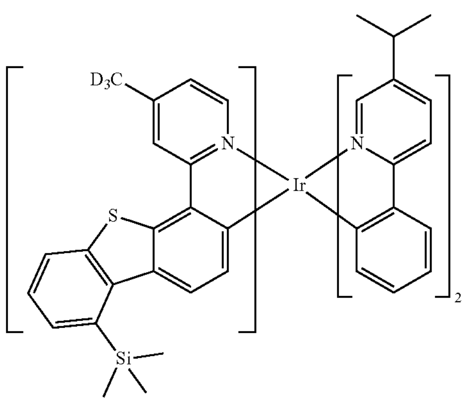
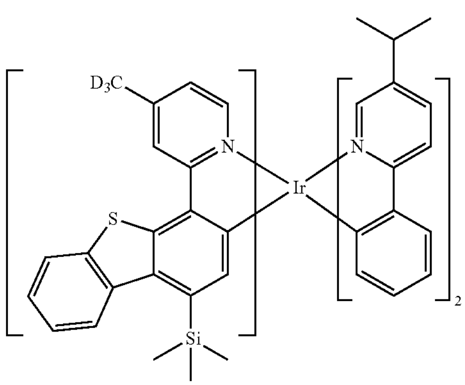
-continued
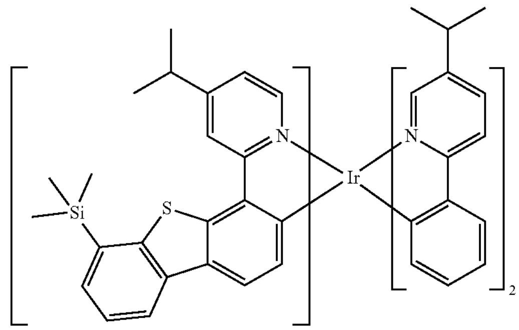
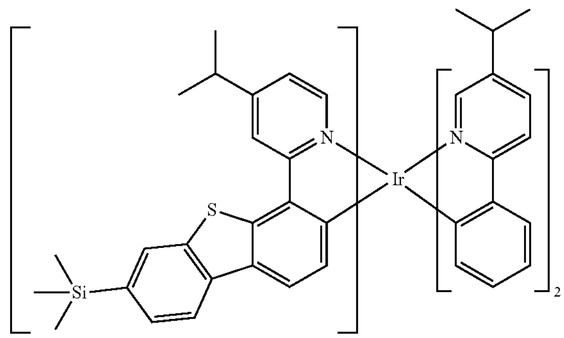
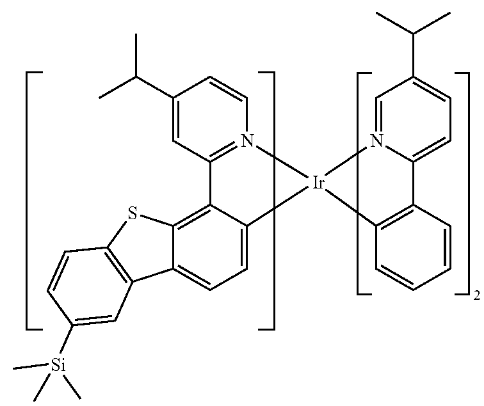
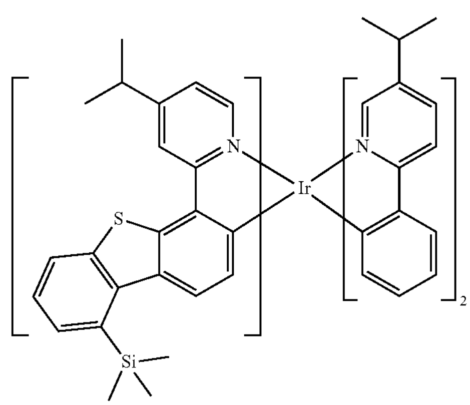

-continued
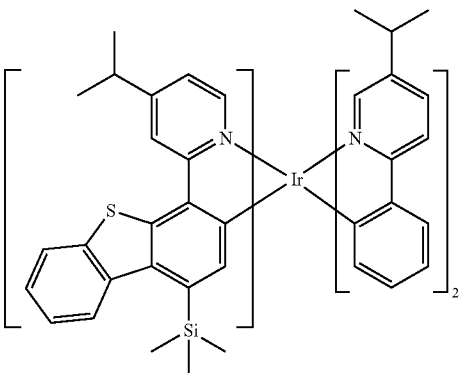
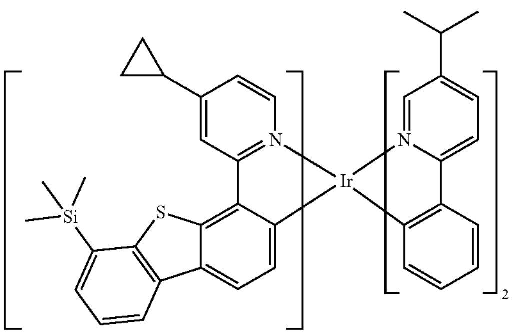
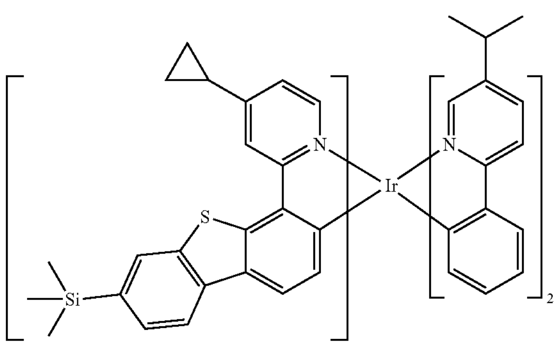
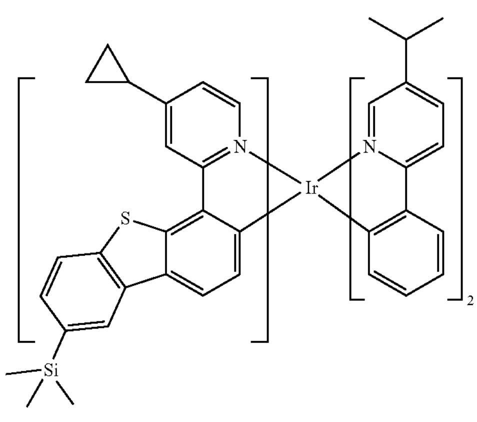
-continued
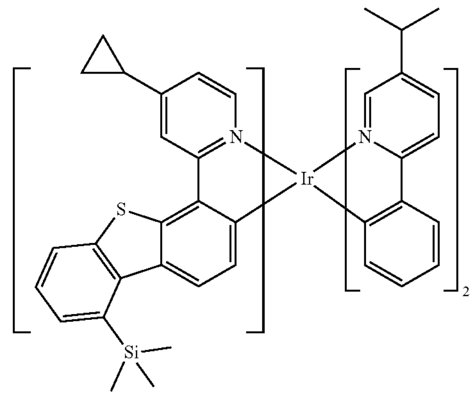
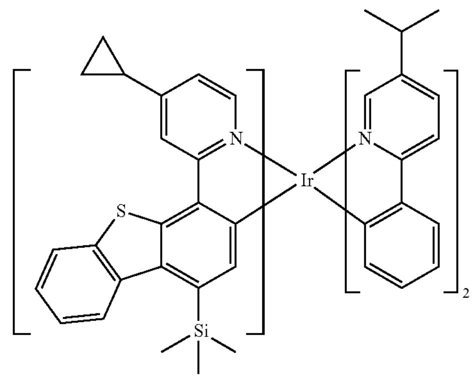
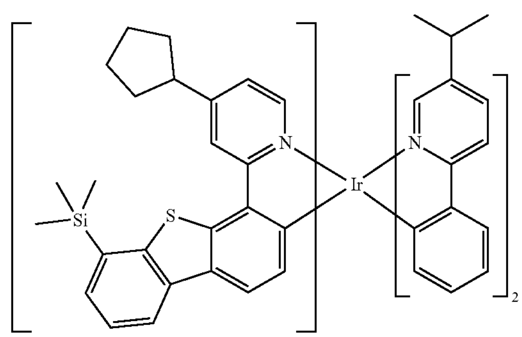
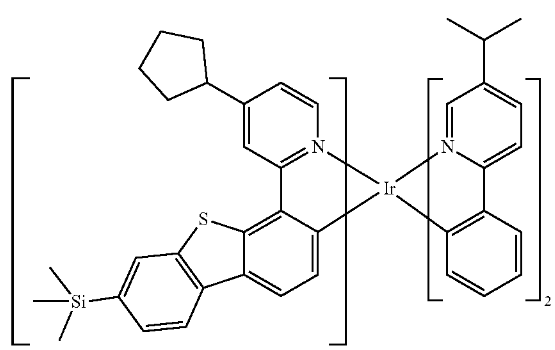

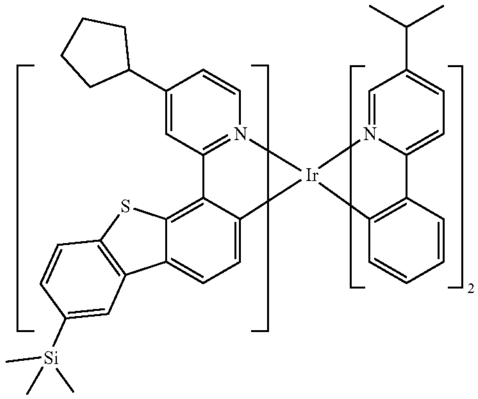
N
Ir
N
S
Si
2
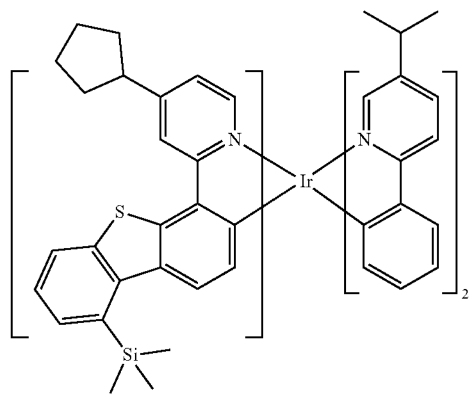
N
Ir
N
S
Si
2
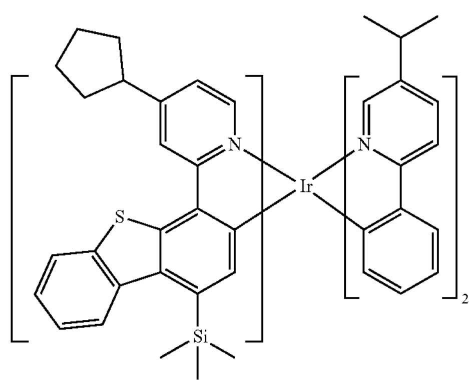
N
Ir
N
S
Si
2
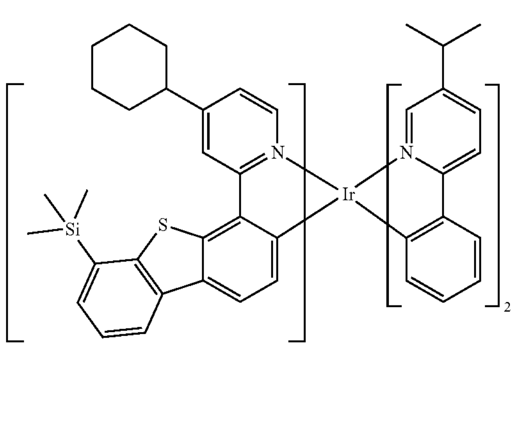
N
Ir
N
S
Si
2
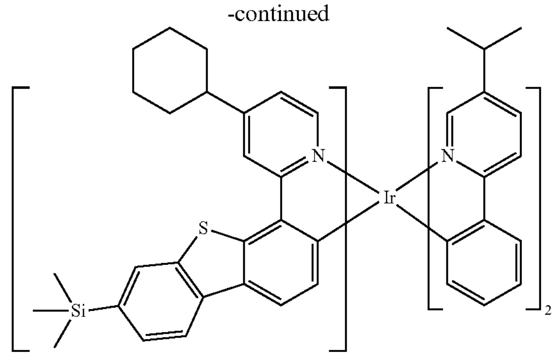
N
Ir
N
S
Si
2
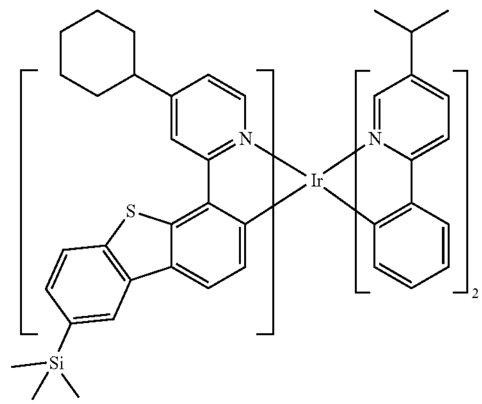
N
Ir
N
S
Si
2
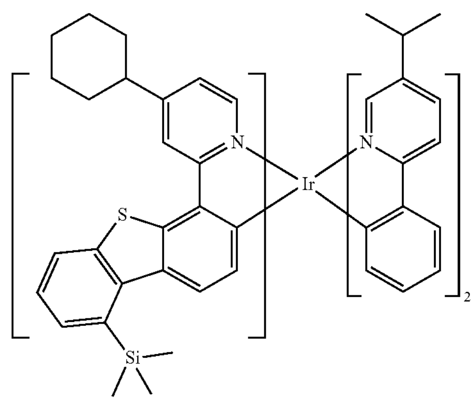
N
Ir
N
S
Si
2
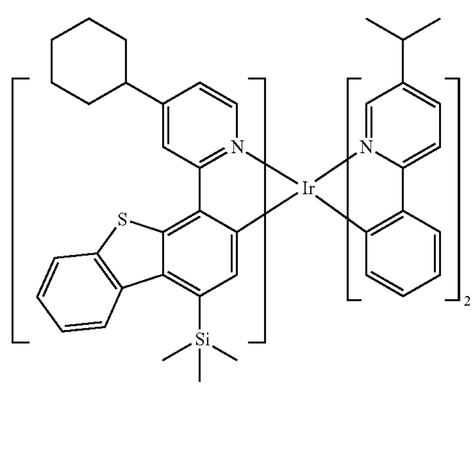
N
Ir
N
S
Si
2

-continued
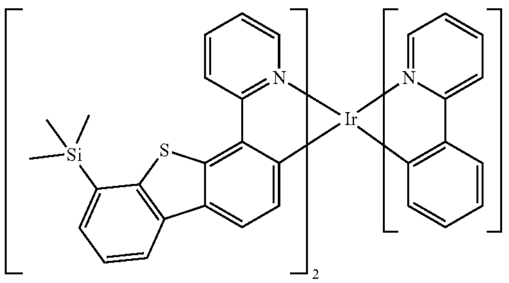
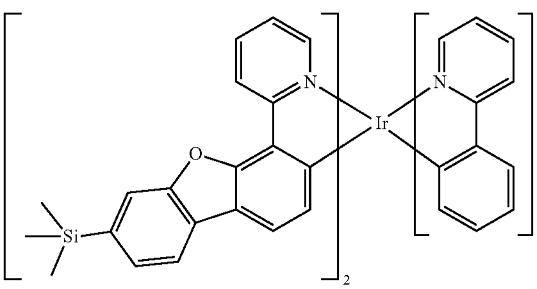
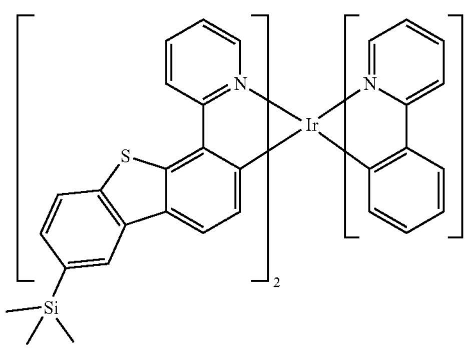
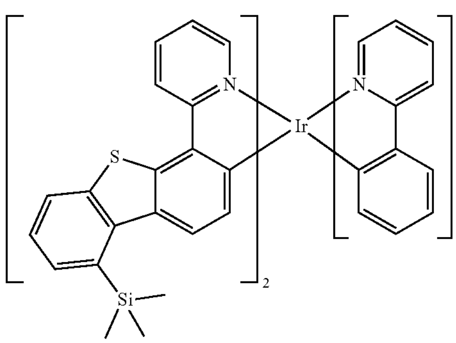
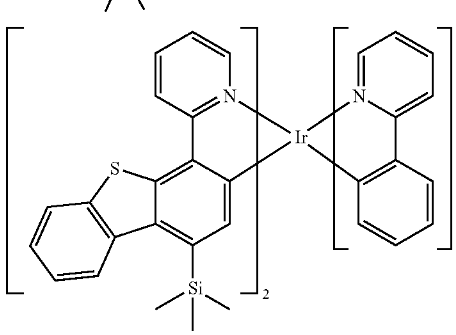
-continued
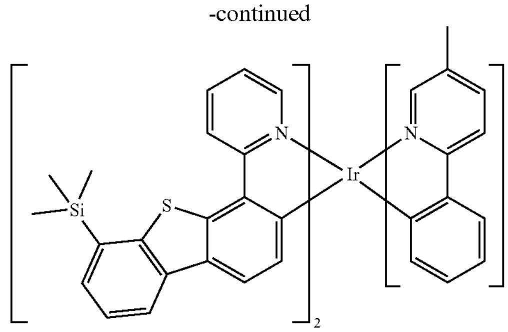
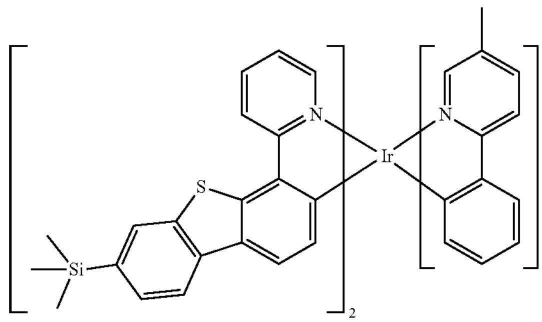
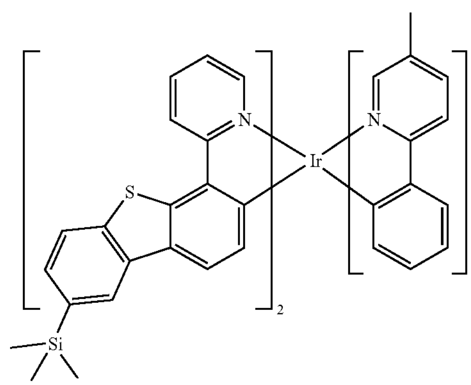
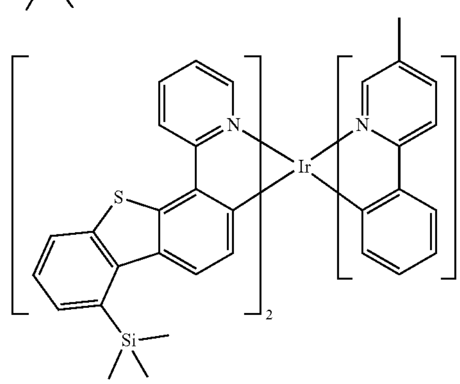
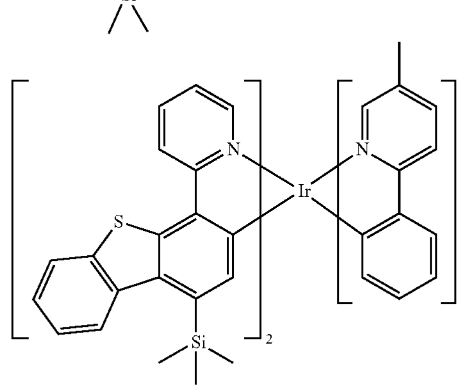

-continued
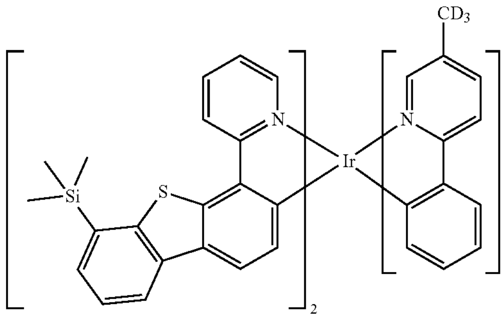
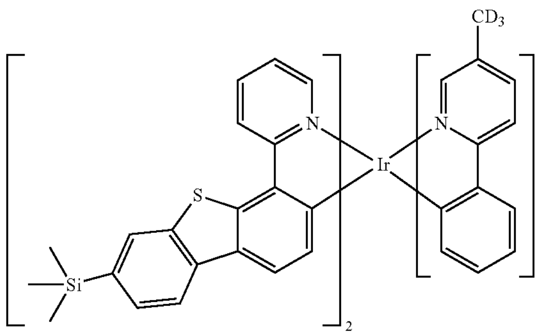
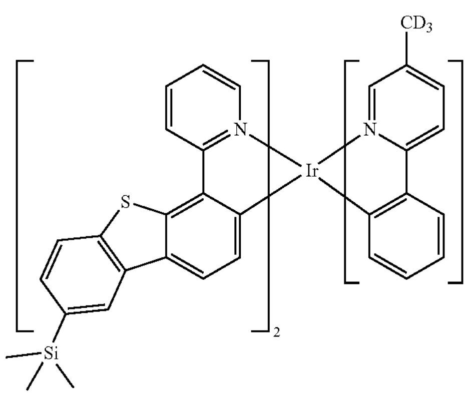
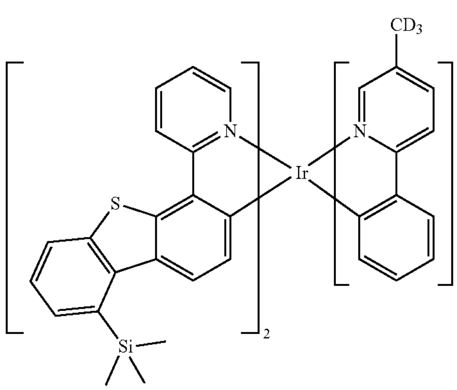
-continued
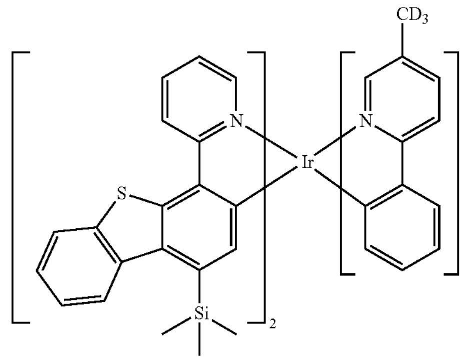
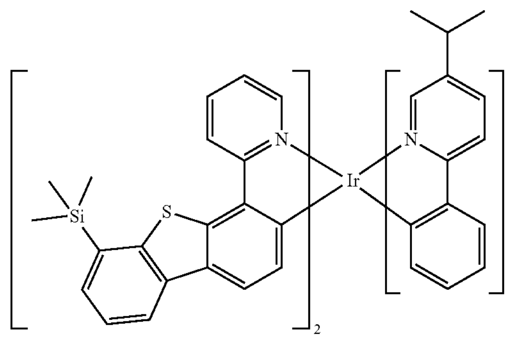
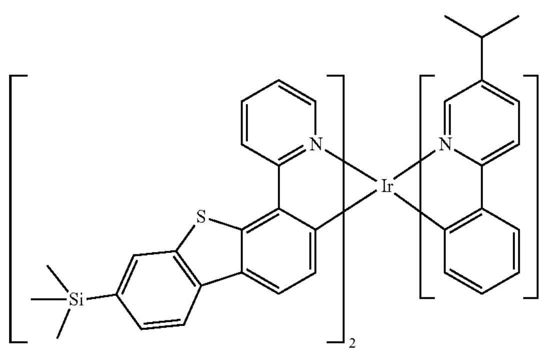
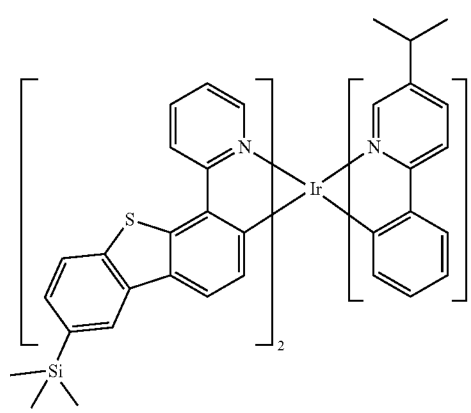

-continued
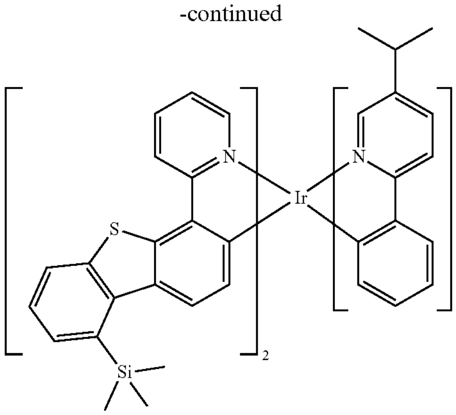
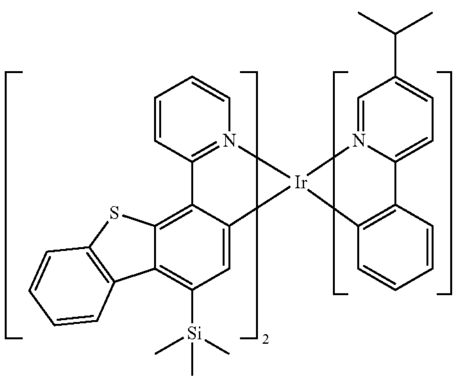
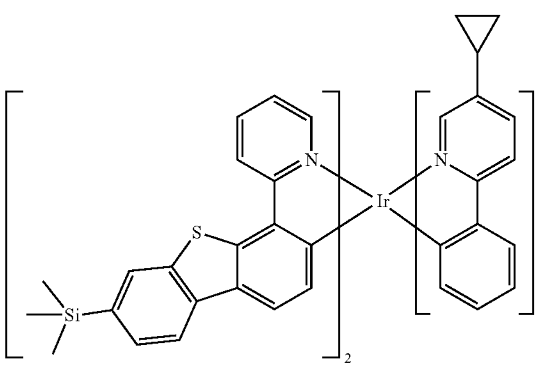
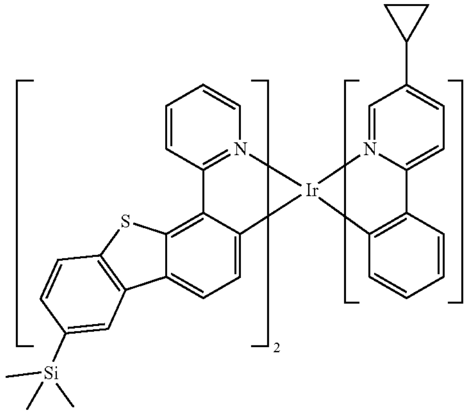
-continued
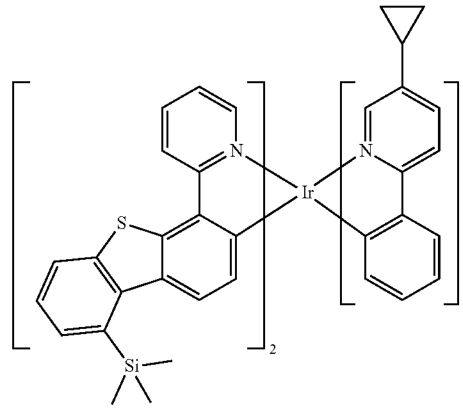
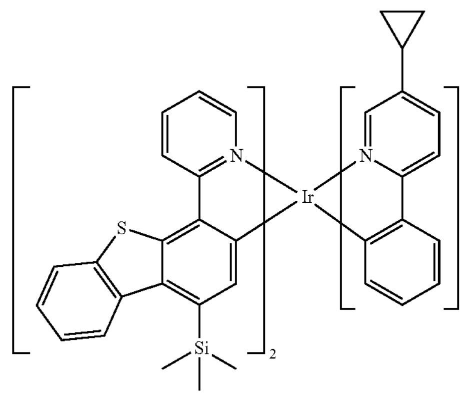
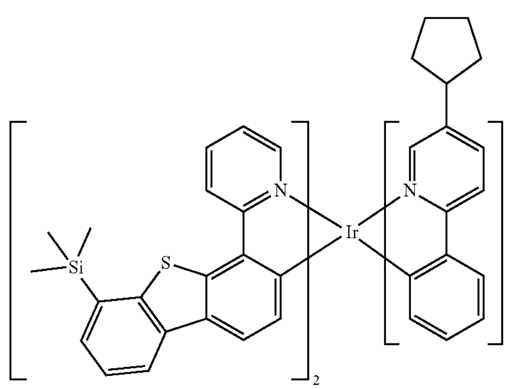
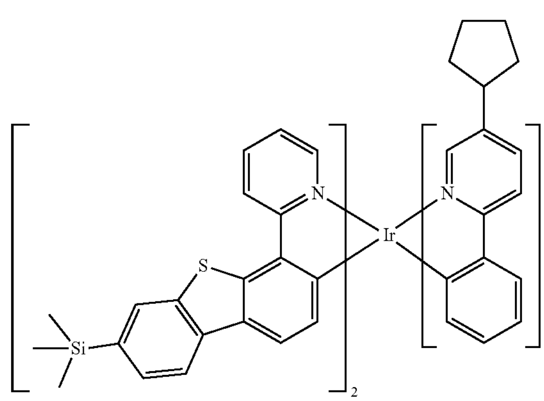

-continued
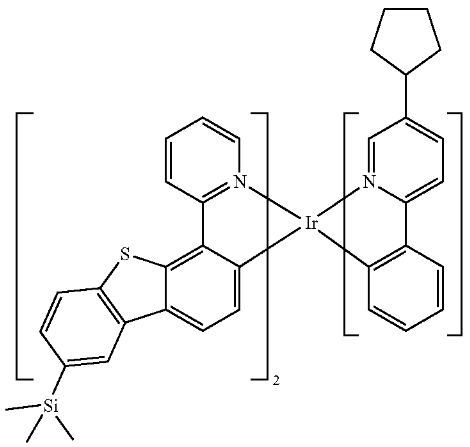
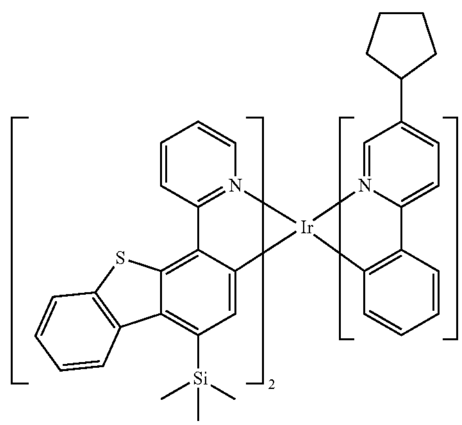
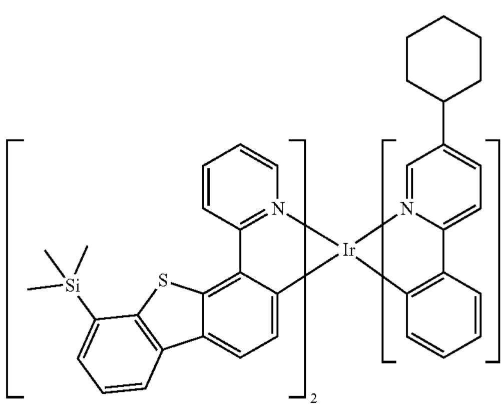
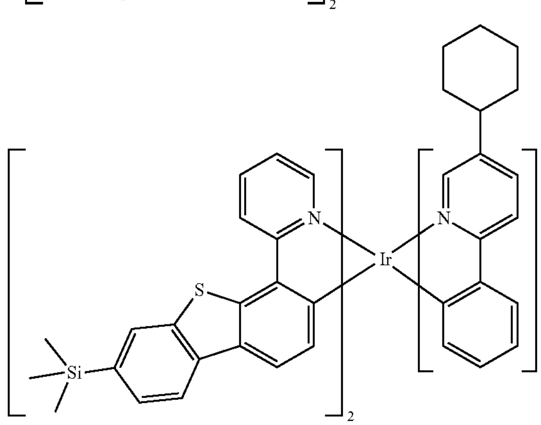
-continued
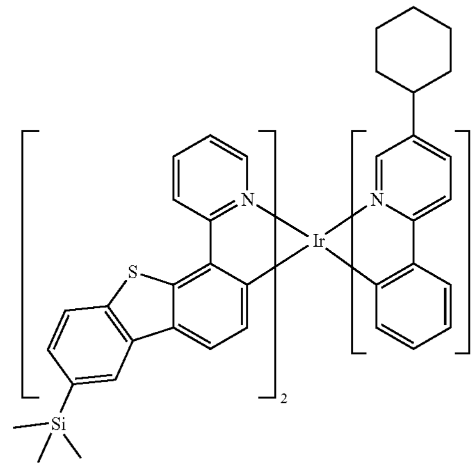
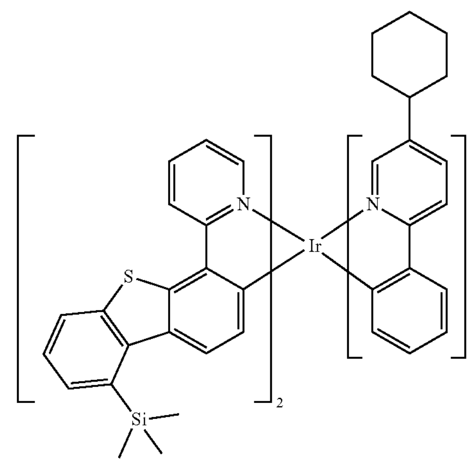
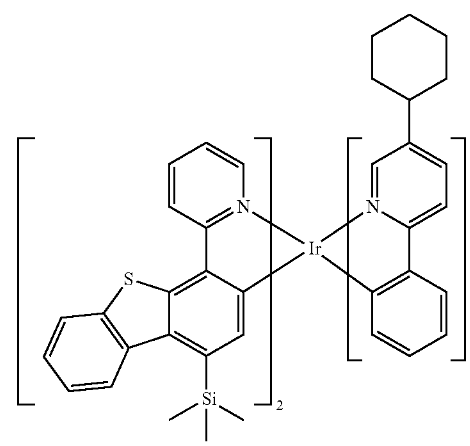
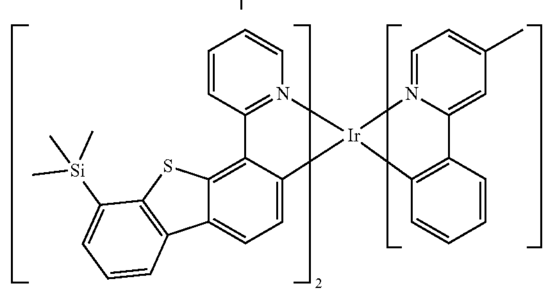

-continued
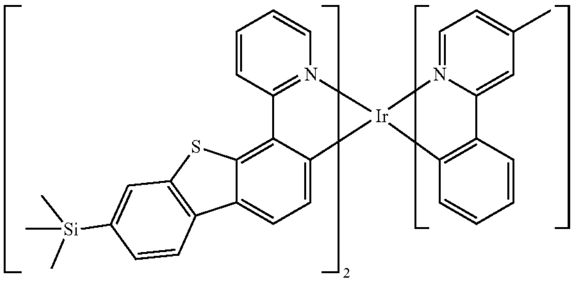
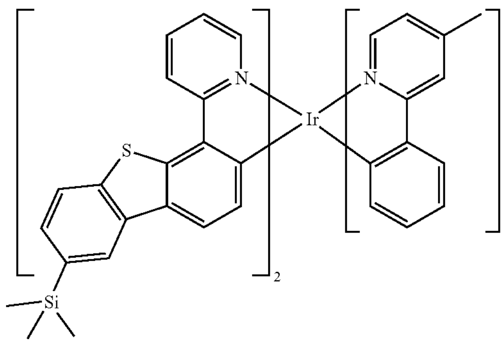
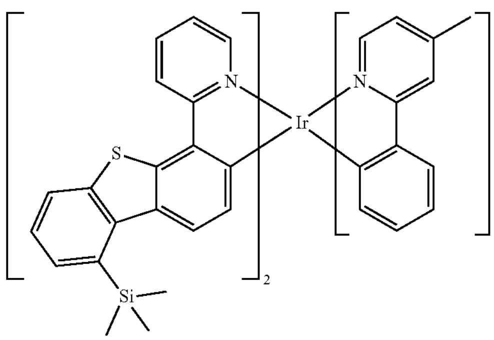
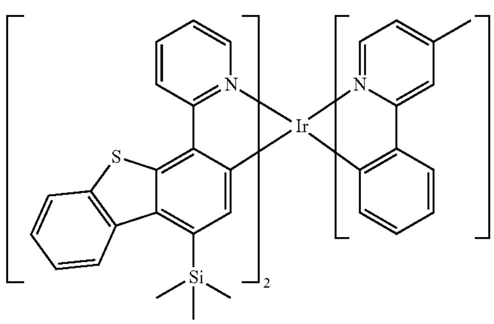
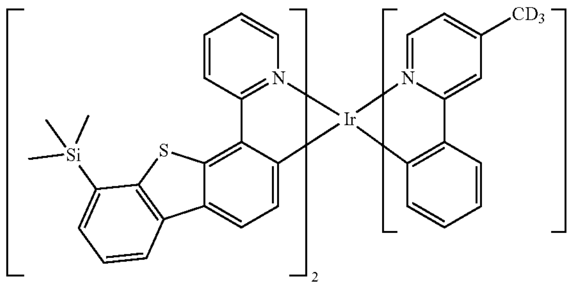
-continued
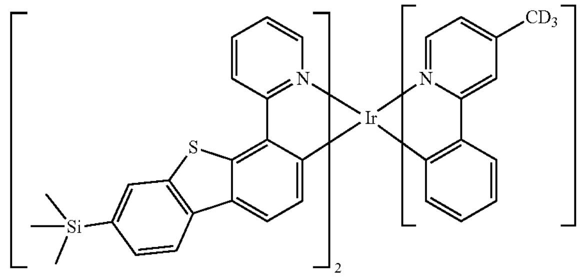
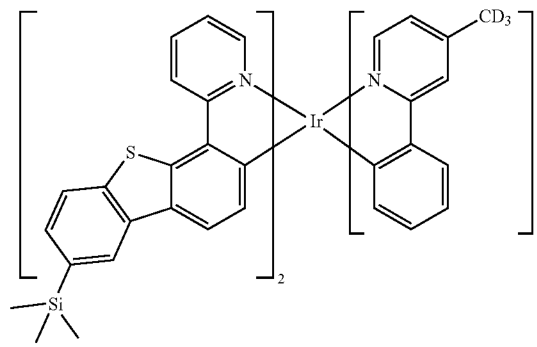
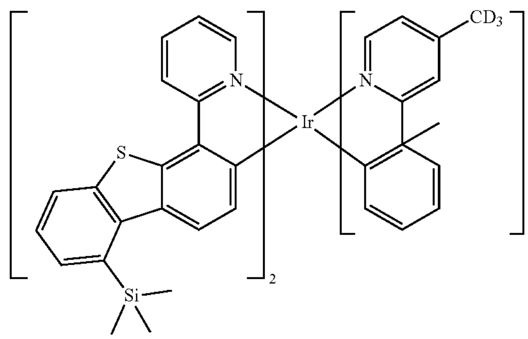
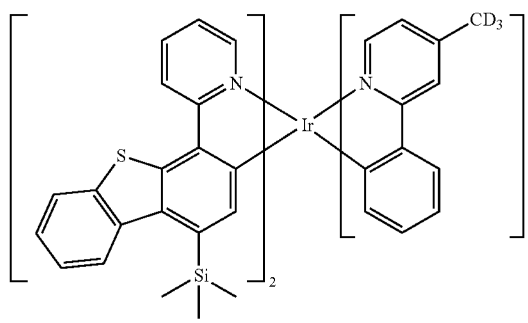
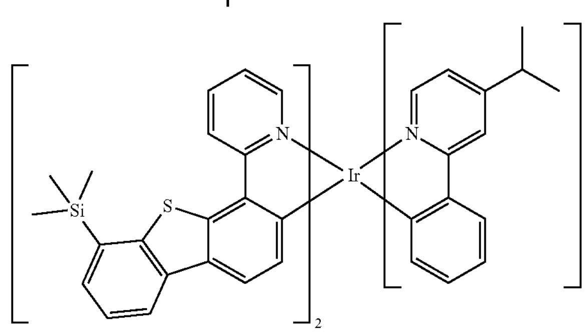

-continued
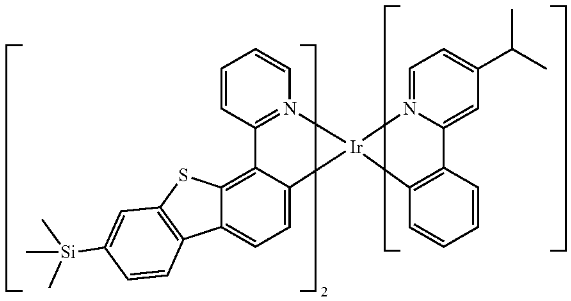
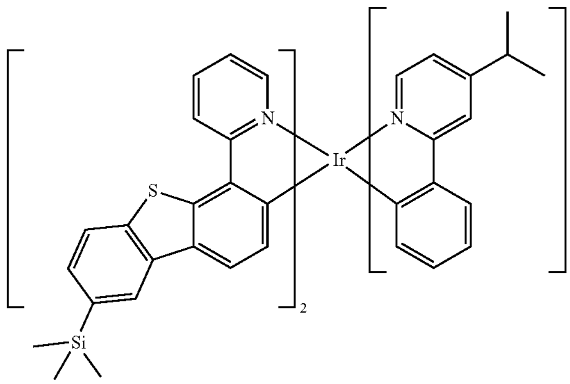
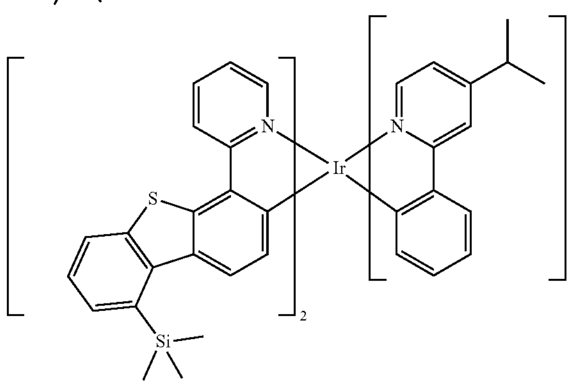
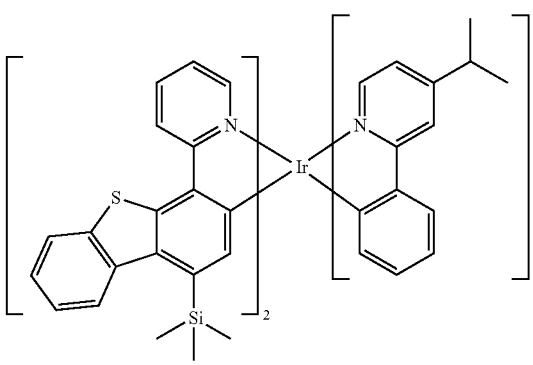
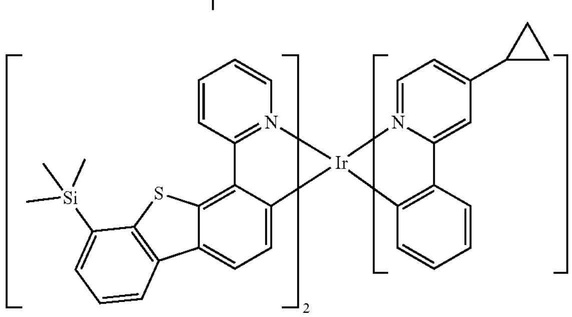
-continued
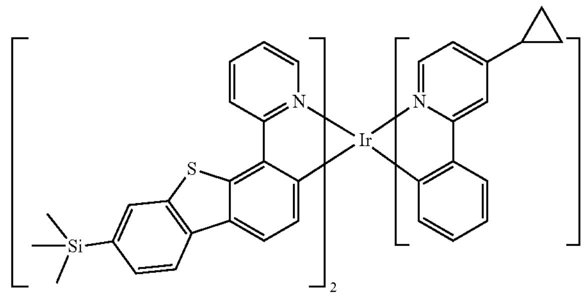
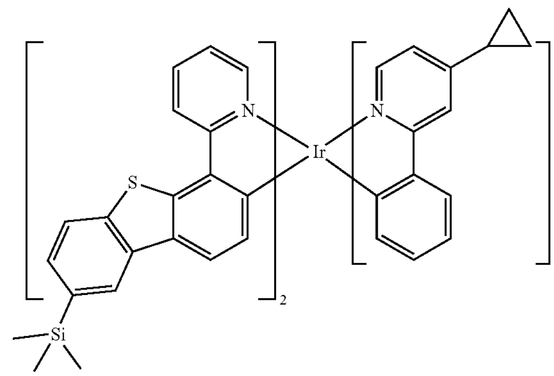
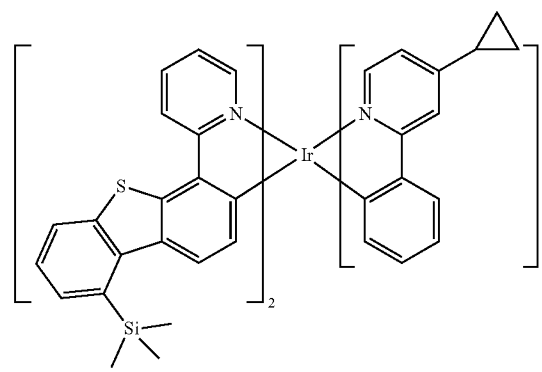
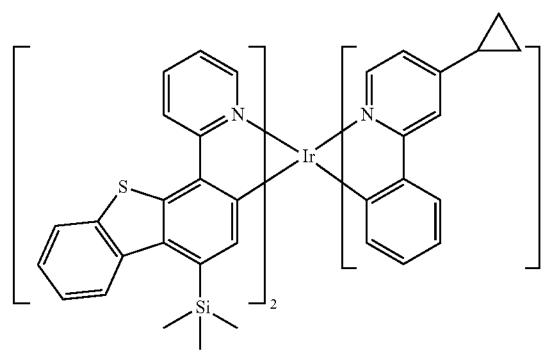
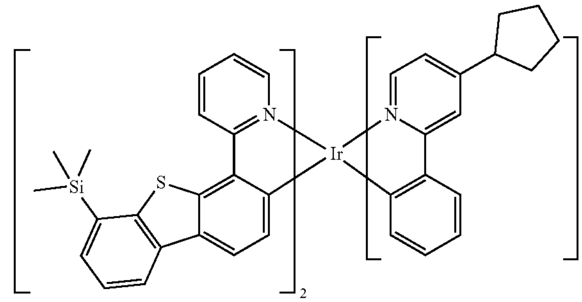

-continued
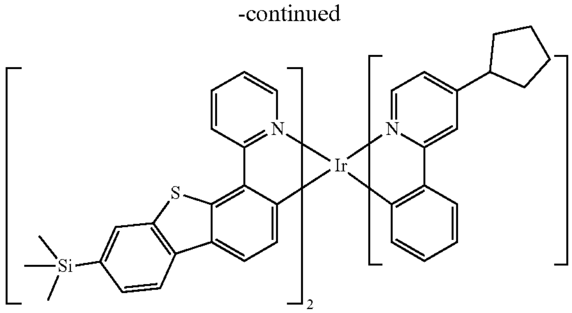
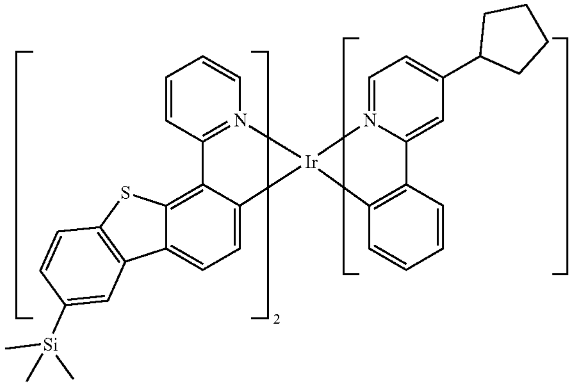
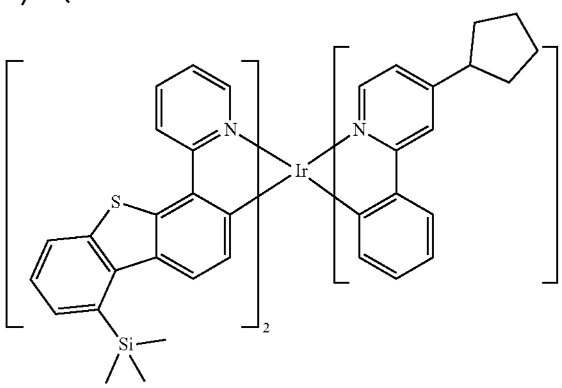
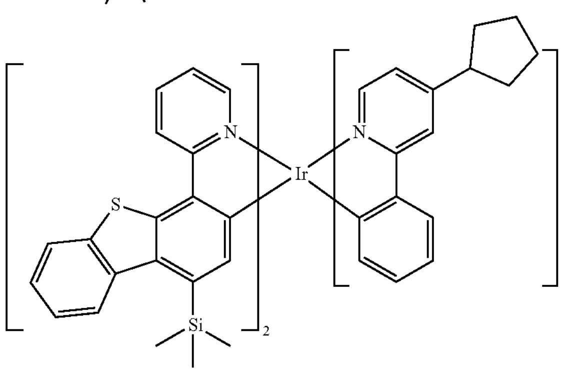
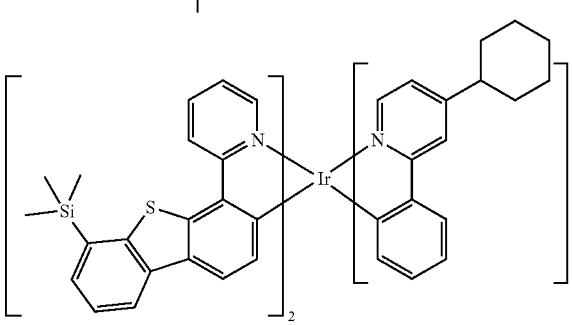
-continued
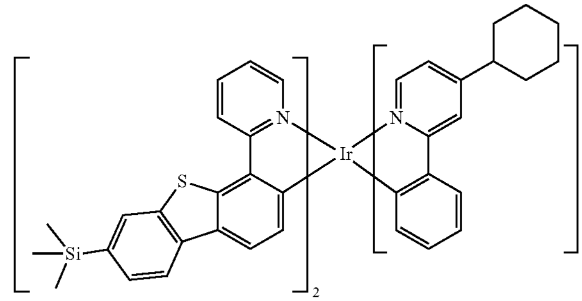
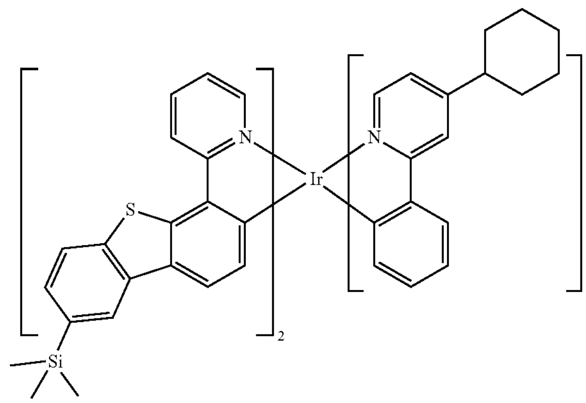
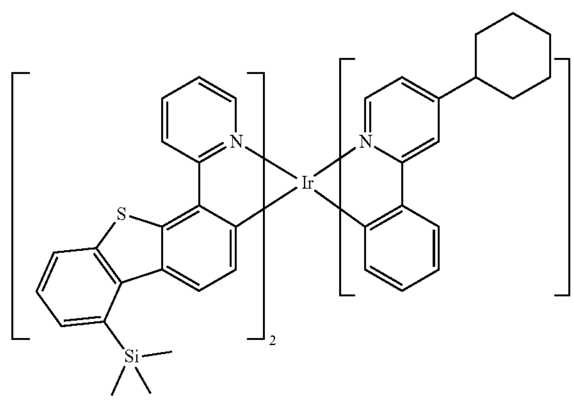
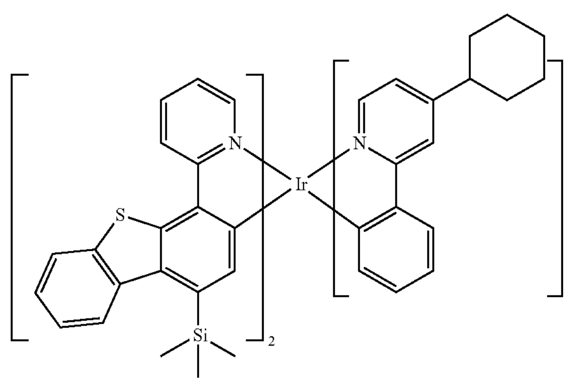

-continued
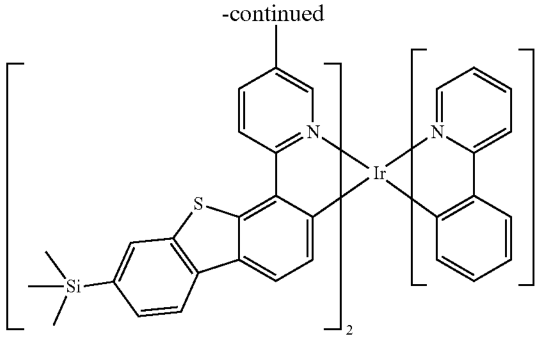
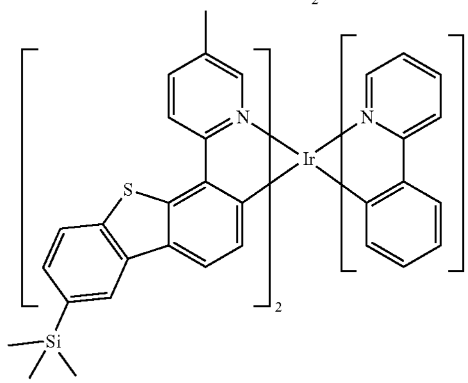
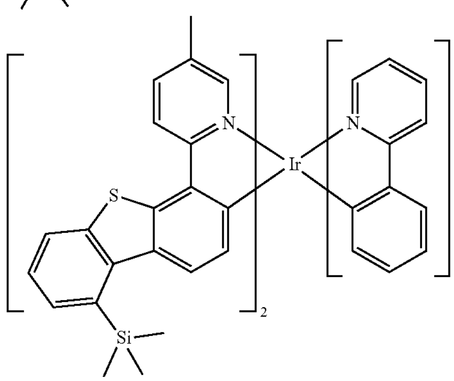
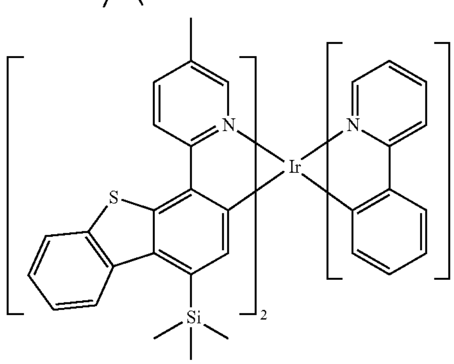
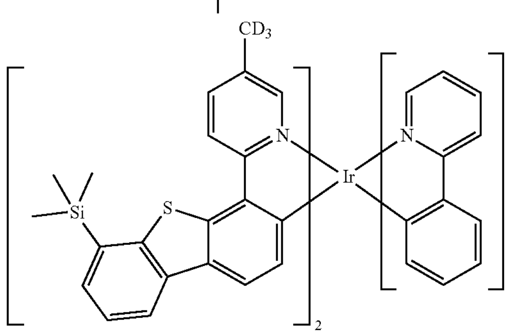
-continued
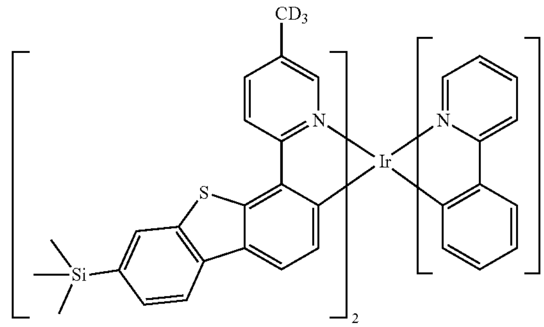
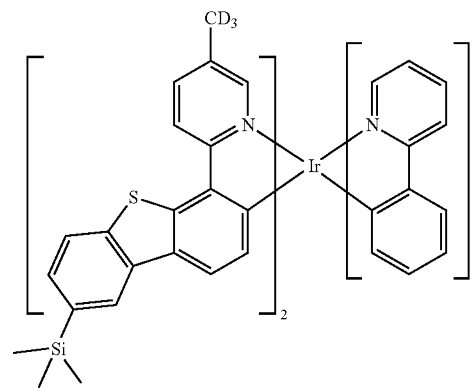
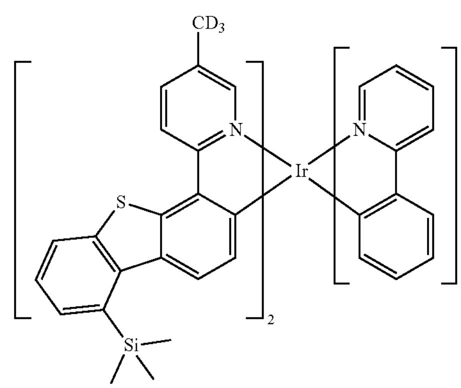
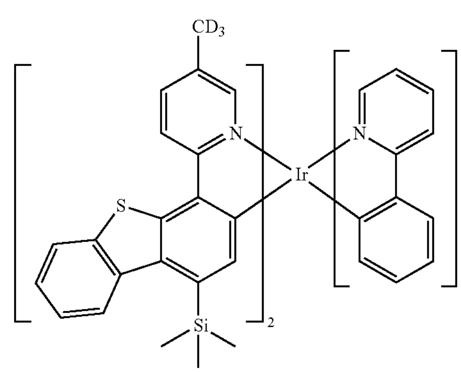

-continued
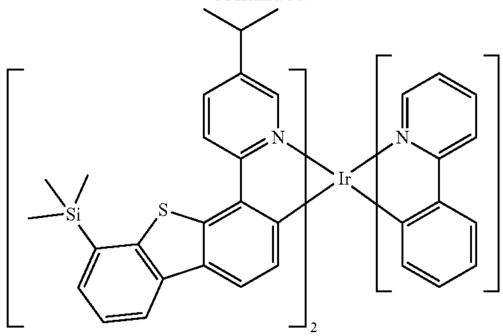
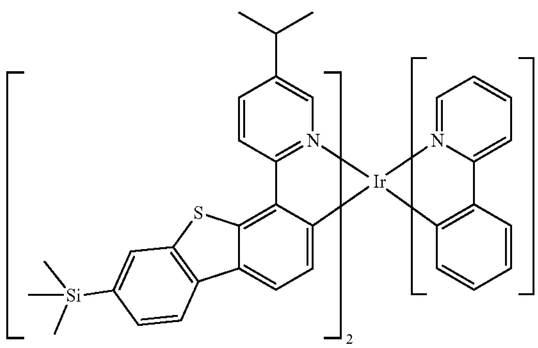
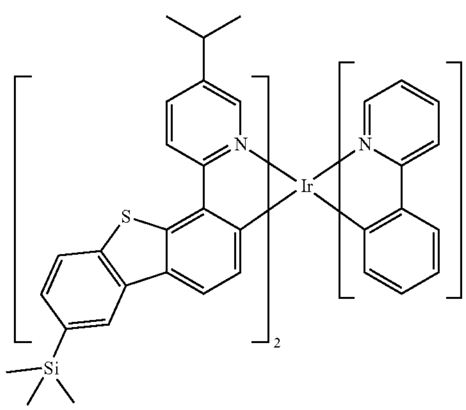
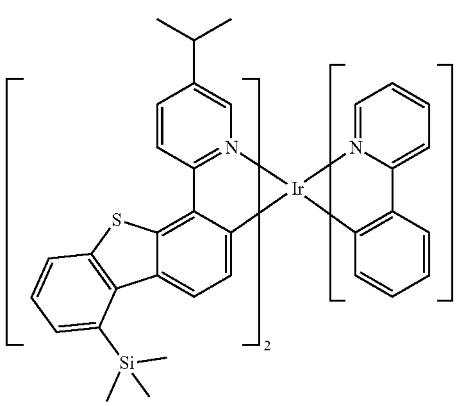
-continued
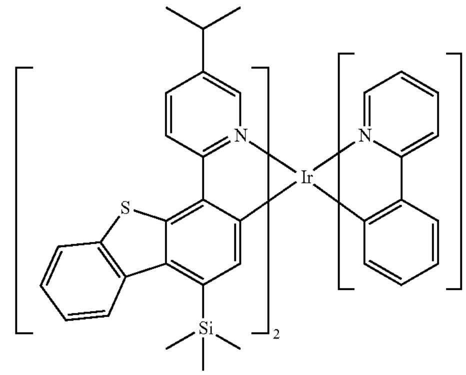
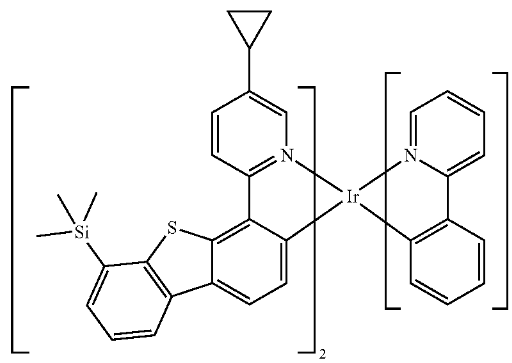
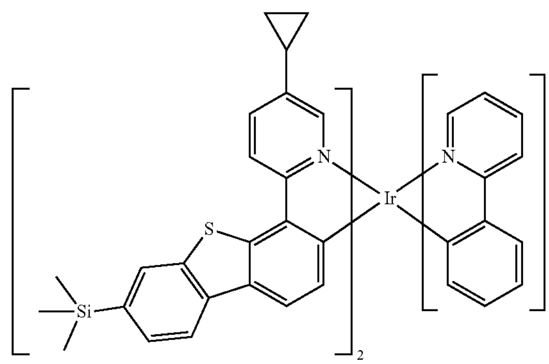
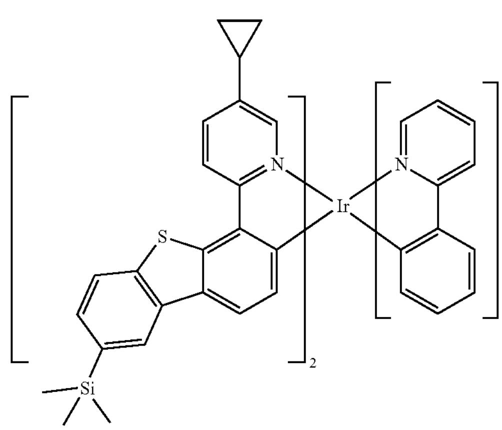

-continued
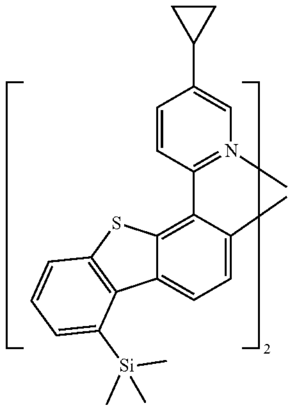
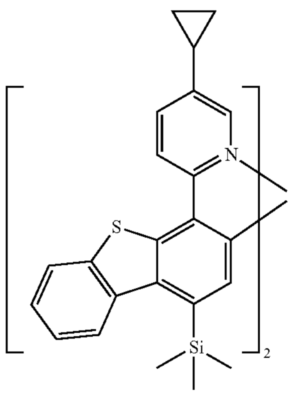
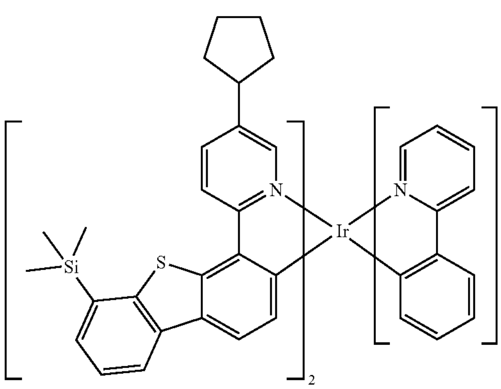
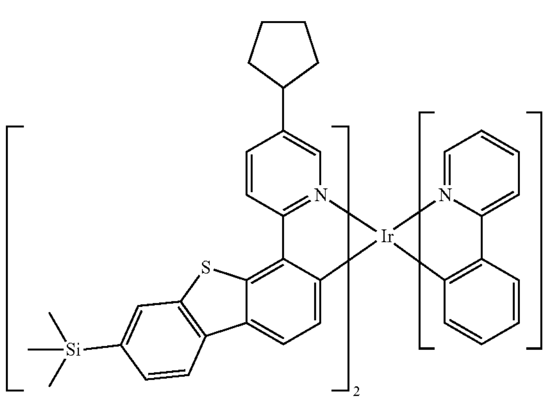
-continued
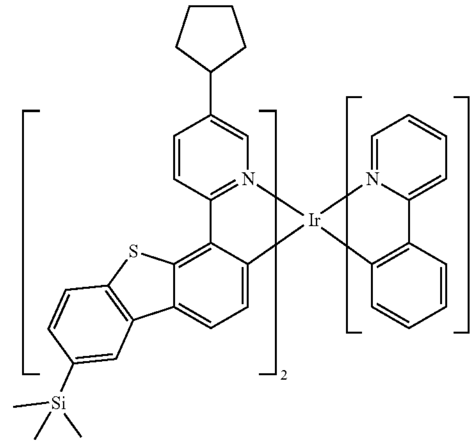
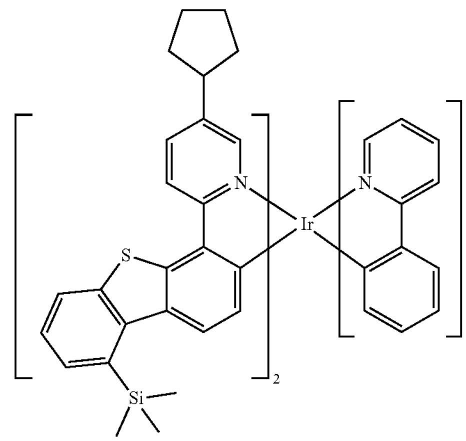
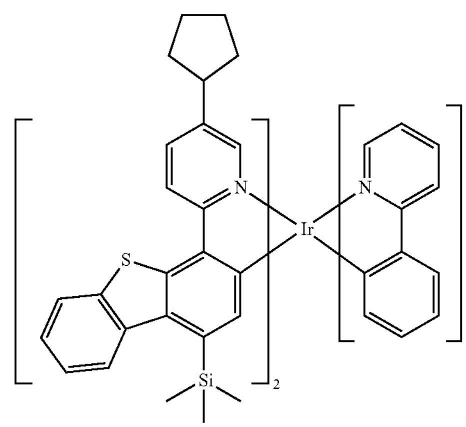
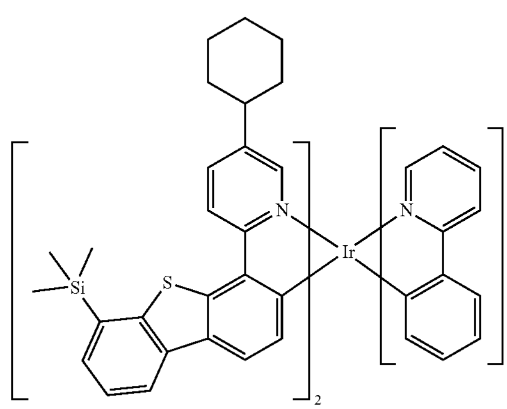

-continued
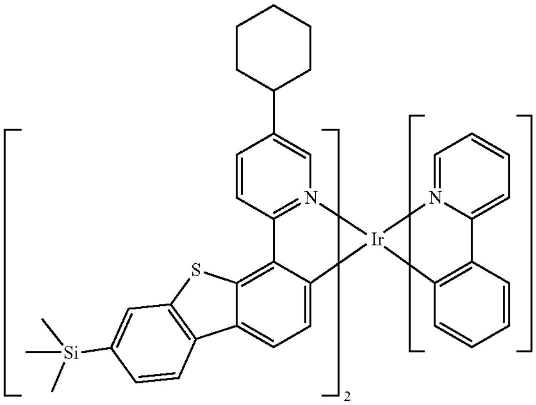
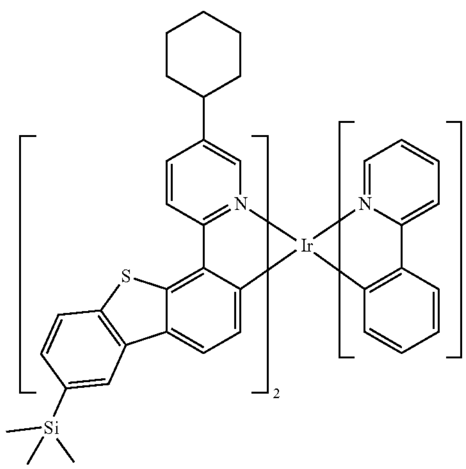
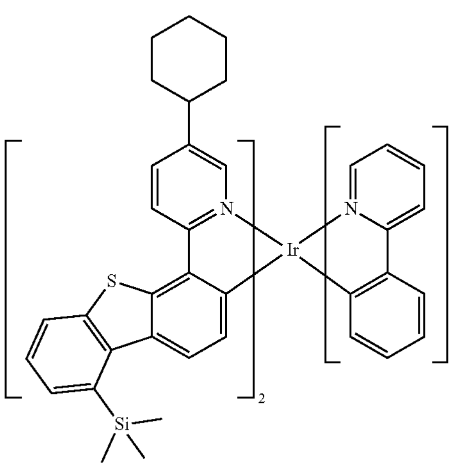
-continued
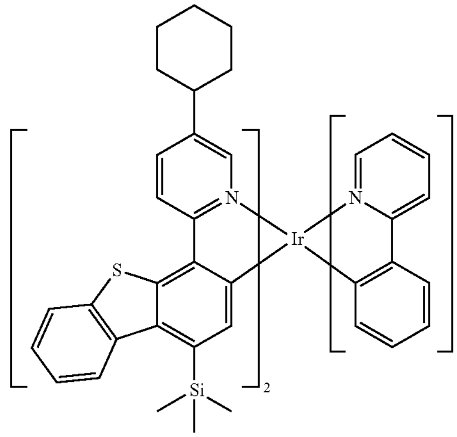
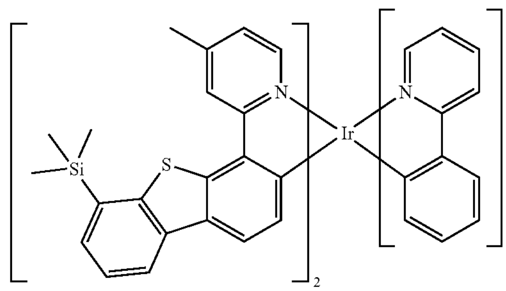
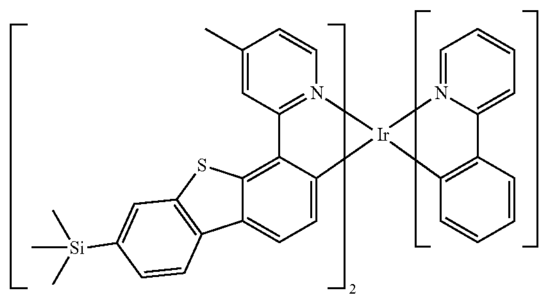
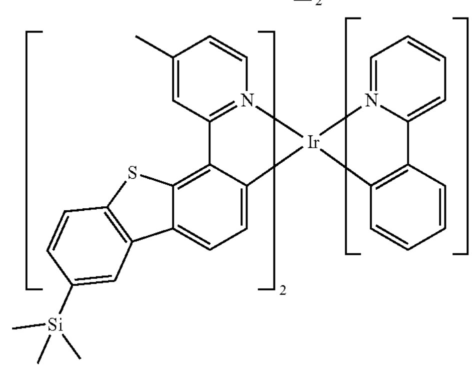
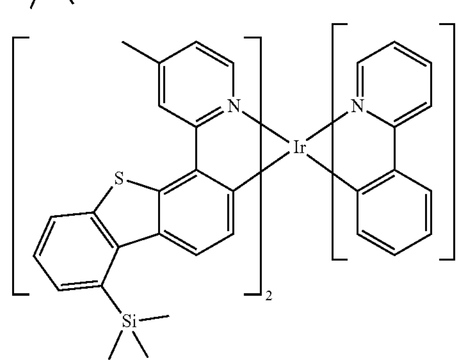

-continued
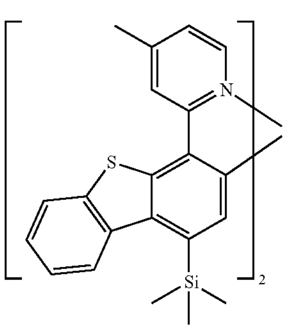
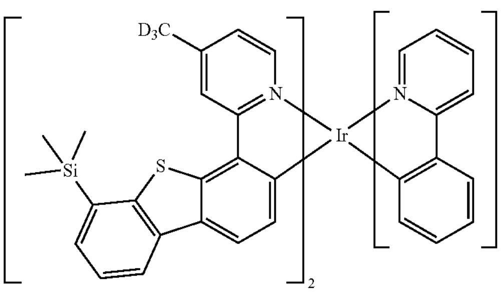
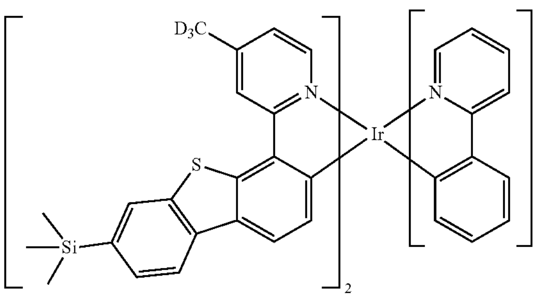
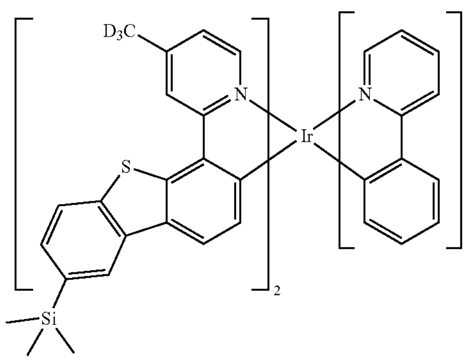
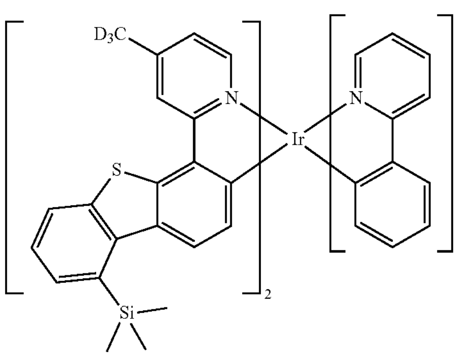
-continued
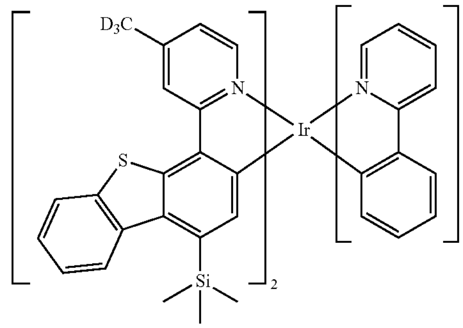
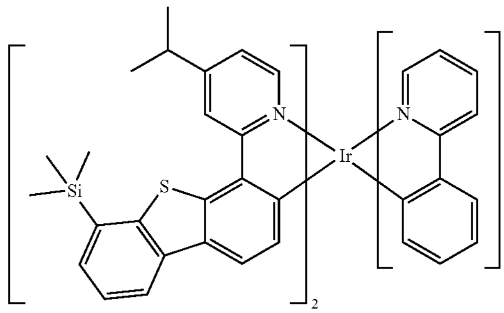
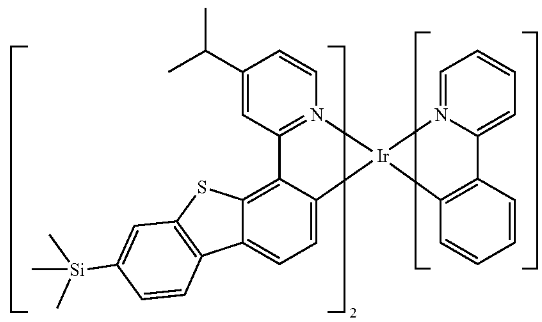
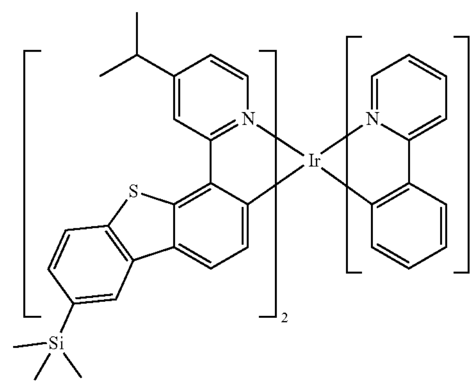
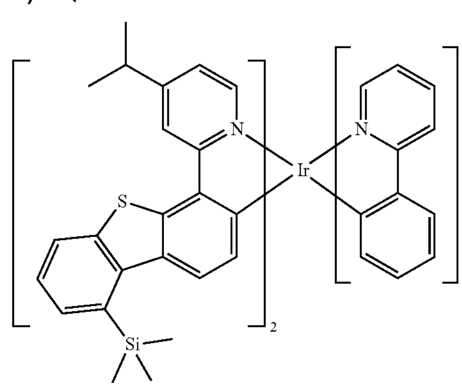

-continued
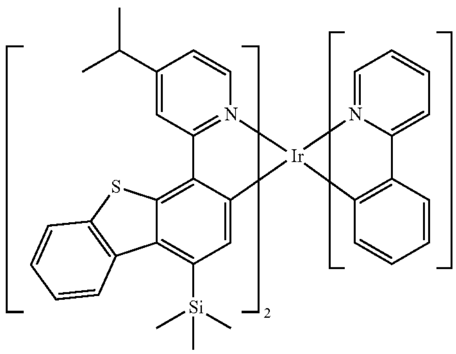
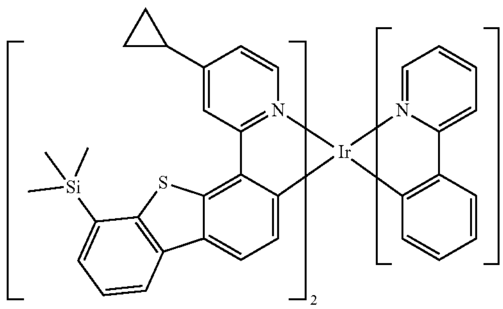
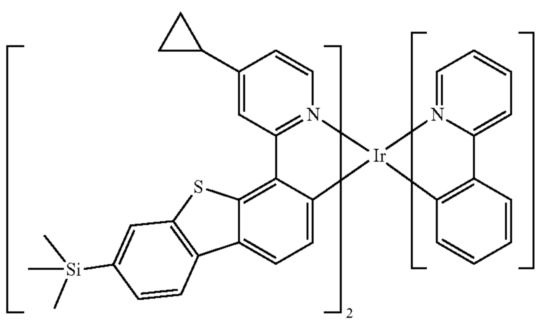
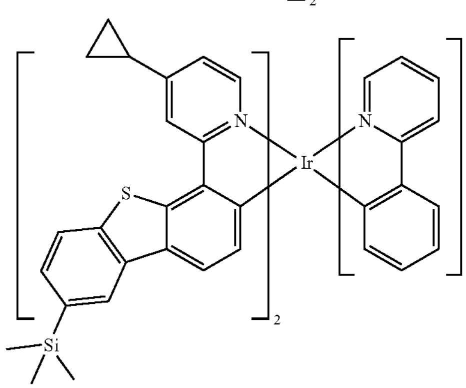
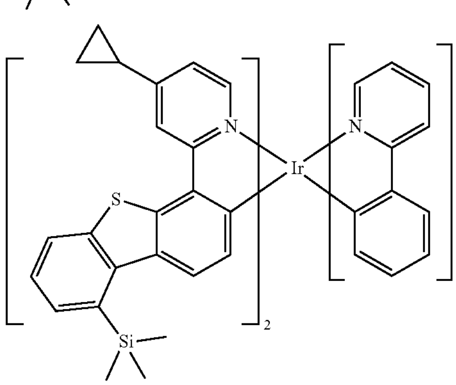
-continued
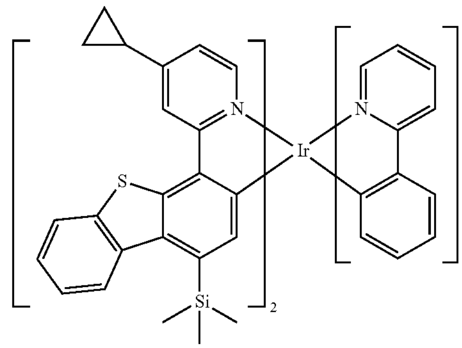
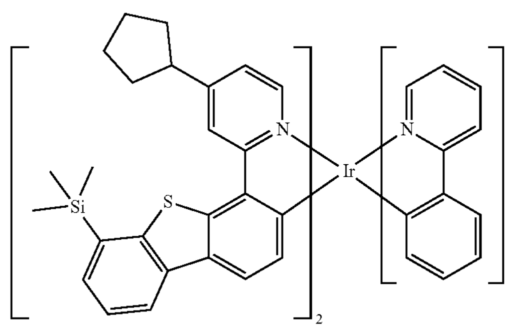
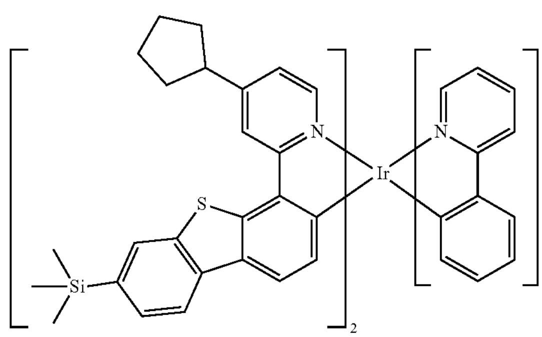
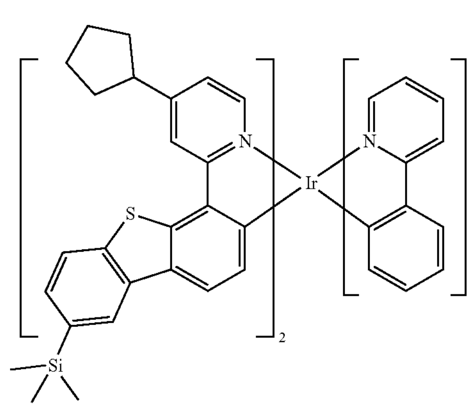

-continued
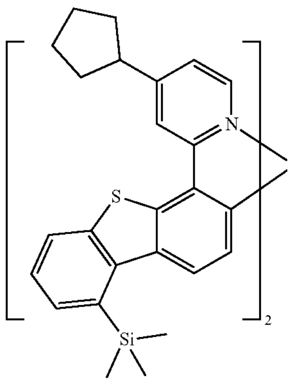
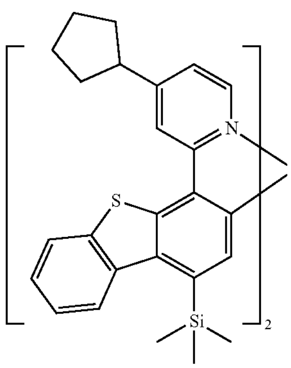
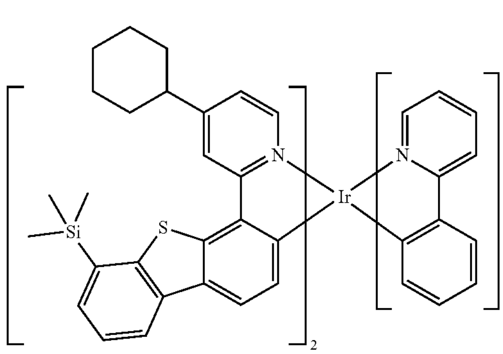
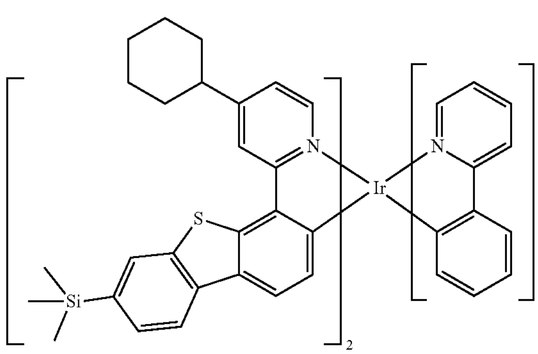
-continued
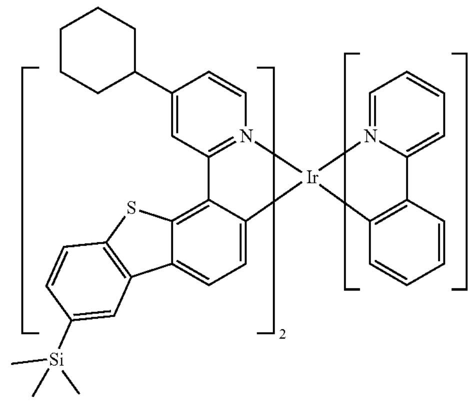
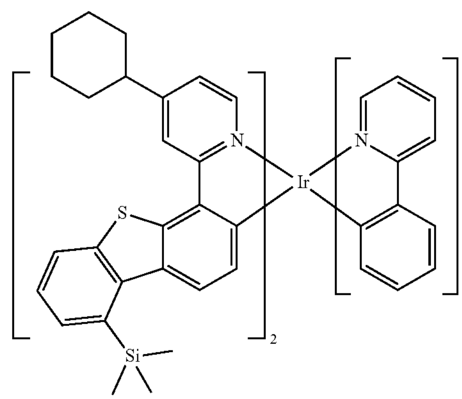
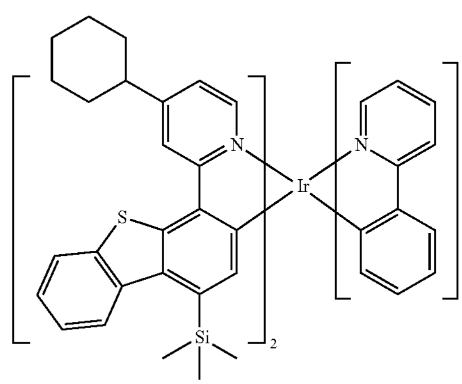
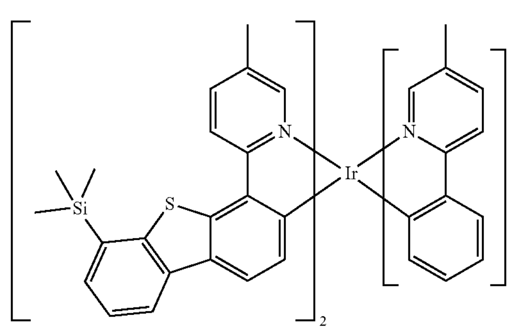

-continued
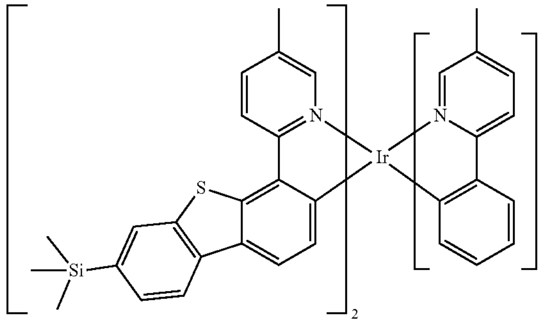
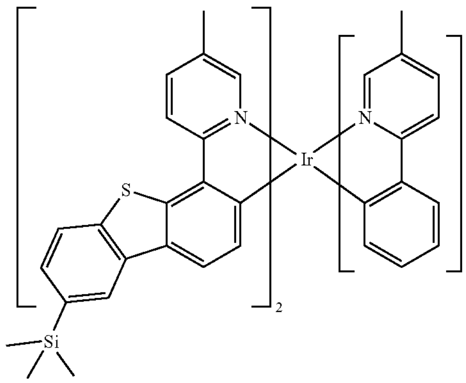
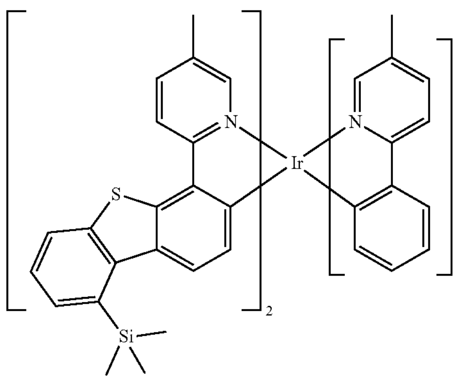
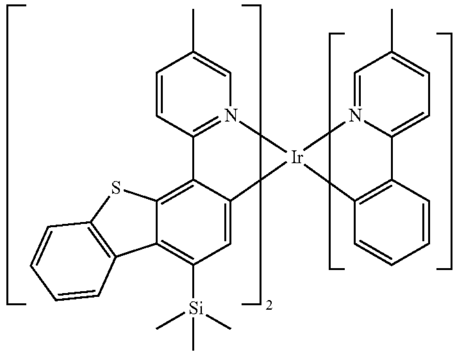
-continued
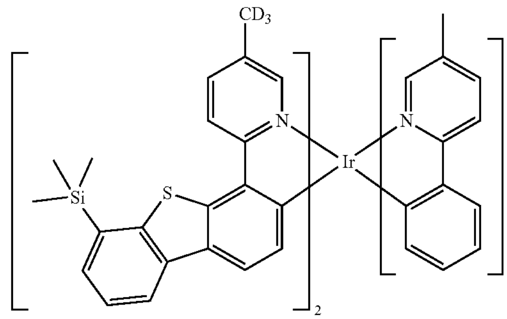
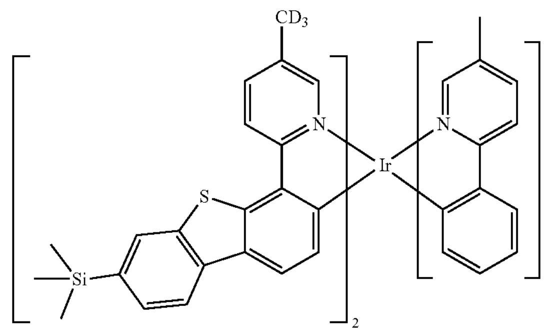
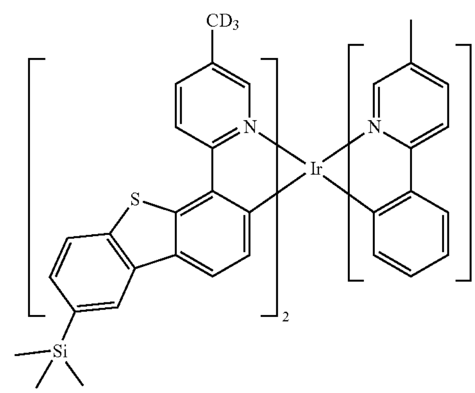
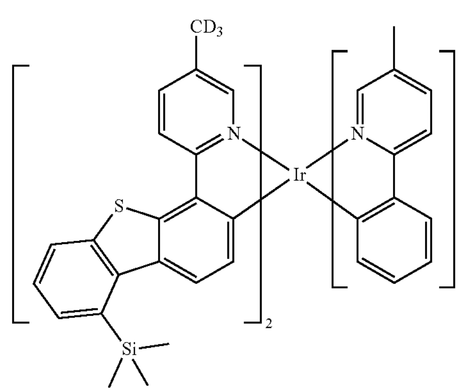

-continued
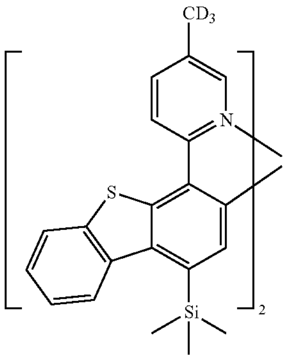
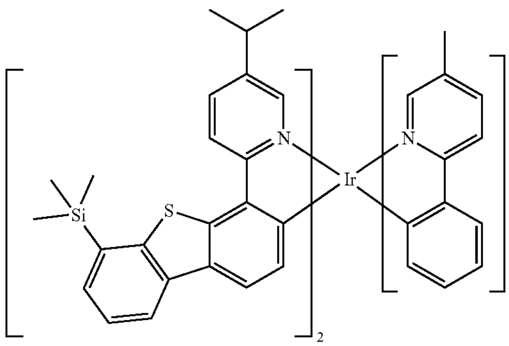
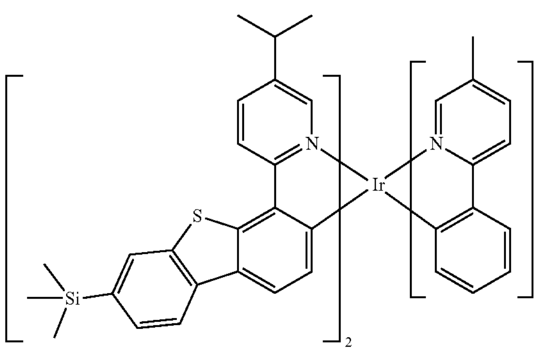
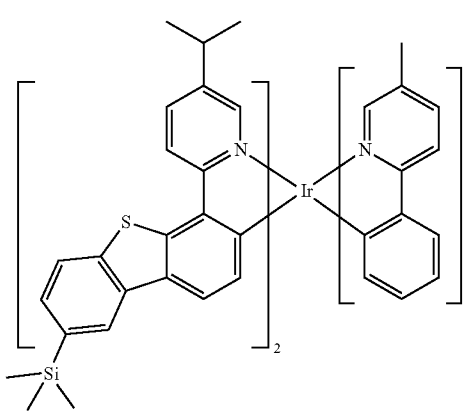
-continued
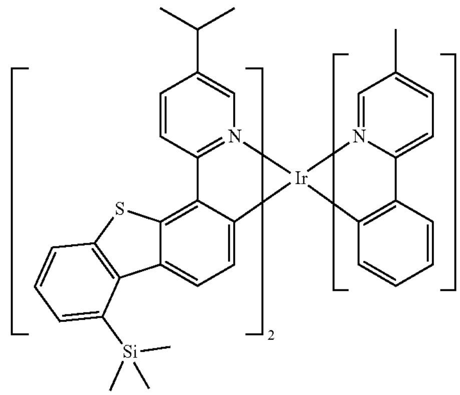
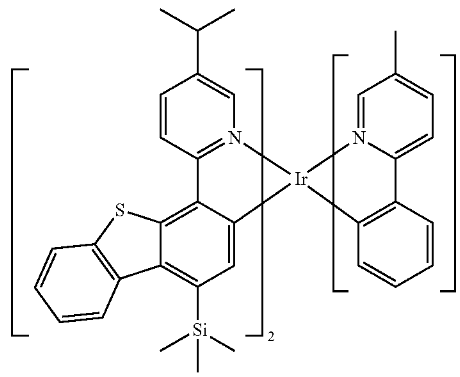
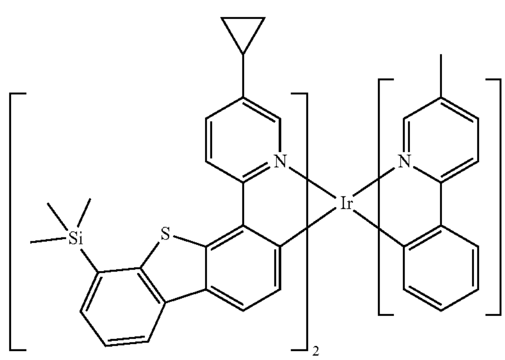
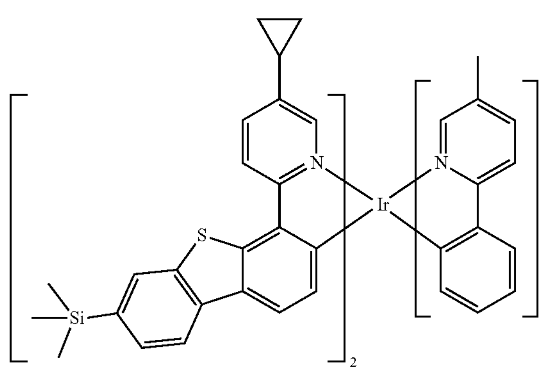

-continued
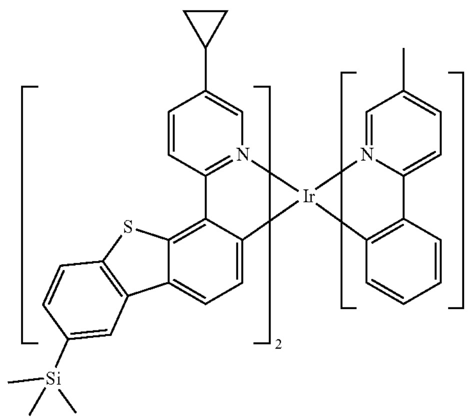
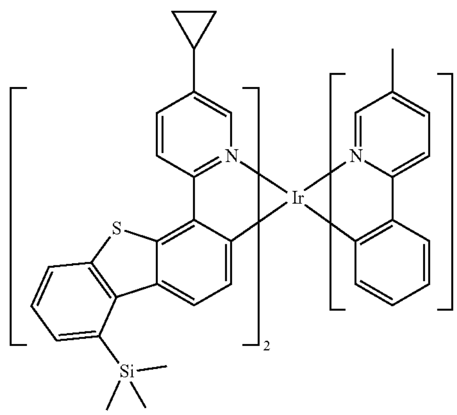
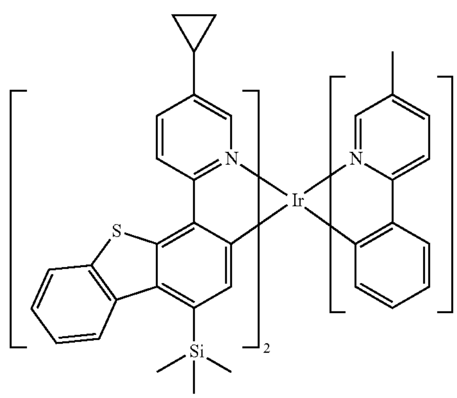
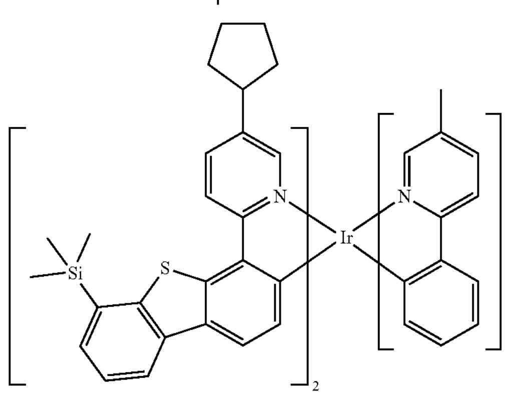
-continued
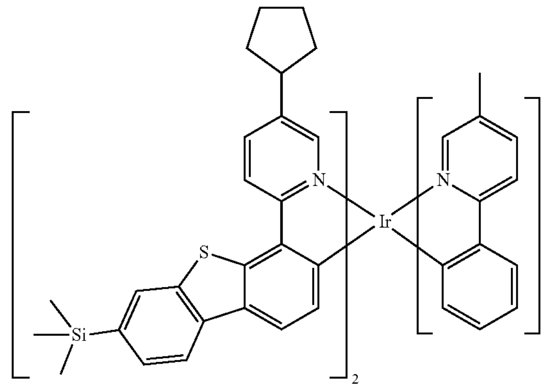
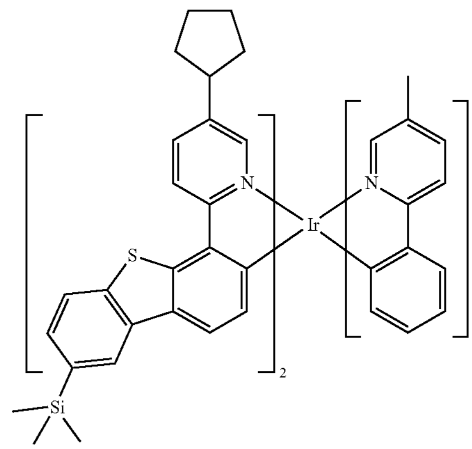
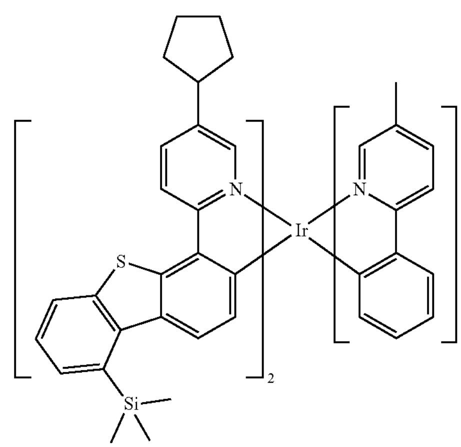
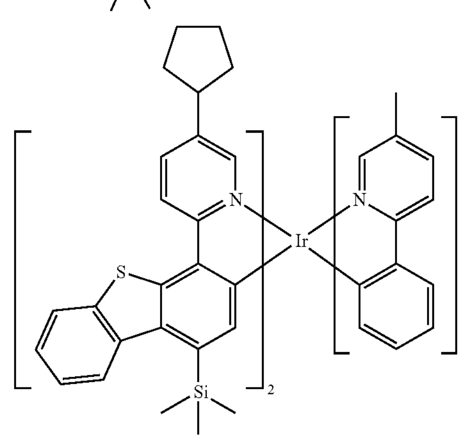

-continued
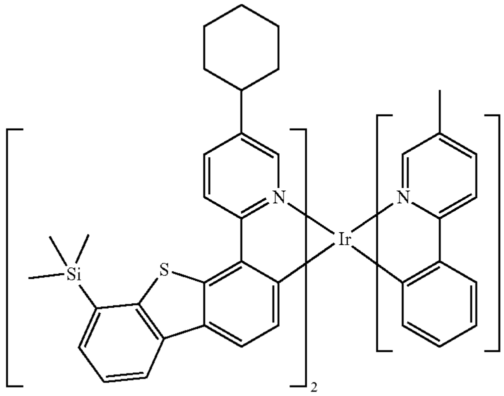
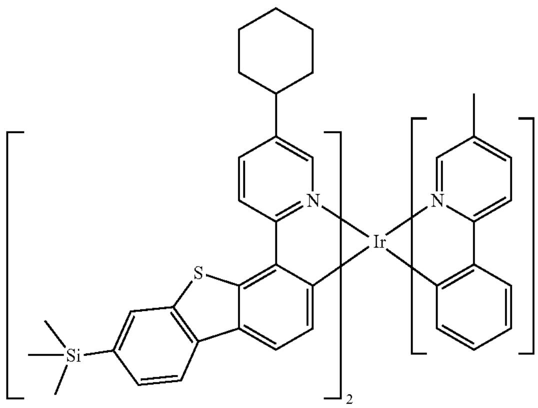
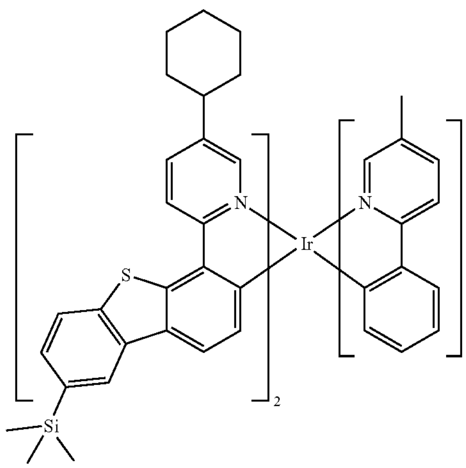
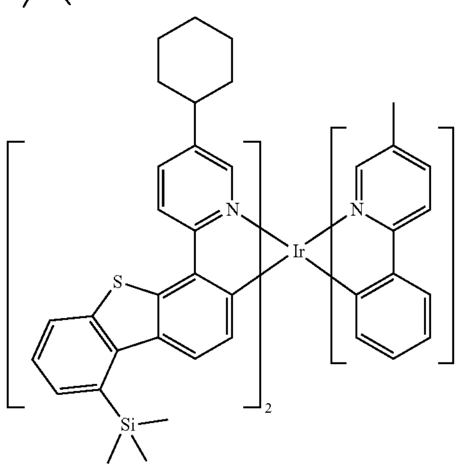
-continued
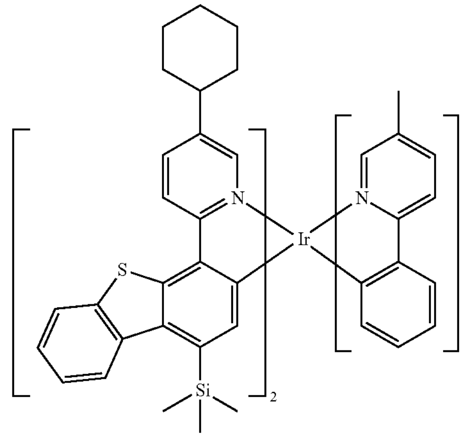
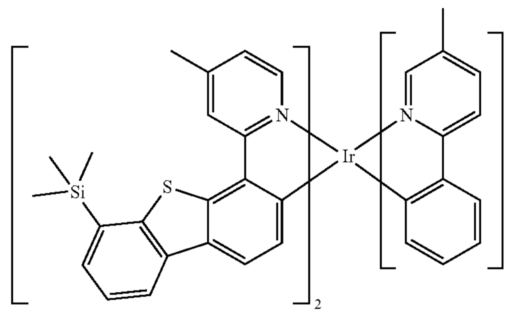
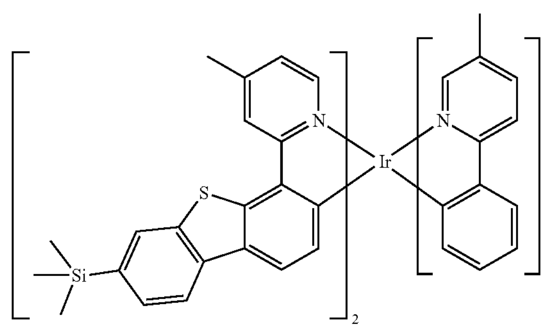
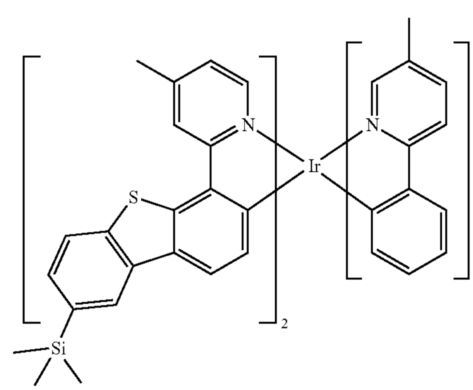

-continued
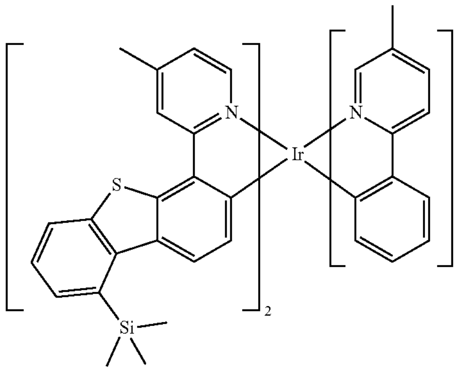
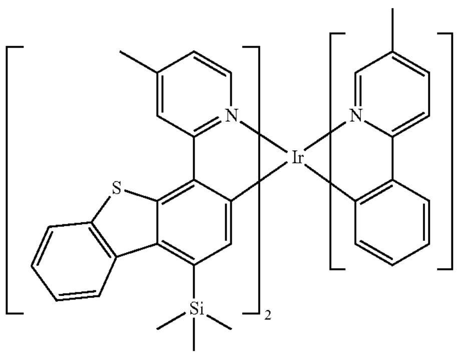
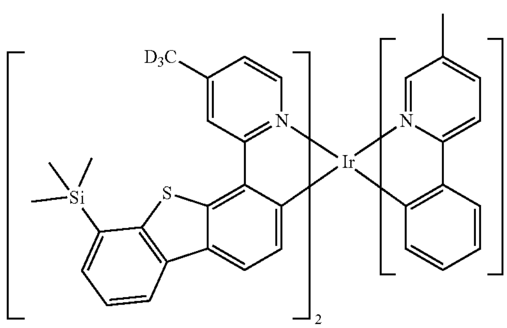
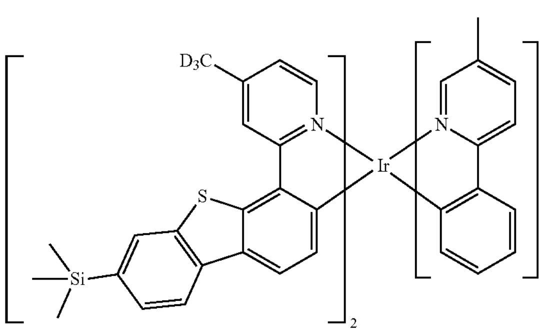
-continued
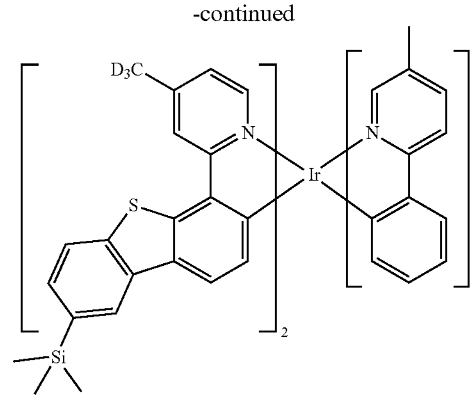
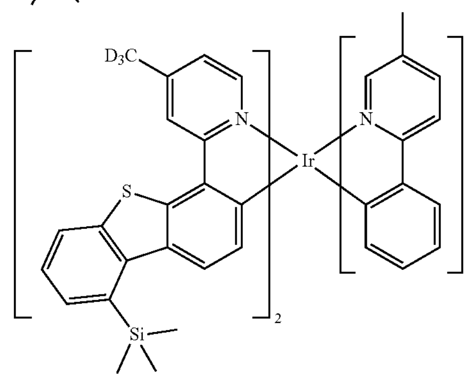
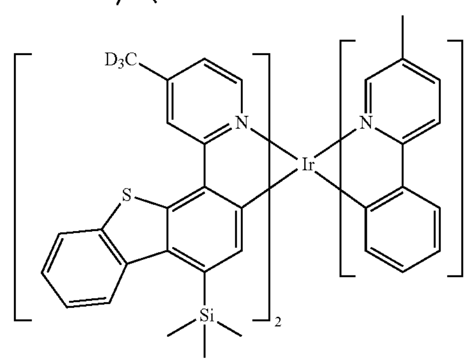
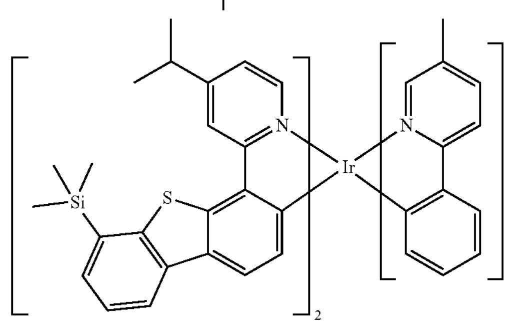
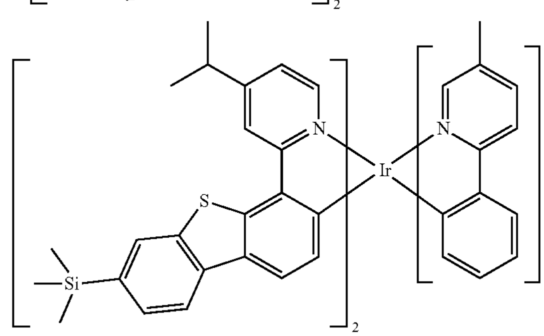

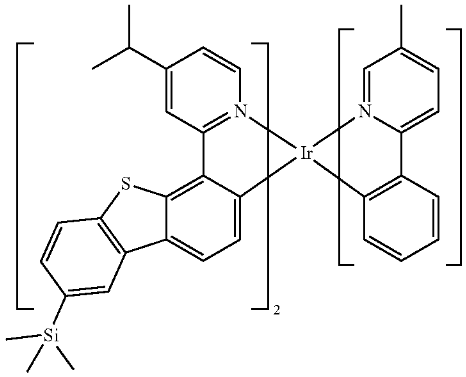
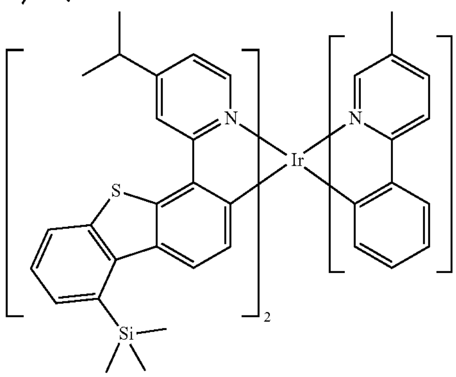
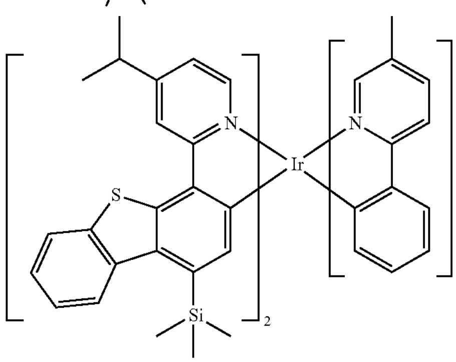
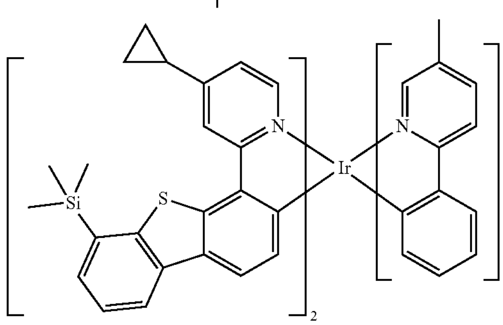
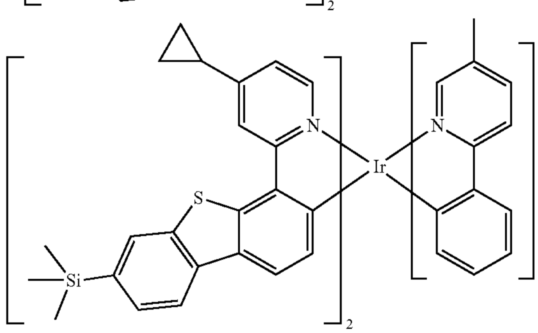
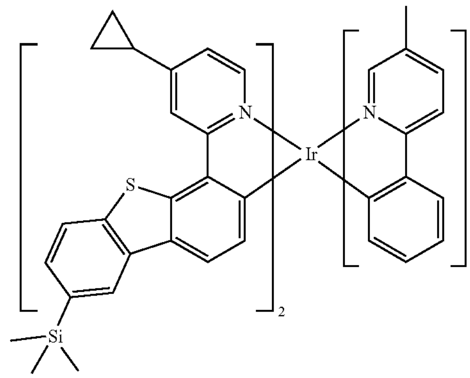
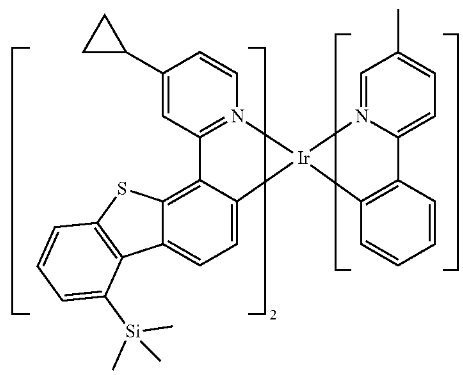
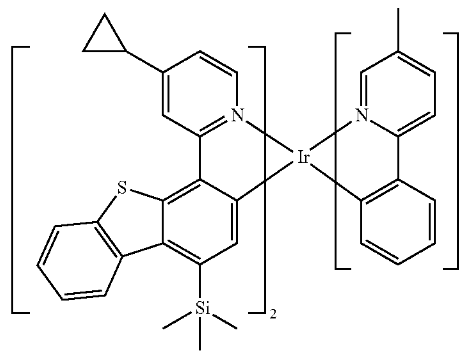
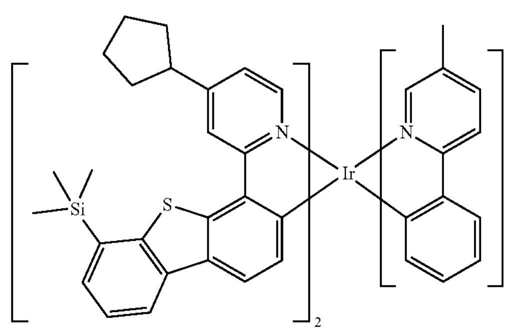

-continued
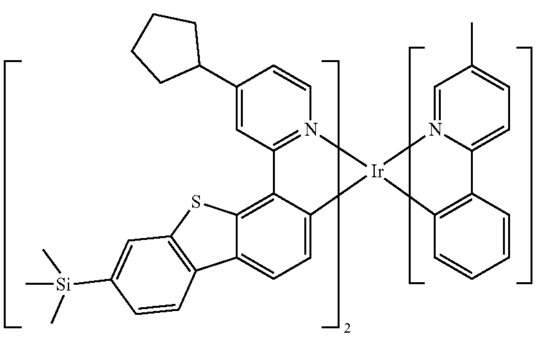
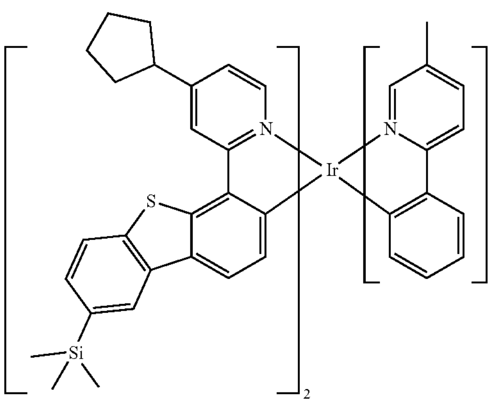
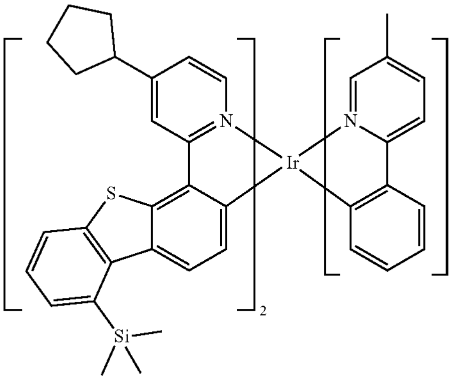
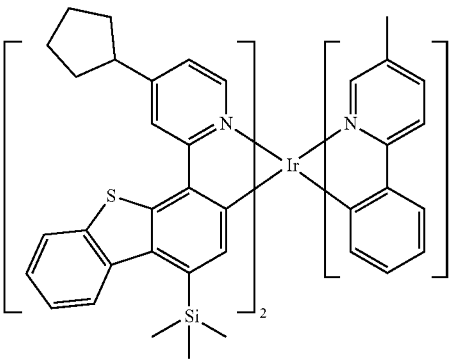
-continued
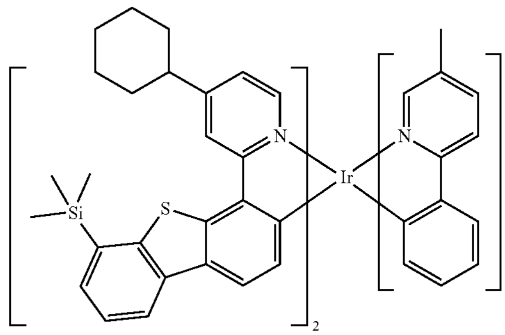
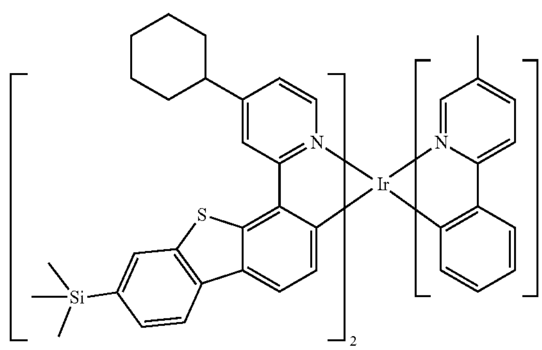
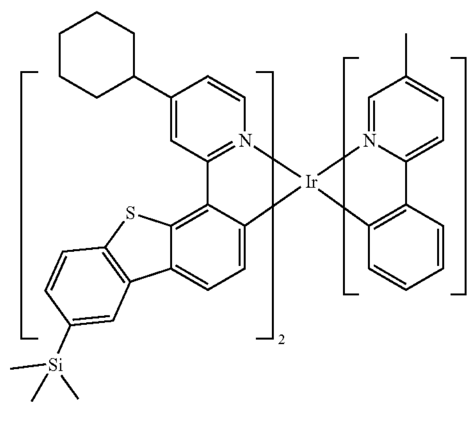
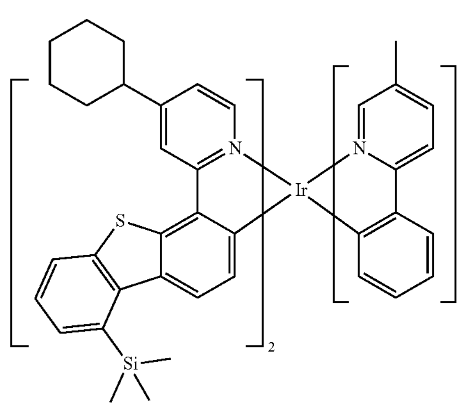

-continued
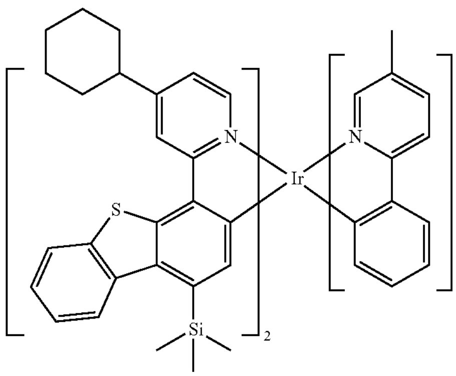
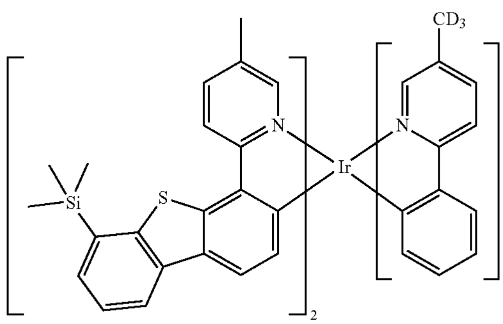
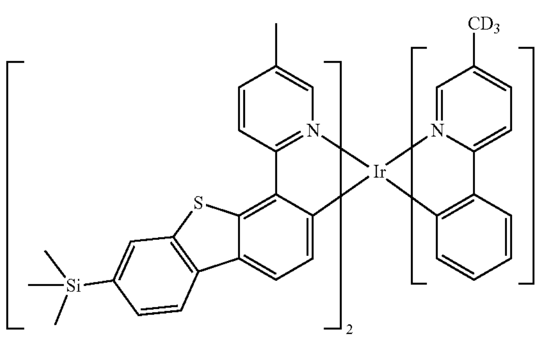
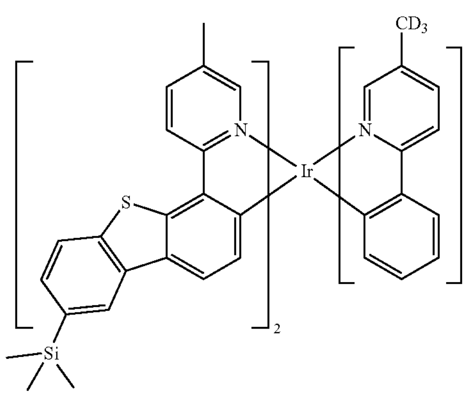
-continued
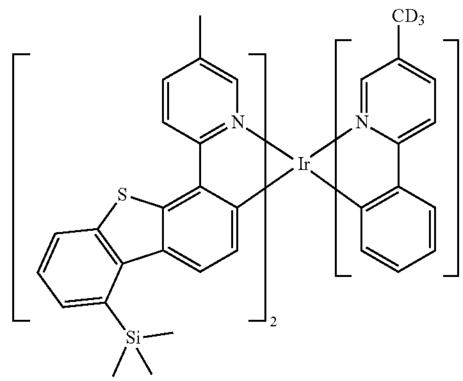
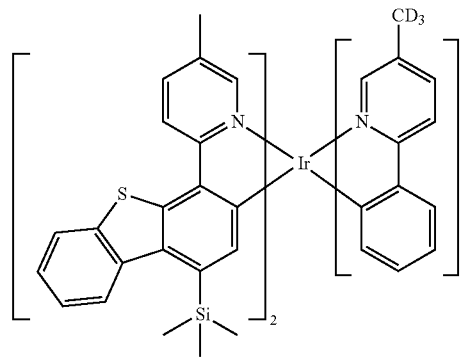
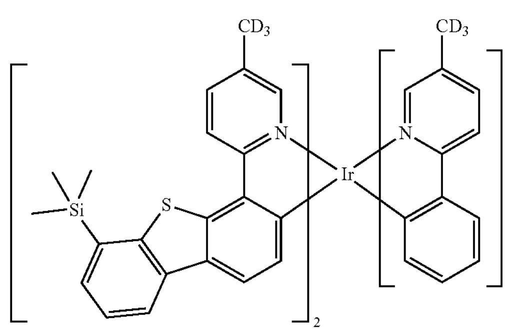
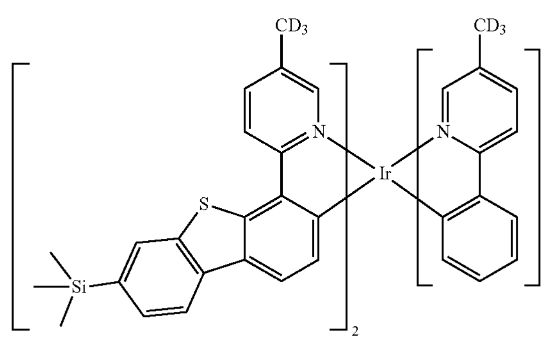

-continued
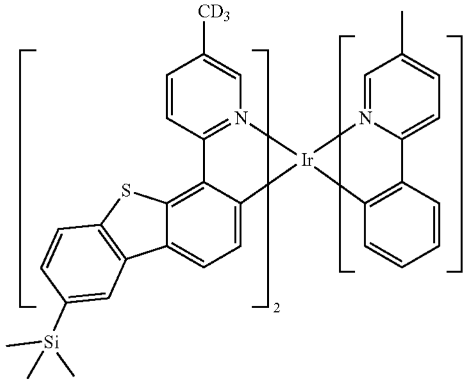
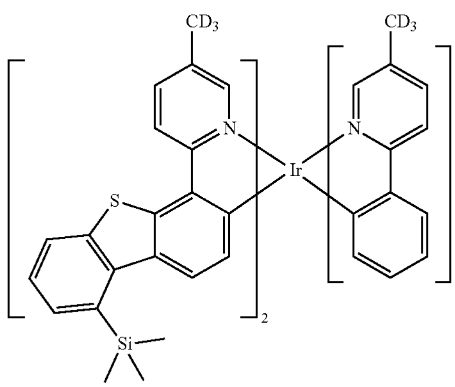
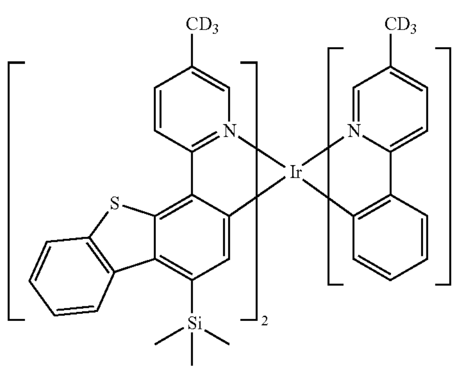
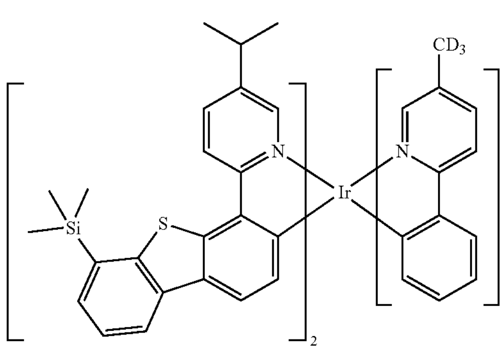
-continued
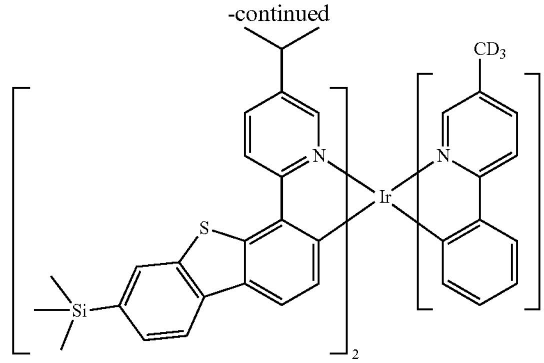
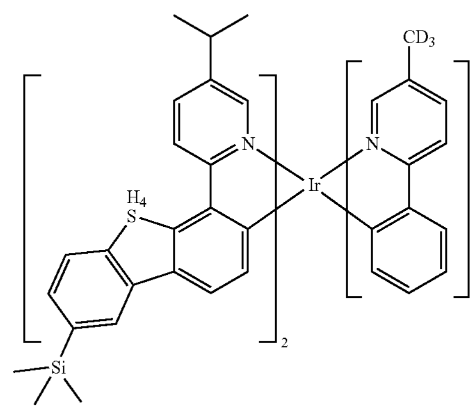
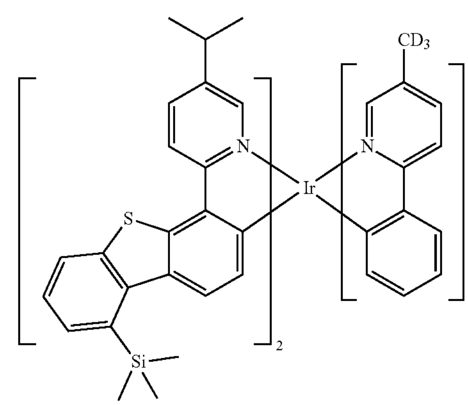
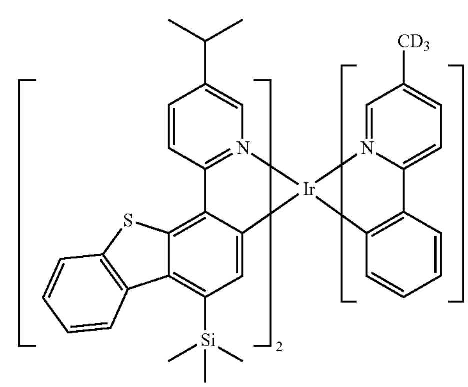

-continued
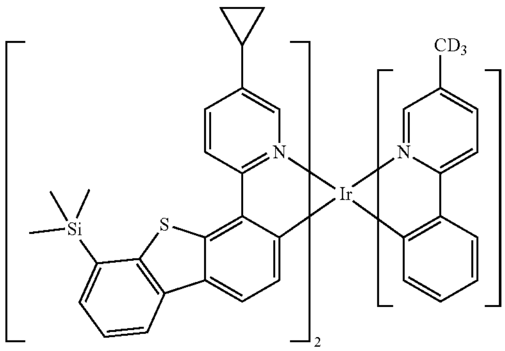
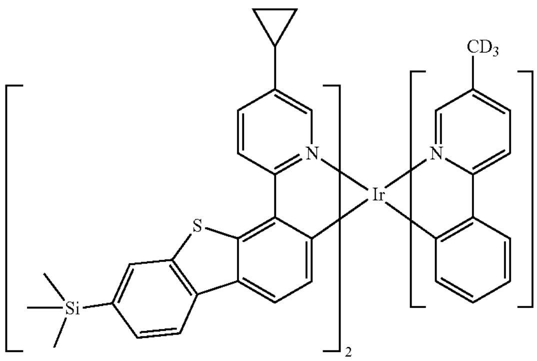
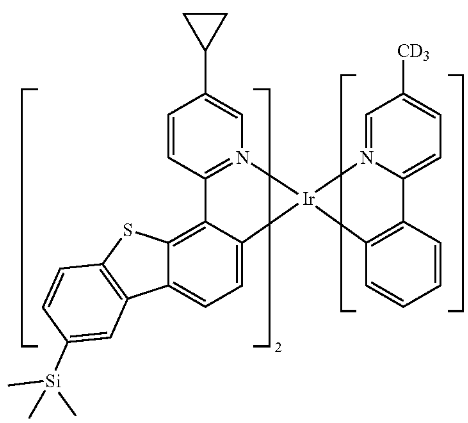
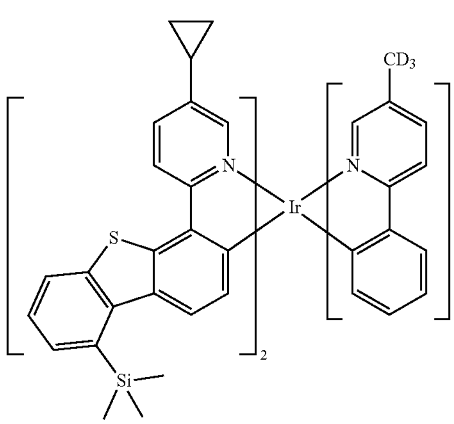
-continued
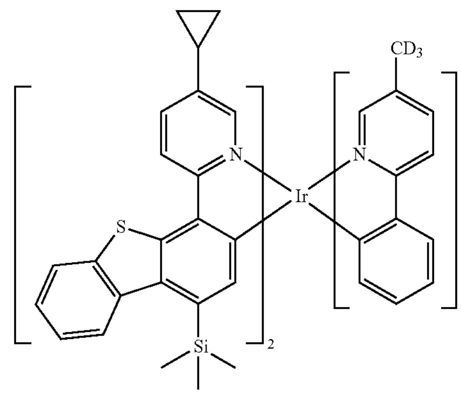
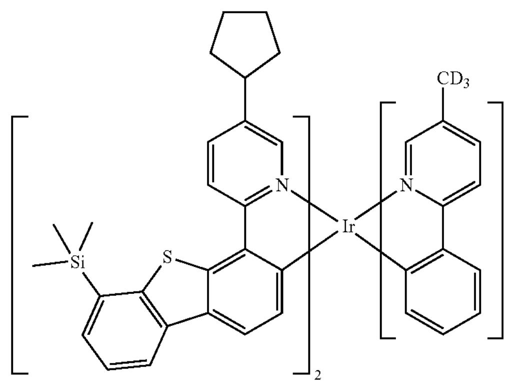
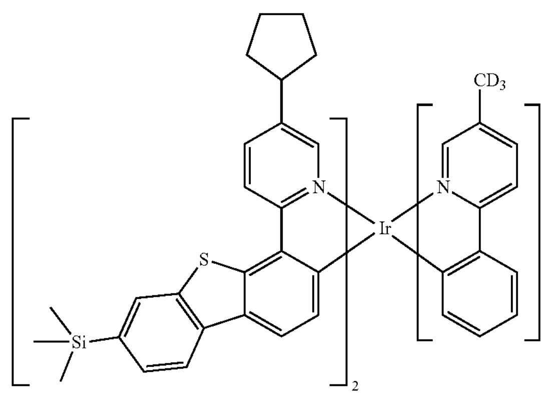
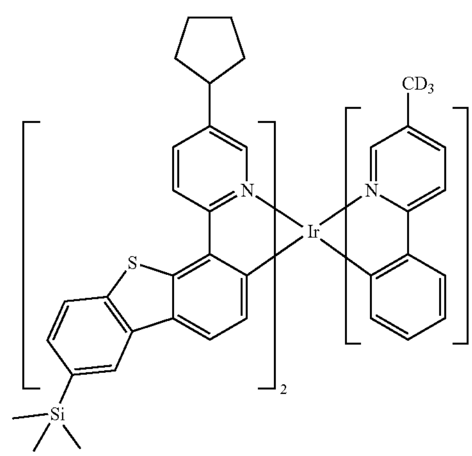

-continued
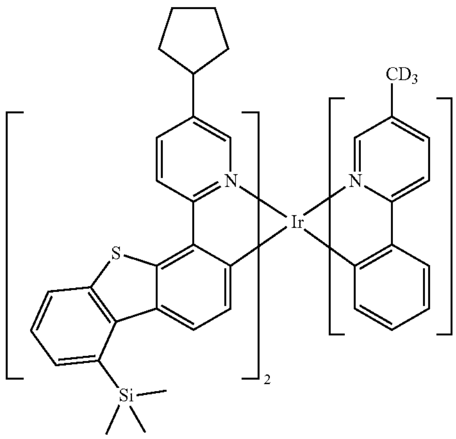
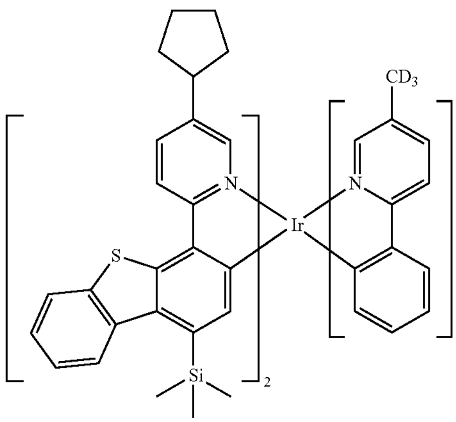
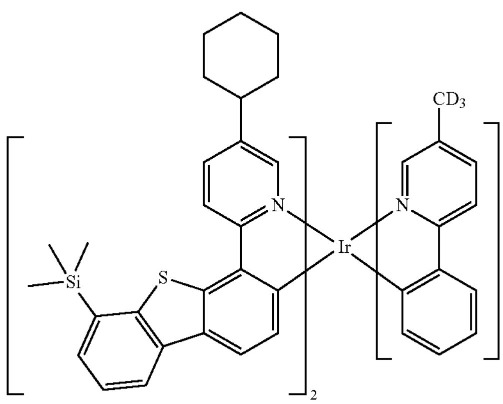
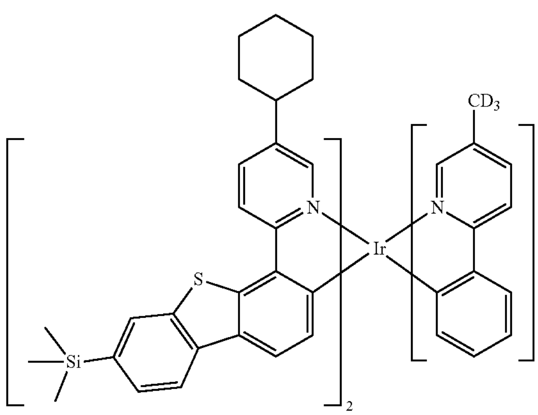
-continued
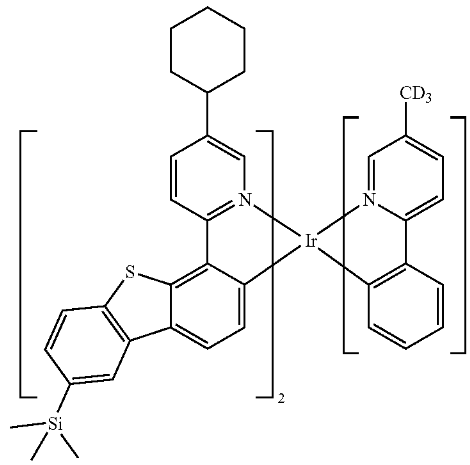
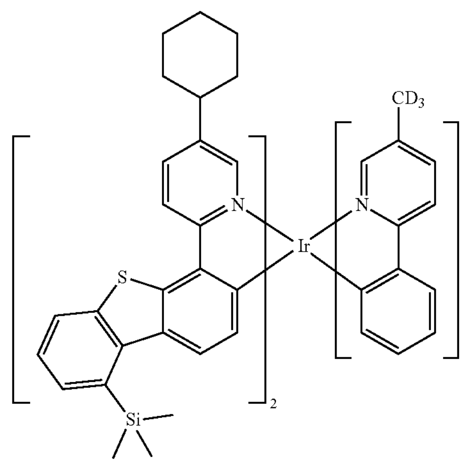
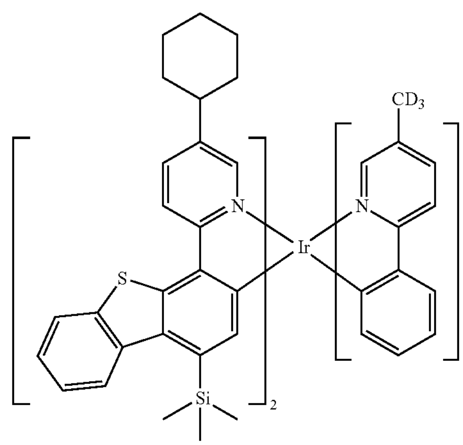
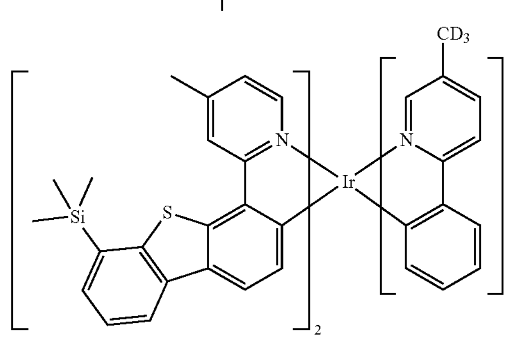

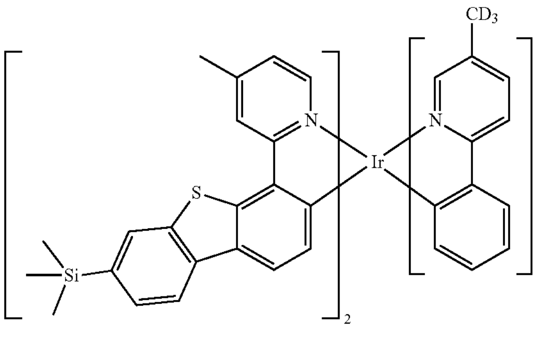
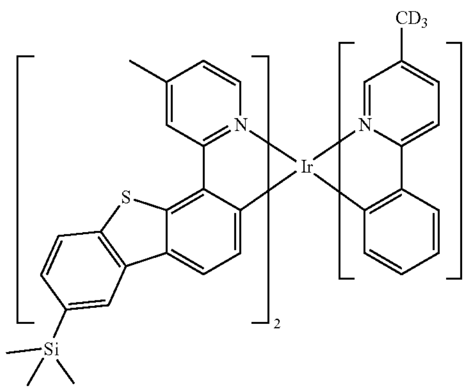
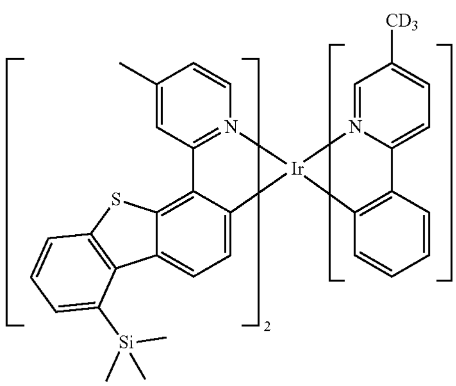
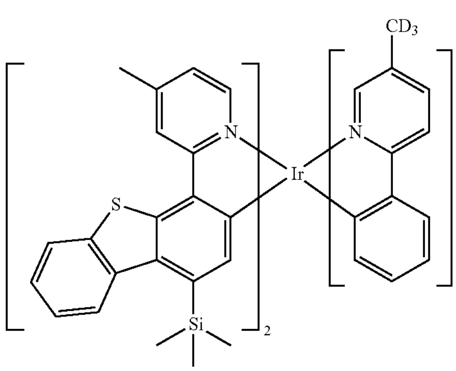
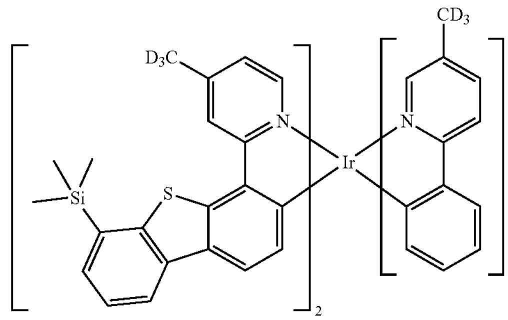
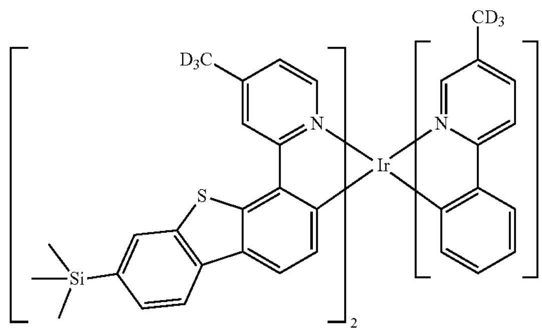
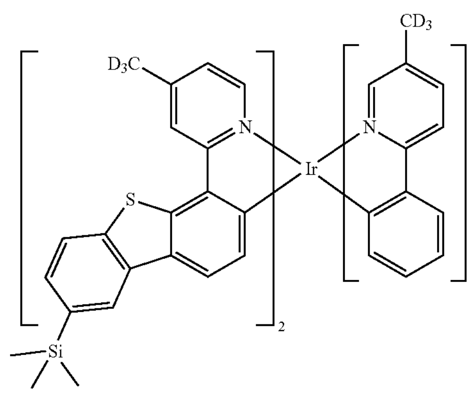
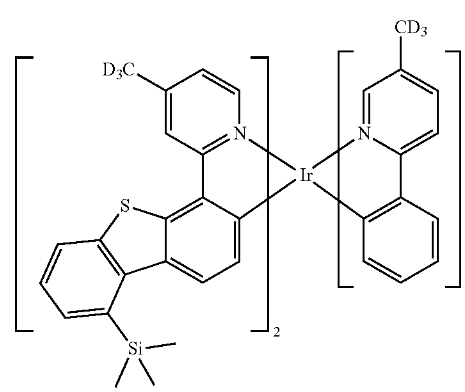

-continued
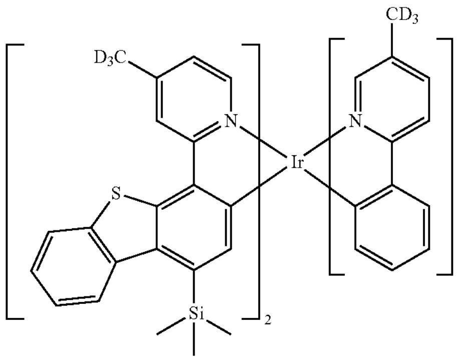
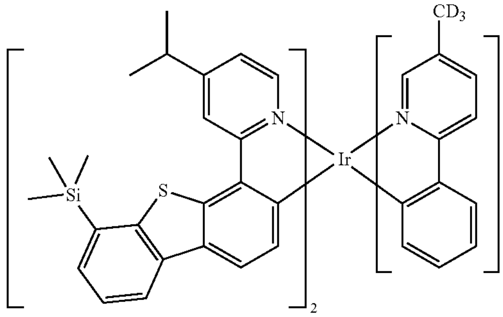
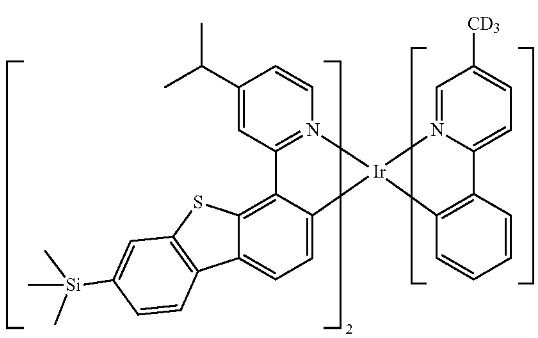
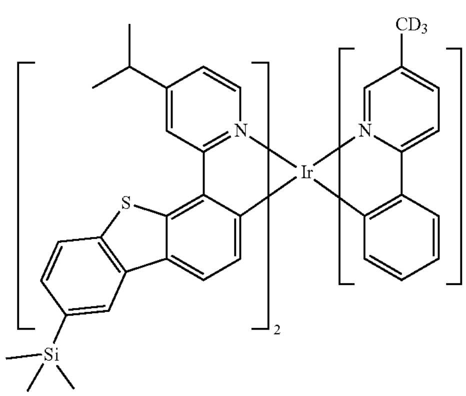
-continued
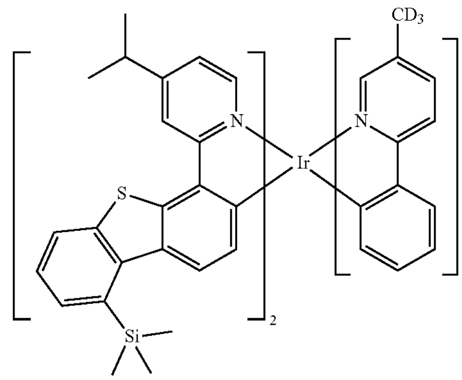
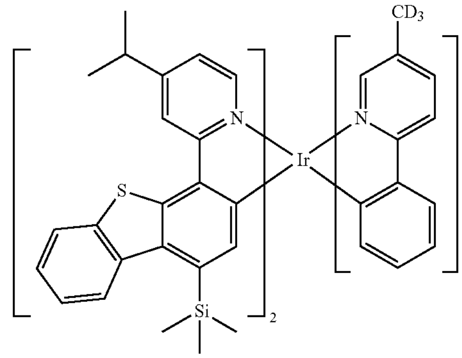
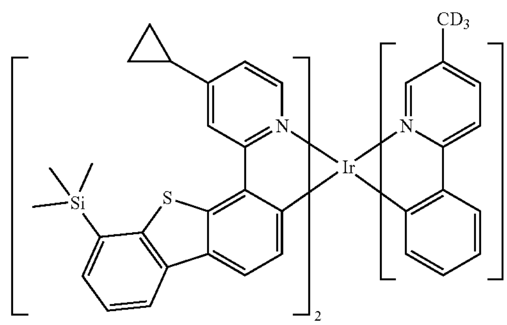
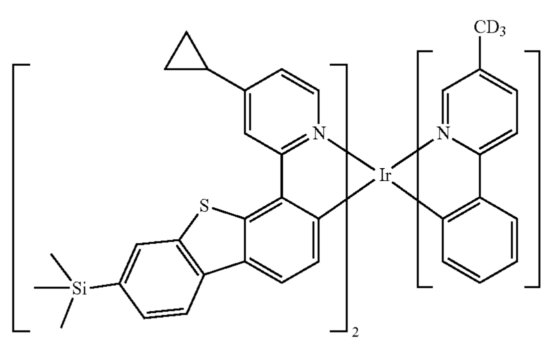

-continued
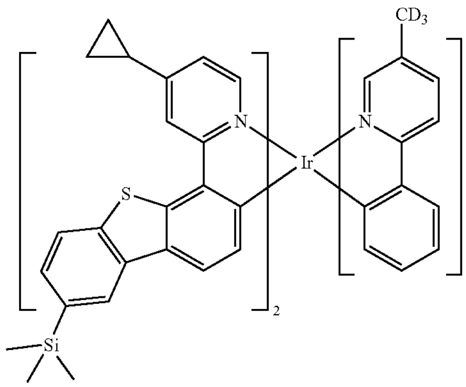
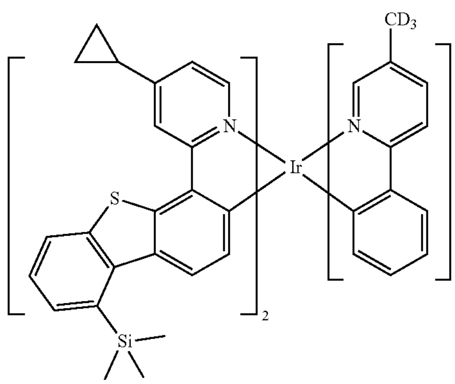
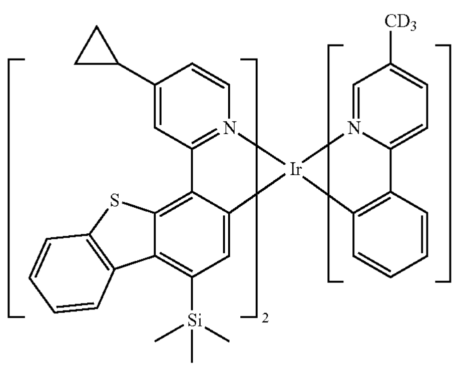
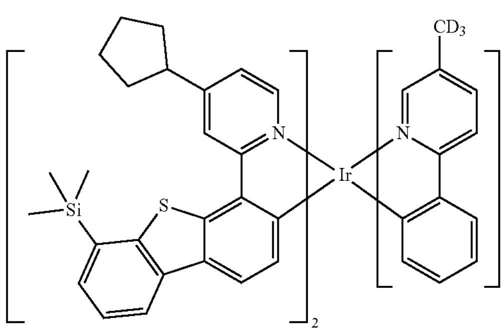
-continued
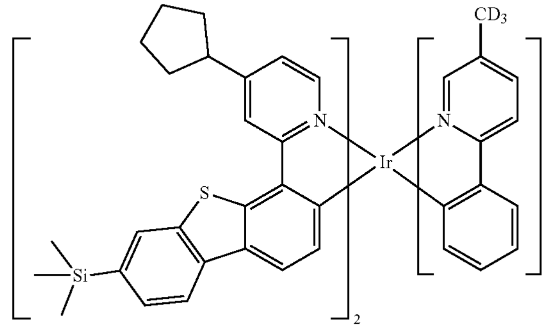
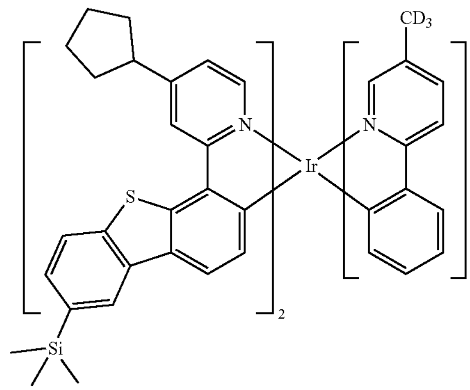
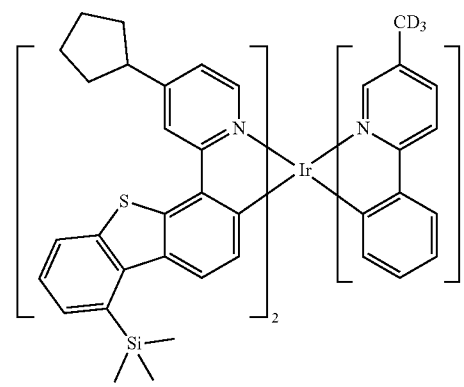
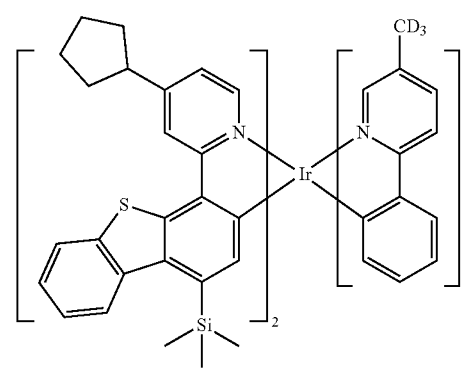

-continued
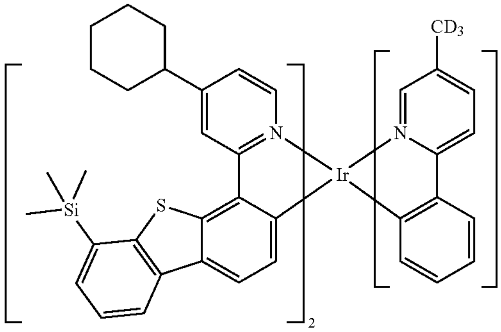
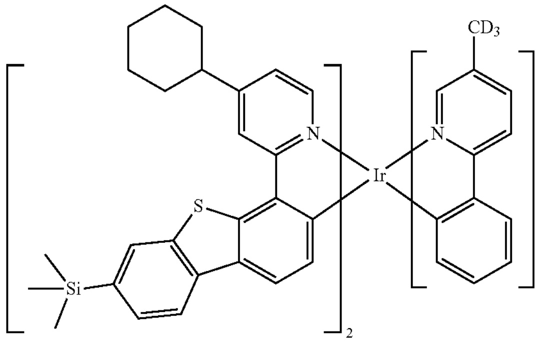
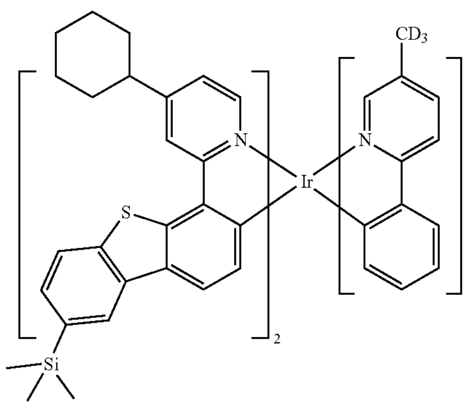
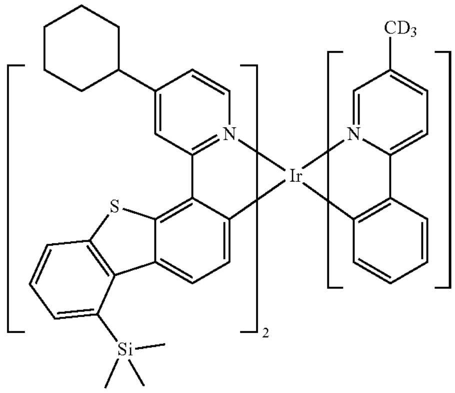
-continued
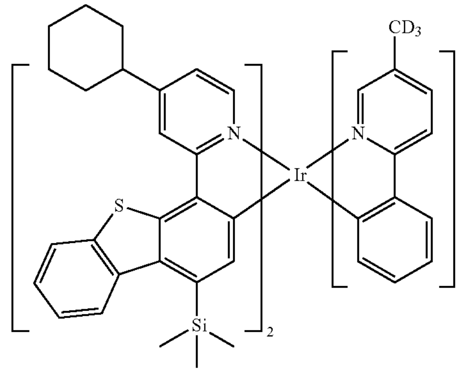
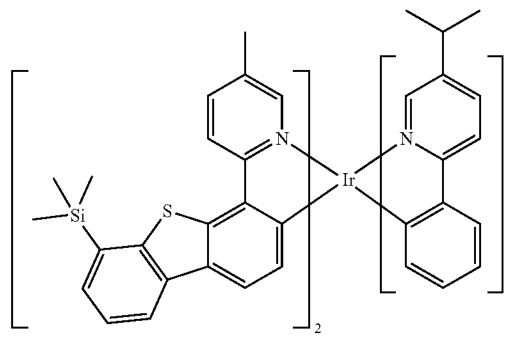
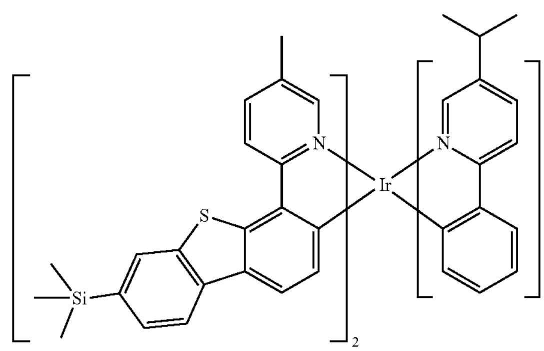
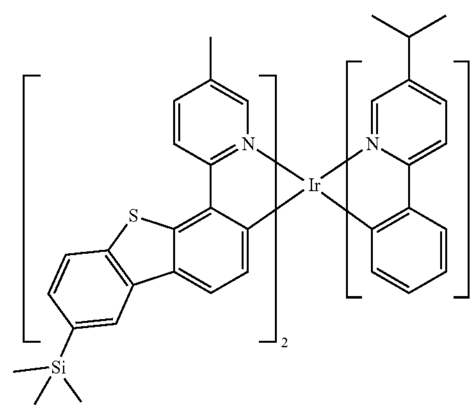

-continued
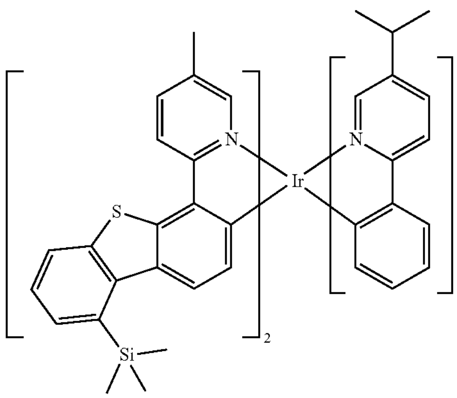
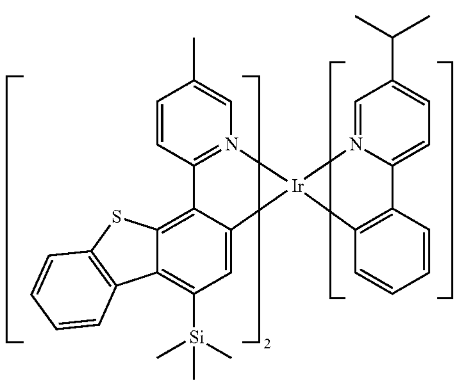
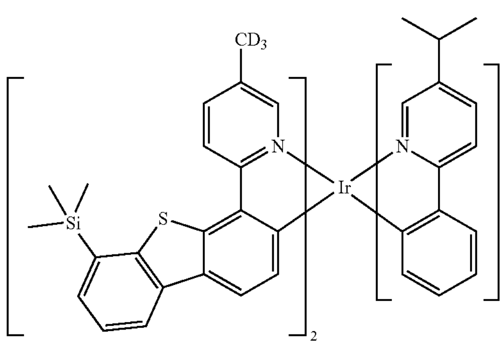
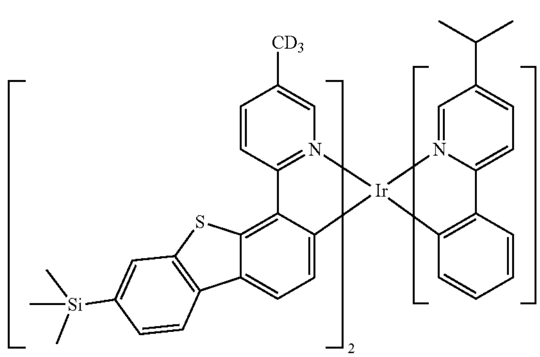
-continued
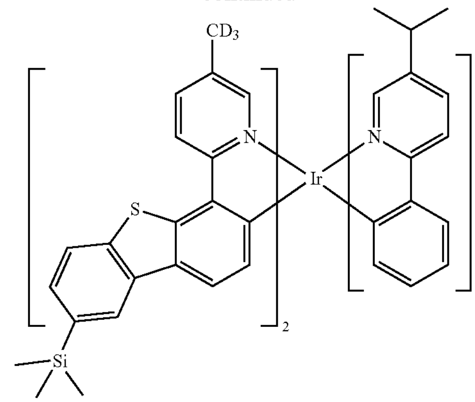
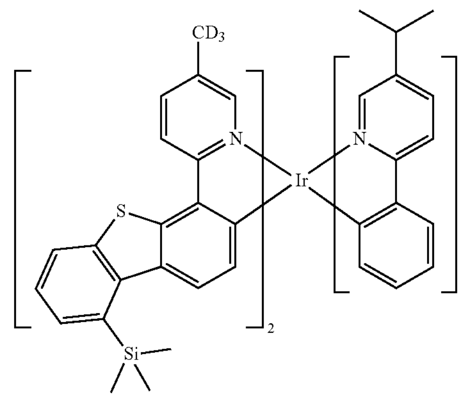
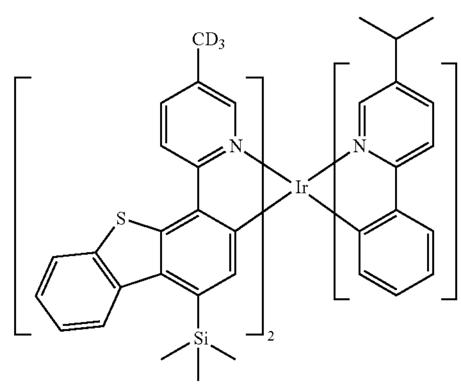
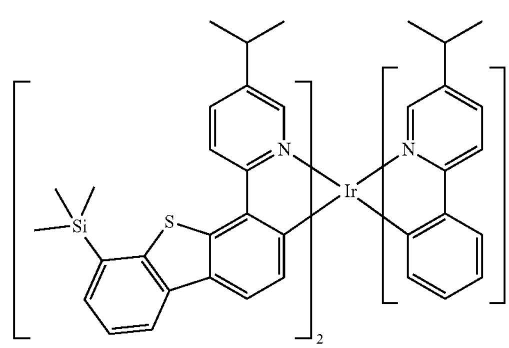

-continued
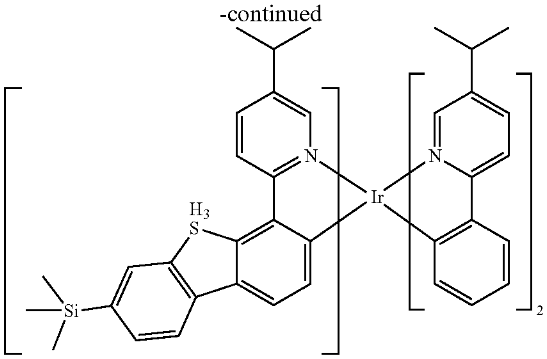
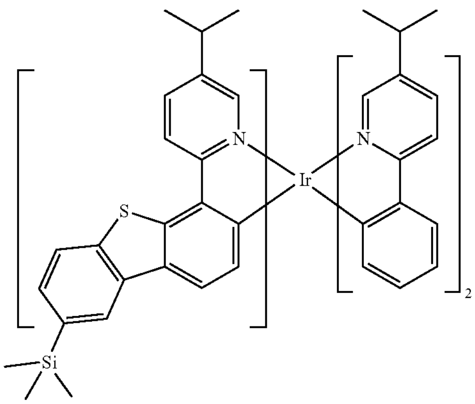
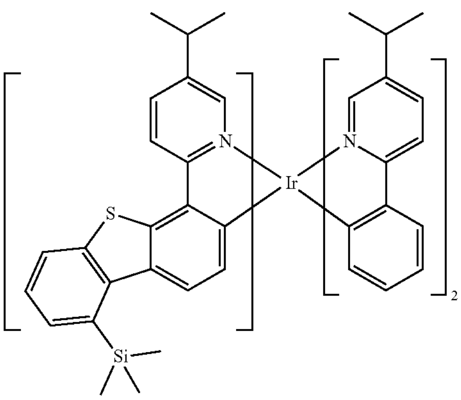
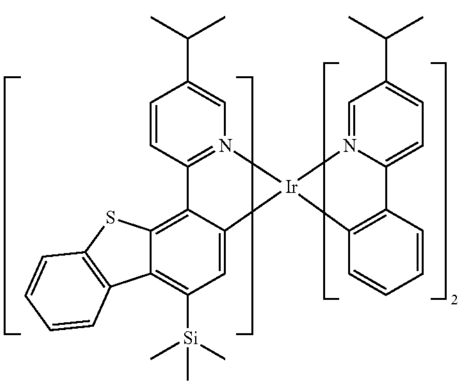
-continued
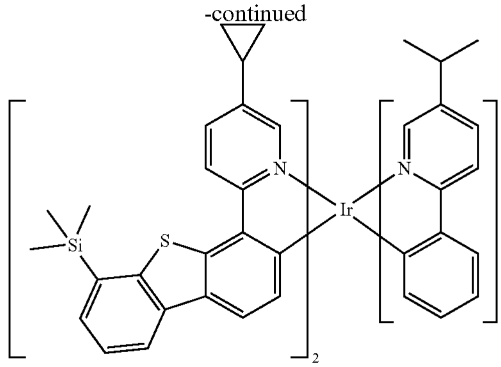
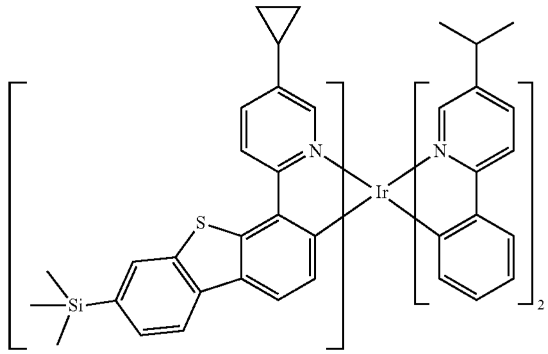
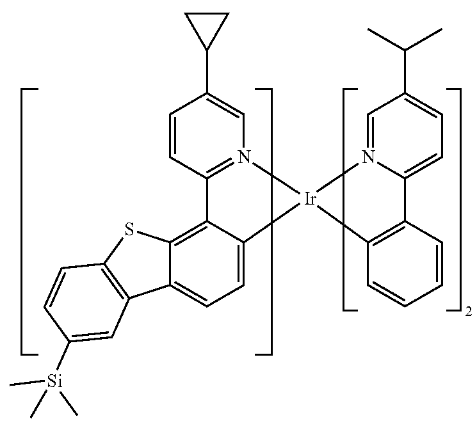
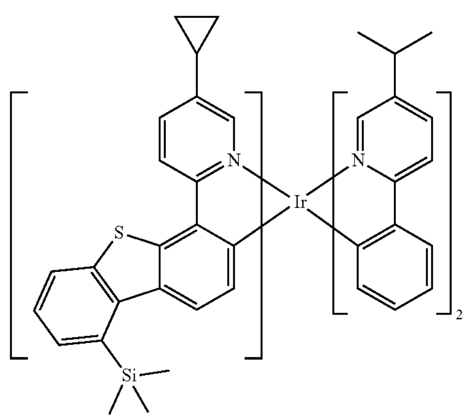

-continued
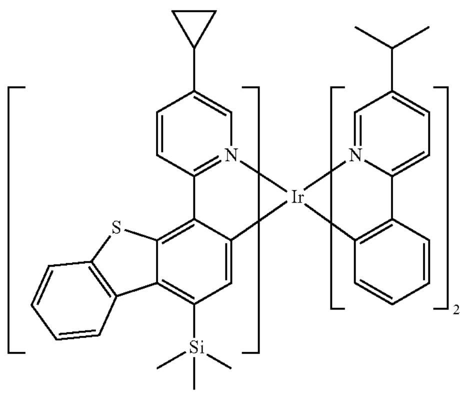
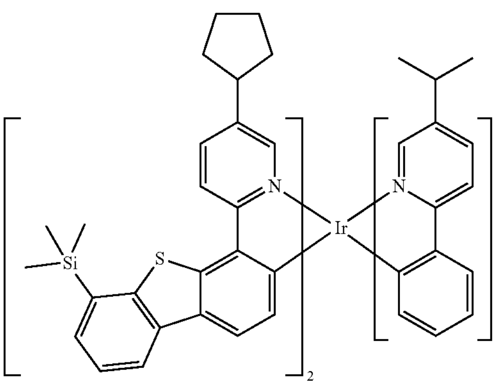
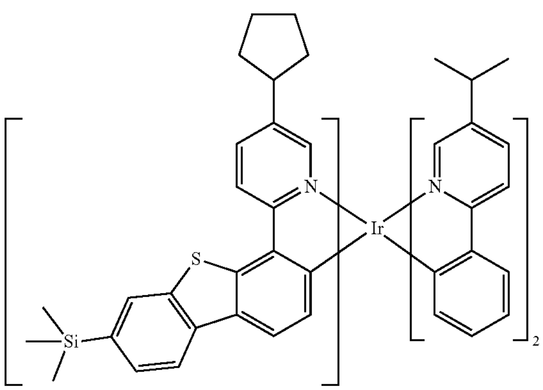
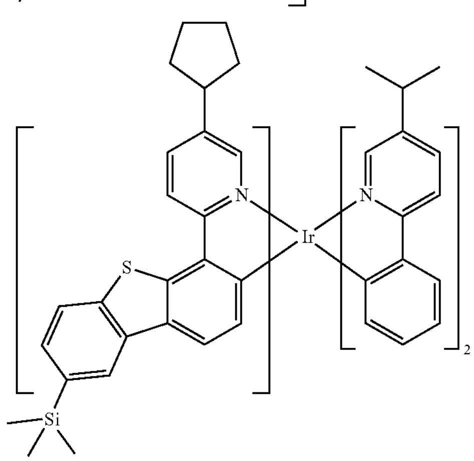
-continued
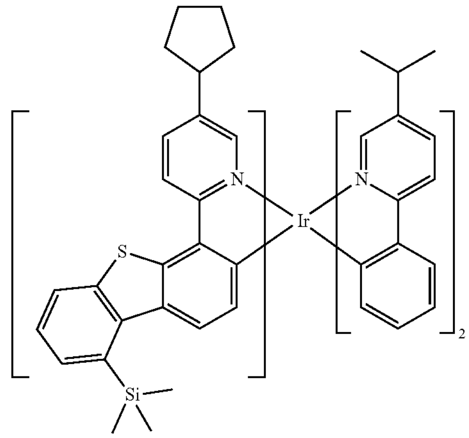
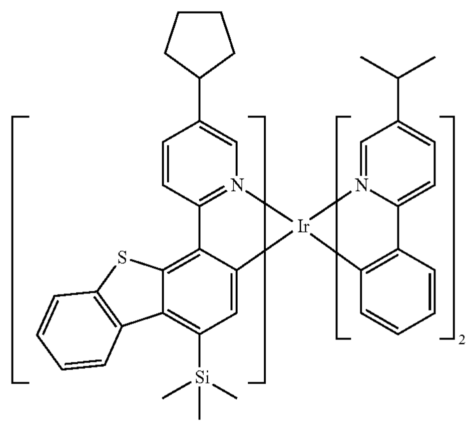
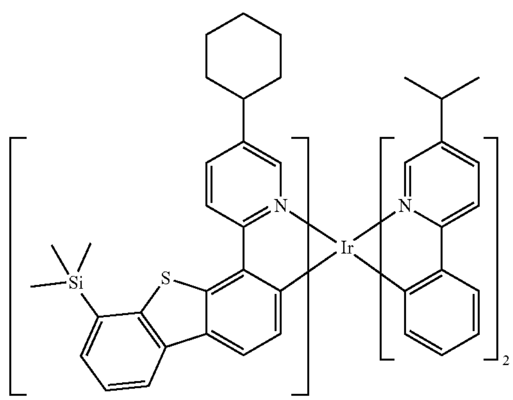
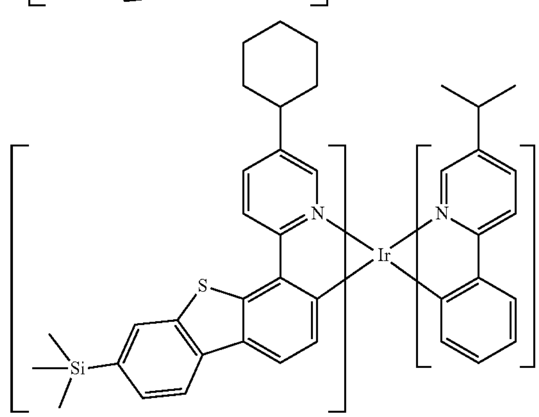

-continued
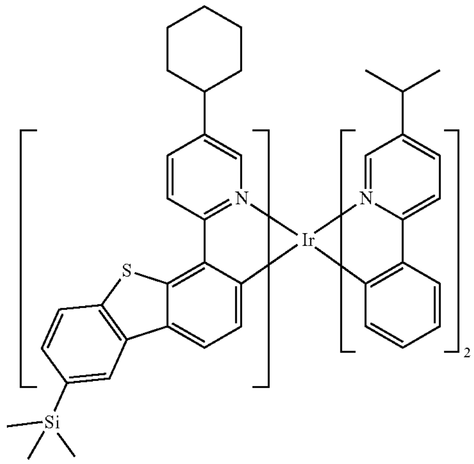
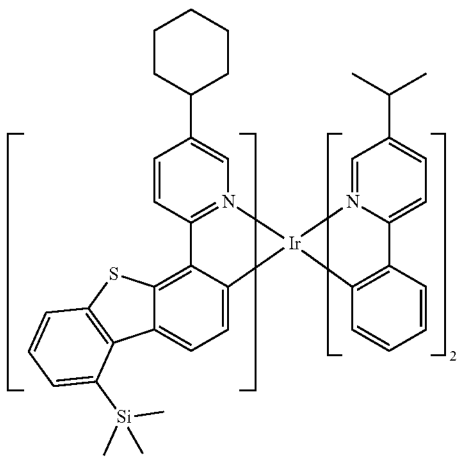
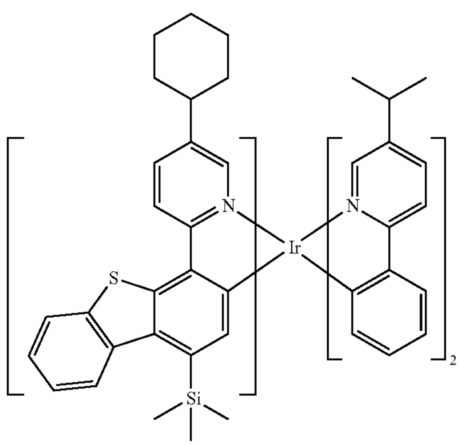
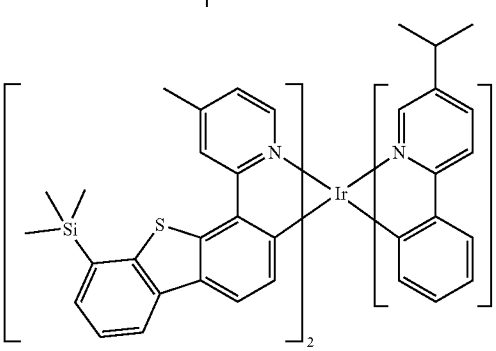
-continued
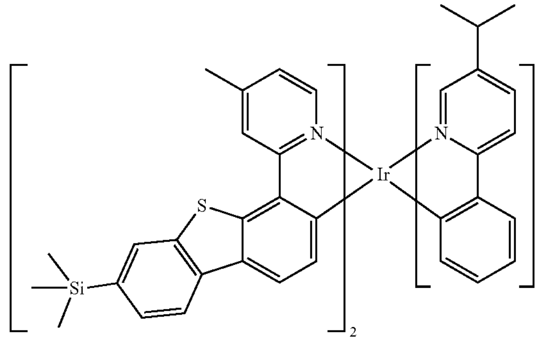
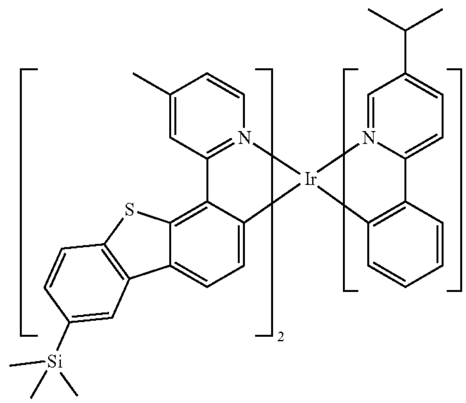
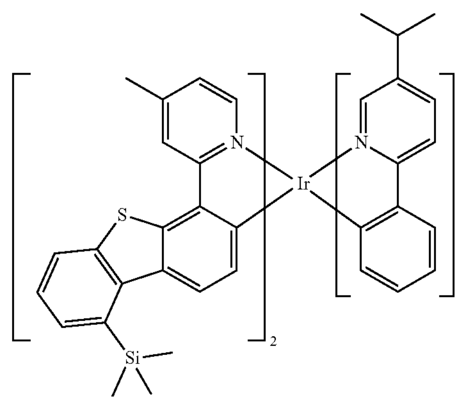
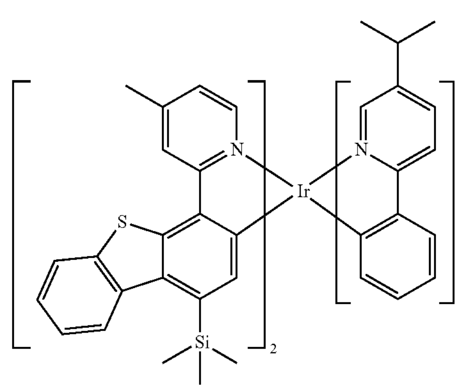

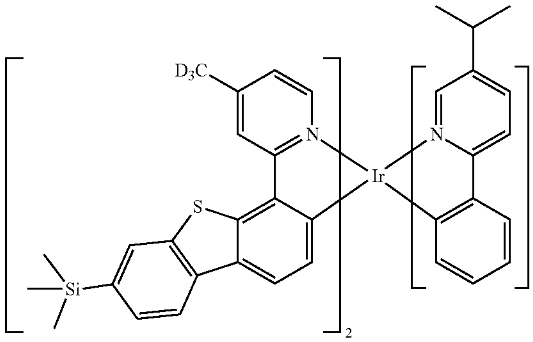
D3C
N
Ir
N
S
Si
2
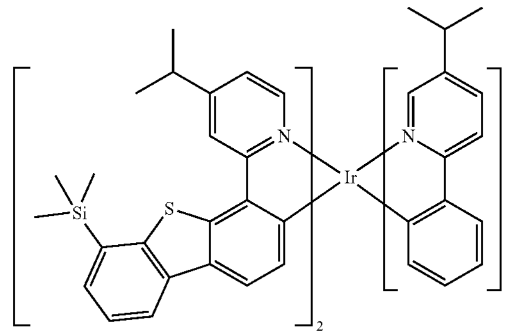
N
Ir
N
Si
S
2
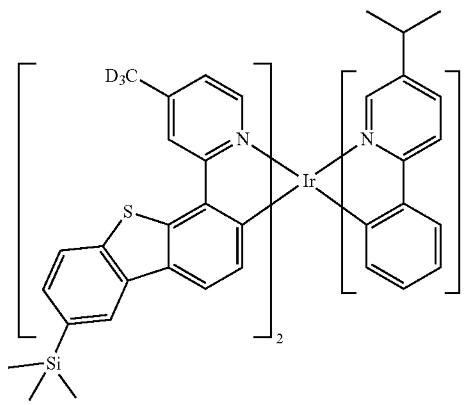
D3C
N
Ir
N
S
Si
2
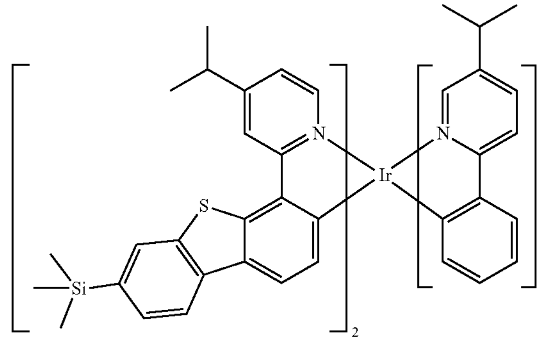
N
Ir
N
S
Si
2
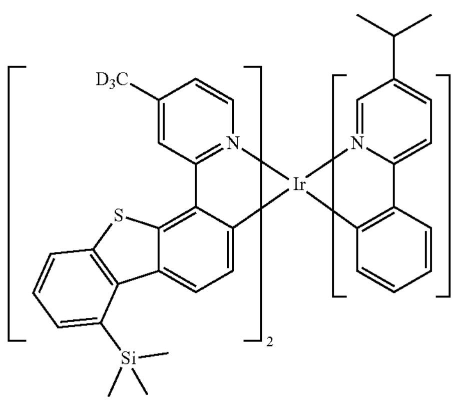
D3C
N
Ir
N
S
Si
2
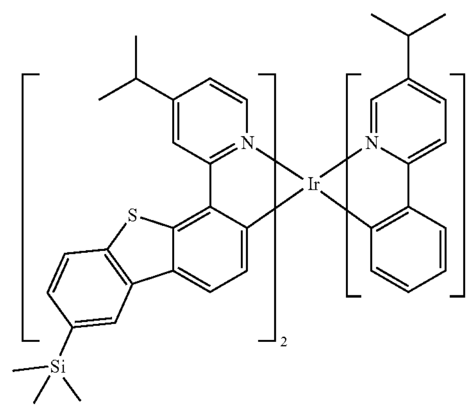
N
Ir
N
S
Si
2
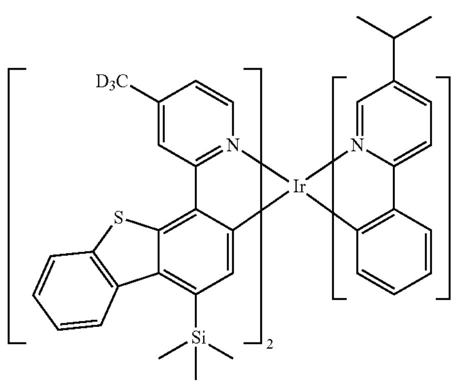
D3C
N
Ir
N
S
Si
2
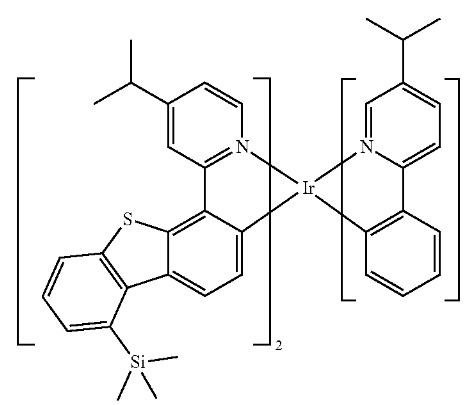
N
Ir
N
S
Si
2

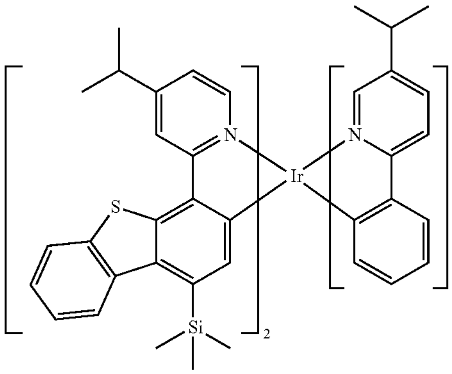
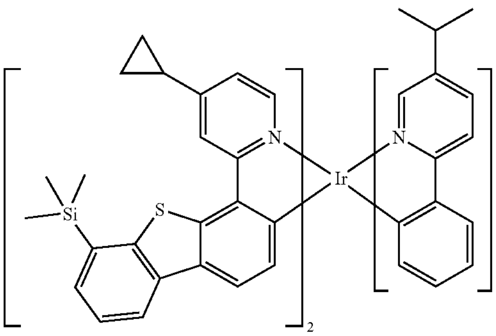
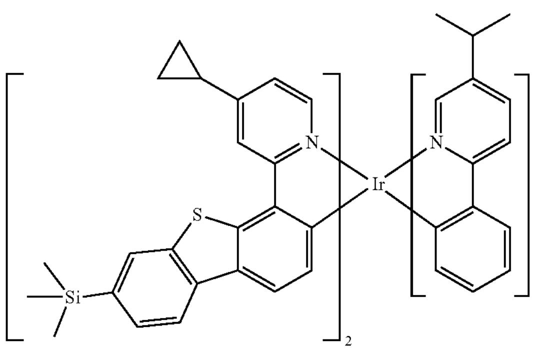
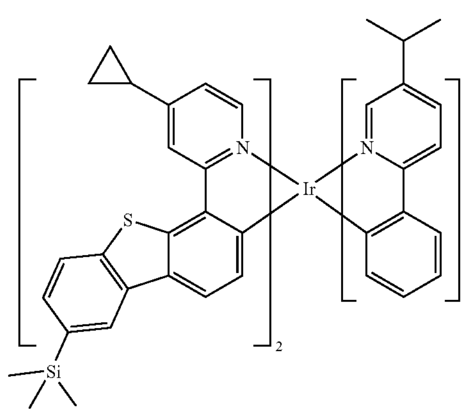
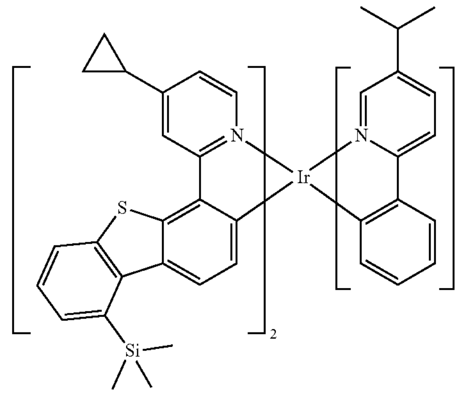
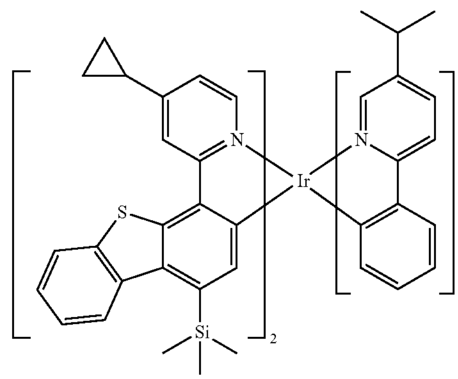
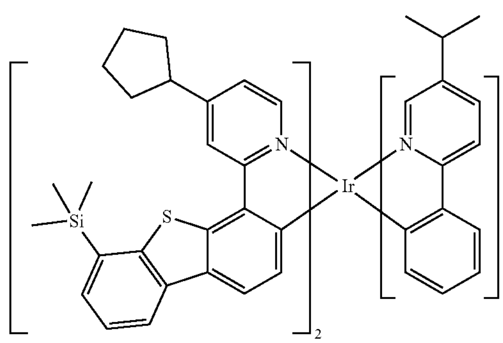
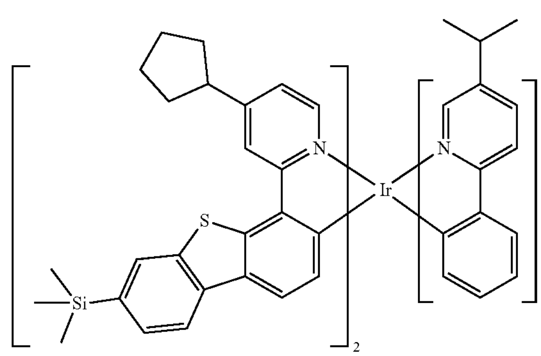

-continued
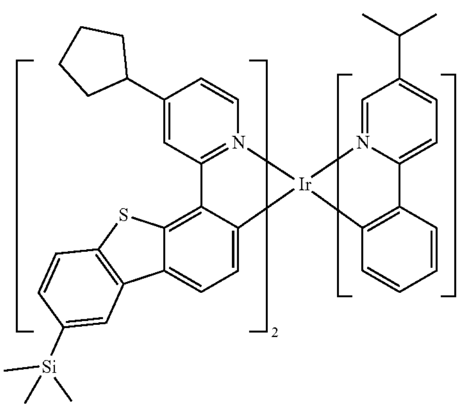
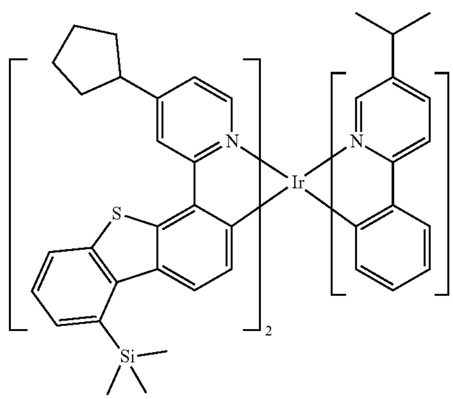
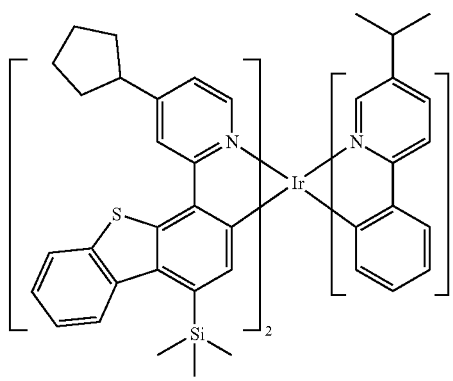
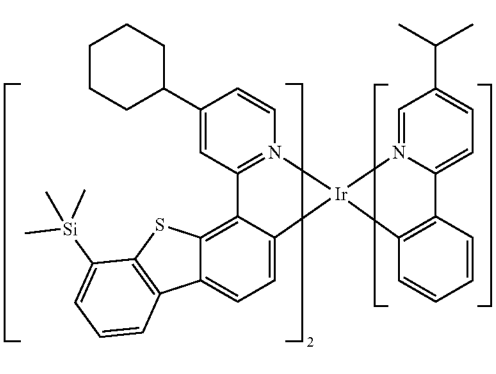
-continued
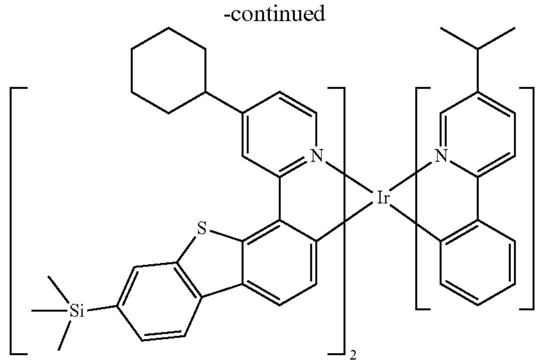
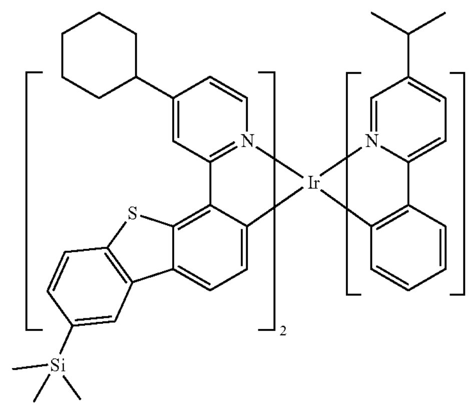
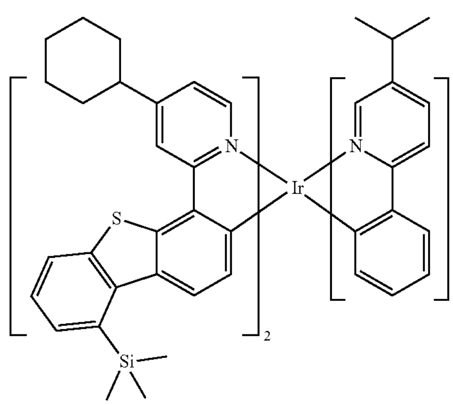
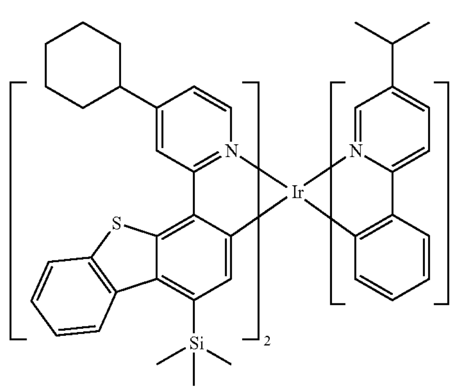

-continued
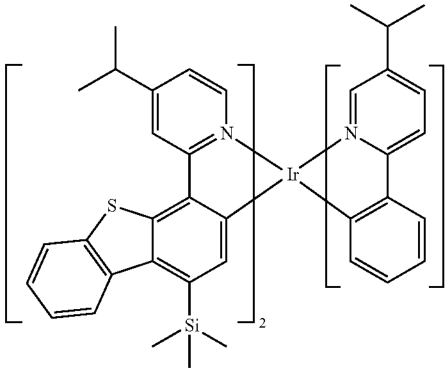
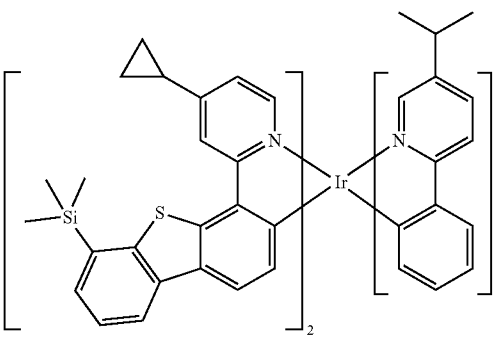
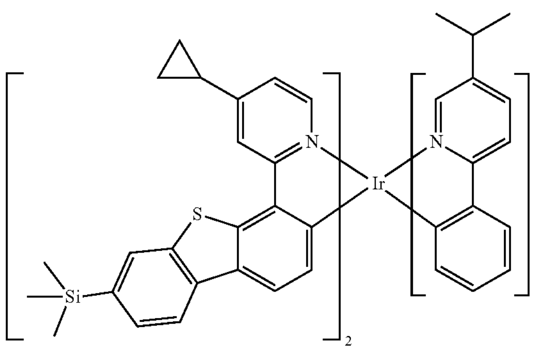
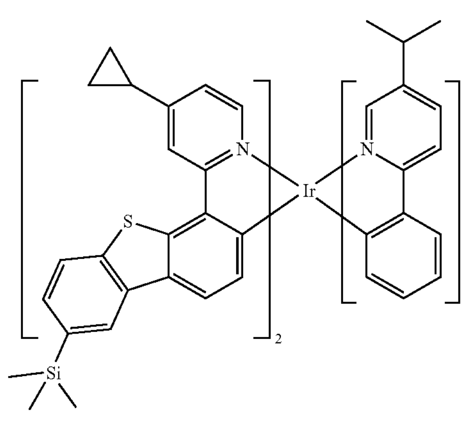
-continued
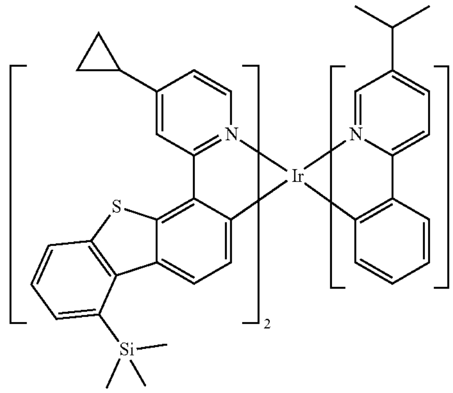
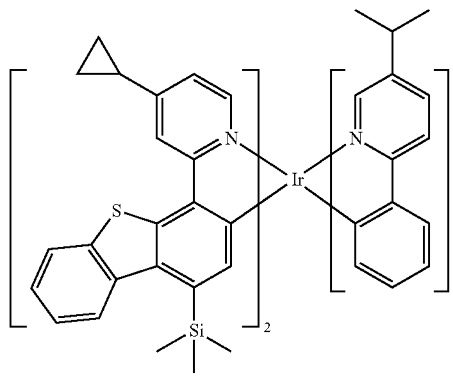
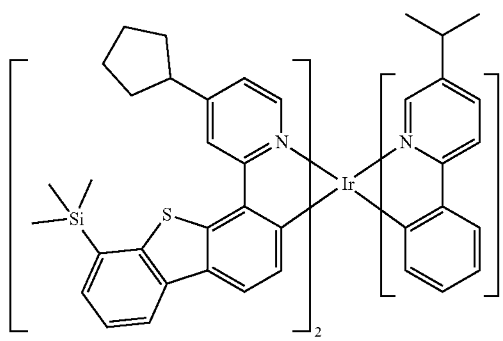
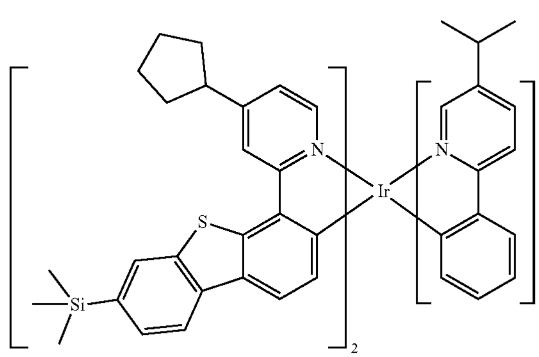

-continued
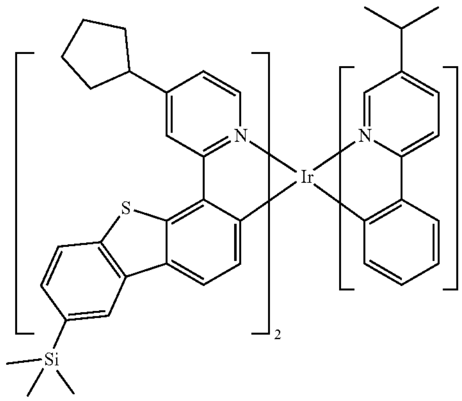
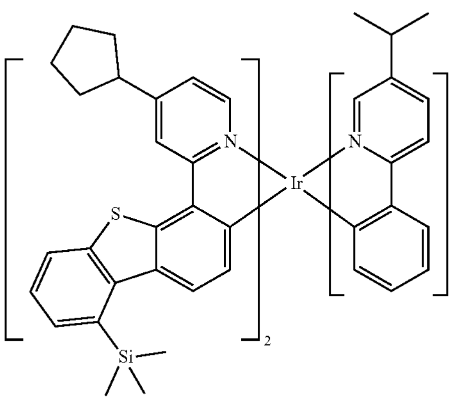
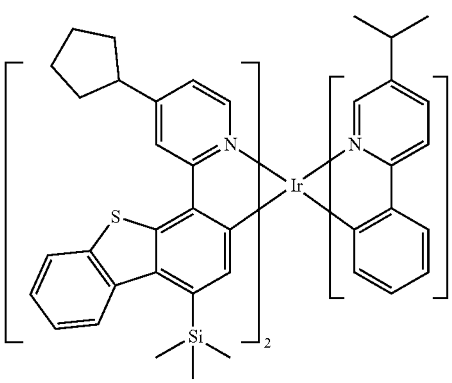
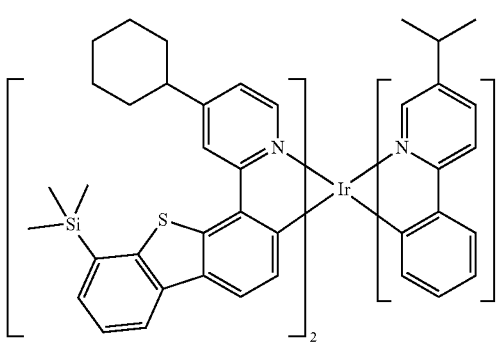
-continued
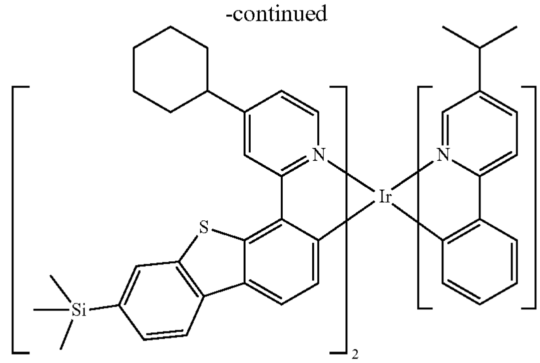
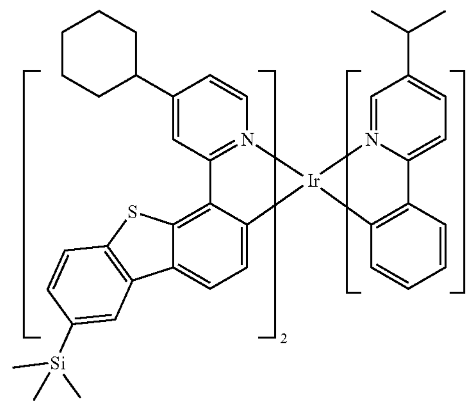
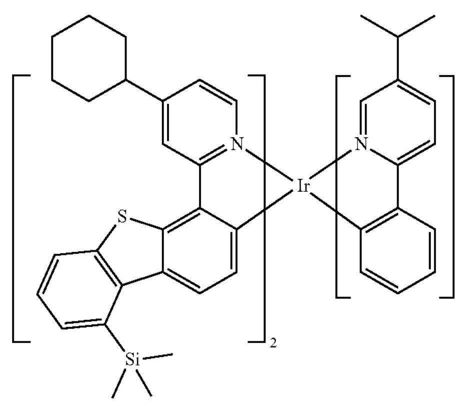
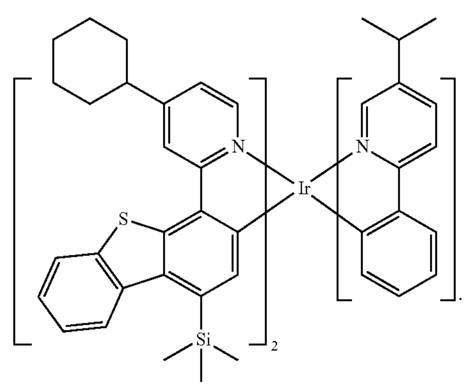

9. An organic light emitting device, comprising:

a first electrode;

a second electrode that is disposed opposite to the first electrode; and one or more organic material layers that are disposed between the first electrode and the second electrode, wherein one or more layers of the organic material layers is a light emitting layer, and the light emitting layer includes the compound of claim 1.

* * * * *